United States Patent
Nichol et al.

(10) Patent No.: US 10,935,716 B2
(45) Date of Patent: *Mar. 2, 2021

(54) FILM-BASED LIGHTGUIDE WITH BEND POSITIONING STRIPS BEHIND AN EXTRACTION REGION

(71) Applicant: FLEx Lighting II, LLC, Chicago, IL (US)

(72) Inventors: Anthony John Nichol, Chicago, IL (US); Zane A. Coleman, Elmhurst, IL (US)

(73) Assignee: FLEx Lighting II, LLC, Chicago, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/673,208

(22) Filed: Nov. 4, 2019

(65) Prior Publication Data
US 2020/0064540 A1  Feb. 27, 2020

Related U.S. Application Data

(63) Continuation of application No. 16/240,765, filed on Jan. 6, 2019, now Pat. No. 10,466,409, which is a
(Continued)

(51) Int. Cl.
*F21V 8/00* (2006.01)
*G09F 9/33* (2006.01)

(52) U.S. Cl.
CPC .......... *G02B 6/0076* (2013.01); *G02B 6/003* (2013.01); *G02B 6/006* (2013.01); *G02B 6/009* (2013.01);
(Continued)

(58) Field of Classification Search
CPC .. G02B 6/0011; G02B 6/0033; G02B 6/0035; G02B 6/0063; G02B 6/0075;
(Continued)

(56) References Cited

U.S. PATENT DOCUMENTS 6,464,365 B1  10/2002  Gunn
6,547,445 B2 *  4/2003  Kiani ................... G02B 6/3612
                                                         385/53
(Continued)

FOREIGN PATENT DOCUMENTS

WO  1996011358 A1  4/1996

*Primary Examiner* — Robert J May
(74) *Attorney, Agent, or Firm* — Zane Coleman

(57) ABSTRACT

A film-based lightguide comprises a major sheet area comprising a light extracting region and a minor sheet area positioned between the major sheet area and an array of strips extended from the minor sheet area. Each strip of the array of strips is bent and stacked such that stacked ends of the array of strips define an input surface. The lightguide further comprises a bend in the minor sheet area that positions the array of strips behind the major sheet area in a thickness direction of the film in the major sheet area. In one embodiment, the bend in the minor sheet area bends the film by an angle of 180 degrees. In another embodiment, the bend in the minor sheet area positions the light input surface behind the major sheet area in the thickness direction of the film in the major sheet area.

20 Claims, 54 Drawing Sheets

Related U.S. Application Data continuation of application No. 15/336,497, filed on Oct. 27, 2016, now Pat. No. 10,175,413, which is a continuation of application No. 14/550,510, filed on Nov. 21, 2014, now Pat. No. 9,523,807, which is a continuation of application No. 13/089,308, filed on Apr. 18, 2011, now Pat. No. 8,905,610, which is a continuation-in-part of application No. PCT/US2010/022066, filed on Jan. 26, 2010, which is a continuation of application No. 61/147,237, filed on Jan. 26, 2009.

(60) Provisional application No. 61/441,871, filed on Feb. 11, 2011, provisional application No. 61/425,328, filed on Dec. 21, 2010, provisional application No. 61/415,250, filed on Nov. 18, 2010, provisional application No. 61/381,077, filed on Sep. 9, 2010, provisional application No. 61/377,888, filed on Aug. 27, 2010, provisional application No. 61/368,560, filed on Jul. 28, 2010, provisional application No. 61/363,342, filed on Jul. 12, 2010, provisional application No. 61/347,567, filed on May 24, 2010, provisional application No. 61/325,280, filed on Apr. 16, 2010, provisional application No. 61/325,282, filed on Apr. 16, 2010, provisional application No. 61/325,277, filed on Apr. 16, 2010, provisional application No. 61/325,272, filed on Apr. 16, 2010, provisional application No. 61/325,271, filed on Apr. 16, 2010, provisional application No. 61/325,270, filed on Apr. 16, 2010, provisional application No. 61/325,269, filed on Apr. 16, 2010, provisional application No. 61/325,266, filed on Apr. 16, 2010, provisional application No. 61/325,265, filed on Apr. 16, 2010, provisional application No. 61/325,262, filed on Apr. 16, 2010, provisional application No. 61/325,252, filed on Apr. 16, 2010, provisional application No. 61/325,275, filed on Apr. 16, 2010, provisional application No. 61/450,711, filed on Mar. 9, 2011, provisional application No. 61/147,215, filed on Jan. 26, 2009.

(52) U.S. Cl.
CPC .......... *G02B 6/0011* (2013.01); *G02B 6/0016* (2013.01); *G02B 6/0018* (2013.01); *G02B 6/0028* (2013.01); *G02B 6/0031* (2013.01); *G02B 6/0036* (2013.01); *G02B 6/0068* (2013.01); *G02B 6/0075* (2013.01); *G02B 6/0078* (2013.01); *G02B 6/0085* (2013.01); *G02B 6/0088* (2013.01); *G09F 9/33* (2013.01); *Y10T 29/49716* (2015.01)

(58) Field of Classification Search
CPC .. G02B 6/0018; G02B 6/0076; G02B 6/0028; G02B 6/08; G02B 6/0086; G02B 6/0088; G02B 6/0081; G02B 6/008; G02B 6/04; G02B 6/3885; G02F 1/133606
USPC .............................. 362/554, 556, 632–634
See application file for complete search history.

(56) References Cited

U.S. PATENT DOCUMENTS

| | | |
|---|---|---|
| 6,933,944 B2 | 8/2005 | Kaneko et al. |
| 7,413,336 B2 | 8/2008 | Freking et al. |
| 7,384,173 B2 | 10/2008 | Whitney |
| 8,098,347 B2 | 1/2012 | Brott et al. |
| 2005/0046921 A1 | 3/2005 | Govil et al. |
| 2005/0264730 A1 | 12/2005 | Katoaka et al. |
| 2008/0285310 A1 | 11/2008 | Aylward et al. |
| 2009/0034292 A1 | 2/2009 | Pokrovskiy et al. |
| 2009/0257108 A1 | 10/2009 | Gruhlke et al. |
| 2010/0053148 A1 | 3/2010 | Khazeni et al. |
| 2012/0229531 A1 | 9/2012 | Yata et al. |
| 2013/0038928 A1 | 2/2013 | Padiyath et al. |

\* cited by examiner

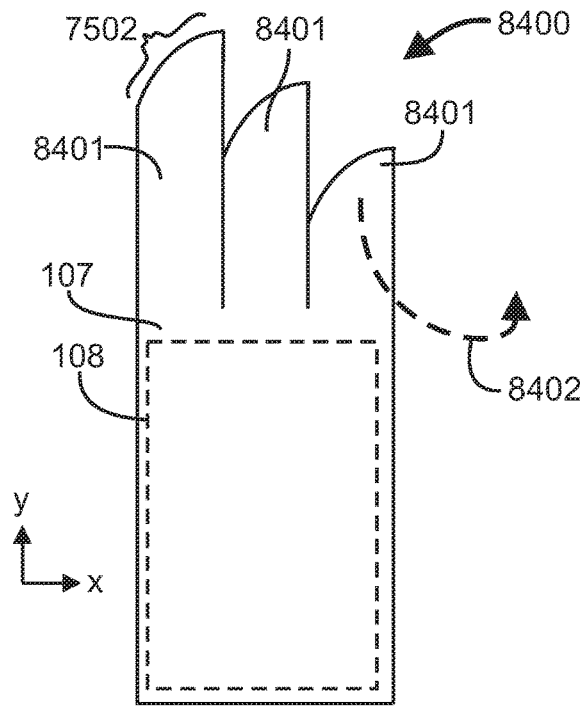
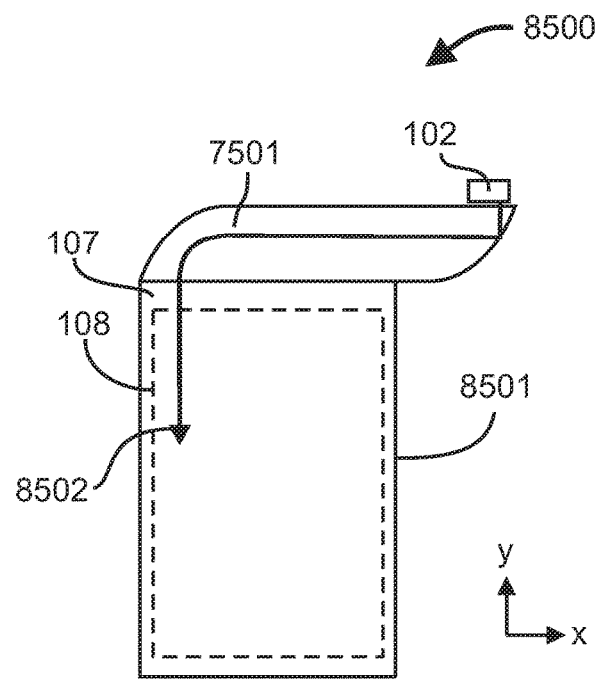
FIG. 84
FIG. 85
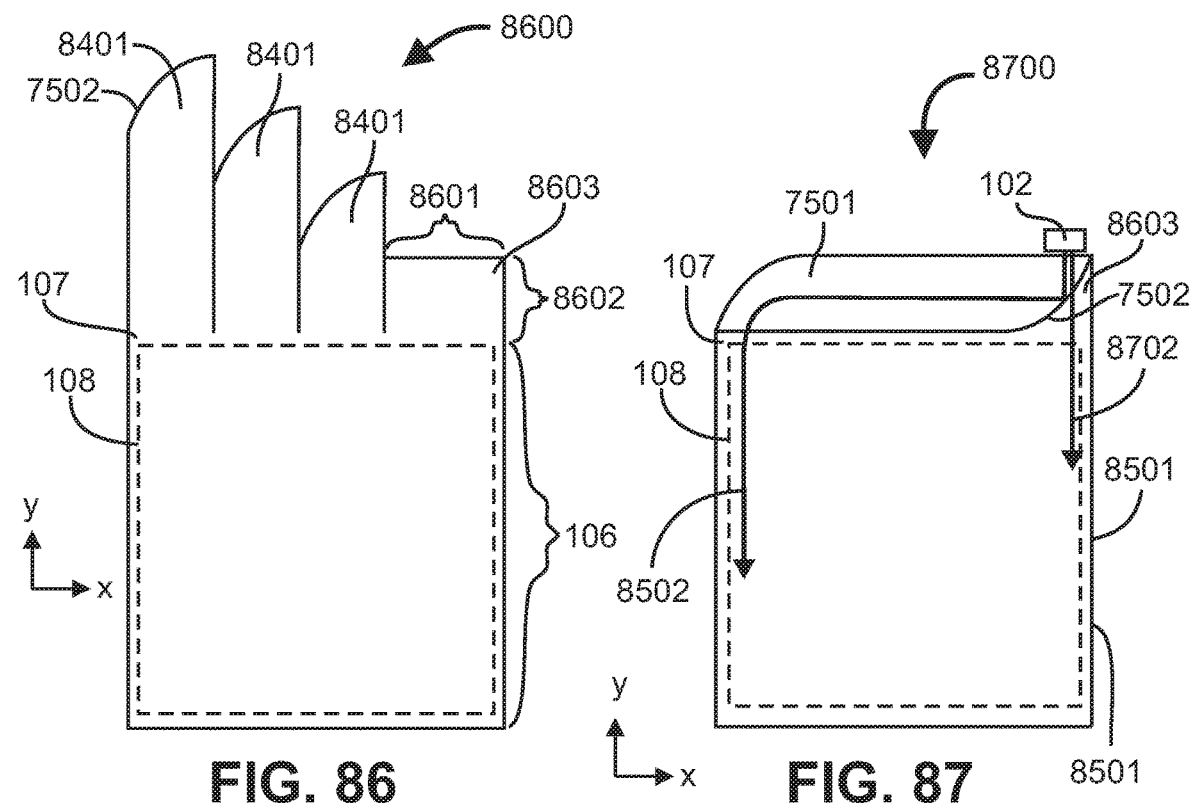
FIG. 86
FIG. 87

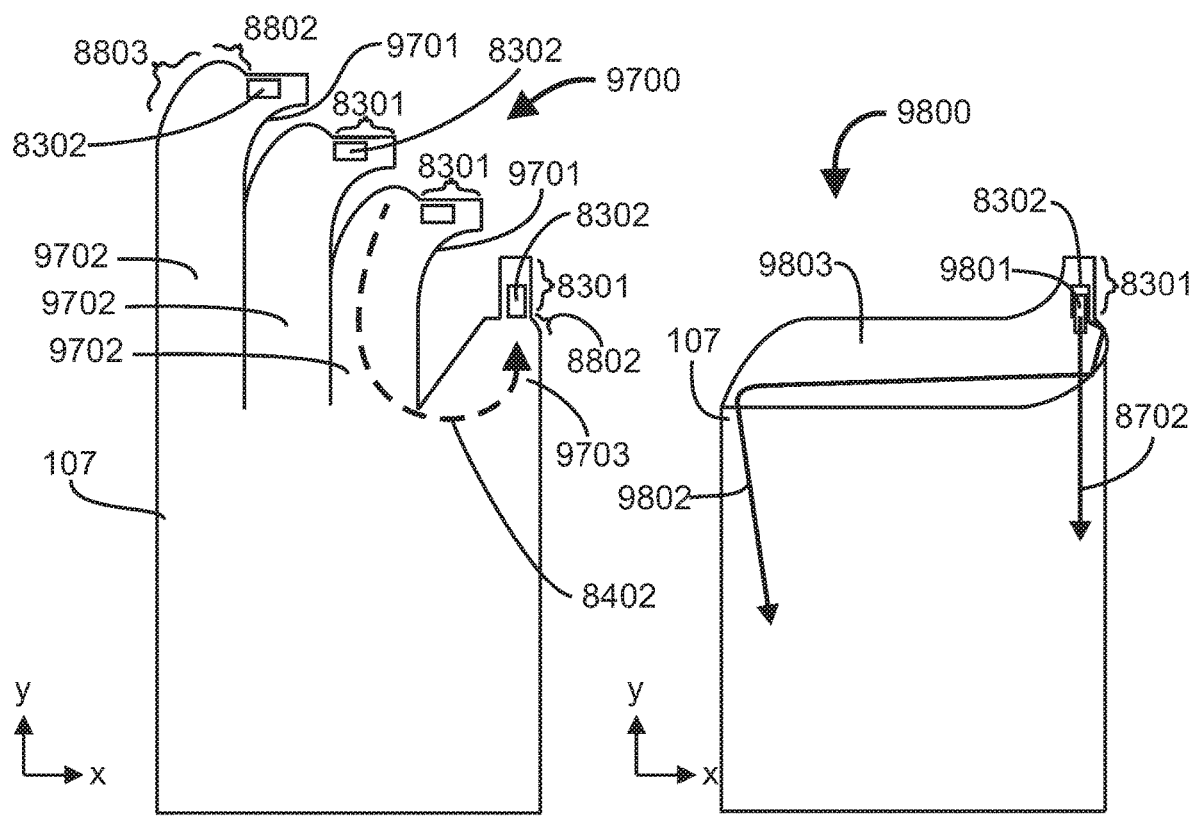
FIG. 97
FIG. 98
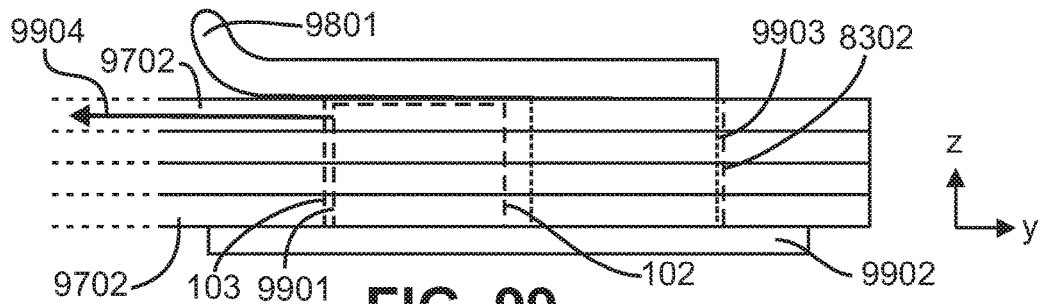
FIG. 99
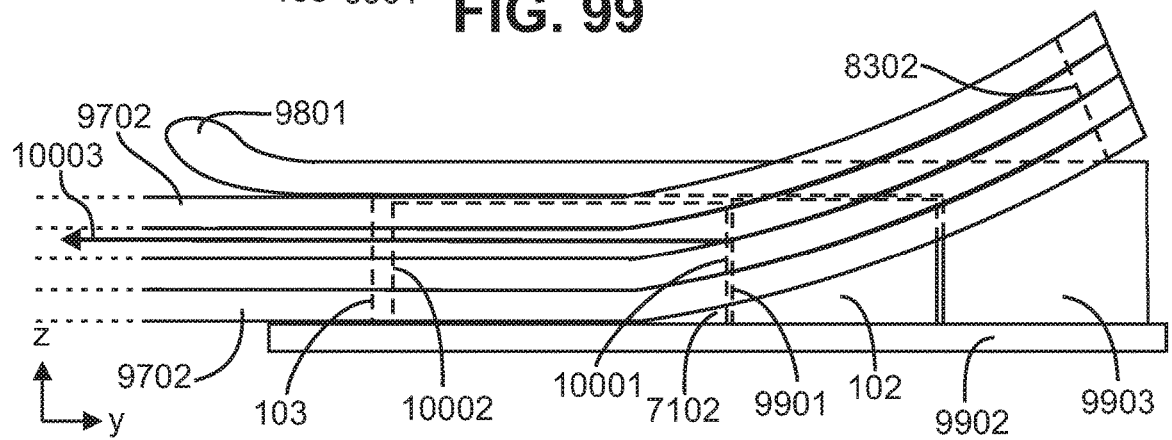
FIG. 100

FILM-BASED LIGHTGUIDE WITH BEND POSITIONING STRIPS BEHIND AN EXTRACTION REGION

CROSS REFERENCE TO RELATED APPLICATION

This application is a continuation of U.S. application Ser. No. 16/240,765 filed Jan. 6, 2019 entitled "Light emitting device comprising a film-based lightguide restrained by a component conducting heat from a light source," which is a continuation of U.S. application Ser. No. 15/336,497 filed Oct. 27, 2017 entitled "Light emitting device comprising a film-based lightguide and reduced cladding layer at the input surface," which is a continuation of U.S. application Ser. No. 14/550,510 filed Nov. 21, 2014 entitled "Device comprising a film-based lightguide and component with angled teeth," which is a continuation of U.S. application Ser. No. 13/089,308 filed Apr. 18, 2011 entitled "Light emitting device comprising a lightguide film" which is a continuation-in-part application of International Application No. PCT/US10/022066 filed Jan. 26, 2010, which claims the benefit of U.S. Provisional Application No. 61/147,215 entitled "Method and apparatus for assembly of a film optical coupling mechanism" filed Jan. 26, 2009, and U.S. Provisional Patent Application No. 61/147,237 entitled "Edge Minimization with Edge-Lit Film" filed Jan. 26, 2009; and this application claims the benefit of U.S. Provisional Application No. 61/325,266, entitled "Replaceable illuminated signage system for cooler doors," filed Apr. 16, 2010; U.S. Provisional Application No. 61/325,252, entitled "Manufacturing device for ultra-low profile film lightguide," filed Apr. 16, 2010; U.S. Provisional Application No. 61/325,269, entitled "Processing method for optical film lightguide and coupling system," filed Apr. 16, 2010; U.S. Provisional Application No. 61/325,271, entitled "Method and apparatus for aligning lightguides in a coupling system," filed Apr. 16, 2010; U.S. Provisional Application No. 61/325,272, entitled "Center aligned lighting configuration for ultra-thin LED backlight system for LCDs," filed Apr. 16, 2010; U.S. Provisional Application No. 61/325,275, entitled "Low profile battery powered lightguide," filed Apr. 16, 2010; U.S. Provisional Application No. 61/325,277, entitled "Method and apparatus for enhanced LCD backlight," filed Apr. 16, 2010; U.S. Provisional Application No. 61/325,280, entitled "Film coupling system with light propagation modifications," filed Apr. 16, 2010; U.S. Provisional Application No. 61/325,282, entitled "Heatsinking methods for compact film light guide systems," filed Apr. 16, 2010; U.S. Provisional Application No. 61/325,262, entitled "Lamination method for a multi-layer optical lightguide film," filed Apr. 16, 2010; U.S. Provisional Application No. 61/325,270, entitled "Edge-enhancement for film coupling technology," filed Apr. 16, 2010; U.S. Provisional Application No. 61/325,265, entitled "Colored surface illumination by mixing dyes and scattering features into ink," filed on Apr. 16, 2010; U.S. Provisional Application No. 61/347,567, entitled "Light emitting device comprising a film-based lightguide," filed May 24, 2010; U.S. Provisional Application No. 61/363,342, entitled "Film lightguide with light redirecting elements," filed Jul. 12, 2010; U.S. Provisional Application No. 61/368,560, entitled "Light emitting device with optical redundancy," filed Jul. 28, 2010; U.S. Provisional Application No. 61/377,888, entitled "Light emitting device comprising a lightguide film," filed Aug. 27, 2010; U.S. Provisional Application No. 61/381,077, entitled "Light emitting device with externally or internally controlled output," filed Sep. 9, 2010; U.S. Provisional Application No. 61/415,250, entitled "Light emitting device comprising a lightguide film and light turning optical element," filed Nov. 18, 2010; U.S. Provisional Application No. 61/425,328, entitled "Light emitting device comprising a removable and replaceable lightguide," filed Dec. 21, 2010; U.S. Provisional Application No. 61/441,871, entitled "Front illumination device comprising a film based lightguide," filed Feb. 11, 2011; and U.S. Provisional Application No. 61/450,711, entitled "Illumination device comprising a film based lightguide," filed on Mar. 9, 2011, the entire contents of each of which are incorporated herein by reference.

TECHNICAL FIELD

The subject matter disclosed herein generally relates to light emitting devices such as luminous signs, light fixtures, backlights, light emitting signs, passive displays, and active displays and their components and method of manufacture.

BACKGROUND

Traditionally, in order to reduce the thickness of displays such as liquid crystal-based displays, signs, and backlights, edge-lit configurations using rigid lightguides have been used to receive light from the edge and direct it out of a larger area face. These types of light emitting devices are typically housed in relatively thick, rigid frames that do not allow for component or device flexibility and require long lead times for design changes. The volume of these devices remains large and often includes thick or large frames or bezels around the device. The thick lightguides (typically 2 mm and larger) limit the design configurations, production methods, and illumination modes.

The ability to further reduce the thickness and overall volume of these area light emitting devices has been limited by the ability to couple sufficient light flux into a thinner lightguide. Typical LED light sources have a light emitting area dimension of at least 1 mm, and there is often difficulty controlling the light entering, propagating through, and coupled out of a 2 mm lightguide to meet design requirements. The displays incorporating the 2 mm lightguides are typically limited to small displays such as those with a 33 cm diagonal or less. Many system sizes are thick due to designs that use large light sources and large input coupling optics or methods. Some systems using one lightguide per pixel (such as fiber optic-based systems) require a large volume and have low alignment tolerances. In production, thin lightguides have been limited to coatings on rigid wafers for integrated optical components.

SUMMARY

In one embodiment, a device comprises a film-based lightguide comprises a major sheet area comprising a light extracting region and a minor sheet area positioned between the major sheet area and an array of strips extended from the minor sheet area. Each strip of the array of strips is bent and stacked such that stacked ends of the array of strips define an input surface. The lightguide further comprises a bend in the minor sheet area that positions the array of strips behind the major sheet area in a thickness direction of the film in the major sheet area. In one embodiment, the bend in the minor sheet area bends the film by an angle of 180 degrees. In another embodiment, the bend in the minor sheet area positions the light input surface behind the major sheet area in the thickness direction of the film in the major sheet area.

In one embodiment, a device comprising the film based lightguide further comprises at least one light source positioned to emit light into the light input surface and positioned behind the major sheet area in the thickness direction of the film in the major sheet area. In another embodiment, the light input surface and/or the at least one light source is positioned between the edges of the film bounding the major sheet area. In another embodiment, the device comprises a display panel with a front viewing side and a back side opposite the front viewing side wherein light from the at least one light source propagates by total internal reflection through the array of strips and the minor sheet area, propagates into the major sheet area, is emitted from the major sheet area in the light extracting region, and propagates toward the display panel. In one embodiment, the device further comprises a heatsink positioned behind the major sheet area in the thickness direction of the film in the major sheet area. In another embodiment, the display panel comprises a frame around a light emitting area of the display panel that receives light from the major sheet area, and the at least one light source is housed outside of the frame around the light emitting area of the display panel. In one embodiment, the at least one light source illuminates the display panel from the back side of the display panel. In another embodiment, the light from the at least one light source illuminates the display panel from the front viewing side of the display panel. In one embodiment, the display panel comprises electrical leads extending from a first side of the display panel, and the bend in the minor sheet area is positioned at the first side of the display panel. In one embodiment, the device comprises a frame restraining the array of strips, the frame positioned behind the major sheet area in the thickness direction of the film in the major sheet area. In one embodiment, the film comprises a thickness in the thickness direction and the bend in the minor sheet area comprises a radius of curvature between 8 times and 25 times the thickness of the film. In one embodiment, the device comprises at least one frame member, the at least one frame member comprising a first inner face and a second inner face, wherein the array of strips are positioned between the first inner face and the second inner face, and the at least one frame member is positioned behind the major sheet area in the thickness direction of the film in the major sheet area. In one embodiment, a film illumination device comprises a film comprising a major sheet area of the film, the major sheet area comprising a light extracting region positioned to receive and extract light propagating by total internal reflection out of the major sheet area; a minor sheet area of the film between the major sheet area and an array of strips, the array of strips extended from the minor sheet area of the film with ends of the array of strips defining a light input surface; at least one light source positioned to emit light into the light input surface and positioned behind the major sheet area in a thickness direction of the film in the major sheet area; and a bend in the minor sheet area that positions the light input surface behind the major sheet area in the thickness direction of the film in the major sheet area.

In another embodiment, a film illumination device comprises a film comprising an array of strips extended along an edge of the film, the film comprising a major sheet area of the film with light extraction features, wherein each strip of the array of strips is bent and stacked such that ends of the array of strips are stacked; at least one light source positioned to emit light into the ends of the array of strips; and an area of the film between the major sheet area and the strips bent such that the array of strips, the ends of the array of strips, and the at least one light source are positioned behind the major sheet area in thickness direction of the film in the major sheet area. In a further embodiment, a method of manufacturing a lightguide comprises forming a light extraction region in a major sheet area of a film; forming an array of strips extending from a minor sheet area of the film, the minor sheet area positioned between the major sheet area and the array of strips; folding and stacking the array of strips; and bending the film in the minor sheet area such that the array of strips are positioned behind the light extraction region in a thickness direction of the film in the major sheet area. In one embodiment, bending the film in the minor sheet area bends the film at an angle of 180 degrees.

BRIEF DESCRIPTION OF THE DRAWINGS

FIG. 84 is a top view of one embodiment of a lightguide comprising coupling lightguides with light turning optical edges.

FIG. 85 is a top view of one embodiment of a light emitting device comprising the lightguide of FIG. 84 with the coupling lightguides folded such that they extend past a lateral edge.

FIG. 86 is a top view of one embodiment of a lightguide comprising a non-folded coupling lightguide.

FIG. 87 is a top view of one embodiment of a light emitting device comprising the lightguide of FIG. 86 wherein the coupling lightguides are folded.

FIG. 97 is a top view of one embodiment of a film-based lightguide comprising coupling lightguides with light turning optical edges, light collimating optical edges, and light source overlay tab regions comprising alignment cavities.

FIG. 98 is a top view of one embodiment of a light emitting device comprising the film-based lightguide of FIG. 97 folded to a stack of coupling lightguides positioned over a light source and guided in the z direction by an alignment guide.

FIG. 99 is a side view of the light emitting device embodiment of FIG. 98 in the region near the light source.

FIG. 100 is a side view of a region of one embodiment of a light emitting device with coupling lightguides with alignment cavities that do not extend to fit completely over the alignment guide.

FIG. 101 is a perspective view of one embodiment of a light emitting transparent sign comprising a lightguide disposed adjacent a window of an automobile.

FIG. 102 is a perspective view of one embodiment of a light emitting transparent sign comprising a lightguide disposed adjacent a trunk door of an automobile.

FIG. 103 is a perspective view of one embodiment of a light emitting sign comprising a light input coupler, a lightguide region, and light emitting region comprising indicia.

FIG. 104 is an enlarged section of a light emitting region of the light emitting sign of FIG. 103 comprising the light emitting indicia comprising light extraction features.

FIG. 105 is a block diagram of a method of producing a device.

FIG. 106 is a perspective view of an exemplary first frame member, an exemplary second frame member, and an exemplary film sheet having film strips extending from a major sheet area, with these components being assembled as shown in order to generate an exemplary illumination device.

FIG. 107 is a perspective view of the first frame member, second frame member, and film sheet wherein the frame members are being urged toward each other about the film strips to begin bending the film strips into parallel relation.

FIG. 108 is a perspective view continuing from FIG. 107, wherein the frame members are further urged toward each other to further bend the film strips into parallel relation.

FIG. 109 is a perspective view continuing from FIG. 108, wherein a cover member is beginning advancement alongside the frame members and to bend the parallel film strips into abutting stacked relationship.

FIG. 110 is a perspective view showing the illumination device of FIG. 115 with the film sheet bent to situate the frame and strip stack behind the major area the film sheet, and with the major area of the film sheet illuminating a display panel.

FIG. 111 is a perspective view of an exemplary first frame member, an exemplary second frame member, and an exemplary film sheet having a major sheet area and an adjacent minor sheet area from which film strips extend, with these components being assembled as shown in FIG. 112 to generate an exemplary illumination device as in FIG. 113.

FIG. 112 is a perspective view of the first frame member, second frame member, and film sheet of FIG. 111, wherein the frame members are urged toward each other to bend the film strips into two arrays of parallel strips.

Figure 112:
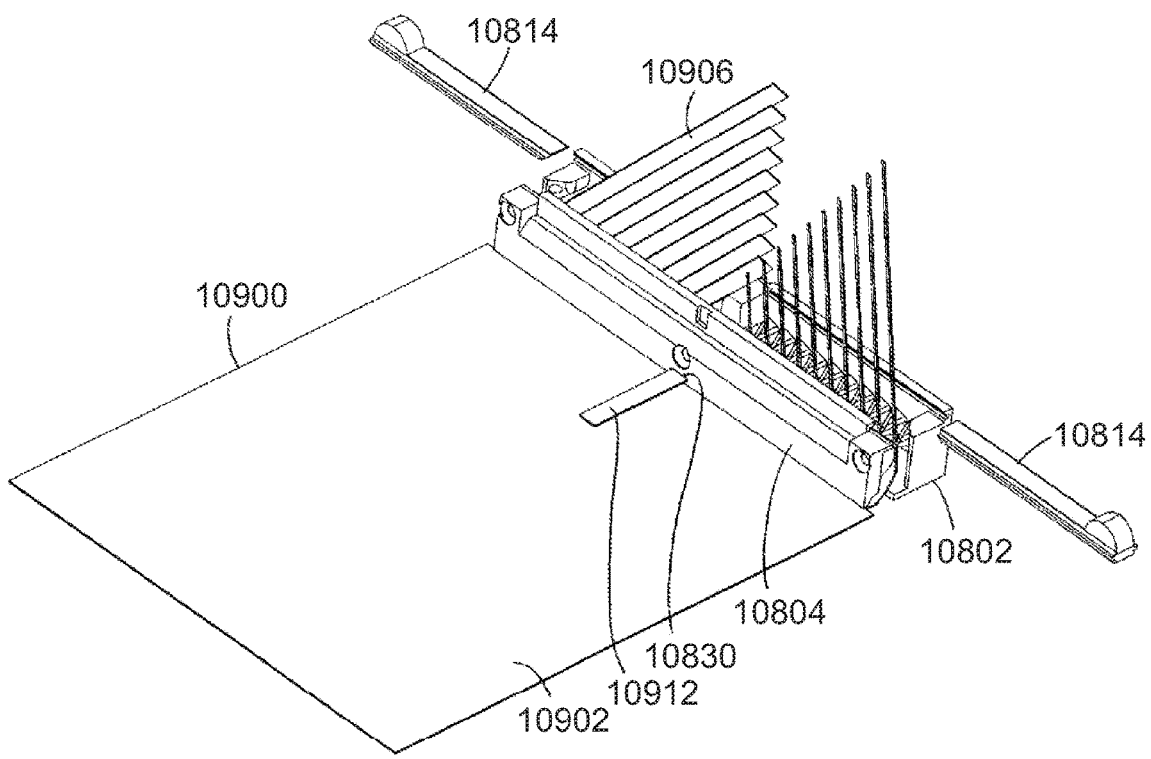
Figure 113:
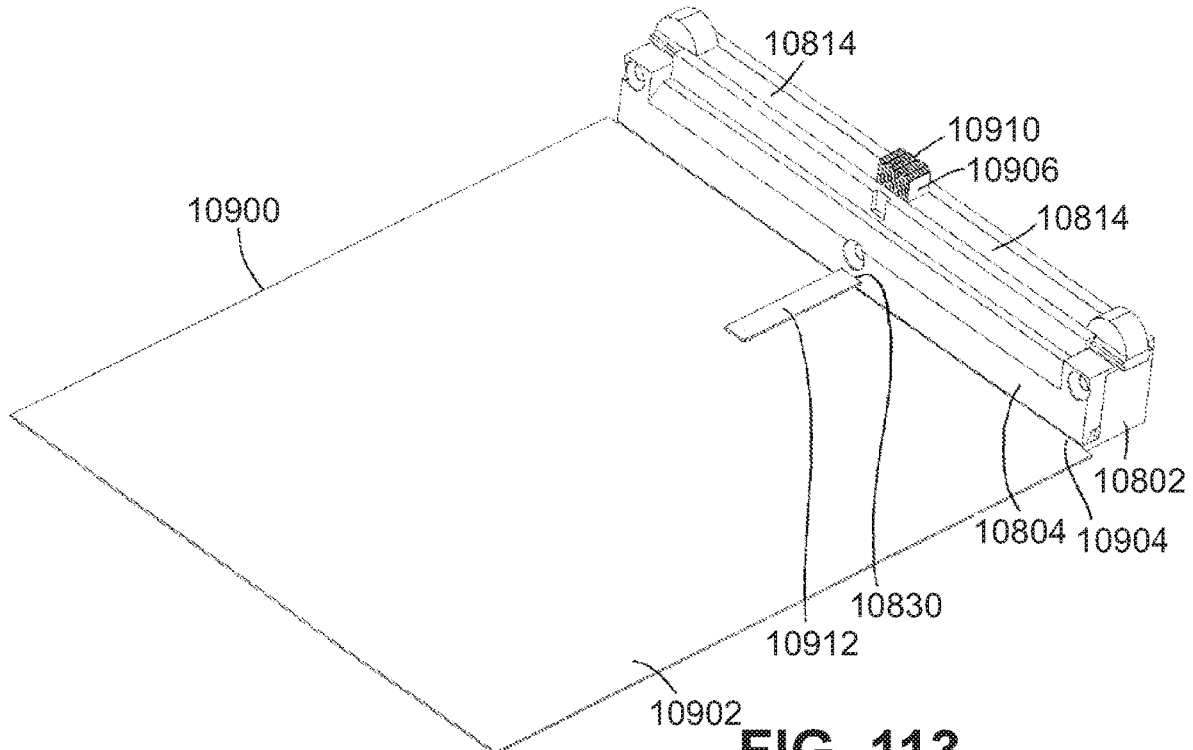

FIG. 113 is a perspective view continuing from FIG. 112, showing an illumination device resulting after cover members have bent the film strips into abutting stacked relationship to generate a strip stack.

Figure 114:
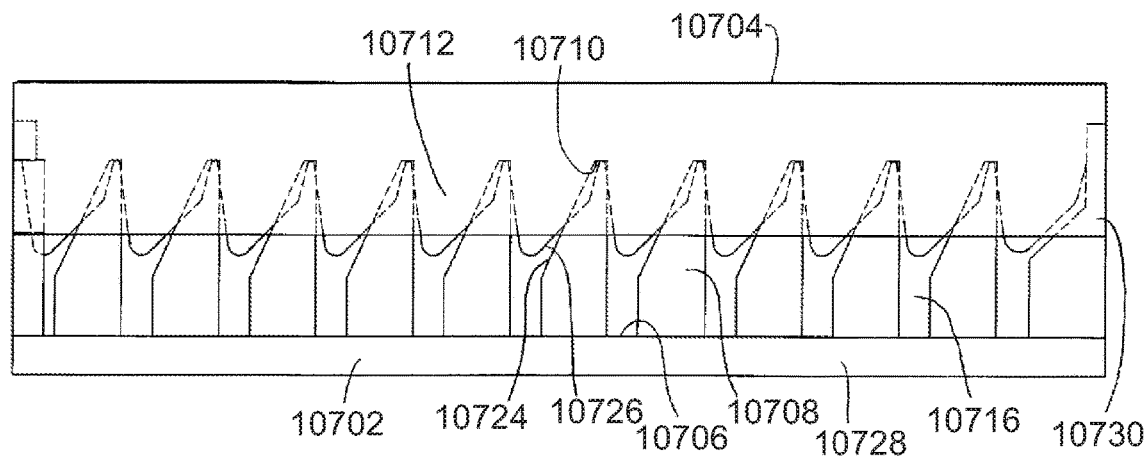

FIG. 114 is a top view of the frame members and as they are moved together into abutment, showing the relative locations of their first member teeth and second member teeth.

Figure 109:
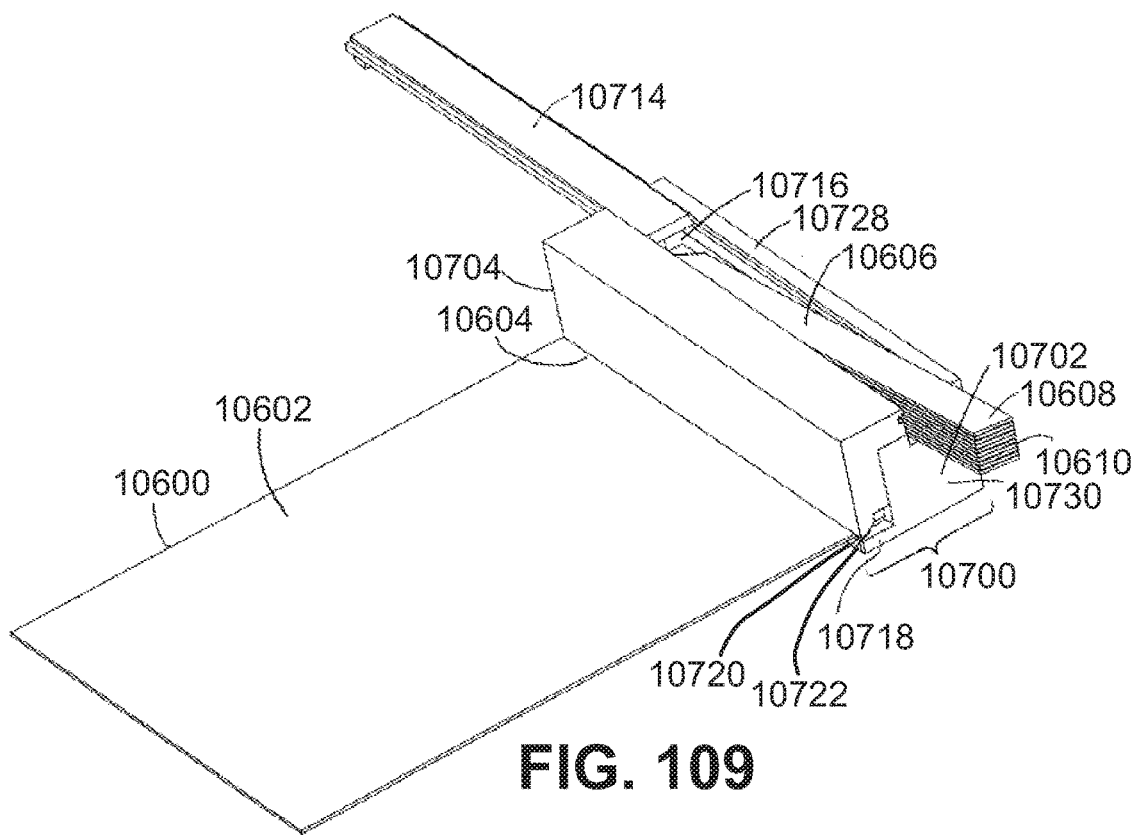
Figure 115:
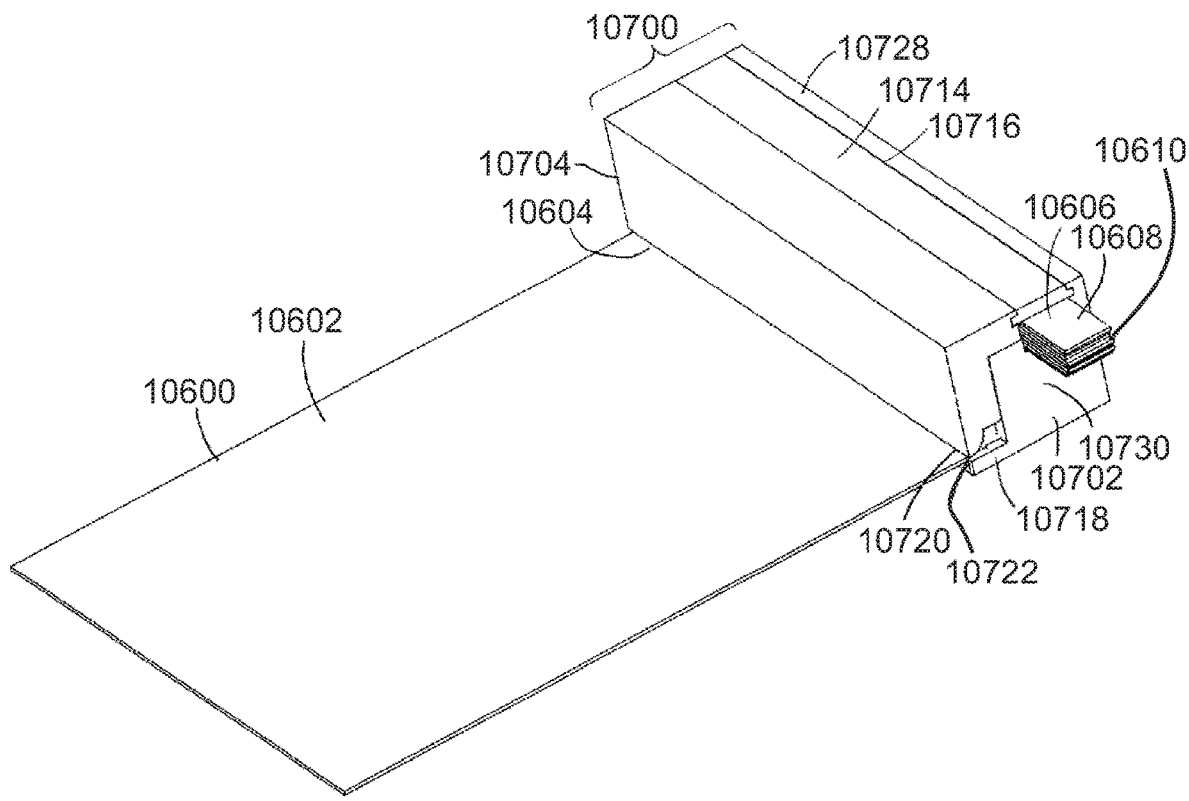

FIG. 115 is a perspective view continuing from FIG. 109, showing an illumination device resulting after the cover member has completed bending the film strips into abutting stacked relationship to generate a strip stack.

DETAILED DESCRIPTION

The features and other details of several embodiments will now be more particularly described. It will be understood that particular embodiments described herein are shown by way of illustration and not as limitations. The principal features can be employed in various embodiments without departing from the scope of any particular embodiment. All parts and percentages are by weight unless otherwise specified.

Definitions

"Electroluminescent sign" is defined herein as a means for displaying information wherein the legend, message, image or indicia thereon is formed by or made more apparent by an electrically excitable source of illumination. This includes illuminated cards, transparencies, pictures, printed graphics, fluorescent signs, neon signs, channel letter signs, light box signs, bus-stop signs, illuminated advertising signs, EL (electroluminescent) signs, LED signs, edge-lit signs, advertising displays, liquid crystal displays, electrophoretic displays, point of purchase displays, directional signs, illuminated pictures, and other information display signs. Electroluminescent signs can be self-luminous (emissive), back-illuminated (back-lit), front illuminated (front-lit), edge-illuminated (edge-lit), waveguide-illuminated or other configurations wherein light from a light source is directed through static or dynamic means for creating images or indicia.

"Optically coupled" as defined herein refers to coupling of two or more regions or layers such that the luminance of light passing from one region to the other is not substantially reduced by Fresnel interfacial reflection losses due to differences in refractive indices between the regions. "Optical coupling" methods include methods of coupling wherein the two regions coupled together have similar refractive indices or using an optical adhesive with a refractive index substantially near or between the refractive index of the regions or layers. Examples of "optical coupling" include, without limitation, lamination using an index-matched optical adhesive, coating a region or layer onto another region or layer, or hot lamination using applied pressure to join two or more layers or regions that have substantially close refractive indices. Thermal transferring is another method that can be used to optically couple two regions of material. Forming, altering, printing, or applying a material on the surface of another material are other examples of optically coupling two materials. "Optically coupled" also includes forming, adding, or removing regions, features, or materials of a first refractive index within a volume of a material of a second refractive index such that light travels from the first material to the second material. For example, a white light scattering ink (such as titanium dioxide in a methacrylate, vinyl, or polyurethane based binder) may be optically coupled to a surface of a polycarbonate or silicone film by inkjet printing the ink onto the surface. Similarly, a light scattering material such as titanium dioxide in a solvent applied to a surface may allow the light scattering material to penetrate or adhere in close physical contact with the surface of a polycarbonate or silicone film such that it is optically coupled to the film surface or volume.

"Light guide" or "waveguide" refers to a region bounded by the condition that light rays propagating at an angle that is larger than the critical angle will reflect and remain within the region. In a light guide, the light will reflect or TIR (totally internally reflect) if it the angle ($\alpha$) satisfies the condition $$\alpha > \sin^{-1}(n_2/n_1),$$

where $n_1$ is the refractive index of the medium inside the light guide and $n_2$ is the refractive index of the medium outside the light guide. Typically, $n_2$ is air with a refractive index of $n \approx 1$, however, high and low refractive index materials can be used to achieve light guide regions. The light guide may comprise reflective components such as reflective films, aluminized coatings, surface relief features, and other components that can re-direct or reflect light. The light guide may also contain non-scattering regions such as substrates. Light can be incident on a lightguide region from the sides or below and surface relief features or light scattering domains, phases or elements within the region can direct light into larger angles such that it totally internally reflects or into smaller angles such that the light escapes the light guide. The light guide does not need to be optically coupled to all of its components to be considered as a light guide. Light may enter from any face (or interfacial refractive index boundary) of the waveguide region and may totally internally reflect from the same or another refractive index interfacial boundary A region can be functional as a waveguide or lightguide for purposes illustrated herein as long as the thickness is larger than the wavelength of light of interest. For example, a light guide may be a 5 micron region or layer of a film or it may be a 3 millimeter sheet comprising a light transmitting polymer.

"In contact" and "disposed on" are used generally to describe that two items are adjacent one another such that the whole item can function as desired. This may mean that additional materials can be present between the adjacent items, as long as the item can function as desired.

A "film" as used herein refers to a thin extended region, membrane, or layer of material.

A "bend" as used herein refers to a deformation or transformation in shape by the movement of a first region of an element relative to a second region, for example. Examples of bends include the bending of a clothes rod when heavy clothes are hung on the rod or rolling up a paper document to fit it into a cylindrical mailing tube. A "fold" as used herein is a type of bend and refers to the bend or lay of one region of an element onto a second region such that the first region covers at least a portion of the second region. An example of a fold includes bending a letter and forming creases to place it in an envelope. A fold does not require that all regions of the element overlap. A bend or fold may be a change in the direction along a first direction along a surface of the object. A fold or bend may or may not have creases and the bend or fold may occur in one or more directions or planes such as 90 degrees or 45 degrees. A bend or fold may be lateral, vertical, torsional, or a combination thereof.

Light Emitting Device

In one embodiment, a light emitting device comprises a first light source, a light input coupler, a light mixing region, and a lightguide comprising a light emitting region with a light extraction feature. In one embodiment, the first light source has a first light source emitting surface, the light input coupler comprises an input surface disposed to receive light from the first light source and transmit the light through the light input coupler by total internal reflection through a plurality of coupling lightguides. In this embodiment, light exiting the coupling lightguides is re-combined and mixed in a light mixing region and directed through total internal reflection within a lightguide or lightguide region. Within the lightguide, a portion of incident light is directed within the light extracting region by light extracting features into a condition whereupon the angle of light is less than the critical angle for the lightguide and the directed light exits the lightguide through the lightguide light emitting surface.

In a further embodiment, the lightguide is a film with light extracting features below a light emitting device output surface within the film and film is separated into coupling lightguide strips which are folded such that they form a light input coupler with a first input surface formed by the collection of edges of the coupling lightguides.

In one embodiment, the light emitting device has an optical axis defined herein as the direction of peak luminous intensity for light emitting from the light emitting surface or region of the device for devices with output profiles with one peak. For optical output profiles with more than one peak and the output is symmetrical about an axis, such as with a "batwing" type profile, the optical axis of the light emitting device is the axis of symmetry of the light output. In light emitting devices with angular luminous intensity optical output profiles with more than one peak which are not symmetrical about an axis, the light emitting device optical axis is the angular weighted average of the luminous intensity output. For non-planar output surfaces, the light emitting device optical axis is evaluated in two orthogonal output planes and may be a constant direction in a first output plane and at a varying angle in a second output plane orthogonal to the first output plane. For example, light emitting from a cylindrical light emitting surface may have a peak angular luminous intensity (thus light emitting device optical axis) in a light output plane that does not comprise the curved output surface profile and the angle of luminous intensity could be substantially constant about a rotational axis around the cylindrical surface in an output plane comprising the curved surface profile, and thus the peak angular intensity is a range of angles. When the light emitting device has a light emitting device optical axis in a range of angles, the optical axis of the light emitting device comprises the range of angles or an angle chosen within the range. The optical axis of a lens or element is the direction of which there is some degree of rotational symmetry in at least one plane and as used herein corresponds to the mechanical axis. The optical axis of the region, surface, area, or collection of lenses or elements may differ from the optical axis of the lens or element, and as used herein is dependent on the incident light angular and spatial profile, such as in the case of off-axis illumination of a lens or element.

Light Input Coupler

In one embodiment, a light input coupler comprises a plurality of coupling lightguides disposed to receive light emitting from light source and channel the light into a lightguide. In one embodiment, the plurality of coupling lightguides are strips cut from a lightguide film such that they remain un-cut on at least one edge but can be rotated or positioned (or translated) substantially independently from the lightguide to couple light through at least one edge or surface of the strip. In another embodiment, the plurality of coupling lightguides are not cut from the lightguide film and are separately optically coupled to the light source and the lightguide. In one embodiment, the light input coupler comprises at least one light source optically coupled to the coupling lightguides which join together in a light mixing region. In another embodiment, the light input coupler is a collection of strip sections cut from a region film which are arranged in a grouping such that light may enter through the edge of a grouping or arrangement of strips. In another embodiment, the light emitting device comprises a light input coupler comprising a core region of a core material and a cladding region or cladding layer of a cladding material on at least one face or edge of the core material with a refractive index less than the core material. In other embodiment, the light input coupler comprises a plurality of coupling lightguides wherein a portion of light from a light source incident on the face of at least one strip is directed into the lightguide such that it propagates in a waveguide condition. The light input coupler may also comprise at least one selected from the group: a strip folding device, a strip holding element, and an input surface optical element.

Light Source

In one embodiment, a light emitting device comprises at least one light source selected from a group: fluorescent lamp, cylindrical cold-cathode fluorescent lamp, flat fluorescent lamp, light emitting diode, organic light emitting diode, field emissive lamp, gas discharge lamp, neon lamp, filament lamp, incandescent lamp, electroluminescent lamp, radiofluorescent lamp, halogen lamp, incandescent lamp, mercury vapor lamp, sodium vapor lamp, high pressure sodium lamp, metal halide lamp, tungsten lamp, carbon arc lamp, electroluminescent lamp, laser, photonic bandgap based light source, quantum dot based light source, high efficiency plasma light source, microplasma lamp. The light emitting device may comprise a plurality of light sources arranged in an array, on opposite sides of lightguide, on orthogonal sides of a lightguide, on 3 or more sides of a lightguide, or on 4 sides of a substantially planer lightguide. The array of light sources may be a linear array with discrete LED packages comprises at least one LED die. In another embodiment, a light emitting device comprises a plurality of light sources within one package disposed to emit light toward a light input surface. In one embodiment, the light emitting device comprises 1, 2, 3, 4, 5, 6, 8, 9, 10, or more than 10 light sources. In another embodiment, the light emitting device comprises an organic light emitting diode disposed to emit light as a light emitting film or sheet. In another embodiment, the light emitting device comprises an organic light emitting diode disposed to emit light into a lightguide.

In one embodiment, a light emitting device comprises at least one broadband light source that emits light in a wavelength spectrum larger than 100 nanometers. In another embodiment, a light emitting device comprises at least one narrowband light source that emits light in a narrow bandwidth less than 100 nanometers. In another embodiment, a light emitting device comprises at least one broadband light source that emits light in a wavelength spectrum larger than 100 nanometers or at least one narrowband light source that emits light in a narrow bandwidth less than 100 nanometers. In one embodiment a light emitting device comprises at least one narrowband light source with a peak wavelength within a range selected from the group: 300 nm-350 nm, 350 nm-400 nm, 400 nm-450 nm, 450 nm-500 nm, 500 nm-550 nm, 550 nm-600 nm, 600 nm-650 nm, 650 nm-700 nm, 700 nm-750 nm, 750 nm-800 nm, and 800 nm-1200 nm. The light sources may be chosen to match the spectral qualities of red, green and blue such that collectively when used in a light emitting device used as a display, the color gamut area is at least one selected from the group: 70% NTSC, 80% NTSC, 90% NTSC, 100% NTSC, and 60%, 70%, 80%, 90%, and 95% of the visible CIE u' v' color gamut of a standard viewer. In one embodiment, at least one light source is a white LED package comprising a red, green, and blue LED.

In another embodiment, at least two light sources with different colors are disposed to couple light into the lightguide through at least one light input coupler. In another embodiment, a light emitting device comprises at least three light input couplers, at least three light sources with different colors (red, green and blue for example) and at least three lightguides. In another embodiment, a light source further comprises at least one selected from the group: reflective optic, reflector, reflector cup, collimator, primary optic, secondary optic, collimating lens, compound parabolic collimator, lens, reflective region and input coupling optic. The light source may also comprise an optical path folding optic such as a curved reflector that can enable the light source (and possibly heat-sink) to be oriented along a different edge of the light emitting device. The light source may also comprise a photonic bandgap structure, nanostructure or other three-dimensional arrangement that provides light output with an angular FWHM less than one selected from the group: 120 degrees, 100 degrees, 80 degrees, 60 degrees, 40 degrees, and 20 degrees.

In another embodiment, a light emitting device comprises a light source emitting light in an angular full-width at half maximum intensity of less than one selected from 150 degrees, 120 degrees, 100 degrees, 80 degrees, 70 degrees, 60 degrees, 50 degrees, 40 degrees, 30 degrees, 20 degrees, and 10 degrees. In another embodiment, the light source further comprises at least one selected from the group: a primary optic, secondary optic, and photonic bandgap region and the angular full-width at half maximum intensity of the light source is less than one selected from 150 degrees, 120 degrees, 100 degrees, 80 degrees, 70 degrees, 60 degrees, 50 degrees, 40 degrees, 30 degrees, 20 degrees, and 10 degrees.

LED Array

In one embodiment, the light emitting device comprises a plurality of LEDs or LED packages wherein the plurality of LEDs or LED packages comprises an array of LEDs. The array components (LEDs or electrical components) may be physically (and/or electrically) coupled to a single circuit board or they may be coupled to a plurality of circuit boards that may or may not be directly physically coupled (i.e. such as not on the same circuit board). In one embodiment, the array of LEDs is an array comprising at least two selected from the group: red, green, blue, and white LEDs. In this embodiment, the variation in the white point due to manufacturing or component variations can be reduced. In another embodiment, the LED array comprises at least one cool white LED and one red LED. In this embodiment, the CRI, or Color Rendering Index, is higher than the cool white LED illumination alone. In one embodiment, the CRI of at least one selected from the group: a light emitting region, the light emitting surface, light fixture, light emitting device, display driven in a white mode comprising the light emitting device, and sign is greater than one selected from the group: 70, 75, 80, 85, 90, 95, and 99. In another embodiment, the NIST Color Quality Scale (CQS) of at least one selected from the group: a light emitting region, the light emitting surface, light fixture, light emitting device, display driven in a white mode comprising the light emitting device, or sign is greater than one selected from the group: 70, 75, 80, 85, 90, 95, and 99. In another embodiment, a display comprising the light emitting device has a color gamut greater than 70%, 80%, 85%, 90%, 95%, 100%, 105%, 110%, 120%, and 130% that of the NTSC standard. In another embodiment, the LED array comprises white, green, and red LEDs. In another embodiment, the LED array comprises at least one green and blue LED and two types of red LEDs with one type having a lower luminous efficacy or a lower wavelength than the other type of red LED. As used herein, the white LED may be a phosphor converted blue LED or a phosphor converted UV LED.

In another embodiment, the input array of LEDs can be arranged to compensate for uneven absorption of light through longer verses shorter lightguides. In another embodiment, the absorption is compensated for by directing more light into the light input coupler corresponding to the longer coupling lightguides or longer lightguides. In another embodiment, light within a first wavelength band is absorbed within the lightguide more than light within a second wavelength band and a first ratio of the radiant light flux coupled into the light input coupler within the first wavelength band divided by the radiant light flux coupled into the light input coupler within the second wavelength band is greater than a second ratio of the radiant light flux emitted from the light emitting region within the first wavelength band divided by the radiant light flux emitted from the light emitting region within the second wavelength band.

Laser

In one embodiment, the light emitting device comprises one or more lasers disposed to couple light into one or more light input couplers or the surface of one or more coupling lightguides. In one embodiment, the divergence of one or more light sources is less than one selected from the group: 20 milliradians, 10 milliradians, 5 milliradians, 3 milliradians, and 2 milliradians. In another embodiment, the light mixing region comprises a light scattering or light reflecting region that increases the angular FWHM of the light from one or more lasers within the light mixing region before entering into the light emitting region of the lightguide or light emitting surface region of the light emitting device. In a further embodiment, the light scattering region within the light mixing region is a volumetric or surface light scattering region with an angular FWHM of transmitted light less than one selected from the group: 50 degrees, 40 degrees, 30 degrees, 20 degrees, 10 degrees, 5 degrees, and 2 degrees when measured normal to the large area surface of the film in the region with a 532 nm laser diode with a divergence less than 5 milliradians. In a further embodiment, the haze of the diffuser in the light mixing region is less than one selected from the group: 50%, 40%, 30%, 20%, 10%, 5%, and 2% when measured normal to the large area surface of the film (such as parallel to the light emitting surface).

Color Tuning

In one embodiment, the light emitting device comprises two or more light sources and the relative output of the two light sources is adjusted to achieve a desired color in a light emitting region of the lightguide or an area of light output on the light emitting device comprising a plurality of lightguides overlapping in the region. For example, in one embodiment, the light emitting device comprises a red, green, and blue LED disposed to couple light into the light input surface of a stack of coupling lightguides. The light mixes within the lightguide and is output in a light emitting region of the lightguide. By turning on the red and blue LEDs, for example, one can achieve a purple colored light emitting region. In another embodiment, the relative light output of the light sources is adjusted to compensate for the non-uniform spectral absorption in an optical element of the light emitting device. For example, in one embodiment, the output of the blue LED in milliwatts is increased to a level more than the red output in milliwatts in order to compensate for more blue light absorption in a lightguide (or blue light scattering) such that the light emitting region has a substantially white light output in a particular region.

LED Array Location

In one embodiment, a plurality of LED arrays are disposed to couple light into a single light input coupler or more than one light input coupler. In a further embodiment, a plurality of LEDs disposed on a circuit board are disposed to couple light into a plurality of light input couplers that direct light toward a plurality of sides of a light emitting device comprising a light emitting region. In a further embodiment, a light emitting device comprises an LED array and light input coupler folded behind the light emitting region of the light emitting device such that the LED array and light input coupler are not visible when viewing the center of the light emitting region at an angle perpendicular to the surface. In another embodiment, a light emitting device comprises a single LED array disposed to couple light into at least one light input coupler disposed to direct light into the light emitting region from the bottom region of a light emitting device. In one embodiment, a light emitting device comprises a first LED array and a second LED array disposed to couple light into a first light input coupler and a second light input coupler, respectively, wherein the first light input coupler and second light input coupler are disposed to direct light into the light emitting region from the top region and bottom region, respectively, of a light emitting device. In a further embodiment, a light emitting device comprises a first LED array, a second LED array, and a third LED array, disposed to couple light into a first light input coupler, a second light input coupler, and a third light input coupler, respectively, disposed to direct light into the light emitting region from the bottom region, left region, and right region, respectively, of a light emitting device. In another embodiment, a light emitting device comprises a first LED array, a second LED array, a third LED array, and a fourth LED array, disposed to couple light into a first light input coupler, a second light input coupler, a third light input coupler, and a fourth light input coupler, respectively, disposed to direct light into the light emitting region from the bottom region, left region, right region, and top region, respectively, of a light emitting device.

Wavelength Conversion Material

In another embodiment, the LED is a blue or ultraviolet LED combined with a phosphor. In another embodiment, a light emitting device comprises a light source with a first activating energy and a wavelength conversion material which converts a first portion of the first activating energy into a second wavelength different than the first. In another embodiment, the light emitting device comprises at least one wavelength conversion material selected from the group: a fluorophore, phosphor, a fluorescent dye, an inorganic phosphor, photonic bandgap material, a quantum dot material, a fluorescent protein, a fusion protein, a fluorophores attached to protein to specific functional groups (such as amino groups (active ester, carboxylate, isothiocyanate, hydrazine), carboxyl groups (carbodiimide), thiol (maleimide, acetyl bromide), azide (via click chemistry or non-specifically (glutaraldehyde))), quantum dot fluorophores, small molecule fluorophores, aromatic fluorophores, conjugated fluorophores, a fluorescent dye, and other wavelength conversion material.

In one embodiment, the light source comprises a semiconductor light emitter such as an LED and a wavelength conversion material that converts a portion of the light from the emitter to a shorter or longer wavelength. In another embodiment, at least one selected from the group: light input coupler, cladding region, coupling lightguide, input surface optic, coupling optic, light mixing region, lightguide, light extraction feature or region, and light emitting surface comprises a wavelength conversion material.

Dynamic Light Emitting Effects

In one embodiment, the light emitting device comprises a light source and a controller wherein the light is turned off and on in a flashing manner. The delay between the on to off transition and the delay between the off to on transition may be constant, variable, or equal to each other. For example, in one embodiment, a light emitting sign comprises a lightguide with light emitting indicia in the form of "OPEN" that flashes off for 1 second and then back on for 10 seconds before repeating the cycle. In another embodiment, the light emitting device comprises a first and second light source wherein by sequentially turning on the first light source and then the second light source, a dynamic sign effect is achieved. In another embodiment, the light output of one or more light sources is slowly decreased or increased such that a gradual fade-off or fade-on effect is achieved. The light sources may be disposed in the same or different light input couplers or lightguides. For example, in one embodiment, the light emitting device comprises a red LED light source disposed to couple light into a first set of coupling lightguides and a blue LED light source disposed to couple light into a second set of coupling lightguides. By switching the lights on and off in an alternating fashion, a dynamic sign effect can be achieved (to attract attention for example). In another example, in one embodiment, a light emitting device comprises three lightguides and three light input couplers disposed to receive light from three white light sources. The light extraction features on the three different lightguides form three different images suggesting movement of the images. In this embodiment, by cycling through the three white LEDs, the images will sequentially illuminate and suggest motion. In another embodiment, the relative output of two or more light sources in a light emitting device are adjusted such that the color, luminance, or both are changed in one or more light emitting regions. For example, in one embodiment, the light emitting device comprises a red, green, and blue LED disposed to couple light into a stack of coupling lightguides such that the light propagates through the coupling lightguides, mixes within the coupling lightguides, mixes within a light mixing region and lightguide region and is output in a light emitting region in the form of indicia. By changing the relative output of LEDs, the color of the light emitting indicia will change and can be used to draw attention or provide instructive or other dynamic effects. In another embodiment, a light emitting device comprises a first lightguide and second lightguide disposed to receive light from a first and second light source, respectively, through two different optical paths wherein the first and second light source are different colors and the light emitting regions of the first and second lightguides comprise an overlap region wherein combined light emitted from both regions exits the light emitting device from the same light emitting overlap region in a color different than the color of the first or second light sources. For example, in one embodiment, a light emitting device comprises a first lightguide with a white light LED disposed to couple light through coupling lightguides into the first lightguide such that light is emitted from the lightguide displaying the indicia "SALE". The light emitting device of the previous embodiment further comprises a blue LED disposed to couple light into a different set of coupling lightguides and into a second lightguide laminated to the first lightguide with an overlapping and aligned light emitting region also displaying the indicia "SALE". In this embodiment, by increasing the blue LED light output, the color of the indicia "SALE" may transition from white to bluish white or pale blue color. Also, for example, in this embodiment, the output of the blue light source may be increased to compensate for blue light absorption and/or scattering from the core lightguide material. In another embodiment, for example, two differently shaped light emitting regions on two lightguides disposed to receive light from two different colored light sources emit light in different colors such that the combination or separate regions have different visible colors. In another embodiment, the light emitting device comprises two or more lightguides disposed to receive light from two or more light sources and the lightguides are sequentially illuminated by the light sources such that a dynamic effect is achieved. For example, a first, second, and third lightguide comprise light extraction regions spatially separated and the lightguides are sequentially illuminated with light from three white LEDs and the display appears to show snow moving down the display. In another embodiment, a light emitting device comprises a first lightguide and second lightguide disposed to receive light from a first and second light source through two different optical paths, respectively, wherein the first and second light source are different colors and the light emitting regions of the first and second lightguides comprise an overlap region wherein light emitted from both regions exits the light emitting device from the same light emitting overlap region, and when the first and second light sources are emitting light, the light emitting device emits light in the overlap region of a color different than the color of the first or second light sources and emits light in a non-overlap region of the first color. For example, in one embodiment, one lightguide may comprise a lightguide comprising a large red square light emitting region illuminated by a red LED and a second lightguide comprises a blue light emitting region in the form of the text "SALE" centered in region above the red light emitting square region such that when the blue LED is turned on a purple "SALE" indicia is seen centered within the red square.

Light Input Coupler Input Surface

In one embodiment, a film-based lightguide comprises an array of coupling lightguides and the film comprises bounding edges along its periphery. In one embodiment, the light input coupler comprises a collection of coupling lightguides with a plurality of bounding edges forming a light coupler input surface. In one embodiment, the light input coupler comprises a collection of coupling lightguides with a plurality of edges forming a light coupler input surface. In another embodiment, an optical element is disposed between the light source and at least one coupling lightguide wherein the optical element receives light from the light source through a light coupler input surface. In some embodiments, the input surface is substantially polished, flat, or optically smooth such that light does not scatter forwards or backwards from pits, protrusions or other rough surface features. In some embodiments, an optical element is disposed to between the light source and at least one coupling lightguide to provide light redirection as an input surface (when optically coupled to at least one coupling lightguide) or as an optical element separate or optically coupled to at least one coupling lightguide such that more light is redirected into the lightguide at angles greater than the critical angle within the lightguide than would be the case without the optical element or with a flat input surface. In another embodiment, the input surface is curved to refract light more light received from the light source into angles within the lightguide greater than the critical angle within the lightguide than would occur with a flat input surface. In another embodiment, the optical element comprises radial or linear Fresnel lens features which refract incident light. In another embodiment, the optical element comprises a refractive-TIR hybrid Fresnel lens (such as one having a low F/# of less than 1.5). In a further embodiment, the optical element is a reflective and refractive optical element. In one embodiment, the light input surface may be formed by machine, cutting, polishing, forming, molding, or otherwise removing or adding material to the lightguide couplers to create a smooth, curved, rounded, concave, convex, rigged, grooved, micro-structured, nano-structured, or predetermined surface shape. In another embodiment, the light input coupler comprises an optical element designed to collect light from the light source and increase the uniformity. Such optical elements can include fly's eye lenses, microlens arrays, integral lenses, lenticular lenses holographic or other diffusing elements with micro-scale features or nano-scale features independent of how they were formed. In another embodiment, the light input coupler is optically coupled to at least one lightguide and at least one light source. In another embodiment, the optical element is at least one selected from the group: diffractive element, holographic element, lenticular element, lens, planar window, refractive element, reflective element, waveguide coupling element, anti-reflection coated element, planar element, and formed portion or region of at least one selected from the group: coupling lightguide, optical adhesive, UV cured adhesive, and pressure sensitive adhesive. The light coupler or an element therein may be comprised of at least one light transmitting material. In another embodiment, an element of the light input coupler or the light input window, lens or surface is a silicone material wherein the ASTM D1003 version 07e1 luminous transmittance change due to exposure to 150 degrees centigrade for 200 hours is less than one selected from the group: 0.5%, 1%, 2%, 3%, 4%, and 5%. In another embodiment, the input surface of the coupling lightguides, the coupling lightguides, or the window optically coupled to the input surface is optically coupled using a light transmitting optical adhesive to an optical window, a light source, the outer surface of an LED, a light collimating optical element, a light redirecting optical element, a light turning optical element, an intermediate lens, or a light transmitting optical element.

When light propagating in air is incident to a planar light input surface of a light transmitting material with a refractive index higher than 1.3 at high angles from the normal to the interface, for example, much of the light is reflected from the air-input surface interface. One method of reducing the loss of light due to reflection is to optically couple the input surface of the light input coupler to the light source. Another method to reduce this loss is to use a collimation optic or optic that directs some of the light output from the light source into angles closer to the optical axis of the light source. The collimating optic, or optical element, may be optically coupled to the light source, the coupling lightguides, an adhesive, or other optical element such that it directs more light into the coupling lightguides into a total internal reflection condition within the coupling lightguides. In another embodiment, the light input surface comprises a recessed cavity or concave region such that the percentage of light from a light source disposed adjacent to the cavity or concave region that is reflected from the input surface is less than one selected from the group: 40%, 30%, 20%, 10%, 5%, 3%, and 2%.

In another embodiment, the total input area ratio, defined as the total area of the input surface of all of the light input couplers of the light emitting device receiving more than 5% of the total light flux from any light source divided by the total light emitting surface areas of the light sources is greater than one selected from the group: 0.9, 1, 1.5, 2, 4, and 5. In another embodiment, the individual input area ratio, defined as the area of the input surface of a light input coupler of the light emitting device receiving more than 5% of the total light flux received from a light source divided by the light emitting surface area of the light source is greater than one selected from the group: 0.9, 1, 1.5, 2, 4, and 5. The individual input area ratios of a light emitting device may vary for different input couplers and the individual input area ratio for a particular input coupler may be greater or less than the total input area ratio.

Input Surface Position Relative to Light Source

In one embodiment, the distance between the outer surface of the light source and the input surface of the light input coupler is less than one selected from the group: 3 millimeters, 2 millimeters, 1 millimeter, 0.5 millimeters, and 0.25 millimeters over a time period between just before powering on the light source and the time for a substantially steady-state junction temperature of the light source at a maintained ambient temperature for the light emitting device of 20 degrees Celsius.

In one embodiment, an elastic object used to store mechanical energy is disposed to force the outer surface of the light source to be in contact or a predetermined distance from the input surface of the light input coupler. In one embodiment, the elastic object is one selected from the group: tension spring, extension spring, compression spring, torsion spring, wire spring, coiled spring, flat spring, cantilever spring, coil spring, helical spring, conical spring, compression spring, volute spring, hairspring, balance spring, leaf spring, V-spring, Belleville washer, Belleville spring, constant-force spring, gas spring, mainspring, rubber band, spring washer, a torsion bar twisted under load, torsion spring, negator spring, and wave spring. In one embodiment, the elastic object is disposed between the light source or LED array and the housing or other element such as a thermal transfer element such that a force is exerted against the light source or LED array such that the relative distance between the outer light emitting surface of the light source or LED array and the input surface of the light input coupler remains within 0.5 millimeters of a fixed distance over a time period between just before powering on the light source and the time for a substantially steady-state junction temperature of the light source at a maintained ambient temperature for the light emitting device of 20 degrees Celsius.

In a further embodiment, a spacer comprises a physical element that substantially maintains the minimum separation distance of at least one light source and at least one input surface of at least one light input coupler. In one embodiment, the spacer is one selected from the group: a component of the light source, a region of a film (such as a white reflective film or low contact area cover film), a component of an LED array (such as a plastic protrusion), a component of the housing, a component of a thermal transfer element, a component of the holder, a component of the relative position maintaining element, a component of the light input surface, a component physically coupled to the light input coupler, light input surface, at least one coupling lightguide, window for the coupling lightguide, lightguide, housing or other component of the light emitting device.

In a further embodiment, at least one selected from the group: film, lightguide, light mixing region, light input coupler, and coupling lightguide comprises a relative position maintaining mechanism that maintains the relative distance between the outer light emitting surface of the light source or LED array and the input surface of the light input coupler remains within 0.5 millimeters of a fixed distance over a time period between just before powering on the light source and the time for a substantially steady-state junction temperature of the light source at a maintained ambient temperature for the light emitting device of 20 degrees Celsius. In one embodiment, the relative position maintaining mechanism is a hole in the lightguide and a pin in a component (such as a thermal transfer element) physically coupled to the light source. For example, pins in a thin aluminum sheet thermal transfer element physically coupled to the light source are registered into holes within the light input coupler (or a component of the light input coupler such as a coupling lightguide) to maintain the distance between the input surface of the light input coupler and the light emitting surface of the light source. In another embodiment, the relative position maintaining mechanism is a guide device.

Stacked Strips or Segments of Film Forming a Light Input Coupler

In one embodiment, the light input coupler is region of a film that comprises the lightguide and the light input coupler which comprises strip sections of the film which form coupling lightguides that are grouped together to form a light coupler input surface. The coupling lightguides may be grouped together such the edges opposite the lightguide region are brought together to form an input surface comprising of their thin edges. A planar input surface for a light input coupler can provide beneficial refraction to redirect a portion of the input light from the surface into angles such that it propagates at angles greater than the critical angle for the lightguide. In another embodiment, a substantially planar light transmitting element is optically coupled to the grouped edges of coupling lightguides. One or more of the edges of the coupling lightguides may be polished, melted, adhered with an optical adhesive, solvent welded, or otherwise optically coupled along a region of the edge surface such that the surface is substantially polished, smooth, flat, or substantially planarized. This polishing can aide to reduce light scattering, reflecting, or refraction into angles less than the critical angle within the coupling lightguides or backwards toward the light source. The light input surface may comprise a surface of the optical element, the surface of an adhesive, the surface of more than one optical element, the surface of the edge of one or more coupling lightguides, or a combination of one or more of the aforementioned surfaces. The light input coupler may also comprise an optical element that has an opening or window wherein a portion of light from a light source may directly pass into the coupling lightguides without passing through the optical element. The light input coupler or an element or region therein may also comprise a cladding material or region.

In another embodiment, the cladding layer is formed in a material wherein under at least one selected from the group: heat, pressure, solvent, and electromagnetic radiation, a portion of the cladding layer may be removed. In one embodiment, the cladding layer has a glass transition temperature less than the core region and pressure applied to the coupling lightguides near the light input edges reduces the total thickness of the cladding to less than one selected from the group: 10%, 20%, 40%, 60%, 80% and 90% of the thickness of the cladding regions before the pressure is applied. In another embodiment, the cladding layer has a glass transition temperature less than the core region and heat and pressure applied to the coupling lightguides near the light input edges reduces the total thickness of the cladding regions to less than one selected from the group: 10%, 20%, 40%, 60%, 80% and 90% of the thickness of the cladding regions before the heat and pressure is applied. In another embodiment, a pressure sensitive adhesives functions as a cladding layer and the coupling lightguides are folded such that the pressure sensitive adhesive or component on one or both sides of the coupling lightguides holds the coupling lightguides together and at least 10% of the thickness of the pressure sensitive adhesive is removed from the light input surface by applying heat and pressure.

Guide Device for Coupling the Light Source to the Light Input Surface of the Light Input Coupler The light input coupler may also comprise a guide that comprises a mechanical, electrical, manual, guided, or other system or component to facility the alignment of the light source in relation to the light input surface. The guide device may comprise an opening or window and may physically or optically couple together one or more selected from the group: light source (or component physically attached to a light source), a light input coupler, coupling lightguide, housing, and electrical, thermal, or mechanical element of the light emitting device. In one embodiment of this device an optical element comprises one or more guides disposed to physically couple or align the light source (such as an LED strip) to the optical element or coupling lightguides. In another embodiment, the optical element comprises one or more guide regions disposed to physically couple or align the optical element to the light input surface of the input coupler. The guide may comprise a groove and ridge, hole and pin, male and corresponding female component, or a fastener. In one embodiment, the guide comprises a fastener selected from the group: a batten, button, clamp, clasp, clip, clutch (pin fastener), flange, grommet, anchor, nail, pin, peg, clevis pin, cotter pin, linchpin, R-clip, retaining ring, circlip retaining ring, e-ring retaining ring, rivet, screw anchor, snap, staple, stitch, strap, tack, threaded fastener, captive threaded fasteners (nut, screw, stud, threaded insert, threaded rod), tie, toggle, hook-and-loop strips, wedge anchor, and zipper. In another embodiment, one or more guide regions are disposed to physically couple or align one or more films, film segments (such as coupling lightguides), thermal transfer elements, housing or other components of the light emitting device together.

Light Redirecting Optical Element

In one embodiment, a light redirecting optical element is disposed to receive light from at least one light source and redirect the light into a plurality of coupling lightguides. In another embodiment, the light redirecting optical element is at least one selected from the group: secondary optic, mirrored element or surface, reflective film such as aluminized Polyethylene Terephthalate (PET) film, giant birefringent optical films such as Vikuiti™ Enhanced Specular Reflector Film by 3M Inc., curved mirror, totally internally reflecting element, beamsplitter, and dichroic reflecting mirror or film.

In another embodiment, a first portion of light from a light source with a first wavelength spectrum is directed by reflection by a wavelength selective reflecting element (such as a dichroic filter) into a plurality of coupling lightguides. In another embodiment, a first portion of light from a light source with a first wavelength spectrum is directed by reflection by a wavelength selective reflecting element (such as a dichroic filter) into a plurality of coupling lightguides and a second portion of light from a second light source with a second wavelength spectrum is transmitted through the wavelength selective reflecting element into the plurality of coupling lightguides. For example, in one embodiment, a red light from an LED emitting red light is reflected by a first dichroic filter oriented at 45 degrees and reflects light into a set of coupling lightguides. Green light from an LED emitting green light is reflected by a second dichroic filter oriented at 45 degrees and passes through the first dichroic filter into the set of coupling lightguides. Blue light from a blue LED is directed toward and passes through the first and second dichroic filters into the coupling lightguides. Other combinations of light coupling or combining the output from multiple light sources into an input surface or aperture are known in the field of projection engine design and include methods for combining light output from color LEDs onto an aperture such as a microdisplay. These techniques may be readily adapted to embodiments wherein the microdisplay or spatial light modulator is replaced by the input surface of coupling lightguides.

Light Collimating Optical Element

In one embodiment, the light input coupler comprises a light collimating optical element. A light collimating optical element receives light from the light source with a first angular full-width at half maximum intensity within at least one input plane and redirects a portion of the incident light from the light source such that the angular full-width at half maximum intensity of the light is reduced in the first input plane. In one embodiment, the light collimating optical element is one or more of the following: a light source primary optic, a light source secondary optic, a light input surface, and an optical element disposed between the light source and at least one coupling lightguide. In another embodiment, the light collimating element is one or more of the following: an injection molded optical lens, a thermoformed optical lens, and a cross-linked lens made from a mold. In another embodiment, the light collimating element reduces the angular full-width at half maximum (FWHM) intensity within the input plane and a plane orthogonal to the input plane.

In one embodiment, a light emitting device comprises a light input coupler and a film-based lightguide. In one embodiment the light input coupler comprises a light source and a light collimating optical element disposed to receive light from one or more light sources and provide light output in a first output plane, second output plane orthogonal to the first plane, or in both output planes with an angular full-width at half maximum intensity in air less than one selected from the group: 60 degrees, 40 degrees, 30 degrees, 20 degrees, and 10 degrees from the optical axis of the light exiting the light collimating optical element.

In one embodiment, the collimation or reduction in angular FWHM intensity of the light from the light collimating element is substantially symmetric about the optical axis. In one embodiment, the light collimating optical element receives light from a light source with a substantially symmetric angular FWHM intensity about the optical axis greater than one selected from the group: 50, 60, 70, 80, 90, 100, 110, 120, and 130 degrees and provides output light with an angular FWHM intensity less than one selected from the group: 60, 50, 40, 30, and 20 degrees from the optical axis. For example, in one embodiment, the light collimating optical element receives light from a white LED with an angular FWHM intensity of about 120 degrees symmetric about its optical axis and provides output light with an angular FWHM intensity of about 30 degrees from the optical axis.

In another embodiment, the collimation or reduction in angular FWHM intensity of the light from light collimating element is substantially asymmetric about the optical axis. In one embodiment, the light collimating optical element receives light from a light source with a substantially symmetric angular FWHM intensity about the optical axis greater than one selected from the group: 50, 60, 70, 80, 90, 100, 110, 120, and 130 degrees and provides output light with an angular FWHM intensity less than one selected from the group: 60, 50, 40, 30, and 20 degrees in a first output plane and an angular FWHM intensity greater than one selected from the group: 100, 90, 80, 70, 60, 50, 40, and 30, degrees in a second output plane substantially orthogonal to the first output plane. For example, in one embodiment, the light collimating optical element receives light from a white LED with an angular FWHM intensity of about 120 degrees symmetric about its optical axis and provides output light with an angular FWHM intensity of about 30 degrees in the first plane orthogonal to the extended film surfaces of the stack of coupling lightguides and an angular FWHM intensity of about 80 degrees in the second plane parallel to the extended film surfaces of the stack of coupling lightguides. In one embodiment, the first output plane is substantially parallel to the extended film surfaces of the coupling lightguides in the stack of coupling lightguides disposed to receive the light from the light collimating optical element In one embodiment, a light emitting device comprises a light input coupler and a film-based lightguide wherein the light propagating within the lightguide has an angular full-width at half maximum intensity less than one selected from the group: 60 degrees, 40 degrees, 30 degrees, 20 degrees, and 10 degrees from the optical axis of the light propagating in the lightguide. In another embodiment, the angular full-width at half maximum intensity of the light propagating in one or more regions of the coupling lightguides, light mixing regions, lightguide regions, or light emitting regions is reduced by an angular bandwidth reduction method. In one embodiment, a light emitting device comprises a film-based lightguide that utilizes one or more angular FWHM intensity reduction methods, including without limitation, collimating incident light using a light collimating optical element, collimating light within the coupling lightguide using tapered or arcuate lateral edges of one or more coupling lightguides or regions of coupling lightguides, reducing the radius of curvature of a bend in one or more coupling lightguides in one or more bend regions, reducing the refractive index difference between the core region and the cladding region, decreasing the thickness of the cladding region, and increasing the refractive index of the cladding region.

The angular full-width at half maximum intensity of the light propagating within the lightguide can be determined by measuring the far field angular intensity output of the lightguide from an optical quality end cut normal to the film surface and calculating and adjusting for refraction at the air-lightguide interface. In another embodiment, the average angular full-width at half maximum intensity of the extracted light from one or more light extraction features or light extraction regions comprising light extraction features of the film-based lightguide is less than one selected from the group: 50 degrees, 40 degrees, 30 degrees, 20 degrees, 10 degrees, and 5 degrees. In another embodiment, the peak angular intensity of the light extracted from the light extraction feature is within 50 degrees of the surface normal of the lightguide within the region. In another embodiment, the far-field total angular full-width at half maximum intensity of the extracted light from the light emitting region of the film-based lightguide is less than one selected from the group: 50 degrees, 40 degrees, 30 degrees, 20 degrees, 10 degrees, and 5 degrees and the peak angular intensity is within 50 degrees of the surface normal of the lightguide in the light emitting region.

Light Turning Optical Element

In one embodiment, a light input coupler comprises a light turning optical element disposed to receive light from a light source with a first optical axis angle and redirect the light to having a second optical axis angle different than the first optical axis angle. In one embodiment, the light turning optical element redirects light by about 90 degrees. In another embodiment, the light turning optical element redirects the optical axis of the incident light by an angle selected from within the range of 75 degrees and 90 degrees within at least one plane. In another embodiment, the light turning optical element redirects the optical axis of the incident light by an angle selected from within the range of 40 degrees and 140 degrees. In one embodiment, the light turning optical element is optically coupled to the light source or the light input surface of the coupling lightguides. In another embodiment, the light turning optical element is separated in the optical path of light from the light source or the light input surface of the coupling lightguides by an air gap. In another embodiment, the light turning optical element redirects light from two or more light sources with first optical axis angles to light having second optical axis angles different than the first optical axis angles. In a further embodiment, the light turning optical element redirects a first portion of light from a light source with a first optical axis angle to light having a second optical axis angle different than the first optical axis angle. In another embodiment, the light turning optical element redirects light from a first light source with a first optical axis angle to light having a second optical axis angle different from the first optical axis angle and light from a second light source with a third optical axis angle to light having a fourth optical axis angle different from the third optical axis angle.

Bi-Directional Light Turning Optical Element

In another embodiment, the light turning optical element redirects the optical axis of light from one or more light sources into two different directions. For example, in one embodiment, the middle coupling lightguide of a light input coupler is a non-folded coupling lightguide and the light input ends of two arrays of stacked, folded coupling lightguides are directed toward the middle coupling lightguide. A bi-directional light turning optical element is disposed above the middle coupling lightguide such that a first portion of light from a light source enters the middle coupling lightguide, a second portion of light from the light source is directed in a first direction parallel and toward the input surface of the first stacked array of folded coupling lightguides by the bi-directional light turning optical element, and a third portion of light from the light source is directed in a second direction parallel and toward the input surface of the second stacked array of folded coupling lightguides by the bi-directional light turning optical element. In this embodiment, the light source may be disposed between the lateral edges of the light emitting region or light emitting device and the non-folded coupling lightguide eliminates an otherwise dark region (where there is insufficient room for a folded coupling lightguide) or eliminates the requirement for multiple bends in the coupling lightguides that can introduce further light loss and increase volume requirements.

In one embodiment, the bi-directional light turning optical element splits and turns the optical axis of one light source into two different directions. In another embodiment, the bi-directional light turning optical element rotates the optical axis of a first light source into a first direction and rotates the optical axis of a second light source into a second direction different that the first direction. In another embodiment, an optical element, such as an injection molded lens, comprises more than one light turning optical element and light collimating element that are configured to receive light from more than one light source. For example, an injection molded lens comprising a linear array of optical light turning surfaces and light collimating surfaces may be disposed to receive light from a strip comprising a linear array of LEDs such that the light is directed into a plurality of light input couplers or stacks of coupling lightguides. By forming a single optical element to perform light turning and light collimating for a plurality of light sources, fewer optical elements are needed and costs can be reduced. In another embodiment, the bi-directional light turning element may be optically coupled to the light source, the coupling lightguides, or a combination thereof.

Light Turning and Light Collimating Optical Element

In another embodiment, the light turning optical element turns the optical axis of the light from the light source in a first plane within the light turning element and collimates the light in the first plane, in a second plane orthogonal to the first plane, or a combination thereof. In another embodiment, the light turning optical element comprises a light turning region and a collimating region. In one embodiment, by collimating input light in at least one plane, the light will propagate more efficiently within the lightguide and have reduced losses in the bend regions and reduced input coupling losses into the coupling lightguides. In one embodiment, the light turning optical element is an injection molded lens designed to redirect light from a first optical axis angle to a second optical axis angle different from the first optical axis angle. The injection molded lens may be formed of a light transmitting material such as poly(methyl methacrylate) (PMMA), polycarbonate, silicone, or any suitable light transmitting material. In a further embodiment, the light turning element may be a substantially planar element that redirects light from a first optical axis angle to a second optical axis angle in a first plane while substantially maintaining the optical axis angle in a second plane orthogonal to the first plane. For example, in one embodiment, the light turning optical element is a 1 millimeter (mm) thick lens with a curved profile in one plane cut from a 1 mm sheet of PMMA using a carbon dioxide ($CO_2$) laser cutter.

In one embodiment, the light input coupler comprises a light turning optical element or coupling lightguides with light turning edges that permit a light source to be disposed between the extended bounding regions of the sides of the light emitting surface adjacent to the input side of the light from the light source into the lightguide region. In this embodiment, the turning optical element or light turning edges permit the light source to be disposed on the light input side region of the lightguide region without substantially extending beyond either side. Additionally, in this embodiment, the light source may be folded behind the light emitting region of the lightguide such that the light source does not substantially extend beyond an edge of the light emitting region or outer surface of the light emitting device comprising the light emitting region. In another embodiment, the light source is substantially directed with its optical axis oriented toward the light emitting region and the turning optical element or turning edges of the coupling lightguides permit the light to be turned such that it can enter the stacked array of coupling lightguides that are stacked substantially parallel to the input side of the lightguide region and substantially orthogonal to the light source optical axis.

Light Coupling Optical Element

In one embodiment, a light emitting device comprises a light coupling optical element disposed to receive light from the light source and transmit a larger flux of light into the coupling lightguides than would occur without the light coupling element. In one embodiment, the light coupling element refracts a first portion of incident light from a light source such that it is incident upon the input surface of one or more coupling lightguides or sets of coupling lightguides at a lower incidence angle from the normal such that more light flux is coupled into the coupling lightguides or sets of coupling lightguides (less light is lost due to reflection). In another embodiment, the light coupling optical element is optically coupled to at least one selected from the group: a light source, a plurality of coupling lightguides, a plurality of sets of coupling lightguides, a plurality of light sources.

Light Blocking Element

In one embodiment, the light input coupler comprises a light blocking element to block external light from reaching the lightguide or lightguide region or to block light emitted from a region of the light emitting device from escaping the device being seen by a viewer. In one embodiment, the light blocking element prevents a significant portion of incident light from escaping or entering the light input coupler through absorption, reflection, or a combination thereof. For example, in one embodiment, an aluminum reflective tape is adhered around the coupling lightguides of a light input coupler. In another embodiment, a low refractive index cladding or air region is disposed between a light absorbing or reflecting light blocking element such that light totally internally reflecting within the core layer of a coupling lightguide or lightguide is not frustrated from the total internal reflection and absorbed or scattered out of the coupling lightguide or lightguide. In another embodiment, the light blocking element is a substantially specularly reflecting element and is optically coupled to one or more coupling lightguides or lightguides. In another embodiment, for example, the housing of the light input coupler is black and substantially absorbs light escaping from the edges of the coupling lightguides and prevents this light from distracting from the visual appearance of the light emitting device. In another embodiment, the light blocking element is a region disposed on or physically or optically coupled to a low contact area cover. In another embodiment, the light blocking element maintains the relative position of the coupling lightguides to each other or maintains the relative position between the coupling lightguide and a lightguide region, light mixing region, or light source. For example, in one embodiment, a partially specularly reflecting aluminum film comprises an adhesive (an aluminum tape), wraps around the coupling lightguides, and is also adhered to the lightguide in a light mixing region. In one embodiment the light blocking element has an ASTM D790 version 10 flexural modulus greater than one selected from the group: 1.5, 2, 4, 6, 8, 10, and 15 gigapascals (GPa).

Thermal Stability of Optical Element

In another embodiment, the light coupling optical element or light redirecting optical element contains materials with a volumetric average glass transition temperature higher than the volumetric average glass transition temperature of the materials contained within the coupling lightguides. In another embodiment, the glass transition temperature of the coupling lightguides is less than 100 degrees Centigrade and the glass transition temperature of the light coupling optical element or the light redirecting optical element is greater than 100 degrees Centigrade. In a further embodiment, the glass transition temperature of the coupling lightguides is less than 120 degrees Centigrade and the glass transition temperature of the light coupling optical element or the light redirecting optical element is greater than 120 degrees Centigrade. In a further embodiment, the glass transition temperature of the coupling lightguides is less than 140 degrees Centigrade and the glass transition temperature of the light coupling optical element or the light redirecting optical element is greater than 140 degrees Centigrade. In a further embodiment, the glass transition temperature of the coupling lightguides is less than 150 degrees Centigrade and the glass transition temperature of the light coupling optical element or the light redirecting optical element is greater than 150 degrees Centigrade. In another embodiment, the light redirecting optical element or the light coupling optical element comprises polycarbonate and the coupling lightguides comprise poly(methyl methacrylate). In another embodiment, at least one of the light redirecting optical element and the light coupling optical element is thermally coupled to a thermal transfer element or the housing of the light emitting device.

Coupling Lightguides

In one embodiment, the coupling lightguide is a region wherein light within the region can propagate in a waveguide condition and a portion of the light input into a surface or region of the coupling lightguides passes through the coupling lightguide toward a lightguide or light mixing region. In one embodiment, coupling lightguides are defined by "leg" regions extending from a "body" (lightguide region) of a film. In one embodiment, the light propagating in a waveguide condition within the coupling lightguide reflects from the outer surfaces of the coupling lightguide, thus totally internally reflecting within the volume of the coupling lightguide. In another embodiment, the coupling lightguide comprises a cladding region or other region optically coupled to a core region of the coupling lightguide. In this embodiment, a portion of the light within the coupling lightguide may propagate through the core region, a portion of the light within the coupling lightguide may propagate through the cladding region or other region, or light may propagate through both regions in a waveguide condition (or in a non-waveguide condition near the input surface, near a light extracting layer on the cladding or other area, or near the bend region). The coupling lightguide, in some embodiments, may serve to geometrically transform a portion of the flux from a light source from a first shaped area to a second shaped area different from the first. In an example of this embodiment, the light input surface of the light input coupler formed from the edges of folded strips (coupling lightguides) of a planar film has the dimensions of a rectangle that is 3 millimeters by 2.7 millimeters and the light input coupler couples light into a planar section of a film in the light mixing region with cross-sectional dimensions of 40.5 millimeters by 0.2 millimeters. In one embodiment, the input area of the light input coupler is substantially the same as the cross-sectional area of the light mixing region or lightguide disposed to receive light from one or more coupling lightguides. In another embodiment, the total transformation ratio, defined as the total light input surface area of the light input couplers receiving more than 5% of the light flux from a light source divided by the total cross-sectional area of the light mixing region or lightguide region disposed to receive light from the coupling lightguides is one selected from the group: 1 to 1.1, 0.9 to 1, 0.8 to 0.9, 0.7 to 0.8, 0.6 to 0.7, 0.5 to 0.6, 0.5 to 0.999, 0.6 to 0.999, 0.7 to 0.999, less than 1, greater than 1, equal to 1. In another embodiment, the input surface area of each light input coupler corresponding to the edges of coupling lightguides disposed to receive light from a light source is substantially the same as the cross-sectional area of the light mixing region or lightguide region disposed to receive light from each corresponding coupling lightguides. In another embodiment, the individual transformation ratio, defined as the total light input area of a single light input surface of a light input coupler (corresponding to the edges of coupling lightguides) divided by the total cross-sectional area of the light mixing region or lightguide disposed to receive light from the corresponding coupling lightguides is one selected from the group: 1 to 1.1, 0.9 to 1, 0.8 to 0.9, 0.7 to 0.8, 0.6 to 0.7, 0.5 to 0.6, 0.5 to 0.999, 0.6 to 0.999, 0.7 to 0.999, less than 1, greater than 1, equal to 1.

In another embodiment, a coupling lightguide is disposed to receive light from at least one input surface with a first input surface longest dimension and transmit the light to a lightguide with a light emitting surface with a light emitting surface longest dimension larger than the first input surface largest dimension. In another embodiment, the coupling lightguide is a plurality of lightguides disposed to collect light from at least one light source through edges or surfaces of the coupling lightguides and direct the light into the surface, edge, or region of a lightguide comprising a light emitting surface. In one embodiment, the coupling lightguides provide light channels whereby light flux entering the coupling lightguides in a first cross sectional area can be redistributed into a second cross sectional area different from the first cross sectional area at the light output region of the light input coupler. The light exiting the light input coupler or light mixing region may then propagate to a lightguide or lightguide region which may be a separate region of the same element (such as a separate region of the same film). In one embodiment, a light emitting device comprises a light source and a film processed to form a lightguide region with light extraction features, a light mixing region wherein light from a plurality of sources, light input couplers, or coupling lightguides mixes before entering into the lightguide region. The coupling lightguides, light mixing region, and light extraction features may all be formed from, on, or within the same film and they may remain interconnected to each other through one or more regions.

In one embodiment, at least one coupling lightguide is disposed to receive light from a plurality of light sources of at least two different colors, wherein the light received by the coupling lightguide is pre-mixed angularly, spatially, or both by reflecting through the coupling lightguide and the 9-spot sampled spatial color non-uniformity, Δu'v', of the light emitting surface of the light emitting device measured on the 1976 u', v' Uniform Chromaticity Scale as described in VESA Flat Panel Display Measurements Standard version 2.0, Jun. 1, 2001 (Appendix 201, page 249) is less than one selected from the group: 0.2, 0.1, 0.05, 0.01, and 0.004 when measured using a spectrometer based spot color meter.

Coupling Lightguide Folds and Bends

In one embodiment, light emitting device comprises a light mixing region disposed between a lightguide and strips or segments cut to form coupling lightguides, whereby a collection of edges of the strips or segments are brought together to form a light input surface of the light input coupler disposed to receive light from a light source. In one embodiment, the light input coupler comprises a coupling lightguide wherein the coupling lightguide comprises at least one fold or bend in one plane such that at least one edge overlaps another edge. In another embodiment, the coupling lightguide comprises a plurality of folds or bends wherein edges of the coupling lightguide can be abutted together in region such that the region forms a light input surface of the light input coupler of the light emitting device.

In one embodiment, a light emitting device comprises a light input coupler comprising at least one coupling lightguide that is bent or folded such that light propagating in a first direction within the lightguide before the bend or fold is propagating in a second direction different that the first within the lightguide after the bend or fold.

In one embodiment, at least one coupling lightguide comprises a strip or segment that is bent or folded to radius of curvature of less than 75 times the thickness of the strip or segment. In another embodiment, at least one coupling lightguide comprises a strip or segment that is bended or folded to radius of curvature greater than 10 times the times the thickness of the strip or segment. In another embodiment, at least one coupling lightguide is bent or folded such that longest dimension in a cross-section through the light emitting device or coupling lightguide in at least one plane is less than without the fold or bend. Segments or strips may be bent or folded in more than one direction or region and the directions of folding or bending may be different between strips or segments.

Optical Efficiency of the Light Input Coupler

In an embodiment, the optical efficiency of the light input coupler, defined as the percentage of the original light flux from the light source that passes through the light input coupler light input surface and out of the light input coupler into a mixing region, lightguide, or light emitting surface, is greater than one selected from the group: 50%, 60%, 70%, 80%, 90%, and 95%. The degree of collimation can affect the optical efficiency of the light input coupler.

Collimation of Light Entering the Coupling Lightguides

In one embodiment, at least one selected from the group: light source, light collimating optical element, light source primary optic, light source secondary optic, light input surface, optical element disposed between the light source and at least one selected from the group: coupling lightguide, shape of the coupling lightguide, shape of the mixing region, shape of the light input coupler, and shape of an element or region of the light input coupler provides light that within the coupling lightguide with an angular full-width of half maximum intensity chosen from the group of less than 80 degrees, less than 70 degrees, less than 60 degrees, less than 50 degrees, less than 40 degrees, less than 30 degrees, less than 20 degrees, less than 10 degrees, between 10 degrees and 30 degrees, between 30 degrees and 50 degrees, between 10 degrees and 60 degrees and between 30 degrees and 80 degrees. In some embodiments, light which is highly collimated (FWHM of about 10 degrees or less) does not mix spatially within a lightguide region with light extracting features such that there may be dark bands or regions of non-uniformity. In this embodiment, the light, however, will be efficiently coupled around curves and bends in the lightguide relative to less collimated light and in some embodiments, the high degree of collimation enables small radii of curvature and thus a smaller volume for the fold or bend in a light input coupler and resulting light emitting device. In another embodiment, a significant portion of light from a light source with a low degree of collimation (FWHM of about 120 degrees) within the coupling lightguides will be reflected into angles such that it exits the coupling lightguides in regions near bends or folds with small radii of curvature. In this embodiment, the spatial light mixing (providing uniform color or luminance) of the light from the coupling lightguides in the lightguide in areas of the light extracting regions is high and the light extracted from lightguide will appear to have a more uniform angular or spatial color or luminance uniformity.

In one embodiment, light from a light source is collimated in a first plane by a light collimating optical element and the light is collimated in a second plane orthogonal to the first plane by light collimating edges of the coupling lightguide. In another embodiment, a first portion of light from a light source is collimated by a light collimating element in a first plane and the first portion of light is further collimated in a second plane orthogonal to the first plane, the first plane, or a combination thereof by collimating edges of one or more coupling lightguides. In a further embodiment, a first portion of light from a light source is collimated by a light collimating element in a first plane and a second portion of light from the light source or first portion of light is collimated in a second plane orthogonal to the first plane, the first plane, or a combination thereof by collimating edges of one or more coupling lightguides.

In another embodiment, one or more coupling lightguides is bent or folded and the optical axis of the light source is oriented at a first redirection angle to the light emitting device optical axis, oriented at a second redirection angle to a second direction orthogonal to the light emitting device optical axis, and oriented at a third redirection angle to a third direction orthogonal to the light emitting device optical axis and the second direction. In another embodiment, the first redirection angle, second redirection angle, or third redirection angle is about one selected from the group: 0 degrees, 45 degrees, 90 degrees, 135 degrees, 180 degrees, 0-90 degrees, 90-180 degrees, and 0-180 degrees.

Each light source may be oriented at a different angle. For example, two light sources along one edge of a film with a strip-type light input coupler can be oriented directly toward each other (the optical axes are 180 degrees apart). In another example, the light sources can be disposed in the center of an edge of a film and oriented away from each other (the optical axes are also 180 degrees apart).

The segments or strips may be once folded, for example, with the strips oriented and abutting each other along one side of a film such that the light source optical axis is in a direction substantially parallel with the film plane or lightguide plane. The strips or segments may also be folded twice, for example, such that the light source optical axis is substantially normal to the film plane or normal to the waveguide.

In one embodiment, the fold or bend in the coupling lightguide, region or segment of the coupling lightguide or the light input coupler has a crease or radial center of the bend in a direction that is at a bend angle relative to the light source optical axis. In another embodiment, the bend angle is one selected from the group: 0 degrees, 45 degrees, 90 degrees, 135 degrees, 180 degrees, 0-90 degrees, 90-180 degrees, and 0-180 degrees.

The bend or fold may also be of the single directional bend (such as vertical type, horizontal type, 45-degree type or other single angle) or the bend or fold or be multi-directional such as the twisted type wherein the strip or segment is torsional. In one embodiment, the strip, segment or region of the coupling lightguide is simultaneously bent in two directions such that the strip or segment is twisted.

In another embodiment, the light input coupler comprises at least one light source disposed to input light into the edges of strips (or coupling lightguides) cut into a film wherein the strips are twisted and aligned with their edges forming an input surface and the light source output surface area is substantially parallel with the edge of the coupling lightguide, lightguide, lightguide region, or light input surface or the optical axis of the light source is substantially perpendicular to the edge of the coupling lightguide, lightguide, lightguide region, or light input surface. In another embodiment, multiple light sources are disposed to couple light into a light input coupler comprising strips cut into a film such that at least one light source has an optical axis substantially parallel to the lightguide edge, coupling lightguide lateral edge or the nearest edge of the lightguide region. In another embodiment, two groupings of coupling lightguides are folded separately toward each other such that the separation between the ends of the strips is substantially the thickness of the central strip between the two groupings and two or more light sources are disposed to direct light in substantially opposite directions into the strips. In one embodiment, two groupings of coupling lightguides are folded separately toward each other such and then both folded in a direction away from the film such that the edges of the coupling lightguides are brought together to form a single light input surface disposed to receive light from at least one light source. In this embodiment, the optical axis of the light source may be substantially normal to the substantially planar film-based lightguide.

In one embodiment, two opposing stacks of coupling lightguides from the same film are folded and recombined at some point away from the end of the coupling apparatus. This can be accomplished by splitting the film into one or more sets of two bundles, which are folded towards each other. In this embodiment, the bundles can be folded at an additional tight radius and recombined into a single stack. The stack input can further be polished to be a flat single input surface or optically coupled to a flat window and disposed to receive light from a light source.

In one embodiment, the combination of the two film stacks is configured to reduce the overall volume. In one embodiment, the film is bent or folded to a radius of curvature greater than 10× the film thickness order to retain sufficient total internal reflection for a first portion of the light propagating within the film.

In another embodiment, the light input coupler comprises at least one coupling lightguide wherein the coupling lightguide comprises an arcuate reflective edge and is folded multiple times in a fold direction substantially parallel to the lightguide edge or nearest edge of the lightguide region wherein multiple folds are used to bring sections of an edge together to form a light input surface with a smaller dimension. In another embodiment, the light coupling lightguide, the strips, or segments have collimating sections cut from the coupling lightguide which directs light substantially more parallel to the optical axis of the light source. In one embodiment, the collimating sections of the coupling lightguide, strips or segments direct light substantially more parallel to the optical axis of the light source in at least one plane substantially parallel to the lightguide or lightguide region.

In a further embodiment, a light input coupler comprises at least one coupling lightguide with an arc, segmented arc, or other light redirect edge cut into a film and the light input coupler comprises a region of the film rolled up to form a spiral or concentric-circle-like light input edge disposed to receive light from a light source.

Coupling Lightguide Lateral Edges

In one embodiment, the lateral edges, defined herein as the edges of the coupling lightguide which do not substantially receive light directly from the light source and are not part of the edges of the lightguide. The lateral edges of the coupling lightguide receive light substantially only from light propagating within the coupling light guide.

In one embodiment, the lateral edges are at least one selected from the group: uncoated, coated with a reflecting material, disposed adjacent to a reflecting material, and cut with a specific cross-sectional profile. The lateral edges may be coated, bonded to or disposed adjacent to a specularly reflecting material, partially diffusely reflecting material, or diffuse reflecting material. In one embodiment, the edges are coated with a specularly reflecting ink comprising nano-sized or micron-sized particles or flakes which substantially reflect the light in a specular manner when the coupling lightguides are brought together from folding or bending. In another embodiment, a light reflecting element (such as a multi-layer mirror polymer film with high reflectivity) is disposed near the lateral edge of at least one region of a coupling lightguide disposed, the multi-layer mirror polymer film with high reflectivity is disposed to receive light from the edge and reflect it and direct it back into the lightguide. In another embodiment, the lateral edges are rounded, and the percentage of incident light diffracted out of the lightguide from the edge is reduced. One method of achieving rounded edges is by using a laser to cut the strips, segments or coupling lightguide region from a film and edge rounding through control of the processing parameters (speed of cut, frequency of cut, laser power, etc.). Other methods for creating rounded edges include mechanical sanding/polishing or from chemical/vapor polishing. In another embodiment, the lateral edges of a region of a coupling lightguide are tapered, angled serrated, or otherwise cut or formed such that light from a light source propagating within the coupling lightguide reflects from the edge such that it is directed into an angle closer to the optical axis of the light source, toward a folded or bent region, or toward a lightguide or lightguide region.

Width of Coupling Lightguides

In one embodiment, the dimensions of the coupling lightguides are substantially equal in width and thickness to each other such that the input surface areas for each edge surface are substantially the same. In another embodiment, the average width of the coupling lightguides, w, is determined by the equation:

$$w = MF * W_{LES}/NC,$$

where $W_{LES}$ is the total width of the light emitting surface in the direction parallel to the light entrance edge of the lightguide region or lightguide receiving light from the coupling lightguide, NC is the total number of coupling lightguides in the direction parallel to the light entrance edge of the lightguide region or lightguide receiving light from the coupling lightguide, and MF is the magnification factor. In one embodiment, the magnification factor is one selected from the group: 0.7, 0.8, 0.9, 1, 1.1, 1.2, 1.3, 1.4, 0.7-1.3, 0.8-1.2, and 0.9-1.1. In another embodiment, at least one selected from the group: coupling lightguide width, the largest width of a coupling waveguide, the average width of the coupling lightguides, and the width of each coupling lightguides is selected from a group: 0.5 mm-1 mm, 1 mm-2 mm, 2 mm-3 mm, 3 mm-4 mm, 5 mm-6 mm, 0.5 mm-2 mm, 0.5 mm-25 mm, 0.5 mm-10 mm, 10-37 mm, and 0.5 mm-5 mm. In one embodiment, at least one selected from the group: the coupling lightguide width, the largest width of a coupling waveguide, the average width of the coupling lightguides, and the width of each coupling lightguides is less than 20 millimeters.

In one embodiment, the ratio of the average width of the coupling lightguides disposed to receive light from a first light source to the average thickness of the coupling lightguides is greater than one selected from the group: 1, 2, 4, 5, 10, 15, 20, 40, 60, 100, 150, and 200.

In one embodiment, the width of an outer coupling lightguide in an array of coupling lightguides or both outer coupling lightguides in an array of coupling lightguides is wider than the average width of the inner or other coupling lightguides in the array. In another embodiment, the width of an outer coupling lightguide in an array of coupling lightguides or both outer coupling lightguides in an array of coupling lightguides is wider than all of the inner or other coupling lightguides in the array. In a further embodiment, the width of an outer coupling lightguide in an array of coupling lightguides or both outer coupling lightguides in an array of coupling lightguides is wider than the average width of the inner or other coupling lightguides in the array by an amount substantially greater than the thickness of the inner or other coupling lightguides in the array when they are stacked in a manner to receive light from a light source at the input surface. In a further embodiment, the ratio of the width of an outer coupling lightguide in an array of coupling lightguides or both outer coupling lightguides in an array of coupling lightguides to the average width of the inner or other coupling lightguides is one selected from the group: greater than 0.5, greater than 0.8, greater than 1, greater than 1.5, greater than 2, greater than 3, between 0.5 and 3, between 0.8 and three, between 1 and 3, between 1 and 5, between 1 and 10. In another embodiment, the wide outer coupling lightguide on one side of an array allows the region of the coupling lightguide extending past the other coupling lightguides in the width direction to be folded toward the lateral edges of the other coupling lightguides to provide a protective barrier, such as a low contact area cover, from dust, TIR frustration light out-coupling, scratches, etc. In another embodiment, the extended coupling lightguide region may be extended around one or more selected from the group: the lateral edges of one or more coupling lightguides on one side, the lateral edges and one surface of the bottom coupling lightguide in the array, the lateral edges on opposite sides of one or more coupling lightguides, the lateral edges on opposite sides of the inner or other coupling lightguides in the array, the lateral edges on opposite sides of the inner or other coupling lightguides in the array, and the outer surface of the other end coupling lightguide in the array. For example, in one embodiment, an array of 10 coupling lightguides comprising 9 coupling lightguides with a width of 10 millimeters are arranged stacked and aligned at one lateral edge above an outer $10^{th}$ coupling lightguide with a width of 27 millimeters, wherein each coupling lightguide is 0.2 millimeters thick. In this embodiment, the 17 mm region of the outer coupling lightguide extending beyond the edges of the stacked 9 coupling lightguides is wrapped around the stack of 9 coupling lightguides and is affixed in place in an overlapping manner with itself (by adhesive or a clamping mechanism, for example) to protect the inner coupling lightguides. In another embodiment, a stacked array of coupling lightguides comprises 2 outer coupling lightguides with widths of 15 millimeters between in 8 coupling lightguides with widths of 10 millimeters wherein each coupling lightguide is 0.4 millimeters thick. In this embodiment, the top outer coupling lightguide is folded alongside the lateral edges on one side of the stacked array of coupling lightguides and the bottom outer coupling lightguide is folded alongside the opposite lateral edges on the opposite side of the stacked array of coupling lightguides. In this embodiment, each folded section contributes to the protection of the lateral edges of the coupling lightguides. In another embodiment, a low contact area film is placed between the lateral edges of the coupling lightguide and the folded section. In another embodiment, the folded section comprises low contact area surface features such that it provides protection without significantly coupling light from the lateral and/or surface areas of the coupling lightguides. In another embodiment, a coupling lightguide comprises an adhesive disposed between two regions of the coupling lightguide such that it is adhered to itself and wrapping around a stack of coupling lightguides.

Gap Between the Coupling Lightguides

In one embodiment, two or more coupling lightguides comprise a gap between the lightguides in the region where they connect to the lightguide region, lightguide region, or light mixing region. In another embodiment, the lightguides are formed from a manufacturing method wherein gaps between the lightguides are generated. For example, in one embodiment, the lightguides are formed by die cutting a film and the coupling lightguides have a gap between each other. In one embodiment, the gap between the coupling lightguides is greater than one selected from the group: 0.25, 0.5, 1, 2, 4, 5 and 10 millimeters. If the gap between the coupling lightguides is very large relative to the coupling lightguide width, then the uniformity of the light emitting region may be reduced (with respect to luminance or color uniformity) if the light mixing region is not sufficiently long in a direction parallel to the optical axis of the light propagating in the lightguide because a side of the lightguide has regions (the gap regions) where light is not entering the lightguide region. In one embodiment, a lightguide comprises two lightguides wherein the average of the width of the two coupling lightguides divided by the width of the gap between the coupling lightguides at the region where the coupling lightguides join the light mixing region or lightguide region is greater than one selected from the group: 1, 1.5, 2, 4, 6, 10, 20, 40, and 50. In another embodiment, the lightguide comprises large gaps between the coupling lightguides and a sufficiently long light mixing region to provide the desired level of uniformity. In another embodiment, a lightguide comprises two lightguides wherein the width of the gap between the coupling lightguides divided by the average of the width of the two coupling lightguides at the region where the coupling lightguides join the light mixing region or lightguide region is greater than one selected from the group: 1, 1.5, 2, 4, 6, 10, 20, 40, and 50.

Shaped or Tapered Coupling Lightguides

The width of the coupling lightguides may vary in a predetermined pattern. In one embodiment, the width of the coupling lightguides varies from a large width in a central coupling lightguide to smaller width in lightguides further from the central coupling lightguide as viewed when the light input edges of the coupling lightguides are disposed together to form a light input surface on the light input coupler. In this embodiment, a light source with a substantially circular light output aperture can couple into the coupling lightguides such that the light at higher angles from the optical axis are coupled into a smaller width strip such that the uniformity of the light emitting surface along the edge of the lightguide or lightguide region and parallel to the input edge of the lightguide region disposed to receive the light from the coupling lightguides is greater than one selected from the group: 60%, 70%, 80%, 90% and 95%.

Other shapes of stacked coupling lightguides can be envisioned, such as triangular, square, rectangular, oval, etc. that provide matched input areas to the light emitting surface of the light source. The widths of the coupling lightguides may also be tapered such that they redirect a portion of light received from the light source. The lightguides may be tapered near the light source, in the area along the coupling lightguide between the light source and the lightguide region, near the lightguide region, or some combination thereof.

In some embodiments, one light source will not provide sufficient light flux to enable the desired luminance or light output profile desired for a particular light emitting device. In this example, one may use more than one light input coupler and light source along the edge or side of a lightguide region or lightguide mixing region. In one embodiment, the average width of the coupling lightguides for at least one light input coupler are in a first width range of one selected from the group: 1-3, 1.01-3, 1.01-4, 0.7-1.5, 0.8-1.5, 0.9-1.5, 1-2, 1.1-2, 1.2-2, 1.3-2, 1.4-2, 0.7-2, 0.5-2, and 0.5-3 times the largest width of the light output surface of the light source in the direction of the lightguide coupler width at the light input surface.

In one embodiment, one or more coupling lightguides are tapered to a wider width in the region of the coupling lightguides adjacent the lightguide region or light mixing region. By tapering outward, the light from the coupling lightguides can expand into a wider spatial region before entering into the lightguide region (or other region) of the film. This can improve the spatial uniformity near the side of light input. Also, in this embodiment, by tapering the coupling lightguides outward, fewer coupling lightguides are needed to illuminate the side of the lightguide region. In one embodiment, the tapered coupling lightguides enable using fewer coupling lightguides that permit a thicker lightguide, a smaller output area light source, or use more than one stack of coupling lightguides with a particular light source. In one embodiment, the ratio of the average width of the coupling lightguides over their length to the width at the region where they couple light into the light mixing region or lightguide region is less than one selected from the group: 1, 0.8, 0.7, 0.6, 0.5, 0.4, 0.3, 0.2, and 0.1. In another embodiment, the ratio of the width of the coupling lightguides at the light input surface to the width at the region where they couple light into the light mixing region or lightguide region is less than one selected from the group: 1, 0.8, 0.7, 0.6, 0.5, 0.4, 0.3, 0.2, and 0.1.

In one embodiment, the coupling lightguide dimensional ratio, the ratio of the width of the coupling lightguide (the width is measured as the average dimension orthogonal to the general direction of propagation within the coupling lightguide toward the light mixing region, lightguide, or lightguide region) to the thickness of the coupling lightguide (the thickness is the average dimension measured in the direction perpendicular to the propagating plane of the light within the coupling lightguide) is greater than one selected from the group: 5:1, 10:1, 15:1, 20:1, 25:1, 30:1, 40:1, 50:1, 60:1, 70:1, and 100:1. In one embodiment, the thickness of the coupling lightguide is less than 600 microns and the width is greater than 10 millimeters. In one embodiment, the thickness of the coupling lightguide is less than 400 microns and the width is greater than 3 millimeters. In a further embodiment, the thickness of the coupling lightguide is less than 400 microns and the width is greater than 10 millimeters. In another embodiment, the thickness of the coupling lightguide is less than 300 microns and the width is less than 10 millimeters. In another embodiment, the thickness of the coupling lightguide or light transmitting film is less than 200 microns and the width is less than 20 millimeters. Imperfections at the lateral edges of the coupling lightguides (deviations from perfect planar, flat surfaces due to the cutting of strips, for example) can increase the loss of light through the edges or surfaces of the coupling lightguides. By increasing the width of the coupling lightguides, one can reduce the effects of edge imperfections since the light within the coupling lightguide bounces (reflects) less off of the later edge surfaces (interacts less with the surface) in a wider coupling lightguide than a narrow coupling lightguide for a give range of angles of light propagation. The width of the coupling lightguides is a factor affecting the spatial color or luminance uniformity of the light entering the lightguide region, light mixing region, or lightguide, and when the width of the coupling lightguide is large compared to the width (in that same direction) of the light emitting region, then spatially non-uniform regions can occur.

In another embodiment, the ratio of width of the light emitting surface area disposed to receive at least 10% of the light emitted from a grouping of coupling lightguides forming a light input coupler in a direction parallel to the width of the coupling lightguides to the average width of the coupling lightguides is greater than one selected from the group: 5:1, 15:1, 20:1, 25:1, 30:1, 40:1, 50:1, 60:1, 70:1, 100:1, 150:1, 200:1, 300:1, 500:1, and 1000:1. In another embodiment, the ratio of the total width of the total light emitting surface disposed to receive the light emitted from all of the coupling lightguides directing light toward the light emitting region or surface along the width to the average coupling lightguide width is greater than one selected from the group: 5:1, 15:1, 20:1, 25:1, 30:1, 40:1, 50:1, 60:1, 70:1, 100:1, 150:1, 200:1, 300:1, 500:1, and 1000:1.

In one embodiment, the width of the coupling lightguide is greater than one of the following: 1.1, 1.2, 1.3, 1.5, 1.8, 2, 3, 4, and 5 times the width of the light output surface of the light source disposed to couple light into the coupling lightguide. In another embodiment, the larger coupling lightguide width relative to the width of the light output surface of the light source allows for a higher degree of collimation (lower angular full-width at half maximum intensity) by the light collimating edges of the coupling lightguides.

Light Turning Edges of the Coupling Lightguides

In one embodiment, one or more coupling lightguides have an edge shape that optically turns by total internal reflection a portion of light within the coupling lightguide such that the optical axis of the light within the coupling lightguide is changed from a first optical axis angle to a second optical axis angle different than the first optical axis angle. More than one edge of one or more coupling lightguides may have a shape or profile to turn the light within the coupling lightguide and the edges may also provide collimation for portions of the light propagating within the coupling lightguides. For example, in one embodiment, one edge of a stack of coupling lightguides is curved such that the optical axis of the light propagating within the lightguide is rotated by 90 degrees. In one embodiment, the angle of rotation of the optical axis by one edge of a coupling lightguide is greater than one of the following: 10 degrees, 20 degrees, 40 degrees, 45 degrees, 60 degrees, 80 degrees, 90 degrees, and 120 degrees. In another embodiment, the angle of rotation of the optical axis by more than one edge region of a coupling lightguide is greater than one of the following: 10 degrees, 20 degrees, 40 degrees, 45 degrees, 60 degrees, 80 degrees, 90 degrees, 120 degrees, 135 degrees, and 160 degrees. By employing more than one specifically curved edge, the light may be rotated to a wide range of angles. In one embodiment, the light within the coupling lightguide is redirected in a first direction (+theta direction) by a first edge profile and rotated in a section direction (+theta 2) by a second edge profile. In another embodiment, the light within the coupling lightguide is redirected from a first direction to a second direction by a first edge profile and rotated back toward the first direction by a second edge profile region further along the coupling lightguide. In one embodiment, the light turning edges of the coupling lightguide are disposed in one or more regions including, without limitation, near the light source, near the light input surface of the coupling lightguides, near the light mixing region, near the lightguide region, between the light input surface of the coupling lightguides, near the light mixing region, near the region between the coupling lightguides and the lightguide region, and near the lightguide region.

In one embodiment, one lateral edge near the light input surface of the coupling lightguide has a light turning profile and the opposite lateral edge has a light collimating profile. In another embodiment, one lateral edge near the light input surface of the coupling lightguide has a light collimating profile followed by a light turning profile (in the direction of light propagation away from the light input surface within the coupling lightguide).

In one embodiment, two arrays of stacked coupling lightguides are disposed to receive light from a light source and rotate the optical axis of the light into two different directions. In another embodiment, a plurality of coupling lightguides with light turning edges may be folded and stacked along an edge of the lightguide region such that light from a light source oriented toward the lightguide region enters the stack of folded coupling lightguides, the light turning edges redirect the optical axis of the light to a first direction substantially parallel to the edge and the folds in the stacked coupling lightguides redirect the light to a direction substantially toward the lightguide region. In this embodiment, a second array of stacked, folded coupling lightguides can be stacked above or below (or interleaved with) the first array of stacked, folded coupling lightguides along the same edge of the lightguide region such that light from the same light source oriented toward the lightguide region enters the second array of stacked, folded coupling lightguides, the light turning edges of the second array of stack folded coupling lightguides redirect the optical axis of the light to a second direction substantially parallel to the edge (and opposite the first direction) and the folds in the stacked coupling lightguides redirect the light to a direction substantially toward the lightguide region. In another embodiment, the coupling lightguides from two different arrays along an edge of a lightguide region may be alternately stacked upon each other. The stacking arrangement may be predetermined, random, or a variation thereof. In another embodiment, a first stack of folded coupling lightguides from one side of a non-folded coupling lightguide are disposed adjacent one surface of the non-folded coupling lightguide and a second stack of folded coupling lightguides from the other side of the non-folded coupling lightguide are disposed adjacent the opposite surface of the non-folded coupling lightguide. In this embodiment, the non-folded coupling lightguide may be aligned to receive the central (higher flux) region of the light from the light source when there are equal numbers of coupling lightguides on the top surface and the bottom surface of the non-folded coupling lightguide. In this embodiment, the non-folded coupling lightguide may have a higher transmission (less light loss) since there are no folds or bends, thus more light reaches the lightguide region.

In another embodiment, the light turning edges of one or more coupling lightguides redirects light from two or more light sources with first optical axis angles to light having a second optical axis angles different than the first optical axis angles. In a further embodiment, the light turning edges of one or more coupling lightguides redirects a first portion of light from a light source with a first optical axis angle to a portion of light having second optical axis angle different than the first optical axis angle. In another embodiment, the light turning edges of one or more coupling lightguides redirects light from a first light source with a first optical axis angle to light having a second optical axis angle different from the first optical axis angle and light from a second light source with a third optical axis angle to light having a fourth optical axis angle different from the third optical axis angle.

In one embodiment, the light turning profile of one or more edges of a coupling lightguide has a curved shape when viewed substantially perpendicular to the film. In another embodiment, the curved shape has one or more conic, circular arc, parabolic, hyperbolic, geometric, parametric, or other algebraic curve regions. In another embodiment, the shape of the curve is designed to provide improved transmission through the coupling lightguide by minimizing bend loss (increased reflection) for a particular light input profile to the coupling lightguide, light input surface, light profile modifications before the curve (such as collimating edges for example), refractive indexes for the wavelengths of interest for the coupling lightguide material, surface finish of the edge, and coating or cladding type at the curve edge (low refractive index material, air, or metallized for example). In one embodiment, the light lost from the light turning profile of one or more edge regions of the coupling lightguide is less than one of the following: 50%, 40%, 30%, 20%, 10%, and 5%.

Vertical Light Turning Edges

In one embodiment, the vertical edges of the coupling lightguides (the edges tangential to the larger film surface) or the core regions of the coupling lightguides have a non-perpendicular cross-sectional profile that rotates the optical axis of a portion of incident light. In one embodiment, the vertical edges of one or more coupling lightguides or core regions of the coupling lightguides comprise a curved edge. In another embodiment, the vertical edges of one or more coupling lightguides or core regions comprise an angled edge wherein the angle to the surface normal of the coupling lightguide is greater than one of the following: 10 degrees, 20 degrees, 30 degrees, 40 degrees, 50 degrees and 60 degrees. In one embodiment, the use of vertical light turning edges of the core regions or coupling lightguides allows light to enter into the coupling lightguides from the coupling lightguide film surface where it is typically easier to obtain an optical finish as it can be the optically smooth surface of a film. In another embodiment, the coupling lightguides (or core regions of the coupling lightguides) are brought in contact and the vertical edges are cut at an angle to the surface normal. In one embodiment, the angled cut creates a smooth, continuous, angled vertical light turning edge on the edges of the coupling lightguides. In another embodiment, the angled, curved, or combination thereof vertical light turning edges are obtained by one or more of the following: laser cutting, polishing, grinding, die cutting, blade cutting or slicing, and hot blade cutting or slicing. In one embodiment, the vertical light turning edges are formed when the coupling lightguides are cut into the lightguide film and the coupling lightguides are aligned to form a vertical light turning edge.

In another embodiment, the light input surface of the coupling lightguides is the surface of one or more coupling lightguides and the surface comprises one or more surface relief profiles (such as an embossed Fresnel lens, microlens array, or prismatic structures) that turns, collimates or redirects a portion of the light from the light source. In a further embodiment, a light collimating element, light turning optical element, or light coupling optical element is disposed between the light source and the light input film surface of the coupling lightguide (non-edge surface). In one embodiment, the light input film surface is the surface of the cladding region or the core region of the coupling lightguide. In a further embodiment, the light collimating optical element, light turning optical element, or light coupling optical element is optically coupled to the core region, cladding region, or intermediate light transmitting region between the optical element and the coupling lightguide.

Vertical Light Collimating Edges

In one embodiment, the vertical edges of the coupling lightguide (the edges tangential to the larger film surface) or the core regions of the coupling lightguides have a non-perpendicular cross-sectional profile that collimate a portion of incident light. In one embodiment, the vertical edges of one or more coupling lightguides or core regions of the coupling lightguides comprise a curved edge that collimates a portion of incident light. In another embodiment, the vertical edges of one or more coupling lightguides or core regions comprise an angled edge wherein the angle to the surface normal of the coupling lightguide is greater than one of the following: 10 degrees, 20 degrees, 30 degrees, 40 degrees, 50 degrees and 60 degrees.

Non-Folded Coupling Lightguide

In a further embodiment, the film-based lightguide comprises a non-folded coupling lightguide disposed to receive light from the light input surface and direct light toward the lightguide region without turning the light. In one embodiment, the non-folded lightguide is used in conjunction with one or more light turning optical elements, light coupling optical elements, coupling lightguides with light turning edges, or coupling lightguides with collimating edges. For example, a light turning optical element may be disposed above or below a non-folded coupling lightguide such that a first portion of light from a light source substantially maintains the direction of its optical axis while passing through the non-folded coupling lightguide and the light from the source received by the light turning optical element is turned to enter into a stacked array of coupling lightguides. In another embodiment, the stacked array of coupling lightguides comprises folded coupling lightguides and a non-folded coupling lightguide.

In another embodiment, the non-folded coupling lightguide is disposed near an edge of the lightguide. In one embodiment, the non-folded coupling lightguide is disposed in the middle region of the edge of the lightguide region. In a further embodiment, the non-folded coupling lightguide is disposed along a side of the lightguide region at a region between the lateral sides of the lightguide region. In one embodiment, the non-folded coupling lightguide is disposed at various regions along one edge of a lightguide region wherein a plurality of light input couplers are used to direct light into the side of a lightguide region.

In another embodiment, the folded coupling lightguides have light collimating edges, substantially linear edges, or light turning edges. In one embodiment, at least one selected from the group: array of folded coupling lightguides, light turning optical element, light collimating optical element, and light source are physically coupled to the non-folded coupling lightguide. In another embodiment, folded coupling lightguides are physically coupled to each other and to the non-folded coupling lightguide by a pressure sensitive adhesive cladding layer and the thickness of the unconstrained lightguide film comprising the light emitting region and the array of coupling lightguides is less than one of the following: 1.2 times, 1.5 times, 2 times, and 3 times the thickness of the array of coupling lightguides. By bonding the folded coupling lightguides only to themselves, the coupling lightguides (when un-constrained) typically bend upward and increase the thickness of the array due to the folded coupling lightguides not being physically coupled to a fixed or relatively constrained region. By physically coupling the folded coupling lightguides to a non-folded coupling lightguide, the array of coupling lightguides is physically coupled to a separate region of the film which increases the stability and thus reduces the ability of the elastic energy stored from the bend to be released.

In one embodiment, the non-folded coupling lightguide comprises one or more of the following: light collimating edges, light turning edges, angled linear edges, and curved light redirecting edges. The non-folded coupling lightguide or the folded coupling lightguides may comprise curved regions near bend regions, turning regions, or collimating regions such that stress (such as resulting from torsional or lateral bending) does not focus at a sharp corner and increase the likelihood of fracture. In another embodiment, curved regions are disposed where the coupling lightguides join with the lightguide region or light mixing region of the film-based lightguide.

In another embodiment, at least one selected from the group: non-folded coupling lightguide, folding coupling lightguide, light collimating element, light turning optical element, light redirecting optical element, light coupling optical element, light mixing region, lightguide region, and cladding region of one or more elements is physically coupled to the relative position maintaining element. By physically coupling the coupling lightguides directly or indirectly to the relative position maintaining element, the elastic energy stored from the bend in the coupling lightguides held within the coupling lightguides and the combined thickness of the unconstrained coupling lightguides (unconstrained by an external housing for example) is reduced.

Interior Light Directing Edge

In one embodiment, the interior region of one or more coupling lightguides comprises an interior light directing edge. The interior light redirecting edge may be formed by cutting or otherwise removing an interior region of the coupling lightguide. In one embodiment, the interior light directed edge redirects a first portion of light within the coupling lightguide. In one embodiment, the interior light redirecting edges provide an additional level of control for directing the light within the coupling lightguides and can provide light flux redistribution within the coupling lightguide and within the lightguide region to achieve a predetermined light output pattern (such as higher uniformity or higher flux output in a specific region).

Cavity Region Withing the Coupling Lightguides

In one embodiment, one or more coupling lightguides or core regions of coupling lightguides comprises at least one cavity. In another embodiment, the cavity is disposed to receive the light source and the vertical edges of the core regions of the coupling lightguides are vertical light collimating optical edges. In one embodiment, a higher flux of light is coupled within the coupling lightguides with a cavity in at least one coupling lightguide than is coupled into the coupling lightguides without the cavity. This may be evaluated, for example, by measuring the light flux out of the coupling lightguides (when cut) or out of the light emitting device with an integrating sphere before and after filling the cavity with a high transmittance (>90% transmittance) light transmitting material (with the light source disposed adjacent the corresponding surface of the material) that is index-matched with the core region. In another embodiment, the cavity region provides registration or alignment of the coupling lightguides with the light source and increased light flux coupling into the coupling lightguides. In one embodiment, an array of coupling lightguides with vertical light collimating edges and a cavity alleviates the need for a light collimating optical element.

Coupling Lightguides Comprising Coupling Lightguides

In one embodiment, at least one coupling lightguide comprises a plurality of coupling lightguides. For example, a coupling lightguide may be further cut to comprise a plurality of coupling lightguides that connect to the edge of the coupling lightguide. In one embodiment, a film of thickness T comprises a first array of N number of coupling lightguides, each comprising a sub-array of M number of coupling lightguides. In this embodiment, the first array of coupling lightguides is folded in a first direction such that the coupling lightguides are aligned and stacked, and the sub-array of coupling lightguides is folded in a second direction such that the coupling lightguides are aligned and stacked. In this embodiment, the light input edge surface comprising the sub-array of coupling lightguides has a width the same as each of the narrower coupling lightguides and the light input surface has a height, H, defined by $H=T \times N \times M$. This can, for example, allow for the use of a thinner lightguide film to be used with a light source with a much larger dimension of the light output surface. In one embodiment, thin film-based lightguides are utilized, for example, when the film-based lightguide is the illuminating element of a frontlight disposed above a touchscreen in a reflective display. A thin lightguide in this embodiment provides a more accurate, and responsive touchscreen (such as with capacitive touchscreens for example) when the user touches the lightguide film. Alternatively, a light source with a larger dimension of the light output surface may be used for a specific lightguide film thickness.

Another advantage of using coupling lightguides comprising a plurality of coupling lightguides is that the light source can be disposed within the region between the side edges of the lightguide region and thus not extend beyond an edge of the display or light emitting region when the light source and light input coupler are folded behind the light emitting surface, for example.

Number of Coupling Lightguides in a Light Input Coupler

In one embodiment, the total number of coupling lightguides, NC, in a direction parallel to the light entrance edge of the lightguide region or lightguide receiving light from the coupling lightguide is $$NC = MF * W_{LES}/w,$$

where $W_{LES}$ is the total width of the light emitting surface in the direction parallel to the light entrance edge of the lightguide region or lightguide receiving light from the coupling lightguide, w is the average width of the coupling lightguides, and MF is the magnification factor. In one embodiment, the magnification factor is one selected from the group: 0.7, 0.8, 0.9, 1, 1.1, 1.2, 1.3, 1.4, 0.7-1.3, 0.8-1.2, and 0.9-1.1. In another embodiment, the number of coupling lightguides in a light input coupler or the total number of coupling lightguides in the light emitting device is selected from a group of 2, 3, 4, 5, 6, 8, 10, 11, 20, 30, 50, 70, 80, 90, 100, 2-50, 3-50, 4-50, 2-500, 4-500, greater than 10, greater than 20, greater than 30, greater than 40, greater than 50, greater than 60, greater than 70, greater than 80, greater than 90, greater than 100, greater than 120, greater than 140, greater than 200, greater than 300, greater than 400, greater than 500.

Coupling Lightguides Directed into More than One Light Input Surface

In a further embodiment, the coupling lightguides collectively do not couple light into the light mixing region, lightguide, or light mixing region in a contiguous manner. For example, every other coupling lightguide may be cut out from the film-based lightguide while still providing strips or coupling lightguides along one or more edges, but not continuously coupling light into the lightguide regions. By using fewer lightguides, the collection of light input edges may be reduced in size. This reduction in size, for example, can be used to combine multiple sets of coupling lightguides optically coupled to different regions of the same lightguide or a different lightguide, better match the light input surface size to the light source size, use a smaller light source, or use a thicker lightguide film with a particular light source where the dimension of the set of contiguous coupling lightguides in the thickness direction would be one selected from the group: 10%, 20%, 40%, 50%, and 100% greater than light emitting surface of the light source in the thickness direction when disposed to couple light into the light input surface.

In a further embodiment, coupling lightguides from a first region of a lightguide have light input edges collected into two or more light input surfaces. For example, the odd number coupling lightguides may be directed to a first white light source and the even number coupling lightguides may be coupled to a red, green, and blue light source. In another embodiment, the coupling lightguides from a first region of a lightguide are coupled to a plurality of white light sources to reduce visibility of color variations from the light source. For example, the even number coupling lightguides may couple light from a white light source with a first color temperature and the odd number coupling lightguides may couple light from a white light source with a second color temperature higher than the first such that the color non-uniformity, $\Delta u'v'$, along a direction parallel to an edge of the lightguide region along the light emitting surface is less than one selected from the group: 0.2, 0.1, 0.05, 0.01, and 0.004.

Similarly, three or more light input surfaces may also be used to couple light from 1, 2, 3 or more light sources. For example, every alternating first, second, and third coupling lightguide from a first region of a lightguide are directed to a first, second, and third light source of the same or different colors.

In a further embodiment, coupling lightguides from a first region of a lightguide have light input edges collected into two or more light input surfaces disposed to couple light into the lightguide for different modes of operation. For example, the first light input surface may be coupled to at least one light source suitable for daylight compatible output and the second light input surface may be coupled to at least one light source for NVIS compatible light output.

The order of the coupling lightguides directed to more than one light input surface do not need to be alternating and may be of any predetermined or random configuration. For example, the coupling lightguides from the top and bottom region of the lightguide may be directed to a different light input surface than the middle region. In a further embodiment, the coupling lightguides from a region of the lightguide are disposed together into a plurality of light input surfaces, each comprising more than one light input edge, arranged in an array, disposed to couple light from a collection of light sources, disposed within the same housing, disposed such that the light input surfaces are disposed adjacent each other, disposed in an order transposed to receive light from a collection of light sources, disposed in a non-contiguous arrangement wherein neighboring light input surfaces do not couple light into neighboring regions of the lightguide, lightguide region, or light mixing region.

In a further embodiment, a plurality of sets of coupling lightguides are arranged to provide a plurality of sets of light input surface along the same side, edge, the back, the front or within the same housing region of the light emitting device wherein the plurality of light input surfaces are disposed to receive light from one or a plurality of LEDs.

Order of Coupling Lightguides

In one embodiment, the coupling lightguides are disposed together at a light input edge forming a light input surface such that the order of the strips in a first direction is the order of the coupling lightguides as they direct light into the lightguide or lightguide region. In another embodiment, the coupling lightguides are interleaved such that the order of the strips in a first direction is not the same as the order of the coupling lightguides as they direct light into the lightguide or lightguide region. In one embodiment, the coupling lightguides are interleaved such that at least one coupling lightguide receiving light from a first light source of a first color is disposed between two coupling lightguides at a region near the lightguide region or light mixing region that receive light from a second light source with a second color different from the color of the first light source. In one embodiment, the color non-uniformity, $\Delta u'v'$, along a direction parallel to the edge of the lightguide region along the light emitting surface is less than one selected from the group: 0.2, 0.1, 0.05, 0.01, and 0.004. In another embodiment, the coupling lightguides are interleaved such that at least one pair of coupling lightguides adjacent to each other at the output region of the light input coupler near the light mixing region, lightguide, or lightguide region, are not adjacent to each other near the input surface of the light input coupler. In one embodiment, the interleaved coupling lightguides are arranged such that the non-uniform angular output profile is made more uniform at the output of the light input coupler by distributing the coupling lightguides such that output from the light input coupler does not spatially replicate the angular non-uniformity of the light source. For example, the strips of a light input coupler could alternate among four different regions of the lightguide region as they are combined at the light input surface so that the middle region would not have very high luminance light emitting surface region that corresponds to the typically high intensity from a light source at 0 degrees or along its optical axis.

In another embodiment, the coupling lightguides are interleaved such that at least one pair of coupling lightguides adjacent to each other near the light mixing region, lightguide, or lightguide region, do not receive light from at least one of the same light source, the same light input coupler, and the same mixing region. In another embodiment, the coupling lightguides are interleaved such that at least one pair of coupling lightguides adjacent to each other near a light input surface do not couple light to at least one of the same light input coupler, the same light mixing region, the same lightguide, the same lightguide region, the same film, the same light output surface. In another embodiment, the coupling lightguides are interleaved at the light input surface in a two-dimensional arrangement such that at least two neighboring coupling lightguides in a vertical, horizontal or other direction at the input surface do not couple light to a neighboring region of at least one selected from the group: the same light input coupler, the same light mixing region, the same lightguide, the same lightguide region, the same film, and the same light output surface.

In a further embodiment, coupling lightguides optically coupled to the lightguide region, light mixing region, or light emitting region near a first input region are arranged together in a holder disposed substantially along or near a second edge region which is disposed along an edge direction greater than one selected from the group: 30 degrees, 40 degrees, 50 degrees, 60 degrees, 70 degrees, 80 degrees and 85 degrees to first edge region. For example, light input couplers may couple light from a first light source and coupling lightguide holder disposed along the bottom edge of a liquid crystal display and direct the light into the region of the lightguide disposed along a side of the display oriented about 90 degrees to the bottom edge of the display. The coupling lightguides may direct light from a light source disposed along the top, bottom, or both into one or more sides of a display such that the light is substantially propagating parallel to the bottom and top edges within the lightguide region.

Coupling Lightguides Bonded to the Surface of a Lightguide Region

In one embodiment, the coupling lightguides are not segmented (or cut) regions of the same film which comprises the lightguide or lightguide region. In one embodiment, the coupling lightguides are formed and physically or optically attached to the lightguide, light mixing region, or lightguide region using at least one selected from the group: optical adhesive, bonding method (solvent welding, thermally bonding, ultrasonic welding, laser welding, hot gas welding, freehand welding, speed tip welding, extrusion welding, contact welding, hot plate welding, high frequency welding, injection welding, friction welding, spin welding, welding rod), and adhesive or joining techniques suitable for polymers. In one embodiment, the coupling lightguides are formed and optically coupled to the lightguide, mixing region, or lightguide region such that a significant portion of the light from the coupling lightguides is transferred into a waveguide condition within the mixing region, lightguide region, or lightguide. The coupling lightguide may be attached to the edge or a surface of the light mixing region, lightguide region, or lightguide. In one embodiment, the coupling lightguides are disposed within a first film wherein a second film comprising a lightguide region is extruded onto a region of the first film such that the coupling lightguides are optically coupled to the lightguide region. In another embodiment, the coupling lightguides are tapered in a region optically coupled to the lightguide. By separating out the production of the coupling lightguides with the production of the lightguide region, materials with different properties may be used for each region such as materials with different optical transmission properties, flexural modulus of elasticity, impact strength (Notched Izod), flexural rigidity, impact resistance, mechanical properties, physical properties, and other optical properties. In one embodiment, the coupling lightguides comprise a material with a flexural modulus less than 2 gigapascals and the lightguide or lightguide region comprises a material with a flexural modulus greater than 2 gigapascals. In one embodiment, the lightguide is a relatively stiff polycarbonate material and the coupling lightguides comprise a flexible elastomer or polyethylene. In another embodiment, the lightguide is an acrylic material and the coupling lightguides comprise a flexible fluoropolymer, elastomer or polyethylene. In one embodiment, the average thickness of the lightguide region or lightguide is more than 0.1 mm thicker than the average thickness of at least one coupling lightguide.

In one embodiment, at least one coupling lightguide is optically coupled to at least one selected from the group: a surface, edge, or interior region, of an input light coupler, light mixing region, lightguide region, and lightguide. In another embodiment, a film comprising parallel linear cuts along a direction of a film is bonded to a surface of a film in the extrusion process such that the strips are optically coupled to the lightguide film and the cut regions can be cut in the transverse direction to "free" the strips so that they can be brought together to form a light input surface of a light input coupler.

Coupling Lightguides Bonded to Each Other

In one embodiment, one or more coupling lightguides substantially bond to themselves in on or more regions. In another embodiment, the array of coupling lightguides are optically coupled to each other in at least one selected from the group: 5%, 10%, 20%, 30%, 40%, 50%, 60%, 70%, and 80% of a region where the coupling lightguides are adjacent each other. In one embodiment, the coupling lightguides are optically coupled to each other by a natural surface adhesion between adjacent coupling lightguides in one or more regions near the light input surface, within the array of coupling lightguides, along the length of and edge of the lightguide or lightguide region, or behind the lightguide region. In another embodiment, two or more coupling lightguides are optically coupled, operatively coupled, or adhered to each other in one or more regions.

Coupling Lightguides Ending within the Lightguide Region

In one embodiment, a film comprising parallel linear cuts along the machine direction of a film is guided between two extrusion layers or coatings such that the ends of the strips are effectively inside the other two layers or regions. In another embodiment, one or more edges of the coupling lightguide are optically couple to a layer or coating (such as an adhesive) within a lightguide to reduce scattering and increase light coupling into the lightguide. This could be done in a single step or in sequential steps. By having strips or coupling lightguides terminate within a lightguide, lightguide region, or light mixing region, there are fewer back reflections from the air-end edge interface as there would be on a simple surface bonding because the edge would effectively be optically coupled into the volume of the light transmitting material forming the light mixing region, lightguide region or lightguide (assuming the material near the edge could flow or deform around the edge or another material is used (such as an adhesive) to promote the optical coupling of the edge and potentially surfaces.

Strip or Coupling Lightguide Registration or Securing Feature

In one embodiment, at least one strip near the central region of a light input coupler is used to align or guide the coupling strips or to connect the coupling lightguides to a lightguide or housing. In a fold-design wherein the coupling lightguides are folded toward the center of the light input coupler, a central strip or lightguide may not be folded to receive light from the light source due to geometrical limitations on the inability to fold the central strip or coupling lightguide. This central strip or coupling lightguide may be used for one selected from the group: aligning the light input coupler or housing to the strips (or lightguide), tightening the fold of the strips or coupling lightguide stack to reduce the volume, registering, securing or locking down the position of the light input coupler housing, provide a lever or arm to pull together components of a folding mechanism which bend or fold the coupling lightguides, coupling lightguides, lightguide or other element relative to one of the aforementioned elements.

Tab Region

In one embodiment, one or more of the strips or coupling lightguides comprises a tab or tab region that is used to register, align, or secure the location of the strip or coupling lightguide relative to the housing, folder, holder, lightguide, light source, light input coupler, or other element of the light emitting device. In another embodiment, at least one strip or coupling lightguide comprises a pin, hole, cut-out, tab, or other feature useful for registering, aligning, or securing the location of the strip or coupling lightguide. In one embodiment, the tab region is disposed at a side of one or more light sources when the light source is disposed to couple light into a coupling lightguide. In a further embodiment, the tab region may be removed, by tearing for example, after the stacking of the coupling lightguides. For example, the coupling lightguides may have an opening or aperture cut within the coupling lightguides that align to form a cavity within which the light emitting region of the light source may be disposed such that the light from the light source is directed into the light input surfaces of the coupling lightguides. After physically constraining the coupling lightguides (by adhering them to each other or to another element or by mechanical clamping, alignment guide or other means for example), all or a portion of the tab region may be removed by tearing without reducing the optical quality of the light input surface disposed to receive light from the light source. In another embodiment, the tab region comprises one or more perforations or cut regions that promote the tearing or removal of the tab region along a predetermined path.

In another embodiment, the tab region or region of the coupling lightguides comprising registration or alignment openings or apertures are stacked such that the openings or apertures align onto a registration pin or post disposed on or physically coupled to the light turning optical element, light collimating optical element, light coupling element, light source, light source circuit board, relative position maintaining element, light input coupler housing, or other element of the light input coupler such that the light input surfaces of the coupling lightguides are aligned and disposed to receive light from the element or light source.

The tab region may comprise registration openings or apertures on either side of the openings or apertures forming the cavity in coupling lightguide such that registration pins assist in the aligning and relative positioning of the coupling lightguides. In another embodiment, one or more coupling lightguides (folded non-folded) comprise low light loss registration openings or apertures in a low light flux region. Low light loss registration openings or apertures in low light flux regions of the coupling lightguides are those wherein less than one of the following: 2%, 5%, 10% and 20% of the light flux from a light source reaches the opening or aperture directly or indirectly within a coupling lightguide. This can be measured by filling the openings or apertures with a black light absorbing material such as a black latex paint and measuring the loss in light output from the light emitting region using an integrating sphere.

In another embodiment, the tab regions of the coupling lightguides allow for the light input surface of the stacked array of coupling lightguides to be formed after stacking the coupling lightguides such that an improved optical finish of the light input surface can be obtained. For example, in one embodiment, the array of coupling lightguides is stacked with a tab region extended from the input region of the coupling lightguides. The stacked array is then cut in the tab region (and optionally mechanically, thermally, chemically or otherwise polished) to provide a continuous smooth input surface.

Holding the Coupling Lightguide Position Relative to the Light Source or Optical Element In another embodiment, the tab region may be cut to provide a physically constraining mechanism for an optical element or the light source. For example, in one embodiment, the tab region of the coupling lightguides comprises one or more arms or ridges such that when the coupling lightguides are stacked in an array, the arms or ridges form a constraining groove or cavity to substantially maintain the optical element or light source in at least one direction. In another embodiment, the stacked array of coupling lightguides form a cavity that allows an extended ridge of a light collimating optic to be positioned within the cavity such that the light collimating optic substantially maintains its position relative to the coupling lightguides. Various forms of grooves, ridges, interlocking shapes, pins, openings, apertures and other constraining shapes may be used with the optical element (such as the light turning optical element or light collimating optical element) or the light source (or housing of the light source) and the shape cut into the coupling lightguides to constrain the element or light source when placed into the interlocking shape.

Expended Coupling Lightguides

In one embodiment, the coupling lightguides are extended such that the coupling lightguides may be folded in an organized fashion by using a relative position maintaining element. By extending the coupling lightguides, the relative position and order of the coupling lightguides may be maintained during the aligning and stacking process such that the coupling lightguides may be stacked and aligned in an organized fashion. For example, in one embodiment, the coupling lightguides are extended with an inverted shape such that they are mirrored along a first direction. In one embodiment, the folding operation creates two stacked arrays of coupling lightguides which may be used to form two different light emitting devices or two illuminated regions illuminated by the same light source. In another embodiment, a first relative position maintaining element substantially maintains the relative position of the coupling lightguides near a first lightguide region and a second relative position maintaining element substantially maintains the relative position of the extended regions of the coupling lightguides (which may form the coupling lightguides of a second light emitting device or region).

Varying Coupling Lightguide Thickness

In one embodiment, at least one coupling lightguide or strip varies in the thickness direction along the path of the light propagating through the lightguide. In one embodiment, at least one coupling lightguide or strip varies in the thickness direction substantially perpendicular to the path of the light propagating through the lightguide. In another embodiment, the dimension of at least one coupling lightguide or strip varies in a direction parallel to the optical axis of the light emitting device along the path of the light propagating through the lightguide. In one embodiment, the thickness of the coupling lightguide increases as the light propagates from a light source to the light mixing region, lightguide, or lightguide region. In one embodiment, the thickness of the coupling lightguide decreases as the light propagates from a light source to the light mixing region, lightguide, or lightguide region. In one embodiment, the thickness of a coupling lightguide in a first region divided by the thickness of the coupling lightguide in a second region is greater than one selected from the group: 1, 2, 4, 6, 10, 20, 40, 60 and 100.

Light Turning Optical Elements or Edges for Light Source Placement

In one embodiment, the light turning optical elements or light turning coupling lightguide edges may be used to position the light source on the same side of the lightguide region as the coupling lightguides. In another embodiment, the light turning optical elements or light turning coupling lightguide edges may be used to position the light source within the extended boundaries of the coupling lightguides such that the light source does not extend past an edge of the lightguide, light emitting region, edges of the display area, lightguide region or bevel. For example, a film-based lightguide with coupling lightguides folded along one edge may have angled edges or a region of the lightguide region not to be directly illuminated from a coupling lightguide in order to position the light source within the region bounded by the edges of the lightguide region. Alternatively, the stack of coupling lightguides along one edge may have light turning edges near the light source ends such that the light source can be disposed with light directed toward the lightguide region. This can allow the light to be turned and directed into the coupling lightguides and when the light source is folded behind the display, the light source does not extend past the outer display edges.

Light Mixing Region

In one embodiment, a light emitting device comprises a light mixing region disposed in an optical path between the light input coupler and the lightguide region. The light mixing region can provide a region for the light output from individual coupling lightguides to mix together and improve at least one of the spatial luminance uniformity, spatial color uniformity, angular color uniformity, angular luminance uniformity, angular luminous intensity uniformity or any combination thereof within a region of the lightguide or of the surface or output of the light emitting region or light emitting device. In one embodiment, the width of the light mixing region is selected from a range from 0.1 mm (for small displays) to more than 3.048 meters (for large billboards). In one embodiment, the light mixing region is the region disposed along an optical path near the end region of the coupling lightguides whereupon light from two or more coupling lightguides may inter-mix and subsequently propagate to a light emitting region of the lightguide. In one embodiment, the light mixing region is formed from the same component or material as at least one of the lightguide, lightguide region, light input coupler, and coupling lightguides. In another embodiment, the light mixing region comprises a material that is different than at least one selected from the group: lightguide, lightguide region, light input coupler, and coupling lightguides. The light mixing region may be a rectangular, square or other shaped region or it may be a peripheral region surrounding all or a portion of the light emitting region or lightguide region. In one embodiment, the surface area of the light mixing region of a light emitting device is one selected from the group: less than 1%, less than 5%, less than 10%, less than 20%, less than 30%, less than 40%, less than 50%, less than 60%, less than 70%, greater than 20%, greater than 30%, greater than 40% greater than 50%, greater than 60%, greater than 70%, greater than 80%, greater than 90%, 1-10%, 10-20%, 20-50%, 50-70%, 70-90%, 80-95% of the total outer surface area of the light emitting surface or the area of the light emitting surface from which light is emitted.

In one embodiment, a film-based lightguide comprises a light mixing region with a lateral dimension longer than a coupling lightguide width and the coupling lightguides do not extend from the entire edge region corresponding to the light emitting region of the lightguide. In one embodiment, the width of the gap along the edge without a coupling lightguide is greater than one of the following: 1 times, 2 times, 3 times, or 4 times the average width of the neighboring coupling lightguides. In a further embodiment, the width of the gap along the edge without a coupling lightguide is greater than one of the following: 1 times, 2 times, 3 times, or 4 times the lateral width of the light mixing region. For example, in one embodiment, a film-based lightguide comprises coupling lightguides with a width of 2 centimeters disposed along a light mixing region that is 4 centimeters long in the lateral direction (such as can readily be the case if the light mixing region folds behind a reflective display for a film-based frontlight), except in a central region where there is a 2 centimeter gap without a coupling lightguide extension. In this embodiment, the light within the neighboring coupling lightguides may spread into the gap region of the light mixing region not illuminated by a coupling lightguide directly and mix together such that the light in the light emitting area is sufficiently uniform. In a further embodiment, a light mixing region comprises two or more gaps without coupling lightguides extending therefrom. In a further embodiment, a light mixing region comprises alternating gaps between the coupling lightguide extensions along an edge of a film-based lightguide.

Light Output Optical Element

In one embodiment, a light emitting device comprises a light output optical element disposed to receive light from a light source and couple the light into a film-based lightguide. In one embodiment, the light output optical element is light transmitting optical element that receives light from a light source and transmits light from the light source through a light transmitting region such that when optically coupled to a film-based lightguide, a portion of the light will propagate into the lightguide through a light receiving region and propagate under total internal reflection. In another embodiment, the light output optical element has an average or maximum thickness greater than 250 microns and is formed by injection molding, compression molding, thermoforming, casting, extrusion or other non-film-based polymer component forming method. In another embodiment, the light output optical element is not contiguous with the film-based lightguide comprising the light emitting region of the light emitting device when the element or the lightguide is formed. For example, the light output optical element may be a sheet of acrylic extruded to a thickness of 500 microns or 1 millimeter, an injection molded tapered optical lightguide, or a cross-linked cast lightguide cured with a region of the lightguide film embedded within the lightguide optical element. In another embodiment, for example, the light output optical element is an injection molded acrylic lightguide that substantially generates a line of light output and an edge or surface is optically coupled to a film-based lightguide. In a further embodiment, the light output optical element is an acrylic injection molded optical element and is optically coupled to a film-based lightguide comprising an acrylic or silicone core region. In the previous embodiment, the acrylic materials may be the same or comprise similar types of components, however, they are formed separately, and one is not a contiguous extension of the other. In another embodiment, the region of the light output optical element through which light is transmitted from the light source into the film-based lightguide comprises at least one material that is not in the core lightguide layer of the light transmitting film-based lightguide. In another embodiment, the light output optical element is tapered in the direction toward the light transmitting region or light extraction region of a film-based lightguide. In one embodiment, the light output optical element also serves another function within the light emitting device selected from the group: a housing, a housing component, a light turning optical element, a light collimating optical element, a light coupling optical element, an optical window, a relative position maintaining element, a low contact region, a light input coupler, a light redirecting optical element, one or more coupling lightguides, holding mechanism, and holder.

Thickness of the Light Output Optical Element

In one embodiment, the average or maximum thickness of the light output optical element in the region comprising the light transmitting region in a direction substantially perpendicular to the optical axis of the light propagating within the optical element is less than one selected from the group: 100%, 90%, 70%, 50%, 25%, 10%, and 5% of the dimension of the light transmitting region of the light output optical element in the direction parallel to the optical axis of the light within the light output optical element. In another embodiment, the average or maximum thickness of the light output optical element in the region comprising the light transmitting region is less than one selected from the group: 100%, 90%, 70%, 50%, 25%, 10%, and 5% of the thickness of the core layer of the film-based lightguide in a direction substantially perpendicular to the optical axis of the light propagating within the optical element. In one embodiment, the light output optical element is thinner than the core layer of the film-based lightguide such that a wider range of input angles of light propagating into the core layer has an opportunity to propagate laterally within the core layer (in the direction of the optical axis) so that it reaches the cladding layer (or air interface) and totally internally reflects instead of propagating back into the light output optical element.

Cladding Layer

In one embodiment, at least one of the light input coupler, coupling lightguide, light mixing region, lightguide region, and lightguide comprises a cladding layer optically coupled to at least one surface. A cladding region, as used herein, is a layer optically coupled to a surface wherein the cladding layer comprises a material with a refractive index, $n_{clad}$, less than the refractive index of the material, $n_m$, of the surface to which it is optically coupled. In one embodiment, $n_m$-$n_{clad}$ is one selected from the group: 0.001-0.005, 0.001-0.01, 0.001-0.1, 0.001-0.2, 0.001-0.3, 0.001-0.4, 0.01-0.1, 0.1-0.5, 0.1-0.3, 0.2-0.5, greater than 0.01, greater than 0.1, greater than 0.2, and greater than 0.3. In one embodiment, the cladding is one selected from the group: methyl-based silicone pressure sensitive adhesive, fluoropolymer material (applied with using coating comprising a fluoropolymer substantially dissolved in a solvent), and a fluoropolymer film. The cladding layer may be incorporated to provide a separation layer between the core or core part of a lightguide region and the outer surface to reduce undesirable out-coupling (for example, frustrated totally internally reflected light by touching the film with an oily finger) from the core or core region of a lightguide. Components or objects such as additional films, layers, objects, fingers, dust etc. that come in contact or optical contact directly with a core or core region of a lightguide may couple light out of the lightguide, absorb light or transfer the totally internally reflected light into a new layer. By adding a cladding layer with a lower refractive index than the core, a portion of the light will totally internally reflect at the core-cladding layer interface. Cladding layers may also be used to provide the benefit of at least one of increased rigidity, increased flexural modulus, increased impact resistance, anti-glare properties, provide an intermediate layer for combining with other layers such as in the case of a cladding functioning as a tie layer or a base or substrate for an anti-reflection coating, a substrate for an optical component such as a polarizer, liquid crystal material, increased scratch resistance, provide additional functionality (such as a low-tack adhesive to bond the lightguide region to another element, a window "cling type" film such as a highly plasticized PVC). The cladding layer may be an adhesive, such as a low refractive index silicone adhesive which is optically coupled to another element of the device, the lightguide, the lightguide region, the light mixing region, the light input coupler, or a combination of one or more of the aforementioned elements or regions. In one embodiment, a cladding layer is optically coupled to a rear polarizer in a backlit liquid crystal display. In another embodiment, the cladding layer is optically coupled to a polarizer or outer surface of a front-lit display such as an electrophoretic display, e-book display, e-reader display, MEMs type display, electronic paper displays such as E-ink® display by E Ink Corporation, reflective or partially reflective LCD display, cholesteric display, or other display capable of being illuminated from the front. In another embodiment, the cladding layer is an adhesive that bonds the lightguide or lightguide region to a component such as a substrate (glass or polymer), optical element (such as a polarizer, retarder film, diffuser film, brightness enhancement film, protective film (such as a protective polycarbonate film), the light input coupler, coupling lightguides, or other element of the light emitting device. In one embodiment, the cladding layer is separated from the lightguide or lightguide region core layer by at least one additional layer or adhesive.

In one embodiment, a region of cladding material is removed or is absent in the region wherein the lightguide layer or lightguide is optically coupled to another region of the lightguide wherein the cladding is removed or absent such that light can couple between the two regions. In one embodiment, the cladding is removed or absent in a region near an edge of a lightguide, lightguide region, strip or region cut from a lightguide region, or coupling lightguide such that light nearing the edge of the lightguide can be redirected by folding or bending the region back onto a region of the lightguide wherein the cladding has been removed where the regions are optically coupled together. In another embodiment, the cladding is removed or absent in the region disposed between the lightguide regions of two coupling lightguides disposed to receive light from a light source or near a light input surface. By removing or not applying or disposing a cladding in the region between the input ends of two or more coupling lightguides disposed to receive light from a light source, light is not directly coupled into the cladding region edge.

In one embodiment, the cladding region is optically coupled to one or more surfaces of the light mixing region to prevent out-coupling of light from the lightguide when it is in contact with another component. In this embodiment, the cladding also enables the cladding and light mixing region to be physically coupled to another component.

Cladding Location

In one embodiment, the cladding region is optically coupled to at least one selected from the group: lightguide, lightguide region, light mixing region, one surface of the lightguide, two surfaces of the lightguide, light input coupler, coupling lightguides, and an outer surface of the film. In another embodiment, the cladding is disposed in optical contact with the lightguide, lightguide region, or layer or layers optically coupled to the lightguide and the cladding material is not disposed on one or more coupling lightguides. In one embodiment, the coupling lightguides do not comprise a cladding layer between the core regions in the region near the light input surface or light source. In another embodiment, the core regions may be pressed or held together, and the edges may be cut and/or polished after stacking or assembly to form a light input surface or a light turning edge that is flat, curved, or a combination thereof. In another embodiment, the cladding layer is a pressure sensitive adhesive and the release liner for the pressure sensitive adhesive is selectively removed in the region of one or more coupling lightguides that are stacked or aligned together into an array such that the cladding helps maintain the relative position of the coupling lightguides relative to each other. In another embodiment, the protective liner is removed from the inner cladding regions of the coupling lightguides and is left on one or both outer surfaces of the outer coupling lightguides.

In one embodiment, a cladding layer is disposed on one or both opposite surfaces of the light emitting region and is not disposed between two or more coupling lightguides at the light input surface. For example, in one embodiment, a mask layer is applied to a film based lightguide corresponding to the end regions of the coupling lightguides that will form the light input surface after cutting (and possibly the coupling lightguides) and the film is coated on one or both sides with a low refractive index coating. In this embodiment, when the mask is removed and the coupling lightguides are folded (using, for example a relative position maintaining element) and stacked, the light input surface can comprises core layers without cladding layers and the light emitting region can comprise a cladding layer (and the light mixing region may also comprise a cladding and/or light absorbing region), which is beneficial for optical efficiency (light is directed into the cladding at the input surface) and in applications such as film-based frontlights for reflective or transflective displays where a cladding may be desired in the light emitting region.

In another embodiment, the protective liner of at least one outer surface of the outer coupling lightguides is removed such that the stack of coupling lightguides may be bonded to one of the following: a circuit board, a non-folded coupling lightguide, a light collimating optical element, a light turning optical element, a light coupling optical element, a flexible connector or substrate for a display or touchscreen, a second array of stacked coupling lightguides, a light input coupler housing, a light emitting device housing, a thermal transfer element, a heat sink, a light source, an alignment guide, a registration guide or component comprising a window for the light input surface, and any suitable element disposed on and/or physically coupled to an element of the light input surface or light emitting device. In one embodiment, the coupling lightguides do not comprise a cladding region on either planar side and optical loss at the bends or folds in the coupling lightguides is reduced. In another embodiment, the coupling lightguides do not comprise a cladding region on either planar side and the light input surface input coupling efficiency is increased due to the light input surface area having a higher concentration of lightguide received surface relative to a lightguide with at least one cladding. In a further embodiment, the light emitting region has at least one cladding region or layer and the percentage of the area of the light input surface of the coupling lightguides disposed to transmit light into the lightguide portion of the coupling lightguides is greater than one of the following: 70%, 80%, 85%, 90%, 95%, 98% and 99%. The cladding may be on one side only of the lightguide or the light emitting device could be designed to be optically coupled to a material with a refractive index lower than the lightguide, such as in the case with a plasticized PVC film (n=1.53) (or other low-tack material) temporarily adhered to a glass window (n=1.51).

In one embodiment, the cladding on at least one surface of the lightguide is applied (such as coated or co-extruded) and the cladding on the coupling lightguides is subsequently removed. In a further embodiment, the cladding applied on the surface of the lightguide (or the lightguide is applied onto the surface of the cladding) such that the regions corresponding to the coupling lightguides do not have a cladding. For example, the cladding material could be extruded or coated onto a lightguide film in a central region wherein the outer sides of the film will comprise coupling lightguides. Similarly, the cladding may be absent on the coupling lightguides in the region disposed in close proximity to one or more light sources or the light input surface.

In one embodiment, two or more core regions of the coupling lightguides do not comprise a cladding region between the core regions in a region of the coupling lightguide disposed within a distance selected from the group: 1 millimeter, 2 millimeters, 4 millimeters, and 8 millimeters from the light input surface edge of the coupling lightguides. In a further embodiment, two or more core regions of the coupling lightguides do not comprise a cladding region between the core regions in a region of the coupling lightguide disposed within a distance selected from the group: 10%, 20%, 50%, 100%, 200%, and 300% of the combined thicknesses of the cores of the coupling lightguides disposed to receive light from the light source from the light input surface edge of the coupling lightguides. In one embodiment, the coupling lightguides in the region proximate the light input surface do not comprise cladding between the core regions (but may contain cladding on the outer surfaces of the collection of coupling lightguides) and the coupling lightguides are optically coupled together with an index-matching adhesive or material or the coupling lightguides are optically bonded, fused, or thermo-mechanically welded together by applying heat and pressure. In a further embodiment, a light source is disposed at a distance to the light input surface of the coupling lightguides less than one selected from the group: 0.5 millimeter, 1 millimeter, 2 millimeters, 4 millimeters, and 6 millimeters and the dimension of the light input surface in the first direction parallel to the thickness direction of the coupling lightguides is greater than one selected from the group: 100%, 110%, 120%, 130%, 150%, 180%, and 200% the dimension of the light emitting surface of the light source in the first direction. In another embodiment, disposing an index-matching material between the core regions of the coupling lightguides or optically coupling or boding the coupling lightguides together in the region proximate the light source optically couples at least one selected from the group: 10%, 20%, 30%, 40%, and 50% more light into the coupling lightguides than would be coupled into the coupling lightguides with the cladding regions extending substantially to the light input edge of the coupling lightguide. In one embodiment, the index-matching adhesive or material has a refractive index difference from the core region less than one selected from the group: 0.1, 0.08, 0.05, and 0.02. In another embodiment, the index-matching adhesive or material has a refractive index greater by less than one selected from the group: 0.1, 0.08, 0.05, and 0.02 the refractive index of the core region. In a further embodiment, a cladding region is disposed between a first set of core regions of coupling lightguides and for a second set of coupling lightguides an index-matching region is disposed between the core regions of the coupling lightguides or they are fused together. In a further embodiment, the coupling lightguides disposed to receive light from the geometric center of the light emitting area of the light source within a first angle of the optical axis of the light source have cladding regions disposed between the core regions, and the core regions at angles larger than the first angle have index-matching regions disposed between the core regions of the coupling lightguides or they are fused together. In one embodiment, the first angle is selected from the group: 10 degrees, 20 degrees, 30 degrees, 40 degrees, 50 degrees, and 60 degrees. In the aforementioned embodiments, the cladding region may be a low refractive index material or air. In a further embodiment, the total thickness of the coupling lightguides in the region disposed to receive light from a light source to be coupled into the coupling lightguides is less than n times the thickness of the lightguide region where n is the number of coupling lightguides. In a further embodiment, the total thickness of the coupling lightguides in the region disposed to receive light from a light source to be coupled into the coupling lightguides is substantially equal to n times the thickness of the lightguide layer within the lightguide region.

Cladding Thickness

In a one embodiment, the average thickness of one or both cladding layers of the lightguide is less than one selected from the group: 100 microns, 60 microns, 30 microns, 20 microns, 10 microns, 6 microns, 4 microns, 2 microns, 1 micron, 0.8 microns, 0.5 microns, 0.3 microns, and 0.1 microns.

In a total internal reflection condition, the penetration depth, $\lambda_e$ of the evanescent wave light from the denser region into the rarer medium from the interface at which the amplitude of the light in the rarer medium is 1/e that at the boundary is given by the equation:

$$\lambda_e = \frac{\lambda_0}{2\pi[(n_s^2(\sin\theta_i)^2) - n_e^2]^{\frac{1}{2}}}$$

where $\lambda_0$ is the wavelength of the light in a vacuum, $n_s$ is the refractive index of the denser medium (core region) and $n_e$ is the refractive index of the rarer medium (cladding layer) and $\theta_i$ is the angle of incidence to the interface within the denser medium. The equation for the penetration depth illustrates that for many of the angular ranges above the critical angle, the light propagating within the lightguide does not need a very thick cladding thickness to maintain the lightguide condition. For example, light within the visible wavelength range of 400 nanometers to 700 nanometers propagating within a silicone film-based core region of refractive index 1.47 with a fluoropolymer cladding material with a refractive index of 1.33 has a critical angle at about 65 degrees and the light propagating between 70 degrees and 90 degrees has a 1/e penetration depth, $\lambda_e$, less than about 0.3 microns. In this example, the cladding region thickness can be about 0.3 microns and the lightguide will significantly maintain visible light transmission in a lightguide condition from about 70 degrees and 90 degrees from the normal to the interface. In another embodiment, the ratio of the thickness of the core layer to one or more cladding layers is greater than one selected from the group: 2, 4, 6, 8, 10, 20, 30, 40, and 60 to one. In one embodiment, a high core to cladding layer thickness ratio where the cladding extends over the light emitting region and the coupling lightguides enables more light to be coupled into the core layer at the light input surface because the cladding regions represent a lower percentage of the surface area at the light input surface.

In one embodiment, the cladding layer comprises an adhesive such as a silicone-based adhesive, acrylate-based adhesive, epoxy, radiation curable adhesive, UV curable adhesive, or other light transmitting adhesive. The cladding layer material may comprise light scattering domains and may scatter light anisotropically or isotropically. In one embodiment, the cladding layer is an adhesive such as those described in U.S. Pat. No. 6,727,313. In another embodiment, the cladding material comprises domains less than 200 nm in size with a low refractive index such as those described in U.S. Pat. No. 6,773,801. Other low refractive index materials, fluoropolymer materials, polymers and adhesives may be used such as those disclosed U.S. Pat. Nos. 6,887,334 and 6,827,886 and U.S. patent application Ser. No. 11/795,534.

In another embodiment, a light emitting device comprises a lightguide with a cladding on at least one side of a lightguide with a thickness within one selected from the group: 0.1-10, 0.5-5, 0.8-2, 0.9-1.5, 1-10, 0.1-1, and 1-5 times a 1/e penetration depth, $\lambda_e$, at for an angle, $\theta$, selected from the group: 80, 70, 60, 50, 40, 30, 20, and 10 degrees from the core-cladding interface normal within the lightguide; and a light output coupler or light extraction region (or film) is disposed to couple a first portion of incident light out of the lightguide when in optical contact with the cladding layer. For example, in one embodiment, a removable and replaceable light extraction film comprising high refractive index light scattering features (such as $TiO_2$ or high refractive index glass particles, beads, or flakes) is disposed upon the cladding layer of a lightguide in a light fixture comprising a polycarbonate lightguide with an amorphous fluoropolymer cladding of thickness $\lambda_e$. In this embodiment, in the regions of the removable and replaceable light extraction film with the scattering features, the light can be frustrated from the lightguide and escape the lightguide. In this embodiment, a light extracting region or film may be used with a lightguide with a cladding region to couple light out of the lightguide. In this embodiment, a cladding region can help protect the lightguide (from scratches, unintentional total internal reflection frustration or absorption when in contact with a surface, for example) while still allowing a removable and replaceable light extraction film to allow for user configurable light output properties. In another embodiment, at least one film or component selected from the group: a light output coupling film, a distribution lightguide, and a light extraction feature is optically coupled to, disposed upon, or formed in a cladding region and couples a first portion of light out of the lightguide and cladding region. In one embodiment the first portion is greater than one selected from the group: 5%, 10%, 15%, 20%, 30%, 50%, and 70% of the flux within the lightguide or within the region comprising the thin cladding layer and film or component.

In one embodiment, the light input surface disposed to receive light from the light source does not have a cladding layer. In one embodiment, the ratio of the cladding area to the core layer area at the light input surface is greater than 0 and less than one selected from the group: 0.5, 0.4, 0.3, 0.2, 0.1, 0.05, 0.02, and 0.01. In another embodiment, the ratio of the cladding area to the core layer area in the regions of the light input surface receiving light from the light source with at least 5% of the peak luminous intensity at the light input surface is greater than 0 and less than one selected from the group: 0.5, 0.4, 0.3, 0.2, 0.1, 0.05, 0.02, and 0.01.

Cladding Layer Materials

Fluoropolymer materials may be used a low refractive index cladding material and may be broadly categorized into one of two basic classes. A first class includes those amorphous fluoropolymers comprising interpolymerized units derived from vinylidene fluoride (VDF) and hexafluoropropylene (HFP) and optionally tetrafluoroethylene (TFE) monomers. Examples of such are commercially available from 3M Company as Dyneon™ Fluoroelastomer FC 2145 and FT 2430. Additional amorphous fluoropolymers that can be used in embodiments are, for example, VDF-chlorotrifluoroethylene copolymers. One such VDF-chlorotrifluoroethylene copolymer is commercially known as Kel-F™ 3700, available from 3M Company. As used herein, amorphous fluoropolymers are materials that contain essentially no crystallinity or possess no significant melting point as determined for example by differential scanning calorimetry (DSC). For the purpose of this discussion, a copolymer is defined as a polymeric material resulting from the simultaneous polymerization of two or more dissimilar monomers and a homopolymer is a polymeric material resulting from the polymerization of a single monomer.

The second significant class of fluoropolymers useful in an embodiment are those homo and copolymers based on fluorinated monomers such as TFE or VDF which do contain a crystalline melting point such as polyvinylidene fluoride (PVDF, available commercially from 3M company as Dyneon™ PVDF, or more preferable thermoplastic copolymers of TFE such as those based on the crystalline microstructure of TFE-HFP-VDF. Examples of such polymers are those available from 3M under the trade name Dyneon™ Fluoroplastics THV™ 200.

A general description and preparation of these classes of fluoropolymers can be found in Encyclopedia Chemical Technology, Fluorocarbon Elastomers, Kirk-Othmer (1993), or in Modern Fluoropolymers, J. Scheirs Ed, (1997), J Wiley Science, Chapters 2, 13, and 32. (ISBN 0-471-97055-7).

In one embodiment, the fluoropolymers are copolymers formed from the constituent monomers known as tetrafluoroethylene ("TFE"), hexafluoropropylene ("HFP"), and vinylidene fluoride ("VdF," "VF2,"). The monomer structures for these constituents are shown below as (1), (2) and (3):

TFE: CF2=CF2 (1)

VDF: CH2=CF2 (2)

HFP: CF2=CF—CF3 (3)

In one embodiment, the preferred fluoropolymer consists of at least two of the constituent monomers (HFP and VDF), and more preferably all three of the constituents monomers in varying molar amounts. Additional monomers not depicted above but may also be useful in an embodiment include perfluorovinyl ether monomers of the general structure: CF 2=CF—OR f, wherein R f can be a branched or linear perfluoroalkyl radical of 1-8 carbons and can itself contain additional heteroatoms such as oxygen. Specific examples are perfluoromethyl vinyl ether, perfluoropropyl vinyl ether, and perfluoro(3-methoxy-propyl) vinyl ether. Additional monomer examples are found in WO00/12754 to Worm, assigned to 3M, and U.S. Pat. No. 5,214,100 to Carlson. Other fluoropolymer materials may be used such as those disclosed in U.S. patent application Ser. No. 11/026,614.

In one embodiment, the cladding material is birefringent and the refractive index in at least a first direction is less than refractive index of the lightguide region, lightguide core, or material to which it is optically coupled.

Collimated light propagating through a material may be reduced in intensity after passing through the material due to scattering (scattering loss coefficient), absorption (absorption coefficient), or a combination of scattering and absorption (attenuation coefficient). In one embodiment, the cladding comprises a material with an average absorption coefficient for collimated light less than one selected from the group: 0.03 cm$^{-1}$, 0.02 cm$^{-1}$, 0.01 cm$^{-1}$, and 0.005 cm$^{-1}$ over the visible wavelength spectrum from 400 nanometers to 700 nanometers. In another embodiment, the cladding comprises a material with an average scattering loss coefficient for collimated light less than one selected from the group: 0.03 cm$^{-1}$, 0.02 cm$^{-1}$, 0.01 cm$^{-1}$, and 0.005 cm$^{-1}$ over the visible wavelength spectrum from 400 nanometers to 700 nanometers. In another embodiment, the cladding comprises a material with an average attenuation coefficient for collimated light less than one selected from the group: 0.03 cm$^{-1}$, 0.02 cm$^{-1}$, 0.01 cm$^{-1}$, and 0.005 cm$^{-1}$ over the visible wavelength spectrum from 400 nanometers to 700 nanometers.

In a further embodiment, a lightguide comprises a hard cladding layer that substantially protects a soft core layer (such as a soft silicone or silicone elastomer).

In one embodiment, a lightguide comprises a core material with a Durometer Shore A hardness (JIS) less than 50 and at least one cladding layer with a Durometer Shore A hardness (JIS) greater than 50. In one embodiment, a lightguide comprises a core material with an ASTM D638-10 Young's Modulus less than 2 MPa and at least one cladding layer with an ASTM D638-10 Young's Modulus greater than 2 MPa at 25 degrees Celsius. In another embodiment, a lightguide comprises a core material with an ASTM D638-10 Young's Modulus less than 1.5 MPa and at least one cladding layer with an ASTM D638-10 Young's Modulus greater than 2 MPa at 25 degrees Celsius. In a further embodiment, a lightguide comprises a core material with an ASTM D638-10 Young's Modulus less than 1 MPa and at least one cladding layer with an ASTM D638-10 Young's Modulus greater than 2 MPa at 25 degrees Celsius.

In one embodiment, a lightguide comprises a core material with an ASTM D638-10 Young's Modulus less than 2 MPa and the lightguide film has an ASTM D638-10 Young's Modulus greater than 2 MPa at 25 degrees Celsius. In another embodiment, a lightguide comprises a core material with an ASTM D638-10 Young's Modulus less than 1.5 MPa and the lightguide film has an ASTM D638-10 Young's Modulus greater than 2 MPa at 25 degrees Celsius. In one embodiment, a lightguide comprises a core material with an ASTM D638-10 Young's Modulus less than 1 MPa and the lightguide film has an ASTM D638-10 Young's Modulus greater than 2 MPa at 25 degrees Celsius.

In another embodiment, the cladding comprises a material with an effective refractive index less than the core layer due to microstructures or nanostructures. In another embodiment, the cladding layer comprises a porous region comprising air or other gas or material with a refractive index less than 1.2 such that the effective refractive index of the cladding layer is than that of the material around the porous regions. For example, in one embodiment, the cladding layer is an aerogel or arrangement of nano-structured materials disposed on the core layer that creates a cladding layer with an effective refractive index less than the core layer. In one embodiment, the nano-structured material comprises fibers, particles, or domains with an average diameter or dimension in the plane parallel to the core layer surface or perpendicular to the core layer surface less than one selected from the group: 1000, 500, 300, 200, 100, 50, 20, 10, 5, and 2 nanometers. For example, in one embodiment, the cladding layer is a coating comprising nanostructured fibers, comprising polymeric materials such as, without limitation, cellulose, polyester, PVC, PTFE, polystyrene, PMMA, PDMS, or other light transmitting or partially light transmitting materials. In another embodiment, materials that normally scattering too much light in bulk form (such as HDPE or polypropylene) to be used as a core or cladding material for lightguide lengths greater than 1 meter (such as scattering greater than 10% of the light out of the lightguide over the 1 meter length) are used in a nanostructured form. For example, in one embodiment, the nanostructured cladding material on the film based lightguide, when formed into a bulk solid form (such as a 200 micron thick homogeneous film formed without mechanically formed physical structures volumetrically or on the surface under film processing conditions designed to minimize haze substantially) has an ASTM haze greater than 0.5%.

In a further embodiment, the microstructured or nanostructured cladding material comprises a structure that will "wet-out" or optically couple light into a light extraction feature disposed in physical contact with the microstructured or nanostructured cladding material. For example, in one embodiment, the light extraction feature comprises nanostructured surface features that when in close proximity or contact with the nanostructured cladding region couple light from the cladding region. In one embodiment, the microstructured or nanostructured cladding material has complementary structures to the light extraction feature structures, such as a male-female part or other simple or complex complementary structures such that the effective refractive index in the region comprising the two structures is larger than that of the cladding region without the light extraction features.

Reflective Elements

In one embodiment, at least one selected from the group: light source, light input surface, light input coupler, coupling lightguide, lightguide region, and lightguide comprises a reflective element or surface optically coupled to it, disposed adjacent to it, or disposed to receive light from it wherein the reflective region is one selected from the group: specularly reflecting region, diffusely reflecting region, metallic coating on a region (such as an ITO coating, Aluminized PET, Silver coating, etc.), multi-layer reflector dichroic reflector, multi-layer polymeric reflector, giant birefringent optical films, enhanced specular reflector films, reflective ink or particles within a coating or layer, and a white reflective film comprising at least one selected from the group: titanium dioxide, barium sulfate, and voids. In another embodiment, a light emitting device comprises a lightguide wherein at least one light reflecting material selected from the group: a light recycling element, a specularly reflective tape with a diffuse reflectance (specular component included) greater than 70%, a retroreflective film (such as a corner cube film or glass bead based retroreflective film), white reflecting film, and aluminum housing is disposed near or optically coupled at least one edge region of the lightguide disposed to receive light from the lightguide and redirect a first portion of light back into the lightguide. In another embodiment, a light emitting device comprises a lightguide wherein at least one light absorbing material selected from the group: a light absorbing tape with a diffuse reflectance (specular component included) less than 50%, a region comprising a light absorbing dye or pigment, a region comprising carbon black particles, a region comprising light absorbing ink, paint, films or surfaces, and a black material is disposed near or optically coupled at least one edge region of the lightguide disposed to receive light from the lightguide and redirect a first portion of light back into the lightguide. In a further embodiment, a light reflecting material and a light absorbing material of the aforementioned types is disposed near or optically coupled at least one edge region of the lightguide disposed to receive light from the lightguide and redirect a first portion of light back into the lightguide and absorb a second portion of incident light. In one embodiment, the light reflecting or light absorbing material is in the form of a line of ink or tape adhered onto the surface of the lightguide film. In one embodiment, the light reflecting material is a specularly reflecting tape adhered to the top surface, edge, and bottom surface of the lightguide near the edge of the lightguide. In another embodiment, the light absorbing material is a light absorbing tape adhered to the top surface, edge, and bottom surface of the lightguide near the edge of the lightguide. In another embodiment, the light absorbing material is a light absorbing ink or paint (such as a black acrylic based paint) adhered to at least one selected from the group: the edge, the top surface near the edge, and the bottom surface near the edge of the lightguide film.

In one embodiment, the light emitting device is a backlight illuminating a display or other object to be illuminated and the light emitting region, lightguide, or lightguide region is disposed between a reflective surface or element and the object to be illuminated. In another embodiment, the reflective element is a voided white PET film such as TETORON® film UX Series from TEIJIN (Japan). In one embodiment, the reflective element or surface has a diffuse reflectance d/8 with the specular component included (DR-SCI) measured with a Minolta CM508D spectrometer greater than one selected from the group: 60%, 70%, 80%, 90%, and 95%. In another embodiment, the reflective element or surface has a diffuse reflectance d/8 with the specular component excluded (DR-SCE) measured with a Minolta CM508D spectrometer greater than one selected from the group: 60%, 70%, 80%, 90%, and 95%. In another embodiment, the reflective element or surface has a specular reflectance greater than one selected from the group: 60%, 70%, 80%, 90%, and 95%. The specular reflectance, as defined herein, is the percentage of light reflected from a surface illuminated by a 532 nanometer laser that is within a 10 degree (full angle) cone centered about the optical axis of the reflected light. This can be measured by using an integrating sphere wherein the aperture opening for the integrating sphere is positioned at a distance from the point of reflection such that the angular extent of the captured light is 10 degrees full angle. The percent reflection is measured against a reflectance standard with a known specular reflectance, a reflectance standard, film, or object that have extremely low levels of scattering.

Light Reflecting Optical Element is Also a Second Element

In addition to reflecting incident light, in one embodiment, the light reflecting element is also at least one second element selected from the group: light blocking element, low contact area covering element, housing element, light collimating optical element, light turning optical element and thermal transfer element. In another embodiment, the light reflecting optical element is a second element within a region of the light reflecting optical element. In a further embodiment, the light reflecting optical element comprises a bend region, tab region, hole region, layer region, or extended region that is, or forms a component thereof, a second element. For example, a diffuse light reflecting element comprising a voided PET diffuse reflecting film may be disposed adjacent the lightguide region to provide diffuse reflection and the film may further comprise a specular reflecting metallized coating on an extended region of the film that is bent and functions to collimate incident light from the light source. In another embodiment, the second element or second region of the light reflecting optical element is contiguous with one or more regions of the light reflecting optical element. In a further embodiment, the light reflecting optical element is a region, coating, element or layer physically coupled to a second element. In another embodiment, the second element is a region, coating, element or layer physically coupled to a light reflecting optical element. For example, in one embodiment, the light reflecting optical element is a metalized PET film adhered to the back of a transparent, low contact area film comprising polyurethane and a surface relief profile wherein the film combination extends from beneath the lightguide region to wrap around one or more coupling lightguides. In a further embodiment, the light reflecting optical element is physically and/or optically coupled to the film-based lightguide and is cut during the same cutting process that generates the coupling lightguides and the light reflecting optical element is cut into regions that are angled, curved or subsequently angled or curved to form a light collimating optical element or a light turning optical element. The size, shape, quantity, orientation, material and location of the tab regions, light reflecting regions or other regions of the light reflecting optical element may vary as needed to provide optical (efficiency, light collimation, light redirection, etc.), mechanical (rigidity, connection with other elements, alignment, ease of manufacture etc.), or system (reduced volume, increased efficiency, additional functionality such as color mixing) benefits such as is known in the art of optical elements, displays, light fixtures, etc. For example, the tab regions of a light reflecting optical element that specularly reflects incident light may comprise a parabolic, polynomial or other geometrical cross-sectional shape such that the angular FWHM intensity, light flux, orientation, uniformity, or light profile is controlled. For example, the curved cross-sectional shape of one or more tab regions may be that of a compound parabolic concentrator. In another embodiment, the light reflecting optical element comprises hole regions, tab regions, adhesive regions or other alignment, physical coupling, optical coupling, or positioning regions that correspond in shape, size, or location to other elements of the light emitting device to facilitate at least one selected from the group: alignment, position, adhesion, physically coupling, and optically coupling with a second element or component of the light emitting device. For example, the light reflecting optical element may be a specularly reflecting or mirror-like metallized PET that is disposed beneath a substantially planar light emitting region and extends into the region near the light source and comprises extended tabs or folding regions that fold and are optically coupled to at least one outer surface of a light collimating element. In this embodiment, the light reflecting optical element is also a component of a light collimating optical element. In another embodiment, the light reflecting optical element is a specularly reflecting metallized PET film that is optically coupled to a non-folded coupling lightguide using a pressure sensitive adhesive and is extended toward the light source such that the extended region is optically coupled to an angled surface of a light collimating optical element that collimates a portion of the light from the light source in the plane perpendicular to the plane comprising the surface of the non-folded coupling lightguide optically coupled to the light reflecting optical element.

In one embodiment, the light reflecting element is also a light blocking element wherein the light reflecting element blocks a first portion of light escaping the light input coupler, coupling lightguide, light source, light redirecting optical element, light collimating optical element, light mixing region, lightguide region. In another embodiment, the light reflecting element prevents the visibility of stray light, undesirable light, or a predetermined area of light emitting or redirecting surface from reaching the viewer of a display, sign, or a light emitting device. For example, a metallized specularly reflecting PET film may be disposed to reflect light from one side of the lightguide region back toward the lightguide region and also extend to wrap around the stack of coupling lightguide using the PSA optically coupled to the coupling lightguides (which may be a cladding layer for the lightguides) to adhere the metallized PET film to the stack and block stray light escaping from the coupling lightguides and becoming visible.

In one embodiment, the light reflecting element is also a low contact area covering. For example, in one embodiment, the light reflecting element is a metallized PET film comprising a methacrylate-based coating that comprises surface relief features. In this embodiment, the light reflecting element may wrap around the stack without significantly extracting light from the coupling lightguides when air is used as a cladding region. In another embodiment, the reflective element has non-planar regions such that the reflective surface is not flat and the contact area between the light reflecting film and one or more coupling lightguides or lightguide regions is a low percentage of the exposed surface area.

In another embodiment, the light reflecting element is also a housing element. For example, in one embodiment, the light reflecting element is a reflective coating on the inner wall of the housing for the coupling lightguides. The housing may have reflective surfaces or reflect light from within (such as an internal reflecting layer or material). The light reflecting element may be the housing for the lightguide region or other lightguide or component of the light emitting device.

In a further embodiment, the light reflecting element is also a light collimating optical element disposed to reduce the angular full-width at half maximum intensity of light from a light source before the light enters one or more coupling lightguides. In one embodiment, the light reflecting optical element is a specularly reflecting multilayer polymeric film (such as a giant birefringent optical film) disposed on one side of the light emitting region of lightguide film and extended in a direction toward the light source with folds or curved regions that are bent or folded to form angled or curved shapes that receive light from the light source and reflect and collimate light toward the input surface of one or more coupling lightguides. More than one fold or curved region may be used to provide different shapes or orientations of light reflecting surfaces for different regions disposed to receive light from the light source. For example, an enhanced specularly reflecting multilayer polymer film (such as a giant birefringent optical film) disposed and optically coupled to the lightguide region of a film-based lightguide using a low refractive index PSA cladding layer may extend toward the light source and comprise a first extended region that wraps around the cladding region to protect and block stray light and further comprise an extended region that comprises two tabs that are folded and a cavity wherein the light source may be disposed such that light from the light source within a first plane is collimated by the extended region tabs. In one embodiment, the use of the light reflecting element that is physically coupled to another component in the light emitting device (such as the film-based lightguide or coupling lightguides) provides an anchor or registration assistance for aligning the light collimating optical element tabs or reflective regions of the light reflecting element.

In a further embodiment, the light reflecting element is also a light turning optical element disposed to redirect the optical axis of light in a first plane. In one embodiment, the light reflecting optical element is a specularly reflecting multilayer polymer film (such as a giant birefringent optical film) disposed on one side of the light emitting region of lightguide film and extended in a direction toward the light source with folds or curved regions that are bent or folded to form angled or curved shapes that receive light from the light source and reflect and redirect the optical axis of the incident light toward the input surface of one or more coupling lightguides. More than one fold or curved region may be used to provide different shapes or orientations of light reflecting surfaces for different regions disposed to receive light from the light source. For example, a specularly reflecting multilayer polymer film disposed and optically coupled to the lightguide region of a film-based lightguide using a low refractive index PSA cladding layer may extend toward the light source and comprise an first extended region that wraps around the cladding region to protect and block stray light and further comprise an extended region that comprises two tabs that are folded and a cavity wherein the light source may be disposed such that optical axis of the light from the light source within a first plane in a first direction is redirected by the extended region tabs into a second direction different than the first direction. In one embodiment, the use of the light reflecting element that is physically coupled to another component in the light emitting device (such as the film-based lightguide or coupling lightguides) provides an anchor or registration assistance for aligning the light turning optical element tabs or reflective regions of the light reflecting element.

In a further embodiment, the light reflecting element is also a thermal transfer element that transfers heat away from the light source. For example, in one embodiment, the light reflecting element is a reflective aluminum housing disposed on one side of the lightguide region and extending to and thermally coupled to a circuit board that is thermally coupled to the light source such that heat from the light source is thermally transferred to the aluminum. In another example, the light reflecting optical element is a high reflectance polished region of an aluminum sheet that further comprises (or is thermally coupled to) an extrusion region with fins or heat sink extensions. In another embodiment, the thermal transfer element is an aluminum extrusion comprising the coupling lightguide in an interior region wherein the inner surface of the extrusion is a light reflecting optical element disposed to reflect light received from the coupling lightguides back toward the coupling lightguides. In another embodiment, the thermal transfer element is an aluminum extrusion comprising coupling lightguides in an interior region wherein the extrusion further comprises a light collimating reflective surface disposed to collimate light from the light source.

Protective Layers

In one embodiment, at least one selected from the group: light input surface, light input coupler, coupling lightguide, lightguide region, and lightguide comprises a protective element or layer optically coupled to it, physically coupled to it, disposed adjacent to it, or disposed between it and a light emitting surface of the light emitting device. A protective film element can have a higher scratch resistance, higher impact resistance, hardcoating layer, impact absorbing layer or other layer or element suitable to protect at least one selected from the group: light input surface, light input coupler, coupling lightguide, lightguide region, and lightguide from scratches, impacts, dropping the device, and interaction with sharp objects, etc. In another embodiment, at least one outer surface region of the lightguide (or layer thereof) comprises a removable protective film or masking film. For example, in one embodiment, a film based lightguide comprises removable protective polyethylene films physically coupled to the cladding regions on either side of a core region. In another embodiment, one of the cladding regions is an adhesive and the protective polyethylene film prevents contamination of the adhesive before the film is adhered to a window, for example, and the other cladding region comprises a "hardcoat" coating with a pencil hardness greater than 2H where the protective polyethylene film prevents scratches before installation of the light emitting device.

Coupling Light into the Surface of the Coupling Lightguide

In one embodiment, the light input surface of the light input coupler is at least one surface of at least one coupling lightguide. In one embodiment, light is coupled into a coupling lightguide such that it remains in the lightguide for multiple total internal reflections by at least one optical element or feature on at least one surface or optically coupled to at least one surface comprising an optical region selected from the group: lens, prismatic lens, prismatic film, diffraction grating, holographic optical element, diffractive optical element, diffuser, anisotropic diffuser, refractive surface relief features, diffractive surface relief features, volumetric light re-directing features, micro-scale volumetric or surface relief features, nano-scale volumetric or surface relief features, and total-internal-reflection volumetric or surface features. The optical element or feature may be incorporated on one or several coupling lightguides in a stacked or predetermined physically arranged distribution of coupling lightguides. In one embodiment, the optical element or feature is arranged spatially in a pattern within or on one coupling lightguide or across multiple coupling lightguides. In one embodiment, the coupling efficiency of an optical element or feature is greater than one selected from the group: 50%, 60%, 70%, 80%, and 90% for a wavelength range selected from one selected from the group: 350 nm-400 nm, 400 nm-700 nm, 450 nm-490 nm, 490 nm-560 nm, and 635 nm-700 nm. The coupling efficiency as defined herein is the percent of incident light from a light source disposed to direct light onto at least one coupling lightguide which is coupled into the at least one coupling lightguide disposed to receive light from the light source which remains within the coupling lightguide at an angle greater than the critical angle further along in the region of the lightguide just past the light input surface region. In one embodiment, two or more coupling lightguides are stacked or bundled together wherein they each have an optical element or feature disposed to couple light into the coupling lightguide and the optical element or feature has a coupling efficiency less than one selected from the group: 50%, 60%, 70%, 80%, and 90% for a wavelength range selected from one selected from the group: 350 nm-400 nm, 400 nm-700 nm, 450 nm-490 nm, 490 nm-560 nm, and 635 nm-700 nm. By stacking a group of coupling lightguides, for example, one can use lower coupling efficiencies to enable a portion of the incident light to pass through a first coupling lightguide onto a second coupling lightguide to allow light to be coupled into the second coupling lightguide. In one embodiment, the coupling efficiency is graded or varies in a first direction through an arrangement of coupling lightguides and a light reflecting element or region is disposed on the opposite side of the arrangement of coupling lightguides disposed to reflect a portion of incident light back through the coupling lightguides.

Coupling Light into Two or More Surfaces

In one embodiment, light is coupled through light input couplers, coupling lightguides, optical elements, or a combination thereof to at least two surfaces or surface regions of a at least one lightguide in a light emitting device. In another embodiment, the light coupled through the surface of a lightguide or lightguide region is directed by the light extraction features into an angular range different than that of the light directed by the same or different light extraction features from light coupled through a second surface or second surface region of a lightguide or lightguide region of a light emitting device. In another embodiment, a first light extracting region comprising a first set of light re-directing features or light extraction features that directs light incident through a first surface or edge into a first range of angles upon exiting the light emitting surface of the lightguide and a second light extracting region comprises a second set of light re-directing or light extraction features that direct light incident through a second surface or edge into a second range of angles upon exiting the light emitting surface of the lightguide. Variations in the light re-directing features include, but are not limited to, feature height, shape, orientation, density, width, length, material, angle of a surface, location in the x, y, and z direction and include dispersed phase domains, grooves, pits, micro-lenses, prismatic elements, air cavities, hollow microspheres, dispersed microspheres, and other known light extraction features or elements. In another embodiment, a light emitting device comprises at least one lightguide and a first light source disposed to couple light through a surface of at least one lightguide and a second light source disposed to couple light through the edge of at least one lightguide wherein the coupling mechanism is at least one selected from the group: light input couplers, optical element, coupling lightguide, optical components or coupling lightguides optically coupled to a surface or edge, diffractive optics, holographic optical element, diffraction grating, Fresnel lens element, prismatic film, light redirecting optic and other optical element.

Light Input Couplers Disposed Near More than One Edge of a Lightguide

In one embodiment, a light emitting device comprises a plurality of light input couplers disposed to couple light into a lightguide from at least two input regions disposed near two different edges of a lightguide. In another embodiment, two light input couplers are disposed on opposite sides of a lightguide. In another embodiment, light input couplers are disposed on three or four sides of a film-type lightguide. In a further embodiment, more than one light input coupler, housing, or light input surface is disposed to receive light from a single light source, light source package, array of light sources or light source strip (such as a substantially linear array of LEDs). For example, two housing for two light input couplers disposed to couple light to two different regions of a lightguide are disposed to receive light from a substantially linear array of LEDs. In another embodiment a first input surface comprising a first collection of coupling lightguides optically coupled to a first region of a lightguide and a second input surface comprising a second collection of coupling lightguides optically coupled to a second region of a lightguide different than the first region are disposed to receive light from one selected from the group: the same light source, a plurality of light sources, light sources in a package, an array or collection of light sources, a linear array of light sources, one or more LEDs, an LED package, a linear array of LEDs, and LEDs of multiple colors.

Strip Folding Device

In one embodiment, the light emitting device comprises frame members which assist in at least one of the folding or holding of the coupling lightguides or strips. Methods for folding and holding coupling lightguides such as film-based lightguides using frame members are disclosed in International (PCT) Publication No. WO 2009/048863 and PCT application titled "ILLUMINATION VIA FLEXIBLE THIN FILMS" filed on Jan. 26, 2010 by Anthony Nichols and Shawn Pucylowski, U.S. Provisional patent applications ser. Nos. 61/147,215 and 61/147,237, the contents of each are incorporated by reference herein. In one embodiment, the coupling lightguide folding (or bending) and/or holding (or housing) element is formed from at least one selected from the group: rigid plastic material, black colored material, opaque material, semi-transparent material, metal foil, metal sheet, aluminum sheet, and aluminum foil. In one embodiment, the folding or holding material has a flexural rigidity or (flexural modulus) at least twice the flexural rigidity (or modulus) of the film or coupling lightguides which it folds or holds.

Housing or Holding Device for Light Input Coupler

In one embodiment, a light emitting device comprises a housing or holding device that holds or contains at least part of a light input coupler and light source. The housing or holding device may house or contain within at least one selected from the group: light input coupler, light source, coupling lightguides, lightguide, optical components, electrical components, heat sink or other thermal components, attachment mechanisms, registration mechanisms, folding mechanisms devices, and frames. The housing or holding device may comprise a plurality of components or any combination of the aforementioned components. The housing or holding device may serve one or more of functions selected from the group: protect from dust and debris contamination, provide air-tight seal, provide a water-tight seal, house or contain components, provide a safety housing for electrical or optical components, assist with the folding or bending of the coupling lightguides, assist in the alignment or holding of the lightguide, coupling lightguide, light source or light input coupler relative to another component, maintain the arrangement of the coupling lightguides, recycle light (such as with reflecting inner walls), provide attachment mechanisms for attaching the light emitting device to an external object or surface, provide an opaque container such that stray light does not escape through specific regions, provide a translucent surface for displaying indicia or providing illumination to an object external to the light emitting device, comprise a connector for release and interchangeability of components, and provide a latch or connector to connect with other holding devices or housings.

In one embodiment, the coupling lightguides are terminated within the housing or holding element. In another embodiment, the inner surface of the housing or holding element has a specular or diffuse reflectance greater than 50% and the inner surface appears white or minor-like. In another embodiment, the outer surface of the housing or holding device has a specular or diffuse reflectance greater than 50% and the outer surface appears white or mirror-like. In another embodiment, at least one wall of the housing or holding device has a specular or diffuse reflectance less than 50% and the inner surface appears gray, black or like a very dark mirror. In another embodiment, at least one wall or surface of the housing or holding device is opaque and has a luminous transmittance measured according to ASTM D1003 version 07e1 of less than 50%. In another embodiment, at least one wall or surface of the housing or holding device has a luminous transmittance measured according to ASTM D1003 version 07e1 greater than 30% and the light exiting the wall or surface from the light source within the housing or holding device provides illumination for a component of the light emitting device, illumination for an object external to the light emitting device, or illumination of a surface to display a sign, indicia, passive display, a second display or indicia, or an active display such as providing backlight illumination for an LCD.

In one embodiment, the housing or holding device comprises at least one selected from the group: connector, pin, clip, latch, adhesive region, clamp, joining mechanism, and other connecting element or mechanical means to connect or hold the housing or holding device to another housing or holding device, lightguide, coupling lightguide, film, strip, cartridge, removable component or components, an exterior surface such as a window or automobile, light source, electronics or electrical component, circuit board for the electronics or light source such as an LED, heat sink or other thermal control element, frame of the light emitting device, and other component of the light emitting device.

In another embodiment, the input ends and output ends of the coupling lightguides are held in physical contact with the relative position maintaining elements by at least one selected from the group: magnetic grips, mechanical grips, clamps, screws, mechanical adhesion, chemical adhesion, dispersive adhesion, diffusive adhesion, electrostatic adhesion, vacuum holding, or an adhesive.

Curved or Flexible Housing

In another embodiment, the housing comprises at least one curved surface. A curved surface can permit non-linear shapes or devices or facilitate incorporating non-planer or bent lightguides or coupling lightguides. In one embodiment, a light emitting device comprises a housing with at least one curved surface wherein the housing comprises curved or bent coupling lightguides. In another embodiment, the housing is flexible such that it may be bent temporarily, permanently or semi-permanently. By using a flexible housing, for example, the light emitting device may be able to be bent such that the light emitting surface is curved along with the housing, the light emitting area may curve around a bend in a wall or corner, for example. In one embodiment, the housing or lightguide may be bent temporarily such that the initial shape is substantially restored (bending a long housing to get it through a door for example). In another embodiment, the housing or lightguide may be bent permanently or semi-permanently such that the bent shape is substantially sustained after release (such as when it is desired to have a curved light emitting device to provide a curved sign or display, for example).

Housing Including a Thermal Transfer Element

In one embodiment, the housing comprises a thermal transfer element disposed to transfer heat from a component within the housing to an outer surface of the housing. In another embodiment, the thermal transfer element is one selected from the group: heat sink, metallic or ceramic element, fan, heat pipe, synthetic jet, air jet producing actuator, active cooling element, passive cooling element, rear portion of a metal core or other conductive circuit board, thermally conductive adhesive, or other component known to thermally conduct heat. In one embodiment, the thermal transfer element has a thermal conductivity greater than one selected from the group: 0.2, 0.5, 0.7, 1, 3, 5, 50, 100, 120, 180, 237, 300, and 400 watts per meter-kelvin. In another embodiment, a frame supporting the film-based lightguide (for example without limitation, a frame that holds tension in the film to maintain flatness) is a thermal transfer element. In one embodiment, the light source is an LED and the LED is thermally coupled to the ballast or frame that is a thermal transfer element. In a further embodiment, a frame or ballast used to thermally transfer heat away from the light source and is also a housing for the light emitting device.

Size of the Housing or Coupling Lightguide Holding Device

In one embodiment, the sizes of the two smaller dimensions of the housing or coupling lightguide holding device are less than one selected from the group: 500, 400, 300, 200, 100, 50, 25, 10, and 5 times the thickness of the lightguide or coupling lightguides. In another embodiment, at least one dimension of the housing or lightguide holding device is smaller due to the use of more than one light input coupler disposed along an edge of the lightguide. In this embodiment, the thickness of the housing or holding device can be reduced because for a fixed number of strips or coupling lightguides, they can be arranged into multiple smaller stacks instead of a single larger stack. This also enables more light to be coupled into the lightguide by using multiple light input couplers and light sources.

Removable and Replaceable Component of Light Emitting Device

In one embodiment, the light emitting device comprises a removable and replaceable section, region, component, or collection of components. By removing less than all of the components of the light emitting device, a portion of the light emitting device may remain installed or usable. For example, in one embodiment, the light source may be removed and a new one may be installed as an upgrade or replacement. Similarly, in another example, the lightguide and coupling lightguides may be removed to display a new logo or indicia without requiring replacement of the light input coupler. Other examples include, but are not limited to, replacing the light input coupler, electrical components, power cord, LED driver, light input optical element, security component, memory chip, light emitting region, etc. As discussed herein, one or more first elements are discussed as being removable and replaceable with a different set of first elements relative to the remaining second elements, however, it is understood that the second elements may also be removed and replaced by a different set of second elements depending on which elements are desired to be replaced. For example, in one embodiment, a light emitting device comprising a light input coupler and a removable and replaceable film-based lightguide with coupling lightguide extensions that is removed from the light input coupler (to display a different logo for example) or the light input coupler may be removed and replaced from the removable and replaceable film-based lightguide if a light source fails. The first or second set of elements may also comprise other elements or components of the light emitting device. In another embodiment, the removable or replaceable component comprises at least one selected from the group: an alignment logo, insignia, alignment guide, hole, slot, printed directional arrow, printed instruction for orientation or other alignment instruction guide disposed on the component, and a removable protection film for the component.

Removable and Replaceable Light Extraction Region

In one embodiment, a light emitting device comprises a light extraction region that may be removed and replaced on a film-based lightguide or repositioned on a film-based lightguide. In another embodiment, the light extraction region is a film or component comprising light extraction features that is physically and optically coupled to the lightguide such that light propagates within the lightguide in a waveguide condition and is extracted by the light extraction features in the light extraction region. In another embodiment, the light extraction region comprises light extraction surface features such that when the features are in contact with the film-based lightguide, a portion of the light incident on the light extraction surface features is redirected into an angle such that it escapes the film-based lightguide. In another embodiment, the light extraction region on the film or component has a protective region or film that can be removed prior to adhering it to the film-based lightguide. In another embodiment, the light extraction region is adhered to the film-based lightguide using a low peel strength adhesive, static bond or other low strength bond. In one embodiment, the light extraction layer or region has an ASTM D 903 version 2010 (modified for 72 hour dwell time) peel strength to standard window glass less than one selected from the group 70 oz/in, 50 oz/in, 40 oz/in, 30 oz/in, 20 oz/in and 10 oz/in. In another embodiment, the adhesive, when adhered to glass, will support the weight of the light emitting device. For example, the film-based lightguide may be a polycarbonate film and the light extraction region may be a PVC or silicone-based film that can be disposed onto the film-based lightguide such that the light extraction region extracts light from the lightguide. In another embodiment, a first light extraction region forms indicia from white ink light extraction features on a silicone-based film. In this embodiment, the silicone-based film is removed by peeling the silicone-based film away from a silicone film-based lightguide. In this embodiment, the first light extraction region is replaced with a new light extraction region comprising embossed features on the surface of a new silicone film with the features oriented toward the silicone film-based lightguide where the light extraction region comprises a low refractive index protective cladding region, layer or film on the opposite side. In this embodiment, the surface light extraction features on the light extraction region essentially become volumetric light extraction features for the lightguide which is formed from the combination of the silicone-based light extraction region and the silicone film-based lightguide. In a further embodiment, the adhesive may be removed from the two components to which it is designed to combine. For example, in one embodiment, the adhesive film or component may be removed from window glass and a region of the lightguide. In another example, the adhesive film or component may be removed from the light extraction region and the lightguide. In one embodiment, the light extraction region maintains sufficient adhesion during normal operation and can be removed permitting reuse of a component or region. For example, in one embodiment, the adhesive may be removed (by peeling for example) from the lightguide film such that a new adhesive film may be used with the light extraction region to apply it to another surface without dirt, contamination, or blemishes from the previous adhesion. In the previous example, this could be advantageous when one wishes to change a light emitting device window display using a film-based lightguide from displaying a Thanksgiving holiday image in the light extraction film to a Christmas holiday image in a different light extraction film. In another embodiment, the adhesive layer, region, or material may be cleaned, such as washing in soap and water, for example) and reused to reapply the light extraction region to the lightguide.

In one embodiment, the light emitting device comprises a cladding region on the lightguide that may be removed or peeled back from the core region of the lightguide such that the light extraction region may be added. In another embodiment, the light emitting device comprises a lightguide optically coupled to a first light extraction region, and the first light extraction region is peeled off and a second light extraction region is optically coupled to the lightguide.

In another embodiment, the light extraction region is an ink or other transferable material that can be transferred onto the film-based lightguide. For example, a film comprising an ink pattern with an adhesive component could be transferred onto the film-based lightguide by lamination or pressing the film against the film-based lightguide. The carrier or transfer media supporting the transfer material or feature may be film, plastic, metal or other flexible or rigid material. For example, the transfer material may be an embossed metal plate that is pressed against the film-based lightguide to transfer a surface pattern from the metal to the film-based lightguide to create surface relief light extraction features. In another embodiment, the transfer material is a thin layer of a coating that can be released from or physically bonded to the light extraction region or features. In another embodiment, the light extraction region has a carrier film, layer or region that can be removed subsequent to optically coupling the light extraction features to the film-based lightguide or it may remain physically coupled to the light extraction features.

In another embodiment, a sign or display kit comprises a light input coupler, a film-based lightguide and one or more light extraction films such that the user may chose the particular light extraction region film to dispose on the film-based lightguide. In another embodiment, the light extraction film comprises an alignment feature that indicates the correct side of the light extraction film to be optically coupled to the film-based lightguide. For example, a silicone light extraction film comprises a printed ink pattern underneath a removable protective film on one side, a low refractive index cladding region on the opposite side, and a notch cut from one corner. The user is instructed (through instructions or diagrams for example) to peel away the protective films from the silicone film-based lightguide and the silicone light extraction film and position the notch on the silicone light extraction film in the bottom left corner on the side of the silicone film-based lightguide that is opposite the side of the light input coupler. Other alignment features or guides including printed inks patterns, registration marks, grooves, holes, etc. may be used.

Removable and Replaceable Lightguide with Light Extraction Region

In one embodiment, a film-based lightguide comprising a light extraction region is removable, or detachable, from a light emitting device. In another embodiment, a film-based lightguide is optically coupled to and can be removed from one or more layers, films or components selected from the group: second film-based lightguide, light output optical element, light input coupler, light mixing region, coupling lightguides, optical element, injection molded lightguide, touchscreen, second film layer, cladding layer, reflective layer, relative position maintaining element, housing and other light transmitting component of the light emitting device. In another embodiment, the removable lightguide with light extraction region comprises a light receiving region disposed to be optically coupled to the light transmitting region on a second film, layer, or component. For example, in one embodiment, a light emitting sign comprises a silicone film-based lightguide with white ink light extraction features disposed on a surface creating a light emitting indicia pattern when illuminated by the light from a light input coupler. In the previous embodiment, the silicone film based lightguide comprises a first lightguide film with a light extraction region optically coupled to a second silicone film-based lightguide film with coupling lightguide extensions disposed to receive light from a light source within a light input coupler. The first lightguide film may be pulled and separated from the second lightguide film such that the first lightguide film may be replaced with a new lightguide film comprising a new light extraction region with white ink light extraction features. In another embodiment, the new lightguide film may be optically coupled to the second lightguide film by overlapping the light receiving region of the new lightguide film onto the light transmitting region of the second lightguide film by pressing the films together using one's finger and running it along the regions. In a further embodiment, the removable lightguide film (or new lightguide film) and the second lightguide film do not comprise cladding regions or layers in the light receiving region or light transmitting region, respectively such that a portion of the incident light can be efficiently transmitted between the core regions of the films. In one embodiment, the cladding regions from at least one of the removable lightguide film (or new lightguide film) and the second lightguide film can be pulled back or removed in the light receiving region or light transmitting region, respectively such that light can be efficiently transmitted between the core regions of the films.

In another embodiment, replacing the lightguide comprising the light extraction region enables a different sign or display to be shown, a cleaner version of the same sign or display (one without blemishes, scratches, fingerprints, dents, etc.), or a light emitting device with different optical output characteristics (such as different light output profiles, angular light output, spatial areas of light output, optical efficiency, color, etc.) or functionality (addition of touchscreen, security features, non-optical features, etc.). In another embodiment, the lightguide with light extraction region is removable and capable of being optically coupled to a light output optical element. For example, a silicone film-based lightguide with a light extraction region may be adhered to a light transmitting region of an injection molded, cast or extruded acrylic light output optical element that receives light from LEDs disposed at the edge of the element. In this embodiment, a portion of the light from the light output optical element exits the light output optical element through the light transmitting region and is coupled into the film-based lightguide through the light receiving region.

In another embodiment, the removable lightguide with a light extraction region substantially comprises the light mixing region of the lightguide. In another embodiment, the removable lightguide does not substantially comprise the light mixing region of the lightguide. In one embodiment, the removable and replaceable lightguide does not comprise coupling lightguides extending therefrom.

Removable and Replaceable Lightguide Comprising Coupling Lightguides

In one embodiment, a light emitting device comprises a removable film-based lightguide comprising coupling lightguides. For example, in one embodiment, a film-based lightguide comprises extended coupling lightguides from the same lightguide that are folded and disposed to receive light from a light source can be removed from the light emitting device and replaced with a different lightguide with coupling lightguides. In this embodiment, one may replace or change the logo, graphic, sign, display or light emitting profile by replacing the lightguide comprising coupling lightguides. In another embodiment, an optically efficient film-based lightguide with coupling lightguide extensions comprising a core region contiguous between the lightguide region and the coupling lightguides may be replaced by a newer or similar optically efficient film-based lightguide with coupling lightguide extensions such that the light source, light source driver, thermal transfer element, and other light emitting device elements or components do not need to be replaced. In another embodiment, the lightguide comprises coupling lightguides that are substantially folded such that the light input edges of the coupling lightguides collectively form a light input surface or region that can be disposed in the light emitting device to receive light from the light source (or an optical component between the light input surface and the light source light emitting surface). In another embodiment, the removable and replaceable lightguide comprising coupling lightguides may further comprise one or more selected from the group: housing component, low contact area cover, physical coupling mechanism, alignment guide, registration holes or cavity, other optical elements films or layers, and other light emitting device component. For example, in one embodiment, the film-based lightguide comprises coupling lightguides within a region of a cartridge that can be physically decoupled or attached to the housing component comprising the light input coupler or light source.

Removable and Replaceable Cartridge

In one embodiment, the light emitting device comprises a detachable section or cartridge to enable removal of at least one selected from the group: lightguide, light emitting region, coupling lightguides, optical element, light source, electrical components, and thermal components. In another embodiment, the light emitting device comprises a housing or holding device that comprises a detachable section or cartridge which allows the removal, re-registration, and re-attachment of a lightguide and light input coupler comprising the coupling lightguides while leaving the light source and electronics connected to the housing or holding device. In one embodiment, the cartridge, light emitting device, or components thereof, comprises a male or female component or shape that allows it to configure into the remaining (male or female) component(s) of the light emitting device or mechanism supporting the light emitting device such that it may be readily attached, removed and/or replaced. The removable and replaceable cartridge may or may not comprise an optical element such as a light redirecting optical element, light turning optical element, light collimating optical element, or light coupling optical element. In this embodiment, the detachable device or cartridge can allow for the lightguide comprising the light extracting features representing indicia (such as for a sign or logo) and the light input coupler to be easily replaced to change the indicia displayed (such in the case of a light emitting sign) without needing to replace the light source, electronics, and possibly without having to un-mount or uninstall the housing or holding device. In another embodiment, the detachable cartridge comprises at least one selected from the group: light source, light input coupler, lightguide, thermal transfer element disposed to be thermally coupled to the light source (or a thermal transfer component attached to the light source), and electrical driving source such as the LED driver. In this embodiment, when improved, higher efficiency light sources or different colors or different elements or configurations are desired, they may be included with the replacement cartridge. In another embodiment, the cartridge comprises at least one selected from the group: an alignment guide, pin, clip, latch, adhesive region, clamp, a joining mechanism, and other connecting element or mechanical means to connect or hold the cartridge to other components of the light emitting device. In one embodiment, for example, the removable and replaceable cartridge comprises the light source. For example, in one embodiment, the light source is replaced by removing the cartridge and installing a more efficient light emitting diode (or array of light emitting diodes). In another embodiment, the removable cartridge comprises the light source and some or all of the electrical components (such as drivers, transformers, control circuitry, etc.).

In another embodiment, the cartridge comprises a light source and an aperture, window, or cavity into which a film-based lightguide or light output optical element may be inserted. For example, in one embodiment, a light emitting device comprises a cartridge with a cavity disposed to receive a lightguide or light output coupler such that when the lightguide or light output coupler is inserted into the cavity, a portion of the light propagates within the light output coupler or in the lightguide film in a total internal reflection condition. In the previous embodiment, the cartridge may be replaced and an end of the lightguide film or light output coupler inserted into the cavity of the new cartridge. Alternatively, the lightguide film or light output coupler may be replaced and inserted into the cavity within the cartridge.

Removable Total Internal Reflection Enabling Component Comprising Cladding Region or Low Contact Area Cover In one embodiment, a light emitting device comprises at least one total internal reflection enabling component selected from the group: cover, holder, hold down mechanism, mechanical arm, mechanical lever, plug, mechanical guide, strip, rigid protective material, and housing component that is removed from contact with a coupling lightguide or film-based lightguide in order to replace a component wherein the total internal reflection enabling component comprises a low contact area cover or a cladding layer. In one embodiment, the total internal reflection enabling component comprises a low refractive index material that will permit a portion of light within the film-based lightguide or coupling lightguide to remain within the lightguide in a total internal reflection condition and prevent reflection frustration or absorption from an arm, housing component, lever, guide, strip, etc. that protects, houses or holds the position of the film or coupling lightguide. For example, in one embodiment, a component of the housing of a light input coupler is black and comprises a transparent low refractive index film adhered on the inner surface. The housing component may be removed to replace the coupling lightguide and film, for example, and when the cover is replaced, it helps hold the coupling lightguides in their proper position and the low refractive index film prevents light within a particular angular range designated to propagate within the core layer from decoupling into the black housing and being absorbed.

In another embodiment, the total internal reflection enabling component comprises a low contact area cover film that will permit a portion of light within the film-based lightguide or coupling lightguide to remain within the lightguide in a total internal reflection condition and prevent reflection frustration or absorption from an arm, holder, hold down mechanism, housing component, lever, guide, or strip that protects, houses or holds the position of the lightguide film or coupling lightguide. For example, in one embodiment, the housing of light input coupler is black and comprises a film with a surface relief profile with a low contact surface area cover adhered on the inner surface of the housing (with the surface relief profile on the side facing the inner part of the light input coupler). The housing cover may be removed to replace the coupling lightguide and film, for example, and when the cover is replaced, it helps hold the coupling lightguides in their proper position and the low contact area cover prevents a portion of the light propagating within the core layer from decoupling into the black housing and being absorbed.

Low Contact Area Cover

In one embodiment, a low contact area cover is disposed between at least one coupling lightguide and the exterior to the light emitting device. The low contact area cover or wrap provides a low surface area of contact with a region of the lightguide or a coupling lightguide and may further provide at least one selected from the group: protection from fingerprints, protection from dust or air contaminants, protection from moisture, protection from internal or external objects that would decouple or absorb more light than the low contact area cover when in contact in one or more regions with one or more coupling lightguides, provide a means for holding or containing at least one coupling lightguide, hold the relative position of one or more coupling lightguides, and prevent the coupling lightguides from unfolding into a larger volume or contact with a surface that could de-couple or absorb light. In one embodiment, the low contact area cover is disposed substantially around one or more coupling lightguide stacks or arrays and provides one or more of the functions selected from the group: reducing the dust buildup on the coupling lightguides, protecting one or more coupling lightguides from frustrated total internal reflection or absorption by contact with another light transmitting or absorbing material, and preventing or limiting scratches, cuts, dents, or deformities from physical contact with other components or assemblers and/or users of the device.

In another embodiment, the low contact area cover is disposed between the outer surface of the light emitting device and the regions of the coupling lightguides disposed between the fold or bend region and the lightguide or light mixing region. In a further embodiment, the low contact area cover is disposed between the outer surface of the light emitting device and the regions of the coupling lightguides disposed between the light input surface of the coupling lightguides and the lightguide or light mixing region. In another embodiment, the low contact area cover is disposed between the outer surface of the light emitting device and a portion of the regions of the coupling lightguides not enclosed by a housing, protective cover, or other component disposed between the coupling lightguides and the outer surface of the light emitting device. In one embodiment, the low contact area cover is the housing, relative position maintaining element, or a portion of the housing or relative positioning maintaining element. In one embodiment, the low contact area surface feature is a protrusion from a film, material, or layer. In another embodiment, the low contact area cover or wrap is disposed substantially around the light emitting device.

Film-Based Low Contact Area Cover

In one embodiment, the low contact area cover is a film with at least one of a lower refractive index than the refractive index of the outer material of the coupling lightguide disposed near the low contact area cover, and a surface relief pattern or structure on the surface of the film-based low contact area cover disposed near at least one coupling lightguide. In one embodiment, the low contact area comprises convex or protruding surface relief features disposed near at least one outer surface of at least one coupling lightguide and the average percentage of the area disposed adjacent to an outer surface of a coupling lightguide or the lightguide that is in physical contact with the surface relief features is less than one of the following: 70%, 50%, 30%, 10%, 5%, and 1%. In another embodiment, the low contact area cover comprises surface relief features adjacent a region of the film-based lightguide and the percentage of the area of the surface relief features that contact a region of the film-based lightguide (or light mixing region, or coupling lightguides) when a uniform planar pressure of 7 kilopascals is applied to the low contact area cover is less than one of the following: 70%, 50%, 30%, 10%, 5%, and 1%. In another embodiment, the low contact area cover comprises surface relief features adjacent and in physical contact with a region of the film-based lightguide and the average percentage of the region of the film-based lightguide (or light mixing region, or coupling lightguides) in contact with the low contact area cover is less than one of the following: 70%, 50%, 30%, 10%, 5%, and 1%.

In one embodiment, a convex surface relief profile designed to have a low contact area with a surface of the coupling lightguide will at least one selected from the group: extract, absorb, scatter, and otherwise alter the intensity or direction of a lower percentage of light propagating within the coupling lightguide than a flat surface of the same material. In one embodiment, the surface relief profile is at least one selected from the group: random, semi-random, ordered, regular in one or 2 directions, holographic, tailored, comprise cones, truncated polyhedrons, truncated hemispheres, truncated cones, truncated pyramids, pyramids, prisms, pointed shapes, round tipped shapes, rods, cylinders, hemispheres, and other geometrical shapes. In one embodiment, the low contact area cover material or film is at least one selected from the group: transparent, translucent, opaque, light absorbing, light reflecting, substantially black, substantially white, has a diffuse reflectance specular component included greater than 70%, has a diffuse reflectance specular component included less than 70%, has an ASTM D1003 version 07e1 luminous transmittance less than 30%, has an ASTM D1003 version 07e1 luminous transmittance greater than 30%, absorbs at least 50% of the incident light, absorbs less than 50% of the incident light, has an electrical sheet resistance less than 10 ohms per square, and has an electrical sheet resistance greater than 10 ohms per square. In one embodiment, low contact area cover has a diffuse reflectance measured in the di/0 geometry according to ASTM E 1164-07 and ASTM E 179 version 96 greater than one selected from the group: 70%, 80%, 85%, 90%, 95%, and 95%.

In another embodiment, the low contact area cover is a film with a thickness less than one selected from the group: 600 microns, 500 microns, 400 microns, 300 microns, 200 microns, 100 microns, and 50 microns.

In another embodiment, the low contact area cover comprises a material with an effective refractive index less than the core layer due to microstructures and/or nanostructures. For example, in one embodiment, the low contact area comprises an aerogel or arrangement of nano-structured materials disposed on a film that have an effective refractive index less than the core layer in the region near the core layer. In one embodiment, the nano-structured material comprises fibers, particles, or domains with an average diameter or dimension in the plane parallel to the core layer surface or perpendicular to the core layer surface less than one selected from the group: 1000, 500, 300, 200, 100, 50, 20, 10, 5, and 2 nanometers. For example, in one embodiment, the low contact area cover is a coating or material comprising nanostructured fibers, comprising polymeric materials such as, without limitation, cellulose, polyester, PVC, PTFE, polystyrene, PMMA, PDMS, or other light transmitting or partially light transmitting materials. In one embodiment, the low contact area is a paper or similar sheet or film (such as a filter paper) comprising fibrous, microstructured, or nano-structured materials or surfaces. In one embodiment, the low contact area material is a woven material. In another embodiment, the low contact area material is non-woven material. In another embodiment, the low contact area cover is a substantially transparent or translucent light transmitting film that comprises "macro" surface features with average dimensions greater than 5 microns that have micro-structured, nanostructured, or fibrous materials or surface features disposed on or within the outer regions of the "macro" surface features. In one embodiment, the "macro" surface features have an average dimension in a first direction parallel to the core surface or perpendicular to the core surface greater than one selected from the group: 5, 10, 15, 20, 30, 50, 100, 150, 200, and 500 microns and the micro-structured, nanostructured, or fibrous materials or surface features have an average dimension in the first direction less than one selected from the group: 20, 10, 5, 2, 1, 0.5, 0.3, 0.1, 0.05, and 0.01 microns.

In this embodiment, the "macro" surface features can be patterned into a surface (such as by extrusion embossing or UV cured embossing) and the outer regions (outermost surfaces of the protruded regions that would be in contact with the core layer) can remain, be formed, coated, roughened, or otherwise modified to comprise micro-structured, nanostructured, or fibrous materials or surface features such that when in contact with the core layer couple less light out of the core layer due to the smaller surface area in contact with the core layer. In one embodiment, by only coating the tips of the "macro" protrusions, for example, less nanostructured material is needed than coating the entire low contact area film or a planar film and the "valleys" or areas around the "macro" protrusions may be light transmitting, transparent, or translucent. In another embodiment, the micro-structured, nanostructured, or fibrous materials or surface features disposed on or within the "macro" surface features create an effective lower refractive index region that functions as a cladding layer. In one embodiment, the low contact area cover couples less than one selected from the group 30%, 20%, 10%, 5%, 2%, and 1% in at least one region of contact with the core layer or region adjacent the core layer.

In one embodiment, the low contact area comprises standoffs, posts, or other protrusions that provide a separation distance between the low contact area cover and the core layer. In one embodiment, the standoffs, posts, or other protrusions are disposed in one or more regions of the low contact area cover selected from the group: the region adjacent the light emitting region, the region adjacent the surface opposite the light emitting surface, the region adjacent the light mixing region, the region adjacent the light input coupler, the region adjacent the coupling lightguides, in a pattern on one surface of the low contact area cover, and in a pattern on both surfaces of the low contact area cover. In one embodiment, the standoffs, posts, or other protrusions of the low contact area cover have an average dimension in a direction parallel to the surface of the core layer or perpendicular to the core layer greater than one selected from the group: 5, 10, 20, 50, 100, 200, 500, and 1000 microns. In another embodiment, the aspect ratio (the height divided by the average width in the plane parallel to the core surface) is greater than one selected from the group: 1, 2, 5, 10, 15, 20, 50, and 100.

In another embodiment, the low contact area cover is physically coupled to the lightguide or core layer in one or more regions selected from the group: an area around the light emitting region of the lightguide, a periphery region of the lightguide that emits less than 5% of the total light flux emitted from the lightguide, a region of the housing of the input coupler, a cladded layer or region, a standoff region, a post region, a protrusions region, a "macro" surface feature region, a nano-structured feature region, a micro-structured feature region, and a plateau region disposed between valley regions by one or more selected from the group: chemical bonds, physical bonds, adhesive layer, magnetic attraction, electrostatic force, van der Waals force, covalent bonds, and ionic bonds. In another embodiment, the low contact area cover is laminated to the core layer.

In one embodiment, the low contact area cover is a sheet, film, or component comprising one or more selected from the group: paper, fibrous film or sheet, cellulosic material, pulp, low-acidity paper, synthetic paper, flashspun fibers, flashspun high-density polyethylene fibers, and a micro-porous film. In another embodiment, the film material of the low contact area cover or the area of the low contact area cover in contact with the core layer of the lightguide in the light emitting region comprises a material with a bulk refractive index or an effective refractive index in a direction parallel or perpendicular to the core surface less than one selected from the group: 1.6, 1.55, 1.5, 1.45, 1.41, 1.38, 1.35, 1.34, 1.33, 1.30, 1.25, and 1.20.

Wrap Around Low Contact Area Cover

In a further embodiment, the low contact area cover is the inner surface or physically coupled to a surface of a housing, holding device, or relative position maintaining element. In a further embodiment, the low contact area cover is a film which wraps around at least one coupling lightguide such that at least one lateral edge and at least one lateral surface is substantially covered such that the low contact area cover is disposed between the coupling lightguide and the outer surface of the device.

In another embodiment, a film-based lightguide comprises a low contact area cover wrapped around a first group of coupling lightguides wherein the low contact area cover is physically coupled to at least one selected from the group: lightguide, lightguide film, light input coupler, lightguide, housing, and thermal transfer element by a low contact area cover physical coupling mechanism. In another embodiment, the light emitting device comprises a first cylindrical tension rod disposed to apply tension to the low contact area cover film and hold the coupling lightguides close together and close to the lightguide such that the light input coupler has a lower profile. In another embodiment, the low contact area cover can be pulled taught after physically coupling to at least one selected from the group: lightguide, lightguide film, light input coupler, lightguide, housing, thermal transfer element, and other element or housing by moving the first cylindrical tension rod away from a second tension bar or away from a physical coupling point of the mechanism holding the tension bar such as a brace. Other shapes and forms for the tension forming element may be used such as a rod with a rectangular cross-section, a hemispherical cross-section, or other element longer in a first direction capable of providing tension when translated or supporting tension when held stationary relative to other components. In another embodiment, a first cylindrical tension rod may be translated in a first direction to provide tension while remaining in a brace region and the position of the cylindrical tension rod may be locked or forced to remain in place by tightening a screw for example. In another embodiment, the tension forming element and the brace or physical coupling mechanism for coupling it to another component of the light input coupler does not extend more than one selected from the group: 1 millimeter, 2 millimeters, 3 millimeters, 5 millimeters, 7 millimeters and 10 millimeters past at least one edge of the lightguide in the direction parallel to the longer dimension of the tension forming element.

In one embodiment, the low contact area cover substantially wraps around the film-based lightguide in one or more planes. In another embodiment, the low contact area cover substantially wraps around the film-based lightguide and one or more light input couplers. For example, in one embodiment the low contact area cover wraps around two input couplers disposed along opposite sides of a film based lightguide and the light emitting region of the lightguide disposed between the light input couplers. The other edges of the low contact cover may be sealed, bonded, clamped together or another material or enclosing method may seal or provide a barrier at the opposite edges to prevent dust or dirt contamination, for example. In this embodiment, for example, a backlight may comprise a substantially air-tight sealed film based lightguide (and sealed coupling lightguides within the light input coupler) that does not have one or more cladding regions and is substantially protected from scratches or dust during assembly or use that could cause non-uniformities or reduce luminance or optical efficiency.

Low Hardness Low Contact Area Cover

In another embodiment, the low contact area cover has an ASTM D3363 version 05 pencil hardness under force from a 300 gram weight less than the outer surface region of the coupling lightguide disposed near the low contact area cover. In one embodiment, the low contact area cover comprises a silicone, polyurethane, rubber, or thermoplastic polyurethane with a surface relief pattern or structure. In a further embodiment, the ASTM D3363 version 05 pencil hardness under force from a 300 gram weight of the low contact area cover is at least 2 grades less than the outer surface region of the coupling lightguide disposed near the low contact area cover. In another embodiment, the low contact area cover has an ASTM D 3363 pencil hardness less than one selected from the group: 5H, 4H, 3H, 2H, H, and F.

Physical Coupling Mechanism for Low Contact Area Cover

In one embodiment, the low contact area cover is physically coupled in a first contact region to the light emitting device, light input coupler, lightguide, housing, second region of the low contact area cover, or thermal transfer element by one or more methods selected from the group: sewing (or threading or feeding a fiber, wire, or thread) the low contact area cover to the lightguide, light mixing region, or other component, welding (sonic, laser, thermo-mechanically, etc.) the low contact area cover to one or more components, adhering (epoxy, glue, pressure sensitive adhesive, etc.) the low contact area cover to one or more components, fastening the low contact area cover to one or more components. In a further embodiment, the fastening mechanism is selected from the group: a batten, button, clamp, clasp, clip, clutch (pin fastener), flange, grommet, anchor, nail, pin, peg, clevis pin, cotter pin, linchpin, R-clip, retaining ring, circlip retaining ring, e-ring retaining ring, rivet, screw anchor, snap, staple, stitch, strap, tack, threaded fastener, captive threaded fasteners (nut, screw, stud, threaded insert, threaded rod), tie, toggle, hook-and-loop strips, wedge anchor, and zipper.

In another embodiment, the physical coupling mechanism maintains the flexibility of at least one selected from the group: the light emitting device, the lightguide, and the coupling lightguides. In a further embodiment, the total surface area of the physical coupling mechanism in contact with at least one selected from the group: low contact area cover, coupling lightguides, lightguide region, light mixing region, and light emitting device is less than one selected from the group: 70%, 50%, 30%, 10%, 5%, and 1%. In another embodiment, the total percentage of the cross sectional area of the layers comprising light propagating under total internal reflection comprising the largest component of the low contact area cover physical coupling mechanism in a first direction perpendicular to the optical axis of the light within the coupling lightguides, light mixing region or lightguide region relative to the cross-sectional area in the first direction is less than one selected from the group: 10%, 5%, 1%, 0.5%, 0.1%, and 0.05%. For example, in one embodiment, the low contact area cover is a flexible transparent polyurethane film with a surface comprising a regular two-dimensional array of embossed hemispheres disposed adjacent and wrapping around the stack of coupling lightguides and is physically coupled to the light mixing region of the lightguide comprising a 25 micron thick core layer by threading the film to the light mixing region using a transparent nylon fiber with a diameter less than 25 microns into 25 micron holes at 1 centimeter intervals. In this example, the largest component of the physical coupling mechanism is the holes in the core region which can scatter light out of the lightguide. Therefore, the aforementioned cross-sectional area of the physical coupling mechanism (the holes in the core layer) is 0.25% of the cross-sectional area of the core layer. In another embodiment, the fiber or material threaded through the holes in one or more components comprises at least one selected from the group: polymer fiber, polyester fiber, rubber fiber, cable, wire (such as a thin steel wire), aluminum wire, and nylon fiber such as used in fishing line. In a further embodiment, the diameter of the fiber or material threaded through the holes is less than one selected from the group: 500 microns, 300 microns, 200 microns, 100 microns, 50 microns, 25 microns, and 10 microns. In another embodiment, the fiber or threaded material is substantially transparent or translucent.

In another embodiment, the physical coupling mechanism for the low contact area cover comprises holes within lightguide through which an adhesive, epoxy or other adhering material is deposited which bonds to the low contact area cover. In another embodiment, the adhesive, epoxy, or other adhering material bonds to the low contact area cover and at least one selected from the group: core region, cladding region, and lightguide. In another embodiment, the adhesive material has a refractive index greater than 1.48 and reduces the scatter out of the lightguide from the hole region over using an air gap or an air gap with a fiber, thread, or wire through the hole. In a further embodiment, an adhesive is applied as a coating on the fiber (which may be UV activated, cured, etc. after threading, for example) or an adhesive is applied to the fiber in the region of the hole such that the adhesive wicks into the hole to provide reduced scattering by at least one selected from the group: optically coupling the inner surfaces of the hole, and optically coupling the fiber to the inner surfaces of the hole.

The physical coupling mechanism in one embodiment may be used to physically couple together one or more elements selected from the group: film-based lightguide, low contact area cover film, housing, relative position maintaining element, light redirecting element or film, diffuser film, collimation film, light extracting film, protective film, touchscreen film, thermal transfer element, and other film or component within the light emitting device.

Lightguide Configuration and Properties

The use of plastic film with thickness less than 0.5 mm for edge lit lightguides can hold many advantages over using plastic plate or sheets. A flexible film may be able to be shaped to surfaces, be folded up for storage, change shape as needed, or wave in the air. Another advantage may be lower cost. The reduction in thickness helps reduce the cost for material, fabrication, storage and shipping for a lightguide of a given width and length. Another reason may be that the decreased thickness makes it able to be added to surfaces without appreciable change in the surface's shape, thickness and or appearance. For example, it can be added to the surface of a window easily without changing the look of the window. Another advantage may be that the film or lightguide can be rolled up. This helps in transportability, can hold some functionality, and may be particularly useful for hand-held devices where a roll-out screen is used. A fifth reason is that the film can weigh less, which again makes it easier to handle and transport, A sixth reason may be that film is commonly extruded in large rolls so larger edge-lit signage can be produced. Finally, a seventh reason may be that there are many companies set up to coat, cut, laminate and manipulate film since film is useful for many other industries. Plastic films are made by blown or cast-extrusion in widths up to 6.096 meters or longer and in rolls thousands of meters long. Co-extrusion of different materials from two to 100 layers can be achieved with special extrusion dies.

Thickness of the Film or Lightguide

In one embodiment, the thickness of the film, lightguide or lightguide region is within a range of 0.005 mm to 0.5 mm. In another embodiment, the thickness of the film or lightguide is within a range of 0.025 millimeters to 0.5 millimeters. In a further embodiment, the thickness of the film, lightguide or lightguide region is within a range of 0.050 millimeters to 0.175 millimeters. In one embodiment, the thickness of the film, lightguide or lightguide region is less than 0.2 millimeters or less than 0.5 millimeters. In one embodiment, the average thickness of the lightguide or core region is less than one selected from the group: 150 microns, 100 microns, 60 microns, 30 microns, 20 microns, 10 microns, 6 microns, and 4 microns. In one embodiment, at least one selected from the group: thickness, largest thickness, average thickness, greater than 90% of the entire thickness of the film, lightguide, and a lightguide region is less than 0.2 millimeters. In another embodiment, the size to thickness ratio, defined as the largest dimension of the light emitting region in the plane of the light emitting region divided by the average thickness of the core region within the light emitting region is greater than one selected from the group: 100; 500; 1,000; 3,000; 5,000; 10,000; 15,000; 20,000; 30,000; and 50,000.

In one embodiment, a light emitting device comprises a light source, a light input coupler, and a film-based lightguide wherein the average light flux density in the coupling lightguides, light mixing region, lightguide region, or light emitting region within the film-based lightguide is greater than one selected from the group: 5, 10, 20, 50, 100, 200, 300, 500, and 1000 lumens per cubic millimeter. In another embodiment, a light emitting device comprises a light source, a light input coupler, and a film-based lightguide wherein the maximum light flux density in the coupling lightguides, light mixing region, lightguide region, or light emitting region within the film-based lightguide is greater than one selected from the group: 5, 10, 20, 50, 100, 200, 300, 500, and 1000 lumens per cubic millimeter. The flux density in a region is measured by cutting an optical quality edge perpendicular to the surface at the region and masking off the area around the region (using light absorbing materials such that light is not substantially reflected back into the film) and measuring the far field luminous intensity using a goniophotometer.

Optical Properties of the Lightguide or Light Transmitting Material

With regards to the optical properties of lightguides or light transmitting materials for embodiments, the optical properties specified herein may be general properties of the lightguide, the core, the cladding, or a combination thereof or they may correspond to a specific region (such as a light emitting region, light mixing region, or light extracting region), surface (light input surface, diffuse surface, flat surface), and direction (such as measured normal to the surface or measured in the direction of light propagation through the lightguide). In one embodiment, the average luminous transmittance of the lightguide measured within at least one selected from the group: the light emitting region, indicia region, the light mixing region, and the lightguide according to ASTM D1003 version 07e1 with a BYK Gardner haze meter is greater than one selected from the group: 70%, 80%, 85%, 88%, 92%, 94%, 96%, 98%, and 99%. In another embodiment, the average luminous transmittance of the lightguide measured within the major light emitting area (the area comprising greater than 80% of the total light emitted from the lightguide) according to ASTM D1003 version 07e1 with a BYK Gardner haze meter is greater than one selected from the group: 70%, 80%, 88%, 92%, 94%, 96%, 98%, and 99%.

In another embodiment, the average haze of the lightguide measured within at least one selected from the group: the light emitting region, indicia region, the light mixing region, and the lightguide measured with a BYK Gardner haze meter is less than one selected from the group: 70%, 60%, 50%, 40%, 30%, 20%, 10%, 6%, 5%, 4%, and 3%. In another embodiment, the average haze of the lightguide measured within at least one selected from the group: the light emitting region, indicia region, the light mixing region, and the lightguide measured with a BYK Gardner haze meter is greater than one selected from the group: 6%, 5%, 4%, 3%, 2% and 1%.

In another embodiment, the average clarity of the lightguide measured within at least one selected from the group: the light emitting region, the light mixing region, and the lightguide according to the measurement procedure associated with ASTM D1003 version 07e1 with a BYK Gardner haze meter is greater than one selected from the group: 70%, 80%, 88%, 92%, 94%, 96%, 98%, and 99%.

In a further embodiment, the diffuse reflectance of the lightguide measured within at least one selected from the group: the light emitting region, the light mixing region, and the lightguide using a Minolta CM-508d spectrophotometer is less than one selected from the group: 30%, 20%, 10%, 7%, 5%, and 2% with the spectral component included or with the spectral component excluded when placed above a light absorbing 6"×6"×6" box comprising Light Absorbing Black-Out Material from Edmund Optics Inc. on the inner walls. In another embodiment, the diffuse reflectance of the lightguide measured within the major light emitting area (the area comprising greater than 80% of the total light emitted from the lightguide) using a Minolta CM-508d spectrophotometer is less than one selected from the group: 30%, 20%, 10%, 7%, 5%, and 2% with the spectral component included or with the spectral component excluded when placed above a light absorbing 6"×6"×6" box comprising Light Absorbing Black-Out Material from Edmund Optics Inc. on the inner walls.

In another embodiment, the average clarity of the lightguide measured within at least one selected from the group: the light emitting region, the light mixing region, and the lightguide measured with a BYK Gardner haze meter is greater than one selected from the group: 70%, 80%, 88%, 92%, 94%, 96%, 98%, and 99%.

Factors which can determine the transmission of light through the film (in the thickness direction) include inherent material absorption, refractive index (light loss due to Fresnel reflections), scattering (refraction, reflection, or diffraction) from particles or features within the volume or on a surface or interface (size, shape, spacing, total number of particles or density in two orthogonal directions parallel to the film plane and the plane orthogonal to the film), absorption/scattering/reflection/refraction due to other materials (additional layers, claddings, adhesives, etc.), anti-reflection coatings, surface relief features.

In one embodiment, the use of a thin film for the lightguide permits the reduction in size of light extraction features because more waveguide modes will reach the light extraction feature when the thickness of the film is reduced. In a thin lightguide, the overlap of modes is increased when the thickness of the waveguide is reduced.

In one embodiment, the film-based lightguide has a graded refractive index profile in the thickness direction. In another embodiment, the thickness of the lightguide region or lightguide is less than 10 microns. In a further embodiment, the thickness of the lightguide region is less than 10 microns and the lightguide is a single mode lightguide.

In one embodiment, the light transmitting material used in at least one selected from the group: coupling lightguide, lightguide, lightguide region, optical element, optical film, core layer, cladding layer, and optical adhesive has an optical absorption (dB/km) less than one selected from the group: 50, 100, 200, 300, 400, and 500 dB/km for a wavelength range of interest. The optical absorption value may be for all of the wavelengths throughout the range of interest or an average value throughout the wavelengths of interest. The wavelength range of interest for high transmission through the light transmitting material may cover the light source output spectrum, the light emitting device output spectrum, optical functionality requirements (IR transmission for cameras, motion detectors, etc., for example), or some combination thereof. The wavelength range of interest may be a wavelength range selected from the group: 400 nm-700 nm, 300 nm-800 nm, 300 nm-1200 nm, 300 nm-350 nm, 300-450 nm, 350 nm-400 nm, 400 nm-450 nm, 450 nm-490 nm, 490 nm-560 nm, 500 nm-550 nm, 550 nm-600 nm, 600 nm-650 nm, 635 nm-700 nm, 650 nm-700 nm, 700 nm-750 nm, 750 nm-800 nm, and 800 nm-1200 nm.

Collimated light propagating through light transmitting material may be reduced in intensity after passing through the material due to scattering (scattering loss coefficient), absorption (absorption coefficient), or a combination of scattering and absorption (attenuation coefficient). In one embodiment, the core material of the lightguide has an average absorption coefficient for collimated light less than one selected from the group: 0.03 cm$^{-1}$, 0.02 cm$^{-1}$, 0.01 cm$^{-1}$, and 0.005 cm$^{-1}$ over the visible wavelength spectrum from 400 nanometers to 700 nanometers. In another embodiment, the core material of the lightguide has an average scattering loss coefficient for collimated light less than one selected from the group: 0.03 cm$^{-1}$, 0.02 cm$^{-1}$, 0.01 cm$^{-1}$, and 0.005 cm$^{-1}$ over the visible wavelength spectrum from 400 nanometers to 700 nanometers. In one embodiment, the core material of the lightguide has an average attenuation coefficient for collimated light less than one selected from the group: 0.03 cm$^{-1}$, 0.02 cm$^{-1}$, 0.01 cm$^{-1}$, and 0.005 cm$^{-1}$ over the visible wavelength spectrum from 400 nanometers to 700 nanometers. In another embodiment, the lightguide is disposed to receive infrared light and the average of at least one selected from the group: absorption coefficient, scattering loss coefficient, and attenuation coefficient of the core layer or cladding layer for collimated light is less than one selected from the group: 0.03 cm$^{-1}$, 0.02 cm$^{-1}$, 0.01 cm$^{-1}$, and 0.005 cm$^{-1}$ over the wavelength spectrum from 700 nanometers to 900 nanometers.

In one embodiment, the lightguide has a low absorption in the UV and blue region and the lightguide further comprises a phosphor film or wavelength conversion element. By using a blue or UV light source and a wavelength conversion element near the output surface of the lightguide for generation of white light, the light transmitting material can be optimized for very high blue or UV light transmission. This can increase the range of materials suitable for lightguides to include those that have high absorption coefficients in the green and red wavelength regions for example.

In another embodiment, the lightguide is the substrate for a display technology. Various high-performance films are known in the display industry as having sufficient mechanical and optical properties. These include, but are not limited to polycarbonate, PET, PMMA, PEN, COC, PSU, PFA, FEP, and films made from blends and multilayer components. In one embodiment, the light extraction feature is formed in a lightguide region of a film before or after the film is utilized as a substrate for the production or use as a substrate for a display such as an OLED display, MEMs based display, polymer film-based display, bi-stable display, electrophoretic display, electrochromic display, electro-optical display, passive matrix display, or other display that can be produced using polymer substrates.

Refractive Index of the Light Transmitting Material

In one embodiment, the core material of the lightguide has a high refractive index and the cladding material has a low refractive index. In one embodiment, the core is formed from a material with a refractive index ($n_D$) greater than one selected from the group: 1.3, 1.4, 1.5, 1.6, 1.7, 1.8, 1.9, 2.0, 2.1, 2.2, 2.3, 2.4, 2.5, 2.6, 2.7, 2.8, 2.9, and 3.0. In another embodiment, the refractive index ($n_D$) of the cladding material is less than one selected from the group: 1.1, 1.2, 1.3, 1.4, 1.5, 1.6, 1.7, 1.8, 1.9, 2.0, 2.1, 2.2, 2.3, 2.4, and 2.5.

In one embodiment, the core region of the film-based lightguide comprises a material with a refractive index difference in two or more orthogonal directions less than one selected from the group: 0.1, 0.05, 0.02, 0.01, 0.005, and 0.001. In one embodiment, the light transmitting material is semicrystalline with a low refractive index birefringence. In another embodiment, the light transmitting material is substantially amorphous and has a low stress-induced birefringence.

The core or the cladding or other light transmitting material used within an embodiment may be a thermoplastic, thermoset, rubber, polymer, silicone or other light transmitting material. Optical products can be prepared from high index of refraction materials, including monomers such as high index of refraction (meth)acrylate monomers, halogenated monomers, and other such high index of refraction monomers as are known in the art. High refractive index materials such as these and others are disclosed, for example, in U.S. Pat. Nos. 4,568,445; 4,721,377; 4,812,032; 5,424,339; 5,183,917; 6,541,591; 7,491,441; 7,297,810, 6,355,754, 7,682,710; 7,642,335; 7,632,904; 7,407,992; 7,375,178; 6,117,530; 5,777,433; 6,533,959; 6,541,591; 7,038,745 and U.S. patent application Ser. Nos. 11/866,521; 12/165,765; 12/307,555; and 11/556,432. High refractive index pressure sensitive adhesives such as those disclosed in U.S. patent application Ser. No. 12/608,019 may also be used as a core layer or layer component.

Low refractive index materials include sol gels, fluoropolymers, fluorinated sol-gels, PMP, and other materials such fluoropolyether urethanes such as those disclosed in U.S. Pat. No. 7,575,847, and other low refractive index material such as those disclosed in U.S. patent application Ser. Nos. 11/972,034; 12/559,690; 12/294,694; 10/098,813; 11/026,614; and U.S. Pat. Nos. 7,374,812; 7,709,551; 7,625,984; 7,164,536; 5,594,830 and 7,419,707.

Materials such nanoparticles (titanium dioxide, and other oxides for example), blends, alloys, doping, sol gel, and other techniques may be used to increase or decrease the refractive index of a material.

In another embodiment, the refractive index or location of a region of lightguide or lightguide region changes in response to environmental changes or controlled changes. These changes can include electrical current, electromagnetic field, magnetic field, temperature, pressure, chemical reaction, movement of particles or materials (such as electrophoresis or electrowetting), optical irradiation, orientation of the object with respect to gravitational field, MEMS devices, MOEMS devices, and other techniques for changing mechanical, electrical, optical or physical properties such as those known in the of smart materials. In one embodiment, the light extraction feature couples more or less light out of the lightguide in response to an applied voltage or electromagnetic field. In one embodiment, the light emitting device comprises a lightguide wherein properties of the lightguide (such as the position of the lightguide) which change to couple more less light out of a lightguide such as those incorporated in MEMs type displays and devices as disclosed in U.S. patent application Ser. Nos. 12/511,693; 12/606,675; 12/221,606; 12/258,206; 12/483,062; 12/221,193; 11/975,411 11/975398; 10/312,003; 10/699,397 and U.S. Pat. Nos. 7,586,560; 7,535,611; 6,680,792; 7,556,917; 7,532,377; and 7,297,471.

Edges of the Lightguide

In one embodiment, the edges of the lightguide or lightguide region are coated, bonded to or disposed adjacent to a specularly reflecting material, partially diffusely reflecting material, or diffuse reflecting material. In one embodiment, the lightguide edges are coated with a specularly reflecting ink comprising nano-sized or micron-sized particles or flakes which reflect the light substantially specularly. In another embodiment, a light reflecting element (such as a specularly reflecting multi-layer polymer film with high reflectivity) is disposed near the lightguide edge and is disposed to receive light from the edge and reflect it and direct it back into the lightguide. In another embodiment, the lightguide edges are rounded and the percentage of light diffracted from the edge is reduced. One method of achieving rounded edges is by using a laser to cut the lightguide from a film and achieve edge rounding through control of the processing parameters (speed of cut, frequency of cut, laser power, etc.). In another embodiment, the edges of the lightguide are tapered, angled serrated, or otherwise cut or formed such that light from a light source propagating within the coupling lightguide reflects from the edge such that it is directed into an angle closer to the optical axis of the light source, toward a folded region, toward a bent region, toward a lightguide, toward a lightguide region, or toward the optical axis of the light emitting device. In a further embodiment, two or more light sources are disposed to each couple light into two or more coupling lightguides comprising light re-directing regions for each of the two or more light sources that comprise first and second reflective surfaces which direct a portion of light from the light source into an angle closer to the optical axis of the light source, toward a folded or bent region, toward a lightguide region, toward a lightguide region, or toward the optical axis of the light emitting device. In one embodiment, one or more edges of the coupling lightguides, the lightguide, the light mixing region, or the lightguide region comprise a curve or arcuate profile in the region of intersection between two or more surfaces of the film in a region. In one embodiment, the edges in a region have a curved profile instead of a sharp corner to reduce diffractive effects and extraction of light near the region. In one embodiment, the edges of one or more regions are round cut edges, such as a semi-circular arc to remove the corners that can act as diffracting elements on the propagating light. Very thin lightguides (e.g. less than 150 microns thick) have a higher probability that light is diffracted when encountering a sharp corner. Rounded corners can be achieved, for example without limitation, by laser-cutting an acrylic film to leave a melted edge that re-solidifies into a rounded edge.

Surfaces of the Lightguide

In one embodiment, at least one surface of the lightguide or lightguide region is coated, bonded to or disposed adjacent to a specularly reflecting material, partially diffusely reflecting material, or diffuse reflecting material. In one embodiment, at least on lightguide surface is coated with a specularly reflecting ink comprising nano-sized or micron-sized particles or flakes which reflect the light substantially specularly. In another embodiment, a light reflecting element (such as a specularly reflecting multi-layer polymer film with high reflectivity) is disposed near the lightguide surface opposite the light emitting surface and is disposed to receive light from the surface and reflect it and direct it back into the lightguide. In another embodiment, the outer surface of at least one lightguide or component coupled to the lightguide comprises a microstructure to reduce the appearance of fingerprints. Such microstructures are known in the art of hardcoatings for displays and examples are disclosed in U.S. patent application Ser. No. 12/537,930.

Shape of the Lightguide

In one embodiment, at least a portion of the lightguide shape or lightguide surface is at least one selected from the group: substantially planar, curved, cylindrical, a formed shape from a substantially planar film, spherical, partially spherical, angled, twisted, rounded, have a quadric surface, spheroid, cuboid, parallelepiped, triangular prism, rectangular prism, ellipsoid, ovoid, cone pyramid, tapered triangular prism, wave-like shape, and other known geometrical solids or shapes. In one embodiment, the lightguide is a film which has been formed into a shape by thermoforming or other forming technique. In another embodiment, the film or region of the film is tapered in at least one direction. In a further embodiment, a light emitting device comprises a plurality of lightguides and a plurality of light sources physically couple or arranged together (such as tiled in a 1×2 array for example). In another embodiment, the lightguide region of the film comprises or is substantially in the shape of one selected from the group: rectangular, square, circle, doughnut shaped (elliptical with a hole in the inner region), elliptical, linear strip, and tube (with a circular, rectangular, polygonal, or other shaped cross-section). In one embodiment, the film-based lightguide is stamped, bent, folded or otherwise reshaped in one or more places (such as in the coupling lightguides, the lightguide region, or light mixing region, for example) to assist in maintaining its location relative to another component or attach it to or guide it relative to another component (such as the housing, frame, light input coupler, device housing, for example without limitation).

In one embodiment, a light emitting device comprises a lightguide formed from a film into a hollow cylindrical tube comprises coupling lightguide strips branching from the film on a short edge toward the inner portion of the cylinder. In another embodiment, a light emitting device comprises a film lightguide with coupling lightguides cut into the film so that they remain coupled to the lightguide region and the central strip is not optically coupled to the lightguide and provides a spine with increased stiffness in at least one direction near the central strip region or lightguide region near the strip. In a further embodiment, a light emitting device comprises lightguides with light input couplers arranged such that the light source is disposed in the central region of the edge of the lightguide and that the light input coupler (or a component thereof) does not extend past the edge and enables the lightguides to be tiled in at least one of a 1×2, 2×2, 2×3, 3×3 or larger array. In another embodiment, a light emitting device comprises light emitting lightguides wherein the separation between the lightguides in at least one direction along the light emitting surface is less than one selected from the group: 10 mm, 5 mm, 3 mm, 2 mm, 1 mm and 0.5 mm.

In another embodiment, the lightguide comprises single fold or bend near an edge of the lightguide such that the lightguide folds under or over itself. In this embodiment, light which would ordinarily be lost at the edge of a lightguide may be further extracted from the lightguide after the fold or bend to increase the optical efficiency of the lightguide or device. In another embodiment, the light extraction features on the lightguide disposed in the optical path of the light within the lightguide after the fold or bend provide light extraction features that increase at least one selected from the group: luminance, luminance uniformity, color uniformity, optical efficiency, and image or logo clarity or resolution.

Edges Fold Around Back onto the Lightguide

In one embodiment, at least one edge region selected from the group: the lightguide, the lightguide region, and the coupling lightguides folds or bends back upon itself and is optically coupled to the lightguide, lightguide region or coupling lightguide such that a portion entering the edge region is coupled back into the lightguide, lightguide region, or coupling lightguide in a direction away from the edge region. The edge regions may be adhered using an adhesive such as PSA or other adhesive, thermally bonded, or otherwise optically coupled back onto the lightguide, lightguide region, or coupling lightguide. In one embodiment, folding the edge regions of the lightguide redirects light that would normally exit the edge of the film back into the lightguide, and the optical efficiency of the system is increased.

In another embodiment, the thickness of the lightguide, lightguide region, or coupling lightguide is thinner in the region near an edge than the average thickness of the lightguide in the light emitting region or lightguide region. In another embodiment, the thickness of the lightguide, lightguide region, or coupling lightguide is less than one selected from the group: 90%, 80%, 70%, 60%, 50%, 40%, 30%, 20%, 10%, and 5% of the average thickness of the lightguide in the light emitting region or lightguide region.

In one embodiment, the thickness of the lightguide, lightguide region, or coupling lightguide is tapered in the region near an edge. In one embodiment, tapering the thickness in the region near edge permits more light to couple back into the lightguide when it is optically coupled to the surface of the lightguide or lightguide region.

In one embodiment, the light emitting device has an optical efficiency, defined as the luminous flux of the light exiting the light emitting device in the light emitting region divided by the luminous flux of the light exiting the light source disposed to direct light into the input coupler, greater than one selected from the group: 50%, 60%, 70%, 80%, and 90%.

In another embodiment, the edge region of a lightguide not disposed to receive light directly from a light source or light input coupler is formed or coupled into a light output coupler comprising coupling lightguides which are folded or bent to create a light output surface. In another embodiment, the light output surface is optically coupled to or disposed proximal to a light input surface of a light input coupler for the same lightguide or film or a second lightguide or film. In this embodiment, the light reaching the edge of a lightguide may be coupled into coupling strips which are folded and bent to direct light back into the lightguide and recycle the light.

Reflecting Features Cut into the Edge of the Lightguide

In one embodiment, one or more regions of the film-based lightguide comprise reflective features disposed to reflect light within a first angular range back into the lightguide by total-internal reflection. In one embodiment, the reflective features are one or more shaped features cut along the edge selected from the group: angled features, triangular features, triangular features with an apex angle of substantially 90 degrees, arcs, semicircular arcs, shapes with arcuate and linear features, multi-faceted shapes, and polygonal shapes. For example, in one embodiment, a light emitting device comprises a light input coupler disposed along one side and a plurality of "zig-zagged" angled cuts in the film on the opposite side with 90 degree apex angles. In this embodiment, the light within the film that reaches the angled cuts directly at about 0 degrees from the opposite side will substantially retro-reflect back into the lightguide. The shape, angle, refractive index and location of the angled cuts will affect the angular range and percentage of light reflected back into the lightguide. The cuts may be "micro-cuts" such that they do not substantially extend the lateral distance of the film-based lightguide. In one embodiment, the optical axis of the light propagating in the film-based lightguide is in the x direction and the apex angle of the reflecting features is 90 degrees such that the reflectance of the light that is not extracted by the light extracting surface features is maximized and directed back toward the light emitting region to be recycled. Other faceted shapes or curved shapes may also be cut from the edge to achieve a desired reflection or light transmitting properties.

Lightguide Material

In one embodiment, a light emitting device comprises a lightguide or lightguide region formed from at least one light transmitting material. In one embodiment, the lightguide is a film comprising at least one core region and at least one cladding region, each comprising at least one light transmitting material. In one embodiment, the core material is substantially flexible (such as a rubber or adhesive) and the cladding material supports and provides at least one selected from the group: increased flexural modulus, increased impact strength, increased tear resistance, and increased scratch resistance for the combined element. In another embodiment, the cladding material is substantially flexible (such as a rubber or adhesive) and the core material supports and provides at least one selected from the group: increased flexural modulus, increased impact strength, increased tear resistance, and increased scratch resistance for the combined element.

The light transmitting material used within an embodiment may be a thermoplastic, thermoset, rubber, polymer, high transmission silicone, glass, composite, alloy, blend, silicone, other light transmitting material, or a combination thereof.

In one embodiment, a component or region of the light emitting device comprises a light transmitting material selected from the group: cellulose derivatives (e.g., cellulose ethers such as ethylcellulose and cyanoethylcellulose, cellulose esters such as cellulose acetate), acrylic resins, styrenic resins (e.g., polystyrene), polyvinyl-series resins [e.g., poly(vinyl ester) such as poly(vinyl acetate), poly(vinyl halide) such as poly(vinyl chloride), polyvinyl alkyl ethers or polyether-series resins such as poly(vinyl methyl ether), poly(vinyl isobutyl ether) and poly(vinyl t-butyl ether)], polycarbonate-series resins (e.g., aromatic polycarbonates such as bisphenol A-type polycarbonate), polyester-series resins (e.g., homopolyesters, for example, polyalkylene terephthalates such as polyethylene terephthalate and polybutylene terephthalate, polyalkylene naphthalates corresponding to the polyalkylene terephthalates; copolyesters containing an alkylene terephthalate and/or alkylene naphthalate as a main component; homopolymers of lactones such as polycaprolactone), polyimide-series resin (e.g., nylon 6, nylon 66, nylon 610), urethane-series resins (e.g., thermoplastic polyurethane resins), copolymers of monomers forming the above resins [e.g., styrenic copolymers such as methyl methacrylate-styrene copolymer (MS resin), acrylonitrile-styrene copolymer (AS resin), styrene-(meth)acrylic acid copolymer, styrene-maleic anhydride copolymer and styrene-butadiene copolymer, vinyl acetate-vinyl chloride copolymer, vinyl alkyl ether-maleic anhydride copolymer]. Incidentally, the copolymer may be whichever of a random copolymer, a block copolymer, or a graft copolymer.

Lightguide Material Comprises Glass

In one embodiment, the coupling lightguides comprise a core material comprising a glass material. In one embodiment, the glass material is one selected from the group: fused silica, ultraviolet grade fused silica (such as JGS1 by Dayoptics Inc., Suprasil® 1 and 2 by Heraeus Quartz America, LLC., Spectrosil® A and B by Saint-Gobain Quartz PLC, and Corning 7940 by Corning Incorporated, Dynasil® Synthetic Fused Silica 1100 and 4100 by Dynasil Corporation), optical grade fused quartz, full spectrum fused silica, borosilicate glass, crown glass, and aluminoborosilicate glass.

In another embodiment, the core material comprises a glass which is coated, or has an organic material applied to at least one selected from the group: the edge, the top surface, and the bottom surface. In one embodiment, the coating on the glass functions to at least one selected from the group: provide a cladding region, increase impact resistance, and provide increased flexibility. In another embodiment, the coupling lightguides comprising glass, a polymeric material, or a rubber material are heated to a temperature above their glass transition temperature or VICAT softening point before folding in a first direction.

Multilayer Lightguide

In one embodiment, the lightguide comprises at least two layers or coatings. In another embodiment, the layers or coatings function as at least one selected from the group: a core layer, a cladding layer, a tie layer (to promote adhesion between two other layers), a layer to increase flexural strength, a layer to increase the impact strength (such as Izod, Charpy, Gardner, for example), and a carrier layer. In a further embodiment, at least one layer or coating comprises a microstructure, surface relief pattern, light extraction features, lenses, or other non-flat surface features which redirect a portion of incident light from within the lightguide to an angle whereupon it escapes the lightguide in the region near the feature. For example, the carrier film may be a silicone film with embossed light extraction features disposed to receive a thermoset polycarbonate resin. In another embodiment, the carrier film is removed from contact with the core material in at least one region. For example, the carrier film may be an embossed FEP film and a thermoset methacrylate-based resin is coated upon the film and cured by heat, light, other radiation, or a combination thereof. In another embodiment, the core material comprises a methacrylate material, and the cladding comprises a silicone material. In another embodiment, a cladding material is coated onto a carrier film and subsequently, a core layer material, such as a silicone, a PC, or a PMMA based material, is coated or extruded onto the cladding material. In one embodiment, the cladding layer is too thin to support itself in a coating line and therefore a carrier film is used. The coating may have surface relief properties one the side opposite the carrier film, for example.

In one embodiment, the lightguide comprises a core material disposed between two cladding regions wherein the core region comprises a polymethyl methacrylate, polystyrene, or other amorphous polymer and the lightguide is bent at a first radius of curvature and the core region and cladding region are not fractured in the bend region, wherein the same core region comprising the same polymethyl methacrylate without the cladding regions or layers fractures more than 50% of the time when bent at the first radius of curvature. In another embodiment, a lightguide comprises substantially ductile polymer materials disposed on both sides of a substantially brittle material of a first thickness such as PMMA or polystyrene without impact modifiers and the polymer fracture toughness or the ASTM D4812 version 06 un-notched Izod impact strength of the lightguide is greater than a single layer of the brittle material of a first thickness.

Core Region Comprising a Thermoset Material

In one embodiment, a thermoset material is coated onto a thermoplastic film wherein the thermoset material is the core material and the cladding material is the thermoplastic film or material. In another embodiment, a first thermoset material is coated onto a film comprising a second thermoset material wherein the first thermoset material is the core material and the cladding material is the second thermoset plastic.

In one embodiment, an epoxy resin that has generally been used as a molding material may be used as the epoxy resin (A). Examples include epoxidation products of novolac resins derived from phenols and aldehydes, such as phenol novolac epoxy resins and ortho-cresol novolac epoxy resins; diglycidyl ethers of bisphenol A, bisphenol F, bisphenol S, alkyl-substituted bisphenol, or the like; glycidylamine epoxy resins obtained by the reaction of a polyamine such as diaminodiphenylmethane and isocyanuric acid with epichlorohydrin; linear aliphatic epoxy resins obtained by oxidation of olefin bonds with a peracid such as peracetic acid; and alicyclic epoxy resins. Any two or more of these resins may be used in combination. Examples of thermoset resins further include bisphenol A epoxy resins, bisphenol F epoxy resins, bisphenol S epoxy resins, diglycidyl isocyanurate, and triglycidyl isocyanurate, P(MMA-d8) material, fluorinated resin, deuterated polymer, poly (fluoroalkyl-MA), poly(deuterated fluoroalkyl-MA), trideutero hexafluorobutyl-pentadeutero methacrylate, and triazine derived epoxy resin.

In another embodiment, the thermosetting resin is a thermosetting silicone resin. In a further embodiment, the thermosetting silicone resin composition comprises a condensation reactable substituent group-containing silicon compound and an addition reactable substituent group-containing silicon compound. In another embodiment, the thermosetting silicone resin composition comprises a dual-end silanol type silicone oil as the condensation reactable substituent group-containing silicon compound; an alkenyl group-containing silicon compound; an organohydrogensiloxane as the addition reactable substituent group-containing silicon compound; a condensation catalyst; and a hydrosilylation catalyst. In one embodiment, the thermosetting resin is a methylphenyl dimethyl copolymer or comprises a silicone-based material such as disclosed in U.S. Pat. No. 7,551,830. In another embodiment, the thermosetting resin comprises a polydiorganosiloxane having an average, per molecule, of at least two aliphatically unsaturated organic groups and at least one aromatic group; (B) a branched polyorganosiloxane having an average, per molecule, of at least one aliphatically unsaturated organic group and at least one aromatic group; (C) a polyorganohydrogensiloxane having an average per molecule of at least two silicon-bonded hydrogen atoms and at least one aromatic group, (D) a hydrosilylation catalyst, and (E) a silylated acetylenic inhibitor. In another embodiment, the thermosetting comprises a silicone, polysiloxane, or silsesquioxane material such as disclosed in U.S. patent application Ser. Nos. 12/085,422 and 11/884,612.

In a further embodiment, the thermosetting material comprises: a liquid crystalline thermoset oligomer containing at least aromatic or alicyclic structural unit with a kink structure in the backbone and having one or two thermally crosslinkable reactive groups introduced at one or both ends of the backbone; either a crosslinking agent having thermally crosslinkable reactive groups at both ends thereof or an epoxy compound or both; and an organic solvent. In a further embodiment, the thermosetting composition comprises at least on selected from the group: an aluminosiloxane, a silicone oil containing silanol groups at both ends, an epoxy silicone, and a silicone elastomer. In this thermosetting composition, it is considered that each of hydroxyl groups of the aluminosiloxane and/or the silicone oil containing silanol groups at both ends, and a highly reactive epoxy group of the epoxy silicone are reacted and cross-linked, at the same time the silicone elastomer is cross-linked by a hydrosilylation reaction therewith. In another embodiment, the thermoset is a photopolymerizable composition. In another embodiment, the photopolymerizable composition comprises: a silicon-containing resin comprising silicon-bonded hydrogen and aliphatic unsaturation, a first metal-containing catalyst that may be activated by actinic radiation, and a second metal-containing catalyst that may be activated by heat but not the actinic radiation.

In another embodiment, the thermosetting resin comprises a silsesquioxane derivative or a Q-containing silicone. In another embodiment, the thermosetting resin is a resin with substantially high transmission such as those disclosed in U.S. patent application Ser. Nos. 12/679,749, 12/597,531, 12/489,881, 12/637,359, 12/637,359, 12/549,956, 12/759,293, 12/553,227, 11/137,358, 11/391,021, and 11/551,323.

In one embodiment, the lightguide material for the core region comprises a material with a glass transition temperature less than one selected from the group: −100, −110, −120, −130, −140, −150 degrees Celsius. In another embodiment, the material for the core region of the lightguide comprises a material with a Young's modulus less than one selected from the group: 2.8, 2, 1.8, 1.6, 1.5, 1.2, 1, 0.8, 0.6, 0.4, 0.2, 0.1, 0.08, 0.06, and 0.04 kilopascals. In one embodiment, a material with a low Young's modulus and/or low glass transition temperature is used to reduce tears or cuts when the coupling lightguides are folded, such as, for example without limitation, when using a relative position maintaining element.

In a further embodiment, the lightguide comprises a thermoset resin that is coated onto an element of the light emitting device (such as a carrier film with a coating, an optical film, the rear polarizer in an LCD, a brightness enhancing film, a thermal transfer element such as a thin sheet comprising aluminum, or a white reflector film) and subsequently cured or thermoset.

Lightguide Material with Adhesive Properties

In another embodiment, the lightguide comprises a material with at least one selected from the group: chemical adhesion, dispersive adhesion, electrostatic adhesion, diffusive adhesion, and mechanical adhesion to at least one element of the light emitting device (such as a carrier film with a coating, an optical film, the rear polarizer in an LCD, a brightness enhancing film, another region of the lightguide, a coupling lightguide, a thermal transfer element such as a thin sheet comprising aluminum, or a white reflector film). In a further embodiment, at least one of the core material or cladding material of the lightguide is an adhesive material. In a further embodiment, at least one selected from the group: core material, cladding material, and a material disposed on a cladding material of the lightguide is at least one selected from the group: a pressure sensitive adhesive, a contact adhesive, a hot adhesive, a drying adhesive, a multi-part reactive adhesive, a one-part reactive adhesive, a natural adhesive, and a synthetic adhesive. In a further embodiment, the first core material of a first coupling lightguide is adhered to the second core material of a second coupling lightguide due to the adhesion properties of the first core material, second core material, or a combination thereof. In another embodiment, the cladding material of a first coupling lightguide is adhered to the core material of a second coupling lightguide due to the adhesion properties of the cladding material. In another embodiment, the first cladding material of a first coupling lightguide is adhered to the second cladding material of a second coupling lightguide due to the adhesion properties of the first cladding material, second cladding material, or a combination thereof. In one embodiment, the core layer is an adhesive and is coated onto at least one selected from the group: cladding layer, removable support layer, protective film, second adhesive layer, polymer film, metal film, second core layer, low contact area cover, and planarization layer. In another embodiment, the cladding material or core material has adhesive properties and has an ASTM D3330 version 04 Peel strength greater than one selected from the group: 8.929, 17.858, 35.716, 53.574, 71.432, 89.29, 107.148, 125.006, 142.864, 160.722, 178.580 kilograms per meter of bond width when adhered to an element of the light emitting device, such as for example without limitation, a cladding layer, a core layer, a low contact area cover, a circuit board, or a housing.

In another embodiment, a tie layer, primer, or coating is used to promote adhesion between at least one selected from the group: core material and cladding material, lightguide and housing, core material and element of the light emitting device, cladding material and element of the light emitting device. In one embodiment, the tie layer or coating comprises a dimethyl silicone or variant thereof and a solvent. In another embodiment, the tie layer comprises a phenyl-based primer such as those used to bridge phenylsiloxane-based silicones with substrate materials. In another embodiment, the tie layer comprises a platinum-catalyzed, addition-cure silicone primer such as those used to bond plastic film substrates and silicone pressure sensitive adhesives.

In a further embodiment, at least one region of the core material or cladding material has adhesive properties and is optical coupled to a second region of the core or cladding material such that the ASTM D1003 version 07e1 luminous transmittance through the interface is at least one selected from the group: 1%, 2%, 3%, and 4% greater than the transmission through the same two material at the same region with an air gap disposed between them.

Outermost Surface of the Film or Lightguide

In one embodiment, the outermost surface of the film, lightguide or lightguide region comprises at least one selected from the group: a cladding, a surface texture to simulate a soft feel or match the surface texture of cloth or upholstery, a refractive element to collimate light from the light extraction features (such as microlens array), an adhesive layer, a removable backing material, an anti-reflection coating, an anti-glare surface, and a rubber surface.

Surface Relief on the Outermost Surface of the Film-Based Lightguide or Light Emitting Film In one embodiment, the outermost surface of the film, lightguide, light emitting film, light redirecting element, or light emitting device comprises surface relief features and the ASTM D523-89 version 2008 60 degree gloss of the surface is less than one selected from the group: 100, 50, 25, and 15. In one embodiment, the gloss on the outer surface reduces ambient glare light intensity that would highlight the surface. For example, in one embodiment, the light emitting device comprises a lightguide with an outermost surface with a uniform low gloss of 2 gloss units. When this lightguide is disposed on a wall with a matte or diffusing surface with a gloss of about 2 gloss units, the substantially transparent or translucent lightguide with high visible light transmittance is nearly invisible, even at glare angles from light sources due to the matching of the gloss of the outermost surface. In this embodiment, the light emitting device is significantly less visible in the off state in an application such as a wall mounted light fixture. In one embodiment, the outermost surface with the low gloss is a surface of an anti-glare film, embossed film, cladding layer, light redirecting element, light turning optical element, light collimating optical element, lightguide, core region (where there is no cladding surface on that side of the core region), light re-directing element, light emitting device cover, lens, or a housing element.

In one embodiment, the outermost surface of the film, lightguide, light emitting film, light redirecting element, or light emitting device has an ASTM D523-89 version 2008 60 degree gloss greater than one selected from the group: 50, 70, 90, 100, and 110. In this embodiment, the high gloss can match a glossy surface such as a window, glass partition, metal surface, etc. such that is less visible in the off state at glare angles. In another embodiment, a kit comprises a light emitting device and one or more films with gloss levels different from a region of the outermost surface of the light emitting device such that may be attached to an outermost surface region of the light emitting device to allow a choice of gloss level for the new outermost surface. For example, a film with the correct gloss level may be chosen to match the gloss level of the wall adjacent the light emitting device.

Light Extraction Method

In one embodiment, at least one selected from the group: the lightguide, the lightguide region, and the light emitting region comprises at least one light extraction feature or region. In one embodiment, the light extraction method includes operatively coupling a light extraction feature to the core region, lightguide region, or to a material operatively coupled to the core region or lightguide region. Operatively coupling the light extraction feature to a region includes, without limitation: adding, removing, or altering material on the surface of the region or within the volume of the region; disposing a material on the surface of the region or within the volume of the region; applying a material on the surface of the region or within the volume of the region; printing or painting a material on the surface of the region or within the volume of the region; removing material from the surface of the region or from the volume of the region; modifying a surface of the region or region within the volume of the region; stamping or embossing a surface of the region or region within the volume of the region; scratching, sanding, ablating, or scribing a surface of the region or region within the volume of the region; forming a light extraction feature on the surface of the region or within the volume of the region; bonding a material on the surface of the region or within the volume of the region; adhering a material to the surface of the cladding region or within the volume of the cladding region; optically coupling the light extraction feature to the surface of the region or volume of the region; optically coupling or physically coupling the light extraction feature to the region by an intermediate surface, layer or material disposed between the light extraction feature and the region. In another embodiment, a light extraction feature is operatively coupled to a region such that a portion of light propagating within the region incident on the light extraction feature will exit the region or be re-directed to an angle smaller than the critical angle such that it does not remain within the region, core region, coupling lightguide, lightguide, or other region through which it is propagating by total internal reflection.

In one embodiment, the light extraction region or feature is defined by a raised or recessed surface pattern or a volumetric region. Raised and recessed surface patterns include, without limitation, scattering material, raised lenses, scattering surfaces, pits, grooves, surface modulations, microlenses, lenses, diffractive surface features, holographic surface features, photonic bandgap features, wavelength conversion materials, holes, edges of layers (such as regions where the cladding is removed from covering the core layer), pyramid shapes, prism shapes, and other geometrical shapes with flat surfaces, curved surfaces, random surfaces, quasi-random surfaces and combinations thereof. The volumetric scattering regions within the light extraction region may comprise dispersed phase domains, voids, absence of other materials or regions (gaps, holes), air gaps, boundaries between layers and regions, and other refractive index discontinuities within the volume of the material different that co-planar layers with parallel interfacial surfaces. In one embodiment, the light extracting region comprises angled or curved surface or volumetric light extracting features that redirect a first redirection percentage of light into an angular range within 5 degrees of the normal to the light emitting surface of the light emitting device. In another embodiment, the first redirection percentage is greater than one selected from the group: 5, 10, 20, 30, 40, 50, 60, 70, 80, and 90. In one embodiment, the light extraction features are light redirecting features, light extracting regions or light output coupling features. In a further embodiment, the light extraction feature has an angular FWHM intensity of transmitted light greater than one selected from the group: 10 degrees, 20 degrees, 30 degrees, 40 degrees, 50 degrees, 60 degrees, 70 degrees, 80 degrees, 90 degrees, and 100 degrees when measured with light incident normal to the large area surface of the film at the feature with a 532 nm laser diode with a divergence less than 5 milliradians where the size of the cross-sectional area of the light from the laser is smaller than the light extraction feature.

In one embodiment, the lightguide or lightguide region comprises light extraction features in a plurality of regions. In one embodiment, the lightguide or lightguide region comprises light extraction features on or within at least one selected from the group: one outer surface, two outer surfaces, two outer and opposite surfaces, an outer surface and at least one region disposed between the two outer surfaces, within two different volumetric regions substantially within two different volumetric planes parallel to at least one outer surface or light emitting surface or plane, and within a plurality of volumetric planes. In another embodiment, a light emitting device comprises a light emitting region on the lightguide region of a lightguide comprising more than one region of light extraction features. In another embodiment, one or more light extraction features are disposed on top of another light extraction feature.

For example, grooved light extraction features could comprise light scattering hollow microspheres which may increase the amount of light extracted from the lightguide or which could further scatter or redirect the light that is extracted by the grooves. More than one type of light extraction feature may be used on the surface, within the volume of a lightguide or lightguide region, or a combination thereof.

In one embodiment, the lateral dimension of one or more light extraction features in the light emitting region in a direction parallel to the optical axis of the light within the lightguide at the light extraction feature is less than one selected from the group: 1 mm, 500 microns, 250 microns, 200 microns, 150 microns, 100 microns, 75 microns, 50 microns, 25 microns, 20 microns, 10 microns, 5 microns, 2 microns, 1 microns, 0.5 microns, and 0.3 microns. In another embodiment, the average lateral dimension of the light extraction features in the light emitting region in a direction parallel to the optical axis of the light within the lightguide at the light extraction feature is less than one selected from the group: 1 mm, 500 microns, 250 microns, 200 microns, 150 microns, 100 microns, 75 microns, 50 microns, 25 microns, 20 microns, 10 microns, 5 microns, 2 microns, 1 microns, 0.5 microns, and 0.3 microns.

In another embodiment, the dimension of one or more light extraction features in the light emitting region in a direction perpendicular to the optical axis of the light within the lightguide at the light extraction feature or the direction perpendicular to the surface of the lightguide between the light extracting features is less than one selected from the group: 1 mm, 500 microns, 250 microns, 200 microns, 150 microns, 100 microns, 75 microns, 50 microns, 25 microns, 20 microns, 10 microns, 5 microns, 2 microns, 1 microns, 0.5 microns, and 0.3 microns. In another embodiment, the average dimension of the light extraction features in the light emitting region in a direction perpendicular to the optical axis of the light within the lightguide at the light extraction feature or the direction perpendicular to the surface of the lightguide between the light extracting features is less than one selected from the group: 1 mm, 500 microns, 250 microns, 200 microns, 150 microns, 100 microns, 75 microns, 50 microns, 25 microns, 20 microns, 10 microns, 5 microns, 2 microns, 1 microns, 0.5 microns, and 0.3 microns.

In one embodiment, the separation distance between a first light extraction feature and the closest neighboring light extraction feature is less than one selected from the group: 200 microns, 150 microns, 100 microns, 75 microns, 50 microns, 25 microns, and 20 microns. In another embodiment, the average separation distance between two neighboring light extraction features in one or more light emitting regions of the film-based lightguide in a direction substantially parallel to the optical axis of the light propagating within the lightguide in the region of the light extracting features is less than one selected from the group: 200 microns, 150 microns, 100 microns, 75 microns, 50 microns, 25 microns, and 20 microns. In one embodiment, a light emitting device comprises a film-based lightguide comprising a first light extraction feature disposed to illuminate a first region or pixel of a display and a second light extraction feature (that is the closest neighboring light extraction feature to the first light extraction feature) disposed to illuminate a second region or pixel of a display adjacent the first region or pixel of a display such that the percentage of light flux from the first light extraction feature received by the second region or pixel and the percentage of light flux from the second light extraction feature received by the first region or pixel is less than one selected from the group: 50%, 40%, 30%, 20%, 10%, and 5%. In one embodiment, a very thin film-based lightguide (such as 25 microns for example) is disposed in close proximity to spatial light modulator and the film-based lightguide comprises substantially one light extraction feature disposed in proximity of each light modulation pixel of the spatial light modulator. In this embodiment, for example, large light extraction features (relative to the thickness of the lightguide) such as 200 microns in a lateral dimension parallel to the direction of the optical axis of the light within the lightguide in the region of the light extraction features would redirect and extract a very significant portion of the light propagating in the lightguide over a broad range of angles that could make uniform illumination over a large illumination area difficult. In one embodiment, the ratio of the average thickness of the film-based lightguide in a light emitting region to the average lateral dimension of the light extraction features in the light emitting region in a direction parallel to the optical axis of the light propagating within the lightguide at the light extraction features is greater than one selected from the group: 2, 4, 6, 8, 10, 15, 20, 40, 60, 80, and 1000. In one embodiment, the ratio of the average thickness of the film-based lightguide in a light emitting region to the average lateral dimension of the light extraction features in the light emitting region in a direction perpendicular to the optical axis of the light propagating within the lightguide at the light extraction features or the dimension in a direction perpendicular to the surface of the lightguide between the light extracting features is greater than one selected from the group: 2, 4, 6, 8, 10, 15, 20, 40, 60, 80, and 1000. In another embodiment, the ratio of the average thickness of the film-based lightguide in the light emitting region to the average separation distance between two neighboring light extraction features in the direction parallel to the optical axis of the light propagating in the lightguide at the light extraction features is greater than one selected from the group: 2, 4, 6, 8, 10, 15, 20, 40, 60, 80, and 1000. In another embodiment, the ratio of the average separation distance between neighboring light extraction features in the direction parallel to the optical axis of the light propagating in the lightguide at the light extraction features to the average lateral dimension of the light extraction features in a light emitting region in a direction parallel to the optical axis of the light propagating within the lightguide at the light extraction features is greater than one selected from the group: 2, 4, 6, 8, 10, 15, 20, 40, 60, 80, and 1000.

In one embodiment, the ratio of the average separation distance between light extraction features in the light emitting region in a first direction to the pitch of the pixels or pitch of the sub-pixels in the first direction is within a range selected from the group: 0.1 to 0.5, 0.5 to 1, 1 to 2, 2 to 4, 4 to 10, 10 to 20, 20 to 100, 0.1 to 100, 0.1 to 1, 1 to 100, 1 to 10, and 1 to 20. In another embodiment, the ratio of the average lateral dimension of the light extraction features of the light emitting region in a first direction to the pitch of the pixels or pitch of the sub-pixels in the first direction is within a range selected from the group: 0.1 to 0.5, 0.5 to 1, 1 to 2, 2 to 4, 4 to 10, 10 to 20, 20 to 100, 0.1 to 100, 0.1 to 1, 1 to 100, 1 to 10, and 1 to 20.

In one embodiment, the light extraction feature is substantially directional and comprises one or more selected from the group: angled surface feature, curved surface feature, rough surface feature, random surface feature, asymmetric surface feature, scribed surface feature, cut surface feature, non-planar surface feature, stamped surface feature, molded surface feature, compression molded surface feature, thermoformed surface feature, milled surface feature, extruded mixture, blended materials, alloy of materials, composite of symmetric or asymmetrically shaped materials, laser ablated surface feature, embossed surface feature, coated surface feature, injection molded surface feature, extruded surface feature, and one of the aforementioned features disposed in the volume of the lightguide. For example, in one embodiment, the directional light extraction feature is a 100 micron long 45 degree angled facet groove formed by UV cured embossing a coating on the lightguide film that substantially directs a portion of the incident light within the lightguide toward 0 degrees from the surface normal of the lightguide.

The light extraction region, light extraction feature, or light emitting region may be disposed on the upper and/or lower surface of the lightguide. For example, when reflective white scattering dots are printed on one surface of a lightguide, typically most of the light scattering from the dots that escape the lightguide will escape through the opposite surface. With surface relief light extraction features, the side of the lightguide that most of the light exits due to redirection from the surface relief light extraction features depends upon the shape of the features.

In a further embodiment, the light extraction features are grooves, indentations, curved, or angled features that redirect a portion of light incident in a first direction to a second direction within the same plane through total internal reflection. In another embodiment, the light extraction features redirect a first portion of light incident at a first angle into a second angle greater than the critical angle in a first output plane and increase the angular full width at half maximum intensity in a second output plane orthogonal to the first. In a further embodiment, the light extraction feature is a region comprising a groove, indentation, curved or angled feature and further comprises a substantially symmetric or isotropic light scattering region of material such as dispersed voids, beads, microspheres, substantially spherical domains, or a collection of randomly shaped domains wherein the average scattering profile is substantially symmetric or isotropic. In a further embodiment, the light extraction feature is a region comprising a groove, indentation, curved or angled feature and further comprises a substantially anisotropic or asymmetric light scattering region of material such as dispersed elongated voids, stretched beads, asymmetrically shaped ellipsoidal particles, fibers, or a collection of shaped domains wherein the average scattering is profile is substantially asymmetric or anisotropic. In one embodiment, the Bidirectional Scattering Distribution Function (BSDF) of the light extraction feature is controlled to create a predetermined light output profile of the light emitting device or light input profile to a light redirecting element.

In one embodiment, at least one light extraction feature is an array, pattern or arrangement of a wavelength conversion material selected from the group: a fluorophore, phosphor, a fluorescent dye, an inorganic phosphor, photonic bandgap material, a quantum dot material, a fluorescent protein, a fusion protein, a fluorophores attached to protein to specific functional groups, quantum dot fluorophores, small molecule fluorophores, aromatic fluorophores, conjugated fluorophores, and a fluorescent dye scintillators, phosphors such as Cadmium sulfide, rare-earth doped phosphor, and other known wavelength conversion materials.

In one embodiment, the light extraction feature is a specularly, diffusive, or a combination thereof reflective material. For example, the light extraction feature may be a substantially specularly reflecting ink disposed at an angle (such as coated onto a groove) or it may be a substantially diffusely reflective ink such as an ink comprising titanium dioxide particles within a methacrylate-based binder (white paint). For example, in one embodiment, the light emitting device is a reflective display comprising a film-based lightguide comprising printed or inkjet applied light scattering dots or shapes on one or more surfaces of the film-based lightguide that extract light from the lightguide toward the reflective display. Alternatively, the light extraction feature may be a partially diffusively reflecting ink such as an ink with small silver particles (micron or sub-micron, spherical or non-spherical, plate-like shaped or non-plate-like shaped, or silver (or aluminum) coated onto flakes) further comprising titanium dioxide particles. In another embodiment, the degree of diffusive reflection is controlled to optimize at least one selected from the group: the angular output of the device, the degree of collimation of the light output, and the percentage of light extracted from the region.

In another embodiment, the light emitting device comprises a lightguide with a light extraction feature optically coupled to the core region of the lightguide. For example, in one embodiment, the light extraction feature is a white reflective film coupled spatially and optically by a pattern of light transmitting adhesive regions disposed on the core region of the lightguide. In this embodiment, the air gaps between the adhesive regions totally internally reflect the light incident at the core region-air interface and the adhesive transmits incident light to a white reflection film that redirects light to angles outside the total internal reflection condition. In another embodiment, the lightguide comprises a spatial array of light transmitting regions that transmit light from the lightguide to light extraction features or a secondary lightguide comprising light extraction features. For example, in one embodiment, the light transmitting regions comprise an adhesive spatially printed on lightguide. In another example, the light transmitting regions comprise a light transmitting film with holes cut from the film to provide air gaps for total internal reflection at the lightguide surface and light transmitting regions to transmit light to light extraction features or another lightguide with light extraction features.

In one embodiment, the light extraction feature is a protrusion from the film-based lightguide material or layer. In another embodiment, the light extraction feature is a recessed region within the film-based lightguide layer. In one embodiment, the light extraction feature is a recessed region that permits light to exit the lightguide at the region. In another embodiment, the light extraction region is a recessed region that reflects a portion of incident light toward the opposite surface of the film-based lightguide such that it escapes the lightguide through the opposite surface. In one embodiment, the film-based lightguide comprises protrusions on a first side and an air-gap region or a cladding region (such as a low refractive index coating or pressure sensitive adhesive) disposed in contact with one or more regions of the protrusions or lightguide.

In another embodiment, the film-based lightguide comprises a first lightguide region comprising first protruding regions and the first lightguide region is optically coupled in one or more coupling regions to a second lightguide region. In a further embodiment, the second lightguide region comprises first recessed regions that are partially conforming but not completely conforming to the shape of the first protruding regions such that an air-gap region remains between the first lightguide region and the second lightguide region. For example, in one embodiment, the first lightguide comprises first protruding regions with a truncated triangular cross-section and the second lightguide region comprises first recessed regions with a recessed triangular cross-section such that when the films are disposed adjacent and aligned, the truncated region forms an air-gap region that can extract light out of the lightguide formed by the first and second optically coupled lightguide regions by total internal reflection (such as reflecting light toward a reflective spatial light modulator in a frontlight application). In one embodiment, the coupling regions of the first and second lightguide regions are disposed between two or more light extraction features such that light propagating between the light extraction features can propagate between the first and second lightguide regions. For example, in one embodiment, the first lightguide region is a silicone layer with protruding features and the second lightguide region is a silicone layer with recessed regions and the substantially planar regions between the recessed and protruding regions optically couple and bond together due to the natural adhesion between the silicone layers and an adhesive or index-matched adhesive is not required. In another embodiment, the first lightguide region and the second lightguide region are formed in materials that may be optically coupled by applying heat and/or pressure.

In a further embodiment, the recessed regions of a film-based lightguide comprise an adhesive or low-refractive index material within the recessed regions such that the refractive index difference between the film-based lightguide and the adhesive or low refractive index material causes a portion of incident light to reflect or totally internally reflect at the interface within the lightguide such that it functions as a light extraction feature for the lightguide. In this embodiment, the adhesive or low refractive index coating may be disposed in or on one or more of the regions selected from the group: a portion of the volume of the recessed region in the lightguide, one or more surfaces of the recessed features in the lightguide, one or more surfaces of the protruding features in the lightguide, substantially all of the volume of the recessed region of the lightguide, and one or more planar regions of the lightguide.

The pattern or arrangement of light extraction features may vary in size, shape, pitch, location, height, width, depth, shape, orientation, in the x, y, or z directions. Patterns and formulas or equations to assist in the determination of the arrangement to achieve spatial luminance or color uniformity are known in the art of edge-illuminated backlights. In one embodiment, a light emitting device comprises a film-based lightguide comprising light extraction features disposed beneath lenticules wherein the light extraction features are substantially arranged in the form of dashed lines beneath the lenticules such that the light extracted from the line features has a lower angular FHWM intensity after redirection from the lenticular lens array light redirecting element and the length of the dashes varies to assist with the uniformity of light extraction. In another embodiment, the dashed line pattern of the light extraction features varies in the x and y directions (where the z direction is the optical axis of the light emitting device). Similarly, a two-dimensional microlens array film (close-packed or regular array) or an arrangement of microlenses may be used as a light redirecting element and the light extraction features may comprise a regular, irregular, or other arrangement of circles, ellipsoidal shapes, or other pattern or shape that may vary in size, shape, or position in the x direction, y direction, or a combination thereof.

Visibility of Light Extraction Features

In one embodiment, at least one light extraction region comprises light extraction features which have a low visibility to the viewer when the region is not illuminated by light from within the lightguide (such as when the device is in the off-state or the particular lightguide in a multi-lightguide device is not illuminated). In one embodiment, the luminance at a first measurement angle of at least one selected from the group: lightguide region, square centimeter measurement area of the light emitting surface corresponding to light redirected by at least one light extraction feature, light emitting region, light extraction feature, and light extracting surface feature or collection of light extraction features is less than one selected from the group: 0.5 $cd/m^2$, 1 $cd/m^2$, 5 $cd/m^2$, 10 $cd/m^2$, 50 $cd/m^2$, and 100 $cd/m^2$ when exposed to diffuse illuminance from an integrating sphere of one selected from the group: 10 lux, 50 lux, 75 lux, 100 lux, 200 lux, 300 lux, 400 lux, 500 lux, 750 lux, and 1000 lux incident on the surface when place over a black, light absorbing surface. Examples of a light absorbing surface include, without limitation, a black velour cloth material, a black anodized aluminum, a material with a diffuse reflectance (specular component included) less than 5%, Light Absorbing Black-Out Material from Edmund Optics Inc., and a window to a light trap box (a box with light absorbing black velour or other material lining the walls). In one embodiment, the first measurement angle for the luminance is one selected from the group: 0 degrees, 5 degrees, 8 degrees, 10 degrees, 20 degrees, 40 degrees, 0-10 degrees, 0-20 degrees, 0-30 degrees, and 0-40 degrees. In one embodiment, the luminance of the light emitted from a 1 $cm^2$ measurement area of the light emitting surface corresponding to light redirected by at least one light extracting feature is less than 100 cd/m2 when exposed to a diffuse illuminance of 200 lux from an integrating sphere when placed over Light Absorbing Black-Out Material from Edmund Optics. In another embodiment, the luminance of the light emitted from a 1 $cm^2$ measurement area of the light emitting surface corresponding to light redirected by at least one light extracting feature is less than 50 $cd/m^2$ when exposed to a diffuse illuminance of 200 lux from an integrating sphere when placed over Light Absorbing Black-Out Material from Edmund Optics Inc. In another embodiment, the luminance of the light emitted from a 1 $cm^2$ measurement area of the light emitting surface corresponding to light redirected by at least one or an average of all light extracting features is less than 25 $cd/m^2$ when exposed to a diffuse illuminance of 200 lux from an integrating sphere when placed over Light Absorbing Black-Out Material from Edmund Optics Inc. In one embodiment, the thin lightguide film permits smaller features to be used for light extraction features or light extracting surface features to be spaced further apart due to the thinness of the lightguide. In one embodiment, the average largest dimensional size of the light extracting surface features in the plane parallel to the light emitting surface corresponding to a light emitting region of the light emitting device is less than one selected from the group: 3 mm, 2 mm, 1 mm, 0.5 mm, 0.25 mm, 0.1 mm, 0.080, 0.050 mm, 0.040 mm, 0.025 mm, and 0.010 mm. In one embodiment, the average minimum dimensional size of the light extracting surface features in the plane parallel to the light emitting surface corresponding to a light emitting region of the light emitting device is less than one selected from the group: 3 mm, 2 mm, 1 mm, 0.5 mm, 0.25 mm, 0.1 mm, 0.080, 0.050 mm, 0.040 mm, 0.025 mm, and 0.010 mm.

In one embodiment, the individual light extracting surface features, regions, or pixels, are not discernable as an individual pixel when the device is emitting light in an on state and is not readily discernable when the light emitting device is in the off state when viewed at a distance greater than one selected from the group: 10 centimeters, 20 centimeters, 30 centimeters, 40 centimeters, 50 centimeters, 100 centimeters, and 200 centimeters. In this embodiment, the area may appear to be emitting light, but the individual pixels or sub-pixels cannot be readily discerned from one another. In another embodiment, the intensity or color of a light emitting region of the light emitting device is controlled by spatial or temporal dithering or halftone printing. In one embodiment, the average size of the light extracting regions in a square centimeter of a light emitting region on the outer surface of the light emitting device is less than 500 microns and the color and/or luminance is varied by increasing or decreasing the number of light extracting regions within a predetermined area. In one embodiment, the luminance of the light extraction region or light extraction features is less than one selected from the group: 1, 5, 10, 20, and 50 $Cd/m^2$ when viewed normal to the surface from the side with the light extraction features or the side without the light extraction features with the light source not emitting light and under 50 lux ambient illumination.

In one embodiment, the light emitting device is a sign with a light emitting surface comprising at least one selected from the group: a light emitting region, a light extracting region, and a light extraction feature which is not readily discernable by a person with a visual acuity between 0.5 and 1.5 arcminutes at a distance of 20 cm when illuminated with 200 lux of diffuse light in front of Light Absorbing Black-Out Material from Edmund Optics Inc. In another embodiment, the light emitting device is a sign with a light emitting surface comprising at least one selected from the group: a light emitting region, a light extracting region, and a single light extraction feature which is not readily discernable by a person with a visual acuity of 1 arcminute at a distance of 50 cm when illuminated with 200 lux of diffuse light in front of Light Absorbing Black-Out Material from Edmund Optics Inc.

In another embodiment, the fill factor of the light extracting features, defined as the percentage of the surface area comprising light extracting features in a light emitting region, surface or layer of the lightguide or film, is one selected from the group: less than 80%, less than 70%, less than 60%, less than 50%, less than 40%, less than 30%, less than 20%, and less than 10%. The fill factor can be measured within a full light emitting square centimeter surface region or area of the lightguide or film (bounded by regions in all directions within the plane of the lightguide which emit light) or it may be the average of the light emitting areas of the lightguides. The fill factor may be measured when the light emitting device is in the on state or in the off state (not emitting light). In one embodiment, in the on state, the light extracting features are visible as discontinuities seen by a person with a visual acuity of one arcminute at a distance of 8 cm when the light emitting region of the film is placed in front of a black light absorbing surface and the film has a luminance of 100 cd/m2 from light directed through the film by a light input coupler.

In another embodiment, the light emitting device is a sign with a light emitting surface comprising light emitting regions wherein when the device is not emitting light, the angle subtended by two neighboring light extracting features that are visible when the device is on, at a distance of 20 cm is less than one selected from the group: 0.001 degrees, 0.002 degrees, 0.004 degrees, 0.008 degrees, 0.010 degrees, 0.015 degrees, 0.0167 degrees, 0.02 degrees, 0.05 degrees, 0.08 degrees, 0.1 degrees, 0.16 degrees, 0.2 degrees, 0.3 degrees, 0.4 degrees, 0.5 degrees, 0.6 degrees, 0.7 degrees, 0.8 degrees, 1 degree, 2 degrees, and 5 degrees. In another embodiment, the light emitting device is a sign with a light emitting surface comprising light emitting regions wherein when the device is not emitting light, the angle subtended by two neighboring light extracting features (that are which are not easily visible when the device is off when illuminated with 200 lux of diffuse light) at a distance of 20 cm is less than one selected from the group: 0.3 degrees, 0.4 degrees, 0.5 degrees, 0.6 degrees, 0.7 degrees, 0.8 degrees, 1 degree, 2 degrees, and 5 degrees.

In a further embodiment, the light extraction features of the light emitting device comprise light scattering domains of a material with a different refractive index than the surrounding material. In one embodiment, the light scattering domain has a concentration within the continuous region having light scattering domains (such as an inkjet deposited white ink pixel) less than one selected from the group: 50%, 40%, 30%, 20%, 10%, 5%, 3%, 1%, 0.5%, and 0.1% by volume or weight. The concentration or thickness of the light scattering domains may vary in the x, y, or z directions and the pixel or region may be overprinted to increase the thickness. In another embodiment, the light extracting features have a light absorbing region disposed between the light extracting feature and at least one output surface of the light emitting device. For example, the light extracting features could be titanium dioxide based white inkjet deposited pixels deposited on a lightguide and the light absorbing ink (such as a black dye or ink comprising carbon black particles) is deposited on top of the white ink such that 50% of the light scattered from the white pixel is transmitted through the light absorbing ink. In this example, the ambient light that would have reflected from the white ink if there were no light absorbing ink is reduced by 75% (twice passing through the 50% absorbing ink) and the visibility of the dots is reduced while sufficient light from the lightguide is emitted from the light emitting device in the region near the white pixel. In another embodiment, a low light transmission, light absorbing material absorbing at least one selected from the group: 5%, 10%, 20%, 30%, 40%, 50%, 60%, and 70% of the light emitted from a first light extracting feature is disposed between the light extracting feature and at least one outer surface of the light emitting device.

In one embodiment, the thickness of the lightguide or core layer at the light extraction feature in a first direction selected from the group: perpendicular to the light emitting surface of the lightguide, perpendicular to the optical axis of the light within the lightguide at the light extraction feature, and perpendicular to the direction of light propagating in the lightguide at the light extraction feature divided by the length of one or more light extraction features in a first direction parallel to the direction of light propagating in the lightguide or parallel to the optical axis of the light within the lightguide is greater than one selected from the group: 1, 2, 5, 10, 15, 20, and 50.

In one embodiment, the lightguide comprises a coating or layer disposed in optical contact with the lightguide comprising the light extraction features. In one embodiment, for example, a UV curable methacrylate-based coating is coated onto a plasma surface treated silicone-based lightguide and is cured in when in contact with an embossing drum such that the light extraction features are formed on the coating on the silicone-based lightguide. Various UV curable coatings are suitable for use in this embodiment, and the refractive index, light transmission properties, adhesion properties, and scattering properties are known in the optical film industry.

In one embodiment, the light extraction feature comprises a light scattering material (such as titanium dioxide, for example) and a light absorbing tint, dye or material on one or more surfaces, in the volume of the feature, or optically coupled to or adjacent to the scattering material. In this embodiment, when light within the film-based lightguide encounters the light extraction feature, the light scatters into a wide angle (out of the lightguide) and substantially maintains the color of the dye due to the absorption properties. In this embodiment, the light scattering material or feature serves as the light scattering (and extracting mechanism) while the dye serves as the coloring mechanism, and allows for full color images to be printed on a light guide and viewed from a variety of angles when illuminated, by white light for example. The light scattering region, or light absorbing material may comprise one or more dyes, tints or light absorbing materials and the regions comprising these materials may be spaced close enough to give an effective color based on the perceived color at a predetermined distance, such as 20, 30, 50, 100 or 200 centimeters, for example for a person with visual acuity of 1 arcminute. In one embodiment, the distance between the centers or the width of the sub-pixels is less than one selected from the group: 4, 2, 1, 0.5, 0.25, 0.2, 0.15, 0.1, 0.05, and 0.025 millimeters. In one embodiment, for example, the sub-regions of color (or sub-pixels) may be red, green, blue, white (substantially without light absorbing material), black, cyan, yellow, magenta, or other colors or primary systems. In one embodiment, after printing or otherwise adding the light extraction, light scattering or absorbing regions or materials, a cladding region or layer may be added by lamination, coating or other method of optical coupling.

In a further embodiment, the light extraction region is designed to be substantially visible from only one side. In one embodiment, the light extraction features are disposed on the non-viewing side of the light emitting device between a low light transmission region and the lightguide. For example, in one embodiment, the light extraction regions are printed white ink regions with light absorbing black ink overprinted on the white ink regions. In this embodiment, the white ink scatters light out of the lightguide on the opposite side and a significant portion of the light transmitted through the white ink is absorbed by the black ink. In another embodiment, the light extraction regions comprise surface relief patterns on one side of a lightguide and a low light transmission film, such as a black PET film, is substantially cut in the shape of the extraction regions and disposed adjacent the light extraction regions. In another embodiment, the low light transmission region does not conform to the shape of the light extraction regions. For example, in one embodiment, a light emitting device comprises a light source, lightguide, light input coupler, and a square black PET film is laminated to cladding layer which is laminated to a circular shaped logo pattern of white ink regions and the lightguide. In this embodiment, the white ink pattern is visible from the side opposite the side of the lightguide comprising the black PET film and is not substantially visible from the side comprising the black PET film when the light source is turned on. In a further embodiment, the luminance of the light emitting display is less than one selected from the group: 1, 5, 10, 20, and 50 $Cd/m^2$ when viewed normal to the surface from the side of the lightguide comprising the low light transmission film. In a further embodiment, the luminance of the light emitting display is greater than one selected from the group: 10, 20, 30, 40, 50, 75, 100, 200, and 300 $Cd/m^2$ when viewed normal to the surface from the side of the lightguide comprising the low light transmission film. In another embodiment, the luminance of the low light transmission region is less than one selected from the group: 1, 5, 10, 20, and 50 $Cd/m^2$ when viewed normal to the surface from the side of the lightguide comprising the low light transmission film with the light source not emitting light and under 50 lux ambient illumination.

In another embodiment, the light extraction region comprising the light extraction features is designed to be visible or legible from two opposite directions. For example, in one embodiment, an image or graphic based light extraction region is substantially symmetric such that it is visually perceptible and correct when viewed from either side of a window to which it is optically coupled or adjacent. In another embodiment, the light emitting device comprises two lightguides with a low light transmission region disposed in a region between the lightguides. In the previous embodiment, for example, a black polyester film layer may be disposed between the lightguides (and between the cladding layers of the two lightguides) in the regions behind the light extraction region in the form of readable text such there is a black or opaque background and the light emitting text is visible and easily legible from either side. In one embodiment, the low light transmission region has an average transmittance across the wavelengths of light emitted by the light emitting device less than one selected from the group: 70%, 60%, 50%, 40%, 30%, 20%, 10% and 5% measured by collimating light from the light sources used in the light emitting device and measuring the total transmittance in the equipment setup prescribed in the ASTM D1003 version 07e1 standard.

In one embodiment, the light extraction feature is a protruding feature on a film or component that is applied to the core or cladding region of a lightguide. In one embodiment, the light extraction features are protrusions from a film that are pressed into a thin cladding such that the separation between the core and the cladding is reduced such that the evanescent penetration depth of light in the cladding permits frustration of a first portion of the light into the material of the light extraction feature (or scattering therefrom in the case of a scattering light extraction feature such as a $TiO_2$ particle). In one embodiment, a lightguide comprises a high refractive index core layer and a compressible, thin low refractive index material such that when a force greater than one selected from the group: 1, 2, 5, 10, 20, 40, and 50 pounds per square inch, a first portion of light is frustrated from the lightguide. For example, in one embodiment, a light extraction film comprising a pattern of light scattering ink comprising $TiO_2$ particles is physically coupled to a compressible fluoropolymer cladding with a first thickness on a film-based lightguide comprising a polycarbonate core layer. A glass plate compresses the light extraction film onto the cladding layer such that the thickness of the cladding layer reduces to a second thickness and a first portion of the light from the lightguide is scattered from the lightguide due to the evanescent coupling of the light through the cladding to the light scattering ink.

In one embodiment, a light extraction feature film comprises protruding light extraction features that adhere to the core region and function as standoffs and adhesion locations to hold the light extraction feature film in place and to protect the light emitting region. In this embodiment, an air cladding is disposed between the light extraction features along the surface of the core layer. For example, in one embodiment, a backlight comprises a light extraction feature film comprising 100-micron protrusions comprising light scattering ink and a pressure sensitive adhesive disposed in a pattern on the surface of a polyethylene terephthalate (PET) film. The light extraction feature film is laminated to the core layer and bonded in the light extraction feature adhesive protrusions. In this embodiment, the light extraction feature film protects the core layer from scratches or dust/dirt accumulation that can occur during assembly, shipping or end-use.

Visible Light Extraction Features Also Providing Illumination

In one embodiment, the light from the light extraction features provides illumination of an object or surface and the light extraction features provide a visible pattern, logo, indicia or graphic. In one embodiment a first percentage of light exiting the lightguide due to the light extraction features illuminates a surface, object or region, and the second percentage of light exits the lightguide in a pattern, logo, indicia, or graphic and is visible directly. In another embodiment, a first percentage of light exiting a light emitting device from the first surface of the lightguide illuminates a surface, object, or region and a second percentage of light exits the light emitting device from the second surface of the lightguide opposite the first surface and the light extraction features form a visible pattern, logo, indicia, or graphic. For example, in one embodiment, a printed white ink light extraction region on one side of a lightguide with a diffuse reflectance of about 60% (measured from the air side and not through the lightguide), reflects a first percentage (approximately 30%) of incident light out of the lightguide toward a viewing side, transmits approximately 40% through the light extraction features out of the lightguide to illuminated a product in a POP display, and approximately 30% of the reflected light remains within the lightguide.

Multiple Lightguides

In one embodiment, a light emitting device comprises more than one lightguide to provide at least one selected from the group: color sequential display, localized dimming backlight, red, green, and blue lightguides, animation effects, multiple messages of different colors, NVIS and daylight mode backlight (one lightguide for NVIS, one lightguide for daylight for example), tiled lightguides or backlights, and large area light emitting devices comprised of smaller light emitting devices. In another embodiment, a light emitting device comprises a plurality of lightguides optically coupled to each other. In another embodiment, at least one lightguide or a component thereof comprises a region with anti-blocking features such that the lightguides do not substantially couple light directly into each other due to touching. In some embodiments, the need for a cladding can be reduced or alleviated by using anti-blocking materials to maintain separation (and air gap) over regions of the lightguide surfaces. In another embodiment, the light emitting device comprises a first and second light emitting region disposed to receive light from a first and second group of coupling lightguides, respectively, wherein the bends or folds in the first group of coupling lightguides are at angle selected from the group: 10 to 30 degrees, 25 degrees to 65 degrees, 70 to 110 degrees, 115 degrees to 155 degrees, 160 degrees to 180 degrees, and 5 to 180 degrees from the bends or folds in the second group of coupling lightguides.

In another embodiment, a film-based lightguide has two separate light emitting regions with a first and second group of coupling lightguides disposed to couple light into the first light emitting region and second light emitting region, respectively, wherein the first and second groups of coupling lightguides fold or bend to create a single light input coupler disposed to couple light from a single source or source package into both light emitting regions. In a further embodiment, the two separate light emitting regions are separated by a separation distance (SD) greater than one selected from the group: 0.1 millimeter, 0.5 millimeters, 1 millimeter, 5 millimeters, 10 millimeters, 1 centimeter, 5 centimeters, 10 centimeters, 50 centimeters, 1 meter, 5 meters, 10 meters, the width of a coupling lightguide, the width of a fold region, a dimension of the first light emitting region surface area, and a dimension of the second light emitting region surface area.

In another embodiment, two film-based lightguides are disposed above one another in at least one selected from the group: the lightguide region, the light emitting region, the light input coupler, the light input surface, and the light input edge such that light from a light source, a package of light sources, an array of light sources, or an arrangement of light sources is directed into more than one film-based lightguide.

In a further embodiment, a plurality of lightguides are disposed substantially parallel to each other proximate a first light emitting region and the lightguides emit light of a first and second color. The colors may be the same or different and provide additive color, additive luminance, white light emitting lightguides, red, green, and blue light emitting lightguides or other colors or combinations of lightguides emitting light near the same, adjacent or other corresponding light emitting regions or light extraction features. In another embodiment, a light emitting device comprises a first lightguide and a second lightguide wherein a region of the second lightguide is disposed beneath first lightguide in a direction parallel to the optical axis of the light emitting device or parallel to the normal to the light emitting surface of the device and at least one coupling lightguide from the first light lightguide is interleaved between at least two coupling lightguides from the second lightguide. In a further embodiment, the coupling lightguides from the first lightguide film are interleaved with the coupling lightguides of the second lightguide region. For example, two film-based lightguides with coupling lightguide strips oriented parallel to each other along one edge may be folded together to form a single light input surface wherein the light input edges forming the light input surface alternate between the lightguides. Similarly, three or more lightguides with light input edges 1, 2, and 3 may be collected through folding into a light input surface with alternating input edges in a 1-2-3-1-2-3-123 . . . pattern along a light input surface.

In another embodiment, a light emitting device comprises a first lightguide and a second lightguide wherein a region of the second lightguide is disposed beneath first lightguide in a direction parallel to the optical axis of the light emitting device or parallel to the normal to the light emitting surface of the device and a first set of the coupling lightguides disposed to couple light into the first lightguide form a first light input surface and are disposed adjacent a second set of coupling lightguides disposed to couple light into the second lightguide. The first and second set of lightguides may be in the same light input coupler or different light input coupler disposed adjacent each other and they may be disposed to receive light from the same light source, a collection of light sources, different light sources, or different collections of light sources.

Tiled Lightguides

In one embodiment, the light emitting device comprises a linear array of lightguides in a first direction. In another embodiment, a light emitting device comprises a linear array of lightguides in a first direction and a linear array of lightguides in a second direction orthogonal to the first direction. In a further embodiment, a light emitting device comprises a rectangular matrix of lightguides. In light emitting devices comprising tiled lightguides, the light input couplers, coupling lightguides, or light sources may be disposed along the periphery of the tiled lightguides, between the lateral edges of the lightguides along the side of the lightguide, folded back toward the central region between the lateral edges, or folded underneath or above the lightguide to permit a low separation distance between the lightguides.

Multiple Lightguides to Reduce Bend Loss

In another embodiment, a light emitting device comprises a first lightguide and a second lightguide wherein a first overlapping region of the second lightguide is disposed beneath first lightguide in a direction parallel to the optical axis of the light emitting device or parallel to the normal to the light emitting surface of the device and the first and second set of coupling lightguides disposed to couple light into the first and second lightguides, respectively, have a total bend loss less than that of a set of coupling lightguides optically coupled to a lightguide covering the same input dimension of each first and second coupling lightguide with the same radius of curvature as the average of the first and second set of coupling lightguides and a core thickness equal to the total core thicknesses of the first and second lightguides in the first overlapping region.

In a further embodiment, multiple lightguides are stacked such that light output from one lightguide passes through at least one region of another lightguide and the radii of curvature for a fixed bend loss (per coupling lightguide or total loss) is less than that of a single lightguide with the same light emitting area, same radius of curvature, and the thickness of the combined lightguides. For example, for a bend loss of 70%, a first lightguide of a first thickness may be limited to a first radius of curvature. By using a second and third lightguide with each at half the thickness of the first lightguide, the radius of curvature of each of the second and third lightguides can be less to maintain only 70% bend loss due to the reduced thickness of each lightguide. In one embodiment, multiple, thin lightguides, each with a radius of curvature less than a thicker lightguide with the same bend loss, reduce the volume and form factor of the light emitting device. The light input surfaces of the coupling lightguides from the different lightguides may be disposed adjacent each other in a first direction, on different sides of the light emitting device, within the same light input coupler, within different light input couplers, underneath each other, alongside each other, or disposed to receive light from the same or different light sources.

Multiple Lightguides Connected by Coupling Lightguides

In one embodiment, two or more lightguides are optically coupled together by a plurality of coupling lightguides. In one embodiment, a film comprises a first continuous lightguide region and strip-like sections cut in a region disposed between the first continuous lightguide region and a second continuous lightguide region. In one embodiment, the strips are cut and the first and second continuous lightguide regions are translated relative to each other such that the strips (coupling lightguides in this embodiment) are folding and overlapping. The resulting first and second lightguide regions may be separate regions such as a keypad illuminator and an LCD backlight for a cellphone which are connected by the coupling lightguides. The first and second lightguide regions may also both intersect a light normal to the film surface in one or more regions such that the first and second lightguide regions at least partially overlap. The first and second lightguide regions may have at least one light input coupler. By coupling the first and second lightguide regions together through the use of coupling lightguides, the light from an input coupler coupled into the first lightguide region is not lost, coupled out of, or absorbed when it reaches the end of the first lightguide region and may further propagate on to the second lightguide region. This can allow more light extraction regions for a specific region since the lightguides overlap in a region. In one embodiment, at least one region disposed to receive light between the first and second lightguide regions may comprise a light absorbing filter such that the light reaching the second lightguide region comprises a different wavelength spectral profile and a second color can be extracted from the second lightguide region different to the first color extracted from the first lightguide extracting region. More than two lightguide regions illuminated by a first input coupler with one, two, or more than two light emitting colors may be used and separate lightguides (or lightguide regions) with separate light input couplers may be disposed behind, between, or above one or more of the lightguide regions illuminated by the first input coupler. For example, a first light input coupler directs white light from an LED into the first lightguide region wherein the light extracting regions extract light creating a first white image, and the light which is not extracted passes into coupling lightguides on the opposite end which have a striped region optically coupled to the lightguide (such as a red colored ink stripe) which substantially absorbs the non-red portions of the spectrum. This light further propagates into the second lightguide region where a portion of the light is extracted out of the lightguide as red light in a red image. Similarly, other colors including subtractive colors may be used to create multiple colors of light emitting from multiple lightguide regions and the light extracting region may overlap to create additive color mixing. Two or more lightguides or lightguide regions may overlap wherein the optical axes of the light propagating within the lightguide are at approximately 90 degrees to each other.

Multiple Lightguides to Provide Pixelated Color

In one embodiment, a light emitting device comprises a first lightguide and second lightguide disposed to receive light from a first and second light source, respectively, through two different optical paths wherein the first and second light source emit light of different colors and the light emitting regions of the first and second lightguides comprise pixelated regions spatially separated in the plane comprising the light output plane of the light emitting device at the pixelated regions (for example, separated in the thickness direction of the film-based lightguides). In one embodiment, the colors of the first and second pixelated light emitting regions are perceived by a viewer with a visual acuity of 1 arcminute without magnification at a distance of two times the diagonal (or diameter) of the light emitting region to be the additive color of the combination of sub-pixels. For example, in one embodiment, the color in different spatial regions of the display is spatially controlled to achieve different colors in different regions, similar to liquid crystal displays using red, green, and blue pixels and LED signs using red green and blue LEDs grouped together. For example, in one embodiment, a light emitting device comprises a red light emitting lightguide optically coupled to a green light emitting lightguide that is optically coupled to a blue lightguide. Various regions of the lightguides and the light output of this embodiment are described hereafter. In a first light emitting region of the light emitting device, the blue and green lightguides have no light extraction features and the red lightguide has light extraction features such that the first light emitting region emits red in one or more directions (for example, emitting red light toward a spatial light modulator or out of the light emitting device). In a second light emitting region of the light emitting device, the red and green lightguides have no light extraction features and the blue lightguide has light extraction features such that the second light emitting region emits blue light in one or more directions. In a third light emitting region of the light emitting device, the blue and red lightguides have light extraction features and the green lightguide does not have any light extraction features such that the third light emitting region emits purple light in one or more directions. In a fourth light emitting region of the light emitting device, the blue, green, and red lightguides have light extraction features such that the fourth light emitting region emits white light in one or more directions. Thus, by using multiple lightguides to create light emitting regions emitting light in different colors, the light emitting device, display, or sign, for example, can be multi-colored with different regions emitting different colors simultaneously or sequentially. In another embodiment, the light emitting regions comprise light extraction features of appropriate size and density on a plurality of lightguides such that a full-color graphic, image, indicia, logo or photograph, for example, is reproduced.

The percentage of extracted light from a first lightguide light extraction feature reaching a neighboring second light extraction feature on a second lightguide is affected by, for example, the distance within the first lightguide between the light extraction feature and the cladding surface in the direction of the optical path between the first and second light extraction features, the total separation between the light extraction features in the optical path of the light between the first and second light extraction features, the distance in the cladding of the optical path between the first and second light extraction features, the refractive index of the first lightguide, the refractive index of the cladding, the distance in the optical path from the cladding surface to the second light extraction feature, the refractive index of the second lightguide, and the directional reflectance (or transmission) properties of the first lightguide light extraction feature. In one embodiment, the percentage of light exiting a first lightguide from a first light pixel region that intersects a second pixel region in a second lightguide is less than one selected from the group: 30%, 20%, 10%, 5%, and 1%. The amount of light from a first lightguide reaching a neighboring pixel on a second lightguide is affected by the thickness of the lightguide, the total separation in the thickness direction, the refractive index of the first lightguide, the refractive index of the cladding, and the directional reflectance (or transmission) properties of the first lightguide light extraction feature. Light near the critical angle within the lightguide will propagate longer distances in the thickness direction in the cladding region than angles larger than the critical angle. In one embodiment, the cladding region thickness is less than one selected from the group: 50, 25, 10, 5, 3, 2, and 1 micron(s). In another embodiment, the thickness of the core region is less than one selected from the group: 50, 25, 10, 5, 3, 2, and 1 micron(s). The lateral separation, $x_1$, of the light from the edge of a first light extraction feature on the surface of a first lightguide of refractive index $n_1$ and thickness $t_1$ propagating within the lightguide at the critical angle between the first lightguide and a cladding region with a refractive index, $n_2$, to the point where it reaches the interface between the first lightguide and the cladding is:

$$x_1 = \frac{t_1\left(\frac{n_2}{n_1}\right)}{\sqrt{1-\left(\frac{n_2}{n_1}\right)^2}}.$$

In one embodiment, the lateral separation between the first pixel in a first lightguide and a second pixel in a second lightguide is greater than one selected from the group: 50%, 60%, 70% and 80% of $x_1$ and less than one selected from the group: 150%, 200%, 250%, 300%, 400%, and 500% of $x_1$. For example, in one embodiment, the light extraction feature on a first lightguide is a first printed white ink pattern on the back side of a film-based lightguide with a refractive index of 1.49 that is 50 microns thick. A second printed white ink pattern on a second lightguide separated by and optically coupled to the first lightguide by a 25 micron cladding region with a refractive index of 1.33 is laterally positioned (in the direction parallel to the film surface) from the first printed white region by a distance of 100 microns. In this example, $x_1$ is 99 microns and the separation distance is 101% of $x_1$.

In another embodiment, the light extraction feature is a directional light extraction feature that asymmetrically redirects incident light and the lateral separation between the first pixel in a first lightguide and a second pixel in a second lightguide is greater than one selected from the group: 20%, 30%, 40% and 50% of $x_1$ and less than one selected from the group: 100%, 150%, 200%, and 300% of $x_1$.

In another embodiment, the dimension of the light extraction feature in the direction of the optical axis within the lightguide for one pixel is less than one selected from the group: 200%, 150%, 100%, 75%, and 50% of the average thickness of the lightguide in that region.

In a further embodiment, a first pixel on a first lightguide is separated laterally from a second pixel on a second lightguide by a first separation distance such that the angular color variation within the angles defined by a luminance of at least 70% of the luminance at 0 degrees, $\Delta u'v'$, of the pixel measured on the 1976 u', v' Uniform Chromaticity Scale as described in VESA Flat Panel Display Measurements Standard version 2.0, Jun. 1, 2001 (Appendix 201, page 249) is less than one selected from the group: 0.2, 0.1, 0.05, 0.01, and 0.004 when measured using a spectrometer based spot color meter.

In one embodiment, the light emitting device is a reflective display comprising a light emitting frontlight comprising a first lightguide comprising a first set of light extraction features and a second lightguide comprising a second set of light extraction features wherein the percentage of the area of overlap between the areas of the first set of light extraction features in the plane parallel to the first lightguide and the areas of the second set of light extraction features in the plane parallel to the second lightguide in the direction substantially normal to the light emitting surface of the reflective display is less than one selected from the group: 80%, 60%, 40%, 20%, 10%, 5%, and 2%. Similarly, in another embodiment, the area of overlap between three sets of light extraction features in three different lightguides is less than one selected from the group: 80%, 60%, 40%, 20%, 10%, 5%, and 2% for each combination of lightguides. For example, in one embodiment, a reflective display comprises a first, second, and third lightguide emitting red, green, and blue light, respectively, from LEDs with the first lightguide on the viewing side of the second lightguide and separated by a cladding layer from the second lightguide which is separated by a cladding layer from the third lightguide that is disposed proximate the reflective spatial light modulator. In this embodiment, the area of overlap between the light extraction features in the lightguide emitting red light and the lightguide emitting green light when viewed normal to the display is less than 10%. Also, in this embodiment, the area of overlap between the light extraction features in the lightguide emitting red light and the lightguide emitting blue light when viewed normal to the display is less than 10%. In this embodiment, the red light directed toward the reflective spatial light modulator from the lightguide emitting red light is less likely to reflect from light extraction features in the green or blue lightguides than a lightguide configuration with a larger percentage of light extraction feature area overlap.

Lightguide Folding Around Components

In one embodiment, at least one selected from the group: lightguide, lightguide region, light mixing region, plurality of lightguides, coupling lightguides, and light input coupler bends or folds such that the component other components of the light emitting device are hidden from view, located behind another component or the light emitting region, or are partially or fully enclosed. These components around which they may bend or fold include components of the light emitting device such as light source, electronics, driver, circuit board, thermal transfer element, spatial light modulator, display, housing, holder, or other components disposed behind the folded or bent lightguide or other region or component. In one embodiment, a backlight for a reflective display or backlight for a transmissive display comprises a lightguide, coupling lightguides and a light source wherein one or more regions of the lightguide are folded and the light source is disposed substantially behind the display. In one embodiment, more than one input coupler or component is folded behind or around the lightguide, light mixing region or light emitting region. In this embodiment, for example, two light input couplers from opposite sides of the light emitting region of the same film may be disposed adjacent each other or utilize a common light source and be folded behind the spatial light modulator of a display. In another embodiment, tiled light emitting devices comprise light input couplers folded behind and adjacent or physically coupled to each other using the same or different light sources. In one embodiment, the light source or light emitting area of the light source is disposed within the volume bounded by the edge of the light emitting region and the normal to the light emitting region on the side of the lightguide opposite the viewing side. In another embodiment, at least one of the light source, light input coupler, coupling lightguides, or region of the light mixing region is disposed behind the light emitting region (on the side of the lightguide opposite the viewing side) or within the volume bounded by the edge of the light emitting region and the normal to the light emitting region on the side of the lightguide opposite the viewing side.

Curled Edge of Lightguide to Recycle Light

In one embodiment, a lightguide edge region is curled back upon itself and optically coupled to a region of the lightguide such that light propagating toward the edge will follow the curl and propagate back into the lightguide. In one embodiment, the cladding area is removed from the lightguide from both surfaces which are to be optically coupled or bonded together. More than one edge may be curled or bent back upon itself to recycle light back into the lightguide.

Registration Holes and Cavities

In one embodiment, at least one selected from the group: lightguide, lightguide region, light mixing region, light input coupler, housing, holding device and plurality of coupling lightguides comprises at least one opening or aperture suitable for registration with another component of the device that contains at least one pin or object which may pass through the at least one opening or aperture. In another embodiment, one or more of the light turning optical element, coupling lightguides, light redirecting optical element, light coupling optical element, relative position maintaining element, circuit board, flexible connector, film-based touchscreen, film-based lightguide, and display film substrate comprises a registration opening, aperture, hole, or cavity.

Alignment Guide

In another embodiment, the light turning optical element has an alignment guide physically coupled to the light turning optical element such that the guide directs the coupling lightguide input surfaces to align in at least one of the following directions: a direction perpendicular to the film surface of the coupling lightguides, a direction parallel to the coupling lightguide film surfaces, a direction parallel to the optical axis of the light source, and a direction orthogonal to the optical axis of the light source. In one embodiment, the alignment guide is physically coupled to one or more the following: the light turning optical element, coupling lightguides, light redirecting optical element, light coupling optical element, relative position maintaining element, circuit board, light source, light source housing, optical element holder or housing, input coupler housing, alignment mechanism, heat sink for the light source, flexible connector, film-based touchscreen, film-based lightguide, and display film substrate. In one embodiment, the alignment guide comprises an alignment arm such as a metal or plastic bar or rod with a flexural modulus of one of the following: 2 times, 3 times, 4 times, and 5 times that of the stacked array of coupling lightguides that it is disposed to guide a stack of coupling lightguides (or an optical element) in a predetermined direction. The alignment guide may have one or more curved regions to assist in the guiding function without scratching or damaging the coupling lightguide through sharp edges. In another embodiment, the alignment guide is a cantilever spring that can apply a force against one or more coupling lightguides to maintain the position of the coupling lightguide temporarily or permanently. In another embodiment, the alignment guide maintains the relative position of the coupling lightguide near the light input surface while an additional, permanent relative position method is employed (such as mechanically clamping, adhering using adhesives, epoxy or optical adhesive, forming a housing around the coupling lightguides, or inserting the coupling into a housing) which substantially maintains the relative position of the coupling lightguides to the light source or light input coupler. In another embodiment, a cladding layer (such as a low refractive index adhesive) is disposed on one or more of the following: the top surface, bottom surface, lateral edges, and light input surface of an array of coupling lightguides such that when the alignment guide is thermally coupled to the array of coupling lightguides, less light is absorbed by the alignment guide.

Alignment Cavity within the Alignment Guide

In one embodiment, the alignment guide comprises a cavity within a mechanical coupler in which a stacked array of coupling lightguides may be disposed to align their light input edges to receive light from a light source. In one embodiment, the alignment guide comprises a thermal transfer element with an extended arm or rod to align the coupling lightguides in one dimension, apply force vertical force to the coupling lightguides to assist holding them at the correct lateral position and a cavity into which the input surface of the coupling lightguides may be placed such that they are aligned to receive light from the light source. In another embodiment, the alignment guide comprises a thermal transfer element with an extended arm (functioning as a cantilever spring to apply force) and a cavity with a cross sectional vertical and width dimension at least as large as the vertical and width dimensions, respectively, of the cross-section of the stacked array of coupling lightguides near their light input surfaces.

Thermally Conductive Alignment Guide

In another embodiment, the alignment guide is thermally and physically coupled to the heat sink for the light source. For example, the alignment guide may comprise an aluminum heat sink disposed around and thermally coupled to the light source with an alignment cavity opening disposed to receive the coupling lightguide such that they are held within the cavity. In this embodiment, the aluminum heat sink serves an alignment function and also reduces the heat load from the light source. In another embodiment, the alignment guide comprises an alignment cavity in a thermally conducting material (such as a metal, aluminum, copper, thermally conductive polymer, or a compound comprising thermally conductive materials) thermally coupled to the coupling lightguides such that the alignment guide removes heat from the coupling lightguides received from the light source. When using high power LEDs, for example, the heat from the light source could potentially damage or cause problems with the coupling lightguides (softening, thermal or optical degradation, etc.). By removing the heat from the coupling lightguides, this effect is reduced or eliminated. In one embodiment, the alignment guide is thermally coupled to one or more coupling lightguides by physical contact or through the use of an intermediate thermally conductive material such as a thermally conductive adhesive or grease.

Other Components

In one embodiment, the light emitting device comprises at least one selected from the group: power supply, batteries (which may be aligned for a low profile or low volume device), thermal transfer element (such as a heat sink, heat pipe, or stamped sheet metal heat sink), frame, housing, heat sink extruded and aligned such that it extends parallel to at least one side of the lightguide, multiple folding or holding modules along a thermal transfer element or heat sink, thermal transfer element exposed to thermally couple heat to a surface external to the light emitting device, and solar cell capable of providing power, communication electronics (such as needed to control light sources, color output, input information, remote communication, Wi-Fi control, Bluetooth control, wireless internet control, etc.), a magnet for temporarily affixing the light emitting device to a ferrous or suitable metallic surface, motion sensor, proximity sensor, forward and backwards oriented motion sensors, optical feedback sensor (including photodiodes or LEDs employed in reverse as detectors), controlling mechanisms such as switches, dials, keypads (for functions such as on/off, brightness, color, color temp, presets (for color, brightness, color temp, etc.), wireless control), externally triggered switches (door closing switch for example), synchronized switches, and light blocking elements to block external light from reaching the lightguide or lightguide region or to block light emitted from a region of the light emitting device from being seen by a viewer.

In one embodiment, the light emitting device is designed to be powered by an automobile's electrical system or a 12-volt DC power battery or power supply. For example, in one embodiment, the light emitting device is a luminous sign disposed on the side of a bus that displays a graphic image and text in light emitting regions. In on embodiment, the light emitting device comprises a cigarette lighter adapter disposed to be placed in an automobile or an airline power outlet. In one embodiment, a light emitting device comprises batteries with a dimension longer in one direction than another (such as AA or AAA batteries) and the longer dimension is disposed substantially parallel to an edge of the lightguide, the light input coupler, or a housing or enclosure of the coupling lightguides. In this embodiment, the form factor and volume required can be reduced by aligning the batteries with the appropriate edge, housing, or other enclosure or element. In this embodiment, for example, the enclosure comprising the batteries may enclose the batteries and coupling lightguides or strips (and optionally the light source). In one embodiment, the light emitting device comprises a light source disposed to emit light into a first range of angles and a second range of angles such that light from the first range of angles provides illumination and the light from the second range of angles is optically coupled into the light input surface, into coupling lightguides, propagates through a lightguide, and is emitted in a light emitting region to provide illumination or display a sign, graphic, image or other indicia. For example, in one embodiment, a light fixture comprises a light source such as a linear array of LEDs directing light upwards and a light input surface disposed to receive light propagating with a component upwards and direct the light through coupling lightguides to a light emitting region disposed on the underside of the light fixture. In this embodiment, for example, a linear pendant luminaire can direct light upwards and provide illumination directly downwards using the lightguide film and coupling lightguides. Similarly, a wall washing light fixture that directs light upwards may emit light horizontally or downwards using the coupling lightguides and lightguide to redirect an angular range of the light output of the light source into the lightguide and out of the lightguide in a different angular range.

Motion Sensor

In another embodiment, the light emitting device comprises a motion sensor. Types of motion sensors include passive infrared sensors, active infrared sensors, ultrasonic motion sensors, and microwave motion sensors. In one embodiment, the motion sensor is disposed to receive radiation passing through the film-based lightguide or from within the film-based lightguide (such as when exterior light is redirected into the lightguide by the light extraction features and propagates through the lightguide to reach the motion sensor). In another embodiment, movement detected by the motion sensor triggers the light emitting device to change the light output characteristics. In one embodiment, the light emitting device changes its light emitting characteristics by one or more selected from the group: emitting light in one or more light emitting regions, stopping emitting light in one or more light emitting regions, changing the overall light flux output (increase or decrease by an amount) in one or more light emitting regions, changing the angular light output profile in one or more light emitting regions, changing the color of the light output in one or more light emitting regions. For example, in one embodiment, the motion sensor triggers the light emitting device to turn on. In another example, the motion sensor triggers the light emitting device to pulse one LED off and on for a flashing logo in a first light emitting region while maintaining the light output of a second LED at a constant visible light output level in a second light emitting region.

In a further embodiment, the coupling lightguides extend past one or more edges of the light emitting region of the lightguide such that the input surface of the coupling lightguide may be disposed to receive light from an external light source. For example, in one embodiment, a sign for an automobile comprises coupling lightguides that may be extended to receive light from a headlight, turn light, reverse light, taillight, or other light on an automobile. In this embodiment, the coupling lightguides may be disposed at or near the light output of the light source (or lens covering the light emitting area) such that a portion of the light is coupled into the lightguide and exits the lightguide in a light emitting region. For example, in one embodiment, a light input surface of an array of coupling lightguides comprises an adhesive that can be used to optically couple the light input surface to the lens of a taillight for an automobile. In this embodiment, the red light from the taillight provides the light source for the light emitting region. In another embodiment, the light input surface of the coupling lightguides are disposed to receive light from a light source disposed in a flashlight such that the case comprises a light emitting region in the form of illuminated logo, indicia, or graphics. In another embodiment, the light input coupler is disposed to receive light from a light source and transmit the light through coupling lightguide into a larger light emitting area such as to provide a lower luminance level light output spread over a larger light emitting area. For example, in one embodiment, the light input coupler is disposed to receive light directed upwards from a light source in a lamp and direct the light through coupling lightguides to the light emitting region disposed in the "lamp shade". In this embodiment, the light is transmitted through the lightguide and exits the shade directly (in embodiments when the light emitting region is on the outer portion of the "lamp shade") without being absorb by propagating through the light absorbing material of the lamp shade. In this embodiment, the lightguide may be disposed within, on the inner surface, or on the outer surface of a lamp shade. In another embodiment, the lightguide provides light diffusing properties (such as a volumetric diffusion layer, surface relief diffusing layer, or printed diffuser layer) to reduce the glare of the light source and comprises light emitting regions that receive light from the light source through coupling lightguides.

In another embodiment, the light emitting device provides light output in a shade or patterned region that is different that the light exiting out of a neighboring region. For example, in one embodiment, the film-based lightguide emits light in a green and red flower pattern while the light transmitting through the shade (from a standard Edison type incandescent light bulb disposed in the lamp, for example) is a second color such as warm white. In one embodiment, a low light transmitting region is disposed between the light emitting region and a light emitting region of external light incident on the light emitting region such that the saturation of the light emitted from the light emitting region is increased. For example, in one embodiment, a table lamp with an incandescent light source disposed within comprises a luminous lamp shade of with a lightguide film disposed to emit blue light from white ink light extraction features in the form of a blue logo and a black ink overprinted on the white ink light extraction features increases the color saturation over the light extraction region without the low light transmitting region.

In another embodiment, the color of the light emitting region forms a visible pattern with a luminance contrast ratio greater than 2 than the surrounding area (such as the area on a lamp shade) when the light lamp and light emitting source are turned off and it is illuminated with 50 lux of diffuse ambient light from a Standard A illuminant. In a further embodiment, the color contrast of the light emitting region when the light emitting device is not emitting light (and the lamp is not emitting light in the case of a luminous lampshade) when illuminated with 50 lux of diffuse ambient light from a Standard A illuminant, $\Delta u'v'$, is greater than 0.004. In embodiments disclosed herein, the "light emitting region" is the region which emits light when the light emitting device light source is turned on, and for embodiments and references where the light source is turned off, is the same physical region bounded by the light extraction features that will emit light when the light source is turned on.

In one embodiment, a light emitting device comprises a first set of light sources comprising a first and second light source disposed to couple light into a first and second light input coupler, respectively, and further comprising a second set of light sources comprising a third and fourth light source disposed to couple light into a first and second light input coupler, respectively, wherein the first set of light sources are thermally coupled to each other and the second set of light sources are thermally coupled to each other by means of one selected from the group metal core printed circuit board, aluminum component, copper component, metal alloy component, thermal transfer element, or other thermally conducting element. In a further embodiment, the first and second set of light sources are substantially thermally isolated by separating the light sources (or substrates for the light sources such as a PCB) in the region proximate the light sources by an air gap or substantially thermally insulating material such as polymer substantially free of metallic, ceramic, or thermally conducting components. In another embodiment, the first and third light sources are disposed closer to each other than the first and second light sources and more heat from the first light source reaches the second light source than reaches the third light source when only the first light source is emitting light. More than two light sources disposed to couple light into more than two coupling lightguides may be thermally coupled together by a thermal transfer element and may be separated from a second set of more than two light sources by an air gap or thermally insulating material.

In another embodiment, a light emitting device comprises a film lightguide that emits light and detects light changes within the lightguide and provides touch screen functionality. In one embodiment, a film lightguide comprises coupling lightguides disposed to receive light from a light source and direct the light into a lightguide to provide a backlight or frontlight and at least one coupling lightguide disposed to detect changes in light intensity (such as lower light levels due to light being frustrated and absorbed by coupling light into a finger in touched location). More than one light intensity detecting lightguide may be used. Other configurations for optical lightguide based touch screens are known in the art and may be used in conjunction with embodiments.

In another embodiment, a touchscreen comprises at least two film lightguides. In another embodiment, a touchscreen device comprises a light input coupler used in reverse to couple light from a film lightguide into a detector. In another embodiment, the light emitting device or touch screen is sensitive to pressure in that when a first film or first lightguide is pressed or pressure is applied, the first film is moved into sufficient optical contact with a second film or second lightguide wherein at least one of light from the first lightguide or first lightguide is coupled into is coupled into the second film or second lightguide, light from the second film or second lightguide is coupled into the first film or first lightguide, or light couples from each lightguide or film into the other.

Thermal Transfer Element Coupled to Coupling Lightguide

In another embodiment, a thermal transfer element is thermally coupled to a cladding region, lightguide region, lightguide, coupling lightguide, stack or arrangement of coupling lightguides, combination of folded regions in a coupling lightguide, input coupler, window or housing component of the light input coupler, or housing. In another embodiment, the thermal transfer element is thermally coupled to the coupling lightguides or folded regions of a coupling lightguide to draw heat away from the polymer based lightguide film in that region such that a high-power LED or other light source emitting heat toward the lightguides may be used with reduced thermal damage to the polymer. In another embodiment, a thermal transfer element is physically and thermally coupled to the cladding region of the light input couplers or folded regions of a coupling lightguide. The thermal transfer element may also serve to absorb light in one more cladding regions by using a thermal transfer element that is black or absorbs a significant amount of light (such as having a diffuse reflectance spectral component included less than 50%). In another embodiment, the top surface of the upper coupling lightguide and the bottom surface of the bottom coupling lightguide comprise cladding regions in the regions of the coupling lightguides or folded regions of the coupling lightguide near the light input edges. By removing (or not applying or disposing) the cladding between the coupling lightguides or folded regions, more light can be coupled into the coupling lightguides or folded regions from the light source. Outer cladding layers or regions may be disposed on the outer surfaces to prevent light absorption from contact with other elements or the housing, or it may be employed on the top or bottom surface, for example, to physically and thermally couple the cladding region to a thermal transfer element to couple the heat out without absorbing light from the core region (and possibly absorbing light within the core region).

In one embodiment, a light emitting device comprises a thermal transfer element disposed to receive heat from at least one light source wherein the thermal transfer element has at least one selected from the group: total thickness, average total thickness, and average thickness, all in the direction perpendicular to the light emitting device light emitting surface less than one selected from the group: 10 millimeters, 5 millimeters, 4 millimeters, 3 millimeters, 2 millimeters, 1 millimeter, and 0.5 millimeters. In one embodiment, the thermal transfer element comprises a sheet or plate of metal disposed on the opposite side of the lightguide as the light emitting surface of the light emitting device. In a further embodiment, a low thermal conductivity component is disposed between the thermal transfer element and the lightguide. In another embodiment, the low thermal conductivity component has a thermal conductivity, k, less than one selected from the group: 0.6, 0.5, 0.4, 0.3, 0.2, 0.1 and 0.05 W·m−1·K−1 at a temperature of 296 degrees Kelvin. In a further embodiment, the low thermal conductivity component is a white reflective polyester based film (or PTFE based film). In a further embodiment, a light emitting device comprises a low thermal conductivity component physically coupled to the thermal transfer element and the light emitting device further comprises at least one selected from the group: a low refractive index material, a cladding region, and a region with an air gap disposed between the low thermal conductivity component and the lightguide.

In a further embodiment, the thermal transfer element is an elongated component with a dimension in first direction at least twice as long as the dimension in either mutually orthogonal direction orthogonal to the first direction wherein a portion of the thermal transfer element is disposed within the bend region of at least one light input coupler. In another embodiment, a light emitting device comprises a light input coupler wherein a portion of the smallest rectangular cuboid comprising all of the coupling lightguides within the light input coupler comprises a thermal transfer element. In another embodiment, a light emitting device comprises a light input coupler wherein a portion of the smallest rectangular cuboid comprising all of the coupling lightguides within the light input coupler comprises an elongated thermal transfer element selected from the group: pipe from a heat pipe, elongated heat sink, metal thermal transfer element with fins, rod inside the thermal transfer element, and metal frame.

In another embodiment, the thermal transfer element comprises at least one metal frame component or elongated metal component that provides at least one selected from the group: increased rigidity, frame support for suspension or mounting, protection from accidental contact, and frame support for a flat or pre-defined non-planar surface. In a further embodiment, the thermal transfer element comprises at least two regions or surfaces oriented at an angle with respect to each other or an opening through the volume that form at least a portion of a channel through which air may flow through. In one embodiment, the light emitting device comprises a plurality of air channels formed by at least one surface of the thermal element through which air flows and convects heat away by active or passive air convection from the source generating the heat (such as a light source or a processor). In one embodiment, the light emitting device comprises a plurality of air channels along vertically oriented sides of the device through which air flows and convects heat through (naturally or forced air). In another embodiment, the thermal transfer element has a thermal conductivity greater than one selected from group of 0.5, 0.7, 1, 2, 5, 10, 50, 100, 200, 300, 400, 800, and 1000 W·m−1·K−1 at a temperature of 296 degrees Kelvin.

Other Optical Films

In another embodiment, the light emitting device further comprises a light redirecting optical film, element, or region that redirects light incident at a first range of angles, wavelength range, and polarization range into a second range of angles different than the first.

Light Redirecting Optical Element

In one embodiment, the light redirecting optical element is disposed between at least one region of the light emitting region and the outer surface of the light emitting device (which may be a surface of the light redirecting optical element). In a further embodiment, the light redirecting optical element is shaped or configured to substantially conform to the shape of the light emitting region of the light emitting device. For example, a light emitting sign may comprise a lightguide film that is substantially transparent surrounding the light emitting region that is in the shape of indicia; wherein the lightguide film comprises light extraction features in the region of the indicia; and a light redirecting optical element (such as a film with substantially hemispherical light collimating surface features) cut in the shape of the light emitting region is disposed between the light emitting region of the lightguide film and the light emitting surface of the light emitting device. In another embodiment, a light emitting sign comprises a film-based lightguide and a light redirecting optical element comprising a lens array formed from lenticules or microlenses (such as substantially hemispherical lenses used in integral images or 3D integral displays or photographs) disposed to receive light from the lightguide wherein the lens array separates light from the lightguide into two or more angularly separated images such that the sign displays stereoscopic images or indicia. The shape of the lens array film or component in the plane parallel to the lightguide film may be substantially conformal to the shape of the light emitting region or one or more sub-regions of the light emitting regions such that sign emits angularly separated information in the entire light emitting region or one or more sub-regions of the light emitting region. For example, the sign may have a first two-dimensional text region and a second region with a stereoscopic image.

In one embodiment, the light redirecting optical film, element or region comprises at least one surface or volumetric feature selected from the group: refractive, prismatic, totally internally reflective, specular reflective element or coating, diffusely reflective element or coating, reflective diffractive optical element, transmissive diffractive optical element, reflective holographic optical element, transmissive holographic optical element, reflective light scattering, transmissive light scattering, light diffusing, multi-layer anti-reflection coating, moth-eye or substantially conical surface structure type anti-reflection coating, Giant Birefringent Optic multilayer reflection, specularly reflective polarizer, diffusely reflective polarizer, cholesteric polarizer, guided mode resonance reflective polarizer, absorptive polarizer, transmissive anisotropic scattering (surface or volume), reflective anisotropic scattering (surface or volume), substantially symmetric or isotropic scattering, birefringent, optical retardation, wavelength converting, collimating, light redirecting, spatial filtering, angular dependent scattering, electro-optical (PDLC, liquid crystal, etc.), electrowetting, electrophoretic, wavelength range absorptive filter, wavelength range reflective filter, structured nano-feature surface, light management components, prismatic structured surface components, and hybrids of two or more of the aforementioned films or components.

Some examples of light redirecting optical films with prismatic structured surfaces may include, but are not limited to, Vikuiti™ Brightness Enhancement Film (BEF I, BEF II, BEF III, BEF III 90/50 5T, BEF III 90/50 M, BEF III 90/50 M2, BEF III 90/50 7T, BEF III 90/50 10T, BEF III 90/50 AS), Vikuiti™ Transparent Right Angle Film (TRAF), Vikuiti™ Optical Lighting Film (OLF or SOLF), IDF II, TRAF II, or 3M™ Diamond Grade™ Sheeting, all of which are available from 3M Company, St. Paul, Minn. Other examples of light management component constructions may include the rounded peak/valley films described in U.S. Pat. Nos. 5,394,255 and 5,552,907 (both to Yokota et al.), Reverse Prism Film from Mitsubishi Rayon Co., Ltd or other totally internally reflection based prismatic film such as disclosed in U.S. Pat. Nos. 6,746,130, 6,151,169, 5,126, 882, and 6,545,827, lenticular lens array film, microlens array film, diffuser film, microstructure BEF, nanostructure BEF, Rowlux microlens film from Rowland Technologies, films with arrangements of light concentrators such as disclosed in U.S. Pat. No. 7,160,017, and hybrids of one or more of the aforementioned films.

In another embodiment, the light emitting device further comprises an angularly selected light absorbing film, element or region. Angularly selective light absorbing films may substantially transmit light within a first incident angular range and substantially absorb light within a second incident angular range. These films can reduce glare light, absorb undesired light at specific angles (such as desired in military applications where stray or unwanted light can illuminate parts of the cockpit or the windshield causing stray reflections. Louver films, such as those manufactured by skiving a multi-layered material at a first angle are known in the display industry and include louver films such as 3M™ Privacy Film by 3M Company and other angular absorbing or redirecting films such as those disclosed in U.S. Pat. Nos. 7,467,873; 3,524,789; 4,788,094; and 5,254,388.

Light Reflecting Film

In another embodiment, a light emitting device comprises a lightguide disposed between a light reflecting film and the light emitting surface of the light emitting device. In one embodiment, the light reflecting film is a light reflecting optical element. For example, a white reflective polyester film of at least the same size and shape of the light emitting region may be disposed on the opposite side of the lightguide as the light emitting surface of the light emitting device or the light reflecting region may conform to the size and shape of one or all of the light emitting regions, or the light reflecting region may be of a size or shape occupying a smaller area than the light emitting region. A light reflecting film or component substantially the same shape as the light emitting region or region comprising light extracting features may maintain the transparency of the light emitting device in the regions surrounding or between the light emitting regions or regions comprising light extracting features while increasing the average luminance in the region on the light emitting surface of the light emitting device by at least one selected from the group: 20%, 30%, 40%, 50%, 60%, 70%, 80%, 90%, 100%, and 110% by reflecting a portion of the light received toward the light emitting surface.

Angular Broadening Element

In a further embodiment, a light emitting device comprises: a light redirecting element disposed to collimate or reduce the angular FWHM of the light from the lightguide; a spatial light modulator; and an angular broadening element (such as a diffuser or light redirecting element) disposed on the viewing side of the spatial light modulator to increase the angular FWHM of the light exiting the spatial light modulator. For example, light may be collimated to pass through or onto pixels or sub-pixels of a spatial light modulator and the light may then angularly broadened (increase the angular FWHM) to increase the angle of view of the device. In a further embodiment, the angular broadening element is disposed within or on a component of the spatial light modulator. For example, a diffuser may be disposed between the outer glass and the polarizer in a liquid crystal display to broaden the collimated or partially collimated light after it has been spatially modulated by the liquid crystal layer. In a further embodiment, the light emitting device may further comprise a light absorbing film, circular polarizer, microlens type projection screen, or other rear projection type screen to absorb a first portion of the ambient light incident on the light emitting surface to improve the contrast.

Extracting Light from the Cladding

In one embodiment, a cladding region is disposed on or optically coupled to a core region of a lightguide and comprises a light extracting region operatively coupled to the cladding region on the side of the first cladding region opposite the lightguide that extracts light from the cladding region. Operatively coupling the light extracting region to the cladding region or a light extraction feature to a region includes, without limitation: adding, removing, or altering material on the surface of the cladding region or within the volume of the cladding region; disposing a material on the surface of the cladding region or within the volume of the cladding region; applying a material on the surface of the cladding region or within the volume of the cladding region; printing or painting a material on the surface of the cladding region or within the volume of the cladding region; removing material from the surface of the cladding region or from the volume of the cladding region; modifying a surface of the cladding region or region within the volume of the cladding region; stamping or embossing a surface of the cladding region or region within the volume of the cladding region; scratching, sanding, ablating, or scribing a surface of the cladding region or region within the volume of the cladding region; forming a light extracting region on the surface of the cladding region or within the volume of the cladding region; bonding a material on the surface of the cladding region or within the volume of the cladding region; adhering a material to the surface of the cladding region or within the volume of the cladding region; optically coupling the light extracting region to the surface of the cladding region or volume of the cladding region; optically coupling or physically coupling the light extracting region to the cladding region by an intermediate surface, layer or material disposed between the light extracting region and the cladding region; such that a portion of light propagating within the cladding region incident on the light extracting region will exit the cladding region or be re-directed to an angle smaller than the critical angle such that it does not remain within the cladding region, core region, coupling lightguide, lightguide, or other region through which it is propagating by total internal reflection.

In one embodiment, by extracting light from the cladding region, other layers or objects (such as fingers or dust) in contact with the cladding region or a region optically coupled to the cladding region in the light emitting area of a display do not frustrate or extract light from the cladding causing reduced luminance contrast or poor display or sign visibility. In one embodiment, the light is extracted from the cladding by absorbing light from the cladding or scattering light directly within the cladding or on an outer surface of the cladding (the surface opposite the core region) or indirectly within or on an outer surface of a film or region optically coupled to the outer surface of the cladding. The scattered method of extracting light from the cladding scatters a portion of the incident light such that it is redirected into angles that do not totally internally reflect within the cladding region or a region optically coupled to the cladding region opposite the core region. For example, in one embodiment, the outer surface of a cladding region is roughened or comprises surface relief features that extract light propagating in the cladding. In another embodiment, a layer or region is optically coupled to the cladding region that comprises a light extracting region. For example, in one embodiment, a black PET film is optically coupled to the core region of a lightguide using a pressure sensitive adhesive that functions as the cladding in the region. In one embodiment, light propagating in a coupling lightguide at a first angle from the total internal reflection interface is propagating at a larger angle after the fold in the coupling lightguide and is extracted from the first cladding region by the light extracting region.

Light Absorbing or Scattering Region or Layer

In one embodiment, at least one selected from the group: cladding, adhesive, layer disposed between the lightguide or lightguide region and the outer light emitting surface of the light emitting device, patterned region, printed region, and extruded region on one or more surfaces or within the volume of the film comprises a light absorbing material which absorbs a first portion of light in a first predetermined wavelength range. In one embodiment, a light absorbing region is a black or light absorbing ink coated on the cladding layer or a light absorbing material such as a black PET film optically coupled using an adhesive to a cladding layer on a core layer of a lightguide in the light mixing region.

In one embodiment, the light absorbing region or layer is optically coupled to a cladding region on one or more regions selected from the group: the coupling lightguide regions, the light mixing regions, and the light emitting regions. In this embodiment, the light absorbing region can absorb a first portion of the light within the cladding to which it is optically coupled. In one embodiment, the first portion of the light absorbed is greater than one selected from the group: 5%, 10%, 20%, 30%, 40%, 50%, 60%, 70%, 80%, 90%, and 95%. In one embodiment, the light propagating in the cladding is substantially absorbed by the light absorbing region. In one embodiment, the light absorbing region further comprises a light scattering material that scatters a portion of the light propagating within the first cladding region into angles such that it is extracted from the first cladding region or reflects light at an angle less than the critical angle for the first cladding region, a second cladding region at the surface opposite the lightguide, or the core region of the lightguide. In one embodiment, the light absorbing region comprises a white ink or material that absorbs a small portion of light and reflectively scatters a larger portion of light than it absorbs. In another embodiment, a light scattering region or layer is within the volume of, optically coupled to, or forms the outer surface of a region of the cladding in one or more regions selected from the group: a coupling lightguide region, a light mixing region, a lightguide region, and a light emitting region. In this embodiment, the light propagating within the cladding can be extracted substantially before the light emitting region (or an area of interest in the light emitting region) by scattering it out of the cladding region. Removing the light propagating within the cladding, for example, may be desired in frontlight applications where fingerprints, smudges, oil, residue, dust, and scratches in the cladding or outer surface may be illuminated or visible due to the light propagating within the cladding when the light source is emitting light. The light propagating through the cladding can propagate through the lightguide at an angle less than the critical angle for the core region and cladding region interface. Light propagating at angles in the core region at or above the critical angle can penetrate into the cladding in an evanescent region. In one embodiment, less than 10% of the evanescent light from the light propagating in the lightguide that totally internally reflects at the cladding region interface extends into the light absorbing region. Placing a light absorbing region to close to the interface (such as less than 500 nm) between the core region and cladding region can absorb a significant portion of light propagating within the core region at angles larger than the critical angle due to the evanescent penetration into the light absorbing region and reduce the light flux reaching the light emitting region and exiting the light emitting device. In another embodiment, the light absorbing region is, on average, greater than one selected from the group: 0.5, 1, 1.5, 2, 2.5, and 3 microns away from the interface between the core regions and the cladding regions.

In one embodiment, the first predetermined wavelength range includes light from 300 nm to 400 nm and the region absorbs UV light that could degrade or yellow the lightguide region, layer or another region or layer. In one embodiment, the cladding region is disposed between the light absorbing region and the lightguide such that the light propagating through the lightguide and the evanescent portion of the light propagating within the lightguide is not absorbed due to the absorbing region since it does not pass through the absorbing region unless it is extracted from the lightguide. In another embodiment, the light absorbing region or layer is an arrangement of light absorbing, light fluorescing, or light reflecting and absorbing regions which selectively absorb light in a predetermine pattern to provide a light emitting device with spatially varying luminance or color (such as in a dye-sublimated or inject printed overlay which is laminated or printed onto a layer of the film to provide a colored image, graphic, logo or indicia). In another embodiment, the light absorbing region is disposed in close proximity to the light extracting region such that the light emitted from the light emitting device due to the particular light extraction feature has a predetermined color or luminous intensity. For example, inks comprising titanium dioxide and light absorbing dyes can be disposed on the lightguide regions such that a portion of the light reaching the surface of the lightguide in that region passes through the dye and is extracted due to the light extraction feature or the light is extracted by the light extraction feature and passes through the dye.

In one embodiment, a light emitting device comprises a five-layer lightguide region with a UV light absorbing material disposed in the outer layers which are both optically coupled to cladding layers which are both optically coupled to the inner lightguide layer. In one embodiment, a 5-layer film comprises a polycarbonate material in the central lightguide layer with low refractive index cladding layers of a thickness between 1 micron and 150 microns optically coupled to the lightguide layer and a UV light absorbing material in the outer layers of the film.

In another embodiment, a light absorbing material is disposed on one side of the light emitting device such that the light emitted from the device is contrasted spatially against a darker background. In one embodiment, a black PET layer or region is disposed in proximity to one side or region of the light emitting device. In another embodiment, white reflecting regions are disposed in proximity to the light extracting region such that the light escaping the lightguide in the direction of the white reflecting region is reflected back toward the lightguide. In one embodiment, a lightguide comprises a lightguide region and a cladding region; and a light absorbing layer is disposed (laminated, coated, co-extruded, etc.) on the cladding region. In another embodiment, the light absorbing material is a dye that sublimates or infuses into the volume of the cladding. In one embodiment, light from a laser cuts (or ablates) regions in the light absorbing layer and creates light extracting regions in the cladding region and/or lightguide region. A white reflecting film such as a white PET film with voids is disposed next to the light absorbing region. The white film may be laminated or spaced by an air gap, adhesive or other material. In this example, a portion of the light extracted in the light extracting regions formed by the laser is directed toward the white film and reflected back through the lightguide where a portion of this light escapes the lightguide on the opposite side and increases the luminance of the region. This example illustrates where registration of the white reflecting region, black reflection region, and light extracting regions are not necessary since the laser created holes in the black film and created the light extracting features at the same time. This example also illustrates the ability for the light emitting device to display an image, logo, or indicia in the off state where light is not emitted from the light source since the white reflective regions reflect ambient light. This is useful, for example, in a sign application where power can be saved during the daytime since ambient light can be used to illuminate the sign. The light absorbing region or layer may also be a colored other than black such as red, green, blue, yellow, cyan, magenta, etc.

In another embodiment, the light absorbing region or layer is a portion of another element of the light emitting device. In one embodiment, the light absorbing region is a portion of the black housing comprising at least a portion of the input coupler that is optically coupled to the cladding region using an adhesive.

In another embodiment, the cladding, outer surface or portion of the lightguide of a light emitting device comprises a light absorbing region such as a black stripe region or light scattering region that absorbs or scatters, respectively, more than one selected from the group: 50%, 60%, 70%, 80% and 90% of the visible light propagating within the cladding region. In one embodiment, the light absorbing region absorbs light propagating within the cladding region from light coupled into the cladding region at the light input surface of the coupling lightguides in the light input coupler. In another embodiment, the lightguide is less than 200 microns in thickness and a light absorbing region optically coupled to the cladding absorbs more than 70% of the light propagating within the cladding which passes through the lightguide, wherein the width of the light absorbing region in the direction of the light propagating within the lightguide is less than one selected from the group: 10 millimeters, 5 millimeters, 3 millimeters, 2 millimeters, and 1 millimeter. In another embodiment, the light absorbing region has a width in the direction of propagation of light within the lightguide between one selected from the group: 0.5-3 millimeters, 0.5-6 millimeters, 0.5-12 millimeters, and 0.05-10 centimeters. In another embodiment, the light scattering region within the volume, on the surface of, or optically coupled to the cladding region on the side opposite the core region has a width in the direction of propagation of light within the lightguide between one selected from the group: 0.5-3 millimeters, 0.5-6 millimeters, 0.5-12 millimeters, and 0.05-10 centimeters.

In one embodiment, the light absorbing region is at least one selected from the group: a material patterned into a line, a material patterned into a shape or collection of shapes, a material patterned on one or both sides of the film, cladding, or layer optically coupled to the cladding, a material patterned on one or more lightguide couplers, a material patterned in the light mixing region, a material patterned in the lightguide, and a material patterned in the lightguide region. In another embodiment, the light absorbing region is patterned during the cutting step for the film, coupling lightguides, or cutting step of other regions, layers or elements. In another embodiment, the light absorbing region covers at least one percentage of surface area of the coupling lightguides selected from the group: 1%, 2%, 5%, 10%, 20%, and 40%.

Adhesion Properties of the Lightguide, Film, Cladding or Other Layer

In one embodiment, at least one selected from the group: lightguide, light transmitting film, cladding, and layer disposed in contact with a layer of the film has adhesive properties. In one embodiment, the cladding is a "low tack" adhesive that allows the film to be removed from a window or substantially planar surface while "wetting out" the interface. By "wetting out" the interface as used herein, the two surfaces are optically coupled such that the Fresnel reflection from the interfaces at the surface is less than 2%. The adhesive layer or region may comprise a polyacrylate adhesive, animal glue or adhesive, carbohydrate polymer as an adhesive, natural rubber based adhesive, polysulfide adhesive, tannin based adhesive, lignin based adhesive, furan based adhesive, urea formaldehyde adhesive, melamine formaldehyde adhesive, isocyanate wood binder, polyurethane adhesive, polyvinyl and ethylene vinyl acetate, hot melt adhesive, reactive acrylic adhesive, anaerobic adhesive, or epoxy resin adhesive.

In one embodiment, the adhesive layer or region has an ASTM D 903 version 2010 (modified for 72-hour dwell time) peel strength to standard window glass less than one selected from the group 77 N/100 mm, 55 N/100 mm, 44 N/100 mm, 33 N/100 mm, 22 N/100 mm, and 11 N/100 mm. In another embodiment, the adhesive, when adhered to glass, will support the weight of the light emitting device.

Removable Protective Layer

In one embodiment, the light emitting device comprises a removable protective layer. In another embodiment, a light transmitting film is disposed on the outer surface of the light emitting device and the ASTM D 903 version 2010 (modified for 72-hour dwell time) peel strength to the lightguide is less than one selected from the group 77 N/100 mm, 55 N/100 mm, 44 N/100 mm, 33 N/100 mm, 22 N/100 mm, and 11 N/100 mm. In another embodiment, when the outer surface of the light emitting device becomes scratched, damaged, or reduces the optical performance of the light emitting device, the outer layer of the film may be removed. In a further embodiment, a tag or extended region of the protective layer allows the individual layer to be removed while maintaining the integrity or position of the lightguide beneath which may have one or more additional protective layers disposed thereupon. In one embodiment, a thin film-based lightguide disposed as a frontlight for a reflective display comprises removable protective layers. The protective layers may be thin or thick and may comprise materials such as those used as display screen protectors, anti-reflection coatings, anti-glare coatings or surfaces, hardcoatings, circular polarizers, or surface structures that reduce the visibility of fingerprints such as those disclosed in U.S. patent application Ser. No. 12/537,930.

Removable Component Comprising Automatic Identification or Data Capture

In one embodiment, a removable component or cartridge of the light emitting device comprises an automatic identification and data capture method (such as indicia) or an information carrying method to provide information readable by the light emitting device. In another embodiment, at least one selected from the group: light input coupler, coupling lightguides, light mixing region, lightguide region, lightguide, film, cladding region, housing for the light input coupler, and separate component of the device comprises indicia or an information carrying method that provides information to the light emitting device. The information provided by the indicia or information carrying method may comprise information related to changing the light output of the light emitting device from a first state to a second state. In one embodiment, the indicia or information carrying method provides information to the light emitting device that directs the light emitting device to at least one selected from the group: turn on, turn off, adjust the overall intensity of the light output, adjust the relative intensity of light output from one or more light sources (such as to change the color from warm white to a cool white, from red to blue, change the color over time based on expected LED degradation rates, from a white based on RGB to white based on white LEDs, etc.) in one or more regions (such as turn on blue only in one region to illuminate a blue region of a logo corresponding to water) or lightguides (turning on one lightguide for the flashing "Sale" logo within the lightguide to be illuminated on top of a soft drink bottle advertisement), change the average color, change the times for on and off, change the identification lights for time to change the lightguide film or light source, change the alarms or special turn on times, change the display information related to authenticity of the component for anti-counterfeiting, change the location specific information, and change the component lifetime information (the light emitting device could display, for example, information relating to "Time to change the film" or "Battery life is low" or "Call for Service (555) 555-5555"). In another embodiment, the removable component comprises multiple lightguide layers and information and an information carrying method to prescribe which lightguide or combination of lightguides should turn on in relation to the date or time information in a clock within the light emitting device. For example, a stack of lightguides could comprise lightguides with images corresponding to images for Christmas, Thanksgiving, St. Patrick's Day, Halloween, etc. which could come on at the appropriate predetermined time of year for a light emitting window display.

In one embodiment, the indicia comprises information in the form of a pattern, text, or arrangement of ink, light extracting surface or volumetric features, or other optically detectible pattern or indicia on a component of the light emitting device. The component may be designed to be field removable such that the new information or configuration specific for the new component can be read by the device and it can be configured appropriately. In one embodiment, the indicia is a pattern of dots, letters, characters, or indicia on the film, lightguide, lightguide region, lightguide, housing or surface of a component of the removable components. The pattern of dots, characters, letters or indicia may vary in size, shape, spacing, color (for example, red, green blue, black, and white dots), or percent reflectance. In one embodiment, the indicia are an arrangement of 1D bars as in a barcode or 2D matrix or 2D barcode.

In another embodiment, the information carrying method is one selected from physical protrusions or notches in a component, physical switches, indentations or grooves in a component, an active, passive, or battery assisted Radio-Frequency Identification (RFID) tag or label, High-frequency RFID or HFID/HighFID, Ultra-HighFID or UHFID, a magnetic stripe, a smart card component, an optical RFID (or OPID). In one embodiment, an RFID tag is printed onto the surface or the surface of a layer within the film used as the coupling lightguide, lightguide region, light mixing region, or lightguide. In another embodiment, the RFID tag is adhered to a component of the cartridge and the reader is within the base unit. In one embodiment, at least one light source within the light emitting device is used to illuminate a printed pattern or light extraction feature pattern disposed on the lightguide, lightguide region, light mixing region or lightguide. In another embodiment, the lightguide, lightguide region, light mixing region, or coupling lightguide comprises a plurality of light absorbing or scattering regions arranged to provide information when illuminated by a plurality of light sources. For example, in one embodiment, each base unit comprising a visible light source and an IR LED which is used as a detector or transmitter. When the cartridge is inserted (or at some other event such as a reset or power on, or a change of state such as lightguide replacement), the various light sources may cycle through a pattern (such as sequentially, or turning the top 3 light source modules, then the side modules). Each IR LED may be used as a detector or a transmitter and may be electrically configured to switch between the two states. The location of the light absorbing or light reflecting regions will determine the relative intensities detected by the IR light emitting diodes that are not emitting light. In this embodiment, the light absorbing (such as an IR absorbing dye) or light reflecting regions can be coded to provide information specific to the lightguide film or cartridge. In another embodiment, visible LEDs are used and an at least one LED is configured to detect light within a specific wavelength range within the lightguide when the lightguide is illuminated by the other LEDs. The visible LEDs may cycle through and provide coded information based on the intensity reaching the visible light LED used as a detector. The relative intensity detected when a plurality of LEDs are illuminated by the light emitting device can provide coded information. More than one LED can be used in a detector only mode, detector and illuminator mode, or illumination mode only.

In a further embodiment, each module of the light emitting device comprises an infra-red (IR) LED designed to operate in at least one of a detector mode or illumination mode and the light emitting device can electronically cycle through each module independently to illuminate the IR LEDs. By incorporating IR light scattering or reflecting regions or IR light absorbing regions in at least one selected from the group: coupling lightguide, light mixing region, lightguide region, and lightguide, the relative intensities of the IR light at a plurality of modules can be used to decode the information provided encoded by the IR light absorbing or light reflecting or light scattering regions. In another embodiment, a dye which absorbs a portion of light greater than 700 nm can be used in a region and white LEDs which emit a portion of light at wavelengths greater than 700 nm can be used as illumination sources and IR LEDs can be used as detectors and provide information based on the light reaching other IR LEDs configured in reverse mode. In this embodiment, for example, IR scattering flakes, powders or materials or IR absorbing dyes may be used on at least one coupling lightguide to provide relative intensity information to the IR LED when used as a detector.

In one embodiment, the pattern is an arrangement of colored indicia which is illuminated sequentially or simultaneously by more than one light source in the device. In one embodiment, the pattern is an array of colored indicia in which the reflected intensity of light from a plurality of indicia changes depending on the color of the light source. For example, the indicia pattern could be an array comprising a red dot, a blue dot, a purple dot, and an orange dot. An optical reading device such as a linear array of photovoltaic cells, photodiodes, CMOS imager, CCD imager, etc. with or without color filters will detect different relative reflected intensities depending on the illumination wavelength spectrum. For example, when the blue LED is turned on, the blue dots will have a high intensity of reflected light and the purple dot will have a medium or high intensity of reflected light and the red dot will have a low level of reflected intensity. The relative reflectances for different illumination spectrums for different dots can provide encoded information.

The reading device of the light emitting device of one embodiment is an array of detectors or a single detector. In the case of the array of detectors, the detecting device could be a CCD or CMOS imaging device with a lens, microlens array, or other optical element to project the array of indicia onto the light detecting array elements.

In another embodiment, the detector on the light emitting device is a detecting element that provides for the information to be read serially when the removable component is attached (or removed) from the light emitting device. For example, the holding device for array of coupling lightguides could have a magnetic stripe which is read by the light emitting device with the holding device for the array of coupling lightguides is placed into the main base light emitting device unit comprising a light source. In another embodiment, the removable component or cartridge comprises a photovoltaic element coupled to the lightguide that powers a transmitter (radio frequency for example), or light source such that information is relayed back to the base unit.

In a further embodiment, the cartridge comprises mechanical holes, protrusions, or switches, or arrays or matrixes thereof that provide information to the light emitting device when the cartridge is attached to the light emitting device base unit.

In another embodiment, the coupling lightguides comprise printed regions on the low refractive index region, the lightguide region of the coupling lightguides, or another layer disposed on a surface or between a coupling lightguide. In one embodiment, a portion of light input into the coupling lightguide scatters out of the coupling lightguides and is detected by an optical detector such as a CCD or CMOS imager or photovoltaic cell or light emitting diode.

Lightguide Comprising Circuitry or Electrical Components

In one embodiment, at least one electrical component is physically disposed on the lightguide or a layer physically coupled to the lightguide. By incorporating electrical components on the lightguide film, a separate substrate for one or more electrical components is not needed (thus lower volumes and component costs) and flexible roll-to-roll processing can be employed to manufacture or dispose the electrical component on the lightguide film. In another embodiment, the lightguide comprises at least one electrical component physically coupled to a cladding region, a cladding layer, or a layer or region physically coupled to the core material or the cladding material. In another embodiment, a light emitting device comprises a flexible layer comprising a plurality of electrical components and the layer is physically coupled to a flexible lightguide film. In one embodiment, a lightguide comprises at least one electrical component or component used with electrical component disposed thereon, wherein the at least one component is selected from the group: active electrical component, passive electrical component, transistor, thin film transistor, diode, resistor, terminal, connector, socket, cord, lead, switch, keypad, relay, reed switch, thermostat, circuit breaker, limit switch, mercury switch, centrifugal switch, resistor, trimmer, potentiometer, heater, resistance wire, thermistor, varistor, fuse, resettable fuse, metal oxide varistor, inrush current limiter, gas discharge tube, circuit breaker, spark gap, filament lamp, capacitor, variable capacitor, inductor, variable inductor, saturable inductor, transformer, magnetic amplifier, ferrite impedance, motor, generator, solenoid, speaker, microphone, RC circuit, LC circuit, crystal, ceramic resonator, ceramic filter, surface acoustic wave filter, transducer, ultrasonic motor, power source, battery, fuel cell, power supply, photovoltaic device, thermo electric generator, electrical generator, sensor, buzzer, linear variable differential transformer, rotary encoder, inclinometer, motion sensor, flow meter, strain gauge, accelerometer, thermocouple, thermopile, thermistor, resistance temperature detector, bolometer, thermal cutoff, magnetometer, hygrometer, photo resistor, solid state component, standard diode, rectifier, bridge rectifier, Schottky diode, hot carrier diode, zener diode, transient voltage suppression diode, varactor, tuning diode, varicap, variable capacitance diode, light emitting diode, laser, photodiode, solar cell, photovoltaic cell, photovoltaic array, avalanche photodiode, diode for alternating current, DIAC, trigger diode, SIDAC, current source diode, Peltier cooler, transistor, bipolar transistor, bipolar junction transistor, phototransistor, Darlington transistor (NPN or PNP), Sziklai pair, field effect transistor, junction field effect transistor, metal oxide semiconductor FET, metal semiconductor FET, high electron mobility transistor, thyristor, unijunction transistor, programmable unijunction transistor, silicon controlled rectifier, static induction transistor/thyristor, triode for alternating current, composite transistor, insulated gate bipolar transistor, hybrid circuits, optoelectronic circuit, opto-isolator, opto-coupler, photo-coupler, photodiode, BJT, JFET, SCR, TRIAC, open collector IC, CMOS IC, solid state relay, opto switch, opto interrupter, optical switch, optical interrupter, photo switch, photo interrupter, led display, vacuum fluorescent display, cathode ray tube, liquid crystal display (preformed characters, dot matrix, passive matrix, active matrix TFT, flexible display, organic LCD, monochrome LCD, color LCD), diode, triode, tetrode, pentode, hexode, pentagrid, octode, barretter, nuvistor, compactron, microwave, klystron, magnetron, multiple electronic components assembled in a device that is in itself used as a component, oscillator, display device, filter, antennas, elemental dipole, biconical, yagi, phased array, magnetic dipole (loop), wire-wrap, breadboard, enclosure, heat sink, heat sink paste & pads, fan, printed circuit boards, lamp, memristor, integrated circuit, processor, memory, driver, and electrical leads and interconnects.

In another embodiment, the electrical component comprises organic components. In one embodiment, at least one electrical component is formed on the lightguide, on a component of the lightguide, or on a layer physically coupled to the lightguide material using roll-to-roll processing. In a further embodiment, a flexible lightguide film material is physically coupled to at least one flexible electrical component or a collection of electrical components such that the resulting lightguide is flexible and has can emit light without temporary or permanent visible demarcation, crease, luminance non-uniformity, MURA, or blemish when a light emitting region is bent to a radius of curvature less than one selected from the group: 100 millimeters, 75 millimeters, 50 millimeters, 25 millimeters, 10 millimeters and 5 millimeters.

Light Redirecting Element Disposed to Redirect Light from the Lightguide

In one embodiment, a light emitting device comprises a lightguide with light redirecting elements disposed on or within the lightguide and light extraction features disposed in a predetermined relationship relative to one or more light redirecting elements. In another embodiment, a first portion of the light redirecting elements are disposed above a light extraction feature in a direction substantially perpendicular to the light emitting surface, lightguide, or lightguide region. In a further embodiment, light redirecting elements are disposed to redirect light which was redirected from a light extraction feature such that the light exiting the light redirecting elements is one selected from the group: more collimated than a similar lightguide with a substantially planar surface; has a full angular width at half maximum intensity less than 60 degrees, 50 degrees, 40 degrees, 30 degrees, 20 degrees, 10 degrees, or 5 degrees in a first light output plane; has a full angular width at half maximum intensity less than 60 degrees, 50 degrees, 40 degrees, 30 degrees, 20 degrees, 10 degrees, or 5 degrees in a first light output plane and second light output plane orthogonal to the first output plane; and has a full angular width at half maximum intensity less than 60 degrees, 50 degrees, 40 degrees, 30 degrees, 20 degrees, 10 degrees, or 5 degrees in all planes parallel to the optical axis of the light emitting device.

In one embodiment, the lightguide comprises a substantially linear array of lenticules disposed on at least one surface opposite a substantially linear array of light extraction features wherein the light redirecting element collimates a first portion of the light extracted from the lightguide by the light extraction features. In a further embodiment, a light emitting device comprises a lenticular lens film lightguide further comprising coupling lightguides, wherein the coupling lightguides are disposed substantially parallel to the lenticules at the lightguide region or light mixing region and the lenticular lens film further comprises linear regions of light reflecting ink light extraction features disposed substantially opposite the lenticules on the opposite surface of the lenticular lens film lightguide and the light exiting the light emitting device is collimated. In a further embodiment, the light extraction features are light redirecting features (such as TIR grooves or linear diffraction gratings) that redirect light incident within one plane significantly more than light incident from a plane orthogonal to the first. In one embodiment, a lenticular lens film comprises grooves on the opposite surface of the lenticules oriented at a first angle greater than 0 degrees to the lenticules.

In another embodiment, a light emitting device comprises a microlens array film lightguide with an array of microlenses on one surface and the film further comprises regions of reflecting ink light extraction features disposed substantially opposite the microlenses on the opposite surface of the lenticular lens film lightguide and the light exiting the light emitting device is substantially collimated or has an angular FWHM luminous intensity less than 60 degrees. A microlens array film, for example can collimate light from the light extraction features in radially symmetric directions. In one embodiment, the microlens array film is separated from the lightguide by an air gap.

The width of the light extraction features (reflecting line of ink in the aforementioned lenticular lens lightguide film embodiment) will contribute to the degree of collimation of the light exiting the light emitting device. In one embodiment, light redirecting elements are disposed substantially opposite light extraction features and the average width of the light extraction features in first direction divided by the average width in a first direction of the light redirecting elements is less than one selected from the group: 1, 0.9, 0.7, 0.5, 0.4, 0.3, 0.2, and 0.1. In a further embodiment, the focal point of collimated visible light incident on a light redirecting element in a direction opposite from the surface comprising the light extraction feature is within at most one selected from the group: 5%, 10%, 20%, 30%, 40%, 50% and 60% of the width of light redirecting element from the light extraction feature. In another embodiment, the focal length of at least one light redirecting element or the average focal length of the light redirecting elements when illuminated by collimated light from the direction opposite the lightguide is less than one selected from the group: 1 millimeter, 500 microns, 300 microns, 200 microns, 100 microns, 75 microns, 50 microns and 25 microns.

In one embodiment, the focal length of the light redirecting element divided by the width of the light redirecting element is less than one selected from the group: 3, 2, 1.5, 1, 0.8, and 0.6. In another embodiment, the f/# of the light redirecting elements is less than one selected from the group: 3, 2, 1.5, 1, 0.8, and 0.6. In another embodiment, the light redirecting element is a linear Fresnel lens array with a cross-section of refractive Fresnel structures. In another embodiment, the light redirecting element is a linear Fresnel-TIR hybrid lens array with a cross-section of refractive Fresnel structures and totally internally reflective structures.

In a further embodiment, light redirecting elements are disposed to redirect light which was redirected from a light extraction feature such that a portion of the light exiting the light redirecting elements is redirected with an optical axis at an angle greater than 0 degrees from the direction perpendicular to the light emitting region, lightguide region, lightguide, or light emitting surface. In another embodiment, the light redirecting elements are disposed to redirect light which was redirected from a light extraction feature such that the light exiting the light redirecting elements is redirected to an optical axis substantially parallel to the direction perpendicular to the light emitting region, lightguide region, lightguide, or light emitting surface. In a further embodiment, the light redirecting element decreases the full angular width at half maximum intensity of the light incident on a region of the light redirecting element and redirects the optical axis of the light incident to a region of the light redirecting element at a first angle to a second angle different than the first.

In another embodiment, the angular spread of the light redirected by the light extraction feature is controlled to optimize a light control factor. One light control factor is the percentage of light reaching a neighboring light redirecting element which could redirect light into an undesirable angle. This could cause side-lobes or light output into undesirable areas. For example, a strongly diffusively reflective scattering light extraction feature disposed directly beneath a lenticule in a lenticular lens array may scatter light into a neighboring lenticule such that there is a side lobe of light at higher angular intensity which is undesirable in an application desiring collimated light output. Similarly, a light extraction feature which redirects light into a large angular rage such as a hemispherical dome with a relatively small radius of curvature may also redirect light into neighboring lenticules and create side-lobes. In one embodiment, the Bidirectional Scattering Distribution Function (BSDF) of the light extraction feature is controlled to direct a first portion of incident light within a first angular range into a second angular range into the light redirecting element to create a predetermined third angular range of light exiting the light emitting device.

Off-Axis Light Redirection

In a further embodiment, at least one light extraction feature is centered in a first plane off-axis from the axis of the light redirecting element. In this embodiment, a portion of the light extraction feature may intersect the optical axis of the light extraction feature or it may be disposed sufficiently far from the optical axis that it does not intersect the optical axis of the light extraction feature. In another embodiment, the distance between the centers of the light extraction features and the corresponding light redirecting elements in first plane varies across the array or arrangement of light redirecting elements.

In one embodiment, the locations of the light extraction features relative to the locations of the corresponding light redirecting elements varies in at least a first plane and the optical axis of the light emitted from different regions of the light emitting surface varies relative to the orientation of the light redirecting elements. In this embodiment, for example, light from two different regions of a planar light emitting surface can be directed in two different directions. In another example of this embodiment, light from two different regions (the bottom and side regions, for example) of a light fixture with a convex curved light emitting surface directed downwards is directed in the same direction (the optical axes of each region are directed downwards toward the nadir wherein the optical axis of the light redirecting elements in the bottom region are substantially parallel to the nadir, and the optical axis of the light redirecting elements in the side region are at an angle, such as 45 degrees, from the nadir) In another embodiment, the locations of the light extraction features are further from the optical axes of the corresponding light redirecting elements in the outer regions of the light emitting surface in a direction perpendicular to lenticules than the central regions where the light extraction regions are substantially on-axis and the light emitted from the light emitting device is more collimated. Similarly, if the light extraction features are located further from the optical axes of the light redirecting elements in a direction orthogonal to the lenticules from a first edge of a light emitting surface, the light emitted from the light emitting surface can be directed substantially off-axis. Other combinations of locations of light extraction features relative to light redirecting elements can readily be envisioned including varying the distance of the light extraction features from the optical axis of the light redirecting element in a nonlinear fashion, moving closer to the axis then further from the axis then closer to the axis in a first direction, moving further from the axis then closer to the axis then further to the axis in a first direction, upper and lower apexes of curved regions of a light emitting surface with a sinusoidal-like cross-sectional (wave-like) profile having light extraction features substantially on-axis and the walls of the profile having light extraction features further from the optical axis of the light redirecting elements, regular or irregular variations in separation distances of the light extraction features from the optical axes of the light redirecting elements, etc.

Angular Width Control

In one embodiment, the widths of the light extraction features relative to the corresponding widths of the light redirecting elements varies in at least a first plane and the full angular width at half maximum intensity of the light emitted from the light redirecting elements varies in at least a first plane. For example, in one embodiment, a light emitting device comprises a lenticular lens array lightguide film wherein the central region of the light emitting surface in a direction perpendicular to the lenticules comprises light extraction features that have an average width of approximately 20% of the average width of the lenticules and the outer region of the light emitting surface in a direction perpendicular to the lenticules comprises light extraction features with an average width of approximately 5% of the average width of the lenticules and the angular full width at half maximum intensity of the light emitted from the central region is larger than that from the outer regions.

Off-Axis and Angular Width Control

In one embodiment, the locations and widths of the light extraction features relative to the corresponding locations and widths, respectively, of the light redirecting elements varies in at least a first plane and the full angular width at half maximum intensity of the light emitted from the light redirecting elements and the optical axis of the light emitted from different regions of the light emitting surface varies in at least a first plane. By controlling the relative widths and locations of the light extraction features, the direction and angular width of the light emitted from the light emitting device can be varied and controlled to achieve desired light output profiles.

Light Redirecting Element

As used herein, the light redirecting element is an optical element which redirects a portion of light of a first wavelength range incident in a first angular range into a second angular range different than the first. In one embodiment, the light redirecting element comprises at least one element selected from the group: refractive features, totally internally reflected feature, reflective surface, prismatic surface, microlens surface, diffractive feature, holographic feature, diffraction grating, surface feature, volumetric feature, and lens. In a further embodiment, the light redirecting element comprises a plurality of the aforementioned elements. The plurality of elements may be in the form of a 2-D array (such as a grid of microlenses or close-packed array of microlenses), a one-dimensional array (such as a lenticular lens array), random arrangement, predetermined non-regular spacing, semi-random arrangement, or other predetermined arrangement. The elements may comprise different features, with different surface or volumetric features or interfaces and may be disposed at different thicknesses within the volume of the light redirecting element, lightguide, or lightguide region. The individual elements may vary in the x, y, or z direction by at least one selected from the group: height, width, thickness, position, angle, radius of curvature, pitch, orientation, spacing, cross-sectional profile, and location in the x, y, or z axis.

In one embodiment, the light redirecting element is optically coupled to the lightguide in at least one region. In another embodiment, the light redirecting element, film, or layer comprising the light redirecting element is separated in a direction perpendicular to the lightguide, lightguide region, or light emitting surface of the lightguide by an air gap. In a further embodiment, the lightguide, lightguide region, or light emitting surface of the lightguide is disposed substantially between two or more light redirecting elements. In another embodiment, a cladding layer or region is disposed between the lightguide or lightguide region and the light redirecting element. In another embodiment, the lightguide or lightguide region is disposed between two light redirecting elements wherein light is extracted from the lightguide or lightguide region from both sides and redirected by light redirecting elements. In this embodiment, a backlight may be designed to emit light in opposite directions to illuminate two displays, or the light emitting device could be designed to emit light from one side of the lightguide by adding a reflective element to reflect light emitted out of the lightguide in the opposite direction back through the lightguide and out the other side.

In another embodiment, the average or maximum dimension of an element of a light redirecting element in at least one output plane of the light redirecting element is equal to or less than one selected from the group: 100%, 90%, 80%, 70%, 60%, 50%, 40%, 30%, 20%, and 10% the average or maximum dimension of a pixel or sub-pixel of a spatial light modulator or display. In another embodiment, a backlight comprises light redirecting elements that redirect light to within a FWHM of 30 degrees toward a display wherein each pixel or sub-pixel of the display receives light from two or more light redirecting elements.

In a further embodiment, the light redirecting element is disposed to receive light from an electro-optical element wherein the optical properties may be changed in one or more regions, selectively or as a whole by applying a voltage or current to the device. In one embodiment, the light extraction features are regions of a polymer dispersed liquid crystal material wherein the light scattering from the lightguide in a diffuse state is redirected by the light redirecting element. In another embodiment, the light extraction feature has a small passive region and a larger active region disposed to change from substantially clear to substantially transmissive diffuse (forward scattering) such that when used in conjunction with the light redirecting element, the display can be changed from a narrow viewing angle display to a larger viewing angle display through the application or removal of voltage or current from the electro-optical region or material. For example, lines of grooved light extraction features are disposed adjacent (x, y, or z direction) a film comprising wider lines polymer dispersed liquid crystal (PDLC) material disposed to change from substantially clear to substantially diffuse upon application of a voltage across the electrodes. Other electro-optical materials such as electrophoretic, electro-wetting, electrochromic, liquid crystal, electroactive, MEMS devices, smart materials and other materials that can change their optical properties through application of a voltage, current, or electromagnetic field may also be used.

In another embodiment, the light redirecting element is a collection of prisms disposed to refract and totally internally reflect light toward the spatial light modulator. In one embodiment, the collection of prisms is a linear array of prisms with an apex angle between 50 degrees and 70 degrees. In another embodiment, the collection of prisms is a linear array of prisms with an apex angle between 50 degrees and 70 degrees to which a light transmitting material has been applied or disposed between the prisms and the lightguide or lightguide region within regions such that the film is effectively planarized in these regions and the collection of prisms is now two-dimensionally varying arrangement of prisms (thus on the surface it no longer appears to be a linear array). Other forms of light redirecting elements, reverse prisms, hybrid elements, with refractive or totally internally reflective features, or a combination thereof, may be used in an embodiment. Modifications of elements such as wave-like variations, variations in size, dimensions, shapes, spacing, pitch, curvature, orientation and structures in the x, y, or z direction, combining curved and straight sections, etc. are known in the art. Such elements are known in the area of backlights and optical films for displays and include those disclosed in "Optical film to enhance cosmetic appearance and brightness in liquid crystal displays," Lee et al., OPTICS EXPRESS, 9 Jul. 2007, Vol. 15, No. 14, pp. 8609-8618; "Hybrid normal-reverse prism coupler for light-emitting diode backlight systems," Aoyama et al., APPLIED OPTICS, 1 Oct. 2006, Vol. 45, No. 28, pp. 7273-7278; Japanese Patent Application No. 2001190876, "Optical Sheet," Kamikita Masakazu; U.S. patent application Ser. No. 11/743,159; U.S. Pat. Nos. 7,085,060, 6,545,827, 5,594, 830, 6,151,169, 6,746,130, and 5,126,882.

Backlight or Frontlight

Displays with optically active pixels include, without limitation, liquid crystal displays, electrophoretic displays, MEMs-based displays, and electrowetting displays. Displays without optically active pixels include, without limitation, printed signs, neon signs, channel letter signs, illuminated signs. In displays without optically active pixels, the lightguide may be disposed behind (backlight) or in front (frontlight) of an element and it may be visible directly and/or provide illumination to the element such that it can be seen or provide light through a light transmitting element such that the indicia or graphics can be seen through the light transmitting element. In embodiments with more than one element, the lightguide can function as a backlighting lightguide and a frontlight lightguide. In one embodiment, the elements illuminated or the elements through which light is transmitted include, without limitation, printed signs, graphics, posters, packaging, labels, display materials, sign components, labels, advertising materials, cards, transparencies, or other materials known in the sign, graphics, advertising, marketing, and display industries to provide indicia, graphics, or patterns. In another embodiment, the element is substantially uniform such that it has high luminance uniformity when illuminated.

For example, in one embodiment, a lightguide with white ink light scattering extraction patterns printed on one side functions as a backlight and is disposed behind (on the side opposite the viewing side) a light transmitting element such that the extraction pattern is visible in the form of indicia or patterns when looking at the light transmitting element. In another embodiment, a lightguide with white ink light scattering extraction patterns printed on one side functions as a backlight and is disposed between two light transmitting elements such that the extraction pattern is visible in the form of indicia, patterns, images, etc. when looking at the light transmitting elements. In one embodiment, a lightguide with white ink light scattering extraction patterns printed on one side functions as a backlight and is disposed between two light transmitting elements such that the extraction pattern provides illumination of the light transmitting element which may comprise images, indicia, or graphics on the light transmitting elements.

In another embodiment, a lightguide with white ink light scattering extraction patterns printed on one side functions as a frontlight and is disposed in front of (on the viewing side) an element such that the extraction pattern is visible in the form of indicia or patterns when looking at lightguide directly when illuminated. In this embodiment, when the lightguide is not illuminated the extraction pattern may have a low diffuse reflectance, may be barely visible or discernable, or have small light extraction features, for example.

In a further embodiment, a lightguide with white ink light scattering extraction patterns printed on one side functions as a frontlight and is disposed in front of (on the viewing side) an element such that the light from the lightguide illuminates the element and the light reflects from the element and passes back through the lightguide to be seen by a viewer looking at the lightguide. In a further embodiment, a lightguide with white ink light scattering extraction patterns printed on one side functions as a frontlight and is disposed in front of (on the viewing side) an element such that the light from the lightguide illuminates the element and the light reflects from the element and passes back through the lightguide to be seen by a viewer looking at the lightguide; and the light from the light scattering patterns on the lightguide is directly visible without reflecting from the element. In this example, the lightguide is a light emitting device with a visible extraction pattern and illuminates an object such that it has a higher luminance (and can be seen in dark or low-light level ambient environments through the lightguide, for example).

In a further embodiment, a lightguide with white ink light scattering extraction patterns printed on one side functions as a frontlight and a backlight and is disposed on one side of a light transmitting element such that the light from the lightguide illuminates the element and the light reflects from the element and passes back through the lightguide to be seen by a viewer looking at the lightguide; and some of the light from the lightguide passes through the light transmitting element and the extraction patterns are visible from the opposite side of the light transmitting element.

In one embodiment, the element has printed indicia or graphics on one or both sides and the lightguide functions as one or more selected from the group: a directly viewable display, a frontlight illuminating the element such that light is reflected back through the lightguide, a backlight for illuminating the indicia or graphics on the opposite side such that it can viewed on the side opposite the backlight, or the indicia or graphics are visible when looking through the element.

Automatic or User Controlled Color Adjustment

In one embodiment, the light emitting device can be operated in a monochrome mode (such as blue-only mode). In another embodiment, the user of the light emitting device can selectively choose the color of the light emitted from the display or light emitting device. In another embodiment, the user can choose to change the mode and relative light output intensities from one or more light sources. For example, in one embodiment, the user can switch from a full-color 2D display using only the frontlight to a stereoscopic 3D display mode. In one embodiment, the user can adjust the color temperature of the white point of the display comprising a film-based lightguide and a light input coupler disposed to couple light from a red LED and a white LED into the coupling lightguides of the lightguide by adjusting the light output of the red LED relative to the white LED. In another embodiment, the user can switch a reflective display from a fixed white point color temperature frontlight only mode to an automatic white color temperature adjustment frontlight and ambient light mode that automatically adjusts the light output from a red LED relative to a white LED (or the relative intensities of blue, green, and red LEDs, etc.) to maintain the color temperature of the white point of the display in a variety of environmental ambient light spectral conditions such as "cool" fluorescent lighting and "warm" lighting from an incandescent bulb. In another embodiment, the user can select to change from a full-color RGB display mode to an NVIS compatible display mode with less red light output. In another embodiment, the user can select to change from an RGB illumination with light from red, green, and blue LEDs to a monochrome mode with light from white LEDs.

In a further embodiment, a film-based lightguide is disposed to receive light from a substantially white light source and a red light source. For example, by coupling light from a white LED and a red LED, the color temperature of the display can be adjusted. This can, for example, be changed by the user (for color preference, for example) or automatically. For example, in one embodiment, a light emitting device comprises a reflective display and a photosensor (such as one or more photodiodes with color filters or LEDs operated in reverse) that detects the color or spectral intensity of light within one or more wavelength bandwidths and adjusts the overall and/or relative light output intensities of the frontlights (or LEDs disposed to couple light into a single frontlight) to increase or decrease the luminance and/or adjust the combined color of light emitted from the reflective display. In another embodiment the light detector (or photosensor) used to detect the color or spectral intensity of light within one or more wavelength bandwidths also determines the relative brightness of the ambient light and the intensity of the light from the frontlight is increased or decreased based on predetermined or user adjusted settings. In one embodiment, the photosensor comprises one or more light sensors such as LEDs used in reverse mode. In one embodiment, the photosensor is disposed in one or more locations selected from the group: behind the display, behind the frontlight, between the light emitting region of the display and the bevel, bezel or frame of the display, within the frame of the display, behind the housing or a light transmitting window of the housing or casing of the display or light emitting device, and in a region of the light emitting device separate from the display region. In another embodiment, the photosensor comprises a red, green, and blue LED driven in reverse to detect the relative intensities of the red, green, and blue spectral components of the ambient light. In another embodiment, the photosensor is disposed at the input surface of an arrangement of coupling lightguides disposed to transmit light from one or more light sources to the light emitting region of a film-based lightguide or at the output surface of output coupling lightguides extending from the film-based lightguide. In this embodiment, the photosensor can effectively collect the average intensity of the light incident on the display and the film-based lightguide frontlight and this can be compared to the relative output of the light from the light sources in the device. In this embodiment, the photosensor is less susceptible to shadows since the area of light collection is larger due to the larger spatial area comprising the light extraction features that are effectively working in reverse mode as light input coupling features coupling a portion of ambient light into the lightguide in a waveguide condition toward the photosensor.

One or more modes of the light emitting device may be configured to turn on automatically in response to an event. Events may be user oriented, such as turning on the high color gamut mode when the cellphone is used in the video mode, or in response to an environmental condition such as a film-based emergency light fixture electrically coupled to a smoke detection system (internal or external to the device) to turn on when smoke is detected, or a high brightness display mode automatically turning on when high ambient light levels are detected.

In another embodiment, the display mode may be changed from a lower luminance, higher color gamut mode (such as a mode using red, green, and blue LEDs for display illumination) to a higher luminance, lower color gamut mode (such as using white LEDs for illumination). In another embodiment, the display may switch (automatically or by user controls) from a higher color gamut mode (such as a light emitting device emitting light from red, green, and blue LEDs) to a lower color gamut mode (such as one using white phosphor-based LEDs). In another embodiment, the display switches automatically or by user controls from a high electrical power mode (such as light emitting device emitting light from red, green, and blue LEDs) to a relatively low electrical power mode (such as a mode using only substantially white LEDs) for equal display luminances.

In a further embodiment, the display switches automatically or by user controls from a color sequential or field sequential color mode frontlight or backlight illumination mode to an ambient-light illumination mode that turns off or substantially reduces the light output from the frontlight or backlight and ambient light contributes to more than 50% of the flux exiting the display.

In one embodiment, a display comprises a film-based lightguide with a light input coupler disposed to receive light from one or more light sources emitting light with one or more colors selected from the group: a red, green, blue, cyan, magenta, and yellow. For example, in one embodiment, a display comprises a film-based lightguide comprising one or more light input couplers disposed to receive light from a red, green, blue, cyan and yellow LED. In this embodiment, the color gamut of the display can be increased significantly over a display comprising only red, green, and blue illumination LEDs. In one embodiment, the LEDs are disposed within one light input coupler. In another embodiment, two or more LEDs of two different colors are disposed to input light into an arrangement of coupling lightguides. In another embodiment, a first light input coupler comprises one or more LEDs with a first spectral output profile of light entering a film-based lightguide and a second light input coupler with a second spectral output profile of light entering the film-based lightguide different than the first spectral output profile and the coupling lightguides in the first or second light input coupler are disposed to receive light at the input surface from an LED with a first peak wavelength and output wavelength bandwidth less than 100 nm and the coupling lightguides in the other light input coupler are not disposed to receive light at the input surface from an LED with substantially similar peak wavelength and substantially similar output wavelength bandwidth. In another embodiment, a light emitting device comprises two or more light input couplers comprising different configurations of different colored LEDs. In another embodiment, a light emitting device comprises two or more light input couplers comprising substantially the same configurations of different colored LEDs.

Stereoscopic Display

In another embodiment, a stereoscopic display comprises a backlight or frontlight wherein at least one lightguide or light extracting region is disposed within or on top of a film-based lightguide wherein at least two sets of light emitting regions produce at least two sets of images in conjunction with a stereoscopic display. The 3D display may further comprise light redirecting elements, parallax barriers, lenticular elements, or other optical components to effectively convert the spatially separated light emitting regions into angularly separated light regions.

In one embodiment, a light emitting display comprises a lenticular lens disposed to direct light into two or more viewing zones for stereoscopic display of images, video, information, or indicia and the lenticular lens is a film-based lightguide or comprises a film-based lightguide substrate. In this embodiment, the thickness of the stereoscopic display can be reduced by incorporating the film-based lightguide into the lenticular lens film. In one embodiment, the light scattering extraction regions are disposed in a plane substantially located at the focal point of the lenticules in a lenticular film.

Light Collection for Photovoltaic Charging

In one embodiment, a light emitting device comprises a film-based lightguide comprising light extraction features that extract a portion of incident light from one or more light sources disposed in light input couplers out of the film-based lightguide and the light extraction features redirect a first portion of ambient light external to the display into the lightguide in a lightguide condition. In one embodiment, a portion of the ambient light directed into a film-based lightguide by the light extraction features (functioning also as light input coupling features) propagates to a photovoltaic cell disposed adjacent or proximate the light sources at the input surface of coupling lightguides in a light input coupler for the film-based lightguide or disposed adjacent or proximate the output surface of the coupling lightguides in a light output coupler for the film-based lightguide. In one embodiment, the light emitting device may be switched to a charging mode such that the display is turned off (immediately or after a brief time period) and light reaching the photovoltaic cell charges a battery, capacitor, or other energy storing device. In another embodiment, the light emitting device charges or comprises a mode that charges an energy storage device when ambient light is sufficiently bright when the light emitting device is turned on or when the light emitting device is turned on or off. In another embodiment, the electrical power generated from the photovoltaic cell is directed to power the display or device without passing through the energy storage device when the power reaches a threshold voltage or current or combination thereof. In another embodiment, the photosensor that detects the ambient light intensity for backlight or frontlight intensity adjustments also sends a signal to turn on the charging mechanism for charging the charge storage device using the photovoltaic cell when the ambient light level is above a threshold level measured by the voltage, current or a combination thereof from the photosensor.

Flexible Light Emitting Device, Backlight, or Frontlight

In another embodiment, a light emitting device such as a display comprises a film-based light emitting device comprising a light source, light input coupler, and lightguide wherein the lightguide, lightguide region, or coupling lightguides can be bent or folded to radius of curvature of less than 75 times the thickness of lightguide or lightguide region and function similarly to similar lightguide or lightguide region that has not been similarly bent. In another embodiment, the lightguide, coupling lightguide, or lightguide region can be bent or folded to radius of curvature greater than 10 times the times the thickness lightguide or lightguide region and function similarly to similar lightguide or lightguide region that has not been similarly bent. In another embodiment, a display comprises a film-based light emitting device comprising a light source, light input coupler, and lightguide wherein the display can be bent or folded to radius of curvature of less than 75 times the thickness of display or lightguide region and function similarly to similar display that has not been similarly bent. In another embodiment, the display is capable of being bent or folded to radius of curvature greater than 10 times the times the thickness lightguide or lightguide region and function similarly to similar display that has not been similarly bent.

In one embodiment, the light emitting device or a display incorporating a light emitting device is bent into a substantially non-planar light emitting device or display incorporating a light emitting device. In one embodiment, the light emitting device or display incorporating the light emitting device has a light emitting surface area substantially in the shape of or comprising a portion of a shape of at least one selected from the group: a cylinder, sphere, pyramid, toms, cone, arcuate surface, folded surface, and bent surface. By folding the input coupler behind the light emitting region and inside a curved or bent region of the light emitting device or display, the input coupler can be effectively "hidden" from view and a substantially seamless display can be created. In another embodiment, two or more regions of a light emitting region in a light emitting device overlap each other in the thickness direction such that there is a continuous light emitting region such as in the case of a cylindrical display or a display wrapping around two or more sides of a rectangular solid.

In another embodiment, the backlight or frontlight is incorporated into a portable device such as a cellphone, smartphone, pda, laptop, tablet computer, pad computer (such as those from Apple Inc.), ebook, e-reader, or other computing device.

Point of Purchase Display

In one embodiment, a light emitting point of purchase (POP) display comprises a film-based lightguide, coupling lightguides, and a light input coupler. In another embodiment, the point of purchase display is a shelving system with tags, indicators, indicia, graphics, or other media. In another embodiment, the POP display comprises a light emitting device electrically connected to a motion sensor. In one embodiment, the light emitting device is integrated into the POP display such that one or more regions of the POP display have light emitting indicia (such as a logo, graphic, text, symbol, or picture). In another embodiment, the lightguide has one or more substantially transparent regions and is disposed in front of a region of the point of purchase display. For example, in one embodiment, a POP display comprises a printed cardboard region with a substantially transparent lightguide disposed above it. In this embodiment, the red printed cardboard region is visible through the lightguide when the light emitting device is not emitting light and is visible in non-light emitting regions of the lightguide when the light emitting device is emitting light. In one embodiment, the lightguide is disposed over text regions, graphic regions, uniform colored regions (red or white background for example) or other printed or unprinted regions of the display. In one embodiment, the light emitting region is used to enhance the printed region. For example, in one embodiment, the light emitting region emits red light in the form of indicia spelling "SALE" and is disposed above a similar size and shape printed region of the POP display spelling "SALE". In another embodiment, the light emitting region emits light that at least one selected from the group: enhances edges, outlines shapes or printed indicia, and indicates a particular product within or region of the POP display. In another embodiment, the light emitting region of a lightguide in a first output region is disposed above a printed region of a display or sign that has a diffuse reflectance less than one selected from the group: 60%, 50%, 40%, 30%, 20%, 10%, and 5%. For example, in one embodiment, a light emitting device comprises a white light emitting region on a lightguide above a black printed region such that the luminance contrast ratio of the light emitting region is high.

In another embodiment, a POP display comprises a light emitting device wherein the light emitting region of the lightguide is disposed behind a region of the display. In one embodiment, the light emitting region is disposed behind a printed graphic, logo, uniform, patterned or other visible region of the display and the light emitting region indicia or pattern has at least one selected from the group: high luminance contrast ratio, high color contrast, and both a high luminance contrast ratio and high color contrast. In order for a lightguide to be visible through a layer of the POP display, the layer must have transmittance sufficient for the light to transmit through the layer such that the light emitting region has a sufficiently high luminance contrast ratio or color contrast. In one embodiment, a layer or region of a POP display comprising a light emitting device is disposed to receive light from the light from the light emitting region and transmit a portion of the light through the layer or region and the layer or region has an ASTM D1003 version 07e1 luminous transmittance greater than one selected from the group: 2%, 5%, 10%, 20%, and 50%. In another embodiment, the aforementioned layer or region of the POP display has an average transmittance for the wavelength of the light emitted from the light emitting region greater than one selected from the group: 2%, 5%, 10%, 20%, and 50%.

In one embodiment, the POP display comprises and is powered by one or more selected from the group: batteries, fuel cell, wired AC power from an AC cord, DC power from a driver, or photovoltaic power from a photovoltaic cell. In another embodiment of this invention, the POP display comprises a digital device reader that reads a device inserted into the POP display. In another embodiment, the POP display uses the information derived from a digital device by the digital device reader to determine one or more selected from the group: authenticity of the product, authenticity of the POP display, authenticity of the user, determine the illumination color for the display, determine the on/off cycle for one or more colors of the display, determine the time period duration for the light source to be on/off (duration of sale items or daytime hours that the store is open for example), and determine other user or manufacturer information related to the light emitting properties and functionality of the POP display. In one embodiment, the digital device comprises one or more selected from the group: microchip, microprocessor, microcontroller, integrated circuit, computer circuit, memory (flash memory, for example), a computer, a digital storage device (memory, flash memory, hard drive, CDROM, DVD DROM, etc.), radio frequency tag, and an electronic information carrying device. For example, in one embodiment, the POP display comprises a radio frequency reader and an RF tag is disposed near the reader such that POP display reads the information from the RF tag and the light output appropriately modified. In this embodiment, the product manufacture could send the appropriate RF ID tag to illuminate a certain part of the display (the region of the display comprising the indicia reading "20% off" for example) rather than another region of the display (the region that reads "10% OFF" for example). In another embodiment, the POP display comprises a radio frequency transceiver that allows the display to communicate with a remote server to determine the optical output for the display. For example, in one embodiment, the POP display comprises a microcontroller and an IEEE 802.11 wireless radio that communicates with a server to determine the correct light output for a particular product at a particular location and time.

Pop Display Provides Product Illumination

In one embodiment, a POP display comprises a light emitting device wherein a lightguide distributes light from a light input coupler to provide illumination to one or more regions designed to hold products. In another embodiment, the POP display comprises a light emitting device wherein a lightguide distributes light from a light input coupler to provide illumination to one or more products within the POP display. For example, in one embodiment, a POP display comprises a light emitting device comprising a light input coupler wherein light from an LED is directed into the input ends of an array of coupling lightguides. The light propagates within the coupling lightguides and into a lightguide region. The lightguide region comprises light emitting regions disposed proximate the products (such as the underside of a shelf above products where the light emitting region directs light down toward the products). In one embodiment, the lightguide comprises one or more light emitting regions for illuminating more than one product or area. In another embodiment, the lightguide region comprises a substantially linear region disposed to illuminate a linear array of products. For example, the light emitting region could be in the shape of a long thin rectangular "line" of light on the underside of a shelf emitting light downwards toward a horizontal array of products. In this embodiment, the shelf may be substantially opaque such that the line of light is not directly visible under normal POP display viewing situations. In another embodiment, the light emitting region of a lightguide region of a film-based lightguide of a light emitting POP display is disposed vertically along a vertical structure of a POP display such that the "line" of light from the long thin rectangular light emitting region illuminates the outer front surfaces of a vertical array of products. In one embodiment, the POP display comprises one, two, three, or more separate light emitting devices to provide light for at least one selected from the group: light emitting indicia, illumination of the products or region near the products, and distributing light into the products. For example, in one embodiment, the POP display comprises a light emitting device for illuminating the products and an additional light emitting device for providing light emitting indicia or graphics. In another example, a light emitting device comprises a light source and an array of coupling lightguides that transmit light to first and second lightguide regions that provide product illumination and light emitting indicia, respectively. In another embodiment, a POP display comprises a sensor that detects the presence or absence of one or more products. By using a sensor, such as a photocell or mechanical switch, power can be reduced and saved when there are no products. For example, in one embodiment, a POP display comprises a mechanical switch at the back of the display with slightly angled shelves. Any product in the display would slide to the back and press against the switch, thus indicating that the light source for the light emitting POP display should be turned on. In another embodiment, a photodetector at the back of the POP display is designed to turn on the light source for the light emitting POP display when a shadow is detected, signifying that a product is disposed between an ambient or internal light source and the photodetector.

In one embodiment, the light emitting device is disposed on a viewing side of an object or region of a container (such as a cooler point of purchase display) and provides illumination through light exiting a region substantially longer than it is wide (similar to a strip) disposed along a top edge, bottom edge, side edge, or along the top, bottom, or side of a shelf. For example, in one embodiment, the light emitting device has a substantially rectangular light emitting strip disposed along the side frame area in-between doors in a transparent cooler (such as used for displaying drinks in a convenience store). In this embodiment, the thin lightguide that is in a narrow strip form provides illumination of the objects in the cooler without the light from the strip being visible from outside the cooler. In this embodiment, for example, the light emitting device can be built into the door. In another embodiment, for example, the light emitting strip is disposed along the underside of a shelf and provides illumination of the products below the shelf. In a further embodiment, the light emitting strip is disposed on the top side of a shelf (or disposed underneath the top surface and emitting light out of the top surface through a shelf with a transparent region). In the aforementioned embodiment, the light emitting strip may be disposed parallel to the shelf such that it illuminates a row of products (parallel to the shelf) or it may be oriented at an angle approximately 90 degrees from the shelf, door, or viewing region such that it illuminates a column of products. For example, in one embodiment, a light emitting device comprises a strip emitting red light disposed in a cooler on a shelf beneath a light transmitting acrylic sheet that illuminates a column of red colored carbonated beverages in transparent plastic bottles. The red light in this embodiment provides a glowing red illumination of the bottles.

Light Emitting Device that Distributes Light to be Emitted from Products

In one embodiment, a light emitting device comprises a light distribution system that receives light from a light input coupler, transmits the light through a lightguide to light emitting regions, wherein products placed in proximity to the light emitting regions receive the light from the light emitting region and emit the light in a predetermined location of the packaging or product. In one embodiment, the product is located on a shelving system, rack, display, platform or point of purchase display. For example, in one embodiment, a POP display comprises a light input coupler that directs light from a light source into coupling lightguides that are extensions from a lightguide. The lightguide comprises first light emitting regions disposed along a vertical wall of the display. The first light emitting regions are disposed to emit light in regions corresponding to light receiving input surfaces of products vertically stacked in the POP display. In one embodiment, the products comprise a lightguide with coupling lightguides disposed to receive light from the first light emitting region, transmit the light through a lightguide and exit the lightguide in a light emitting region of the lightguide comprising light extraction features. For example, when the light emitting device of the previous example is turned on and products stacked vertically in the POP display, light exits the first light emitting regions and propagates into the product and is emitted from a second light emitting region illuminating the text "NEW AND IMPROVED," for example. When the product is removed from the shelf, the light emitting region of the product stops emitting light. Thus, in this example, each product can be illuminated without requiring light sources, electronics, batteries, etc. within each product. In another embodiment, the product uses a lightguide and does not comprise coupling lightguides. For example, the light receiving region of the product may comprise a light scattering region disposed behind a light transmitting lightguide such that a portion of the light from the light emitting region of the POP display passes through the lightguide, reaches the scattering region on the back side of the lightguide, is reflectively scattered into the lightguide in a waveguide condition, propagates to light emitting regions disposed on a second side of the packaging such that light is emitted in the form of light emitting indicia or graphics.

In one embodiment, the light emitting region has a low luminance contrast ratio or low color contrast when the product is removed from the POP display. For example, a light emitting region comprising surface relief light extraction features of micro-indentations into a transparent lightguide of sizes less than 100 microns in one or more directions and spaced more than about 100 microns apart may not be readily discernable under some illumination conditions and the print or packaging below the light emitting region (looking through the lightguide) using ambient light is readily discernable or sufficiently uniform. In this example, when light is input into the lightguide of the product, a portion of the light exits the light emitting region such that an image, logo, indicia, graphic or other pattern is visible and when the product is removed from the POP display it disappears. In another embodiment, the color of the light extraction feature in the light emitting region is substantially the same as the region beneath the feature. For example, a red ink light extraction feature disposed on the product side of a lightguide in a light emitting region disposed in front of a red region of the packaging will maintain the red appearance when illuminated with ambient light when removed from the POP display.

In another embodiment, a shelf (such as a grocery store shelf) comprises light emitting regions on the top side of the shelf such that when products are disposed on top of the light emitting regions, the products "lights up" (have light emitting regions) or have light emitting indicia or graphic regions. When the product is removed from the shelf, the product does not receive light from the first light emitting region and the light emitting from the product is reduced or eliminated. In another embodiment, a portion of the ambient light is reflected from the package in the light emitting region or ambient light is transmitted through the lightguide in the product to provide illumination to indicia or graphics.

In one embodiment, the product further comprises a light output window disposed to permit a portion of the incident light to propagate into a second product. For example, in the preceding example, a product stacked on another product would not directly receive light from the light emitting regions on the shelf below. In another embodiment, the product comprises at least one selected from the group: a lightguide, coupling lightguide, cavity, hole, or light transmitting optical element that permits or directs light from one light receiving region of the product to a light transmitting region of the product such that when a second product is disposed and aligned upon the first product, the second product emits light through second light emitting regions or indicia.

Distributed Illumination System

In one embodiment, a distributed illumination system comprises a light emitting device comprising at least one light output coupler optically coupled to a distribution lightguide in light transmitting regions. In one embodiment, the light output coupler is one or more selected from the group: lightguides, optical elements, light emitting regions, and coupling lightguides. For example, in one embodiment, a distributed illumination system comprises a light source disposed to couple light into an array of coupling lightguides that are extensions of a long thin strip film-based distribution lightguide. The light propagates along the length of the lightguide film and is coupled out of the lightguide in light transmitting regions where the film is optically coupled to light receiving regions of a light output coupler lightguide film. Light propagates through the light output coupler lightguide film and is extracted by light extraction features in a light emitting region of the light output coupler lightguide film.

Light Output Coupler

More than one light output coupler may be used to couple light out of the lightguide at various locations along the lightguide. In one embodiment, a first portion of the light incident on the light output coupler is specularly reflected or transmitted such that it does not exit the light output coupler at the next interface. By specularly reflecting or transmitting a first portion of light, that light may continue to propagate within the light output coupler without being extracted within or near the light receiving region. For example, in one embodiment, the light output coupler is a film-based lightguide disposed to receive a first portion of light from the lightguide in a light receiving region and transmit it to light extraction feature in a second region further along the light output coupler from the light receiving region. In one embodiment, a light output coupler directs light away from the light transmitting region of the lightguide and the light emitting region of the light output coupler is larger than the light transmitting region. Thus, in this example, the light output coupler is able to extract a portion of light from the lightguide and emit the light in a larger light emitting area than the area that the light output coupler is in contact with the lightguide. In another embodiment, the cross-sectional light flux density within the lightguide (measured perpendicular to the optical axis of the light propagating within the lightguide in Lumens/mm$^2$) is greater than the flux density of the light emitting region area comprising the light extraction features. In another embodiment, ratio of the lightguide light flux density to light emitting area light flux density is greater than one selected from the group: 1, 2, 5, 10, 20, 40, and 100.

Removable Cladding Region

In one embodiment, the distributed illumination system comprises a cladding region optically coupled to the lightguide that may be removable or repositionable. In another embodiment, the cladding may be separated from the lightguide in a light transmitting region and a light output coupler may be disposed in optical contact within the light transmitting region. For example, in one embodiment, a distributed illumination system comprises a light source disposed to couple light into an array of coupling lightguides that are extensions of a long thin strip film-based lightguide. The light propagates along the length of the distribution lightguide film and substantially remains in the lightguide in a region beneath the cladding region. The cladding region is removed, exposing a light transmitting region of the core region. A light output coupler is optically coupled to the lightguide at the light transmitting region such that a portion of light within the lightguide is coupled out of the lightguide into the light transmitting region. In this embodiment, light propagates through the light output coupler lightguide film and is extracted by light extraction features in a light emitting region of the light output coupler lightguide film. In another embodiment, the cladding region is a flap comprising a tab that allows it to be easily pulled away from the lightguide while remaining physically coupled to the distributed illumination system such that a light output coupler may be optically coupled to the lightguide. For example, the light output coupler could be optically coupled to the lightguide by pressing with one's finger a tacky film-based light output coupler onto the core region of the lightguide film). In a further embodiment, the flap is laid back onto the light output coupler after it is optically coupled to the light transmitting region on the distribution lightguide. When there is a desire to replace or change the light output coupler, the light output coupler may be removed and the old or a new cladding region may be re-applied, adhered or otherwise optically coupled to the lightguide.

In another embodiment, the lightguide is a tacky film, such as a silicone film, and the cladding layer is peeled away from the lightguide such that it is not physically coupled to the distributed illumination system. The tacky film, in this embodiment, helps hold on the cladding region and promotes adhesion of the light output coupler to the lightguide or a new or the same cladding region subsequent to removal of the light output coupler.

Signs and Window Displays

In another embodiment, a light emitting device is used as an overlay with indicia that can be illuminated. In one embodiment, the lightguide region has a low degree of visibility in the off-state, and an in the on-state can be clearly seen as illuminated indicia. For example, the lightguide region may be printed with light scattering dots to illuminate and display indicia such as "Warning," "Exit," "Sale," "Open," "Closed," "Merry Christmas," etc. The lightguide region may be disposed on the viewing side of a display (such as a liquid crystal display, plasma display, projection display, etc.) or it may be placed on a store or home window, on a table surface, a road sign, on a vehicle or air/water/land craft exterior or window, over or inside a transparent, translucent, or opaque object, on a door, stairs, in a hallway, or within a doormat, etc. The indicia may also be icons, logos, images, or other representations such as a cartoon-like drawing of Santa Claus, a brand logo such as the Nike "Swoosh", a photo of a beach scene, a dithered photo of the face of a person, etc. The indicia may be full-color, monochrome, comprise mixtures of colored and monochrome regions, and may be layered or employ phosphors, dyes, inks or pigments to achieve colors.

By using a lightguide film which is substantially not visible in the off state, the display, sign, or light emitting device can be employed in more places without substantially interfering with appearance of the object on which it is disposed. In another embodiment, the light emitting device provides illumination of a space wherein the region which emits light in the on-state is not readily discernable in the off-state. This, for example, can provide thin light fixtures or illumination devices that are substantially only visible in the on-state. For example, vehicle taillights, seasonal window film displays, ceiling mounted light fixtures, lamps, closed signs, road hazard signs, danger/warning signs, etc. may be substantially invisible in the off state. In some situations, this enables the signs to be posted and only turned on when needed and can reduce delays incurred due to the installation time required. In another embodiment, the light emitting device is a light fixture which appears to be the color of the background surface upon which it is place upon in the off state. In another embodiment, the light emitting area of the light fixture is substantially black or light absorbing in the off state. Such displays are useful in submarines or other aircraft under NVIS illumination conditions.

In a further embodiment, the lightguide film comprises a cladding region disposed between the core layer and a light absorbing layer. For example, the light redirected by the light extraction features into angles less than the critical angle between the core layer and the cladding layer may be at an angle that remains within a lightguide condition of a window-air interface when the lightguide is optically coupled to a window. In this example, the light will remain trapped within the window and lightguide film until it is absorbed or re-directed out of the lightguide. Scratches, fingerprints, and other blemishes on the window may be illuminated by this light and the light redirected out of the window causing visible artifacts. In one embodiment, a light absorbing coating, layer or region is disposed between a cladding layer and the window and substantially absorbs the light through the multiple TIR reflections and reduces the visibility of this artifact. In another embodiment, the light absorbing region, coating, or layer has an average specular light transmission (including specular reflections) for the wavelength range of at least one light source for the light emitting device less than one selected from the group: 85%, 80%, 75%, 70%, and 65%. In one embodiment, placing the light absorbing region on the opposite side of the cladding region than the core region (and by not placing the light absorbing material inside the cladding region), only the light passing through the cladding layer will reach the light absorbing region. In the previous embodiment, when the lightguide is optically coupled to a window, the light that will exit the window only passes through the light absorbing layer once while the light trapped within the glass will pass through many times and will have a greater chance of being significantly reduced in intensity before reaching a light extracting artifact (scratch, fingerprint, etc.) on the window. In another embodiment, the lightguide has an average specular light transmission (including specular reflections) for the wavelength range of at least one light source for the light emitting device less than one selected from the group: 85%, 80%, 75%, 70%, and 65%.

Optically Coupling Light into the Window

In one embodiment, a lightguide or light output coupling element is optically coupled to a glass or plastic window such that light is coupled into the window and propagates within the window in a total internal reflection condition. By coupling light into a window, one can illuminate frosted or etched glass, films disposed on the window, or embossed plastic patterns such as logos or decoration on the window. In one embodiment, the light coupled into the window is extracted by rain, water, or condensation on the window effectively forming lenses to provide rain or weather indication or an aesthetic luminous effect. In another embodiment, light from a light source is coupled into a window from a light output coupler or lightguide optically coupled to the window and a light extraction region or film is optically coupled to the window such that light escapes the window in the region of the light extraction region. In the previous embodiment, the window is functioning as the core region of a lightguide. In one embodiment, the window has wavelength dependent absorption properties (such as absorbing red light more than blue light) and the output of the light from the lightguide or light output coupler compensates for the absorption in order to achieve a desired color such as white. For example, in one embodiment, the light from the lightguide comprises more red light output than blue light output to compensate for the green absorption in a soda-lime glass window.

Lightguide Adjacent to a Window

In one embodiment, the lightguide film is substantially separated from the window by an air gap. In another embodiment, the light extraction features in the lightguide film do not redirect light into an angle within the window greater than the critical angle of the window (typically angles greater than about 42 degrees from the surface normal). In one embodiment, the lightguide film is held in place by standoffs or physically coupling the lightguide, light input coupler, housing or other element of the light emitting device to the window, frame, or other element disposed in proximity to the window. In another embodiment, the lightguide is disposed proximate the window and is supported by one or more selected from the group: a stand, a hanging mechanism to a wall or ceiling, and a mount to a wall or ceiling.

In one embodiment, a light emitting device comprises a light source, coupling lightguides, a lightguide comprising a light emitting region, and a method for physically coupling the lightguide to a window or window frame. For example, the lightguide may comprise an adhesive material (such as a "static cling" PVC film or silicone rubber film) disposed on one side of a core region of a lightguide such that the light emitting device may be laminated (by hand or with the assistance of a roller and/or application fluids, for example) to a window such that the light emitting device supports its own weight. In this embodiment, the region of the lightguide not emitting light may be substantially transparent and the light emitting region may be substantially transparent, translucent, or partially transparent when the light source is turned off. In one embodiment, the light input coupler is disposed at the lower end of a lightguide such that the force does not substantially pull the lightguide away from the window. In another embodiment, the adhesion layer is a cladding layer with a refractive index lower than the core layer and the lightguide further comprises a cladding layer on the opposite side of the core layer. In another embodiment, the light emitting device may be disposed on a window sill or other supporting structure with the lightguide physically coupled to or disposed near the window. In another embodiment, one or more cladding layers of the lightguide comprises a protective coating such as a hard-coating wherein the pencil hardness of the protective coating is greater than one selected from the group: 8H, 7H, 6H, 5H, 4H, 3H, and 2H. In a further embodiment, the lightguide comprises an ammonia resistant coating such that the coating does not show evidence of crazing or whitening after 5 hours of exposure to 1% ammonium hydroxide or 3% isopropyl alcohol. In a further embodiment, the lightguide comprises a tab region or other extended region that physically decouples the lightguide from a window when pulled.

In one embodiment, the lightguide is physically and optically coupled to a window (glass or plastic) and the transmittance through a substantially non-light emitting region of the lightguide is greater than one selected from the group: 70%, 80%, 86%, 88%, 90% and 92%. Optically coupling the lightguide to the window can reduce or substantially eliminate the surface reflection from the inner lightguide-air and air window interfaces. This reduces the overall visibility of the lightguide film and its light extraction features (the close proximity required for optical coupling also reduces extraneous multiple reflections).

In another embodiment, the light emitting device comprises one or more suction cups that physically couple the device to a substantially non-porous surface. For example, in one embodiment, a light input coupler disposed on the lower edge of a lightguide comprises suction cups that adhere the light input coupler to a window and the lightguide film has a low peel-strength adhesive, material, or region disposed to physically couple the lightguide film to a non-porous surface such as a window. In another embodiment, the lightguide film comprises holes through which portions of a suction cup or a hook or extension thereof may pass through such that the lightguide film is supported vertically. Other mechanical means such as latches, fasteners, hook and loop fasteners (using adhesive to bond the hook to the glass and the loop to the light input coupler, for example) may be used to fasten or couple the light emitting device or a component thereof (such as the lightguide) to a window or a substantially non-porous surface.

In another embodiment, a kit comprises a light emitting device with an adhesive film or water-soluble adhesive that will physically and optically coupled the lightguide to a glass window. In a further embodiment, the kit comprises a roller suitable for moving an application liquid in-between the lightguide and a window, thus removing air bubbles and spreading the adhesive.

Other Applications and Functionality of the Light Emitting Device

Since embodiments enable inexpensive coupling into thin films, there are many general illumination and backlighting applications. The first example is general home and office lighting using roll-out films on walls or ceiling. Beyond that, the film can bend to shape to non-planar shapes for general illumination Additionally, it can be used as the backlight or frontlight in the many thin displays that have been or are being developed. For example, LCD and E-ink thin-film displays may be improved using a thin back-lighting film or thin front-lighting film; Handheld devices with flexible and scrollable displays are being developed and they need an efficient, low-cost method for getting light into the back-lighting film. In one embodiment, the light emitting device comprises a light input coupler, lightguide, and light source which provide illumination for translucent objects or film such as stained-glass windows or signs or displays such as point-of-purchase displays. In one embodiment, the thin film enables the light extraction features to be printed such that they overall negligibly scatter light that propagates normal to the face of the film. In this embodiment, when the film is not illuminated, objects can be seen clearly through the film without significant haze. When placed behind a transparent or partially transparent stained-glass window, the overall assembly allows low-scattering transmission of light through the assembly if desired. Furthermore, the flexibility of the film allows for much greater positional tolerances and design freedom than traditional plate lightguide backlights because the film can be bent and adapted to the various stained-glass window shapes, sizes and topologies. In this embodiment, when not illuminated, the stained glass appears as a regular non-illuminated stained-glass window. When illuminated, the stained-glass window glows.

Additional embodiments include light emitting devices wherein the stained-glass window is strictly aesthetic and does not require viewing of objects through it (e.g. cabinet stained-glass windows or art displays), and the overall see-through clarity of the backlight does not need to be achieved. In this embodiment, a diffuse or specular reflector can be placed behind the film to capture light that illuminates out of the film in the direction away from the stained-glass window. Diffusing films, light redirecting films, reverse prism films, diffuser films (volumetric, surface relief or a combination thereof) may be disposed between the lightguide and the object to be illuminated. Other films may be used such as other optical films known to be suitable to be used within an LCD backlight.

The light emitting device of one embodiment can be used for backlighting or frontlighting purposes in passive displays, e.g., as a backlight or frontlight for an illuminated advertising poster, as well as for active (changing) displays such as LCD displays. Suitable displays include, but are not limited to, mobile phone displays, mobile devices, aircraft display, watercraft displays, televisions, monitors, laptops, watches (including one where the band comprises a flexible lightguide which is capable of illumination or "lighting up" in a predetermined pattern by an LED within the watch or watch band), signs, advertising displays, window signs, transparent displays, automobile displays, electronic device displays, and other devices where LCD displays are known to be used.

Some applications generally require compact, low-cost white-light illumination of consistent brightness and color across the illuminated area. It is cost-effective and energy-efficient to mix the light from red, blue, and green LEDs for this purpose, but color mixing is often problematic. In one embodiment, light from red, blue, and green light sources is directed into each stack of coupling lightguides/input areas and is sufficiently mixed that it appears as white light when it exits the lightguide region of the lightguide. The light sources can be geometrically situated, and adjusted in intensity, to better provide uniform intensities and colors across the lightguide region. A similar arrangement can be attained by providing stacked sheets (more specifically stacked sheet bodies or lightguides) wherein the colors in the sheets combine to provide white light. Since some displays are provided on flexible substrates—for example, "E-ink" thin-film displays on printed pages—the sheets provide a means for allowing backlighting while maintaining the flexibility of the display's media.

In some embodiments, the light emitting device is a novel LCD backlighting solution, which includes mixing multiple colors of LEDs into a single lightguide. In one embodiment, the length and geometry of the strips uniformly mixes light into the lightguide region of the film lightguide without a significant are of light mixing region located around the edge. The enhanced uniformity of the colors can be used for a static display or a color-sequential LCD and BLU system. One method for a color-sequential system is based on pulsing between red, green, and blue backlight color while synced to the LCD screen pulsing. Moreover, a layered version of red-, green- and blue-lighted films that combine to make white light is presented. A pixel-based display region can have multiple pixels that are designated to be red, green or blue. Behind it are three separate film lightguides that each have a separate color of light coupled to them. Each of the lightguides has light extraction features that match up with the corresponding color of the pixel-based display. For example, red light is coupled into coupling lightguide and then into the lightguide or lightguide region and is extracted from the feature into the red pixel. The film lightguides are considerably thinner than the width of the pixels so that geometrically a high percentage of the light from a given color goes into its corresponding set of pixels. Ideally, no color filter needs to be used within the pixels, but in case there is crosstalk between pixels, they should be used.

It is also notable that the invention has utility when operated "in reverse"—that is, the light-emitting face(s) of a sheet could be used as a light collector, with the sheet collecting light and transmitting it through the coupling lightguides to a photosensitive element. As an example, sheets in accordance with the invention could collect incoming light and internally reflect it to direct it to a photovoltaic device for solar energy collection purposes. Such an arrangement can also be useful for environmental monitoring sensing purposes, in that the sheet can detect and collect light across a broad area, and the detector(s) at the coupling lightguides will then provide a measurement representative of the entire area. A sheet could perform light collection of this nature in addition to light emission. For example, in lighting applications, a sheet might monitor ambient light, and then might be activated to emit light once twilight or darkness is detected. Usefully, since it is 15 known that LEDs can also be "run in reverse"—that is, they can provide output current/voltage when exposed to light—if LEDs are used as an illumination source when a sheet is used for light emission, they can also be used as detectors when a sheet is used for light collection. In one embodiment, the lightguide captures a portion of incident light and directs it to a detector wherein the detector is designed to detect a specific wavelength (such as by including a bandpass filter, narrowband filter or a diode with a specific bandgap used in reverse). These light detection devices have the advantages of collecting a percentage of light over a large area and detecting light of a specific wavelength is directed toward the film while the film/sheet/lightguide/device remains substantially transparent. These can be useful in military operations where one is interested in detecting lasers or light sources (such as used in sighting devices, aiming devices, laser-based weapons, LIDAR or laser based ranging devices, target designation, target ranging, laser countermeasure detection, directed energy weapon detection, eye-targeted or dazzler laser detection) or infra-red illuminators (that might be used with night vision goggles).

In another embodiment, a light emitting device comprises a light source, light input coupler, and film-based lightguide wherein the light emitting device is one selected from the group: building mounted sign, freestanding sign, interior sign, wall sign, fascia sign, awning sign, projecting sign, sign band, roof sign, parapet sign, window sign, canopy sign, pylon sign, joint tenant sign, monument sign, pole sign, high-rise pole sign, directional sign, electronic message center sign, video sign, electronic sign, billboard, electronic billboard, interior directional sign, interior directory sign, interior regulatory sign, interior mall sign, and interior point-of-purchase sign.

The sheets are also highly useful for use in illuminated signs, graphics, and other displays. For example, the film may be placed on walls or windows without significantly changing the wall or window appearance. However, when the sign is illuminated, the image etched into the film lightguide would become visible. The present invention could also be useful for coupling light into the films that sit in front of some grocery store freezers as insulation. Lighting applications where there is limited space, such as in the ice at hockey rinks may also require plastic film lighting. Since a sheet can be installed on a wall or window without significantly changing its appearance, with the light-emitting area(s) becoming visible when the light source(s) are activated, the invention allows displays to be located at areas where typical displays would be aesthetically unacceptable (e.g., on windows). The sheets may also be used in situations where space considerations are paramount, e.g., when lighting is desired within the ice of skating rinks (as discussed in U.S. Pat. No. 7,237,396, which also describes other features and applications that could be utilized with the invention). The flexibility of the sheets allows them to be used in lieu of the curtains sometimes used for 15 climate containment, e.g., in the film curtains that are sometimes used at the fronts of grocery store freezers to better maintain their internal temperatures. The flexibility of the sheets also allows their use in displays that move, e.g., in light emitting flags that may move in the breeze.

Lightguide is Also Sound Emitting Device

In one embodiment, the lightguide is also a thin, flexible, diaphragm which may be vibrated by a transducer to emit sound such as disclosed in U.S. Pat. Nos. 6,720,708 and 7,453,186 and U.S. patent application Ser. No. 09/755,895. In one embodiment, the lightguide is a frontlight for lighting a reflective display and the lightguide is also speaker which emits audio. In one embodiment, the lightguide comprises multiple layers of polymers (such as core lightguide and two cladding layers) which increase the rigidity of the lightguide film and provide improved acoustic performance. In one embodiment, the lightguide has at least one property selected from the group: high light transmittance, low haze, high clarity, and low diffuse reflectance such that the visibility of the lightguide or diaphragm is reduced.

Lightguide is Also a Touchscreen

In one embodiment, the light emitting device comprises a touchscreen or the lightguide is a touchscreen for detecting haptic feedback, contact, proximity, or location of user input by finger or stylus or other device. In one embodiment, the lightguide carries at least one of the illumination or light modified by the input as well as providing frontlight, backlight, audio, or other functionality. In one embodiment, the lightguide is an optical touchscreen. Optical based touchscreens are known in the art and in one embodiment, the optical based touchscreen is one disclosed in U.S. patent application Ser. No. 11/826,079, 12/568,931, or 12/250,108. In another embodiment, the lightguide is a surface acoustic wave based touchscreen such as disclosed in U.S. Pat. Nos. 5,784,054, 6,504,530 or U.S. patent application Ser. No. 12/315,690.

Luminance Uniformity of the Backlight, Frontlight, or Light Emitting Device

In a further embodiment, the luminance of the light emitting device is greater than one selected from the group: 10, 20, 30, 40 50, 75, 100, 200, and 300 Cd/m$^2$ at a first angle (such as normal to the film surface in the light emitting region) when the light source is emitting light and the light emitting device is in a dark environment. In another embodiment, the luminance of the light extracting features is greater than one selected from the group: 10, 20, 30, 40, 50, 75, 100, 200, and 300 Cd/m$^2$ at a first angle (such as normal to the film) when the light source is emitting light and the light emitting device is in a dark environment. In another embodiment, the luminance of the light extracting features when illuminated by the light input coupler is greater than one selected from the group: 5, 10, 20, 30, 40, 50, 75, 100, 200, 300, 400, 500, 750, 1000, 1500, 2000, 4000, 6000, 8000, 10000, and 15000 Cd/m$^2$ within a first angular range selected from the group: 0-10, 0-20, 0-30, 0-40, 0-50, and 0-60 degrees from the normal to the surface of the film in the light emitting region or region comprising light extraction features when the light source is emitting light and the light emitting device is in a dark environment.

In one embodiment, a light emitting device comprises a light source, a light input coupler, and a film-based lightguide wherein the 9-spot spatial luminance uniformity of the light emitting surface of the light emitting device measured according to VESA Flat Panel Display Measurements Standard version 2.0, Jun. 1, 2001 is greater than one selected from the group: 60%, 70%, 80%, 90%, and 95%. In another embodiment, a display comprises a spatial light modulator and a light emitting device comprising a light source, a light input coupler, and a film-based lightguide wherein the 9-spot spatial luminance uniformity of the light reaching the spatial light modulator (measured by disposing a white reflectance standard surface such as Spectralon by Labsphere Inc. in the location where the spatial light modulator would be located to receive light from the lightguide and measuring the light reflecting from the standard surface in 9-spots according to VESA Flat Panel Display Measurements Standard version 2.0, Jun. 1, 2001) is greater than one selected from the group: 60%, 70%, 80%, 90%, and 95%. In another embodiment, a display comprises a spatial light modulator and a light emitting device comprising a light source, a light input coupler, and a film-based lightguide wherein the 9-spot spatial luminance uniformity of the display measured according to VESA Flat Panel Display Measurements Standard version 2.0, Jun. 1, 2001) is greater than one selected from the group: 60%, 70%, 80%, 90%, and 95%.

Luminance Contrast Ratio of the Light Emitting Region

The luminance contrast ratio of the light emitting region may be measured under specific light conditions to ascertain the visibility of the light emitting indicia or region. The desired visibility of the light emitting region (whether emitting light in the on-state or not emitting light in the off-state) may vary depending on the application and desired appearance of the light emitting device. The perceived visibility of the light emitting region under different ambient light conditions can be measured by the luminance contrast ratio. The luminance contrast ratio is the ratio of the luminance of the light emitting region to the luminance of the neighboring region under specific ambient light levels. For high ambient light levels, the peak illuminance of the light emitting region and the neighboring region is greater than 100 lux. For low ambient light levels, the peak illuminance of the light emitting region and the neighboring region is less than 100 lux. For a spot measurement area, the measurement spot size may be from 1 mm$^2$ to 10 cm$^2$, with a typical 1 cm$^2$ circular spot measurement. For light emitting regions comprising small text font size, for example, the light emitting region measurement spot size may be 1 mm$^2$. For large emitting regions with a continuous light emitting pattern, the light emitting region measurement spot size may be, for example, 10 cm$^2$ or a 9-point average of 1 cm$^2$ spot sizes. In one embodiment, the light emitting region is visibly perceived as a continuous light emitting region representing text, graphics, logos, a uniform pattern, etc. and is comprised of smaller light extraction features that are not readily discerned without close inspection. In this example, the luminance contrast ratio may be measured in the perceivable characteristic region that represents the logo or perceived pattern. For example, when standing in front of a POP display, the text "SALE" may be perceived and upon closer inspection, the bend in the middle region of the "S" comprises a collection of light extraction features extracting light in-between regions that do not extract light. In this embodiment, the luminance measurement for the light emitting region should have a spot size less than size of the bend in the middle region of the "S" and large enough to encompass at least about 4 or more light extraction features. The luminance contrast ratio in this example is the luminance of the middle region of the "S" divided by the luminance of the substantially non-light emitting region near the "S".

A high luminance contrast ratio is desired when the sign, graphic, logo, or light emitting region should be perceived over the neighboring area or region. For example, an exit sign should be perceived when emitting light in the light emitting indicia forming the text "EXIT" such that the sign is readily visible. In some applications, it is desirable that the light emitting region have a low luminance contrast ratio when the light emitting region does not emit light. For example, one may desire that a cooler door sign be very visible when illuminated, but substantially transparent when not illuminated. In another embodiment, the luminance of the light emitting region in ambient light depends on one or more properties selected from the group: the type of the light extraction features, the reflectance of the light extraction features, the size of the light extraction features, the shape of the light extraction features, the density of the light extraction features, the thickness of the light extraction features, other films or components disposed in front of the light emitting region, other films or components disposed in behind the light emitting region, the ambient light illuminance from the front of the light emitting region, and the ambient light illuminance from behind the light emitting region. In another embodiment, the light emitting region does not require a high luminance contrast ratio in high ambient light environments because it is normally used in low ambient light environments. For example, a sign or display in a low ambient light level restaurant does not necessarily need a high contrast ratio in a high ambient light environment. In another embodiment, the light emitting region is designed to primarily display the light emitting indicia when in low ambient light level environments. For example, an exterior sign painted red may be readily visible during the day but needs supplemental lighting (of the red paint) or light emitting indicia (displaying the same indicia) at night to be readily seen.

In another embodiment, for example, a low luminance white light emitting indicia region of a substantially transparent lightguide disposed in front of a white region of a POP display may not be very visible in a bright ambient light environment but will be more visible in a very low ambient light environment. In this embodiment, the region of the POP comprising the light emitting region has a low Luminance Contrast Ratio, On-state, High Ambient Light and a high Luminance Contrast Ratio, On-state, Low Ambient Light. In another embodiment, the light emitting region has a low luminance contrast ratio in the off-state in low and high ambient light levels and has a high luminance contrast ratio in the on-state in low and high ambient light levels.

The luminance contrast ratio needed for a particular task (such as viewing a sign or display) may depend on the ambient environment, the individual viewing the sign, and the color of the light emitting region and the neighboring region. In one embodiment, the luminance contrast ratio of the light emitting region in the on-state (emitting light in the region) for a low ambient light level, high ambient light level, or both is greater than one selected from the group: 1, 2, 5, 10, and 20. In another embodiment, the luminance contrast ratio of the light emitting region in the off-state (not emitting light in the region) for a low ambient light level, high ambient light level, or both is greater than one selected from the group: 2, 5, 10, and 20.

In some applications, the luminance contrast ratio of the light emitting region may not need to be high. For example, if the light emitting region serves only to accent or supplement the outline or feature of the printed indicia it is placed in front of or behind. In a further embodiment, the luminance contrast ratio of the light emitting region in the on-state (emitting light in the region) for a low ambient light level, high ambient light level, or both is less than one selected from the group: 2, 5, 10, and 20. In a another embodiment, the luminance contrast ratio of the light emitting region in the off-state (not emitting light in the region) for a low ambient light level, high ambient light level, or both is less than one selected from the group: 2, 5, 10, and 20.

Color Contrast of the Light Emitting Region

The contrast of a sign, display or light emitting display is also dependent on the color of the light emitting region and the neighboring region. For example, red light emitting indicia on a transparent lightguide may have the same luminance as the green background under standard illuminant A illumination, but the color contrast is significantly greater. The color contrast of the light emitting region, as defined herein, is the length of the line between the color of the light emitting region and the neighboring region, $\Delta u'v'$, measured on the 1976 u', v' CIE Uniform Chromaticity Scale when illuminated by an Illuminant A standard illuminant. The measurement spot size for the color contrast may be ascertained the same way as described above for the luminance contrast ratio. The color contrast may be measured under high and low ambient light levels as described above for the luminance contrast ratio. The typical color contrast, $\Delta u'v'$, needed to perceive two colors adjacent each other is 0.004. However, for some applications, the contrast ratio is desired to be higher to provide increased visibility and perception against the background. The color contrast may be low or high in the off-state and be the opposite in the on-state. For example, a light emitting region may be designed to be the same color as the background by using white ink light extraction features on a transparent lightguide when placed above a white region of a POP display. In this example, when the light emitting region emits light from a red LED, the color contrast of the light emitting region is significantly higher than when the light emitting region emits white light.

In some applications, for example, the color contrast may be desired to be low in the on state or off state such that the light emitting indicia matches the background. For example, a POP display may be designed to have a matching color contrast when on where red light emitting indicia match the color of the display in the on-state, and when the light emitting indicia are turned off, the black background beneath the indicia provides a high color contrast. Similarly, as with the luminance contrast ratio, the color contrast may be designed to high or low under low or high ambient light levels depending on the application and desired visibility in either state under the lighting conditions.

In one embodiment, the color contrast of the light emitting region in the on-state (emitting light in the region) for a low ambient light level, high ambient light level, or both is greater than one selected from the group: 0.004, 0.01, 0.04, and 0.1. In another embodiment, the color contrast of the light emitting region in the off state (not emitting light in the region) for a low ambient light level, high ambient light level, or both is greater than one selected from the group: 0.004, 0.01, 0.04, and 0.1. In another embodiment, the color contrast of the light emitting region in the on-state (emitting light in the region) for a low ambient light level, high ambient light level, or both is less than one selected from the group: 0.004, 0.01, 0.04, and 0.1. In another embodiment, the color contrast of the light emitting region in the off state (not emitting light in the region) for a low ambient light level, high ambient light level, or both is less than one selected from the group: 0.004, 0.01, 0.04, and 0.1.

Color Uniformity of the of the Backlight, Frontlight, or Light Emitting Device

In one embodiment, a light emitting device comprises a light source, a light input coupler, and a film-based lightguide wherein the 9-spot sampled spatial color non-uniformity, $\Delta u'v'$, of the light emitting surface of the light emitting device measured on the 1976 u', v' Uniform Chromaticity Scale as described in VESA Flat Panel Display Measurements Standard version 2.0, Jun. 1, 2001 (Appendix 201, page 249) is less than one selected from the group: 0.2, 0.1, 0.05, 0.01, and 0.004 when measured using a spectrometer based spot color meter. In another embodiment, a display comprises a spatial light modulator and a light emitting device comprising a light source, a light input coupler, and a film-based lightguide wherein the 9-spot sampled spatial color non-uniformity, $\Delta u'v'$, of the of the light reaching the spatial light modulator (measured by disposing a white reflectance standard surface such as Spectralon in the location where the spatial light modulator would be located to receive light from the lightguide and measuring the color of the standard surface on the 1976 u', v' Uniform Chromaticity Scale as described in VESA Flat Panel Display Measurements Standard version 2.0, Jun. 1, 2001 (Appendix 201, page 249) is less than one selected from the group: 0.2, 0.1, 0.05, 0.01, and 0.004 when measured using a spectrometer based spot color meter. In another embodiment, a display comprises a spatial light modulator and a light emitting device comprising a light source, a light input coupler, and a film-based lightguide wherein the 9-spot sampled spatial color non-uniformity, Δu'v', of the display measured on the 1976 u', v' Uniform Chromaticity Scale as described in VESA Flat Panel Display Measurements Standard version 2.0, Jun. 1, 2001 (Appendix 201, page 249) is less than one selected from the group: 0.2, 0.1, 0.05, 0.01, and 0.004 when measured using a spectrometer based spot color meter.

Angular Profile of Light Emitting from the Light Emitting Device

In one embodiment, the light emitting from at least one surface of the light emitting device has an angular full-width at half-maximum intensity (FWHM) less than one selected from the group: 120 degrees, 100 degrees, 80 degrees, 60 degrees, 40 degrees, 20 degrees and 10 degrees. In another embodiment, the light emitting from at least one surface of the light emitting device, the light emitting region, or a light extraction feature has an angular full-width at half-maximum intensity (FWHM) greater than one selected from the group: 120 degrees, 100 degrees, 80 degrees, 60 degrees, 40 degrees, 20 degrees and 10 degrees. In another embodiment, the light emitting from at least one surface of the light emitting device has at least one angular peak of intensity within at least one angular range selected from the group: 0-10 degrees, 20-30 degrees, 30-40 degrees, 40-50 degrees, 60-70 degrees, 70-80 degrees, 80-90 degrees, 40-60 degrees, 30-60 degrees, and 0-80 degrees from the normal to the light emitting surface. In another embodiment, the light emitting from at least one surface of the light emitting device has two peaks within one or more of the aforementioned angular ranges and the light output resembles a "bat-wing" type profile known in the lighting industry to provide uniform illuminance over a predetermined angular range. In another embodiment, the light emitting device emits light from two opposing surfaces within one or more of the aforementioned angular ranges and the light emitting device is one selected from the group: a backlight illuminating two displays on either side of the backlight, a light fixture providing up-lighting and down-lighting, a frontlight illuminating a display and having light output on the viewing side of the frontlight that has not reflected from the modulating components of the reflective spatial light modulator with a peak angle of luminance greater than 40 degrees, 50 degrees, or 60 degrees. In another embodiment, the optical axis of the light emitting device is within an angular range selected from the group: 0-20, 20-40, 40-60, 60-80, 80-100, 100-120, 120-140, 140-160, 160-180, 35-145, 45-135, 55-125, 65-115, 75-105, and 85-95 degrees from the normal to a light emitting surface. In a further embodiment, the shape of the lightguide is substantially a tubular and the light substantially propagates through the tube in a direction parallel to the longer (length) dimension of the tube and the light exits the tube wherein at least 70% of the light output flux is contained within an angular range of 35 degrees to 145 degrees from the light emitting surface. In a further embodiment, the light emitting device emits light from a first surface and a second surface opposite the first surface wherein the light flux exiting the first and second surfaces, respectively, is chosen from the group: 5-15% and 85-95%, 15-25% and 75-85%, 25-35% and 65-75%, 35-45% and 65-75%, 45-55% and 45-55%. In another embodiment, the first light emitting surface emits light in a substantially downward direction and the second light emitting surface emits light substantially in an upward direction. In another embodiment, the first light emitting surface emits light in a substantially upward direction and the second light emitting surface emits light substantially in a downward direction.

Optical Redundancy

In one embodiment, the light emitting device comprises coupling lightguides which provide a system for optical redundancy. Optical redundancy provides for the ability for the device to function at acceptable illuminance uniformity, luminance uniformity, or color uniformity levels through multiple optical paths from different light sources that overlap in at least one region. The optical redundancy may be achieved through stacking lightguides, coupling light from more than one light source into a light input coupler, or disposing light input couplers for the same lightguide film on a plurality of sides of the lightguide (such as on opposite sides of the lightguide). More than one method of achieving optical redundancy may be employed, for example, by stacking two or more lightguides that each comprise light input couplers that are each disposed to receive light from a plurality of light sources.

Optical redundancy may be used to increase the spatial or angular uniformity (luminance, illuminance, or color), provide a combination of angular or spatial light output profiles (low angular output from one lightguide and high angular output from a second lightguide, for example), provide increased luminance levels, provide a backup light emitting region when component failure causes light from the first lightguide to fall below specification (such as color uniformity, luminance uniformity, or luminance) in the overlapping region, increase the color gamut (combining light output from white and red LEDs for example), or provide color mixing (combining the output from red, green, and blue LEDs for example).

In one embodiment, optical redundancy is used to maintain or reduce the unwanted effects of light source failure or component failure (such as LED driver or a solder joint failure). For example, two lightguides may each be coupled to a separate light input coupler with separate light sources and the lightguides may be stacked in a light output direction and each independently designed with light extraction features to provide uniform output in a light emitting region. If the LED fails in the first light input coupler, the second light input coupler may still operate and provide uniform light output. Similarly, if the color of the first LED within the first light input coupler changes due to temperature or degradation, the effects (color changes such as off-white) will be less due to the optical redundancy of a stacked system.

In another embodiment, the light output from two or more light sources are coupled into the light input coupler of a light emitting device comprising optical redundancy and the optical redundancy reduces the color or luminance binning requirements of the LEDs. In this embodiment, optical redundancy provides for the mixing of light from a plurality of light sources within a region (such as within the coupling lightguides) such that the color from each source is averaged spatially with each coupling lightguide receiving light from each light source and directing it into the lightguide or light mixing region.

In another embodiment, a light emitting device comprises at least one coupling lightguide disposed to receive light from at least two light sources wherein the light from the at least two light sources is mixed within a first region of the at least one coupling lightguide and the first region is contained within a distance from the light emitting region of the light emitting device less than one selected from the group: 100%, 70%, 50%, 40%, 30%, 20%, 10%, and 5% of the largest dimension of the light emitting device output surface or light emitting region.

In a further embodiment, a light emitting device comprises at least one coupling lightguide disposed to receive light from at least two light sources wherein the light from the at least two light sources is mixed over the length of the at least one coupling lightguide and the light mixing region and the combined length of the at least one coupling lightguide and the light mixing region in the direction of propagation of light exiting the coupling lightguide is greater than one selected from the group: 100%, 70%, 50%, 40%, 30%, 20%, 10%, and 5% of the largest dimension of the light emitting device output surface or light emitting region.

In a further embodiment, a light emitting device comprising a plurality of light sources comprises optical redundancy and the device may be dimmed by adjusting the light output of one or more LEDs while leaving the output driving pattern of one or more LEDs substantially constant. For example, a light emitting device comprising a first string of LEDs L1, L2, and L3 connected in an electrical series and optically coupling light into light input couplers LIC1, LIC2, and LIC3, respectively, and further comprising a second string of LEDs L4, L5, and L6 connected in an electrical series and optically coupling light into light input couplers LIC1, LIC2, and LIC3, respectively, can be uniformly dimmed (dimmed while maintaining spatial luminance uniformity of the light emitting surface, for example) from, for example 50% to 100% output luminance, by adjusting the current to the second string of LEDs. Similarly, the color of the light output can be uniformly adjusted by increasing or decreasing the electrical current to the second string when the color of the light output of the second string is different than the color output of the first string. Similarly, three or more strings may be controlled independently to provide optical redundancy or uniform adjustment of the luminance or color. Three or more groups with different colors (red, green, and blue, for example) may be adjusted independently to vary the output color while providing spatial color uniformity.

Uniformity Maintenance

In one embodiment, the first color difference $\Delta u'v'_1$ of two light sources disposed to couple light into a light input coupler is greater than the spatial color non-uniformity $\Delta u'v'_2$ of at least one selected from the group: the 9-spot sampled color non-uniformity of the light emitting region disposed to receive light from the light input coupler, the light output surface of the light emitting device, and the light exiting the coupling lightguides.

In another embodiment, a light emitting device comprises a first group of light sources comprising at least one light source and a second group of light sources comprising at least one light source wherein at least one light source from the first group and at least one light source from the second group couple light into the same light input coupler and the 9-spot spatial color non-uniformity of the light emitting region or light output surface when receiving light from both the first group of light sources and the second group of light sources is less than one selected from the group: 0.2, 0.1, 0.05, 0.01, and 0.004 when measured using a spectrometer based spot color meter, and the 9-spot spatial color non-uniformity of the light emitting region or light output surface when receiving light from only the first group of light sources is less than one selected from the group: 0.2, 0.1, 0.05, 0.01, and 0.004. In another embodiment, the 9-spot spatial color non-uniformity of the light emitting region or light output surface when receiving light from both the first group of light sources and the second group of light sources is less than 0.05 and the 9-spot spatial color non-uniformity of the light emitting region or light output surface when receiving light from only the first group of light sources is less than 0.05. In a further embodiment, the 9-spot spatial color non-uniformity of the light emitting region or light output surface when receiving light from both the first group of light sources and the second group of light sources is less than 0.05 and the 9-spot spatial color non-uniformity of the light emitting region or light output surface when receiving light from only the first group of light sources is less than 0.1

In another embodiment, a light emitting device comprises a first group of light sources comprising at least one light source and a second group of light sources comprising at least one light source wherein at least one light source from the first group and at least one light source from the second group couple light into the same light input coupler and the 9-spot spatial luminance uniformity of the light emitting region or light output surface when receiving light from both the first group of light sources and the second group of light sources is greater than one selected from the group: 50%, 60%, 70%, 80%, and 90% and the 9-spot spatial luminance uniformity of the light emitting region or light output surface when receiving light from only the first group of light sources is greater than one selected from the group: 50%, 60%, 70%, 80%, and 90%. In another embodiment, the 9-spot spatial luminance uniformity of the light emitting region or light output surface when receiving light from both the first group of light sources and the second group of light sources is greater than 70% and the 9-spot spatial luminance uniformity of the light emitting region or light output surface when receiving light from only the first group of light sources is greater than 70%. In a further embodiment, the 9-spot spatial luminance uniformity of the light emitting region or light output surface when receiving light from both the first group of light sources and the second group of light sources is greater than 80% and the 9-spot spatial luminance uniformity of the light emitting region or light output surface when receiving light from only the first group of light sources is greater than 70%.

Stacked Lightguides

In one embodiment, a light emitting device comprises at least one film lightguide or lightguide region disposed to receive and transmit light from a second film lightguide or lightguide region such that the light from the second lightguide improves the luminance uniformity, improves the illuminance uniformity, improves the color uniformity, increases the luminance of the light emitting region, or provides a back-up light emitting region when component failure causes light from the first lightguide to fall below specification (such as color uniformity, luminance uniformity, or luminance) in the overlapping region.

Plurality of Light Sources Coupling into Light Input Coupler

In another embodiment, a plurality of light sources are disposed to couple light into a light input coupler such that a portion of the light from the plurality of light sources is coupled into at least one coupling lightguide such that the light output is combined. By combining the light output from a plurality of light sources within the coupling lightguides, the light is "mixed" within the coupling lightguides and the output is more uniform in color, luminance, or both. For example, two white LEDs disposed adjacent a light input surface of a collection of coupling lightguides within a light input coupler can have substantially the same spatial luminance or color uniformity in the light emitting region if one of the light sources fails. In another embodiment, light sources emitting light of two different colors are disposed to couple light into the same light input coupler. The light input coupler may provide the mixing within the coupling lightguides, and furthermore, the coupling lightguides provide optical redundancy in case one light source fails. The optical redundancy can improve the color uniformity when light sources of two or more colors are coupled into the same light input coupler. For example, three white LEDs, each with different color temperatures, may be coupled into the same light input coupler and if one of the light LEDs fails, then the light output from the other two LEDs is still mixed and provides more uniformity than single LEDs with different color outputs coupled into two adjacent light input couplers. In one embodiment, a light source comprises at least one selected from the group: 3, 5, 10, 15, 20, 25, and 30 LED chips disposed in an array or arrangement to couple light into a single light input coupler. In one embodiment, a light source comprises at least one selected from the group: 3, 5, 10, 15, 20, 25 and 30 LED chips disposed in an array or arrangement to couple light into more than one light input coupler. In a further embodiment, a light source disposed to couple light into a light input coupler comprises a plurality of LED chips with a light emitting surface area with a light emitting dimension less than one selected from the group: 0.25 millimeters, 0.3 millimeters, 0.5 millimeters, 0.7 millimeters, 1 millimeter, 1.25 millimeters, 1.5 millimeters, 2 millimeters and 3 millimeters.

Light Input Couplers on Different Sides of the Lightguide

In another embodiment, a plurality of light input couplers are disposed on two or more edge regions of a lightguide wherein the optical axes of the light exiting the coupling lightguides are oriented at an angle greater than 0 degrees to each other. In a further embodiment, the light input couplers are disposed on opposite or adjacent edges or sides of the lightguide. In one embodiment, a light emitting device comprises a plurality of light input couplers disposed on two or more edge regions of a lightguide and the luminance or color uniformity of the light emitting region is substantially the same when the light output of the first light input coupler is increased or decreased relative to the light output of the second light input coupler. In one embodiment, the light extraction features are disposed within the light emitting region such that the spatial luminance uniformity is greater than 70% when receiving light from only the first light input coupler and receiving light from the first and second light input couplers. In another embodiment, the light extraction features are disposed within the light emitting region such that the 9-spot spatial color non-uniformity is less than 0.01 when receiving light from only the first light input coupler and receiving light from the first and second light input couplers.

Security Features of the Light Emitting Device

In one embodiment, the light emitting device comprises a security features disposed on one or more components selected from the group: lightguide, light input coupler, cartridge, housing, replaceable or removable component, light extraction region, housing, alignment guide, relative position maintaining element, electrical component, light source module, optical element, thermal transfer element, and coupling lightguides. In another embodiment, the security element provides verification information for the authenticity of one or more components. In one embodiment, the security feature is a printed pattern on an element. For example, a lightguide may comprise very small dots disposed in a specific pattern that can be read by a detector that provides authenticity of the lightguide and the illumination information for the optical output (color, time on/off, pulse frequency/duration, length of time for the lightguide to be authorized, etc.). In another embodiment, the security feature is a digital device that comprises one or more selected from the group: microchip, microprocessor, microcontroller, integrated circuit, computer circuit, memory (flash memory, for example), a computer, a digital storage device (memory, flash memory, hard drive, CDROM, DVD DROM, etc.), radio frequency tag, and an electronic information carrying device.

Wavelength Conversion Material

In a further embodiment, the security feature comprises a layer or coating comprising a wavelength conversion material disposed to receive light from the light source in the light emitting device at a first wavelength and emit light at a second wavelength different than the first. For example, in one embodiment, the lightguide comprises a region with an ink pattern comprising the dye indotricarbocyanine and the light input coupler comprises an infra-red LED configured as a photodetector to receive IR light emitted from the dye due to the excitation from a red visible light emitting LED in the light input coupler. In one embodiment, a portion of the red light emitted from the red LED propagates through a coupling lightguides, reaches the dye and fluoresces such that light propagates in the coupling lightguide back to the input surface and reaches the IR LED configured as an infrared photodetector. In another embodiment, the dye is disposed on a portion of the core region or cladding region of at least one coupling lightguide and an infra-red light absorbing dye, ink, or pigment is disposed on the core or cladding region of the coupling lightguide in the optical path between the region comprising the dye and the light emitting region. In this embodiment, the visible light that might excite the dye, or infrared light received by the lightguide externally would be substantially absorbed before reaching the IR LED. In one embodiment, an IR absorbing dye that is substantially transparent to visible light such as BASF Lumogen IR 765 is used to absorb ambient IR light. In another embodiment, the IR fluorescing dye is disposed on the cladding of a coupling lightguide and the coupling lightguide or lightguide comprises a light absorbing region between the IR fluorescing dye and the light emitting region that absorbs at least 50% of the light at the peak excitation wavelength of the dye or at least 50% of the light at the peak sensitivity of the IR LED configured as a photodetector. For example, in the previous embodiment, a light absorbing ink that absorbs greater than 50% of visible and IR light at the peak wavelength of sensitivity of the IR LED may be printed in a linear band on the lightguide within the housing after the coupling lightguides and before the light emitting region. In this example, the light absorbing ink also absorbs unwanted light that is coupled into the cladding region of the coupling lightguides which can be extracted due to fingerprints or scratches in the cladding layer in the lightguide and cause undesirable light emitting patterns or noise.

In another embodiment, the wavelength conversion material is disposed on or within a region or component of the light emitting device selected from the group: lateral edge, light input edge, light input surface, cladding region, core region, coupling lightguide, light mixing region, light emitting region, light extraction feature, coating or region between two regions of the lightguide, tab region, alignment region, relative position maintaining element, housing, light source, light input coupler, alignment guide, cavity region, light turning optical element, light collimating optical element, light coupling optical element, guide device, removable or replaceable cartridge or component, light extraction region, low contact area cover, thermal transfer element, other optical film, adhesive, and light absorbing region or layer.

In another embodiment, the light emitting device uses an IR photodetector to detect the presence of the IR fluorescing dye during one or more selected from the group: device startup, during regular intervals (every minute for example), irregular intervals (3 times a day at random time for example), when the light source is turned on, when the cartridge or lightguide is inserted, and when the replaceable or removable element is re-inserted. In a further embodiment, the light emitting device comprises a light source with a wavelength less than about 420 nm or greater than about 680 nm and a photodetector disposed to detect light. For example, in one embodiment, the light input coupler comprises an IR LED and a region of a coupling lightguide comprises an IR reflecting pigment and an IR light absorbing region is disposed between the IR reflecting pigment and the light emitting region. In this embodiment, the IR LED can be programmed to pulse at a specific time and a portion of the light propagating through the coupling lightguides reaches the IR light reflecting pigment and is reflected back toward the light input coupler and reaches the IR light photodetector. The IR light intensity reaching the IR photodetector may be required to be above a specific level (indicating that enough light reflected from within the lightguide from the IR reflecting pigment) such that the lightguide is authorized. In another embodiment, the light received by the IR photodetector is compared with the background IR light intensity (when the IR LED is off and one, none, or more than one visible light LEDs are turned on depending on the configuration) and if the intensity ratio is above a specific number (such as 2, 5, 10, 20, etc.) then the film is considered authorized.

Method of Manufacturing Light Input/Output Coupler

In one embodiment, the lightguide and light input or output coupler are formed from a light transmitting film by creating segments of the film corresponding to the coupling lightguides and translating and bending the segments such that a plurality of segments overlap. In a further embodiment, the input surfaces of the coupling lightguides are arranged to create a collective light input surface by translation of the coupling lightguides to create at least one bend or fold.

In another embodiment, a method of manufacturing a lightguide and light input coupler comprising a light transmitting film with a lightguide region continuously coupled to each coupling lightguide in an array of coupling lightguides, said array of coupling lightguides comprising a first linear fold region and a second linear fold region, comprises the steps: (a) increasing the distance between the first linear fold region and the second linear fold region of the array of coupling lightguides in a direction perpendicular to the light transmitting film surface at the first linear fold region; (b) decreasing the distance between the first linear fold region and the second linear fold region of the array of coupling lightguides in a direction substantially perpendicular to the first linear fold region and parallel to the light transmitting film surface at the first linear fold region; (c) increasing the distance between the first linear fold region and the second linear fold region of the array of coupling lightguides in a direction substantially parallel to the first linear fold region and parallel to the light transmitting film surface at the first linear fold region; decreasing the distance between the first linear fold region and the second linear fold region of the array of coupling lightguides in a direction perpendicular to the light transmitting film surface at the first linear fold region; (d) such that the coupling lightguides are bent, disposed substantially one above another, and aligned substantially parallel to each other. These steps (a), (b), (c) and (d) do not need to occur in alphabetical order and the linear fold regions may be substantially parallel.

In one embodiment, the method of assembly includes translating the first and second linear fold regions of the array of coupling lightguides (segments) in relative directions such that the coupling lightguides are arranged in an ordered, sequential arrangement and a plurality of coupling lightguides comprise a curved bend. The coupling lightguides can overlap and can be aligned relative to one another to create a collection of coupling lightguides. The first linear fold region of the collection of coupling may be further bent, curved, or folded, glued, clamped, cut, or otherwise modified to create a light input surface wherein the surface area is suitable to receive and transmit light from a light source into the coupling lightguides. Linear fold regions are regions of the light transmitting film that comprise a fold after the coupling lightguides are bent in at least one direction. The linear fold regions have a width that at least comprises at least one bend of a coupling lightguide and may further include the region of the film physically, optically, or mechanically coupled to a relative position maintaining element. The linear fold regions are substantially co-planar with the surface of the film within the region and the linear fold regions have a length direction substantially larger than the width direction such that the linear fold regions have a direction of orientation in the length direction parallel to the plane of the film. In one embodiment, the array of coupling lightguides are oriented at an angle greater than 0 degrees and less than 90 degrees to the first linear fold region.

As used herein, the first linear fold region or the second linear fold region may be disposed near or include the input or output end of the coupling lightguides. In embodiments where the device is used to collect light, the input end may be near the light mixing region, lightguide region, or lightguide and the output end may be near the light emitting edges of the coupling lightguides such as in the case where the coupling lightguides couple light received from the lightguide or lightguide region into a light emitting surface which is disposed to direct light onto a photovoltaic cell. In the embodiments and configurations disclosed herein, the first linear fold region or second linear fold region may be transposed to create further embodiments for configurations where the direction of light propagation is substantially reversed.

In one embodiment, the array of coupling lightguides have a first linear folding region and a second linear folding region and the method of manufacturing the light input coupler comprises translating steps that create the overlap and bends while substantially maintaining the relative position of the coupling lightguides within the first and second linear folding regions. In one embodiment, maintaining the relative position of the coupling lightguides assists with the ordered bending and alignment and can allow the coupling lightguide folding and overlap without creating a disordered or tangled arrangement of coupling lightguides. This can significantly improve the assembly and alignment and reduce the volume required, particularly for very thin films or coupling lightguides and/or very narrow coupling light strip widths.

In one embodiment, the aforementioned steps for a method of manufacturing a lightguide and light input coupler comprising a light transmitting film with a lightguide region are performed such that at least at least one of steps (a) and (b) occur substantially simultaneously; steps (c) and (d) occur substantially simultaneously; and steps (c) and (d) occur following steps (a) and (b). In another embodiment, the aforementioned steps for a method of manufacturing a lightguide and light input coupler comprising a light transmitting film with a lightguide region are performed such that steps (a), (b), and (c) occur substantially simultaneously. The relative translation first linear folding region and the second linear folding region of the coupling lightguides may be achieved by holding a linear folding region stationary and translating the other linear folding region. In a further embodiment, a relative position maintaining elements disposed at the first folding region remains substantially stationary while a second relative position maintaining element at the second linear folding region is translated. The translation may occur in an arc-like pattern within one or more planes, or in directions parallel to or at an angle to the x, y, or z axis.

In another embodiment, the aforementioned steps are performed while substantially maintaining the relative position of the of the array of coupling lightguides within the first linear fold region relative to each other in a direction parallel to the first linear fold region and substantially maintaining the relative position of the array of coupling lightguides within the second linear fold region relative to each other in a direction parallel to the first linear fold region.

In a further embodiment, the distance between the first linear fold region and second linear fold region of the array of coupling lightguides is increased by at least the distance, D, that is the total width, $W_t$, of the array of the coupling lightguides in a direction substantially parallel to the first linear fold region.

In another embodiment, the array of coupling lightguides comprises a number, N, of coupling lightguides that have substantially the same width, $W_s$, in a direction parallel to the first linear fold region and $D=N \times W_s$.

Relative Position Maintaining Element

In one embodiment, at least one relative position maintaining element substantially maintains the relative position of the coupling lightguides in the region of the first linear fold region, the second linear fold region or both the first and second linear fold regions. In one embodiment, the relative position maintaining element is disposed adjacent the first linear fold region of the array of coupling lightguides such that the combination of the relative position maintaining element with the coupling lightguide provides sufficient stability or rigidity to substantially maintain the relative position of the coupling lightguides within the first linear fold region during translational movements of the first linear fold region relative to the second linear fold region to create the overlapping collection of coupling lightguides and the bends in the coupling lightguides. The relative position maintaining element may be adhered, clamped, disposed in contact, disposed against a linear fold region or disposed between a linear fold region and a lightguide region. The relative position maintaining element may be a polymer or metal component that is adhered or held against the surface of the coupling lightguides, light mixing region, lightguide region or film at least during one of the translational steps. In one embodiment, the relative position maintaining element is a polymeric strip with planar or saw-tooth-like teeth adhered to either side of the film near the first linear fold region, second linear fold region, or both first and second linear fold regions of the coupling lightguides. By using saw-tooth-like teeth, the teeth can promote or facilitate the bends by providing angled guides. In another embodiment, the relative position maintaining element is a mechanical device with a first clamp and a second clamp that holds the coupling lightguides in relative position in a direction parallel to the clamps parallel to the first linear fold region and translates the position of the clamps relative to each other such that the first linear fold region and the second linear fold region are translated with respect to each other to create overlapping coupling lightguides and bends in the coupling lightguides. In another embodiment, the relative position maintaining element maintains the relative position of the coupling lightguides in the first linear fold region, second linear fold region, or both the first and second linear fold regions and provides a mechanism to exert force upon the end of the coupling lightguides to translate them in at least one direction.

In another embodiment, the relative position maintaining element comprises angular teeth or regions that redistribute the force at the time of bending at least one coupling lightguide or maintains an even redistribution of force after at least one coupling lightguide is bent or folded. In another embodiment, the relative position maintaining element redistributes the force from bending and pulling one or more coupling lightguides from a corner point to substantially the length of an angled guide. In another embodiment, the edge of the angled guide is rounded.

In another embodiment, the relative position maintaining element redistributes the force from bending during the bending operation and provides the resistance to maintain the force required to maintain a low profile (short dimension in the thickness direction) of the coupling lightguides. In one embodiment, the relative position maintaining element comprises a low contact area region, material, or surface relief regions operating as a low contact area material, cover, or region wherein one or more surface relief features are in physical contact with the region of the lightguide during the folding operation and/or in use of the light emitting device. In one embodiment, the low contact area surface relief features on the relative position maintaining element reduce decoupling of light from the coupling lightguides, lightguide, light mixing region, lightguide region, or light emitting region.

In a further embodiment, the relative position maintaining element is also a thermal transfer element. In one embodiment, the relative position maintaining element is an aluminum component with angled guides or teeth that is thermally coupled to an LED light source.

In a further embodiment, the input ends and output ends of the array of coupling lightguides are each disposed in physical contact with relative position maintaining elements during the aforementioned steps (a), (b), (c) and (d).

In one embodiment, a relative position maintaining element disposed proximal to the first linear fold region of the array of coupling lightguides has an input cross-sectional edge in a plane parallel to the light transmitting film that is substantially linear and parallel to the first linear fold region, and a relative position maintaining element disposed proximal to the second linear fold region of the array of coupling lightguides at the second linear fold region of the array of coupling lightguides has a cross-sectional edge in a plane parallel to the light transmitting film at the second linear fold region substantially linear and parallel to the linear fold region.

In another embodiment, the cross-sectional edge of the relative position maintaining element disposed proximal to the first linear fold region of the array of coupling lightguides remains substantially parallel to the cross-sectional edge of the relative position maintaining element disposed proximal to the second linear fold region of the array of coupling lightguides during steps (a), (b), (c), and (d).

In a further embodiment, the relative position maintaining element disposed proximal to the first linear fold region has a cross-sectional edge in a plane parallel to the light transmitting film surface disposed proximal to the first linear fold region that comprises a substantially linear section oriented at an angle greater than 10 degrees to the first linear fold region for at least one coupling lightguide. In a further embodiment, the relative position maintaining element has saw-tooth-like teeth oriented substantially at 45 degrees to a linear fold region of the coupling lightguides.

In one embodiment, the cross-sectional edge of the relative position maintaining element forms a guiding edge to guide the bend of at least one coupling lightguide. In another embodiment, the relative position maintaining element is thicker than the coupling lightguide that is folded around or near the relative position maintaining element such that the relative position maintaining element (or a region such as a tooth or angular extended region) does not cut or provide a narrow region for localized stress that could cut, crack, or induce stress on the coupling lightguide. In another embodiment, the ratio of the relative position maintaining element or the component (such as an angled tooth) thickness to the average thickness of the coupling lightguide(s) in contact during or after the folding is greater than one selected from the group of 1, 1.5, 2, 3, 4, 5, 10, 15, 20, and 25. In one embodiment the relative position maintaining element (or component thereof) that is in contact with the coupling lightguide(s) during or after the folding is greater than one selected from the group: 0.05, 0.1, 0.2, 0.3, 0.5, 0.6, 0.7, 0.8, 0.9, and 1 millimeter.

In another embodiment, the aforementioned method further comprises the step of cutting through the overlapping coupling lightguides to provide an array of input edges of the coupling lightguides that end in substantially one plane orthogonal to the light transmitting film surface. The coupling lightguides may be formed by cutting the film in lines to form slits in the film. In another embodiment, the aforementioned method of manufacture further comprises forming an array of coupling lightguides in a light transmitting film by cutting substantially parallel lines within a light transmitting film. In one embodiment, the slits are substantially parallel and equally spaced apart. In another embodiment, the slits are not substantially parallel or have non-constant separations.

In another embodiment, the aforementioned method further comprises the step of holding the overlapping array of coupling lightguides in a fixed relative position by at least one selected from the group: clamping them together, restricting movement by disposing walls or a housing around one or more surfaces of the overlapping array of coupling lightguides, and adhering them together or to one or more surfaces.

In another embodiment, a method of manufacturing a lightguide and light input coupler comprising a light transmitting film with a lightguide region continuously coupled to each coupling lightguide in an array of coupling lightguides, said array of coupling lightguides comprising a first linear fold region and a second linear fold region substantially parallel to the first fold region, comprises the steps: (a) forming an array of coupling lightguides physically coupled to a lightguide region in a light transmitting film by physically separating at least two regions of a light transmitting film in a first direction; (b) increasing the distance between the first linear fold region and the second linear fold region of the array of coupling lightguides in a direction perpendicular to the light transmitting film surface at the first linear fold region; (c) decreasing the distance between the first linear fold region and the second linear fold region of the array of coupling lightguides in a direction substantially perpendicular to the first linear fold region and parallel to the light transmitting film surface at the first linear fold region; (d) increasing the distance between the first linear fold region and the second linear fold region of the array of coupling lightguides in a direction substantially parallel to the first linear fold region and parallel to the light transmitting film surface at the first linear fold region; and (e) decreasing the distance between the first linear fold region and the second linear fold region of the array of coupling lightguides in a direction perpendicular to the light transmitting film surface at the first linear fold region; such that the coupling lightguides are bent, disposed substantially one above another, and aligned substantially parallel to each other.

In another embodiment, a method of manufacturing a lightguide and light input coupler comprising a light transmitting film with a lightguide region optically and physically coupled to each coupling lightguide in an array of coupling lightguides, said array of coupling lightguides comprising a first fold region and a second fold region, comprises the steps: (a) translating the first fold region and the second fold region away from each other in a direction substantially perpendicular to the film surface at the first fold region such that they move toward each other in a plane parallel to the film surface at the first fold region and (b) translating the first fold region and the second fold region away from each other in a direction parallel to the first fold region such that the first fold region and second fold region move toward each other in a direction substantially perpendicular to the film surface at the first fold region such that the coupling lightguides are bent and disposed substantially one above another.

Stress Induced Scattering

The bending or folding of a film-based coupling lightguide may result in stress-induced scattering in a region that caused a portion of the light within the coupling lightguide to be scattered into a direction such that it exits the lightguide near the region. The stress induced scattering may be of the type stress cracking, stress whitening, shear bands, stress crazing, or other visible material deformation resulting in a scattering region due to stress. Stress induced deformations such as stress cracking, stress whitening, shear bands, and stress crazing are described in "Characterization and failure analysis of plastics," ASM International (2003) and can cause significant scattering of light.

In one embodiment, stress induced scattering in one or more coupling lightguides induced by bending or folding is reduced by bending or folding the coupling lightguides at a higher temperature. In another embodiment, stress induced scattering in one or more coupling lightguides induced by bending or folding is be reduced after bending or folding by subjecting one more coupling lightguides or regions of coupling lightguides to a temperature higher than one selected from the group: the glass transition temperature, the ASTM D1525 version 09 Vicat softening temperature, the temperature 10 degrees less than the glass transition temperature, and the temperature equal to or higher than the melt temperature.

Coupling Lightguides Heated while Bending

In one embodiment, the coupling lightguides are bent or folded while heated to temperature above 30 degrees Celsius. In one embodiment, coupling lightguides comprising at least one material which results in stress induced scattering when bent or folded at a first temperature less than 30 degrees Celsius are heated to a temperature greater than 30 degrees Celsius and bent or folded to create bend or fold regions that are substantially free of stress induced scattering. A coupling lightguide substantially free of stress induced scattering does not scatter more than 1% of the light propagating within the coupling lightguide out of the lightguide in the bend, fold or stressed region due stress induced scattering of light out of the coupling lightguide when illuminated with light from a light input coupler. A coupling lightguide substantially free of stress induced scattering does not have a scattering region visible by eye in the area of the bend, fold, or stressed region when the coupling lightguide is viewed in transmission by eye at 5 degrees off-axis to the light incident to the coupling lightguide normal to the surface from a halogen light source collimated to less than 20 degrees at a distance of 3.048 meters.

In one embodiment, the bending or folding of the coupling lightguides occurs at a temperature of at least one selected from the group: greater than room temperature, greater than 27 degrees Celsius, greater than 30 degrees Celsius, greater than 40 degrees Celsius, greater than 50 degrees Celsius, greater than 60 degrees Celsius, greater than the glass transition temperature of the core material, greater than the glass transition temperature of the cladding material, greater than the ASTM D1525 version 09 Vicat softening temperature of the core material, greater than the ASTM D1525 version 09 Vicat softening temperature of the cladding material, and greater than the ASTM D1525 version 09 Vicat softening temperature of the coupling lightguide film or film composite.

Coupling Lightguide with Fold Regions

In one embodiment, a lightguide comprises a coupling lightguide comprising fold regions defined by fold lines and a reflective edge that substantially overlap such that the collection of light input edges form a light input surface. In a further embodiment, one or more fold regions comprise a first reflective surface edge disposed to redirect a portion of light from a light source input at a light input edge of the film into an angle less than the critical such that it does not escape the coupling lightguide at the reflective edge or the lightguide region at an outer edge (such as the edge distal from the light source). In another embodiment, one or more fold regions comprise a second reflective surface edge disposed to redirect a portion of light input from a light input edge of the film into an angle such that it does not escape the coupling lightguide at the reflective edge. In a further embodiment, the first and second reflected surface edges substantially collimate a portion of the light from the light source. In another embodiment, the first and second reflected surface edges have a parabolic shape.

The reflective surface edge may be an edge of the film formed through a cutting, stamping or other edge forming technique and the reflective properties may be due to total internal reflection or an applied coating (such as a reflective ink coating or sputter coated aluminum coating). The reflective surface edge may be linear, parabolic, angled, arcuate, faceted, or other shape designed to control the angular reflection of light receive from the light input edge. The first and second reflective surface edges may have different shapes or orientations to achieve desired optical functions. The reflective surface edge may serve to redirect light to angles less than the critical angle, collimate light, or redirect light flux to a specific region to improve spatial or angular luminance, color, or light output uniformity.

In one embodiment, the reflective edge is angled, curved, or faceted to direct by total internal reflection a first portion of the light from the light source into the lightguide region. In a further embodiment, the reflective edge comprises a reflective coating.

In one embodiment, the fold line is angled or curved such that the fold regions are at least one selected from the group: at an angle to each other, at an angle to one or more edges of the light input coupler, lightguide region, or light input surface, and at an angle to the optical axis of a light source wherein the angle is greater than 0 degrees and less than 180 degrees.

One or more regions or edges of the film-based lightguide, such as the reflective edges or the reflective surface edges may be stacked and coated. For example, more than one lightguide may be stacked to coat the reflective edges using sputter coating, vapor deposition, or other techniques. Similarly, the reflective surface edges may be folded and coated with a reflective material. Spacers, protective films or layers or materials may be used to separate the films or edges.

A lightguide with fold regions can reduce or eliminate the need for cutting and folding the coupling lightguides. By forming reflective surface edges such as collimating surfaces for light incident from the light source which are cut from the single film, light can be redirected such that light does not escape out of the lightguide at the angled edge (from the light sources nearest the lightguide region, for example) and the light from the light source is not coupled out of the lightguide at the opposite edge (such as light from the LEDs nearest the lightguide incident on the opposite edge of the lightguide region at an angle less than the critical angle). In a further embodiment, the shape of the first and second reflective surface edges varies from the light source nearest the lightguide region or light emitting region toward the farthest fold region from the lightguide region or light emitting region. In one embodiment, the light source farthest from the lightguide region or light emitting region has a second reflective surface edge formed by the reflective edge and the first reflective surface edge is angled to permit light from the light source to reach the lightguide region or light emitting region without reflecting from the reflective edge. In a further embodiment, the second reflective surface edges redirect light from the light source incident in a direction away from the lightguide region or light emitting region (in the unfolded layout) toward the reflective edge at an angle greater than the critical angle and the first reflective surface edges redirect light from the light source incident in a direction toward the lightguide region or light emitting region toward the reflective edge at an angle greater than the critical angle or allow light from the light source to directly propagate toward the lightguide region or light emitting region without reflecting from the reflective edge.

In one embodiment, the film-based lightguide with a light input coupler comprising a coupling lightguide with fold regions is formed by folding a lightguide film along fold lines and overlapping the fold regions at a first light input edge. In one embodiment, the film-based lightguide is folded prior to cutting. By folding prior to cutting, the edges of the internal layers may have improved surface qualities when mechanically cutting, for example. In a further embodiment, the film-based lightguide is cut prior to folding. By cutting prior to folding, multiple lightguide films may be stacked together to reduce the number of cuts needed. Additionally, by cutting prior to folding, the first and second reflective surfaces may have different individual shapes and the reflective edge may be angled or curved.

In a further embodiment, multiple film lightguides are stacked or disposed one above another in the light input coupler region and the fold regions (or plurality of coupling lightguides) are interwoven or alternating. For example, two film-based lightguides may be stack upon each other and the fold regions may be simultaneously folded in both lightguides by a mechanical film folder (such as folding machines used in the paper industry). This can reduce the number of folding steps and allow for multiple lightguides to be illuminated by a single light input coupler or light source. Interleaving the lightguides can also increase the uniformity since the light extraction features (location, size, depth, etc.) within each lightguide may be different and independently controlled. Additionally, multiple lightguides wherein the lightguide region or light emitting regions do not overlap or only partially overlap may be illuminated by a single light input coupler. For example, by folding two lightguides together, the display and backlit keypad in a phone, the display and backlit keyboard in a computer, or the frontlight and keypad in a portable device such as an electronic book may be illuminated by the same light source or light source package. In a further embodiment, two separate light emitting regions within a single lightguide film are illuminated by a folded light input coupler (or light input coupler comprising a plurality of coupling lightguides).

The fold for the film, the lightguide region, or the light mixing region may be a similar radius of curvature to the coupling lightguides or strips used in the light input coupler comprising a plurality of coupling lightguides. In another embodiment, the lightguide is held in two or more regions and a plurality of wires are brought toward each other wherein the wires contact the film near the fold lines in an alternating format and form the bends in the film. The input edges of the fold regions or regions of the fold regions may then be held or bonded together such that the wires can be removed, and the folds remain. In one embodiment, the folds along the fold lines are not "creases" in that they do not form visible lines or creases when the film is unfolded. In another embodiment, teeth or plates moving in directions toward each other press alternating fold lines in opposite directions and create the "zig-zag", accordion-like, or bellow-like folds in the film. A housing or fold maintaining element such as a holding device for holding a plurality of coupling lightguides may be used to hold together, house, or protect the coupling lightguide formed from a plurality of fold regions. Similarly to the housing or holding device for a plurality of coupling lightguides, the housing may comprise an optically coupled window, refractive lenses or other features, elements or properties used in the housing, folder, or holding device for a plurality of coupling lightguides. In a further embodiment, the housing, folder, or holding device comprises alternating rigid elements on two opposing parts such that when the elements are brought together, a film disposed between the elements is folded in a bellow-like manner creating fold regions within a coupling lightguide.

Packaging

In one embodiment, a kit suitable for providing illumination comprises a light source, a light input coupler, and a lightguide.

Roll-Up or Retractable Lightguide

In one embodiment, the flexible light emitting device can be rolled up into a tube of a diameter less than one selected from the group: 152.4 mm, 76.2 mm, 50.8 mm and 25.4 mm. In another embodiment, the flexible light emitting device comprises a spring or elastic-based take-up mechanism which can draw a portion of the lightguide, the light emitting region, or the lightguide region inside the housing. For example, the light emitting region of the film can be retracted into a cylindrical tube when a button on the device is pressed to provide secure, protected storage.

Lamination or Use with Other Films

In one embodiment, at least one selected from the group: lightguide, light transmitting film, light emitting device housing, thermal transfer element, and component of the light emitting device is laminated to or disposed adjacent to at least one selected from the group: reflection film, prismatic film reflective polarizer, low refractive index film, pressure sensitive adhesive, air gaps, light absorbing films, anti-glare coatings, anti-reflection coatings, protective film, barrier film, and low tack adhesive film.

Film Production

In one embodiment, the film or lightguide is one selected from the group: extruded film, co-extruded film, cast film, solvent cast film, UV cast film, pressed film, injection molded film, knife coated film, spin coated film, and coated film. In one embodiment, one or two cladding layers are co-extruded on one or both sides of a lightguide region. In another embodiment, tie layers, adhesion promotion layers, materials or surface modifications are disposed on a surface of or between the cladding layer and the lightguide layer. In one embodiment, the coupling lightguides, or core regions thereof, are continuous with the lightguide region of the film as formed during the film formation process. For example, coupling lightguides formed by slicing regions of a film at spaced intervals can form coupling lightguides that are continuous with the lightguide region of the film. In another embodiment, a film-based lightguide with coupling lightguides continuous with the lightguide region can be formed by injection molding or casting a material in a mold comprising a lightguide region with coupling lightguide regions with separations between the coupling lightguides. In one embodiment, the region between the coupling lightguides and the lightguide region is homogeneous and without interfacial transitions such as without limitation, air gaps, minor variations in refractive index, discontinuities in shapes or input-output areas, and minor variations in the molecular weight or material compositions.

In another embodiment, at least one selected from the group: lightguide layer, light transmitting film, cladding region, adhesive region, adhesion promotion region, or scratch resistant layer is coated onto one or more surfaces of the film or lightguide. In another embodiment, the lightguide or cladding region is coated onto, extruded onto or otherwise disposed onto a carrier film. In one embodiment, the carrier film permits at least one selected from the group: easy handling, fewer static problems, the ability to use traditional paper or packaging folding equipment, surface protection (scratches, dust, creases, etc.), assisting in obtaining flat edges of the lightguide during the cutting operation, UV absorption, transportation protection, and the use of winding and film equipment with a wider range of tension and flatness or alignment adjustments. In one embodiment, the carrier film is removed before coating the film, before bending the coupling lightguide, after folding the coupling lightguides, before adding light extraction features, after adding light extraction features, before printing, after printing, before or after converting processes (further lamination, bonding, die cutting, hole punching, packaging, etc.), just before installation, after installation (when the carrier film is the outer surface), and during the removal process of the lightguide from installation. In one embodiment, one or more additional layers are laminated in segments or regions to the core region (or layers coupled to the core region) such that there are regions of the film without the one or more additional layers. For example, in one embodiment, an optical adhesive functioning as a cladding layer is optically coupled to a touchscreen substrate; and an optical adhesive is used to optically couple the touchscreen substrate to the light emitting region of film-based lightguide, thus leaving the coupling lightguides without a cladding layer for increased input coupling efficiency.

In another embodiment, the carrier film is slit or removed across a region of the coupling lightguides. In this embodiment, the coupling lightguides can be bent or folded to a smaller radius of curvature after the carrier film is removed from the linear fold region.

Separate Coupling Lightguides

In another embodiment, the coupling lightguides are discontinuous with the lightguide and are subsequently optically coupled to the lightguide. In one embodiment, the coupling lightguides are one selected from the group: extruded onto the lightguide, optically coupled to the lightguide using an adhesive, optically coupled to the lightguide by injection molding a light transmitting material that bonds or remains in contact with the coupling lightguides and lightguide, thermally bonded to the lightguide, solvent bonded to the lightguide, laser welded to the lightguide, sonic welded to the lightguide, chemically bonded to the lightguide, and otherwise bonded, adhered or disposed in optical contact with the lightguide. In one embodiment, the thickness of the coupling lightguides is one selected from the group: less than 80%, less than 70%, less than 50%, less than 40%, less than 20%, less than 10% of the thickness of the lightguide. In one embodiment, the coupling lightguides and lightguide region of the light emitting device are molded. This molding method may include, for example without limitation, solvent casting, injection molding, knife coating, spin coating. Examples of materials suitable for molding include, without limitation, solvent cast acrylic and silicone. This molding method may also comprise inverted extraction features in the mold that form extraction features in the molded material. In one embodiment, the mold has a thickness variation in one or more directions, such as in the direction of propagation for example, to form a wedge or tapered lightguide to increase the extraction of light out of the film-based lightguide at the end away from the entrance side. In another embodiment, the light emitting region of a lightguide is illuminated from opposite sides and the taper is from both sides toward the middle. In a further embodiment, a film based lightguide is tapered in first number of directions from a lightguide with light incident into the light emitting region from a second number of sides, wherein the first number is equal to the second number, the first number is four, or the first number is larger than four. In another embodiment, one or more surfaces of the film based lightguide comprises one or more cross-sectional shapes selected from the group: non-linear, arcuate, stepwise, random, optically designed, quasi-random, and other shape to achieve a particular spatial or angular light output profile of the lightguide and/or device.

Glass Laminate

In another embodiment, the lightguide is disposed within or on one side of a glass laminate. In another embodiment, the lightguide is disposed within a safety glass laminate. In a further embodiment, at least one selected from the group: lightguide, cladding, or adhesive layer comprises polyvinyl butyrate.

Patterned Lightguides

In another embodiment, at least one of the lightguide or coupling lightguides is a coated region disposed on a cladding, carrier film, substrate, or other material. By using a coated pattern for the lightguide, different pathways for the light can be achieved for light directed into the coupling lightguides or lightguide. In one embodiment, the lightguide region comprises lightguide regions which direct light to separate light emitting regions wherein the neighboring lightguide regions with light extracting features emit light of a different color. In another embodiment, a lightguide pattern is disposed on a cladding layer, carrier film, or other layer which comprises regions disposed to emit light of two or more colors from two or more light sources coupled into input couplers with coupling lightguides disposed to direct light from the light source to the corresponding patterned (or trace) lightguide. For example, a red LED may be disposed to couple light into a light input coupler with coupling lightguides (which may be film-based or coating based or the same material used for the pattern lightguide coating) to a lightguide pattern wherein the light extraction features emit light in a pattern to provide color in a pixilated color display. In one embodiment, the lightguide pattern or the light extracting region patterns within the lightguide pattern comprises one or more selected from the group: curved sections, bend straight sections, shapes, and other regular and irregular patterns. The coupling lightguides may be comprised of the same material as the patterned lightguides or they may be a different material.

Light Extraction Features

In one embodiment, the light extraction features are disposed on or within a film, lightguide region or cladding region by embossing or employing a "knurl roll" to imprint surface features on a surface. In another embodiment, the light extraction features are created by radiation (such as UV exposure) curing a polymer while it is in contact with a drum, roll, mold or other surface with surface features disposed thereon. In another embodiment, light extraction features are formed in regions where the cladding or low refractive index material or other material on or within the lightguide is removed or formed as a gap. In another embodiment, the lightguide region comprises a light reflecting region wherein light extraction features are formed where the light reflecting region is removed. Light extraction may comprise or be modified (such as the percent of light reaching the region that is extracted or direction profile of the extracted light) by adding scattering, diffusion, or other surface or volumetric prismatic, refracting, diffracting, reflecting, or scattering elements within or adjacent the light extraction features or regions where the cladding or other layer has been removed.

In one embodiment, the light extraction features are volumetric light redirecting features that refract, diffract, scatter, reflect, totally internally reflect, diffuse, or otherwise redirect light. The volumetric features may be disposed within the lightguide, lightguide region, core, cladding, or other layer or region during the production of the layer or region or the features may be disposed on a surface whereupon another surface or layer is subsequently disposed.

In one embodiment, the light extraction features comprise an ink or material within a binder comprising least one selected from the group: titanium dioxide, barium sulfate, metal oxides, microspheres or other non-spherical particles comprising polymers (such as PMMA, polystyrene), rubber, or other inorganic materials. In one embodiment, the ink or material is deposited by one selected from the group: thermal inkjet printing, piezoelectric inkjet printing, continuous inkjet printing, screen printing (solvent or UV), laser printing, sublimation printing, dye-sublimation printing, UV printing, toner-based printing, LED toner printing, solid ink printing, thermal transfer printing, impact printing, offset printing, rotogravure printing, photogravure printing, offset printing, flexographic printing, hot wax dye transfer printing, pad printing, relief printing, letterpress printing, xerography, solid ink printing, foil imaging, foil stamping, hot metal typesetting, in-mold decoration, and in-mold labeling.

In another embodiment, the light extraction features are formed by removing or altering the surface by one selected from the group: mechanical scribing, laser scribing, laser ablation, surface scratching, stamping, hot stamping, sandblasting, radiation exposure, ion bombardment, solvent exposure, material deposition, etching, solvent etching, plasma etching, and chemical etching.

In a further embodiment, the light extraction features are formed by adding material to a surface or region by one selected from the group: UV casting, solvent casting with a mold, injection molding, thermoforming, vacuum forming, vacuum thermoforming, and laminating or otherwise bonding, and coupling a film or region comprising surface relief or volumetric features.

In one embodiment, at least one selected from the group: mask, tool, screen, patterned film or component, photo resist, capillary film, stencil, and other patterned material or element is used to facilitate the transfer of the light extraction feature to the lightguide, film, lightguide region, cladding region or a layer or region disposed on or within the lightguide.

In another embodiment, more than one light extraction layer or region comprising light extraction features is used and the light extraction layer or region may be located on one surface, two surfaces, within the volume, within multiple regions of the volume, or a combination of the aforementioned locations within the film, lightguide, lightguide region, cladding, or a layer or region disposed on or within the lightguide.

In another embodiment, surface or volumetric light extraction features are disposed on or within the lightguide or cladding or a region or surface thereon or between that direct at least one selected from the group: 20%, 40%, 60%, and 80% of light incident from within the lightguide to angles within 30 degrees from the normal to the light emitting surface of the light emitting device or within 30 degrees from the normal of a reflecting surface such as a reflective spatial light modulator.

Folding and Assembly

In one embodiment, the coupling lightguides are heated to soften the lightguides during the folding or bending step. In another embodiment, the coupling lightguides are folded while they are at a temperature above one selected from the group: 50 degrees Celsius, 70 degrees Celsius, 100 degrees Celsius, 150 degrees Celsius, 200 degrees Celsius, and 250 degrees Celsius.

Folder

In one embodiment, the coupling lightguides are folded or bent using opposing folding mechanisms. In another embodiment, grooves, guides, pins, or other counterparts facilitate the bringing together opposing folding mechanisms such that the folds or bends in the coupling lightguides are correctly folded. In another embodiment, registration guides, grooves, pins or other counterparts are disposed on the folder to hold in place or guide one or more coupling lightguides or the lightguide during the folding step. In one embodiment, at least one of the lightguide or coupling lightguides comprises a hole and the holder comprises a registration pin and when the pin is positioned through the hole before and during the folding step, the lightguide or coupling lightguide position relative to the holder is fixed in at least one direction. Examples of folding coupling lightguides or strips for lightguides are disclosed in International Patent Application number PCT/US08/79041 titled "LIGHT COUPLING INTO ILLUMINATED FILMS", the contents of which are incorporated by reference herein.

In one embodiment, the folding mechanism has an opening disposed to receive a strip that is not to be folded in the folding step. In one embodiment, this strip is used to pull the coupling lightguides into a folded position, pull two components of the folding mechanism together, align the folding mechanism components together, or tighten the folding such that the radius of curvature of the coupling lightguides is reduced.

In one embodiment, at least one selected from the group: folding mechanism, relative position maintaining element, holder, or housing is formed from one selected from the group: sheet metal, foil, film, rigid rubber, polymer material, metal material, composite material, and a combination of the aforementioned materials.

Holder

In one embodiment, a light emitting device comprises a folding mechanism which substantially maintains the relative position of the coupling lightguides subsequent to the folding operation. In another embodiment, the folder or housing comprises a cover that is disposed over (such as slides over, folds over, hinges over, clips over, snaps over, etc.) the coupling lightguides and provides substantial containment of the coupling lightguides. In a further embodiment, the folding mechanism is removed after the coupling lightguides have been folded and the holding mechanism is disposed to hold the relative position of the coupling lightguides. In one embodiment, the holding mechanism is a tube with a circular, rectangular, or other geometric shape cross-sectional profile which slides over the coupling lightguides and further comprises a slit where the coupling lightguides, light mixing region, or lightguide exits the tube. In one embodiment, the tube is one selected from the group: transparent, black, has inner walls with a diffuse luminous reflectance greater than 70%, and has a gloss less than 50 in a region disposed proximate a coupling lightguide such that the surface area of the inner tube in contact with the coupling lightguide remains small.

In a further embodiment, a method of manufacturing a light input coupler and lightguide comprises at least one step selected from the group: holding the coupling lightguide, holding the lightguide, cutting the regions in the film corresponding to the coupling lightguides, and folding or bending the coupling lightguides wherein the relative position maintaining element holds the lightguide or coupling lightguide during the cutting and the folding or bending step. In another embodiment, a method of manufacturing a light input coupler and lightguide comprises cutting the coupling lightguides in a film followed by folding or bending the coupling lightguides wherein the same component holding the coupling lightguides or lightguide in place during the cutting also holds the coupling lightguide or lightguide in place during the folding or bending.

In another embodiment, the relative position of at least one region of the coupling lightguides are substantially maintained by one or more selected from the group: wrapping a band, wire, string, fiber, line, strap, wrap or similar tie material around the coupling lightguides or a portion of the coupling lightguides, disposing a housing tube, case, wall or plurality of walls or components around a portion of the coupling lightguides, wrapping a heat-shrinking material around the coupling lightguides and applying heat, bonding the coupling lightguides using adhesives, thermal bonding or other adhesive or bonding techniques in one or more regions of the coupling lightguides (such as near the input end, for example), clamping the lightguides, disposing a low refractive index epoxy, adhesive, or material around, or between one or more regions of the coupling lightguides, pressing together coupling lightguides comprising a pressure sensitive adhesive (or UV cured or thermal adhesive) on one or both sides. In one embodiment, the coupling lightguide region of a film comprises a pressure sensitive adhesive wherein after the coupling lightguides are cut into the film with the adhesive, the coupling lightguides are folded on top of one another and pressed together such that the pressure sensitive adhesive holds them in place. In this embodiment, the pressure sensitive adhesive can have a lower refractive index than the film and operate as cladding layer.

In another embodiment, the folder and/or holder has a plurality of surfaces disposed to direct, align, bring the coupling lightguides together, direct the coupling lightguides to become parallel, or direct the input surfaces of the coupling lightguides toward a light input surface disposed to receive light from an LED when the coupling lightguides are translated in the folder or holder. In one embodiment, the coupling lightguides are guided into a cavity that aligns the coupling lightguides parallel to each other and disposes the input edges of the coupling lightguides near an input window. In one embodiment, the window is open, comprises a flat outer surface, or comprises an optical outer surface suitable for receiving light from a light source. In another embodiment, the folder and/or holder comprises a low contact area surface comprising surface relief features disposed between the folder and/or holder and the lightguide.

Hold-Down Mechanism

In one embodiment, at least one coupling lightguide comprises at least one hook region disposed near the input surface end of the coupling lightguide. The hook region allows a guide, alignment mechanism, or pull-down mechanism to maintain at least one selected from the group: the relative position of the ends or regions near the ends of the coupling lightguides, the relative separations of the coupling lightguides to each other in the thickness direction of the coupling lightguide, the positions of the coupling lightguides relative to the lightguide in the thickness direction of the lightguide, and the positions of the end regions or the ends of the coupling lightguides in one or more directions in a plane substantially parallel to the lightguide. In one embodiment, the hook region comprises at least selected from the group: a flange, a barb, a protrusion, a hole, or an aperture region in the coupling lightguide. In one embodiment, the lightguide or a means for manufacturing a film-based lightguide comprises a hold down mechanism comprising two hook regions comprising flanges on either side of at least one coupling lightguide wherein the flanges permit a strap, wire or other film or object to be positioned against the hook region such that the strap, strip, wire or other film or object substantially maintains the relative position of the ends of the coupling lightguide in at least one direction. In another embodiment, the hold down mechanism comprises a physical restraining mechanism for holding or maintaining the hold down mechanism or the hook region in at least one direction relative to a temporary or permanent base or other component such as holder, relative position maintaining element, housing, thermal transfer element, guide, or tension forming element. In another embodiment, the lightguide or a means for manufacturing a film-based lightguide comprises a hold down mechanism comprising a hook region comprising two holes on either side of the coupling lightguides or near the input end of the coupling lightguides, and the coupling lightguides may be stacked on top of each other and on top of a base element comprising two pins that align with the holes. The pins and holes register the ends of the coupling lightguides and substantially maintain their relative positions near the input end of the coupling lightguides. In another embodiment, one or more coupling lightguides comprise a hook region that can be removed after the hold-down mechanism forces the coupling lightguides together. In another embodiment, the hook region may be removed along with a portion of the end of the coupling lightguides. In one embodiment, the hook regions and the ends of the coupling lightguides are cut, peeled or town off after the coupling lightguides have been strapped or physically coupled to a base or other element. After the hook regions and the coupling lightguides are cut from the remainder of the coupling lightguides, the new ends of the coupling lightguides may form an input surface or a surface suitable to optically couple to one or more optical elements such as windows or secondary optics.

In another embodiment, one or more coupling lightguide comprise a removable hook region comprising an aperture cut from the lightguide that forms the light input surface for the coupling lightguide after removing the hook region. For example, in one embodiment, an array of coupling lightguides are cut into a film wherein the end region of the coupling lightguide near the input edge comprises shoulder-like flanges that extend past the average width of the coupling lightguides and further comprises an aperture cut that extends more than 20% of the width of the coupling lightguides. In this embodiment, the lateral edges of the coupling lightguides and aperture cut can be cut during the same process step and they can both comprises high quality surface edges. When the edge region is removed from the ends of the coupling lightguides using the aperture cut as a separation guide after stacking and aligning using the shoulder-like flanges, the stack of coupling lightguides have a light input surface formed from the collection of edges formed by the aperture cut. Similarly, pin and hole type hook regions may be used and in one embodiment, the hook region does not extend past the width of the coupling lightguides. For example, holes near the width ends of the coupling lightguides may be used as hook regions.

In another embodiment, one or more coupling lightguides is physically coupled to a hold down mechanism and the hold down mechanism is translated in a first direction substantially parallel to the axis of the coupling lightguides such that the coupling lightguides move closer together, closer to the lightguide, or closer to the base. For example, in one embodiment, the end region of the coupling lightguides comprises holes that are aligned onto a pin under low tension. After the coupling lightguides are aligned onto the pins, the pins and the base supporting the pins is translated in a direction away from the coupling lightguides such that the coupling lightguide pull closer toward each other and the base.

Converting or Secondary Operations on the Film or Light Input Coupler

In one embodiment, at least one selected from the group: coupling lightguides, lightguide, light transmitting film, lightguide region, light emitting region, housing, folder, and holder component is stamped, cut, thermoformed, or painted. In one embodiment, the cutting of the component is performed by one selected from the group: knife, scalpel, heated scalpel, die cutter, water jet cutter, saw, hot wire saw, laser cutter, or other blade or sharp edge. One or more components may be stacked before the cutting operation.

In one embodiment, the component is thermoformed (under a vacuum, ambient pressure, or at another pressure)

to create a curved or bent region. In one embodiment, the film is thermoformed into a curve and the coupling lightguide strips are subsequently cut from the curved film and folded in a light input coupler.

In one embodiment, at least one edge selected from the group: coupling lightguide, lightguide, light transmitting film, collection of coupling lightguides, or edge of other layer or material within the light emitting device is modified to become more planar (closer to optically flat), roughened, or formed with a predetermined structure to redirect light at the surface (such as forming Fresnel refracting features on edges of the input coupling lightguides in a region of the collection of coupling lightguides to direct light into the coupling lightguides in a direction closer to a direction parallel to the plane of the coupling lightguides at the input surface (for example, forming a Fresnel collimating lens on the surface of the collection of coupling lightguides disposed near an LED). In one embodiment, the edge modification substantially polishes the edge by laser cutting the edge, mechanically polishing the edge, thermally polishing (surface melting, flame polishing, embossing with a flat surface), chemically polishing (caustics, solvents, methylene chloride vapor polishing, etc.).

Reflective Coating or Element

In one embodiment, at least one region of at least one edge selected from the group: a coupling lightguide, film, and lightguide comprises a substantially specularly reflecting coating or element optically coupled to the region or disposed proximal to the edge. In one embodiment, the substantially specularly reflecting element or coating can redirect light a portion of the light exiting the coupling lightguide, lightguide, or film edge back into the coupling lightguide, lightguide or film at an angle that will propagate by TIR within the lightguide. In one embodiment, the specularly reflective coating is a dispersion of light reflecting material disposed in an ink or other binder selected from the group: dispersions of aluminum, silver, coated flakes, core-shell particles, glass particles, and silica particles. In another embodiment, the dispersion comprises particle sizes selected from one of the group of less than 100 microns in average size, less than 50 microns in average size, less than 10 microns in average size, less than 5 microns in average size, less than 1 micron in average size, less than 500 nm in average size. In another embodiment, the dispersion comprises substantially planar flakes with an average dimension in a direction parallel to the flake surface selected from one of the group of less than 100 microns in average size, less than 50 microns in average size, less than 10 microns in average size, less than 5 microns in average size, less than 1 micron in average size, less than 500 nm in average size. In another embodiment, the coupling lightguides are folded and stacked and a light reflecting coating is applied in regions on the edges of the lightguide. In another embodiment, the light reflecting coating is applied to the tapered region of the collection of coupling lightguides. In a further embodiment, the blade that cuts through the film, coupling lightguide, or lightguide passes through the film during the cutting operation and makes contact with a well comprising reflective ink; and the ink is applied to the edge when the blade passes back by the edge of the film. In another embodiment, a multilayer reflection film, such as a specularly reflecting multilayer polymer film is disposed adjacent to or in optical contact with the coupling lightguides in a region covering at least the region near the edges of the coupling lightguides, and the specularly reflecting multilayer polymer film is formed into substantially a 90 degree bend forming a reflected side to the coupling lightguide. The bending or folding of the reflective film may be achieved during the cutting of the lightguide, coupling lightguides, or tapered region of the coupling lightguides. In this embodiment, the reflective film may be adhered or otherwise physically coupled to the film, coupling lightguide, collection of coupling lightguides, or lightguide and the fold creates a flat reflective surface near the edge to reflect light back into the lightguide, film, coupling lightguide or collection of coupling lightguides. The folding of the reflective film may be accomplished by bending, pressure applied to the film, pressing the lightguide such that a wall or edge bends the reflective film. The reflective film may be disposed such that it extends past the edge prior to the fold. The folding of the reflective film may be performed on multiple stacked edges substantially simultaneously.

The following are more detailed descriptions of various embodiments illustrated in the Figures.

Figure 1:
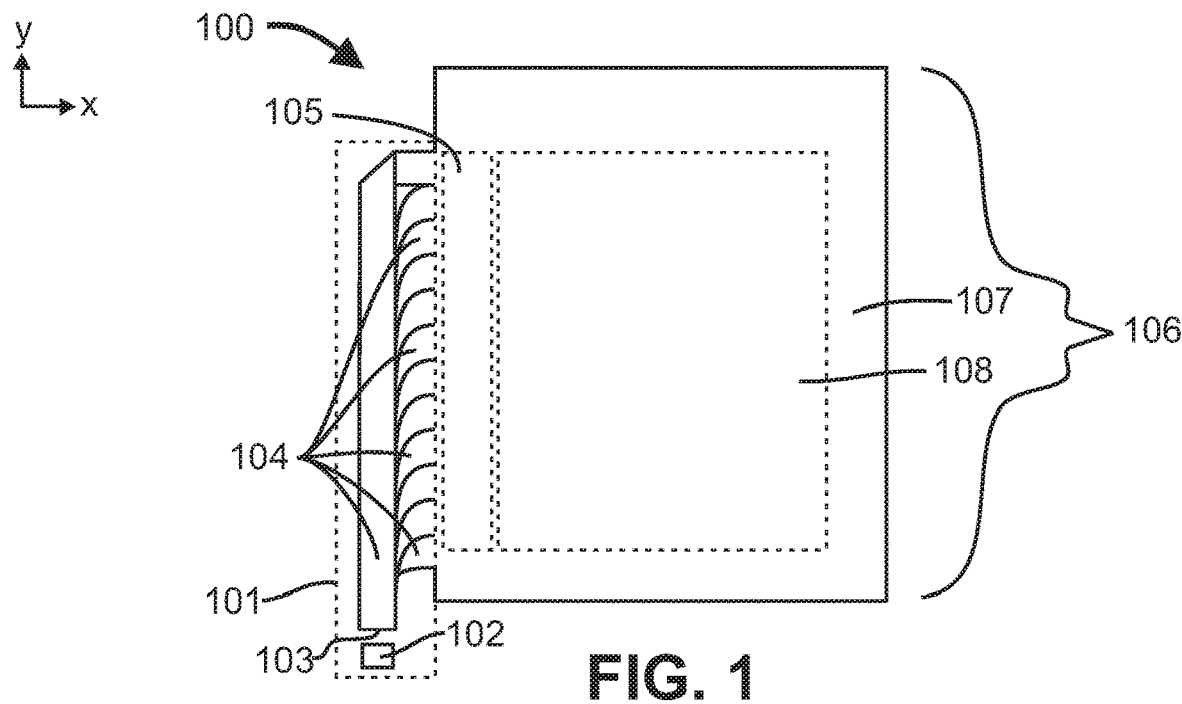
FIG. 1 is a top view of one embodiment of a light emitting device comprising a light input coupler disposed on one side of a lightguide.

FIG. 1 is a top view of one embodiment of a light emitting device 100 comprising a light input coupler 101 disposed on one side of a film-based lightguide. The light input coupler 101 comprises coupling lightguides 104 and a light source 102 disposed to direct light into the coupling lightguides 104 through a light input surface 103 comprising one or more input edges of the coupling lightguides 104. In one embodiment, each coupling lightguide 104 includes a coupling lightguide terminating at a bounding edge. Each coupling lightguide is folded such that the bounding edges of the coupling lightguides are stacked to form the light input surface 103. The light emitting device 100 further comprises a lightguide region 106 comprising a light mixing region 105, a lightguide 107, and a light emitting region 108. Light from the light source 102 exits the light input coupler 101 and enters the lightguide region 106 of the film. This light spatially mixes with light from different coupling lightguides 104 within the light mixing region 105 as it propagates through the lightguide 107. In one embodiment, light is emitted from the lightguide 107 in the light emitting region 108 due to light extraction features (not shown).

Figure 2:
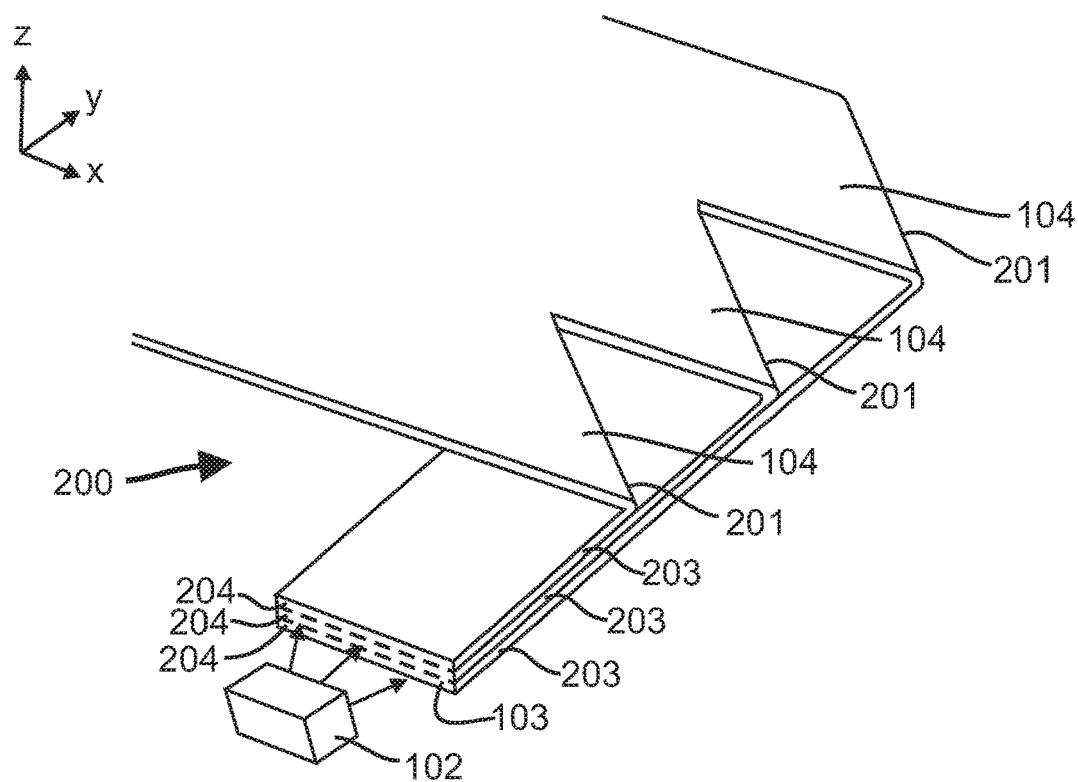
FIG. 2 is a perspective view of one embodiment of a light input coupler with coupling lightguides folded in the −y direction.

FIG. 2 is a perspective view of one embodiment of a light input coupler 200 with coupling lightguides 104 folded in the −y direction. Light from the light source 102 is directed into the light input surface 103 comprising input edges 204 of the coupling lightguides 104. A portion of the light from the light source 102 propagating within the coupling lightguides 104 with a directional component in the +y direction will reflect in the +x and −x directions from the lateral edges 203 of the coupling lightguides 104 and will reflect in the +z and −z directions from the top and bottom surfaces of the coupling lightguides 104. The light propagating within the coupling lightguides is redirected by the folds 201 in the coupling lightguides 104 toward the −x direction.

Figure 3:
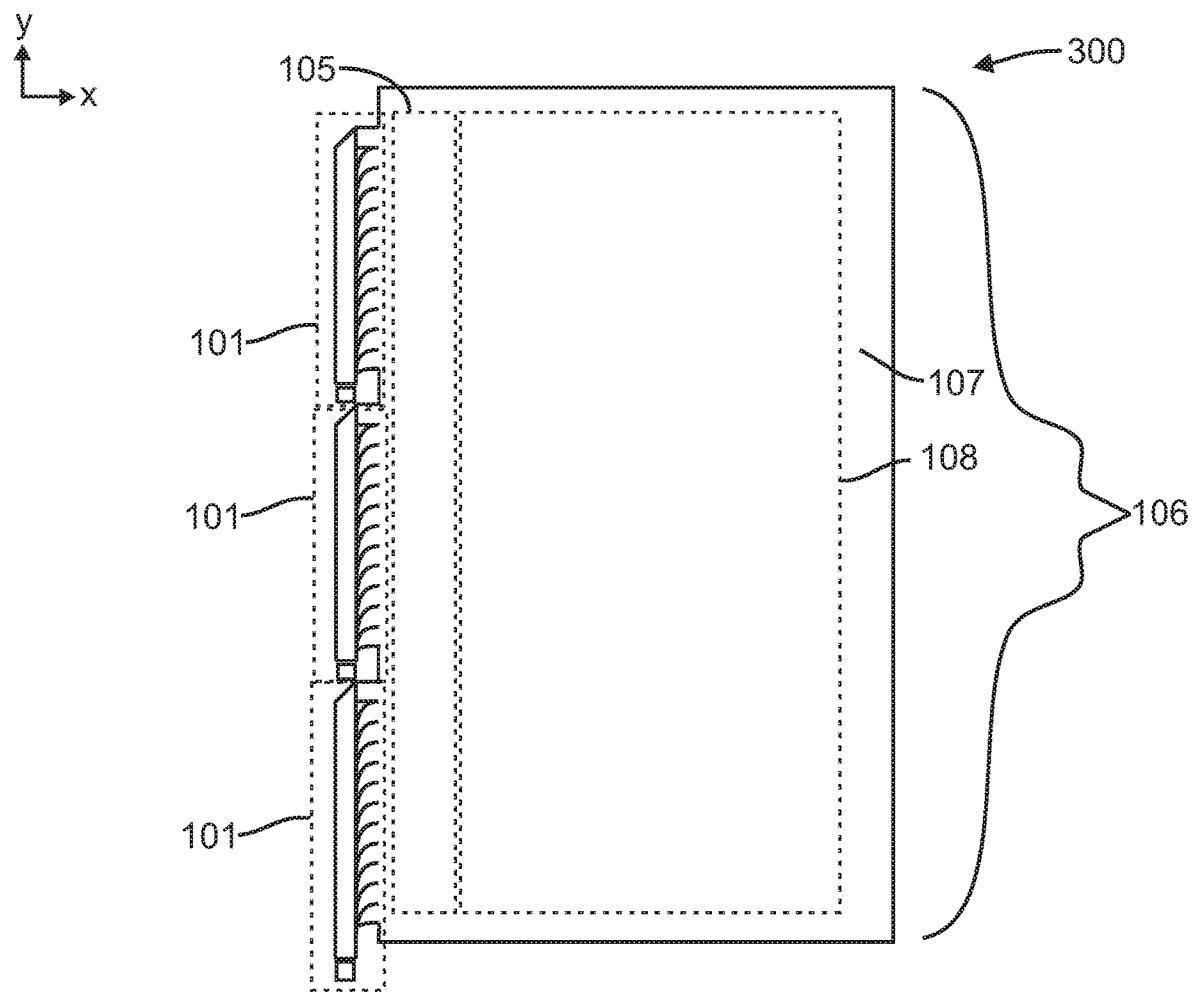
FIG. 3 is a top view of one embodiment of a light emitting device with three light input couplers on one side of a lightguide.

FIG. 3 is a top view of one embodiment of a light emitting device 300 with three light input couplers 101 on one side of the lightguide region 106 comprising the light mixing region 105, a lightguide 107, and the light emitting region 108.

Figure 4:
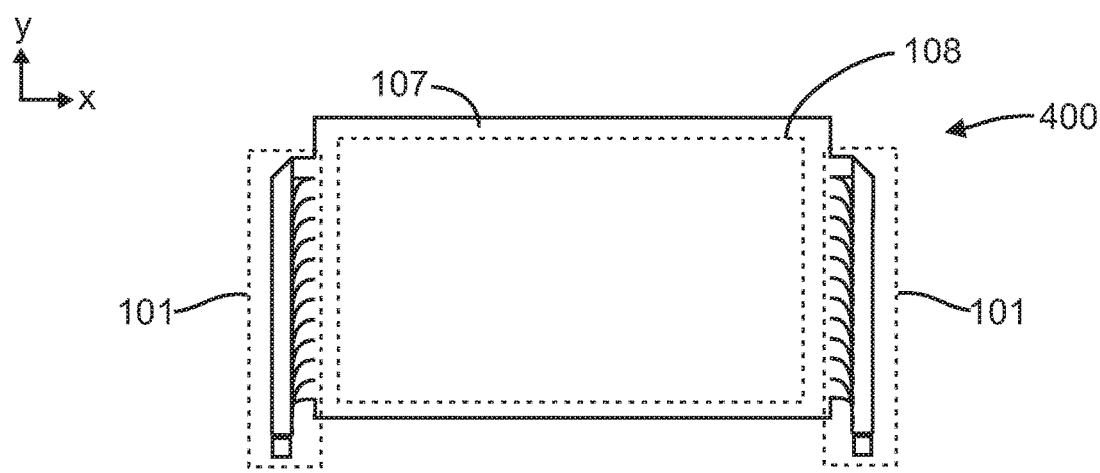
FIG. 4 is a top view of one embodiment of a light emitting device with two light input couplers disposed on opposite sides of a lightguide.

FIG. 4 is a top view of one embodiment of a light emitting device 400 with two light input couplers 101 disposed on opposite sides of the lightguide 107. In certain embodiments, one or more input couplers 101 may be positioned along one or more corresponding sides of the lightguide 107.

Figure 5:
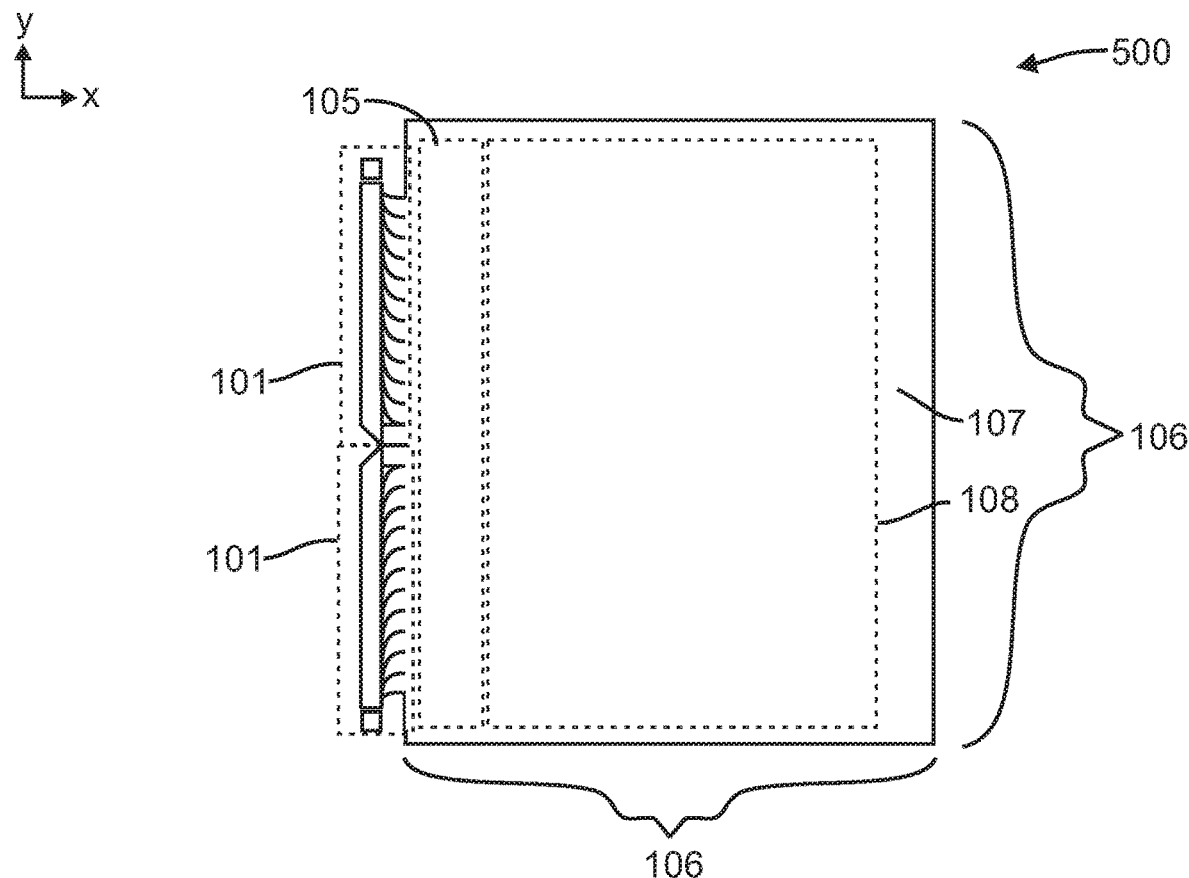
FIG. 5 is a top view of one embodiment of a light emitting device with two light input couplers disposed on the same side of a lightguide wherein the optical axes of the light sources are oriented substantially toward each other.

FIG. 5 is a top view of one embodiment of a light emitting device 500 with two light input couplers 101 disposed on the same side of the lightguide region 106. The light sources 102 are oriented substantially with the light directed toward each other in the +y and −y directions.

Figure 6:
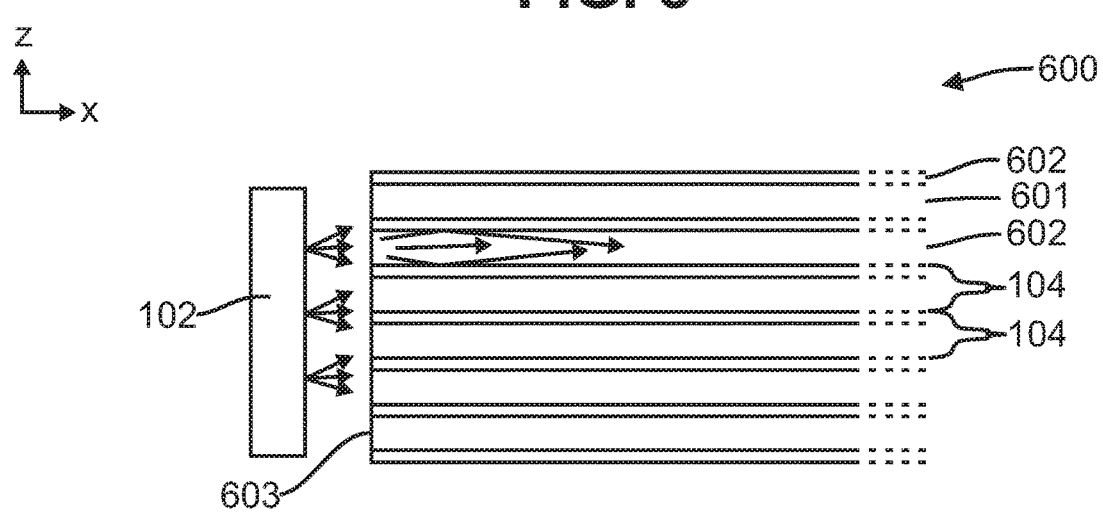
FIG. 6 is a cross-sectional side view of one embodiment of a light emitting device with a substantially flat light input surface comprised of flat edges of a coupling lightguide disposed to receive light from a light source.

FIG. 6 is a cross-sectional side view of one embodiment of a light emitting device 600 defining a region 604 near a substantially planar light input surface 603 comprised of planar edges of coupling lightguides 104 disposed to receive light from a light source 102. The coupling lightguides comprise core regions 601 and cladding regions 602. A portion of the light from the light source 102 input into the core region 601 of the coupling lightguides 104 will totally internally reflect from the interface between the core region 601 and the cladding region 602 of the coupling lightguides 104. In the embodiment shown in FIG. 6, a single cladding region 602 is positioned between adjacent core regions 601. In another embodiment, two or more cladding regions 602 are positioned between adjacent core regions 601.

Figure 7:
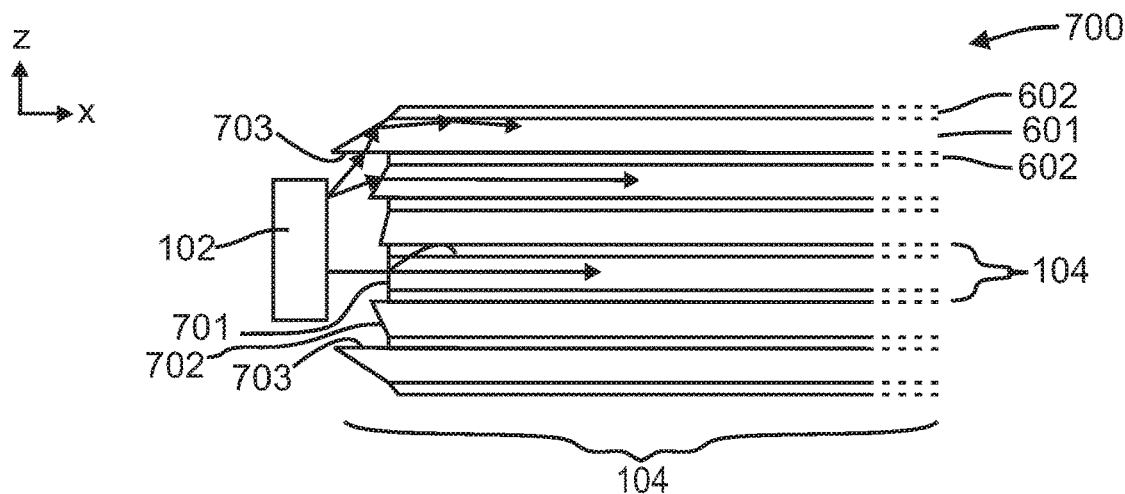
FIG. 7 is a cross-sectional side view of one embodiment of a light emitting device with a light input coupler with a light input surface with refractive and flat surface features on the light input surface wherein light totally internal reflects on some outer surfaces similar to a hybrid refractive-TIR Fresnel lens.

FIG. 7 is a cross-sectional side view of one embodiment of a light emitting device 700 defining a region 704 near a light input surface of the light input coupler 101 having one or more planar surface features 701 substantially parallel to stack direction (z direction as shown in FIG. 7) of the coupling lightguides 104, one or more refractive surface features 702, and one or more planar input surfaces 703 and a bevel formed on an opposite surface of the coupling lightguide 104 that totally internally reflects a portion of incident light into the coupling lightguide 104 similar to a hybrid refractive-TIR Fresnel lens.

Figure 8:
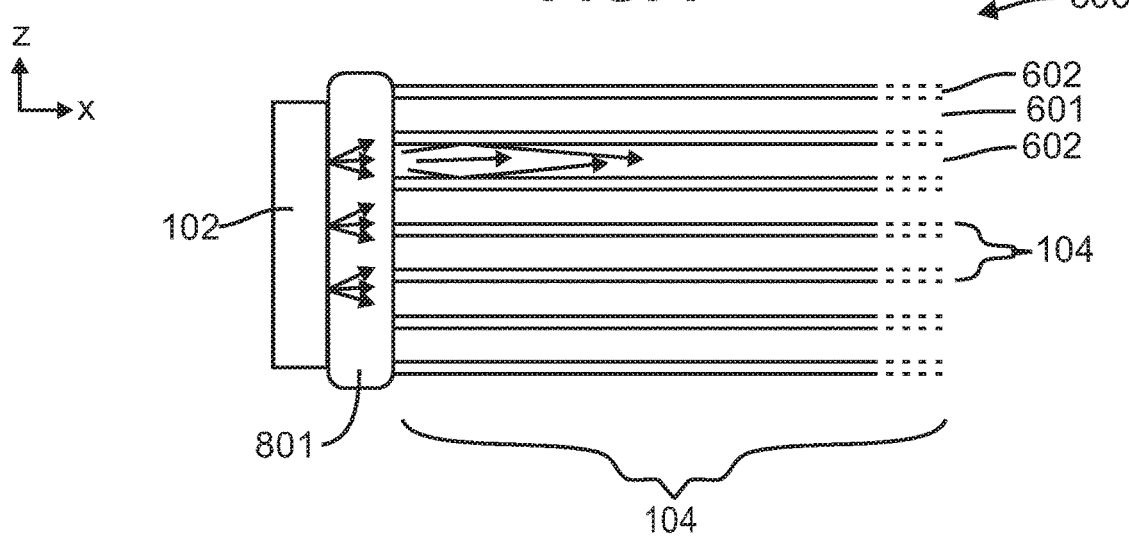
FIG. 8 is a cross-sectional side view of one embodiment of a light emitting device wherein the coupling lightguides and the light input surface are optically coupled to the light source.

FIG. 8 is a cross-sectional side view of one embodiment of a light emitting device 800 defining a region 802 near a light input surface of the light emitting device 800. The coupling lightguides 104 are optically coupled to the light source 102 by an optical adhesive 801 or other suitable coupler or coupling material. In this embodiment, less light from the light source 102 is lost due to reflection (and absorption at the light source or in another region) and the positional alignment of the light source 102 relative to the coupling lightguides 104 is easily maintained.

Figure 9:
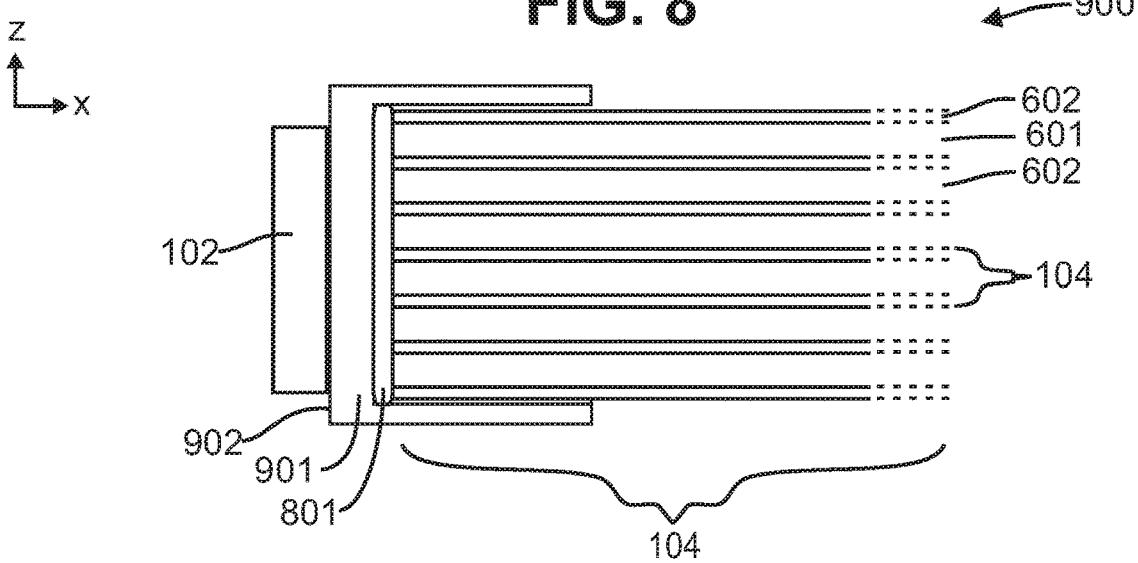
FIG. 9 is a cross-sectional side view of one embodiment of a light emitting device wherein the coupling lightguides are held in place by a sleeve and the edge surfaces are effectively planarized by an optical adhesive or material such as a gel between the ends of the coupling lightguides and the sleeve with a flat outer surface adjacent the light source.

FIG. 9 is a cross-sectional side view of one embodiment of a light emitting device 900 defining a region 903 near a light input surface of the light emitting device 900. In this embodiment, the coupling lightguides 104 are held in place by a sleeve 901 with an outer coupling surface 902 and the edge surfaces of the coupling lightguides 104 are effectively planarized by an optical adhesive 801 between the ends of the coupling lightguides and the sleeve 901 with the outer surface 902 adjacent the light source 102. In this embodiment, the surface finish of the cutting of the coupling lightguides is less critical because the outer surface 902 of the sleeve 901 is optically coupled to the edges using an optical adhesive 801 which reduces the refraction (and scattering loss) that could otherwise occur at the air-input edge interface of the input edge due to imperfect cutting of the edges. In another embodiment, an optical gel, a fluid or a non-adhesive optical material may be used instead of the optical adhesive to effectively planarize the interface at the edges of the coupling lightguides. In certain embodiments, the difference in the refractive index between the optical adhesive, the optical gel, the fluid, or the non-adhesive optical material and the core region of the coupling lightguides is less than one selected from group of 0.6, 0.5, 0.4, 0.3, 0.2, 0.1, 0.05, and 0.01. In one embodiment, the outer surface 902 of the sleeve 901 is substantially flat and planar.

Figure 10:
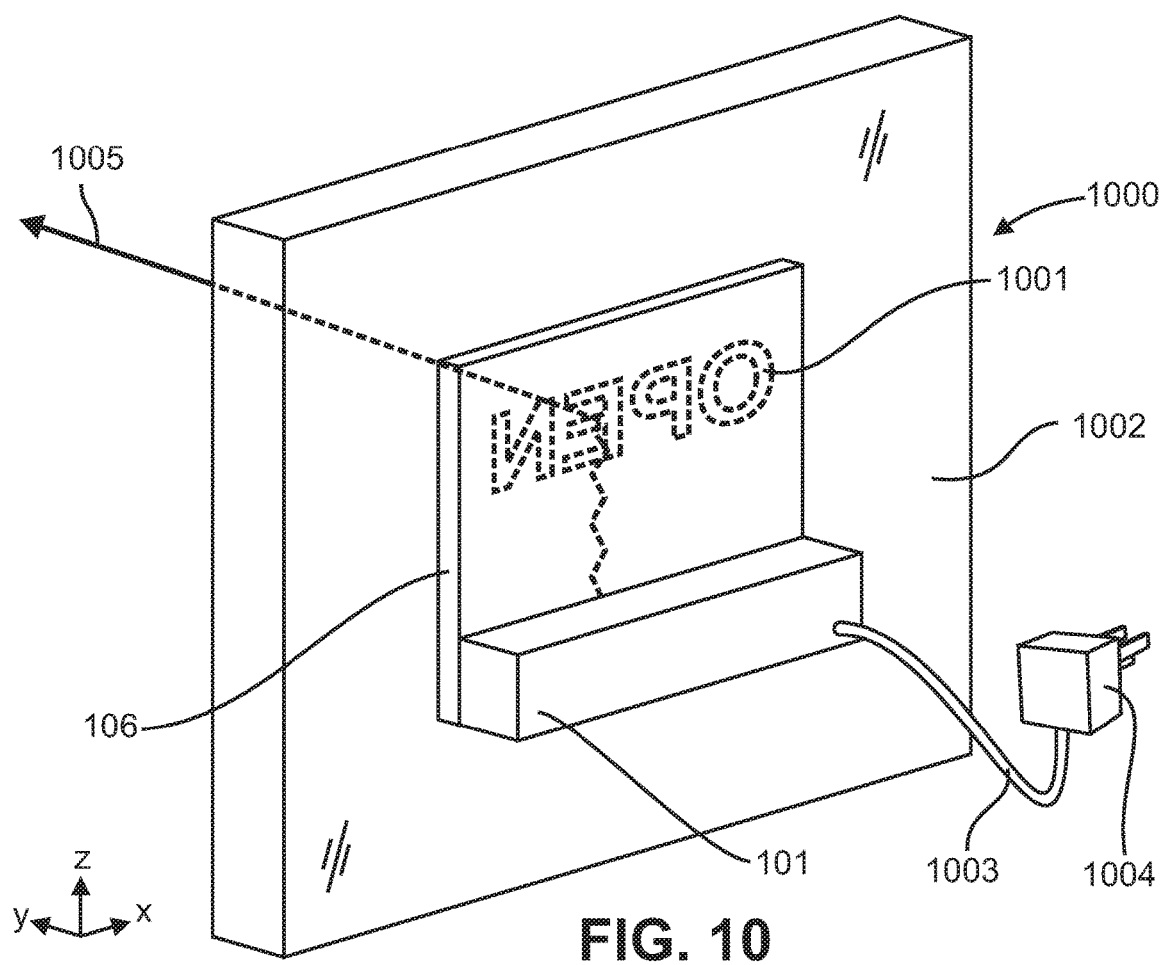
FIG. 10 is a perspective view of one embodiment of a light emitting display disposed adjacent a window.

FIG. 10 is a perspective view of one embodiment of a light emitting display 1000 disposed adjacent a window 1002 comprising a light input coupler 101 disposed to receive electrical power through a power cable 1003 attached to a power plug 1004. Light 1005 from the light source 102 (not shown in FIG. 10) in the light input coupler 101 propagates through the lightguide region 106 and exits the light emitting display 1000 due to light extraction features in a region of the light emitting region 108 forming light emitting indicia 1001. In one embodiment, the lightguide region 106 is optically coupled to the window 1002 and the adhesion and/or strength of the lightguide region 106 supports the weight of the light emitting display 1000. In another embodiment, the adhesion and/or the strength of the lightguide region 106 supports the weight of the lightguide region 106 and the light input coupler 101. In this embodiment, the power cable 1003 may be of sufficient length that the light emitting display 1000 does not need to support the weight of the power plug 1004 when it is unplugged because the power plug 1004 would normally reach the ground (as typically is the case with a 6-foot power cable). By not needing to support the weight of the power plug 1004 (when the power plug 1004 is plugged into an electrical outlet or the power cable 1003 is sufficiently long), more electronics such as the transformer, LED driver, or switch mode power supply which are typically heavy can be integrated into the power plug 1004 and a peel strength of the lightguide region 106 and/or an elastic modulus of the lightguide region 106 can be reduced.

Figure 11:
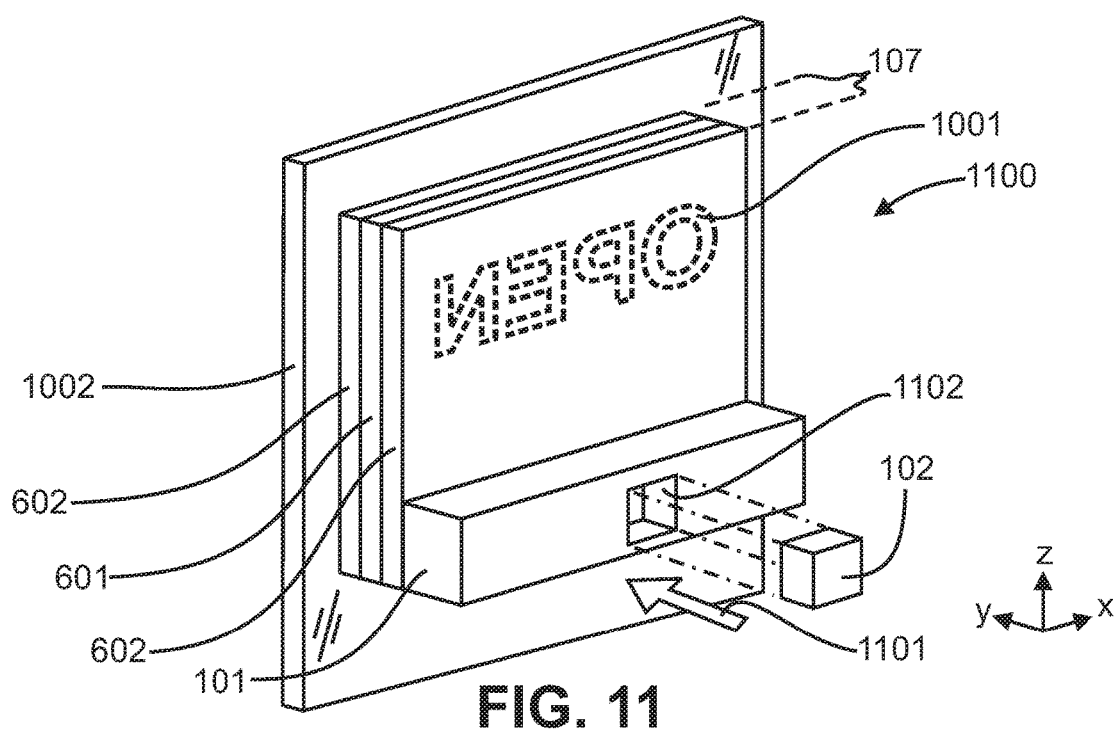
FIG. 11 is a perspective view of one embodiment of a light emitting device wherein the light source can be removed and replaced from the light input coupler.

FIG. 11 is a perspective view of one embodiment of a light emitting device 1100 having a light source 102 that is removable from the light input coupler 101 and replaceable. In this embodiment, the lightguide 107 comprises a core region 601 disposed between two cladding regions 602. As shown in FIG. 11, a first cladding region 602 is disposed adjacent a window 1002 such that the light emitting device 1100 emits light in the form of indicia 1001 and through the window 1002. The light source 102 is inserted into the light input coupler 101 by moving the light source 102 in a first direction 1101 (the +y direction). The light source 102 may also be removed from the light input coupler 101 by translating it in the −y direction with respect to the light input coupler 101. Similarly, in a different perspective, the light input coupler 101 and the lightguide 107 may be removed from the light source 102 (when they are not physically coupled to a stationary window 1002). In one embodiment, the electronics (including, for example, a driver, a controlling mechanism, etc.) and related components (a heat sink, optical elements, etc.) for the light source 102 may also be removed from the light input coupler 101 with the light source 102.

Figure 12:
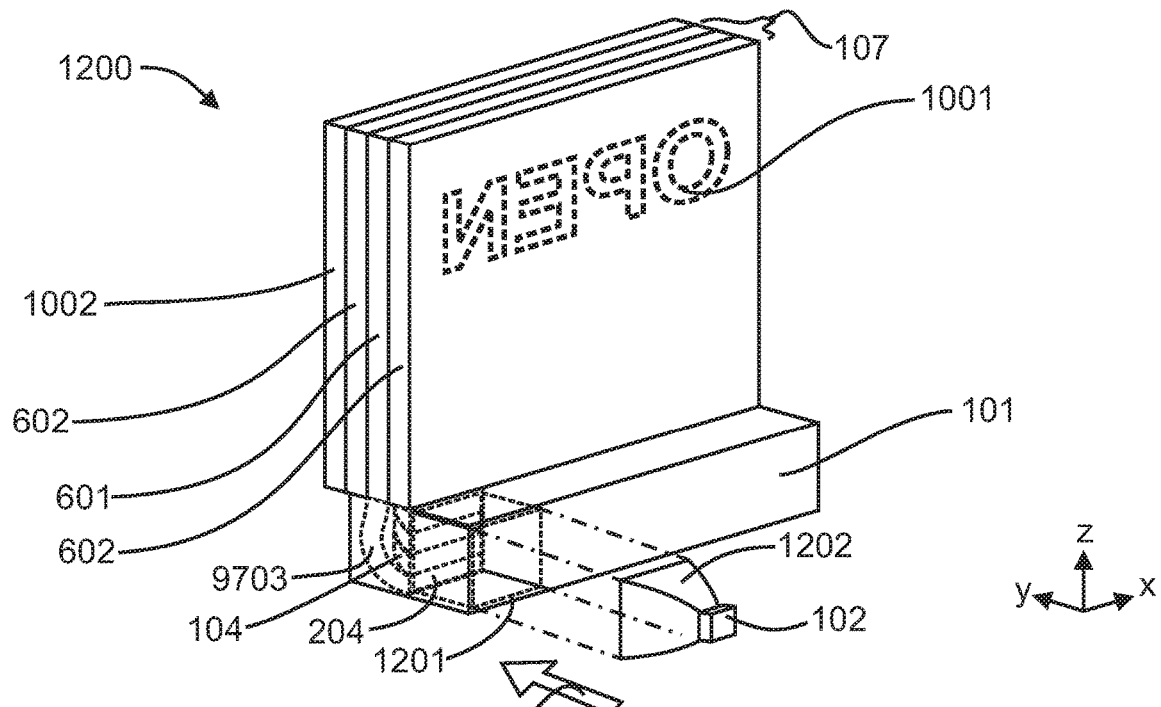
FIG. 12 is a perspective view of one embodiment of a light emitting device comprising a cavity for inserting a light source and a light collimating optical element.

FIG. 12 is a perspective view of one embodiment of a light emitting device 1200 including the light input coupler 101 defining a cavity 1201 for receiving a light source 102 and a light collimating optical element 1202. In this embodiment, the lightguide 107 comprises a core region 601 disposed between two cladding regions 602. In this embodiment, a first cladding region 602 is disposed adjacent a window 1002 such that the light emitting device 1200 emits light from individual light extraction features (not shown) that collectively form light emitting indicia 1001 and through the window 1002. The light source 102 and the light collimating optical element 1202 are removable from within the cavity 1201 of the light input coupler 101 and replaceable. In this embodiment, a portion of the light from the light source 102 is collimated by the light collimating optical element 1202 and is directed into the input edges 204 of the coupling lightguides 104 where the light propagates through the core region 601 and is emitted from the light emitting device 1200 in the form of light emitting indicia 1001. Also shown in this embodiment, a portion of the light may propagate through a non-folding coupling lightguide 9703. The light source 102 and the light collimating optical element 1202 are inserted into the cavity 1201 by moving the light source 102 with the attached light collimating optical element 1202 in a first direction 1101 (the +y direction). The light source 102 and the light collimating optical element 1202 may also be removed from the cavity 1201 by translating the light source 102 and the light collimating optical element 1202 in the −y direction with respect to the light input coupler 101.

Figure 13:
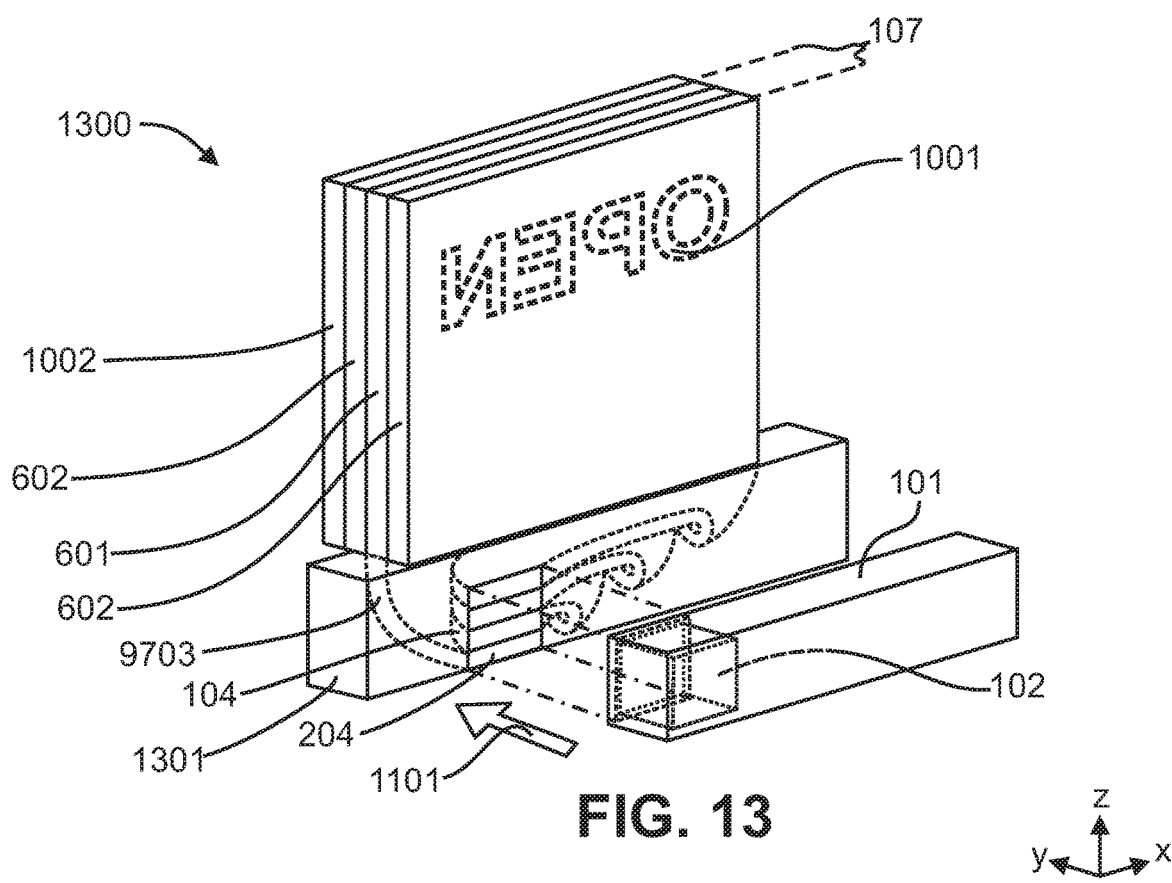
FIG. 13 is a perspective view of one embodiment of a light emitting device wherein the lightguide and cartridge are removable and replaceable.

FIG. 13 is a perspective view of one embodiment of a light emitting device 1300 wherein the lightguide 107 and a cartridge 1301 are removable from the light input coupler 101 and replaceable. The light input coupler 101 is moved toward the input edges 204 of the coupling lightguides 104 substantially housed in the cartridge 1301 such that light propagates through the core region 601 and is emitted from the light emitting device 1300 from individual light extraction features (not shown) that collectively form light emitting indicia 1001. Also shown in this embodiment, a portion of the light may propagate through a non-folding coupling lightguide 9703. The light source 102 is disposed to couple light into the input edges 204 of the coupling lightguides 104 in the cartridge 1301 by translating the light input coupler 101 in a first direction 1101 (the +y direction). The light input coupler 101 may also be removed from the cartridge 1301 by translating the light input coupler 101 in the −y direction with respect to the light input edges 204 of the coupling lightguides 104. From a different perspective, the cartridge 1301 is removable and replaceable with respect to the light input coupler 101. For example, in one embodiment, a user may change the light emitting indicia 1001 by detaching the cartridge 1301 and the lightguide 107 from the light input coupler 101. In this embodiment, the lightguide 107 and the cartridge 1301 may be kept for future use or disposed. In another embodiment, the light input coupler 101 is translated in a first direction (such as the +z direction) such that light from the light source 102 is coupled into the coupling lightguides 104.

Figure 14A:
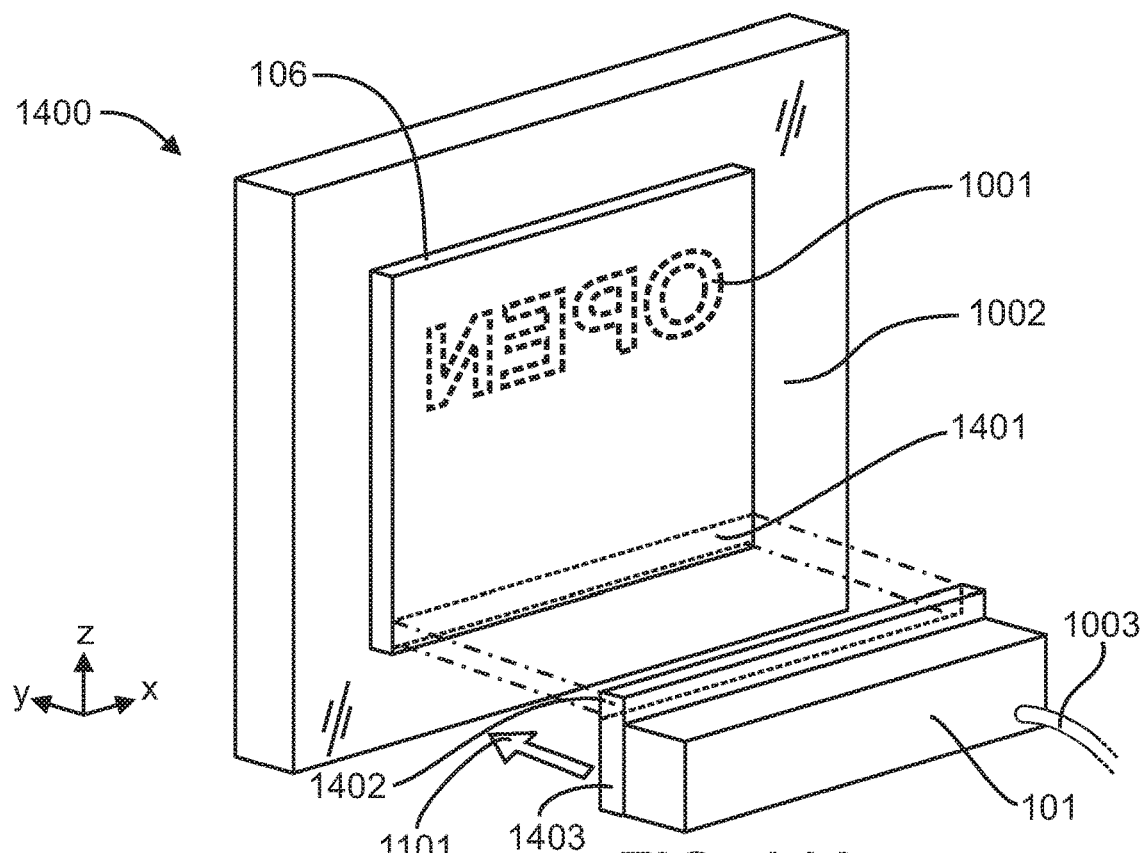
FIG. 14A is a perspective view of one embodiment of a light emitting device comprising a lightguide region with a light receiving region and a light input coupler with a light transmitting region on a light output optical element.

FIG. 14A is a perspective view of one embodiment of a light emitting device 1400 comprising a lightguide region 106 with a light receiving region 1401 and a light input coupler 101 with a light transmitting region 1402 on a light output optical element 1403. In this embodiment, the lightguide region 106 is a film that can be rolled and/or pressed onto a surface of the window 1002. When the light input coupler 101 with the light output optical element 1402 is moved in the direction 1101 toward and placed against the lightguide region 106 such that the light transmitting region 1402 aligns with the light receiving region 1401, a portion of the light from the light input coupler 101 is coupled into the lightguide region 106 and exits the lightguide region 106 from individual light extraction features (not shown) that collectively form light emitting indicia 1001.

Figure 14B:
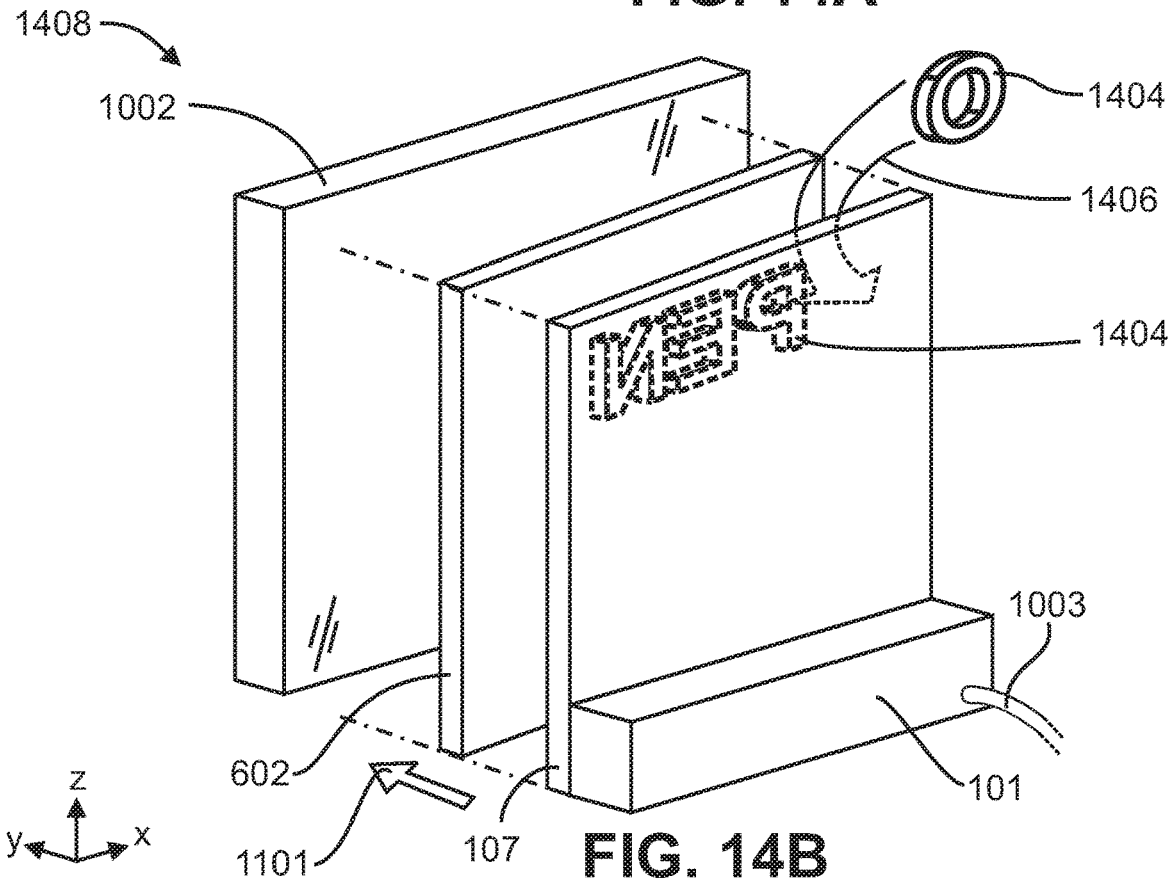
FIG. 14B is a perspective view of one embodiment of a light emitting device in the form of a sign comprising an input coupler with a lightguide.

FIG. 14B is an exploded perspective view of one embodiment of a light emitting device 1400 in the form of a sign displaying the word "OPEN." The light emitting device 1408 comprises an input coupler 101 with a lightguide 107 having a plurality of light extraction regions 1404 in the form of indicia disposed on a surface 1430 of the lightguide 107. The light extraction regions 1404 may be removed or added 1406, as shown in FIG. 14B, to the surface 1430 of the lightguide 107 to change the image, indicia, pattern, or logo of the region of light emitted from the light emitting device 1408. Other forms of indicia or light emitting patterns may be added or removed to change the appearance and/or light output pattern of the light emitting device 1408. In this embodiment, a cladding region 602 is disposed between the lightguide 107 and the window 1002 to prevent or limit light transmission into the window 1002 where light is absorbed due to the intrinsic absorption of the glass (thus reducing the light intensity of the indicia) or extracted through fingerprints, scratches and/or other light extracting properties within and/or on the surface 1431 of the window 1002.

Figure 15:
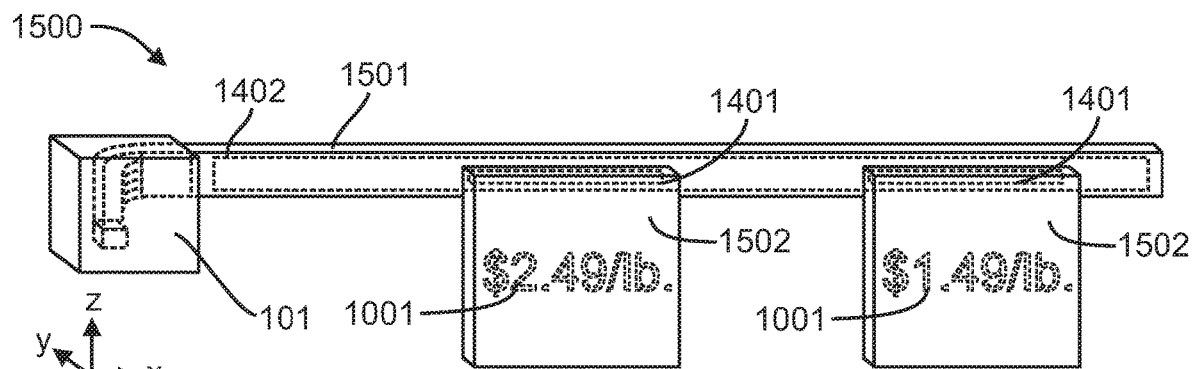
FIG. 15 is a perspective view of one embodiment of a distributed illumination system comprising a light input coupler disposed to couple light into a distribution lightguide.

FIG. 15 is a perspective view of one embodiment of a distributed illumination system 1500 comprising the light input coupler 101 disposed to couple light into a distribution lightguide 1501. The light in the distribution lightguide 1501 exits through the light transmitting region 1402 when optically coupled to a light receiving region 1401 of an output coupling lightguide 1502. As shown in FIG. 15, two output coupling lightguides 1502 are optically coupled to the light transmitting region 1402 of the distribution lightguide 1501 in two regions. First and second portions of the light propagating in a waveguide condition within the distribution lightguide 1501 exit the distribution lightguide 1501 by coupling into the output coupling lightguides 1502 as the first and second portions of light propagate in a waveguide condition within the output coupling lightguides 1502 and exit the output coupling lightguides 1502 by emitting light from individual light extraction features (not shown) that collectively form light emitting indicia 1001. As shown in FIG. 15, in one embodiment the output coupling lightguides 1502 are optically coupled at different locations to the distribution lightguide 1501 to provide light emitting indicia 1001 at desired locations corresponding to product placement locations (on a shelf or display, for example).

Figure 16A:
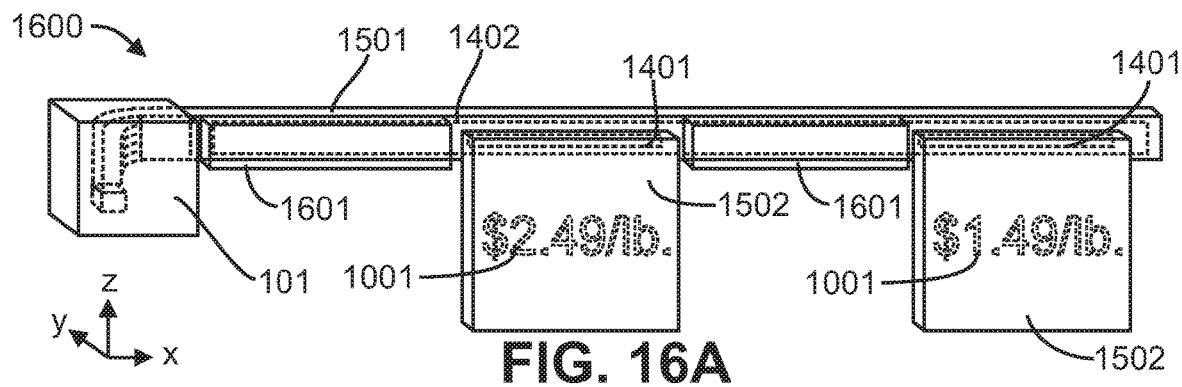
FIG. 16A is a perspective view of one embodiment of a distributed illumination system comprising the illumination system of FIG. 15 and repositionable cladding layers.

FIG. 16A is a perspective view of one embodiment of a distributed illumination system 1600 comprising the illumination system 1500 shown in FIG. 15 and repositionable cladding layers 1601. The repositionable cladding layers 1601 may be disposed in exposed regions of the distribution lightguide 1501 such that light is not absorbed or coupled out of the distribution lightguide 1501 due to scratches, dirt, and/or other components in direct contact with the surface of the distribution lightguide 1501. In one embodiment, the repositionable cladding layers 1601 may be moved from one region of the light transmitting region 1402 on the distribution lightguide 1501 to another region of the light transmitting region 1402 on the distribution lightguide 1501 and have a repositionable low peel strength adhesive bond with the distribution lightguide 1501. Other suitable coupling mechanisms may be used to couple the repositionable cladding layers 1601 to the distribution lightguide 1501. In another embodiment, the repositionable cladding layers 1601 substantially cover regions of the distribution lightguide 1501 that are not optically coupled to output coupling lightguides 1502. In another embodiment, the repositionable cladding layers 1601 include flaps that may be peeled back from the distribution lightguide 1501 while remaining physically coupled to the distribution lightguide 1501 such that light receiving regions on an output coupling lightguide 1502 may be optically coupled to the light transmitting region of the distribution lightguide 1501 to illuminate indicia on the output coupling lightguide 1502. In another embodiment, the repositionable cladding layer 1601 has an ASTM D1003 version 07e1 luminous transmittance less than one selected from the group of 80%, 70%, 60%, 50%, 40%, 30%, 20%, 10%, 5%, 2%, and 1%. In one embodiment, the repositionable cladding layer 1601 comprises a light absorbing region (such as a black PET film or other light absorbing materials disclosed herein, for example without limitation) on the outer surface (surface opposite the distribution lightguide 1501) and wraps around one or more surfaces of the distribution lightguide 1501 such that stray light is not transmitted from the light emitting device 1600 in the regions where the repositionable cladding layer 1601 is optically coupled to the distribution lightguide 1501.

Figure 16B:
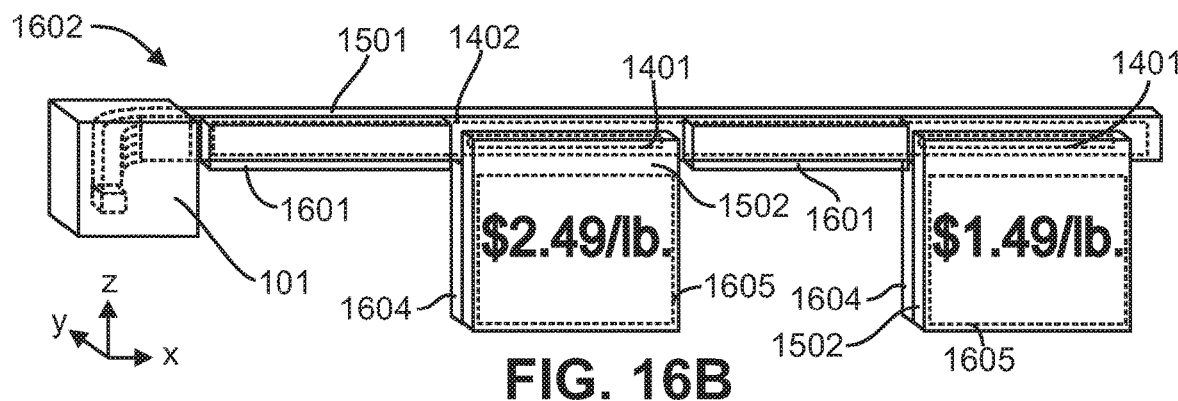
FIG. 16B is a perspective view of one embodiment of a distributed front illumination system comprising a light input coupler, a distribution lightguide, repositionable cladding layers, and output coupling lightguides disposed to received light from the distribution lightguide and direct the light toward a reflective display.

FIG. 16B is a perspective view of one embodiment of a distributed front illumination system 1602 comprising the light input coupler 101, the distribution lightguide 1501, the repositionable cladding layers 1601, and the output coupling lightguides 1502 disposed to receive light from the distribution lightguide 1501 and direct the light toward a reflective display 1604. In one embodiment, the reflective display 1604 includes one or more of the following: a sign, a graphic, a printed label, a bistable display, an electrophoretic display, a MEMS display, a passive display, and an active display. In the embodiment shown in FIG. 16B, the reflective display 1604 is a bistable reflective display with dark characters on a light background. In this embodiment, the light emitted from the light emitting region 1605 of the output coupling lightguide 1502 is directed toward the reflective display 1604 and significantly reflects back in the lighter regions such that the luminance contrast ratio of the light to dark regions is high and the reflective display 1604 can be readily discerned or read.

Figure 16C:
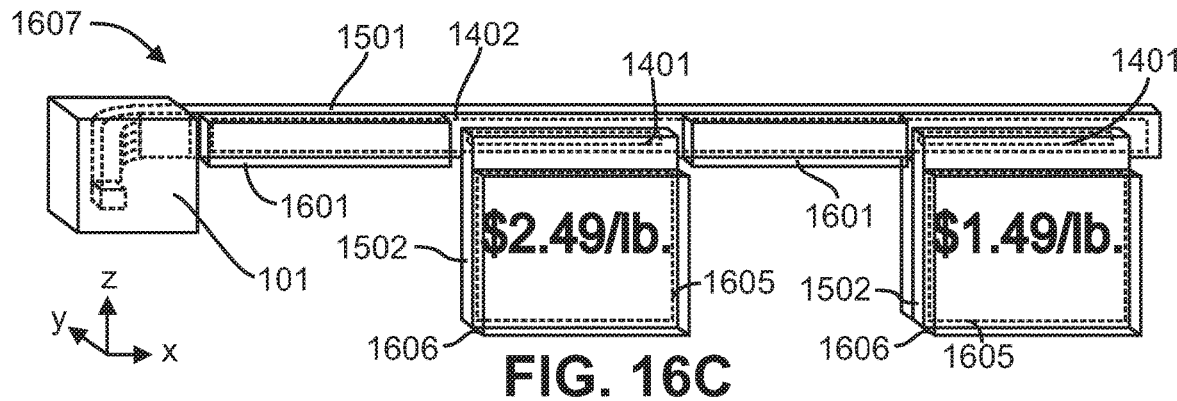
FIG. 16C is a perspective view of one embodiment of a distributed back illumination system comprising a light input coupler, a distribution lightguide, repositionable cladding layers, and output coupling lightguides disposed to received light from the distribution lightguide and direct the light toward a transmissive display.

FIG. 16C is a perspective view of one embodiment of a distributed back illumination system 1607 comprising the light input coupler 101, the distribution lightguide 1501, the repositionable cladding layers 1601, and the output coupling lightguides 1502 disposed to receive light from the distribution lightguide 1501 and direct the light toward a transmissive display 1606 (such as a bistable liquid crystal display). In one embodiment, the transmissive display includes one or more of the following: a sign, graphic, a printed label, a bistable display, a passive display, and an active display. In the embodiment shown in FIG. 16C, the transmissive display 1606 is a passive printed label with dark characters on a light background. The light emitted from the light emitting region 1605 of the output coupling lightguide 1502 is directed toward the transmissive display 1606 and the transmissive display 1606 transmits light in the low absorption regions (lighter regions) and absorbs light in the high absorption regions (darker regions) such that the luminance contrast ratio of the light to dark regions is high and the label can be readily discerned. For example, the distributed back illumination system 1607 may be used on a shelf or display in a store to provide product and/or price information by illuminating the label.

Figure 17A:
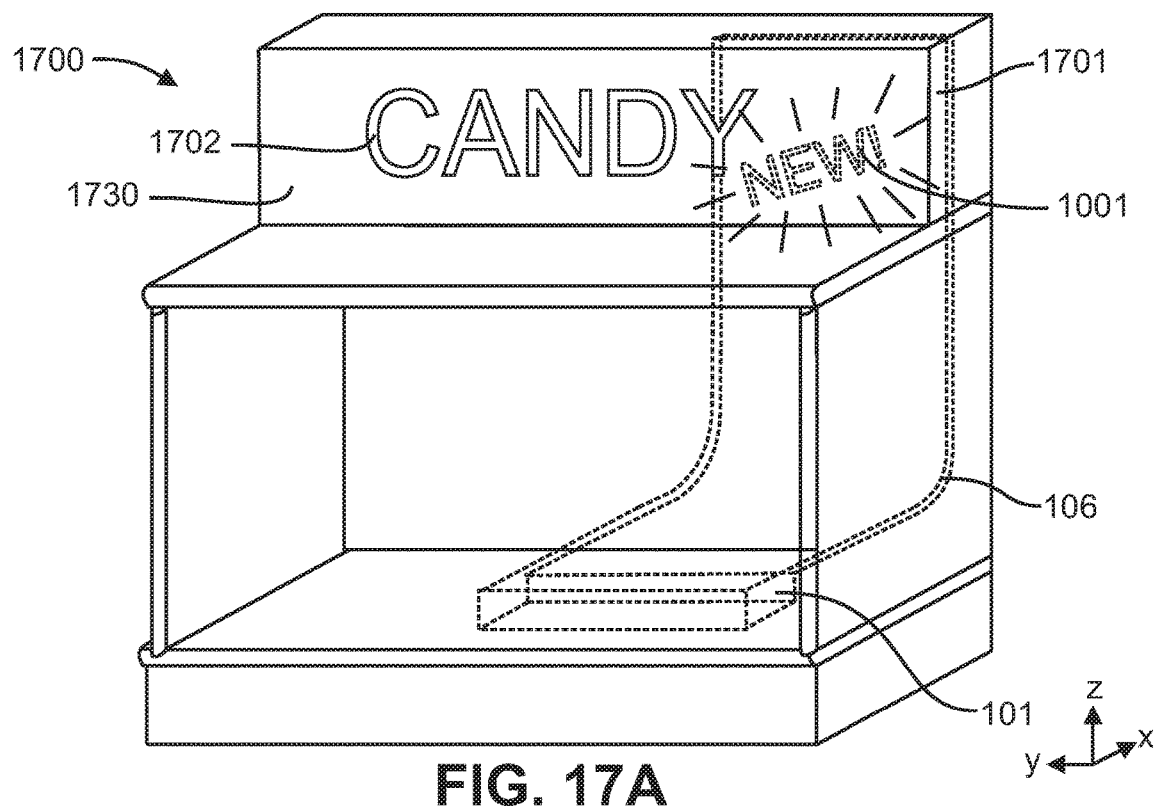
FIG. 17A is a perspective view of one embodiment of a light emitting point of purchase (POP) display comprising printed indicia on a surface layer of the POP display and luminous indicia emitting light from the lightguide and that is visible through the surface layer of the POP display.
Figures 103, 104:
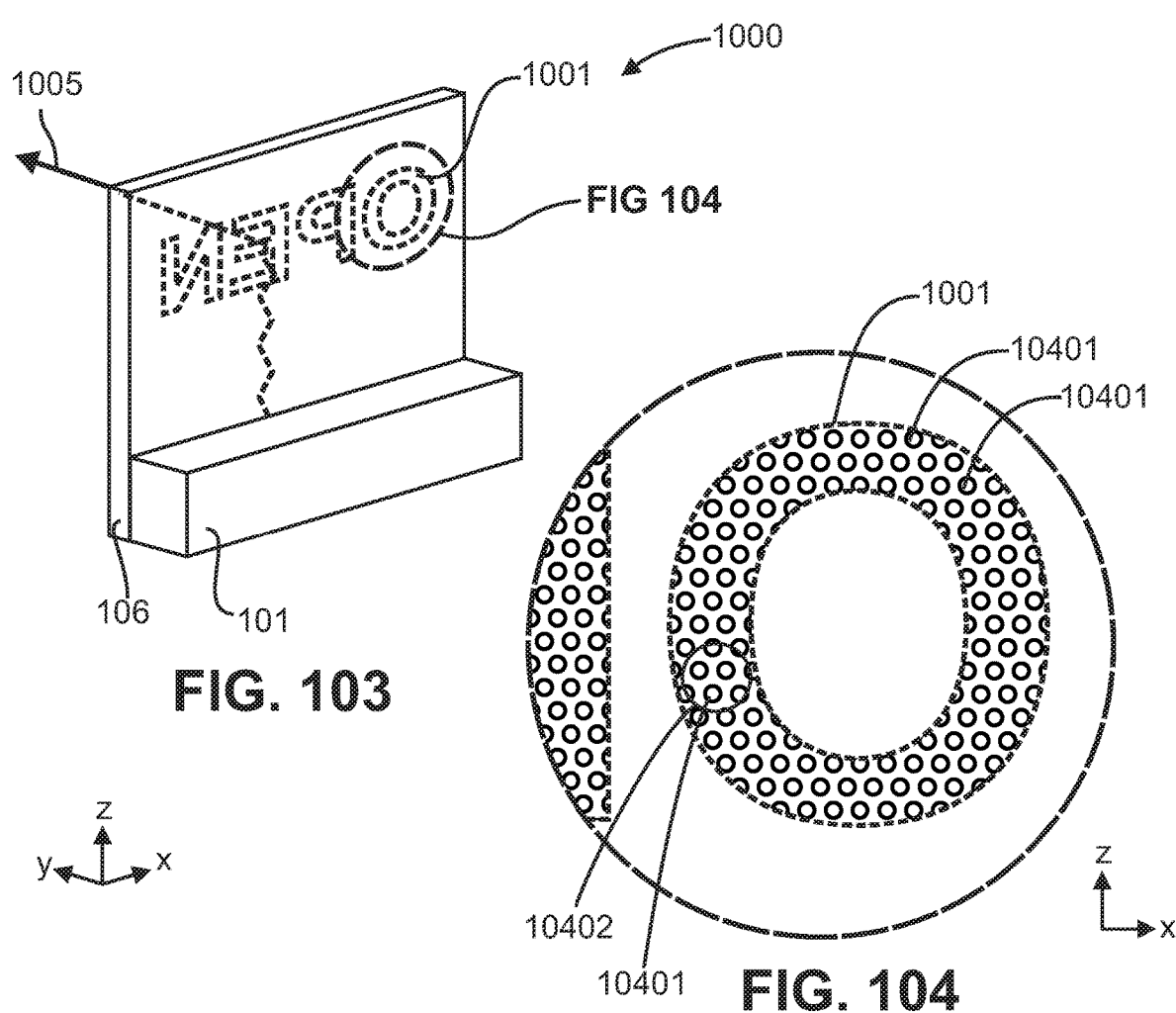

FIG. 17A is a perspective view of one embodiment of a light emitting point of purchase (POP) display 1700 comprising printed indicia 1702 on a surface layer 1730 of the POP display 1700. In this embodiment, the light emitting indicia 1001 emits light from the lightguide 106 that visible through the surface layer 1730 of the POP display 1700. For example, in one embodiment, the POP display 1700 comprises a suitable material, such as cardboard, with printed indicia and the lightguide region 106 comprises printed light extraction features (as shown in FIG. 104) on a surface of the lightguide region 106 such that the light emitted from the lightguide region 106 passes through the cardboard and is visible. In another embodiment, the lightguide region 106 is disposed on an outer surface of the POP display 1700 and the light emitting indicia 1001 is visible directly when illuminated.

Figure 17B:
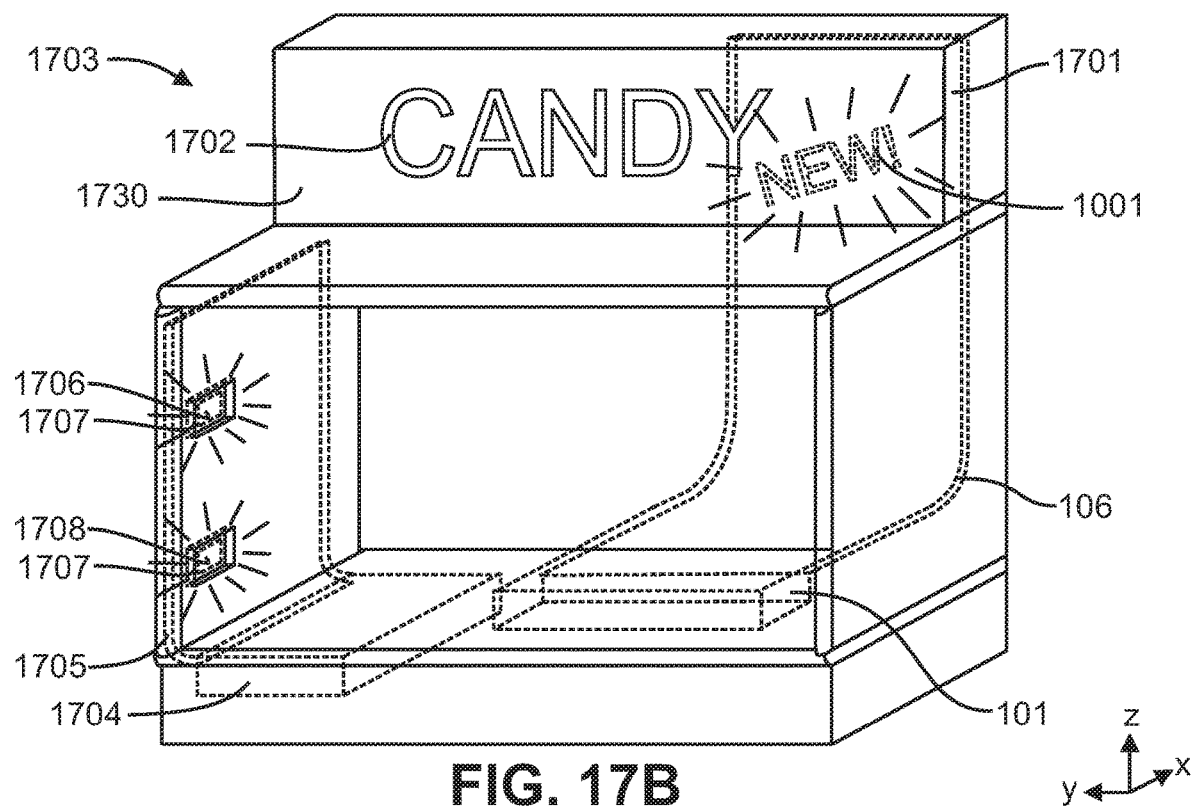
FIG. 17B is a perspective view of one embodiment of a point of purchase display comprising printed indicia on a surface layer and light emitting indicia emitting light from the first lightguide that is visible through the surface layer and a second input coupler comprising a light source and a second lightguide comprising a first light emitting region and a second light emitting region disposed to emit light through apertures in the POP display toward the interior region of the POP display.

FIG. 17B is a perspective view of one embodiment of a point of purchase (POP) display 1703 comprising the printed indicia 1702 on the surface layer 1730 and the luminous light emitting indicia 1001 emitting light from the first lightguide region 106 and visible through the surface layer 1730. In this embodiment, a second input coupler 1704 comprising a light source (not shown in FIG. 17B) and a second lightguide 1705 comprising a first light emitting region 1706 and a second light emitting region 1708 disposed to emit light through apertures 1707 in the POP display 1703 toward an interior region 1760 of the POP display 1703. The interior region 1760 is configured to contain one or more products for display). For example, in one embodiment, the light emitted from the first light emitting region 1706 and the light emitted from the second light emitting region 1708 illuminate the products such that the products are more clearly visible, the packaging distinct or more legible, and/or enhanced through supplemental illumination. In another embodiment, the POP display 1703 provides distribution of light through the first light emitting region 1706 and the second light emitting region 1708 to be coupled into and emitted from a product.

Figure 17C:
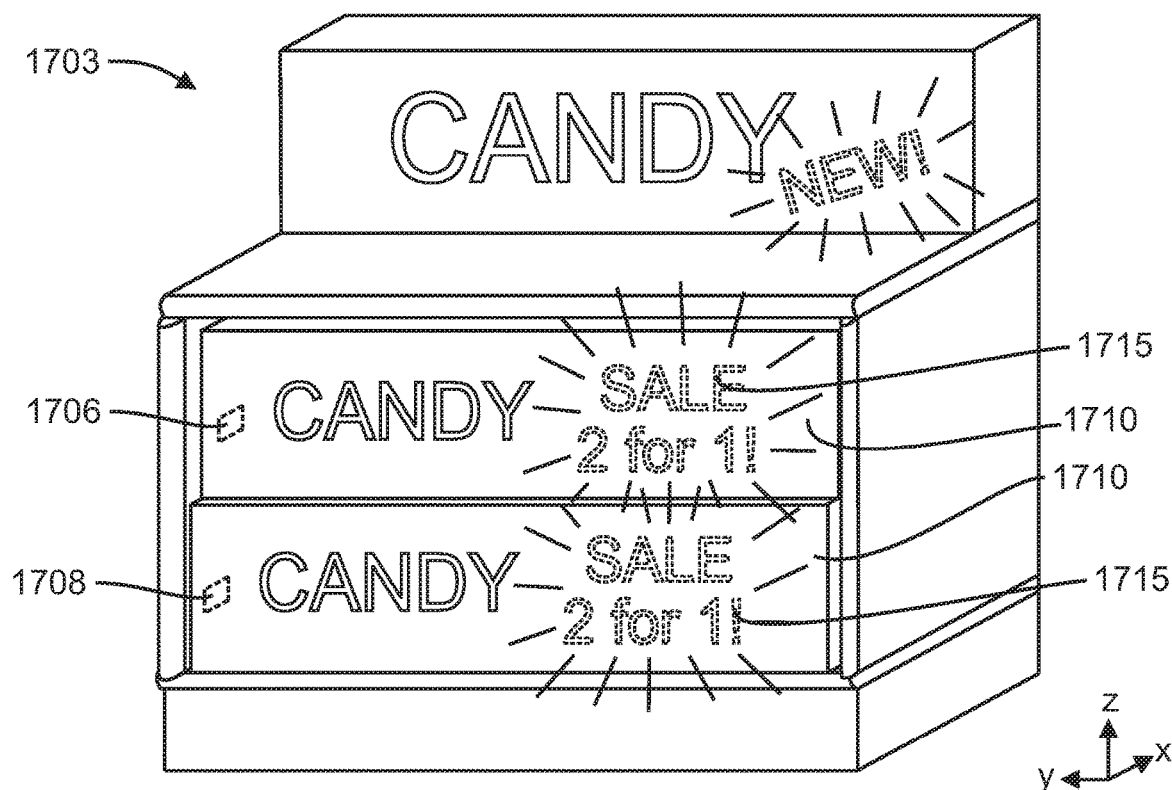
FIG. 17C is a perspective view of the point of purchase display of FIG. 17B further comprising products.

FIG. 17C is a perspective view of the POP display 1703 shown in FIG. 17B further comprising one or more products 1710 with packaging (two products 1710 are shown in FIG. 17C). The POP display 1703 includes a lightguide 1705 having a first light emitting region 1706 and a second light emitting region 1708 on a first side of the POP display 1703. In the embodiment shown, the light emitted from the first light emitting regions 1706 and the light emitted from the second light emitting region 1708 passes into the products 1710 and is emitted from the products 1710 in the form of light emitting indicia 1715. For example, as shown in FIG. 17C, the products 1715 are boxes of candy that comprise coupling lightguides (shown in FIG. 17D) that receive light from the first light emitting region 1706 or second light emitting region 1708 and transmit the light out of the product 1710 in the form of light emitting indicia 1715. In this manner, the product can appear luminous without requiring any light sources or power supplies within the product. Other products, for example, include without limitation, food or grocery items in cardboard, paper, metal, or plastic packages, toothpaste products, cereal products, potato chip bags, goods, cereals, soft drinks in cans, water in bottles. The coupling lightguides (shown in FIG. 17D) for the products/packages may be placed in a range of packaging materials and may be disposed on the inner region of the package, the outer region of the packaging, or within the packaging material.

Figure 17D:
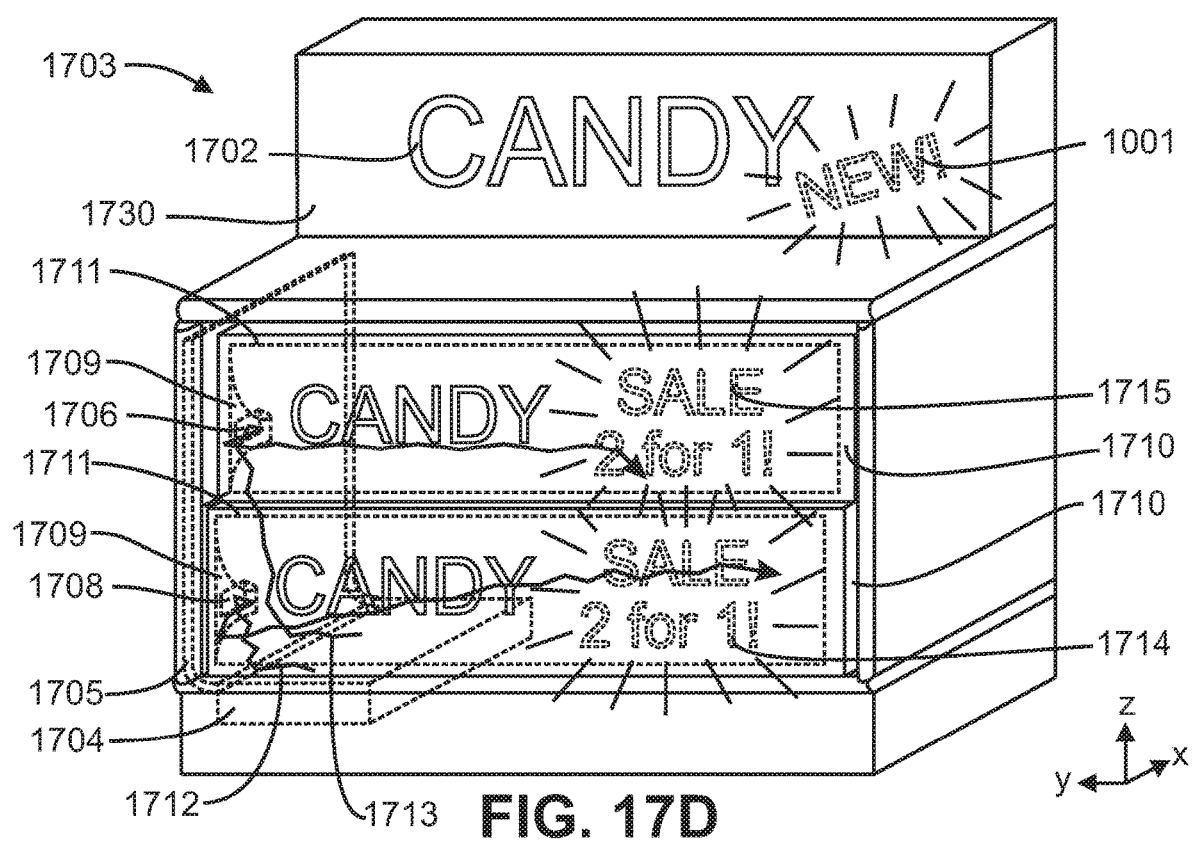
FIG. 17D is a perspective view of the point of purchase display comprising products of FIG. 17C illustrating the path of light through the POP display and products.

FIG. 17D is a perspective view of the POP display 1703 comprising products 1710 shown in FIG. 17C and illustrating a path of light through the POP display 1703 and products 1710. The products 1710 comprise coupling lightguides 1709 and a lightguide 1711. Light 1712 from the light input coupler 1704 propagates through the lightguide 1705 in the +y direction and then in the +z direction and exits the lightguide 1705 at the second light emitting region 1708 propagating in the −y direction and is coupled into coupling lightguides 1709 in the product 1710. The light 1712 then propagates through the coupling lightguides 1709 in the product 1710 in the −x direction and is directed into the lightguide 1711 propagating in the −y direction within the product 1710 until the light is extracted from the lightguide 1711 by light extraction features (not shown) and exits the product 1710 with a component in the −x direction in the form of light emitting indicia 1714. Light 1713 from the light input coupler 1704 propagates through the lightguide 1705 and exits the lightguide 1705 at the first light emitting region 1706 and is coupled into coupling lightguides 1709 in the product 1710. The light 1713 then propagates through the coupling lightguides 1709 in the product 1710 and within the lightguide 1711 within the product 1710 until the light is emitted from individual light extraction features (not shown) on the lightguide 1711 that collectively form light emitting indicia 1715.

Figure 17E:
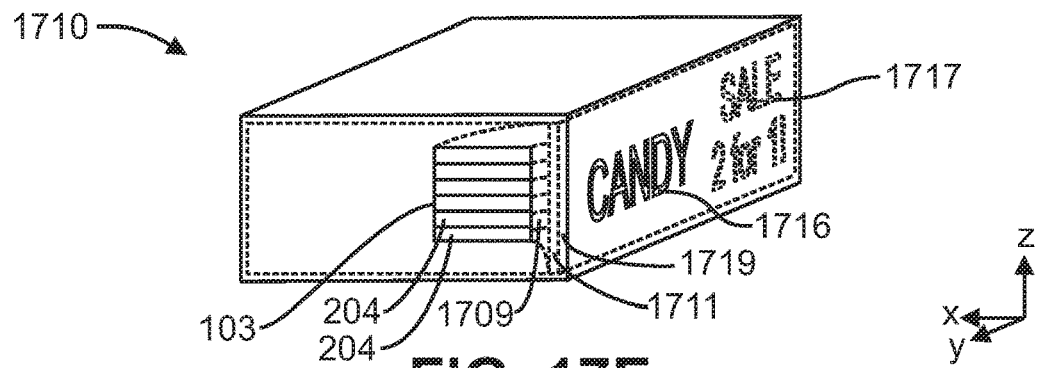
FIG. 17E is a perspective view of the product of FIG. 17C comprising printed indicia on the outer surface of the packaging and a stacked array of coupling lightguides with the light input surface comprising input edges of the coupling lightguides disposed to receive light and transmit it into the lightguide on the inner side of the packaging of the product where it is emitted due to the light extraction features in light emitting indicia region of the lightguide through the packaging.

FIG. 17E is a perspective view of the product 1710 shown in FIG. 17C comprising printed indicia 1716 on one or more outer surfaces of the packaging 1719 and a stacked array of coupling lightguides 1709 with the light input surface 103 comprising the light input edges 204 of the coupling lightguides 1709 disposed to receive light and transmit the light into the lightguide 1711 positioned within an interior region of the packaging 1719 of the product 1710. The light is then extracted from the lightguide 1711 to exit the product 1710 by light extraction features (not shown) on, within, or optically coupled to the lightguide 1711 where the light emitted from the packaging 1719 and product 1710 due to the light extraction features collectively form light emitting indicia 1717.

Figure 17F:
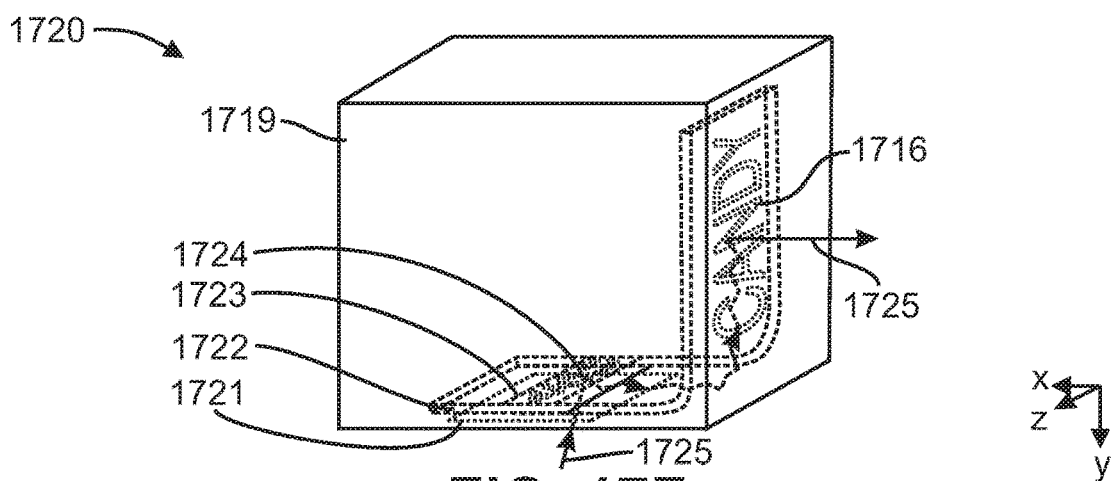
FIG. 17F is a perspective view of one embodiment of a product disposed to receive light from a light emitting device with a component in the −y direction and transmit the light through a lightguide in the −x direction.

FIG. 17F is a perspective view of one embodiment of a product 1720 disposed to receive light 1712 from a light emitting device 1703 (shown in FIG. 17C) with a component in the −y direction, transmit the light through a lightguide 1722 in the −x direction, and then the −y direction to a second region 1780 of the product 1720 where the light is emitted with a component in the −x direction in the form of light emitting indicia 1716. The product 1720 can be used in the POP display 1703 illustrated in FIGS. 17C and 17D. As shown in FIG. 17F, light 1712 (also shown in FIG. 17D) from the light emitting region 1708 (shown in FIG. 17D) of the lightguide 1705 in the POP display 1703 propagating in the −y direction is transmitted through an input window 1721 in the packaging 1719, transmitted through the lightguide 1722 and is reflectively scattered in the +y direction and −x direction from one of the light scattering features 1724 back into the lightguide 1722 in a waveguide condition. The light 1712 propagates through the lightguide 1722 in the −x direction and then the +y direction and exits a different side 1780 of the product 1720 than the light entered with a directional component in the −x direction when the light reaches a light extraction feature (not shown), forming part of the light emitting indicia 1716.

Figure 17G:
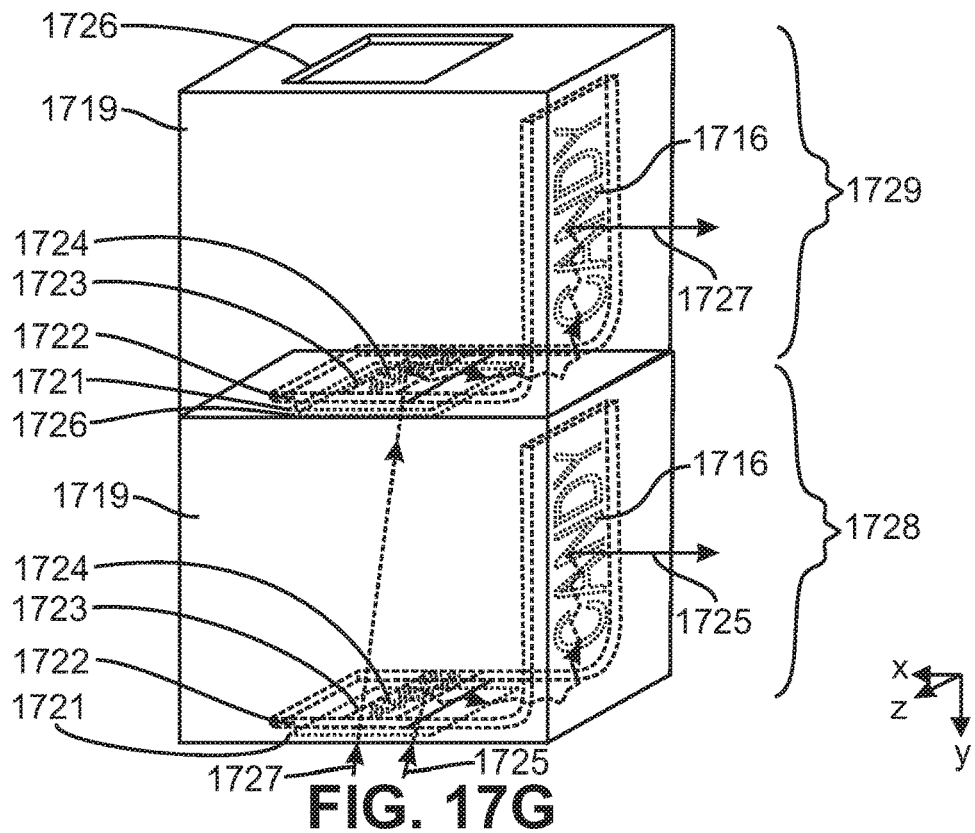
FIG. 17G is a perspective view of one embodiment of a first product and a second product stacked upon each other disposed to receive light from a light emitting device.

FIG. 17G is a perspective view of one embodiment of a first product 1728 and a second product 1729 stacked upon each other and disposed to receive light 1712 from the POP display 1703 (shown in FIG. 17D) propagating in the −y direction. The first product 1728 and the second product 1729 comprise lightguides 1722 disposed to receive light passing through a light input window 1721 in the packaging 1719, and the light output windows 1726 in the packaging 1719. Light 1727 propagating in the −y direction incident on the first product 1728 passes through the input window 1721, through the lightguide 1722 in a region 1723 without light extraction features, passes through the first product 1728 and exits the first product 1728 through the light output window 1726 in the packaging 1719. This light 1727 propagating in the −y direction is transmitted through an input window 1721 in the packaging 1719 of the second product 1729, transmitted through the lightguide 1722 and is reflectively scattered in the +y direction and −x direction from one of the light scattering features 1724 back into the lightguide 1722 in a waveguide condition. The light 1727 propagates through the lightguide 1722 in the −x direction and then the +y direction and exits a different side of the first product 1728 than the light 1727 entered with a directional component in the −x direction when the light 1727 reaches a light extraction feature (not shown), it is extracted from the second product 1729 where the light collectively combines from other light scattering features to form part of the light emitting indicia 1716. The light 1727 propagating in the −y direction received from the POP display 1703 (shown in FIG. 17D) propagating in the −y direction is transmitted through an input window 1721 in the packaging 1719 of the first product 1729, transmitted through the lightguide 1722 and is reflectively scattered in the +y direction and −x direction from one of the light scattering features 1724 back into the lightguide 1722 in a waveguide condition. The light 1712 then propagates through the lightguide in the −x direction and then the +y direction and exits a different side of the first product 1729 than the light 1712 entered with a directional component in the −x direction when the light 1712 reaches a light extraction feature (not shown), it is extracted from the second product 1729 where the light collectively combines from other light scattering features to form part of the light emitting indicia 1716 of the first product 1728. In another embodiment, the lightguide 1722 is disposed on an outer surface 1760 of the packaging 1719 in the region of the light emitting indicia 1716.

Figure 18:
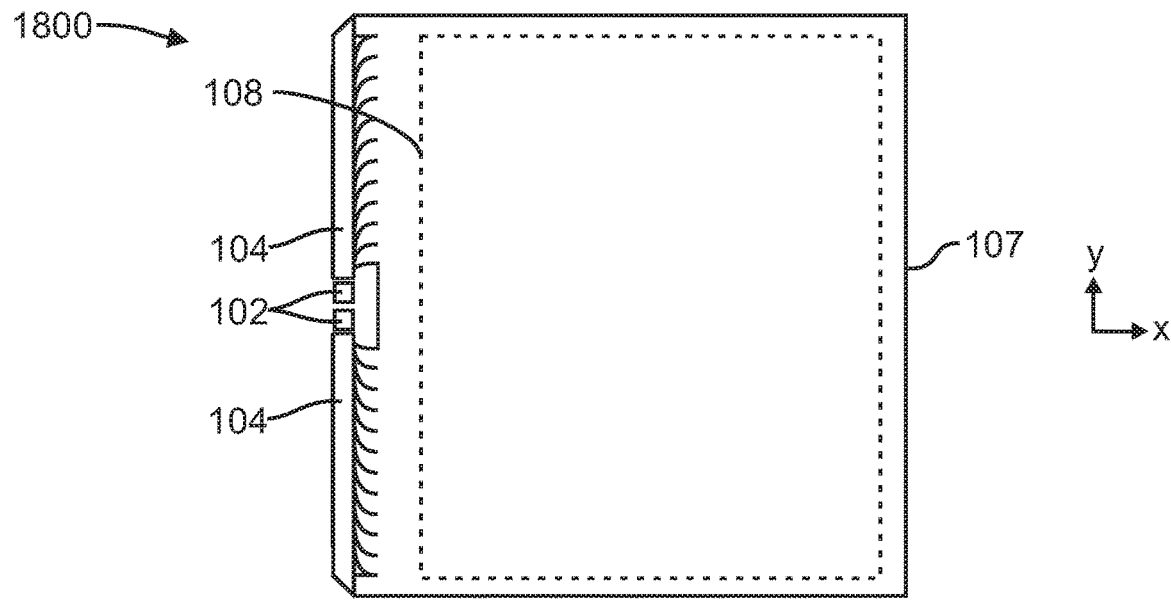
FIG. 18 is a top view of one embodiment of a light emitting device comprising two light input couplers with light sources on the same edge in the middle region oriented in opposite directions.

FIG. 18 is a top view of one embodiment of a light emitting device 1800 comprising two light input couplers with two arrays of coupling lightguides 104 and two light sources 102 on the same edge in the middle region oriented in opposite directions. As shown in FIG. 18, the +y and −y edges of the light emitting device 1800 may be very close to the border of the light emitting region 108 because the light sources 102, including LEDs, do not extend past the bottom edge of the light emitting region 108 as the light source 102 in the embodiment shown in FIG. 1 does. Thus, a TV for example, illuminated by the light emitting device 1800 of shown in FIG. 18 could have a light emitting display area extending less than 2 millimeters from the edge of the light emitting device 1800 in the +y and −y directions. In the embodiment shown in FIG. 18, the light source 102 is disposed substantially in a middle region of the light emitting region 108 between the +y and −y edges of the light emitting device 1800.

Figure 19:
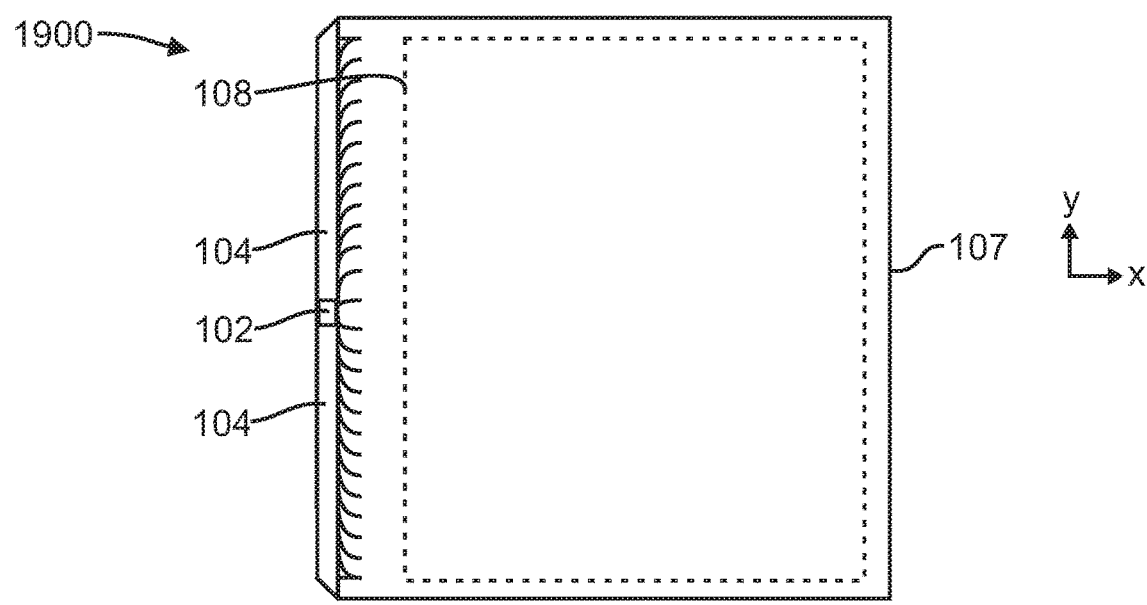
FIG. 19 is a top view of one embodiment of a light emitting device comprising one light input coupler with coupling lightguides folded toward the −y direction and then folded in the +z direction toward a single light source.

FIG. 19 is a top view of one embodiment of a light emitting device 1900 comprising one light input coupler with coupling lightguides 104 folded in the +y and −y directions and then folded in the +z direction (out of the page in the drawing) toward a single light source 102.

Figure 20A:
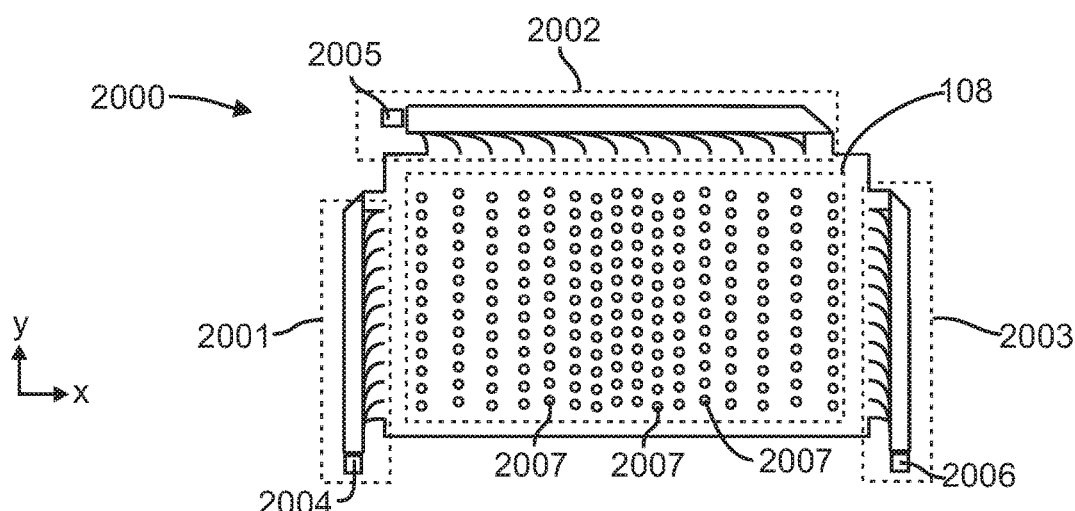
FIG. 20a is a top view of one embodiment of a backlight emitting red, green, and blue light with light input couplers disposed along three sides of the lightguide.

FIG. 20A is a top view of one embodiment of a light emitting backlight 2000 emitting red, green, and blue light comprising a red light input coupler 2001, a green light input coupler 2002, and a blue light input coupler 2003 disposed to receive light from a red light source 2004, a green light source 2005, and a blue light source 2006, respectively. Light from each of the light input couplers 2001, 2002, and 2003 is extracted from the lightguide region 106 in a light emitting region 108 by light extraction features 2007 and exits the light emitting device 2000. The pattern of the light extraction features 2007 may vary in one or more of the following: size, space, spacing, pitch, shape, and location within the x-y plane or throughout a thickness of the light emitting region 108 in the z direction.

Figure 20B:
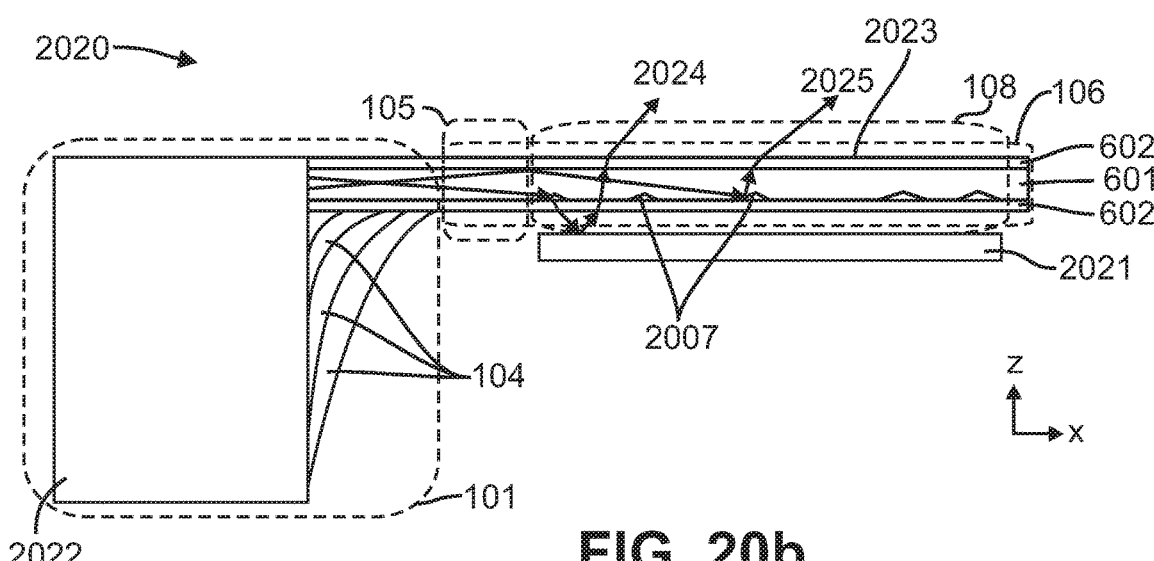
FIG. 20b is a cross-sectional side view of one embodiment of a light emitting device comprising a light input coupler and lightguide with a reflective optical element disposed adjacent a surface.

FIG. 20B is a cross-sectional side view of one embodiment of a light emitting device 2020 comprising the light input coupler 101 (shown in phantom lines) and the lightguide region 106 with a reflective optical element 2021 disposed adjacent a surface 2050 of the cladding region 602 and a light source 2022 emitting light with a directional component in the +y direction disposed to direct light into the coupling lightguides 104. Light from the light source 2022 propagates through the coupling lightguides 104 within the light input coupler 101 and through the light mixing region 105 and the light emitting region 108 within the lightguide region 106. A first portion of light 2024 reaching the light extraction features 1007 is redirected toward the reflecting optical element 2021 at an angle such that the light escapes the lightguide region 106, reflects from the reflective optical element 1101, passes back through the lightguide region 106, and exits the lightguide region 106 through the light emitting surface 2023 within the light emitting region 108. A second portion of light 2025 reaching the light extraction features 1007 is redirected toward the light emitting surface 2023 at an angle less than a critical angle, escapes the lightguide region 106, and exits the lightguide region 106 through the light emitting surface 2023 within the light emitting region 108.

Figure 20C:
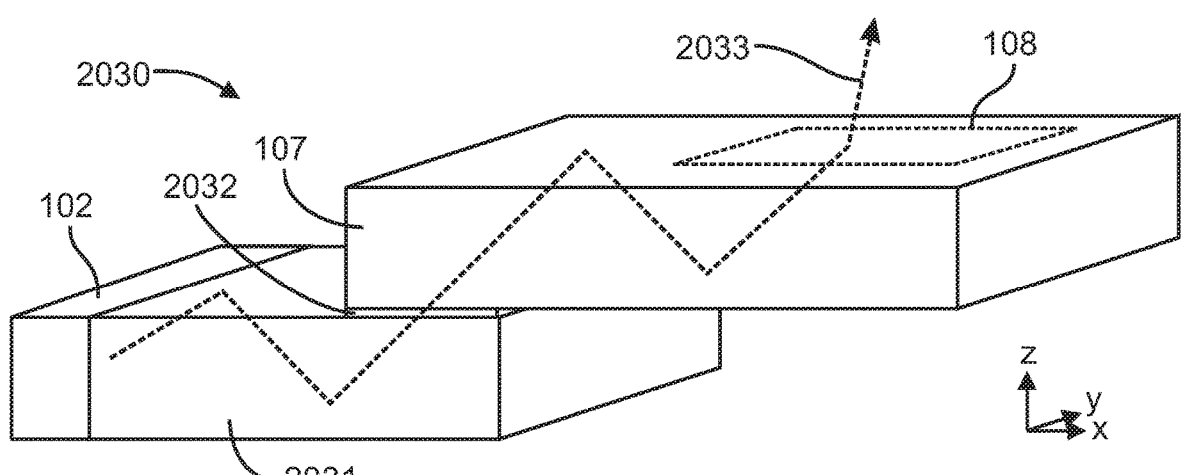
FIG. 20c is a perspective view of one embodiment of a light emitting device comprising a light output optical element optically coupled to a film-based lightguide using an adhesive.

FIG. 20C is a perspective view of one embodiment of a light emitting device 2030 comprising a light output optical element 2031 optically coupled to the film-based lightguide 107 using an adhesive 2032. Light 2033 from the light source 102 totally internally reflects within the light output optical element 2031 and transmits through the adhesive 2002 and into the film-based lightguide 107 where the light totally internally reflects and exits the film-based lightguide 107 through the light emitting surface region 108. In another embodiment, the light output optical element 2031 and the film-based lightguide 107 directly adhere and optically couple to each other due to inherent adhesion properties of the light output optical element 2031 and/or inherent adhesion properties of the film-based lightguide 107.

Figure 20D:
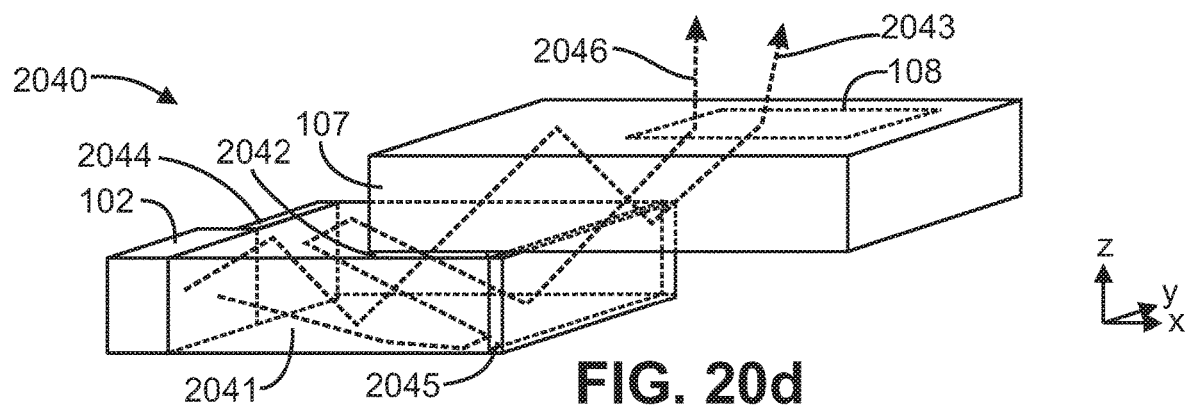
FIG. 20d is a perspective view of one embodiment of a light emitting device comprising a light output optical element optically coupled to a film-based lightguide using an adhesive with a reflective optical element disposed on the end of the light output optical element opposite the light source.

FIG. 20D is a perspective view of one embodiment of a light emitting device 2040 comprising a light output optical element 2041 optically coupled to the film-based lightguide 107 using an adhesive 2042 with a reflective optical element 2045 disposed on an end 2060 of the light output optical element 2041 opposite the light source 102 and a second reflective optical element 2044 on the input edge 2061 with the light source 102. Light 2043 from the light source 102 totally internally reflects within the light output optical element 2041 and transmits through the adhesive 2042 and into the film-based lightguide 107 where the light totally internally reflects and exits the film-based lightguide 107 through the light emitting region 108. Light 2046 from the light source 102 totally internally reflects within the light output optical element 2041, reflects from the reflective optical element 2045 toward the second reflective optical element 2044 at the input edge 2061, total internally reflects off of edges and surfaces, as shown in FIG. 20D, and transmits through the adhesive 2042 and into the film-based lightguide 107 where the light totally internally reflects and exits the film-based lightguide 107 through the light emitting region 108.

Figure 21:
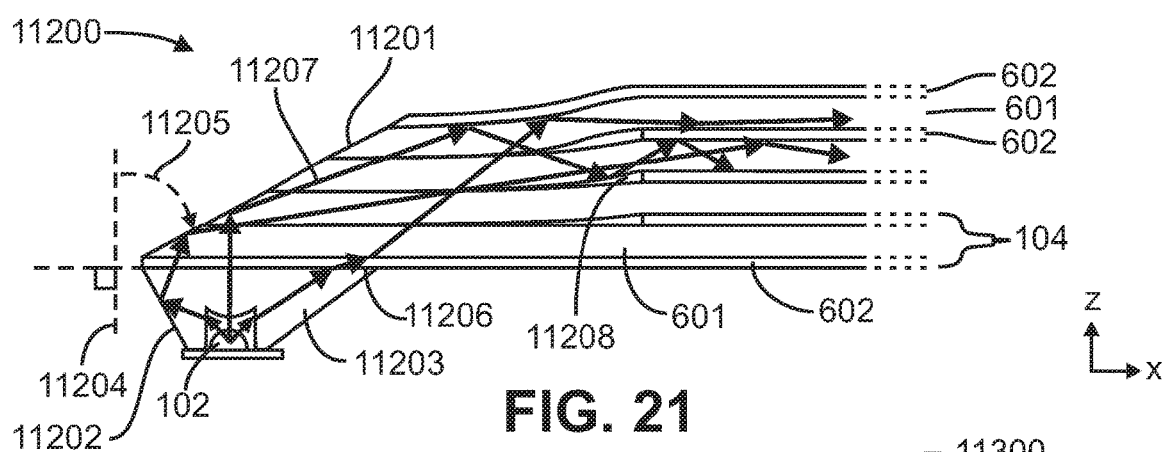
FIG. 21 is a cross-sectional side view of a region of one embodiment of a light emitting device comprising a stacked array of coupling lightguides with core regions comprising vertical light turning optical edges.

FIG. 21 is a cross-sectional side view of a region of one embodiment of a light emitting device 11200 comprising a stacked array of coupling lightguides 104 comprising core regions 601 and cladding regions 602. The core regions 601 comprise vertical light turning optical edges 11201. The cladding regions 602 in the inner regions of the stack of coupling lightguides 104 do not extend to the vertical light turning optical edges 11201 and the core regions 601 are not separated by a cladding layer in the region near the light source 102. The light source 102 and the light collimating optical element 11203 are disposed at a light input surface 11206 on the larger (non-lateral edge) surface of the stack coupling lightguides 104. Light 11207 from the light source 102 is collimated by the reflecting surface 11102 of the light collimating optical element 11203, enters the stack of coupling lightguides 104 and the optical axis is rotated toward the +x direction by the vertical light turning optical edges 11201 of the core regions 601 of the coupling lightguides. Light 11207 propagates in the core regions 601 near the light source and totally internally reflects in a core region when encountering an air gap 11208 or cladding layer 602. In one embodiment, the vertical light turning optical edges 11201 are formed by cutting the stack of core regions 601 at the angle 11205 from the normal 11204 to the surface of the stack of coupling lightguides 104. In another embodiment, the outer cladding region 602 near the light source 102 does not extend to the region between the light collimating optical element 11203 and the stack of core regions 601 near the light collimating optical element 11203. In another embodiment, the cladding layer 602 near the light collimation element 11203 is a low refractive index optical adhesive that bonds the light collimating optical element 11203 to the stack of coupling lightguides 104.

Figure 22:
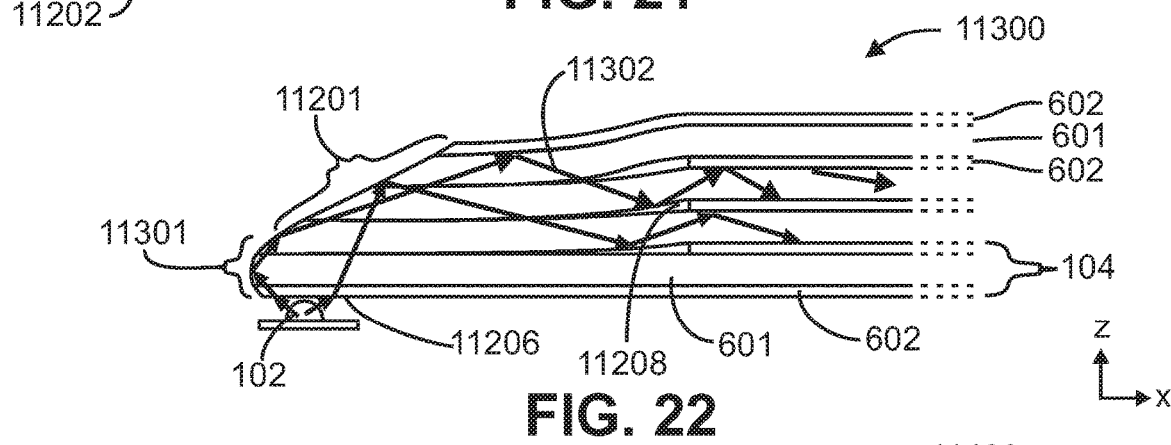
FIG. 22 is a cross-sectional side view of a region of one embodiment of a light emitting device comprising a stacked array of coupling lightguides with core regions comprising vertical light turning optical edges and vertical light collimating optical edges.

FIG. 22 is a cross-sectional side view of a region of one embodiment of a light emitting device 11300 comprising a stacked array of coupling lightguides 104 comprising core regions 601 and cladding regions 602. The core regions 601 comprise vertical light turning optical edges 11201 and vertical light collimating optical edges 11301. The cladding regions 602 in the inner regions of the stack of coupling lightguides 104 do not extend to the vertical light turning optical edges 11201 or the vertical light collimating optical edges 11301 and the core regions 601 are not separated by a cladding layer in the region near the light source 102. The light source 102 is disposed at light input surface 11206 on the larger (non-lateral edge) surface of the stack coupling lightguides 104. Light 11302 from the light source 102 enters the stack of coupling lightguides 104 and is collimated by the vertical light collimating optical edges 11301 of the core regions 601 of the coupling lightguides 104. The optical axis of the light 11302 is rotated toward the +x direction by the vertical light turning optical edges 11201 of the core regions 601 of the coupling lightguides 104. Light 11302 propagates in the core regions 601 near the light source and totally internally reflects in a core region when encountering an air gap 11208 or cladding layer 602.

Figure 23:
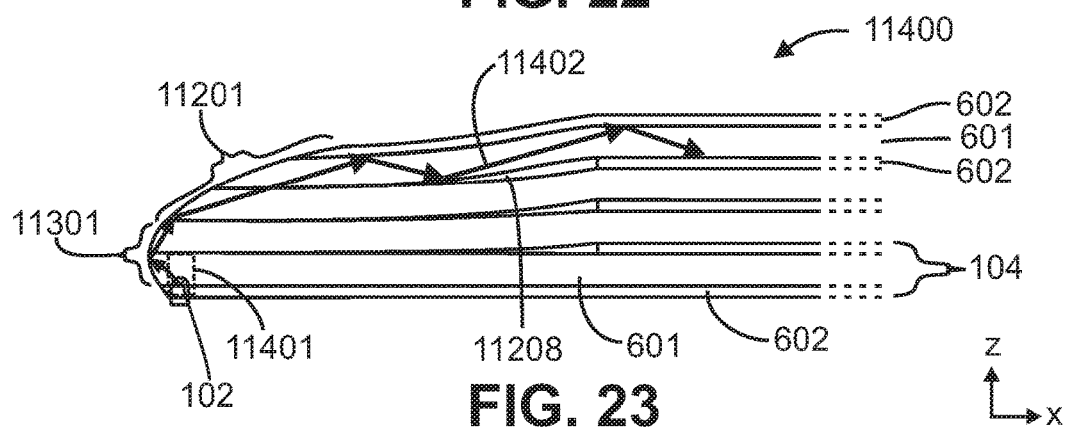
FIG. 23 is a cross-sectional side view of a region of one embodiment of a light emitting device comprising a stacked array of coupling lightguides with a cavity and core regions comprising vertical light turning optical edges and light collimating optical edges

FIG. 23 is a cross-sectional side view of a region of one embodiment of a light emitting device 11400 comprising a stacked array of coupling lightguides 104 comprising core regions 601 and cladding regions 602. The core regions 601 comprise vertical light turning optical edges 11201 and vertical light collimating optical edges 11301. The cladding regions 602 in the inner regions of the stack of coupling lightguides 104 do not extend to the vertical light turning optical edges 11201 or the vertical light collimating optical edges 11301 and the core regions 601 are not separated by a cladding layer in the region near the light source 102. A coupling lightguide 104 near the vertical light collimating optical edges 11301 comprises a cavity 11401. A light source 102 is disposed within the cavity 11401 and light 11402 from the light source 102 enters the stack of coupling lightguides 104 and is collimated by the vertical light collimating optical edges 11301 of the core regions 601 of the coupling lightguides 104. The optical axis of the light 11402 is rotated toward the x direction by the vertical light turning optical edges 11201 of the core regions 601 of the coupling lightguides. Light 11402 propagates in the core regions 601 near the light source and totally internally reflects in a core region when encountering an air gap 11208 or cladding layer 602. In this embodiment, the cavity 11401 can assist in registration and increase optical efficiency of the light emitting device 11400. The cavity 11401 can serve as an alignment cavity to position the light source 102 at a predetermined location (x, y, and +z registration) relative to the vertical light collimating optical edges 11301 and/or light turning optical edges 11201. By placing the light source 102 within the cavity of a coupling lightguide 104, the light flux from the light source 102 directed into the coupling lightguides 104 and remaining in the coupling lightguides 104 in a total internal reflection condition in areas with the cladding regions 602, or near the lightguide region (not shown) further in the +x direction, is increased relative to a light source disposed at the larger outer surface. In another embodiment, the cavity 11401 extends through two or more or coupling lightguides 104 or core regions 601 of coupling lightguides 104.

Figure 24:
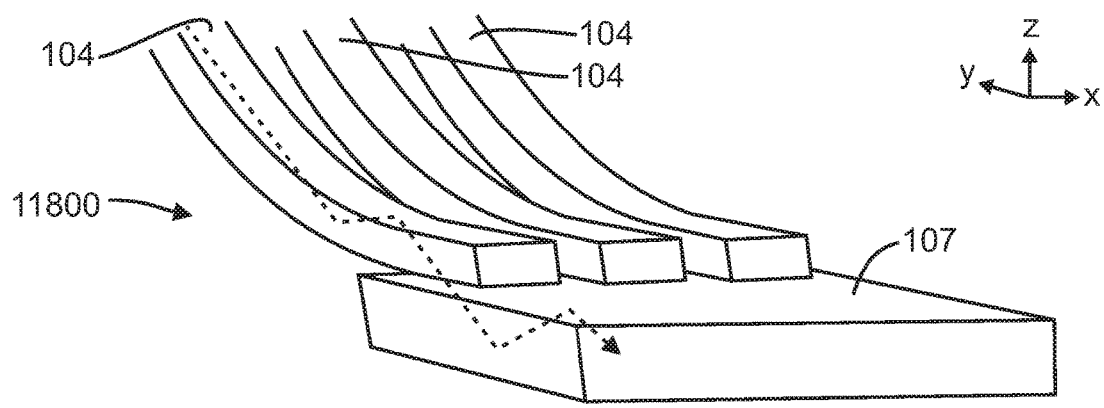
FIG. 24 is a perspective view of one embodiment of a light emitting device wherein the coupling lightguides are optically coupled to a surface of a lightguide.

FIG. 24 is a perspective view of one embodiment of a light emitting device 11800 comprising coupling lightguides 104 that are optically coupled to a surface of a lightguide 107. In one embodiment, the coupling lightguides optically coupled to the lightguide have a thickness less than one selected from the group: 40%, 30%, 20%, 10%, and 5% of the thickness of the lightguide.

Figure 25:
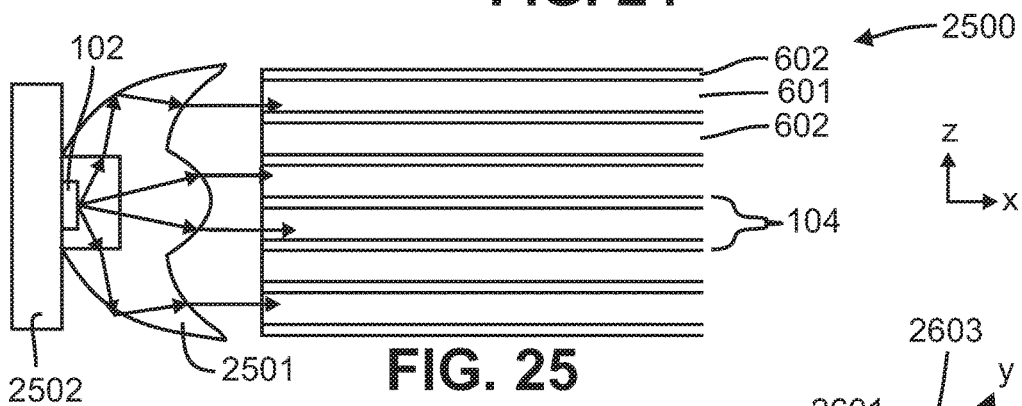
FIG. 25 is a cross-sectional side view of one embodiment of a light emitting device comprising a light input coupler disposed adjacent a light source with a collimating optical element.

FIG. 25 is a cross-sectional side view of a region of one embodiment of a light emitting device 2500 comprising a stack of coupling lightguides 104 disposed adjacent a light source 102 with a substrate 2502 and a collimating optical element 2501. In one embodiment, the collimating optical element 2501 is a lens which refracts and totally internally reflects light to collimate light from a light emitting diode.

Figure 26:
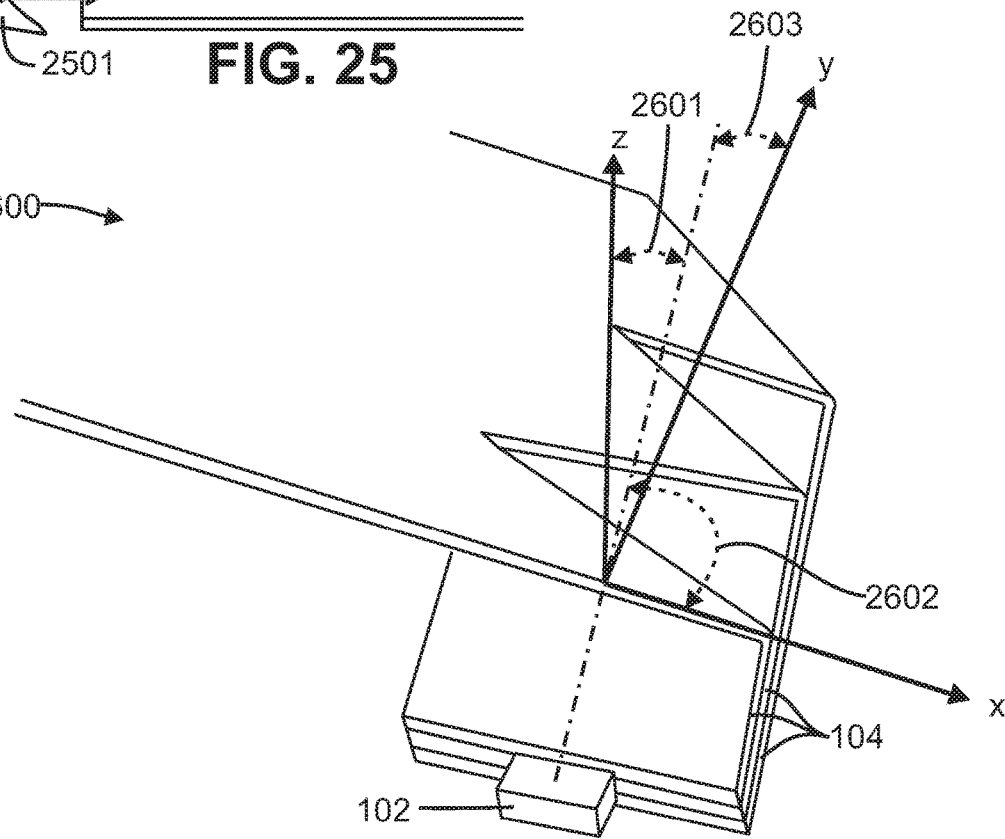
FIG. 26 is a perspective view of one embodiment of a light emitting device comprising light coupling lightguides and a light source oriented at an angle to the x, y, and z axis.

FIG. 26 is a perspective view of one embodiment of a light emitting device 2600 comprising a light source 102 and coupling lightguides 104 oriented at an angle to the x, y, and z axes. The coupling lightguides 104 are oriented at a first redirection angle 2601 from the +z axis (light emitting device optical axis), a second redirection angle 2602 from the +x direction, and a third redirection angle 2603 from the +y direction. In another embodiment, the light source optical axis and the coupling lightguides 104 are oriented at a first redirection angle 2601 from the +z axis (light emitting device optical axis), a second redirection angle 2602 from the +x direction, and a third redirection angle 2603 from the +y direction.

Figure 27:
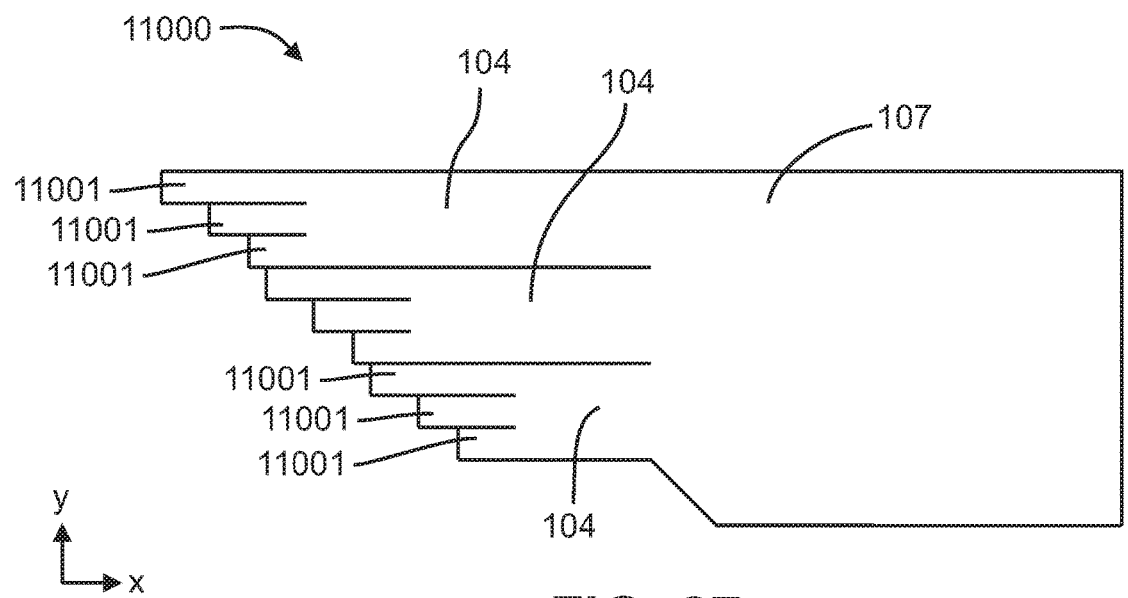
FIG. 27 is a top view of one embodiment of a film-based lightguide comprising an array of coupling lightguides wherein each coupling lightguide further comprises a sub-array of coupling lightguides.

FIG. 27 is a top view of one embodiment of a lightguide 11000 comprising a film-based lightguide 107 comprising an array of coupling lightguides 104 wherein each coupling lightguide 104 further comprises a sub-array of coupling lightguides 11001 with a smaller width in the y direction.

Figure 28:
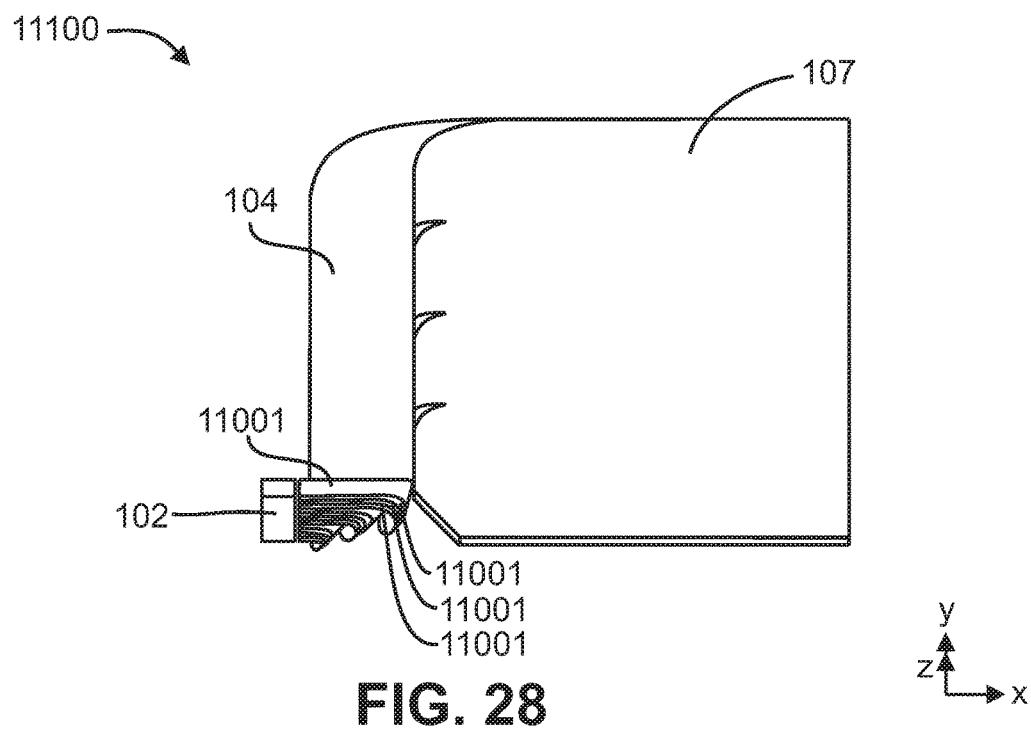
FIG. 28 is a perspective top view of one embodiment of a light emitting device comprising the film-based lightguide of FIG. 27 wherein the coupling lightguides are folded.

FIG. 28 is a perspective top view of one embodiment of a light emitting device 11100 comprising the lightguide 11000 of FIG. 27 wherein the coupling lightguides 104 are folded such that they overlap and are aligned substantially parallel to the y direction, and the sub-array of coupling lightguides 11001 are subsequently folded such that they overlap and are aligned substantially parallel to the x direction and disposed to receive light from the light source 102, and couple the light into the coupling lightguides 104 that couple the light into the film-based lightguide 107.

Figure 29A:
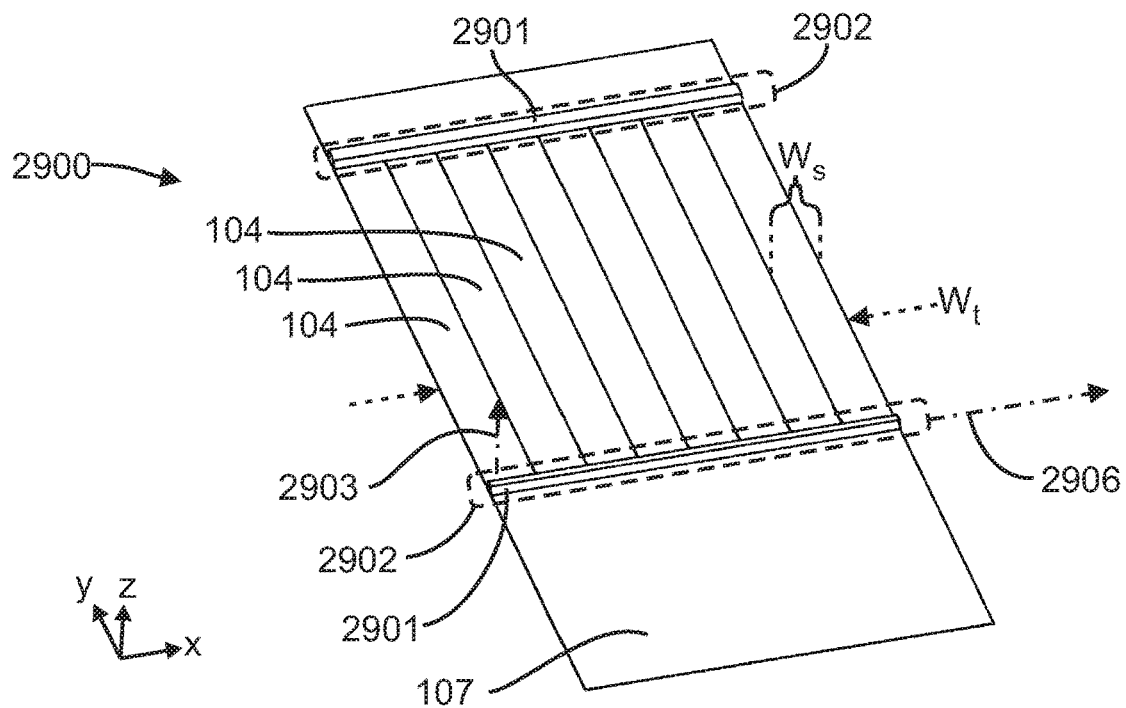
FIG. 29A is a perspective view of one embodiment of a method of manufacturing light input coupler comprising an array of coupling lightguides that are substantially within the same plane as the lightguide and the coupling lightguides are regions of a light transmitting film comprising two linear fold regions.

FIGS. 29A, 29B, 29C, 29D, and 29E illustrate one embodiment of a method of manufacturing a lightguide 107 with continuously coupled lightguides 104 using a light transmitting film. FIG. 29A is a perspective view of one embodiment of a lightguide 107 continuously coupled to each coupling lightguide 104 in an array of coupling lightguides 104. The array of coupling lightguides 104 comprise linear fold regions 2902 substantially parallel to each other which further comprise relative position maintaining elements 2901 disposed within the linear fold regions 2902. In the configuration shown in FIG. 29A, the array of coupling lightguides are substantially within the same plane (x-y plane) as the lightguide 107 and the coupling lightguides 104 are regions of a light transmitting film. The total width, $W_t$, of the array of the coupling lightguides in a direction substantially parallel to the linear fold regions 2902 is shown in FIG. 29A. In the embodiment shown in FIG. 29A, the coupling lightguides have substantially the same width, $W_s$, in a direction 2906 parallel to the linear fold region. The direction 2903 normal to a film surface 2980 at the linear fold region 2902 is shown in FIG. 29A.

Figure 29B:
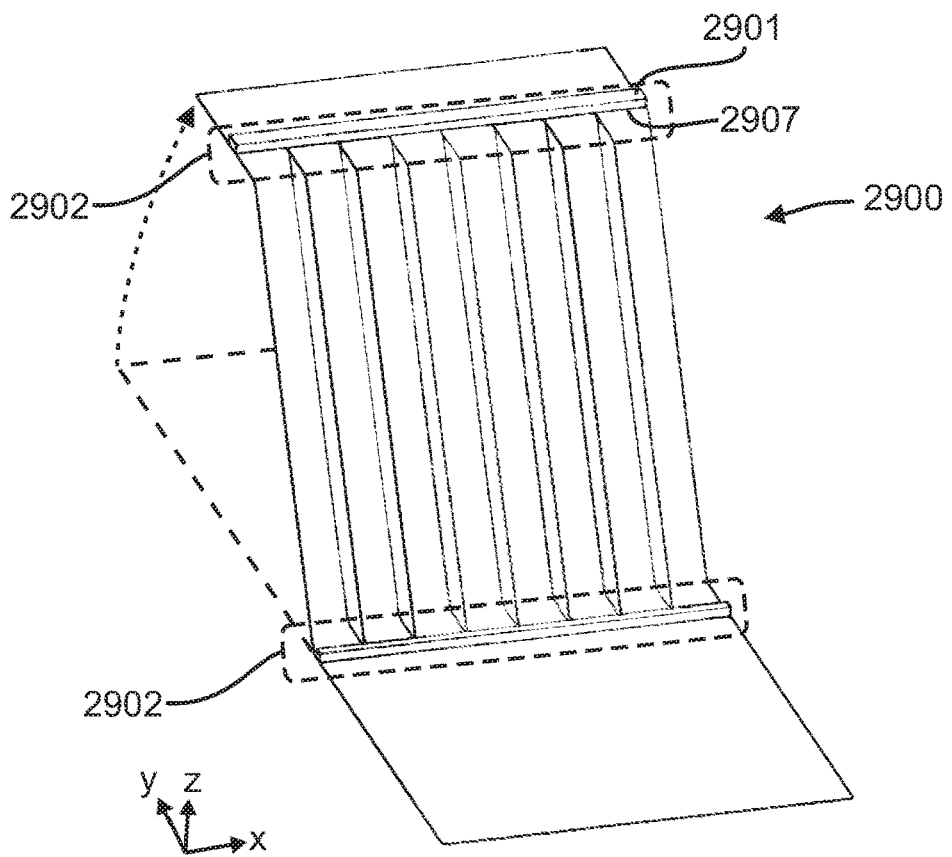
FIG. 29B is a perspective view of one embodiment for manufacturing an input coupler and lightguide comprising translating one of the linear fold regions of FIG. 29A.

As shown in FIG. 29B, the linear fold regions 2902 are translated with respect to each other from their locations shown in FIG. 29A. The distance between the two linear fold regions 2902 of the array of coupling lightguides 104 in a direction 2903 (parallel to the z direction) perpendicular to the light transmitting film surface 2980 at the linear fold region 2902 is increased. In addition, as shown in FIG. 29B, the distance between the linear fold regions 2902 of the array of coupling lightguides 104 in a direction (y direction) substantially perpendicular to the direction 2906 of the linear fold region 2902 and parallel to the light transmitting film surface 2980 (x-y plane) at the linear fold region 2902 is decreased.

Figure 29C:
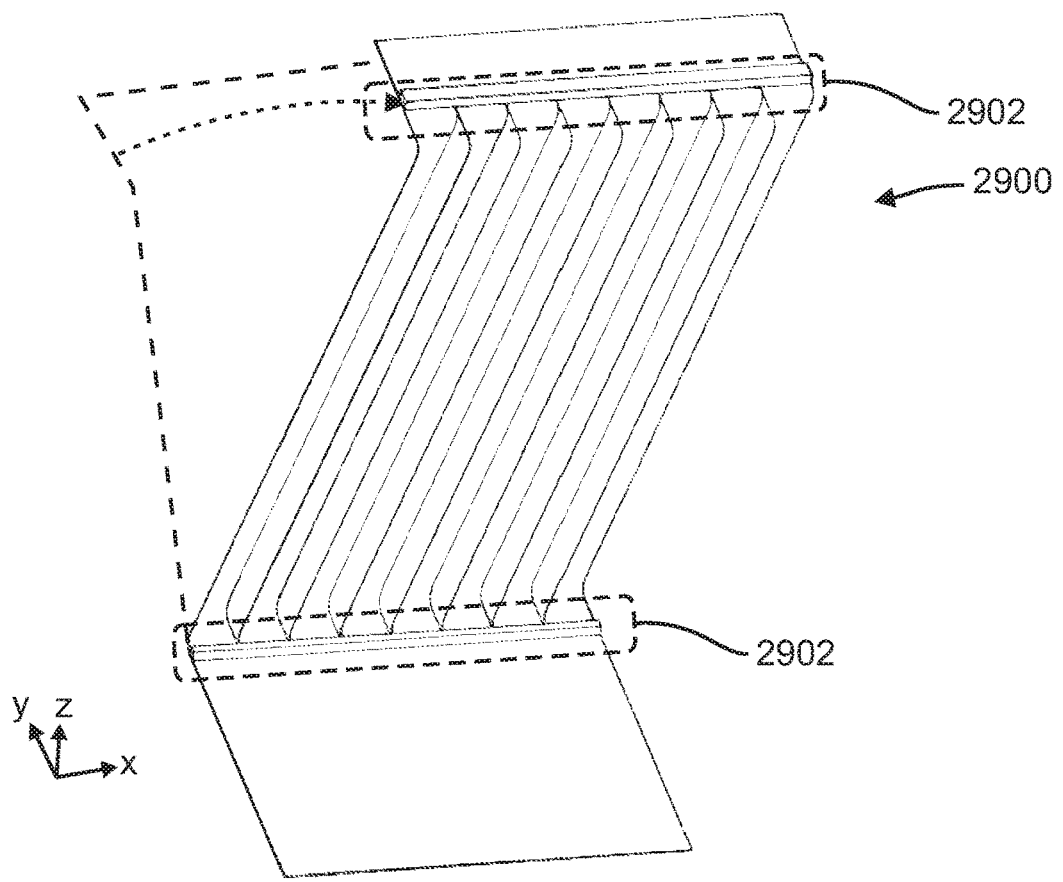
FIG. 29C is a perspective view of one embodiment for manufacturing an input coupler and lightguide comprising translating one of the linear fold regions of FIG. 29B.

As shown in FIG. 29C, the linear fold regions 2902 are translated with respect to each other from their locations shown in FIG. 29B. In FIG. 29C, the distance between the linear fold regions 2902 of the array of coupling lightguides 104 in a direction (x direction) substantially parallel to the direction 2906 of the linear fold regions 2902 and parallel to the light transmitting film surface 2980 at the linear fold regions 2902 is increased.

Figure 29D:
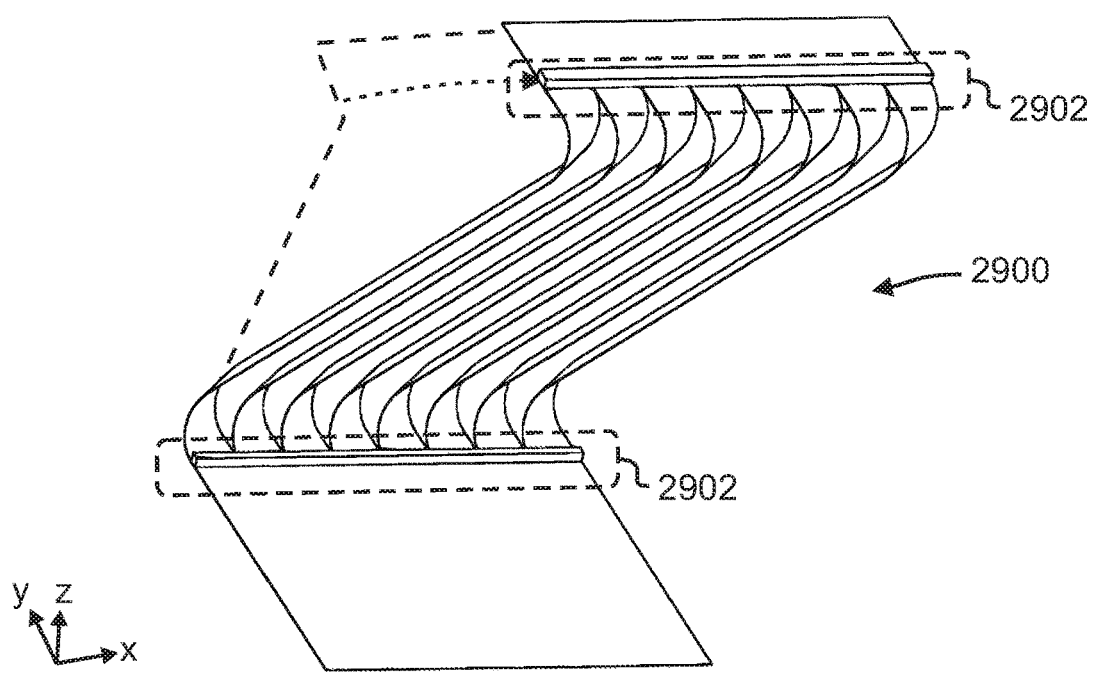
FIG. 29D is a perspective view of one embodiment for manufacturing an input coupler and lightguide comprising translating one of the linear fold regions of FIG. 29C.

FIG. 29D illustrates further translation of the linear fold regions 2902 where the distance between the linear fold regions 2902 of the array of coupling lightguides 104 in a direction (x direction) substantially parallel to the direction 2906 of the linear fold regions 2902 and parallel to the light transmitting film surface 2980 at the linear fold regions 2902 is increased and the distance between the linear fold regions 2902 of the array of coupling lightguides 104 in a direction 2903 perpendicular to the light transmitting film surface 2980 at the linear fold region 2902 is decreased.

Figure 29E:
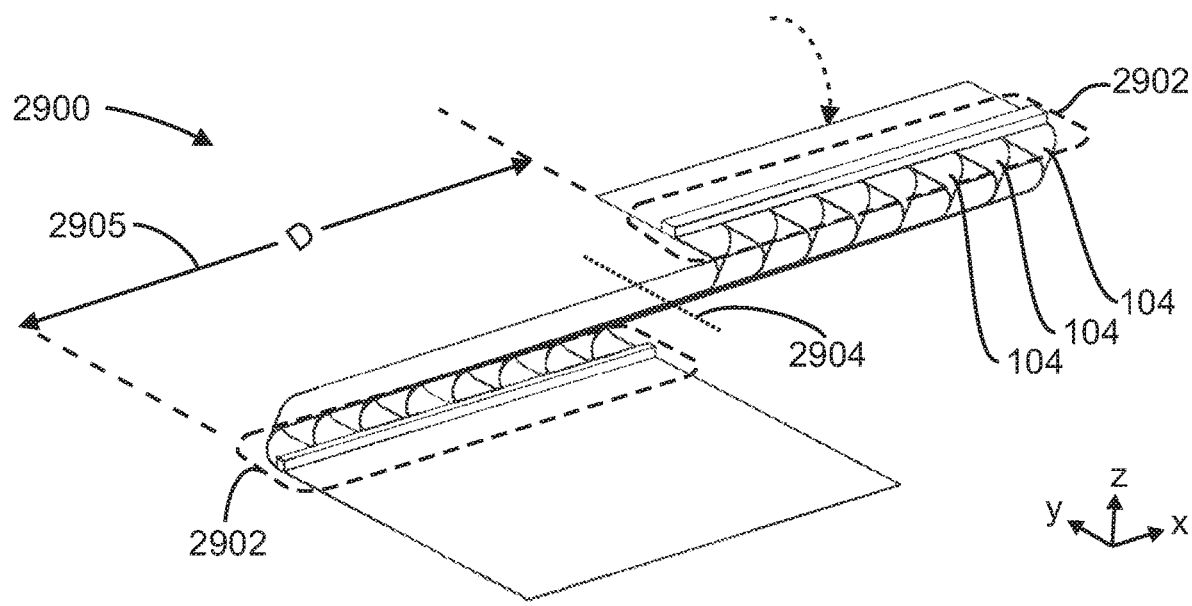
FIG. 29E is a perspective view of one embodiment for manufacturing an input coupler and lightguide comprising translating one of the linear fold regions of FIG. 29D.

As shown in FIG. 29E, the linear fold regions 2902 are translated with respect to each other from their locations shown in FIG. 29D. In FIG. 29E, the distance between the linear fold regions 2902 of the array of coupling lightguides 104 in a direction (x direction) substantially parallel to the direction 2906 of the linear fold regions 2902 and parallel to the light transmitting film surface 2980 at the linear fold regions 2902 is further increased from that of FIG. 29D and the distance between the linear fold regions 2902 of the array of coupling lightguides 104 in a direction 2903 perpendicular to the light transmitting film surface 2980 at the linear fold region 2902 is further decreased over that of FIG. 29D.

As a result of the translations of the linear fold regions 2902 as shown FIGS. 29A-e, corresponding edges 2981 of the linear fold regions 2902 are separated by a distance, D. In one embodiment, the distance, D, is at least equal to the total width, $W_t$, of the array of the coupling lightguides 104 in a direction substantially parallel to the linear fold region 2902 In another embodiment, D=N×W, where the array of coupling lightguides 104 comprise a number, N, of coupling lightguides that have substantially the same width, $W_s$, in a direction parallel to the linear fold region 2902. The array of coupling lightguides 104 disposed substantially one above another may be cut along a first direction 2904 to provide an array of input edges of the coupling lightguides 104 that end in substantially one plane perpendicular to the linear fold regions 2902. The cut may be at other angles and may include angled or arcuate cuts that can provide collimation or light redirection of light from a light source disposed to couple light into the input surface of the coupling lightguides.

In a further embodiment, a method of manufacturing a light input coupler and lightguide comprises cutting the coupling lightguides such that two input couplers and two lightguides are formed from the same film. For example, by cutting the coupling lightguides along the direction 2904, the light transmitting film can be divided into two parts, each comprising a light input coupler and a lightguide.

Figure 30:
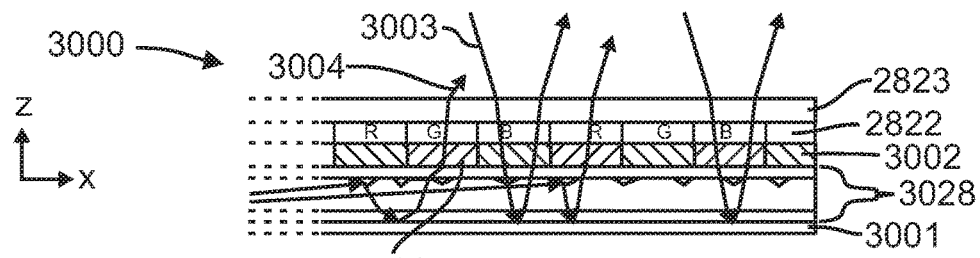
FIG. 30 is a cross-sectional side view of a region of one embodiment of a reflective display comprising a backlight disposed between the light modulating pixels and the reflective element.

FIG. 30 is a cross-sectional side view of a region of one embodiment of a reflective display 3000 comprising a backlight 3028 with light extraction features within the film-based lightguide disposed between two cladding layers. The backlight 3028 is disposed between the light modulating pixels 3002 and the reflective element 3001 within the reflective display 3000. The light modulating pixels 3002 are disposed between the red, green, and blue color filters 2822 and the backlight 3028. Ambient light 3003 exterior to the display 3000 propagates through the substrate 2823, through the color filters 2904, through the light modulating pixels 3002, through the backlight 3028, and reflects from the reflective element 3001 back through the backlight 3028, light modulating pixels 3002, color filter 2822, substrate 2823, and exits the reflective display 3000. Light 3004 propagating within film-based lightguide region of the backlight 3028 is redirected by light extraction features toward the reflective element 3001. This light reflects back through the backlight 3028, the light modulating pixels 3002, the color filters 2822 and the substrate 2823 for the color filters before exiting the reflective display 3000. In this embodiment, the backlight is within a reflective spatial light modulator. In one embodiment, for example without limitation, the light modulating pixels comprise liquid crystal material materials, the reflective display further comprises polarizers, and the reflective layer is an aluminum coating on outer surface of the cladding layer.

Figure 31:
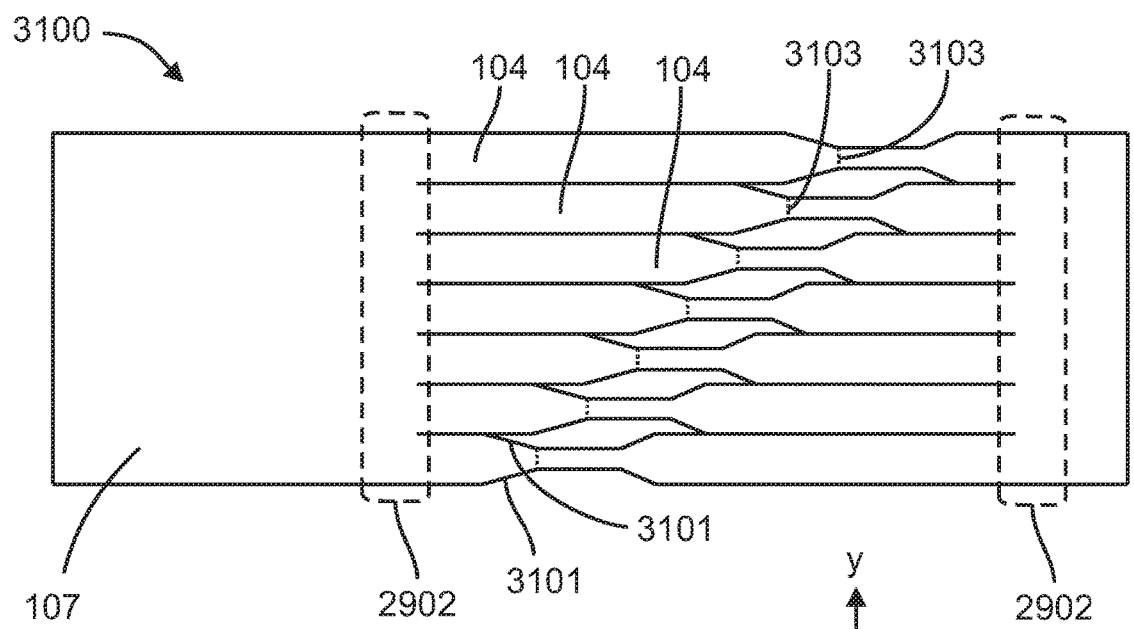
FIG. 31 is a top view of one embodiment of an input coupler and lightguide wherein the array of coupling lightguides has non-parallel regions.

FIG. 31 is a top view of a further embodiment of an input coupler and lightguide 3100 with coupling lightguides 104 wherein the array of coupling lightguides 104 has non-parallel regions. In the embodiment illustrated in FIG. 31, the coupling lightguides 104 have tapered region 3101 comprising light collimating edges 3181 and linear fold regions 2902 substantially parallel to each other. In another embodiment, the coupling lightguides 104 have non-constant separations. In another embodiment, a method for manufacturing a lightguide 3100 with coupling lightguides 104 having a tapered regions 3101 of the coupling lightguides 104 includes cutting the coupling lightguides in regions 3103 disposed at or near the tapered region 3101 such that when the array of coupling lightguides 104 are folded, the coupling lightguides 104 overlap to form a profiled, non-planar input surface that is capable of redirecting light input through the light input surface so that the light is more collimated. In another embodiment, the coupling lightguides 104 are not substantially parallel such that the coupling lightguides 104 have regions with angles between the edges that vary by more than about 2 degrees.

Figure 32:
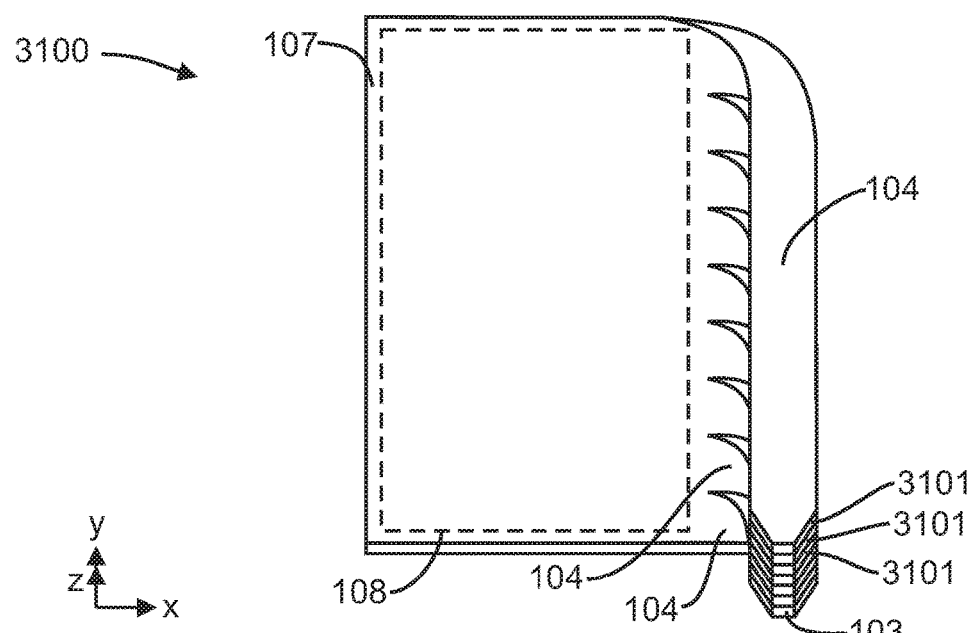
FIG. 32 is a perspective top view of a portion of the input coupler and lightguide of FIG. 31 with the coupling lightguides folded.

FIG. 32 is a perspective view of a portion of the lightguide 3100 with coupling lightguides 104 shown in FIG. 31. The coupling lightguides 104 have been cut in regions 3103 (shown in FIG. 31) disposed near the tapered region 3101 and folded such that the tapered regions 3101 overlap to form a profiled light collimating edges 3181 that are capable of redirecting light input through the light input surface 103 so that the light is more collimated in the x-y plane within the film-based lightguide 107.

Figure 33:
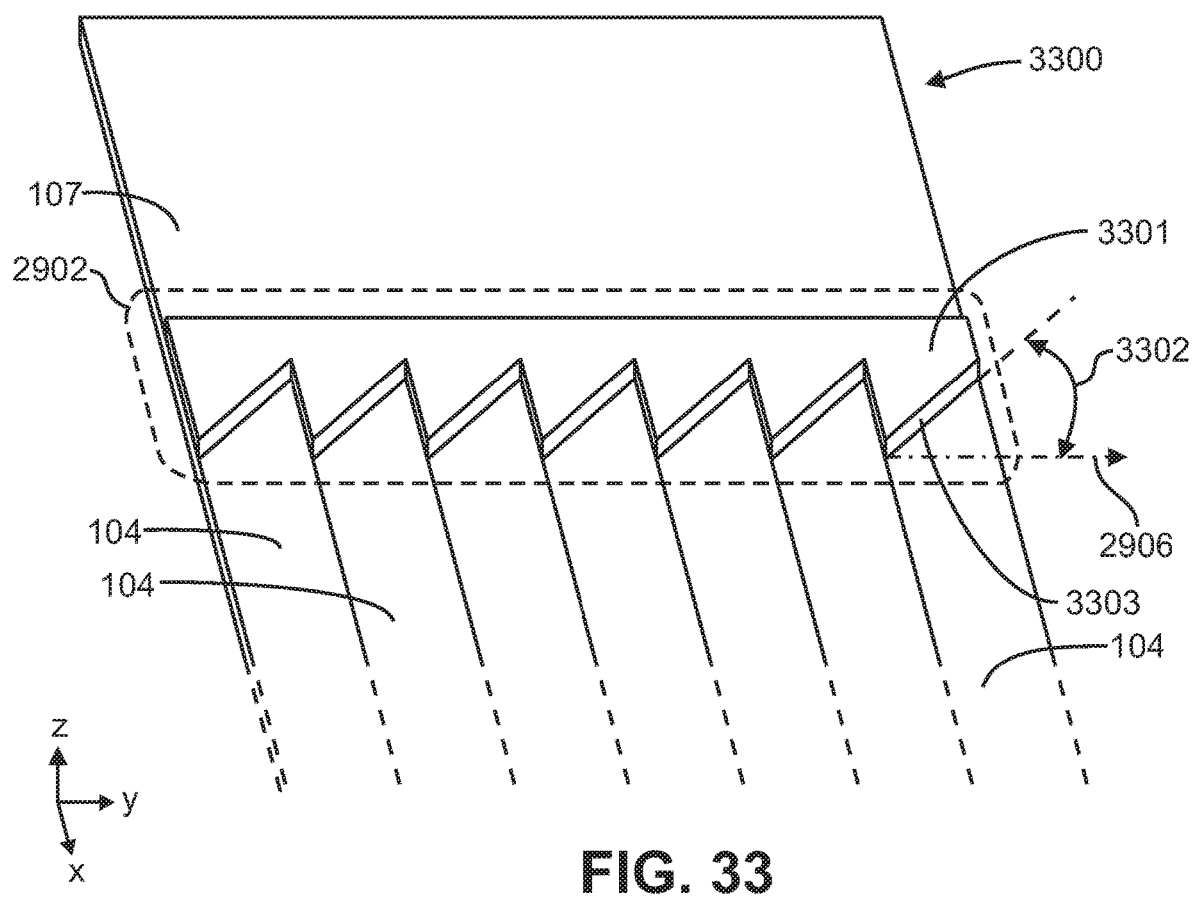
FIG. 33 is a perspective view of one embodiment of a light input coupler and lightguide comprising a relative position maintaining element disposed proximate a linear fold region.

FIG. 33 is a perspective view of one embodiment of a light input coupler and lightguide 3300 comprising a relative position maintaining element 3301 disposed proximal to a linear fold region 2902. In this embodiment, the relative position maintaining element 3301 has a cross-sectional edge 2971 in a plane (x-y plane as shown) parallel to the light transmitting film surface 2970 disposed proximal to the linear fold region 2902 that comprises a substantially linear section 3303 oriented at an angle 3302 greater than 10 degrees to the direction 2906 parallel to the linear fold region 2902 for at least one coupling lightguide 104. In one embodiment, a substantially linear section 3303 is disposed at an angle of about 45 degrees to a direction parallel to the linear fold region 2902.

Figure 34:
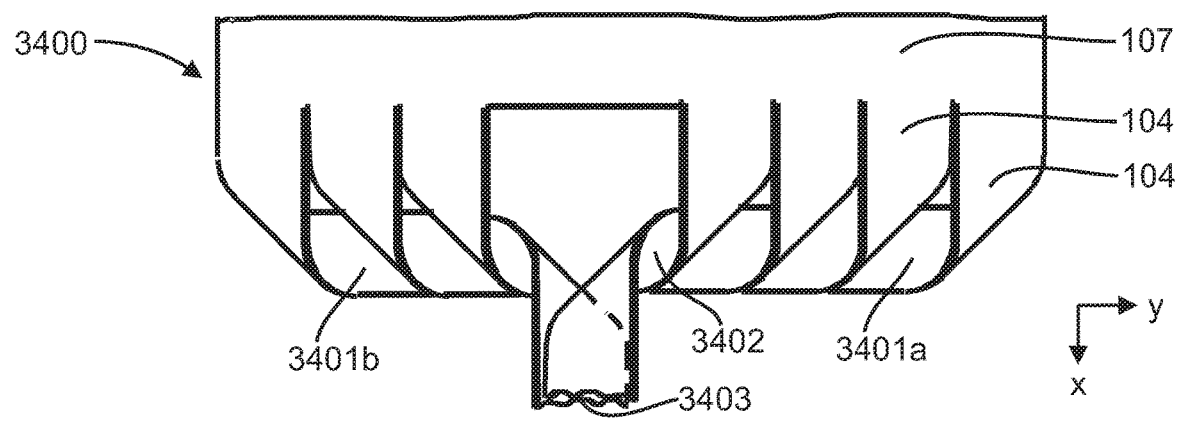
FIG. 34 is a top view of one embodiment of a light input coupler and lightguide comprising bundles of coupling lightguides that are folded twice and recombined in a plane substantially parallel to the film-based lightguide.
Figure 35A:
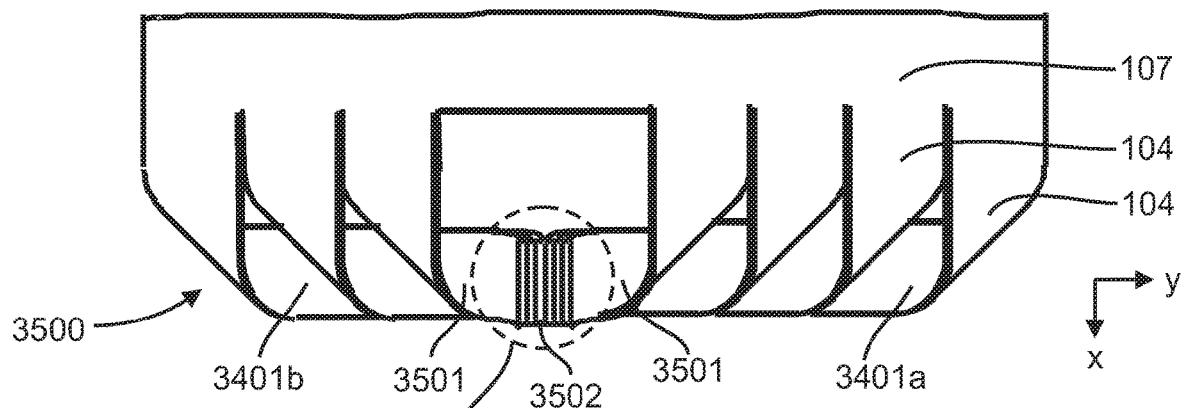
FIG. 35A is a top view of one embodiment of a light input coupler and lightguide comprising bundles of coupling lightguides that are folded upwards (+z direction) and combined in a stack that is substantially perpendicular to the plane of the film-based lightguide.

FIGS. 34 and 35A are top views of certain embodiments of light input couplers and lightguides 3400 and 3500, respectively, configured such that a volume and/or a size of the overall device is reduced while retaining total internal reflection (TIR) light transfer from the light source (not shown) into the lightguide. In FIG. 35A, the light input coupler and lightguide 3400 comprises bundles of coupling lightguides (3401a, 3401b) that are folded twice 3402 and recombined 3403 in a plane substantially parallel to the film based lightguide 107.

Figure 35B:
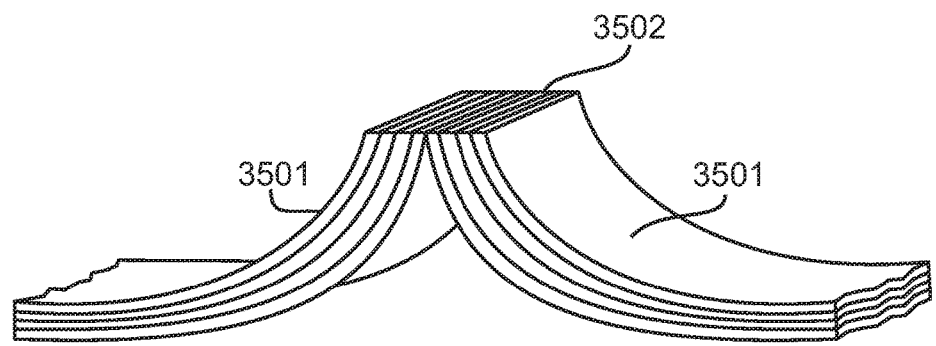
FIG. 35B is a magnification of the region of FIG. 35A comprising the upward folds of the coupling lightguides.

FIG. 35B illustrates one embodiment of a light emitting device with a light input coupler and lightguide 3500 that comprises bundles (3401a, 3401b) that are folded upwards 3501 (+z direction) and combined in a stack 3502 that is substantially perpendicular to the plane of the film-based lightguide 107.

Figure 36:
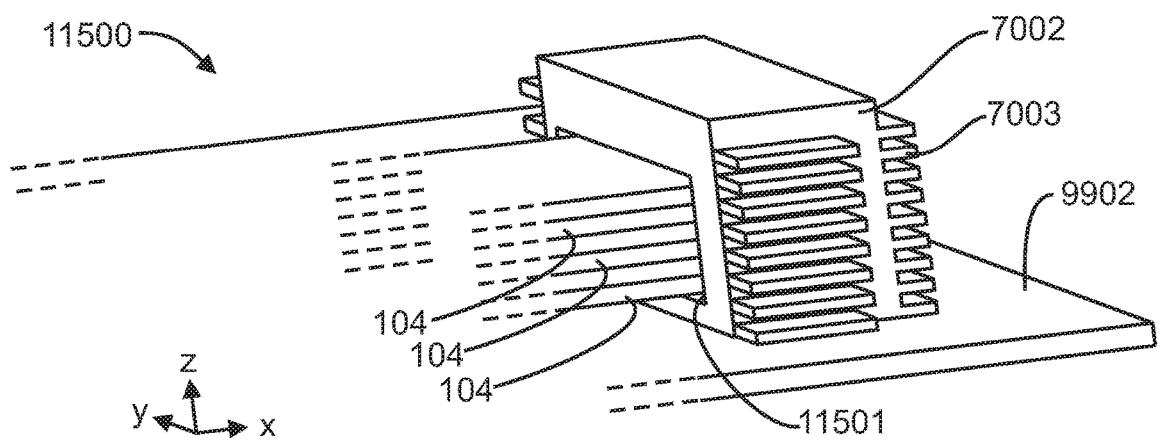
FIG. 36 is a perspective view of a region of one embodiment of a light emitting device comprising a stacked array of coupling lightguides disposed within an alignment cavity of a thermal transfer element.

FIG. 36 is a perspective view of a region of one embodiment of a light emitting device 11500 comprising a stacked array of coupling lightguides 104 disposed within an alignment cavity 11501 of a thermal transfer element 7002 comprising extended fins 7003 that is physically coupled to a light source base 9902. The heat from a light source disposed within the thermal transfer element 7002 is transferred away from the light source by the thermal transfer element 7002. The light source is disposed to couple light into the stack of coupling lightguides 104. The alignment cavity 11501 can register the stack of coupling lightguides 104 in the y and z directions and the light source can provide registration in the +x direction (the coupling lightguides are prevented from translating past the light source in the +x direction). Friction or other mechanical or adhesive means can facilitate registration and maintaining the position of the stacks relative to the light source 102 in the −x direction (prevent the stack from pulling out of the cavity). In another embodiment, an internal ridge or end of the cavity 11501 stops the lateral movement of the coupling lightguides 104 in the +x direction and provides a predetermined minimum distance between the light source 102 and the stack of coupling lightguides 104 (which can reduce the maximum operating temperature of the ends of the coupling lightguides 104 due to heat from the light source).

Figure 37:
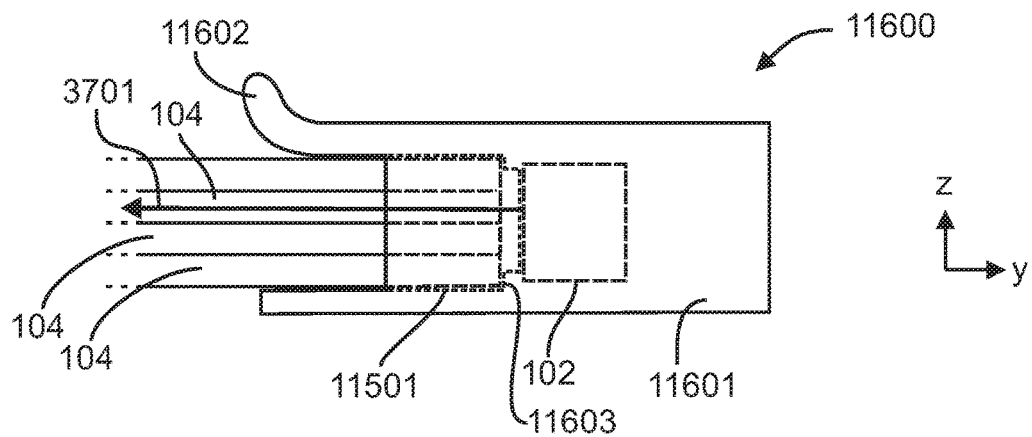
FIG. 37 is a side view of a region of one embodiment of a light emitting device comprising a stacked array of coupling lightguides disposed within an alignment guide with an extended alignment arm and an alignment cavity.

FIG. 37 is a side view of a region of one embodiment of a light emitting device 11600 comprising a stacked array of coupling lightguides 104 disposed within an alignment cavity 11501 of an alignment guide 11601 comprising an extended alignment arm 11602. The stack of coupling lightguides 104 can be inserted into the alignment cavity that registers the light input surface of the coupling lightguides 104 in the x and z directions. The inner end 11603 of the alignment cavity 11501 can provide a stop for the coupling lightguides 104 that sets a minimum separation distance for the stack of coupling lightguides 104 and the light source 102. Light 3701 from the light source 102 is directed into the coupling lightguide 104.

Figure 38:
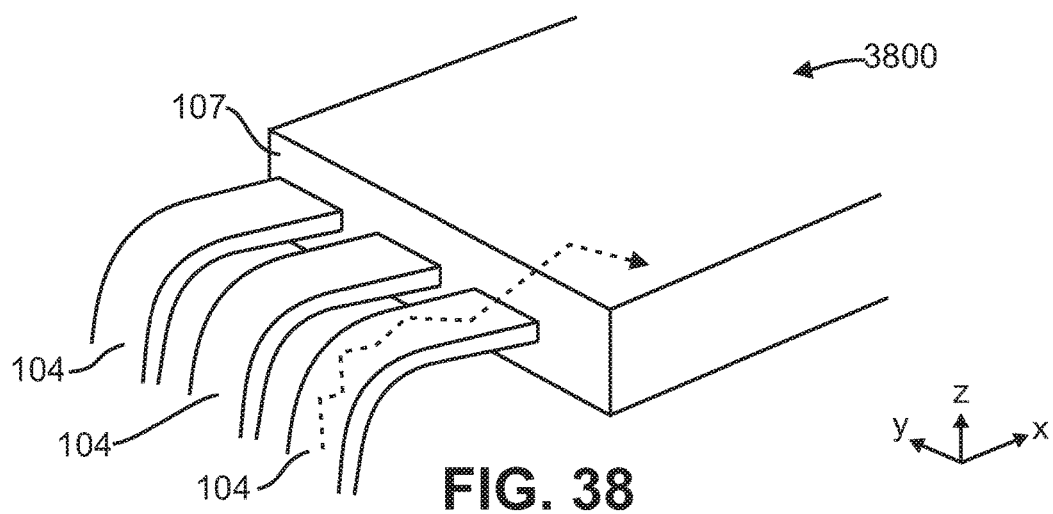
FIG. 38 is a perspective view of one embodiment of a light emitting device wherein the coupling lightguides are optically coupled to the edge of a lightguide.

FIG. 38 is a perspective view of one embodiment of a light emitting device 3800 comprising coupling lightguides 104 that are optically coupled to the edge of a lightguide 107. In one embodiment, the coupling lightguides optically coupled to the edge of the lightguide have a thickness less than one selected from the group: 90%, 80%, 70%, 60%, 50%, 40%, 30%, 20%, and 10% of the thickness of the lightguide.

Figure 39:
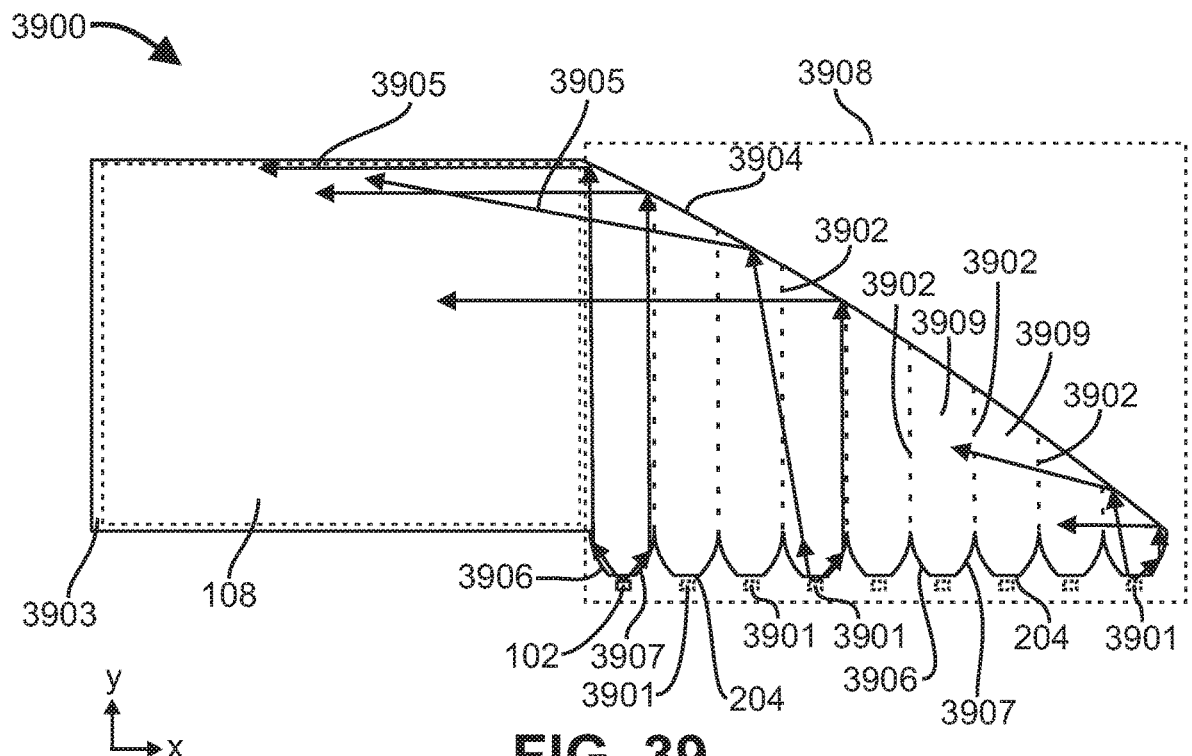
FIG. 39 is a top view of one embodiment of a light emitting device with an unfolded lightguide comprising fold regions.

FIG. 39 illustrates one embodiment of an un-folded top view of a light emitting device 3900 comprising a light input coupler 3908 comprising a lightguide 3903 and a single coupling lightguide comprising fold regions 3909 defined by fold lines 3902, a reflective edge 3904 and a light input edge 204 disposed between a first reflective surface edge 3906 and a second reflective surface edge 3907 within a single film. The film of the light input coupler 3908 is folded along fold lines 3902 such that the fold regions 3909 substantially overlay each other and the light source 102 couples light into each light input edge 204. The optical system is shown "un-folded" in FIG. 39 and the light sources 3901 correspond to the location of the light source 102 relative to the fold regions 3909 when the film is folded. As shown in FIG. 39, light 3905 from the light source 102 (and the light sources 3901 when folded) totally internally reflects from the reflective edge 3904 which is angled toward the light emitting region 108 of the lightguide 3903. The first reflective surface 3906 and the second reflective surface 3907 are formed by shaped edges (angled or curved for example) in the film and serve to redirect a portion of light from the light sources (102 and 3901) into the lightguide at angles which totally internally reflect from the angled edge 3904.

Figure 40:
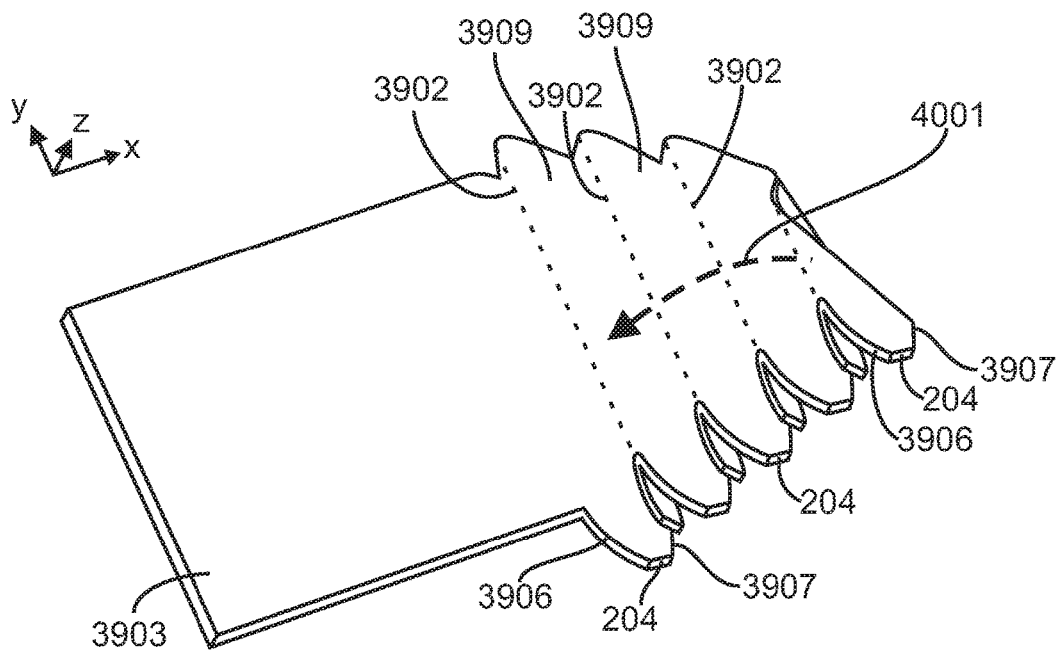
FIG. 40 is a perspective view of the light emitting device of FIG. 39 with the lightguide being folded.

FIG. 40 is a perspective view of the lightguide 3903 and the light input coupler 3908 comprising a light source 102 and coupling lightguide of FIG. 39 as the film is being folded along the fold lines 3902 in the direction 4001 represented in the figure. The fold regions 3909 substantially layer upon each other such that the light input edges 204 stack and align to receive light from the light source 102.

Figure 41:
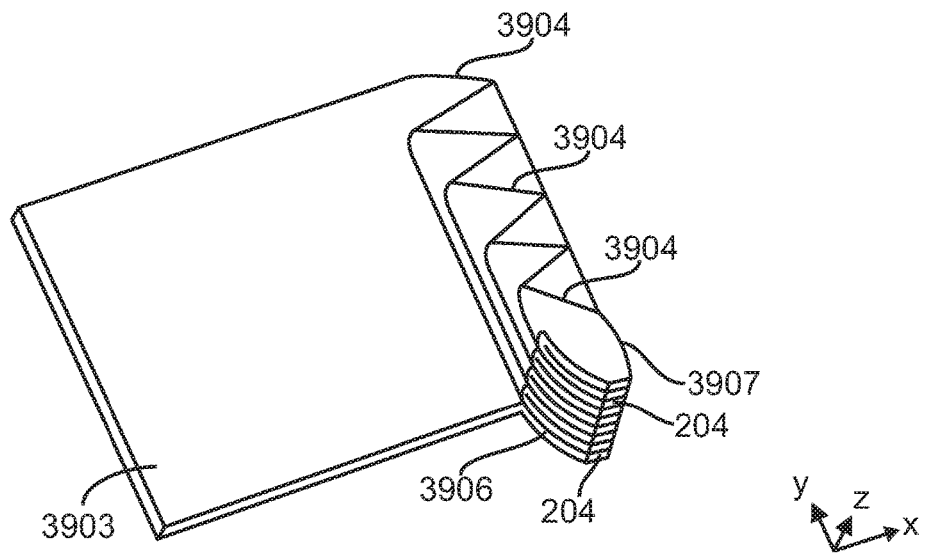
FIG. 41 is a perspective view of the light emitting device of FIG. 39 folded with the lightguide comprising overlapping folded regions.

FIG. 41 is a perspective view of the lightguide 3903 and the light input coupler 3908 of FIG. 39 folded and comprising a coupling lightguide formed from overlapping fold regions 3909 of a film lightguide 3903. The fold regions 3909 substantially layer upon each other such that the light input edges 204 stack and align to receive light from the light source 102.

Figure 42:
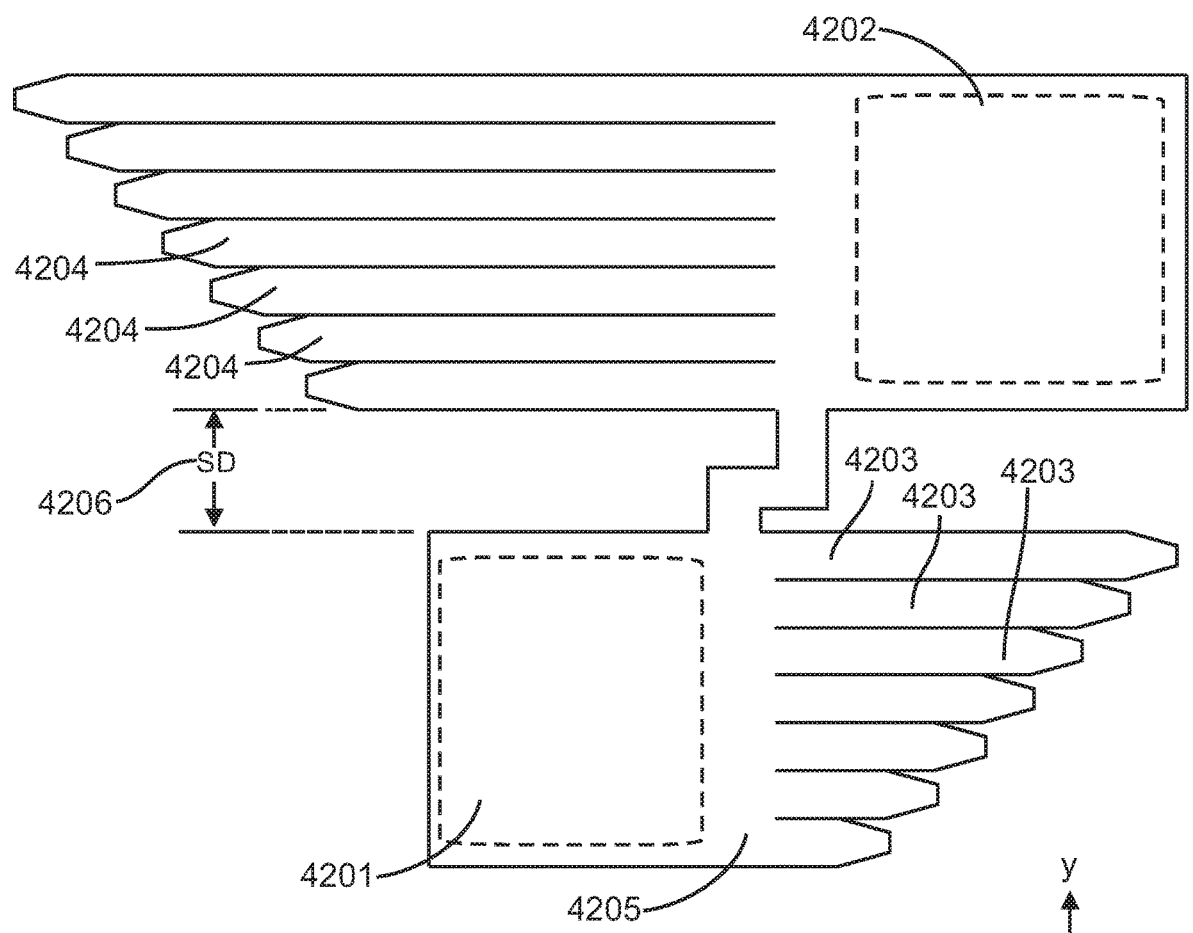
FIG. 42 is an elevated view of one embodiment of a film-based lightguide comprising a first light emitting region disposed to receive light from a first set of coupling lightguides and a second light emitting region disposed to receive light from a second set of coupling lightguides.

FIG. 42 is an elevated view of an embodiment of a film-based lightguide 4205 comprising a first light emitting region 4201 disposed to receive light from a first set of coupling lightguides 4203 and a second light emitting region 4202 disposed to receive light from a second set of coupling lightguides 4204. The light emitting regions are separated from each other in the y direction by a distance "SD" 4206. The free ends of the sets of coupling lightguides 4203 and 4204 can be folded toward the −y direction such that both sets substantially overlap as shown in FIG. 43.

Figure 43:
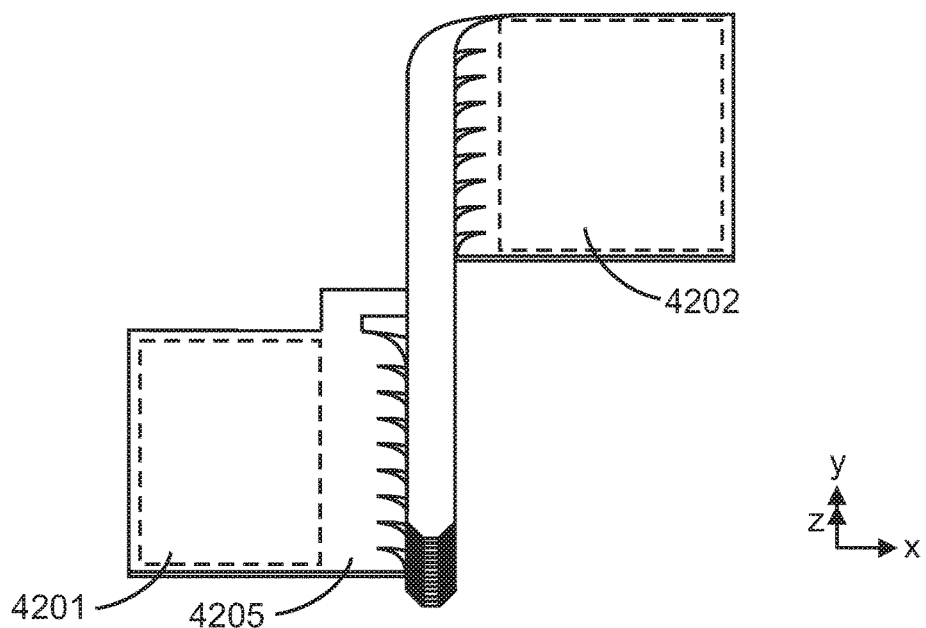
FIG. 43 is an elevated view of the film-based lightguide of FIG. 42 with the coupling lightguides folded.

FIG. 43 is an elevated view of the film-based lightguide 4205 of FIG. 42 wherein the coupling lightguides 4203 are folded such that they substantially overlap and form a light input surface 103. In this embodiment, a single light source (not shown) may illuminate two separate light emitting regions within the same film. In another embodiment, two separated film-based lightguides have separate light input couplers which are folded, and the light input edges are brought together to form a stack of coupling lightguides disposed to receive light from a light source. This type of configuration may be useful, for example, where the first light emitting region backlights an LCD and the second light emitting region illuminates a keypad on a mobile phone device.

Figure 44:
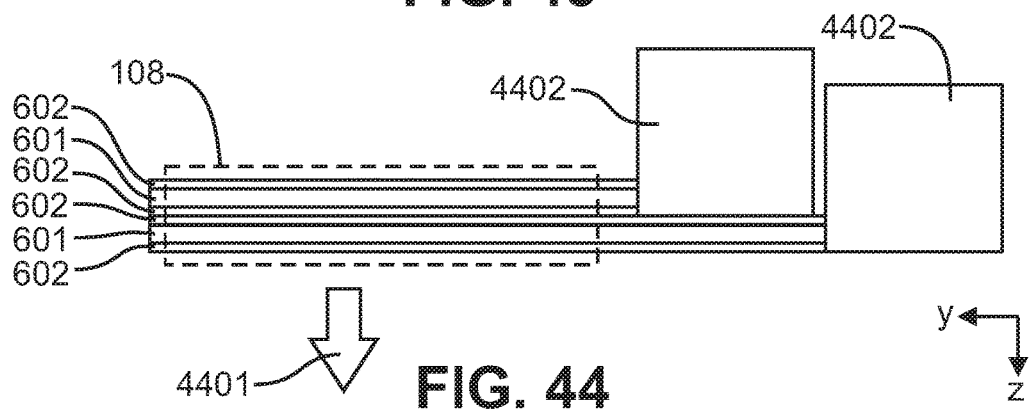
FIG. 44 is a cross-sectional side view of one embodiment of a light emitting device comprising two lightguides stacked in the z direction.

FIG. 44 is a cross-sectional side view of one embodiment of a light emitting device 4400 with optical redundancy comprising two lightguides 107 stacked in the z direction. Light sources and coupling lightguides within the holders 4402 arranged substantially adjacent in the y direction direct light into core regions 601 such that light 4401 is output from the light emitting region 108 from each lightguide 107.

Figure 45:
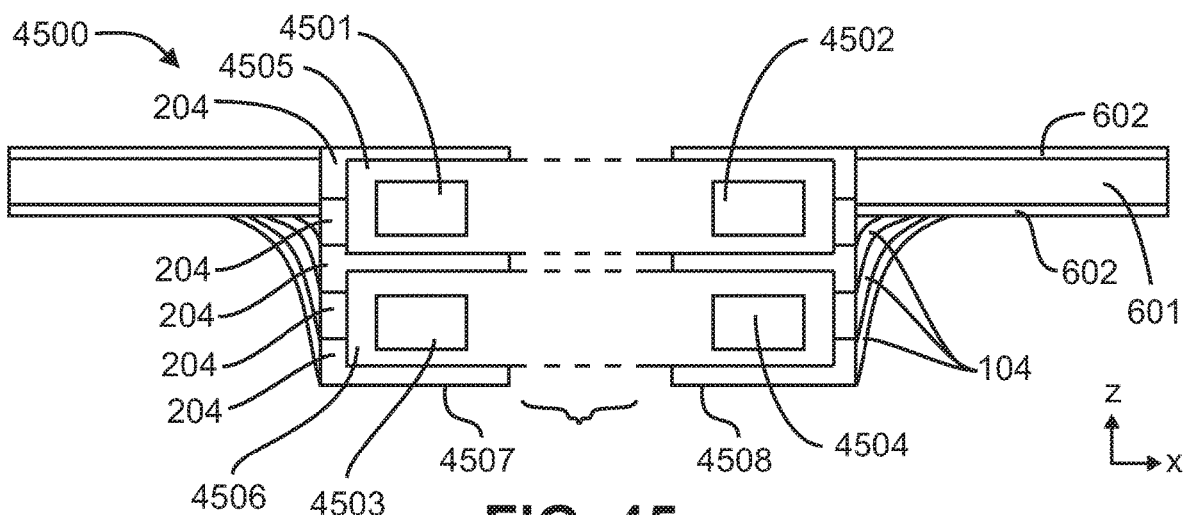
FIG. 45 is a cross-sectional side view of one embodiment of a light emitting device with a first light source and a second light source thermally coupled to a first thermal transfer element.

FIG. 45 is a cross-sectional side view of one embodiment of a light emitting device 4500 with a first light source 4501 and a second light source 4502 thermally coupled to a first thermal transfer element 4505 (such as a metal core printed circuit board (PCB)) and thermally insulated (physically separated by an air gap in the embodiment shown) from a second thermal transfer element 4506 that is thermally coupled to a third light source 4503 and a fourth light source 4504. The first light source 4501 and the third light source 4503 are disposed to couple light into a first light input coupler 4507 and the second light source 4502 and the fourth light source 4504 are disposed to couple light into a second light input coupler 4508. In this embodiment, the heat dissipated from the first light source 4501 is dissipated along the first thermal transfer element 4505 in the x direction toward the second light source 4502 such that heat from the first light source 4501 does not substantially increase the temperature at the third light source 4503 by conduction.

Figure 46:
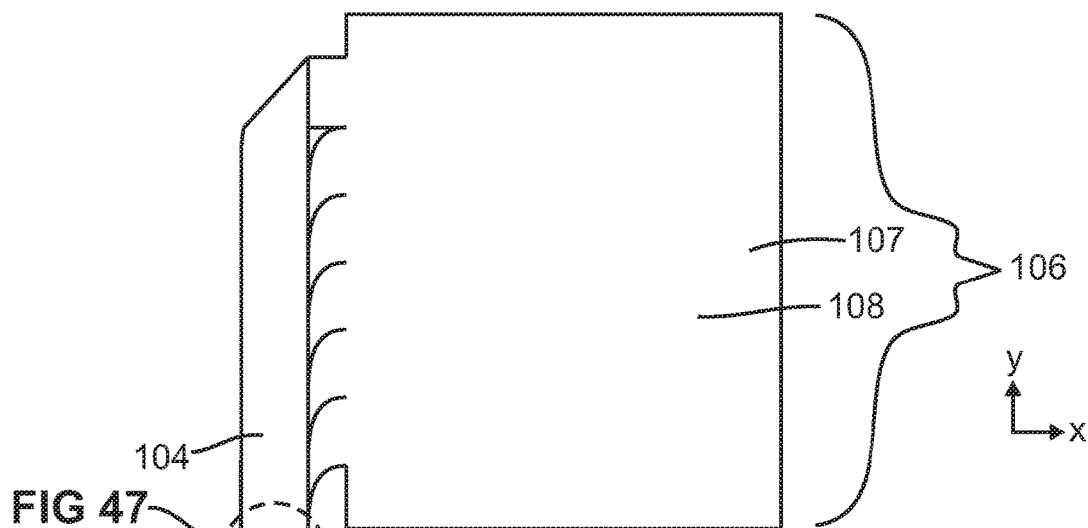
FIG. 46 is a top view of one embodiment of a light emitting device comprising coupling lightguides with a plurality of first reflective surface edges and a plurality of second reflective surface edges within each coupling lightguide.

FIG. 46 is a top view of one embodiment of a light emitting device 4600 comprising a plurality of coupling lightguides 104 with a plurality of first reflective surface edges 3906 and a plurality of second reflective surface edges 3907 within each coupling lightguide 104. In the embodiment shown in FIG. 46, three light sources 102 are disposed to couple light into respective light input edges 204 at least partially defined by respective first reflective surface edges 3906 and second reflective surface edges 3907.

Figure 47:
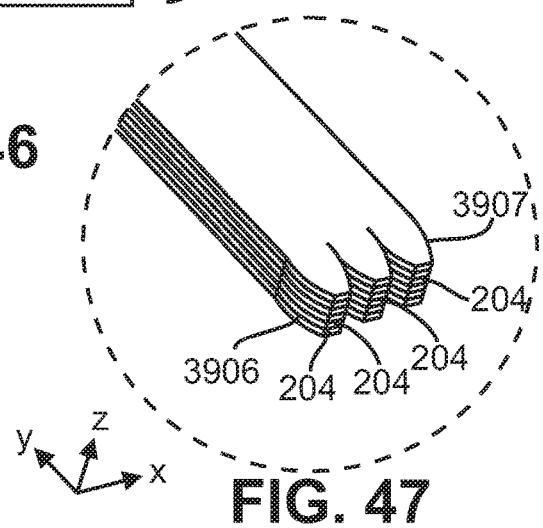
FIG. 47 is an enlarged perspective view of the input end of the coupling lightguides of FIG. 46.

FIG. 47 is an enlarged perspective view of the coupling lightguides 104 of FIG. 46 with the light input edges 204 disposed between the first reflective surface edges 3906 and the second reflective surface edges 3907. The light sources 102 are omitted in FIG. 47 for clarity.

Figure 48:
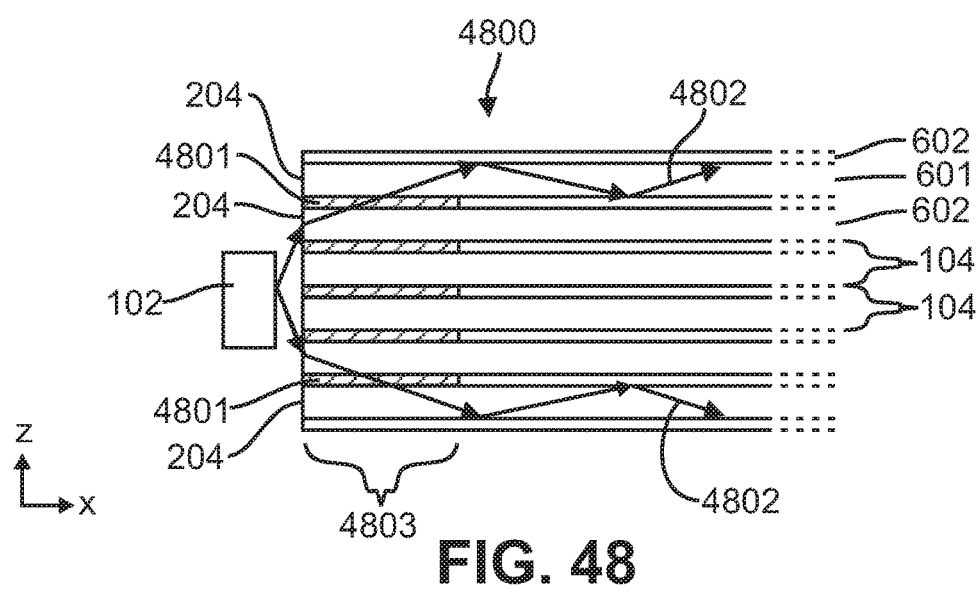
FIG. 48 is a cross-sectional side view of the coupling lightguides and light source of one embodiment of a light emitting device comprising index matching regions disposed between the core regions of the coupling lightguides.

FIG. 48 is a cross-sectional side view of the coupling lightguides 104 and the light source 102 of one embodiment of a light emitting device 4800 comprising index matching regions 4801 disposed between the core regions 601 of the coupling lightguides 104 in the index-matched region 4803 of the coupling lightguides 104 disposed proximate the light source 102. The light source 102 is positioned adjacent the coupling lightguides 104 and the high angle light 4802 from the light source 102 propagates through the coupling lightguides 104 and the index matching region 4801 and is coupled into the coupling lightguides 104 at a location distant from the light input edge 204 of the coupling lightguides 104. In the embodiment shown in FIG. 48, the light from the light source 102 is coupled into more coupling lightguides because the light, for example at 60 degrees from the optical axis 4830 of the light source 102 propagates into a core region 601 near the light source, propagates through the index matching region 4801, and totally internally reflects in a core region 601 further away from the light source 102. In this embodiment, a portion of the light is coupled into the outer coupling lightguides 104 that would not normally receive the light if there were cladding present at or near the light input edge 204.

Figure 49:
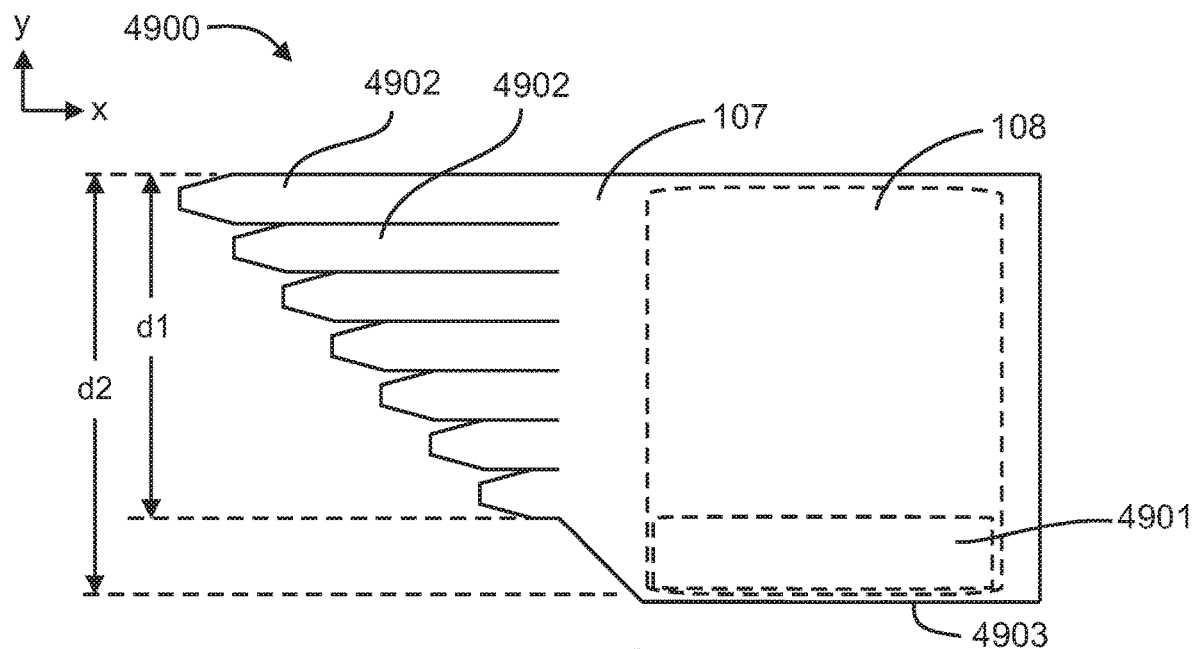
FIG. 49 is a top view of one embodiment of a film-based lightguide comprising an array of tapered coupling lightguides.

FIG. 49 is a top view of one embodiment of a film-based lightguide 4900 comprising an array of tapered coupling lightguides 4902 formed by cutting regions in a lightguide 107. The array of tapered coupling lightguides 4902 extend in a first direction (y direction as shown) a dimension, d1, which is less than a parallel dimension, d2, of the light emitting region 108 of the lightguide 107. A compensation region 4901 is defined within the film-based lightguide 4900 which does not include tapered coupling lightguides 4902 (when the tapered coupling lightguides 4902 are not folded or bent). In this embodiment, the compensation region provides a volume having sufficient length in the y direction to place a light source (not shown) such that the light source does not extend past the lower edge 4903 of the lightguide 107. The compensation region 4901 of the light emitting region 108 may have a higher density of light extraction features (not shown) to compensate for the lower input flux directly received from the tapered coupling lightguides 4902 into the light emitting region 108. In one embodiment, a substantially uniform luminance or light flux output per area in the light emitting region 108 is achieved despite the lower level of light flux received by the light extraction features within the compensation region 4901 of the light emitting region by, for example, increasing the light extraction efficiency or area ratio of the light extraction features to the area without light extraction features within one or more regions of the compensation region, increasing the width of the light mixing region between the coupling lightguides and the light emitting region, decreasing the light extraction efficiency or the average area ratio of the light extraction features to the areas without light extraction features in one or more regions of the light emitting region outside the compensation region, and any suitable combination thereof.

Figure 50:
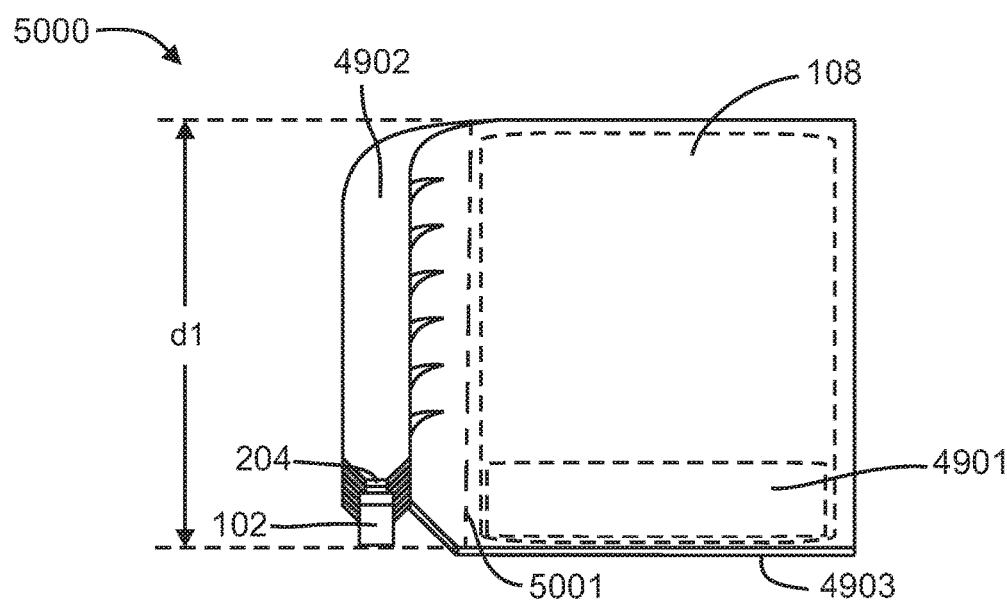
FIG. 50 is a perspective top view of a light emitting device of one embodiment comprising the film-based lightguide of FIG. 49 and a light source.

FIG. 50 is a perspective top view of one embodiment of a light emitting device 5000 comprising the film-based lightguide 4900 shown in FIG. 49 and a light source 102. In this embodiment, tapered coupling lightguides 4902 are folded in the −y direction toward the light source 102 such that the light input edges 204 of the coupling lightguides 4902 are disposed to receive light from the light source 102. Light from the light source 102 propagating through the tapered coupling lightguides 4902 exits the tapered coupling lightguides 4902 and enters into the light emitting region 108 generally propagating in the +x direction while expanding in the +y and −y directions. In the embodiment shown in FIG. 50, the light source 102 is disposed within the region that did not comprise a tapered coupling lightguide 4902 and the light source 102 does not extend in the y direction past a lower edge 4903 of the light emitting device 5000. By not extending past the lower edge 4903, the light emitting device 5000 has a shorter overall width in the y direction. Furthermore, the light emitting device 5000 can maintain the shorter dimension, d1, in the y direction (shown in FIG. 49) when the tapered coupling lightguides 4902 and the light source 102 are folded under (−z direction and then +x direction) the light emitting region 108 along the fold (or bend) line 5001.

Figure 51:
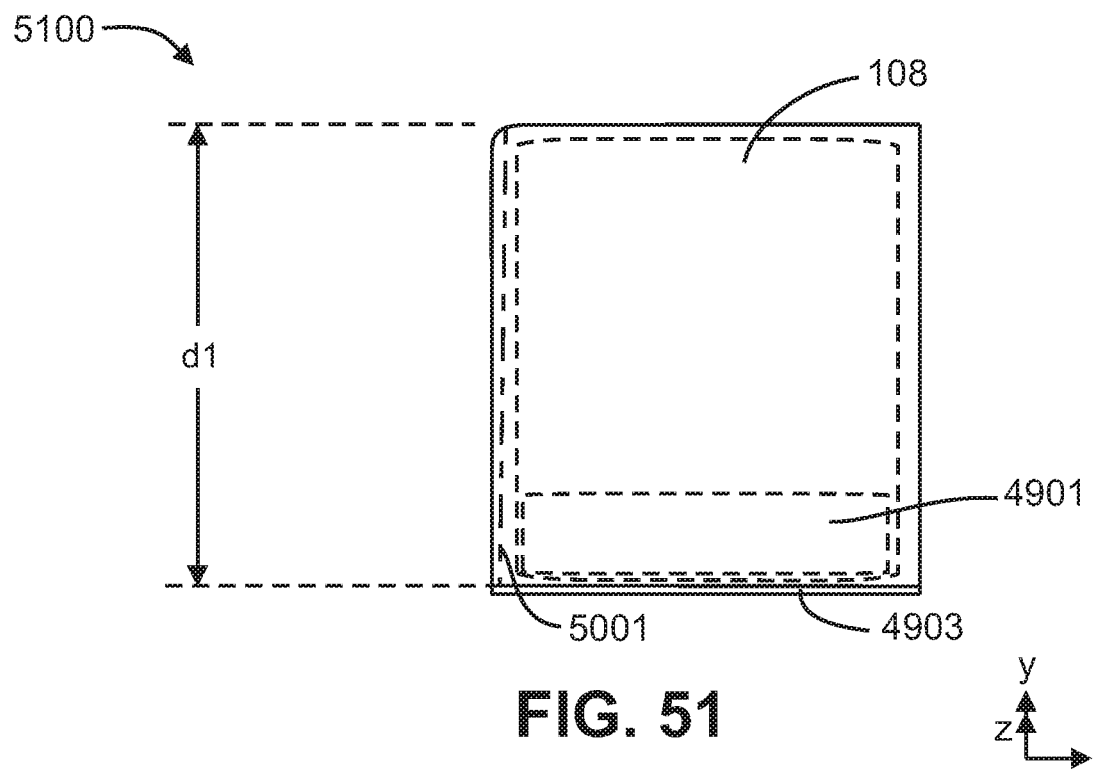
FIG. 51 is a perspective top view of a light emitting device comprising the light emitting device of FIG. 50 wherein the tapered coupling lightguides and light source are folded behind the light emitting region.

FIG. 51 is a perspective view of a light emitting device 5100 comprising the light emitting device 5000 shown in FIG. 50 with the tapered coupling lightguides 4902 and light source 102 shown in FIG. 50 folded (−z direction and then +x direction) behind the light emitting region 108 along the fold (or bend) line 5001. As can be seen from FIG. 51, a distance between the lower edge of the light emitting region 108 and the corresponding edge of the light emitting device 4903 in the −y direction is relatively small. When this distance is small, the light emitting region 108 can appear borderless, and for example, a display comprising a backlight where the light emitting region 108 extends very close to the edge of the backlight can appear frameless or borderless.

Figure 52:
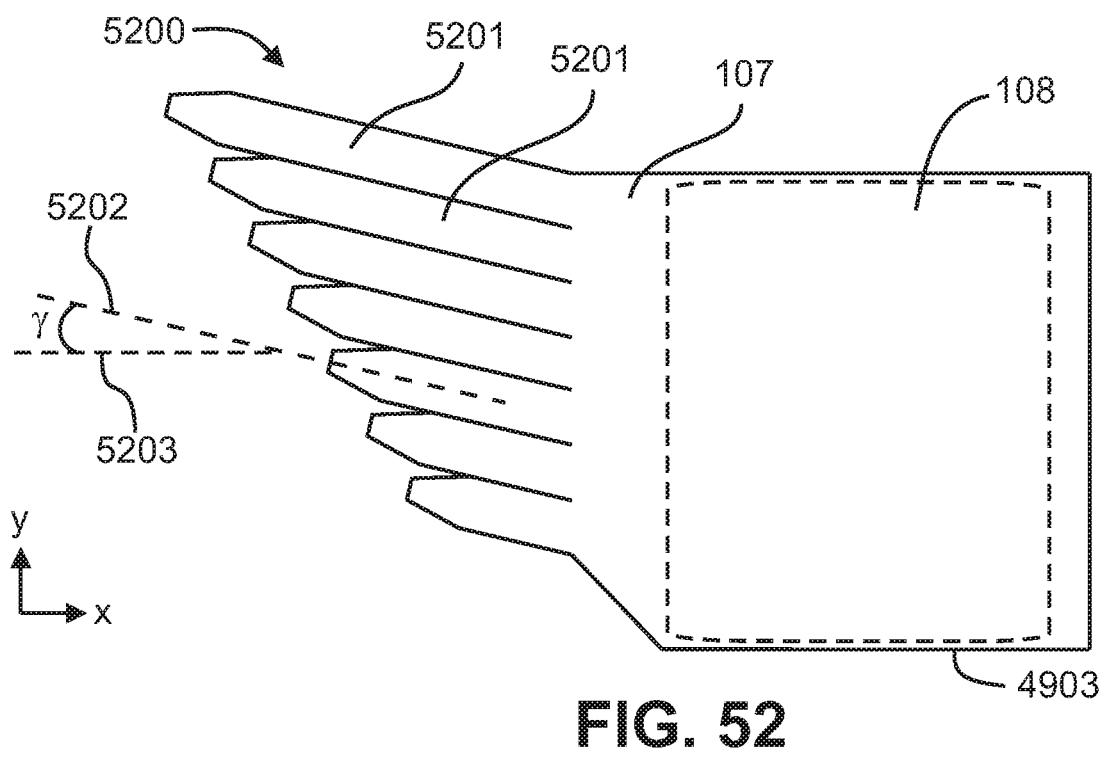
FIG. 52 is a top view of one embodiment of a film-based lightguide comprising an array of angled, tapered coupling lightguides.

FIG. 52 is a top view of one embodiment of a film-based lightguide 5200 comprising an array of angled, tapered coupling lightguides 5201 formed by cutting regions in a lightguide 107 at a first coupling lightguide orientation angle, y, defined as the angle between the coupling lightguide axis 5202 and the direction 5203 parallel to the major component of the direction of the coupling lightguides 5201 to the light emitting region 108 of the lightguide 107. By cutting the tapered coupling lightguides 5201 within the lightguide 107 at a first coupling lightguide orientation angle, the angled, tapered lightguides 5201, when folded, provide volume with a dimension of sufficient length to place a light source such that the light source does not extend past the lower edge 4903 of the film-based lightguide 5200.

Figure 53:
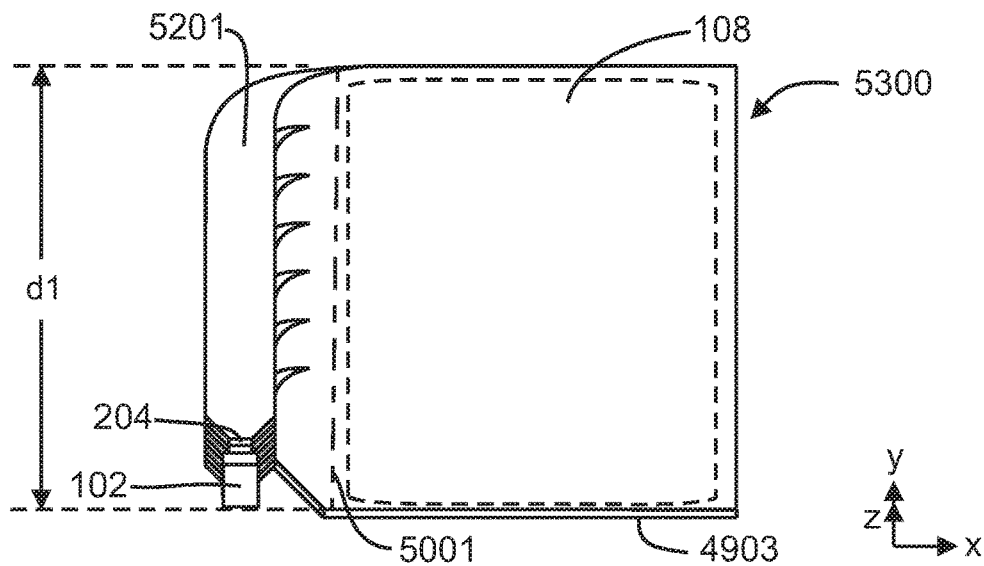
FIG. 53 is a perspective top view of a light emitting device of one embodiment comprising the film-based lightguide of FIG. 52 with the coupling lightguides folded and the light source not extending past the lateral sides of the film-based lightguide.

FIG. 53 is a perspective view of one embodiment of a light emitting device 5300 comprising the film-based lightguide 5200 shown in FIG. 52 and a light source 102. As shown in FIG. 53, the angled, tapered coupling lightguides 5201 are folded in the −y direction toward the light source 102 such that the light input surfaces 204 of the stacked coupling lightguides 5201 are disposed to receive light from the light source 102.

Figure 54:
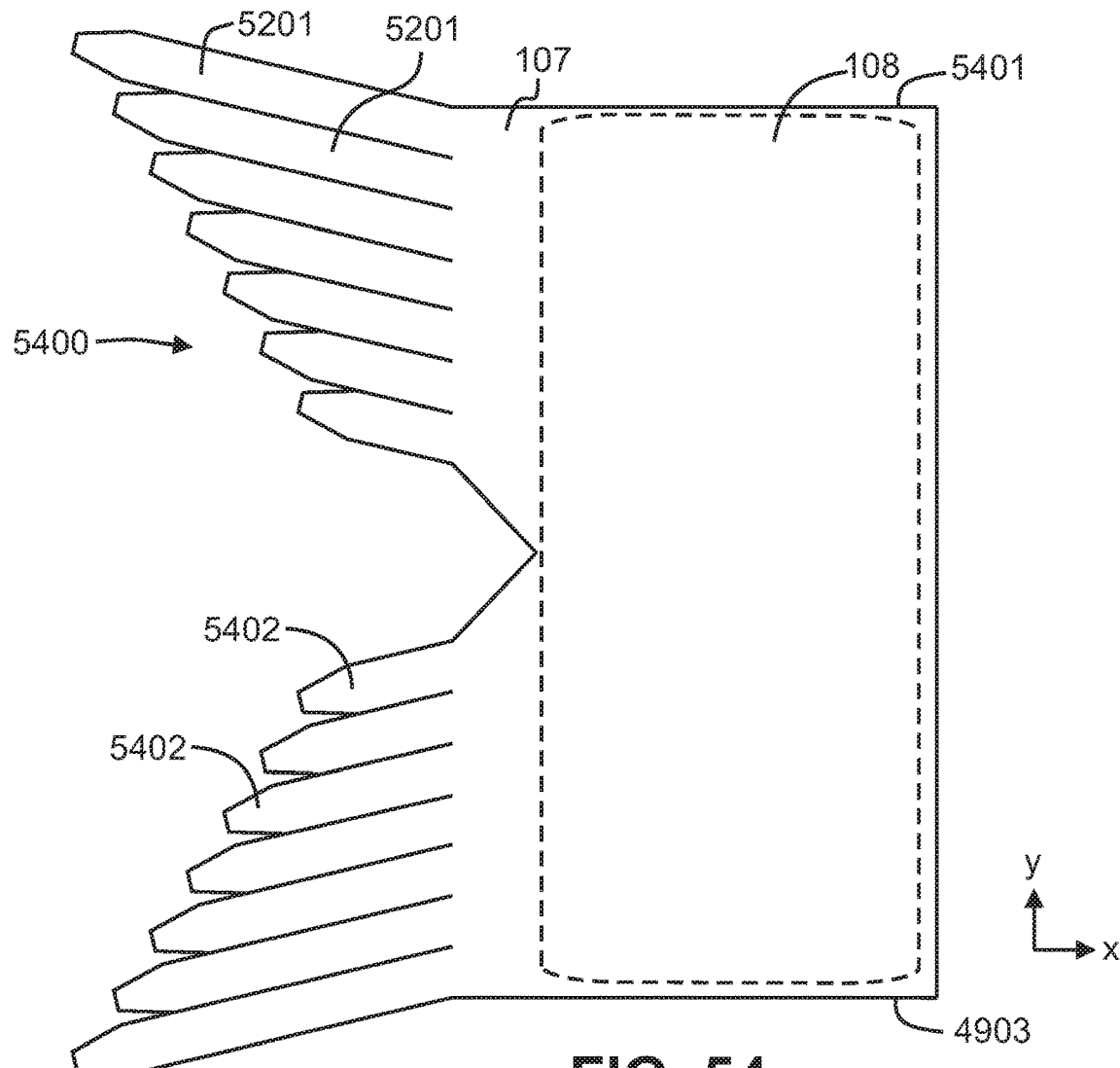
FIG. 54 is a top view of one embodiment of a film-based lightguide comprising a first and second array of angled, tapered coupling lightguides.

FIG. 54 is a top view of one embodiment of a film-based lightguide 5400 comprising a first array of angled, tapered coupling lightguides 5201 formed by cutting regions in the lightguide 107 at a first coupling lightguide orientation angle 5406 and a second array of angled, tapered coupling lightguides 5402 formed by cutting regions in the lightguide 107 at a second coupling lightguide orientation angle 5407. By cutting the first array of coupling lightguides 5201 and the second array of coupling lightguides 5402 within the lightguide 107 at the first coupling lightguide orientation angle 5406 and the second coupling lightguide orientation angle 5407, respectively, the angled, tapered lightguides 5201 and 5402, when folded, provide volume with a dimension of sufficient length to place one or more light sources 102 such that the one or more light sources 102 do not extend past the lower edge 4903 of the lightguide 107.

Figure 55:
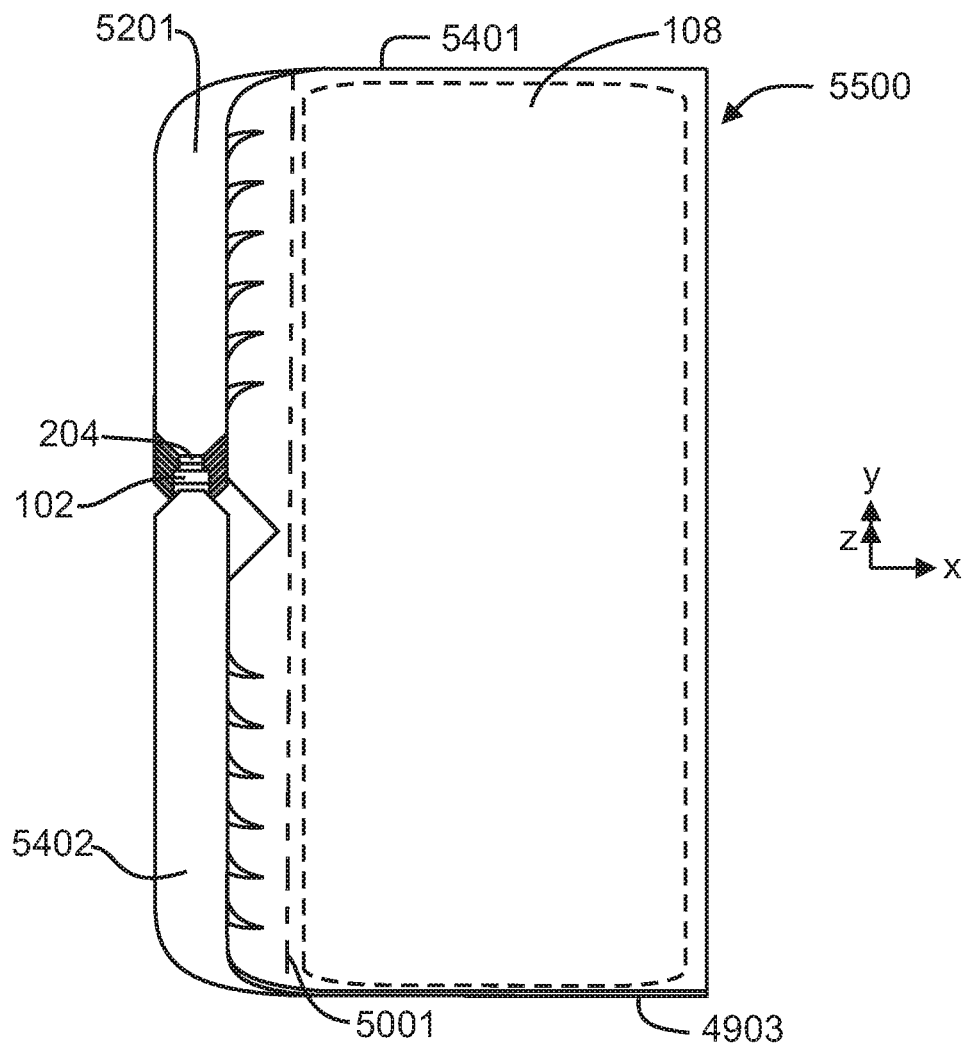
FIG. 55 is a perspective top view of a light emitting device of one embodiment comprising the film-based lightguide of FIG. 54.

FIG. 55 is a perspective top view of one embodiment of a light emitting device 5500 comprising the film-based lightguide 5400 shown in FIG. 54 and a light source 102 emitting light in the +y direction and −y direction (such as two LEDs disposed back to back). The first array of coupling lightguides 5201 are folded in the −y direction toward the light source 102 such that each light input surface 204 is disposed to receive light from the light source 102 and the second array of coupling lightguides 5402 are folded in the +y direction toward the light source 102 such that each light input surface 204 is disposed to receive light from the light source 102. The first and second array of coupling lightguides 5201 and 5402 are angled away from the center of the light emitting region 108 to allow the light source 102 to be disposed in the central region of the lightguide 107 (in the y direction) such that the light source 102 does not extend past the lower edge 4903 or upper edge 5401 of the lightguide 107. The light source 102, the first array of coupling lightguides 5201, and the second array of coupling lightguides 5402 may be folded under the light emitting region 108 along the fold (or bend) axis 5001 such that the light emitting device 5500 is substantially edgeless or has light emitting regions extending very close to the edges of the light emitting device in the x-y plane.

Figure 56:
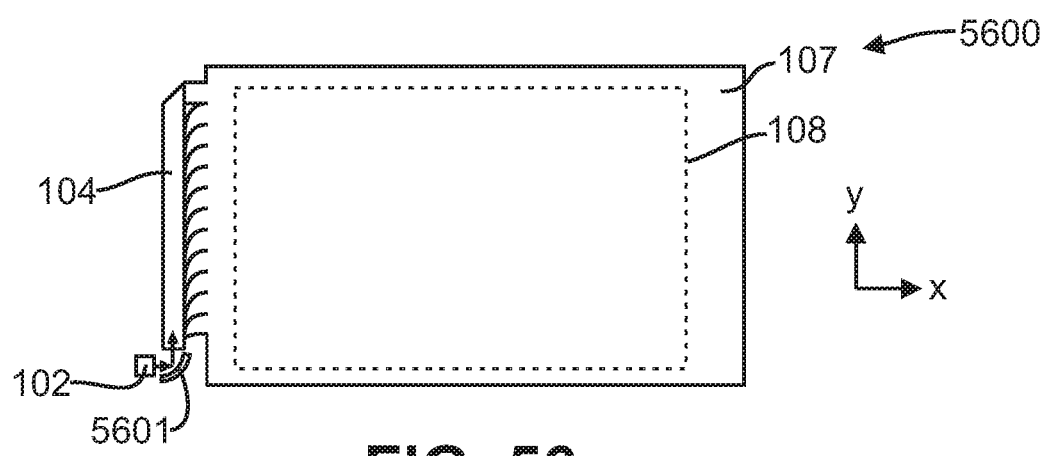
FIG. 56 is a top view of one embodiment of a light emitting device comprising a lightguide, coupling lightguides and a curved mirror.

FIG. 56 is a top view of one embodiment of a light emitting device 5600 comprising the lightguide 107, the coupling lightguides 104 and a mirror 5601 functioning as a light redirecting optical element including a curved or arcuate reflective surface or region disposed to redirect light from the light source 102 into the coupling lightguides 104. Within the coupling lightguides 104, the light propagates through the coupling lightguides 104 into the lightguide 107 and exits the lightguide 107 in the light emitting region 108.

Figure 57:
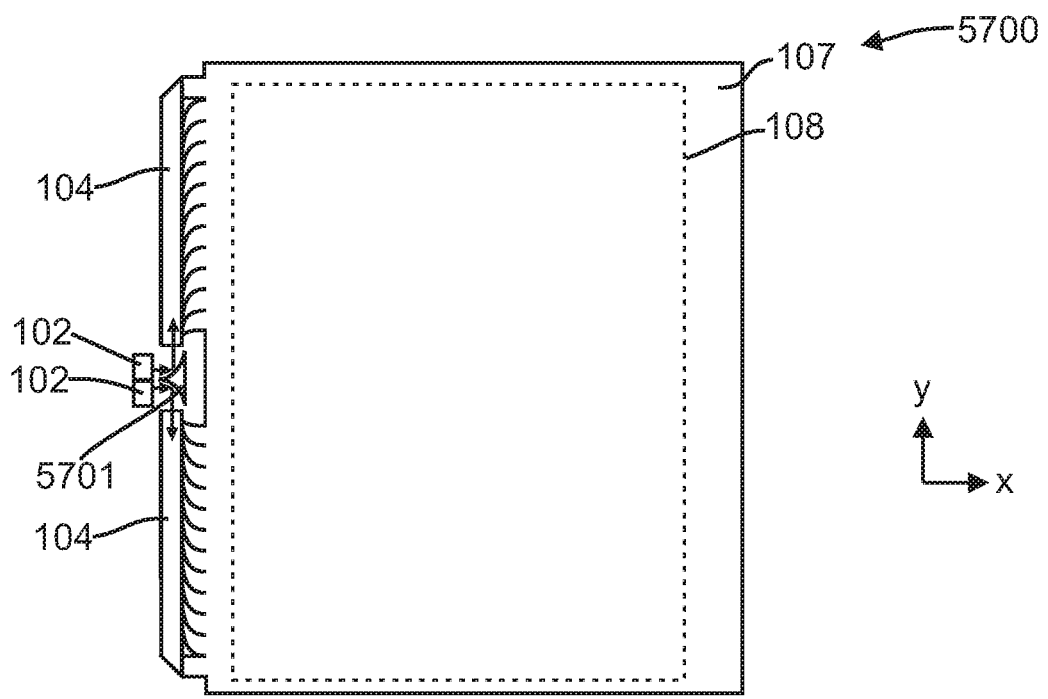
FIG. 57 is a top view of one embodiment of a light emitting device comprising a lightguide, coupling lightguides, and a curved mirror with two curved regions.

FIG. 57 is a top view of one embodiment of a light emitting device 5700 comprising the lightguide 107, the coupling lightguides 104 and a mirror 5701. In this embodiment, mirror 5701 includes two or more curved or arcuate surfaces or regions disposed to redirect light from one or more light sources, such as the two light sources 102 shown in FIG. 57, into the coupling lightguides 104 where the mirror is functioning as a bidirectional light turning optical element. Within the coupling lightguides 104, the light propagates through the coupling lightguides 104 into the lightguide 107 and exits the lightguide 107 in the light emitting region 108. As shown in FIG. 57, the light sources 102 are disposed to emit light with a corresponding light source optical axis 5702 substantially oriented parallel to the +x direction. The curved mirror redirects the light into axis 5703 oriented in the +y and 5704 oriented in the −y direction. In another embodiment, the optical axes of the light sources 102 are oriented substantially in the −z direction (into the page) and the curved mirror redirects the light into axes 5703 and 5704 oriented in the +y and −y directions, respectively.

Figure 58:
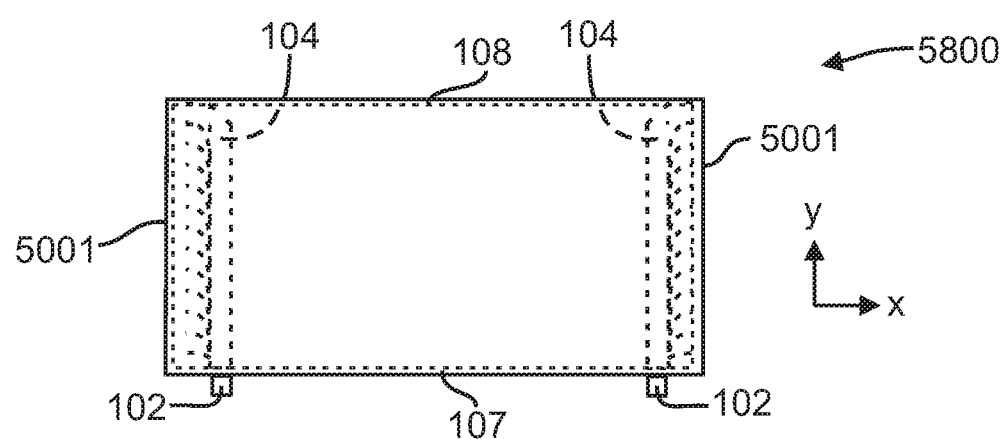
FIG. 58 is a top view of one embodiment of a light emitting device comprising a lightguide and two light input couplers comprising coupling lightguides that have been folded behind the light emitting region of the light emitting device.

FIG. 58 is a top view of one embodiment of a light emitting device 5800 comprising the lightguide 107 and coupling lightguides 104 on opposite sides of the lightguide 107 that have been folded behind the light emitting region 108 of the light emitting device 5800 along the lateral sides 5001 (shown by phantom lines in FIG. 58) such that the frames or border regions (5830, 5831) between the light emitting region 108 and the corresponding edge (5001, 5832) of the light emitting device 5800 in the +x direction, −x direction, and +y direction are minimized and the light emitting device 5800 can be substantially edgeless (or have a small frame) along any desirable number of sides or edges, such as three sides or edges as shown in FIG. 58.

Figure 59:
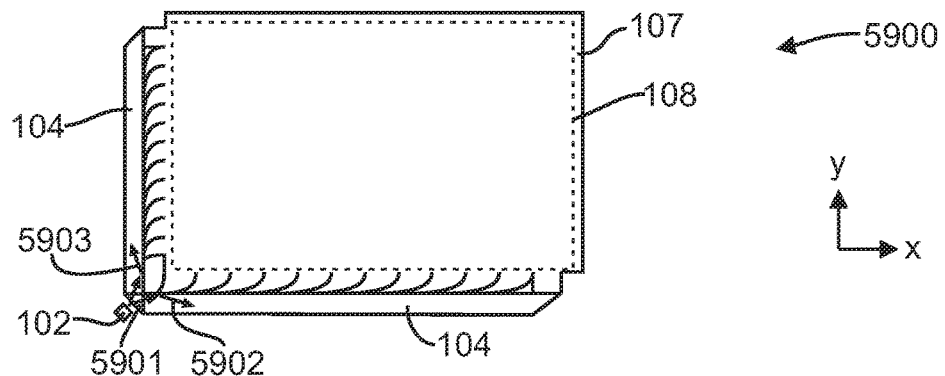
FIG. 59 is a top view of one embodiment of a light emitting device comprising a lightguide with coupling lightguides on two orthogonal sides.

FIG. 59 is a top view of one embodiment of a light emitting device 5900 comprising the lightguide 107, with the coupling lightguides 104 on two orthogonal sides. In this embodiment, a light coupling optical element 5901 is disposed to increase the light flux that couples from the light source 102 into the two sets of coupling lightguides 104. A first portion of the light 5902 from the light source 102 will refract upon entering the light coupling optical element 5901 and be directed into a waveguide condition within the coupling lightguides 104 oriented substantially parallel to the x axis and a second portion of the light 5903 will refract upon entering the light coupling optical element 5901 and be directed into a waveguide condition within the coupling lightguides 104 oriented substantially parallel to the y axis.

Figure 60:
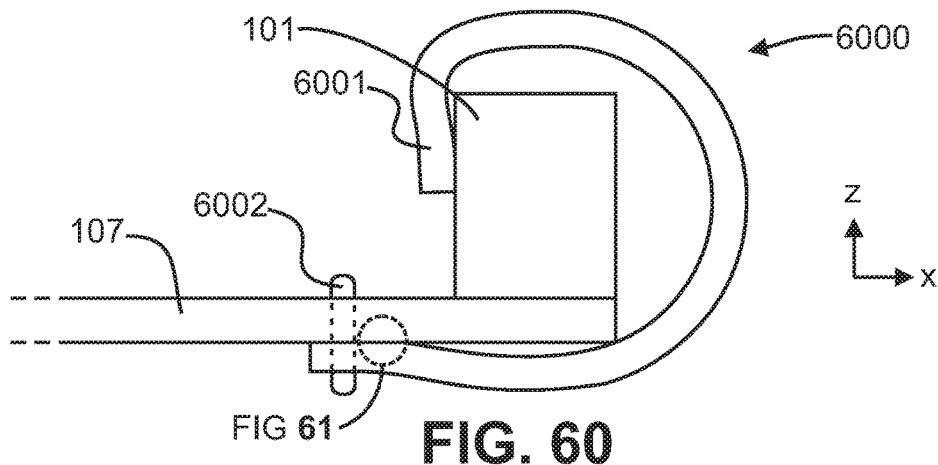
FIG. 60 is a cross-sectional side view of a portion of a light emitting device of one embodiment comprising a lightguide and a light input coupler wherein a low contact area cover is physically coupled to the light input coupler.

FIG. 60 is a cross-sectional side view of a portion of one embodiment of a light emitting device 6000 comprising the lightguide 107 and the light input coupler 101. In this embodiment, a low contact area cover 6001 is operatively coupled, such as physically coupled as shown in FIG. 60, to the light input coupler 101 (or one or more elements within the light input coupler 101) and wraps around the light input coupler 101 and is physically coupled or maintained in a region near the lightguide 107 by a suitable fastening mechanism, such as one or more fibers 6002 that stitches the low contact area cover 6001 in contact or in proximity to the lightguide 107. In the embodiment shown in FIG. 60, the stitches pass through the low contact area cover 6001 and the lightguide 107 and provide a very small surface area in the primary direction (−x direction) of propagation of the light within the light emitting portion of the lightguide 107. A physical coupling mechanism with a small surface within the lightguide reduces the scattering or reflection of light propagating within the lightguide which can reduce optical efficiency or cause stray light. In the embodiment shown in FIG. 60, the fiber (or wire, thread, etc.) 6002 provides a low contact area physical coupling mechanism that has a small percentage of cross sectional area in the y-z plane (orthogonal to the optical axis direction (−x direction) of the light within the lightguide region).

Figure 61:
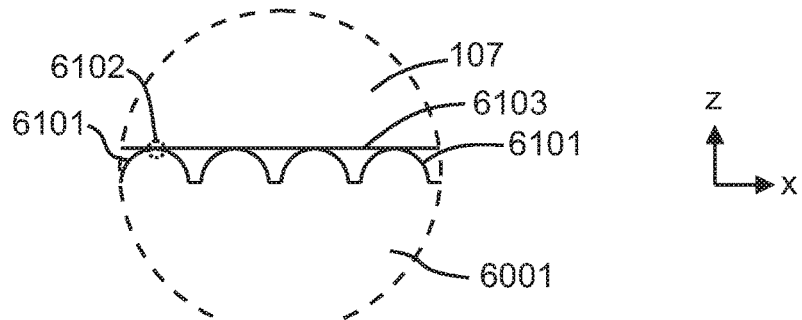
FIG. 61 shows an enlarged portion of FIG. 60 of the region of the lightguide in contact with the low contact area cover.

FIG. 61 shows an enlarged view of a region of the lightguide 107 shown in FIG. 60 in which the lightguide 107 is in contact with the low contact area cover 6001. In this embodiment, the low contact area cover 6001 has convex surface features 6101 that reduce the contact area 6102 in contact with the surface 6103 of the lightguide 107 disposed near the low contact area cover 6101. In other embodiments, the low contact area cover 6001 includes any suitable feature that reduces the contact area 6102.

Figure 62:
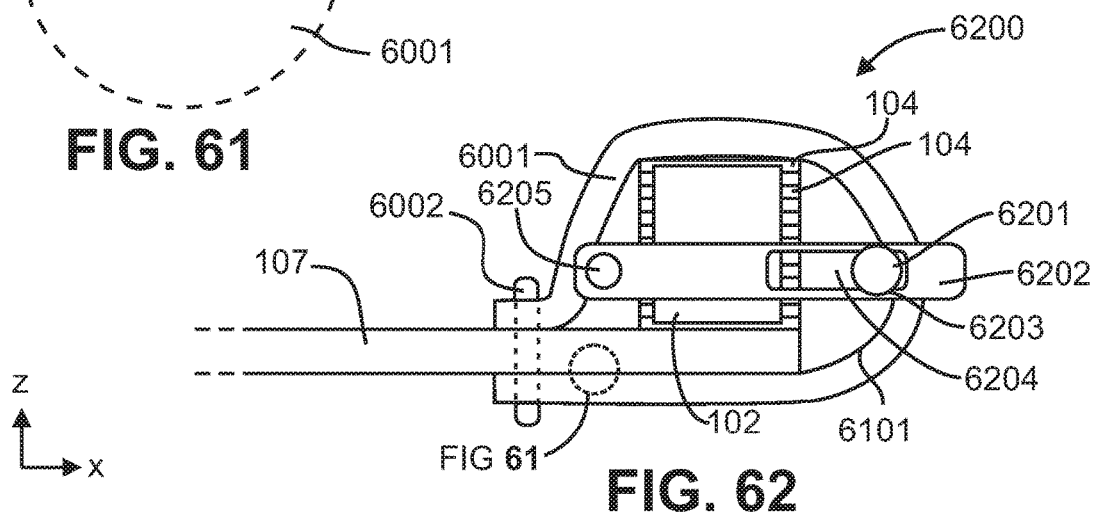
FIG. 62 is a side view of a portion of a light emitting device of one embodiment comprising a lightguide and a light input coupler protected by a low contact area cover.

FIG. 62 is a side view of a portion of one embodiment of a light emitting device 6200 comprising the lightguide 107 and coupling lightguides 104 protected by a low contact area cover 6001. The low contact area cover 6001 is operatively coupled, such as physically coupled as shown in FIG. 62, by a suitable fastening mechanism, such as one or more sewn fibers 6002, to the lightguide 1007 at two or more regions of the low contact area cover 6001 such that the low contact area cover wraps around the coupling lightguides 104. A non-adjustable cylindrical tension rod 6205 and an adjustable cylindrical tension rod 6201 are disposed substantially parallel to each other in the y direction and are operatively coupled, such as physically coupled by two braces 6202 that are substantially parallel to each other in the x direction. The inner surface 6101 of the low contact area cover 6001 comprises convex surface features. When the cylindrical tension rod 6201 is translated in the +x direction, the inner surface 6101 of the low contact area cover 6001 is pulled inward in the +z and −z directions onto the lightguide 107 and coupling lightguide 104. The surface relief features on the low contact area cover 6001 reduce the amount of light lost from within the coupling lightguide 104 and/or the lightguide 107 when the cylindrical tension rod 6201 is translated in the +x direction. Translating the tension rod in the +x direction also reduces a height of the light emitting device 6200 parallel to the z direction by moving the coupling lightguides 104 closer together and closer to the lightguide 107. The low contact area cover 6001 also provides protection from dust contamination and physical contact by other components coupling light out of the coupling lightguides 104 and/or the lightguide film 107.

Figure 63A:
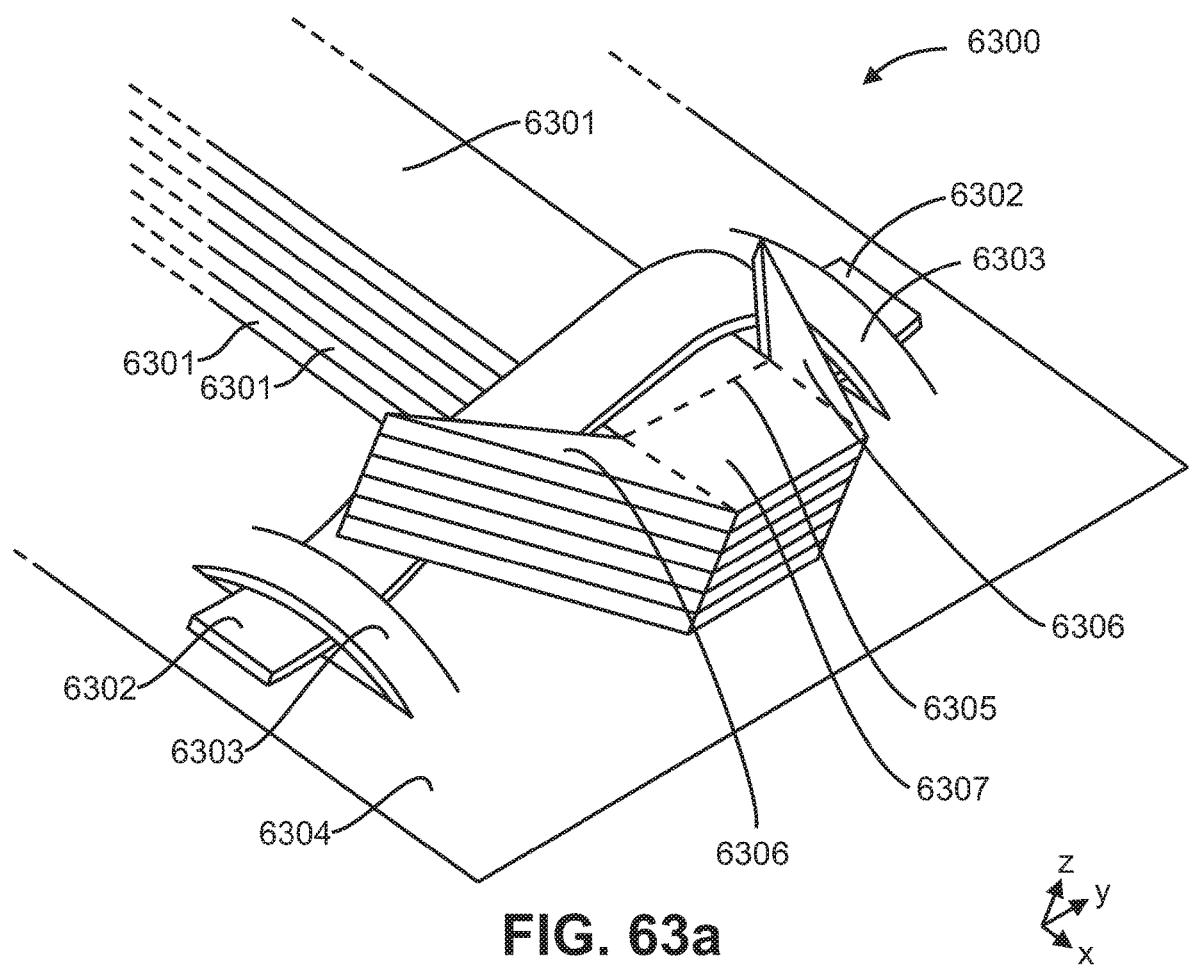
FIG. 63A is a perspective view of a portion of a film-based lightguide of one embodiment comprising coupling lightguides comprising two flanges on either side of the end region of the coupling lightguides.

FIG. 63A is a perspective view of a portion of one embodiment of a film-based lightguide 6300 comprising coupling lightguides 6301 including one or more flanges. In this embodiment, each coupling lightguide 6301 includes a flange 6306 on each opposing side of an end region 6307 of the coupling lightguides 6301 as shown in FIG. 63A. A strap 6302 is guided through two slits 6303 formed in a base 6304 and pulled by both ends in the y directions (or in the +y direction, for example, if the region of the strap in the −y direction is held fixed relative to the base 6304). By tightening the strap 6302, the coupling lightguides 6301 are urged closer together and toward the base 6304 in the z direction to facilitate securing the coupling lightguides 6301 with respect to the base 6304. Also, the strap 6303 and the hook regions formed by the flanges 6306 prevent or limit the coupling lightguides 6301 from translating in the −x direction. In one embodiment, after the coupling lightguides 6301 are urged together, the end region 6307 of the coupling lightguides 6301 and/or the flanges 6306 are cut or otherwise removed along a cut axis 6305. The resulting new edge at the end of the coupling lightguides 6301 along the cut axis 6305 can be an input surface or otherwise coupled to an optical element or polished to form a new input surface for the coupling lightguides 6301. The ends may be physically or optically coupled to a window or an adhesive or epoxy such as an Ultraviolet (UV) curable epoxy disposed between the ends of the coupling lightguide 6301 and a high gloss fluorinated ethylene propylene (FEP) film or polished glass such that the film or glass can be removed, leaving a glossy, polished input surface made of the epoxy which also helps holds the ends of the coupling lightguides 6301 together. In another embodiment, the holding mechanism is removed after one or more of the coupling lightguides 6301 are adhered together or to another component of the light emitting device 6300. In another embodiment, the end region 6307 is not removed from the coupling lightguides 6301 and the ends of the coupling lightguides 6301 form the light input surface 204 as shown in FIG. 63A.

Figure 63B:
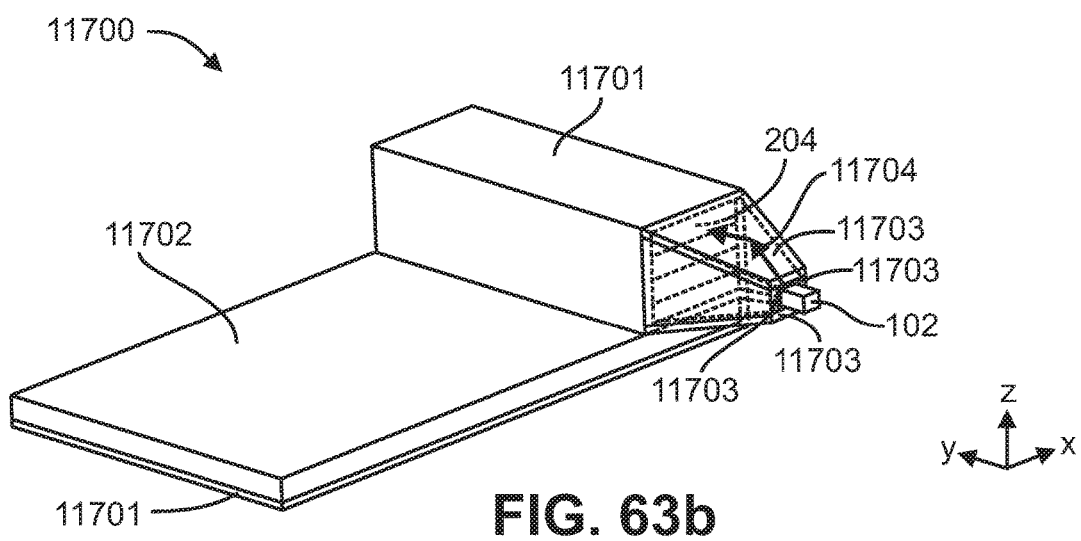
FIG. 63b is a perspective view of one embodiment of a light emitting device comprising film-based lightguide and a light reflecting optical element that is also a light collimating optical element and light blocking element.

FIG. 63B is a perspective view of one embodiment of a light emitting device 11700 comprising a film-based lightguide 11702 and a light reflecting optical element 11701 (shown in the FIG. 63B as transparent to illustrate the reflecting light ray) that is also a light collimating optical element and a light blocking element. The light reflecting optical element 11701 has a region 11705 that extends beyond the lightguide region 106 and wraps around the stack of coupling lightguides 104 and has tab regions 11703 that fold toward the light source 102 to form a light collimating element 11706. Light 11704 from the light source 102 is reflected off of the tab region 11703 of the light collimating element 11706 and becomes more collimated (smaller angular FWHM intensity) in the y-z and y-x planes and enters the input edges 204 of the coupling lightguides 104. Stray light that escapes a coupling lightguide 104 is blocked (reflected or absorbed in this embodiment) from exiting directly from the stack of coupling lightguides 104 by the light reflecting optical element 11701 that is also a light blocking optical element. In another embodiment, the light reflecting optical element 11701 may be optically coupled to the film-based lightguide 11702 by a pressure sensitive adhesive and the light reflecting optical element 11701 may diffusely reflect, specularly reflect, or a combination thereof, a portion of the incident light. In a further embodiment, the light reflecting optical element 11701 is a low contact area cover or comprises surface relief features in contact with the film-based lightguide 11702.

Figure 64:
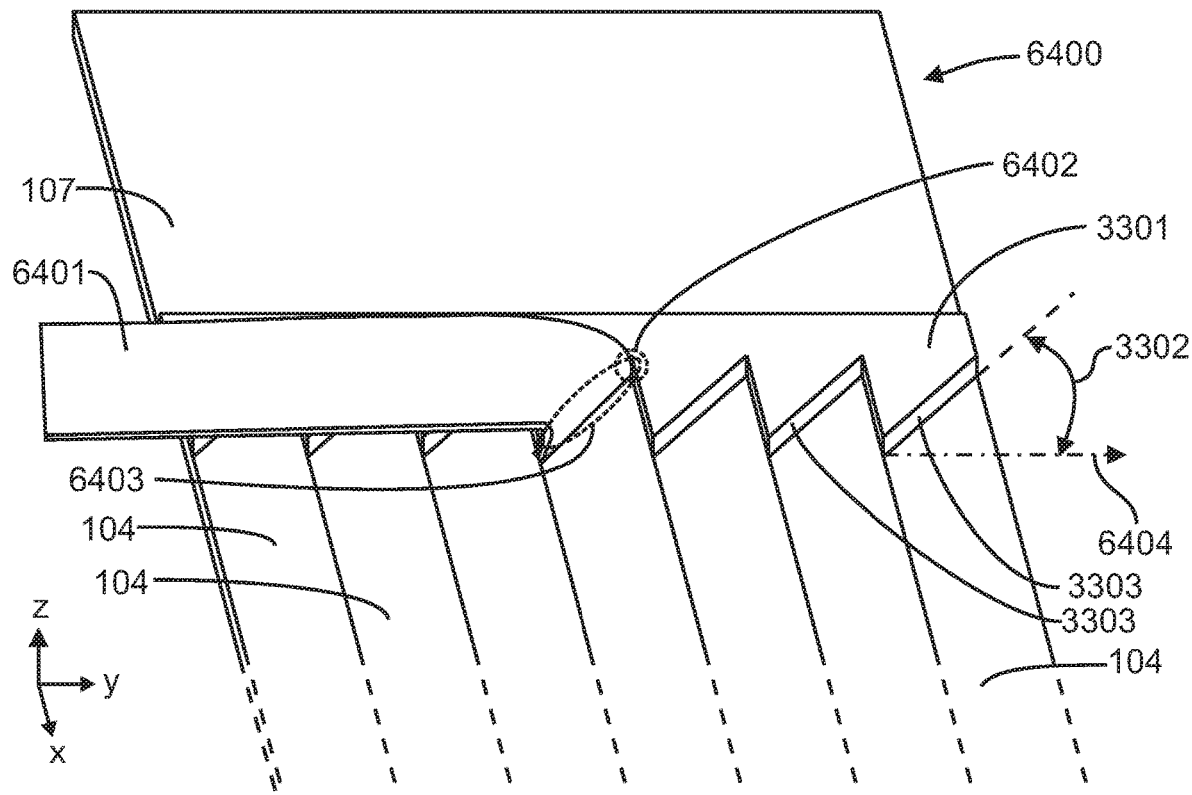
FIG. 64 is a perspective view of one embodiment of a film-based lightguide comprising a light input coupler and lightguide comprising a relative position maintaining element disposed proximal to a linear fold region.

FIG. 64 is a perspective view of one embodiment of a film-based lightguide 6400 comprising a light input coupler and lightguide 107 comprising a relative position maintaining element 3301 disposed proximal to a linear fold line or region. In this embodiment, the relative position maintaining element 3301 has a cross-sectional guide edge in a plane (x-y plane as shown) parallel to the lightguide 107 that comprises a substantially linear angled guide edge 3303 oriented at an angle 3302 about 45 degrees to the direction 6404 (+y direction) parallel to the linear fold direction (the −y direction). If the coupling lightguide 6401 is folded without the relative position maintaining element 3301, the stress point for the force of the fold or bend pulling the coupling lightguide in the −y direction is at the region 6402 near where the coupling lightguide 6401 separates from the lightguide 107. By using the relative position maintaining element 3301, when the coupling lightguide 6401 is pulled in the −y direction, the force is distributed across a length region 6403 of the angled guide edge 3303 of the relative position maintaining element 3301. In one embodiment, the angled guide edges 3303 on the relative position maintaining element 3301 reduce the likelihood of tearing the coupling lightguide 6401 and enable a lower profile (reduced height in the z direction) because the coupling lightguide 6401 can be pulled with relatively more force. In another embodiment, the thickness and edge profile of the relative position maintaining element 3301 dictates a minimum bend radius for the fold in the coupling lightguide 6401 near the length region 6403.

Figure 65:
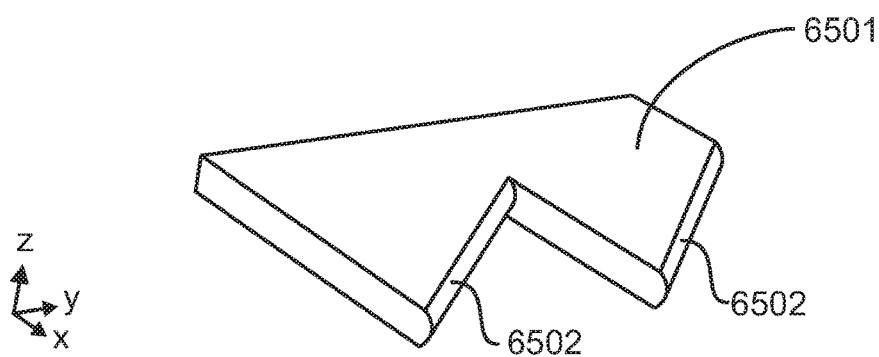
FIG. 65 is a perspective view of one embodiment of relative position maintaining element comprising rounded angled edge surfaces.

FIG. 65 is a perspective view of one embodiment of a relative position maintaining element 6501 comprising rounded angled edge surfaces 6502. By rounding the edge surfaces 6502, the surface area of contact with a folded film is increased to the rounded angled edge surface 6502. By spreading the force of pull in the −y direction over a larger area of the coupling lightguide 6401, for example, the coupling lightguide 6401 is less likely to fracture or tear.

Figure 66:
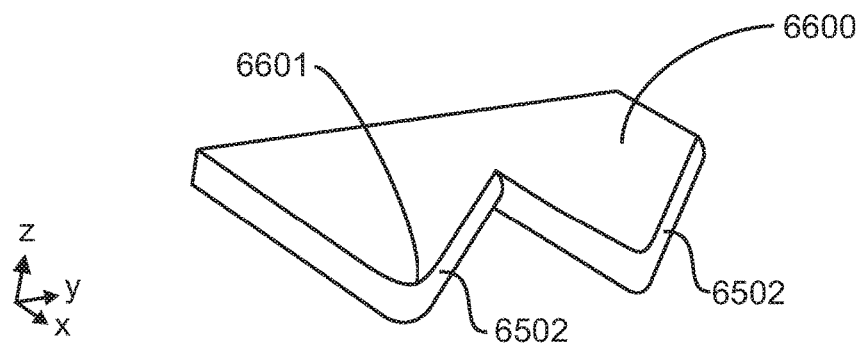
FIG. 66 is a perspective view of one embodiment of relative position maintaining element comprising rounded angled edge surfaces and a rounded tip.

FIG. 66 is a perspective view of one embodiment of a relative position maintaining element 6600 comprising rounded angled edge surfaces 6502 and rounded tips 6601. By rounding the edge surfaces 6502, the surface area of contact with a folded film is increased to the rounded angled edge surface 6502. By spreading the force of pull in the −y direction over a larger area of the coupling lightguide 6401, for example, the coupling lightguide 6401 is less likely to fracture or tear. By rounding the tips 6601 of the relative position maintaining element 6600, the edge is less sharp and less likely to induce a localized stress region in the coupling lightguide 6401 as the coupling lightguide 6401 is folded (or bent) or while maintaining the fold or bend.

Figure 67:
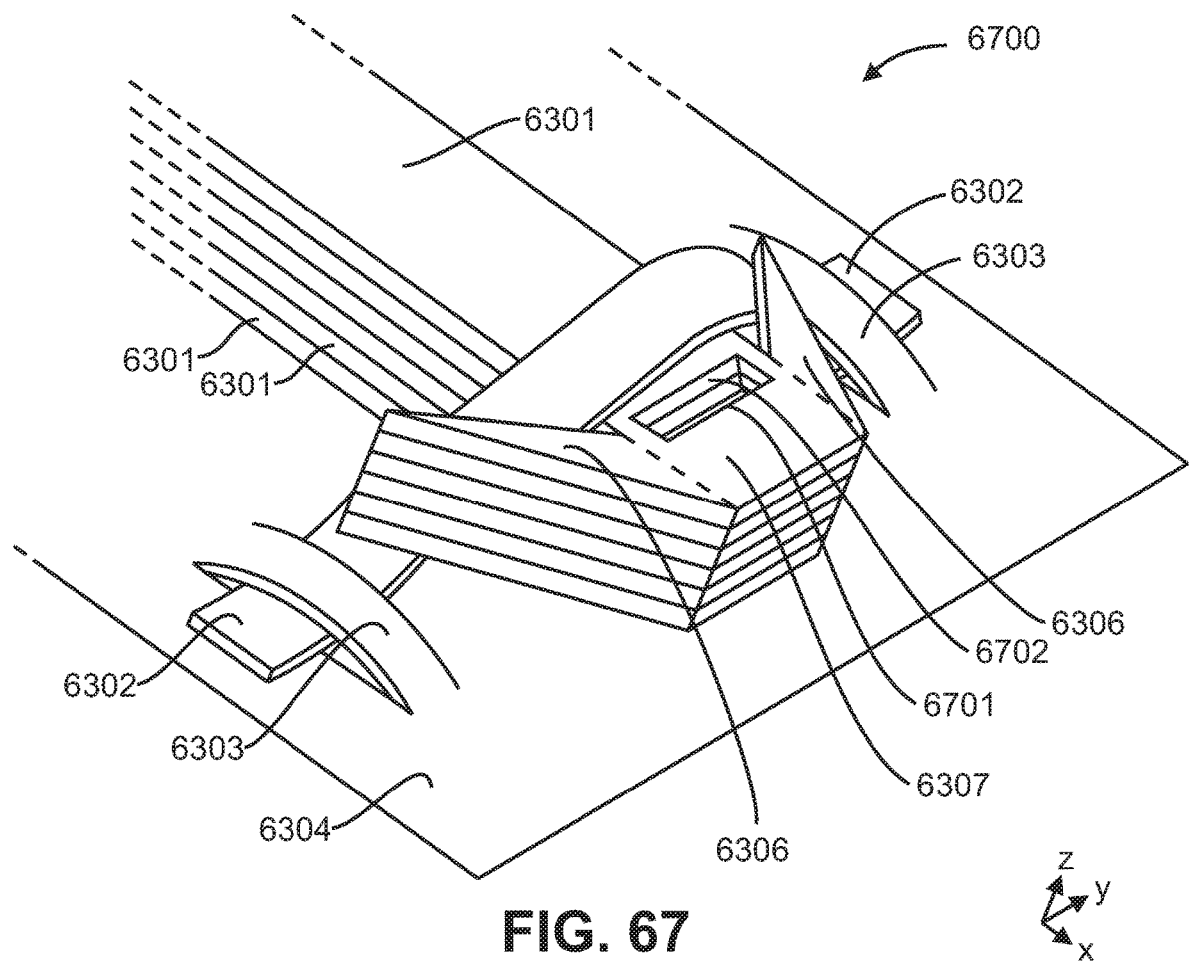
FIG. 67 is a perspective view of a portion of a film-based lightguide of one embodiment comprising coupling lightguides comprising two flanges on either side of the end region of the coupling lightguides.

FIG. 67 is a perspective view of a portion of one embodiment of a film-based lightguide 6700 comprising coupling lightguides 6301 including one or more flanges 6306. In this embodiment, each coupling lightguide 6301 includes a flange 6306 on each opposing side of an end region 6307 of the coupling lightguides 6301 as shown in FIG. 63. A strap 6302 is guided through two slits 6303 in a base 6304 and pulled by both ends in the y directions (or in the +y direction, for example, if the region of the strap in the −y direction is held fixed relative to the base 6304). By tightening the strap 6303, the coupling lightguides 6301 are urged closer together and toward the base 6304 in the z direction to facilitate securing the coupling lightguides 6301 with respect to the base 6304. Also, the strap 6303 and the hook regions formed by the flanges 6306 prevent or limit the coupling lightguides 6301 from translating in the −x direction. In one embodiment, after the coupling lightguides 6301 are urged together, the end region 6307 of the coupling lightguides 6301 and/or the flanges 6306 are cut or otherwise removed along an aperture cut 6701 by tearing or cutting the regions between the aperture cut 6701 and the flanges 6306 along a cut axis 6305. An edge 6702 of the aperture cut 6701 then becomes the light input surface of the coupling lightguides 6301. For example, in one embodiment, the cutting device used to cut the coupling lightguides 6301 from a film can also cut the light input surface on the coupling lightguides and the flanges 6306 and strap 6302 assist with assembly.

Figure 68:
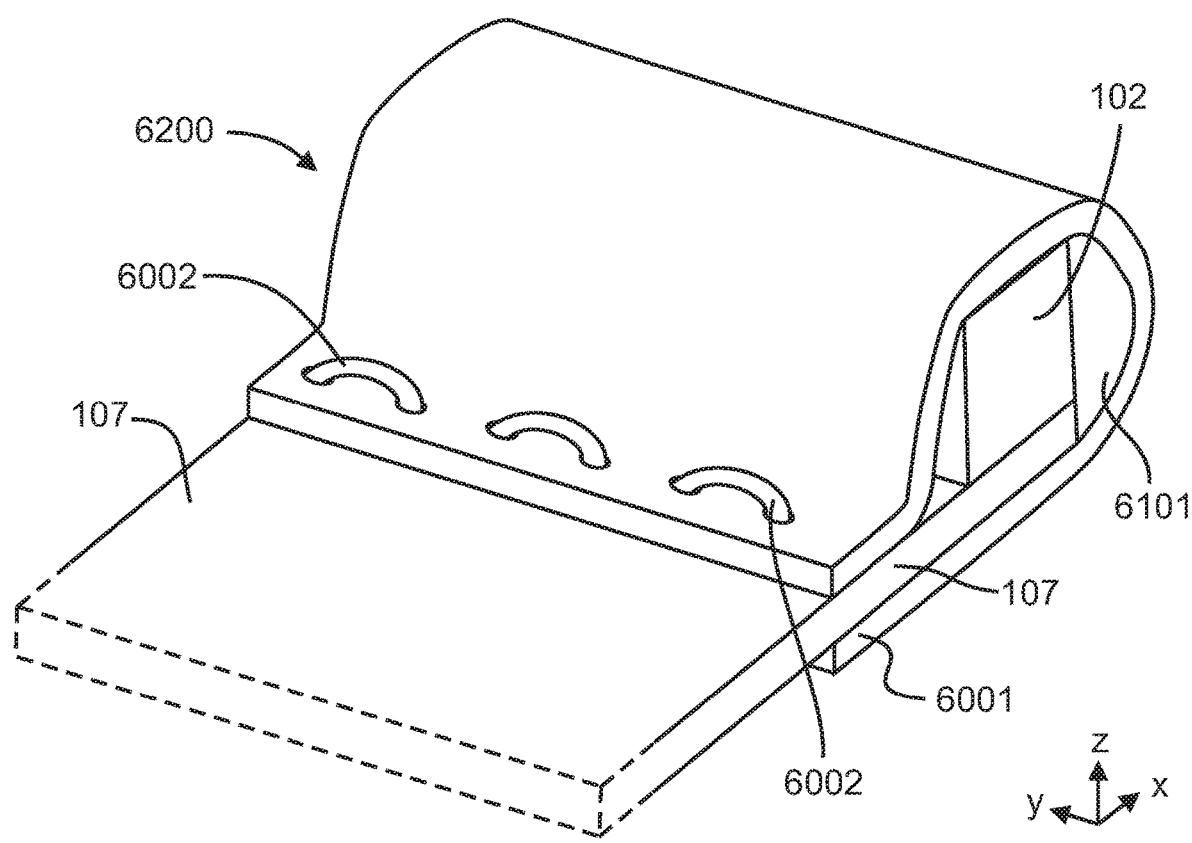
FIG. 68 is a perspective view of a portion of the light emitting device of the embodiment illustrated in FIG. 62.

FIG. 68 is a perspective view of a portion of one embodiment of the light emitting device 6200 illustrated in FIG. 62 comprising the lightguide 107 and light input coupler protected by a low contact area cover 6001. In this embodiment, the low contact area cover 6001 is physically coupled by a fiber 6002 to the lightguide 1007 in two regions of the low contact area cover 6001 by passing a fiber 6002 through the two layers of the low contact area cover 6001 and the lightguide 107 in a sewing or threading type action.

Figure 69:
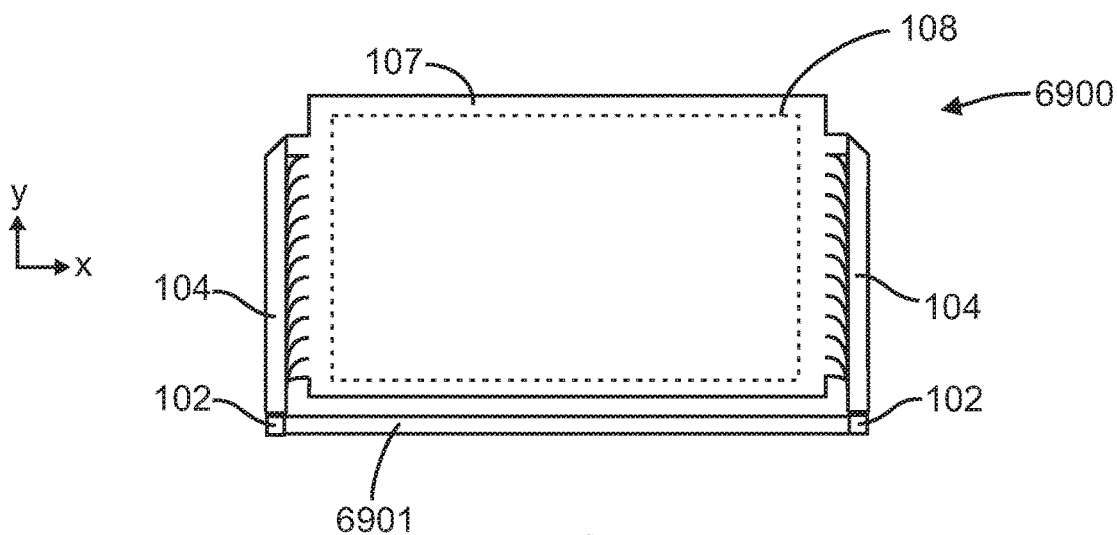
FIG. 69 is a top view of one embodiment of a light emitting device with two light input couplers, a first light source, and a second light source disposed on opposite sides of a lightguide.

FIG. 69 is a top view of one embodiment of a light emitting device 6900 with two light input couplers comprising coupling lightguides 104 and a first light source 6902 and a second light source 6903 disposed on opposite sides of the lightguide 107. An aluminum bar type thermal transfer element 6901 is disposed to thermally couple heat from the first light source 6902 and the second light source 6903 and dissipate heat along the length of light emitting device 6900 in the x direction. In other embodiments, one or more suitable thermal transfer elements may be incorporated into the light emitting device 6900 to facilitate dissipating heat from the light emitting device 6900.

Figure 70:
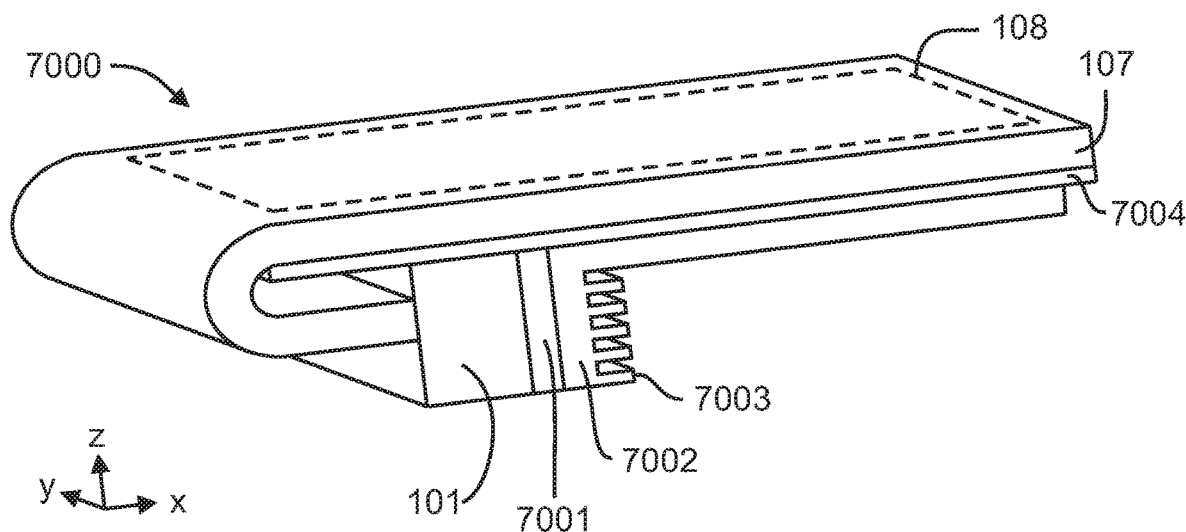
FIG. 70 is a perspective view of one embodiment of a light emitting device comprising a lightguide, a light input coupler, and a light reflecting film disposed between the light input coupler and the light emitting region.

FIG. 70 is a perspective view of one embodiment of a light emitting device 7000 comprising the lightguide 107, the light input coupler 101, and a light reflecting film 7004 disposed between the light input coupler 101 and the light emitting region 108. A circuit board 7001 for the light source in the light input coupler 101 couples heat from the light source to a thermal transfer element heat sink 7002 thermally coupled to the circuit board 7001. In this embodiment, the thermal transfer element 7002 comprises fins 7003 and is extended in the x-y plane behind the light reflecting film 7004 and the light emitting region 108 to provide an increased surface area and occupy a volume that does not extend past the edges 7030 of the lightguide 107 to conduct heat away from the circuit board 7001 and the light source in the light input coupler 101.

Figure 71:
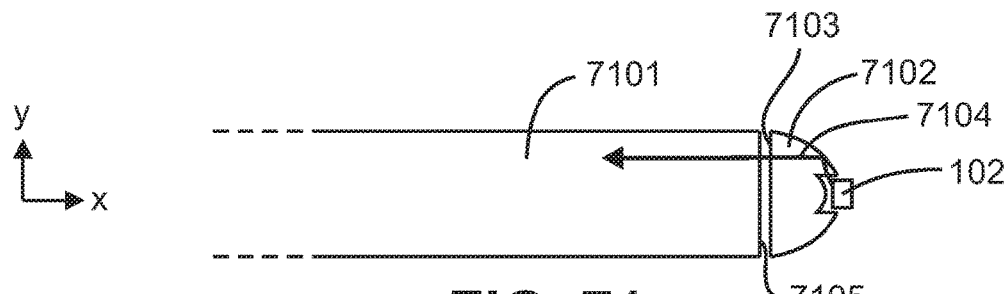
FIG. 71 is a top view of a region of one embodiment of a light emitting device comprising a stack of coupling lightguides disposed to receive light from a light collimating optical element and a light source.

FIG. 71 is a top view of a region of one embodiment of a light emitting device 7100 comprising a stack 7101 of coupling lightguides disposed to receive light from a light collimating optical element 7102 and the light source 102. The output surface 7103 of the light collimating optical element 7102 corresponds in shape to the light input surface 7105 of the stack 7101 of coupling lightguides. Light 7104 from the light source 102 is collimated by the light collimating optical element 7102 and enters the stack 7101 of coupling lightguides. For example, as shown in FIG. 71, the output surface 7103 has a rectangular shape substantially matching the rectangular shape of the light input surface 7105 of the stack 7101 of coupling lightguides.

Figure 72:
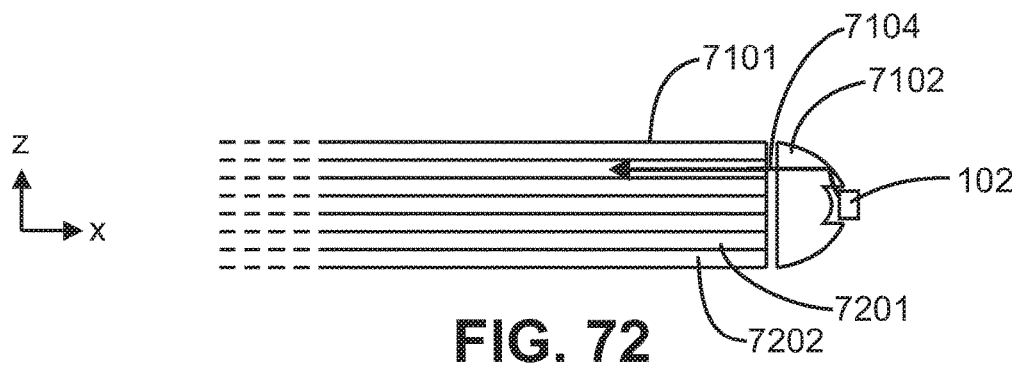
FIG. 72 is a cross-sectional side view of the embodiment shown in FIG. 71.

FIG. 72 is a cross-sectional side view of the light emitting device 7100 shown in FIG. 71. The light 7104 collimated by the light collimating optical element 7102 enters the stack 7101 of coupling lightguides 7201.

Figure 73:
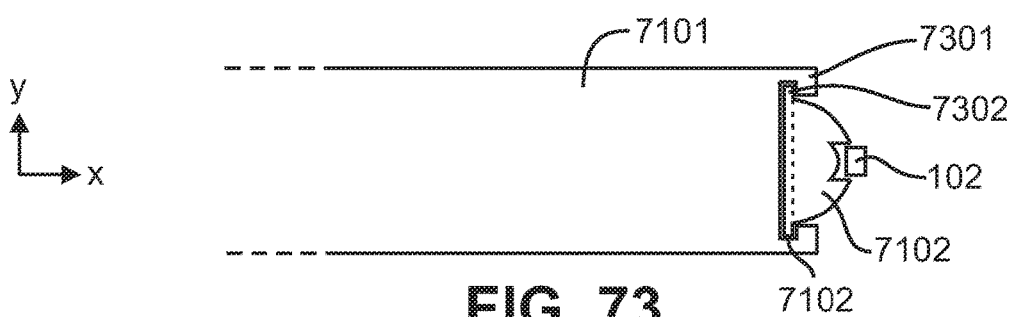
FIG. 73 is a top view of a region of one embodiment of a light emitting device comprising a stack of coupling lightguides physically coupled to a collimating optical element.

FIG. 73 is a top view of one embodiment of a light emitting device 7300 comprising the stack 7101 of coupling lightguides physically coupled to the light collimating optical element 7102. The physical coupling region of the stack 7101 of coupling lightguides defines a cavity 7331 within which the light collimating optical element physical coupling region 7302 is disposed. In the embodiment shown, the light collimating optical element physical coupling region 7302 is a ridge 7330 on the light collimating optical element 7102 and the physical coupling region of the stack 7101 of coupling lightguides is the region 7301 partially surrounding an opening or aperture cut within each coupling lightguide which, when stacked, forms a cavity 7331 that substantially constrains and aligns the light collimating optical element 7102 in the x and y directions.

Figure 74:
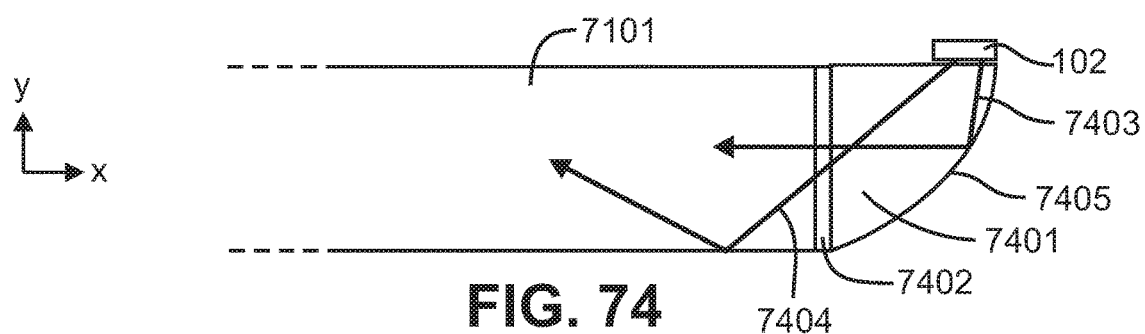
FIG. 74 is a top view of a region of one embodiment of a light emitting device comprising a light source adjacent a light turning optical element optically coupled to a stack of coupling lightguides.

FIG. 74 is a top view of a region of one embodiment of a light emitting device 7400 comprising a light turning optical element 7401 optically coupled using an index matching adhesive 7402 to a stack 7101 of coupling lightguides. Light 7403 from the light source 102 totally internally reflects off of the light turning surface 7405 of the light turning optical element 7401, passes through the index matching adhesive 7402 and into the stack 7101 of coupling lightguides and the optical axis of the light 7403 from the light source 102 is rotated. Light 7404 from the light source 102 passes directly into the stack 7101 of coupling lightguides without reflecting off of the light turning surface 7405 of the light turning optical element 7401.

Figure 75A:
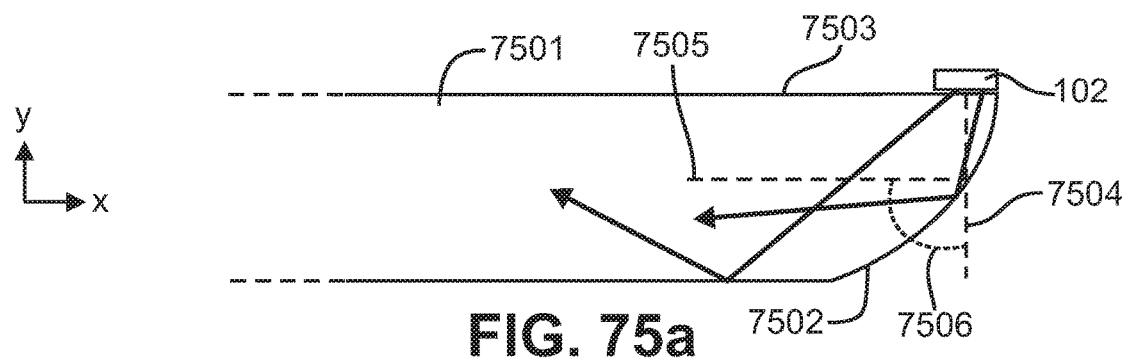
FIG. 75A is a top view of a region of one embodiment of a light emitting device comprising a light source disposed adjacent a lateral edge of a stack of coupling lightguides with light turning optical edges.

FIG. 75A is a top view of a region of one embodiment of a light emitting device 7500 comprising the light source 102 disposed adjacent a lateral edge 7503 of a stack 7501 of coupling lightguides with light turning optical edges 7502. The light turning optical edges 7502 reflect a portion of the incident light from the light source 102 with an optical axis 7504 in a first direction (−y direction, for example) such that the optical axis 7504 is rotated from the first direction by an angle 7506 to an optical axis 7505 in a second direction (−x direction, for example).

Figure 75B:
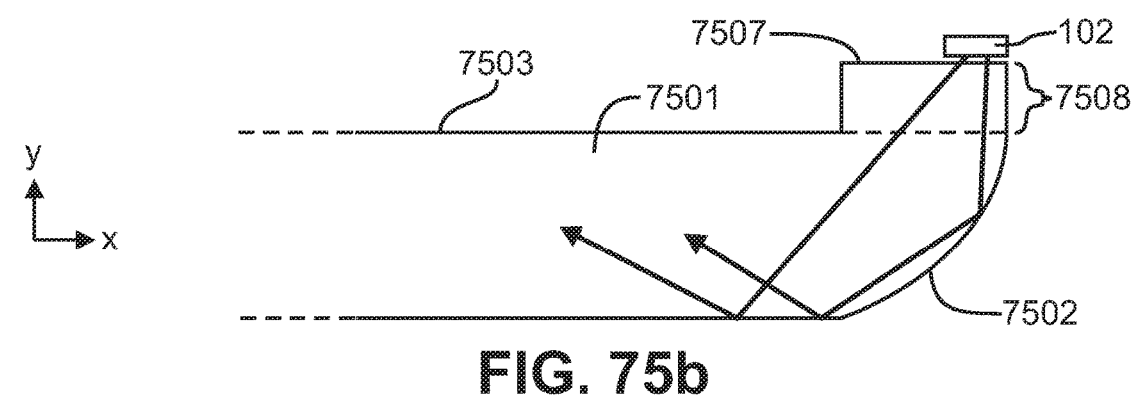
FIG. 75B is a top view of a region of one embodiment of a light emitting device comprising a light source disposed adjacent the light input surface edge of the extended region of a stack of coupling lightguides with light turning optical edges.

FIG. 75B is a top view of a region of one embodiment of a light emitting device 7530 comprising the light source 102 disposed adjacent the light input surface edge 7507 of the extended region 7508 of the stack 7501 of coupling lightguides with light turning optical edges 7502. In this embodiment, the extended region 7508 allows the light input surface edge 7507 to be cut, trimmed, and/or polished (separately or as a collection of coupling lightguides in a stack) or bonded to a light collimating optical element without damaging (scratching or tearing, for example) or unnecessarily coupling light out of the lateral edges 7503 of the stack 7501 of coupling lightguides (with overflow adhesive, for example).

Figure 76:
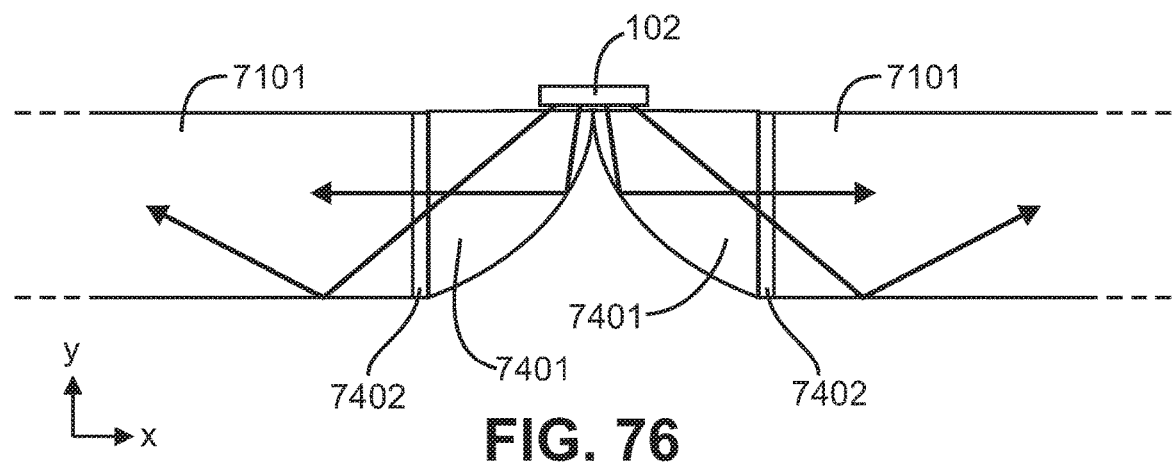
FIG. 76 is a top of a region of one embodiment of a light emitting device comprising a light source disposed to couple light into two light turning optical elements that are optically coupled to coupling lightguides using index matching adhesive.

FIG. 76 is a top view of a region of one embodiment of a light emitting device 7600 comprising the light source 102 disposed to couple light into two light turning optical elements 7401 optically coupled using an index matching adhesive 7402 (such as an optical adhesive for example) to two stacks 7101 of coupling lightguides.

Figure 77:
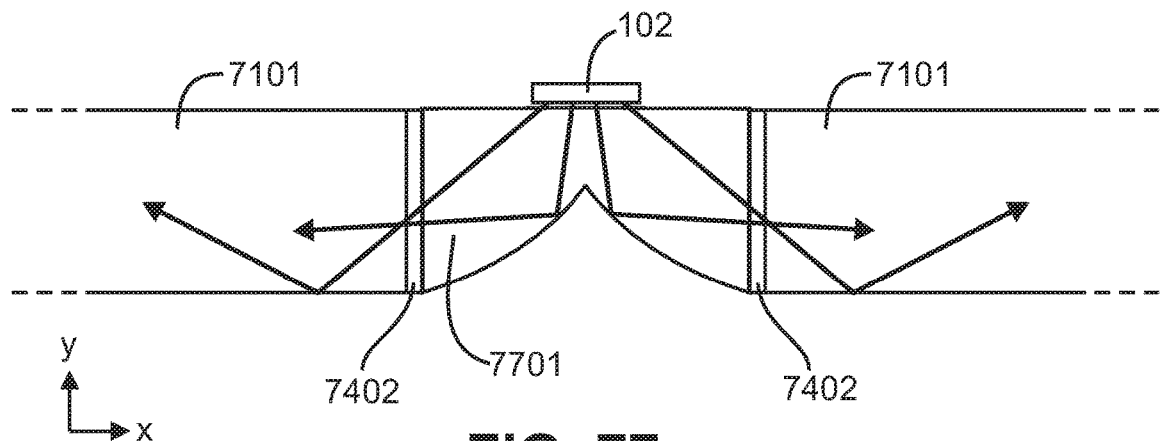
FIG. 77 is a top view of a region of one embodiment of a light emitting device comprising a light source disposed to couple light into a bi-directional light turning optical element optically coupled to two stacks of coupling lightguides.

FIG. 77 is a top view of a region of one embodiment of a light emitting device 7700 comprising the light source 102 disposed to couple light into a bi-directional light turning optical element 7701 optically coupled using index matching adhesive 7402 to two stacks 7101 of coupling lightguides. In this embodiment, a single bi-directional light turning optical element 7701 divides and rotates the optical axis of light from a single light source in a first direction (−y direction) into two different directions (−x and +x directions), replaces two unidirectional light turning optical elements, and reduces part count and associated costs.

Figure 78:
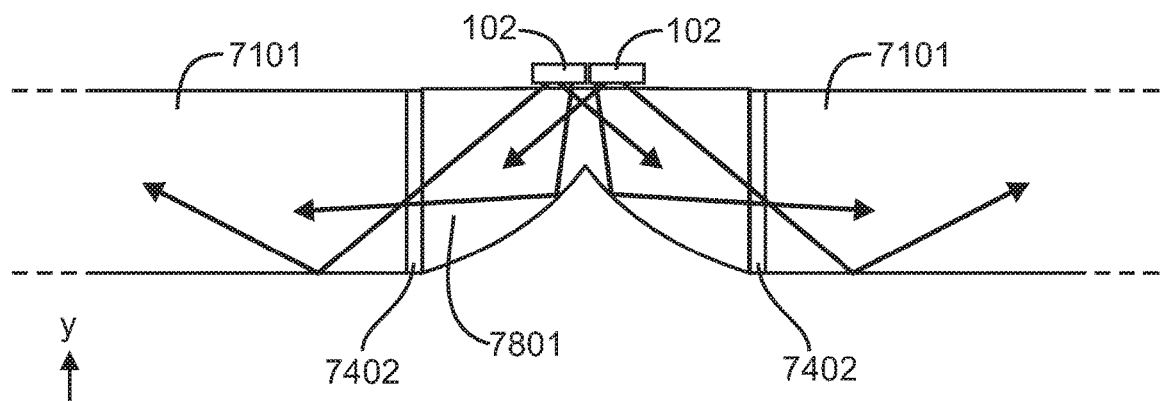
FIG. 78 is a top view of a region of one embodiment of a light emitting device comprising two light sources disposed to couple light into a bi-directional light turning optical element optically coupled to two stacks of coupling lightguides.

FIG. 78 is a top view of a region of one embodiment of a light emitting device 7800 comprising two light sources 102 disposed to couple light into a bi-directional light turning optical element 7801 optically coupled using index matching adhesive 7402 to two stacks 7101 of coupling lightguides. In this embodiment, a single bi-directional light turning optical element 7701 is designed to divide and rotate the optical axes of light from two light sources from a first direction (−y direction) to two different directions (+x and −x directions).

Figure 79:
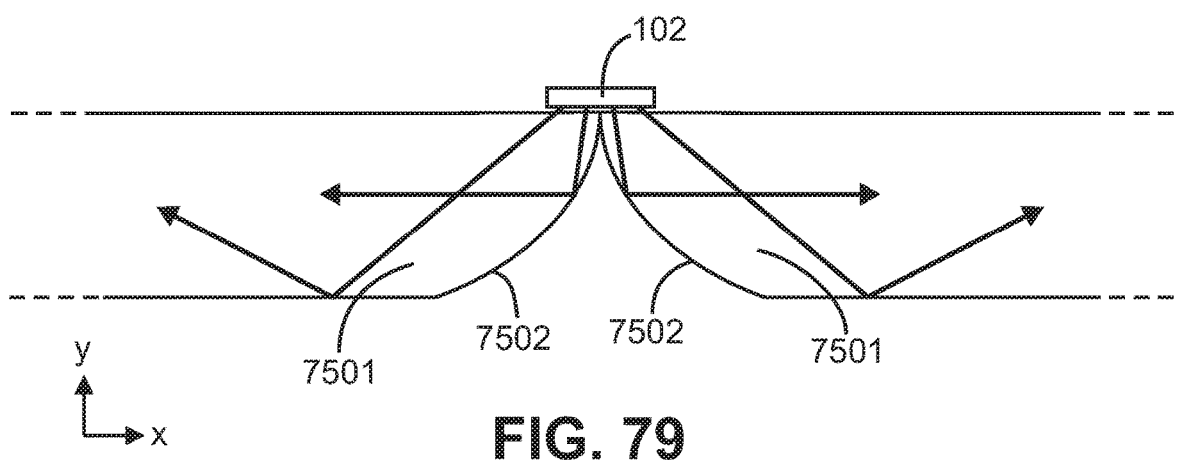
FIG. 79 is a top view of a region of one embodiment of a light emitting device comprising a light source disposed to couple light into two stacks of coupling lightguides with light turning optical edges.

FIG. 79 is a top view of a region of one embodiment of a light emitting device 7900 comprising the light source 102 disposed to couple light into two stacks 7501 of coupling lightguides with light turning optical edges 7502. In this embodiment, the two stacks 7501 of coupling lightguides divide and rotate the optical axis of light from the light source from a first direction (−y direction) to two different directions (+x and −x directions).

Figure 80:
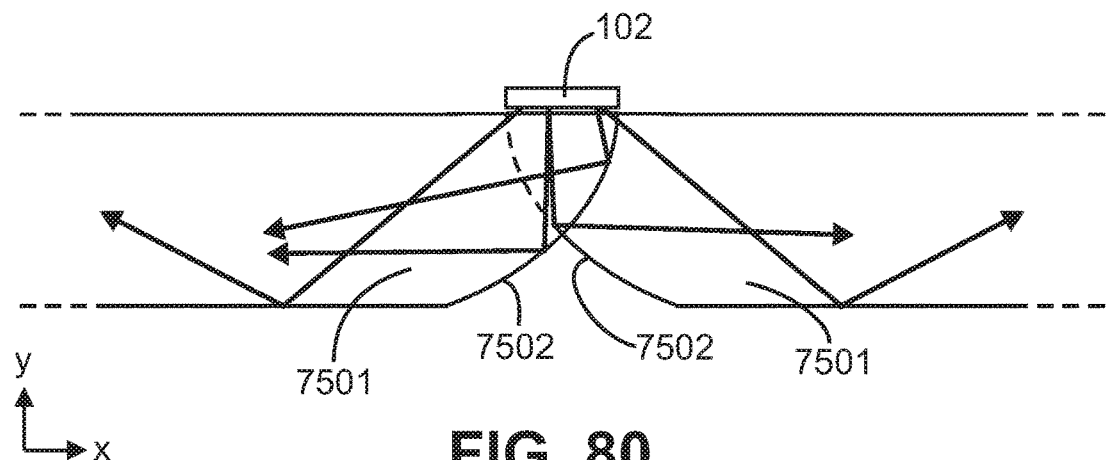
FIG. 80 is a top view of a region of one embodiment of a light emitting device comprising a light source disposed to couple light into two overlapping stacks of coupling lightguides with light turning optical edges.

FIG. 80 is a top view of a region of one embodiment of a light emitting device 8000 comprising the light source 102 disposed to couple light into two overlapping stacks 7501 of coupling lightguides with light turning optical edges 7502. In this embodiment, the two stacks 7501 of coupling lightguides divide and rotate the optical axis of light from the light source from a first direction (−y direction) to two different directions (+x and −x directions).

Figure 81:
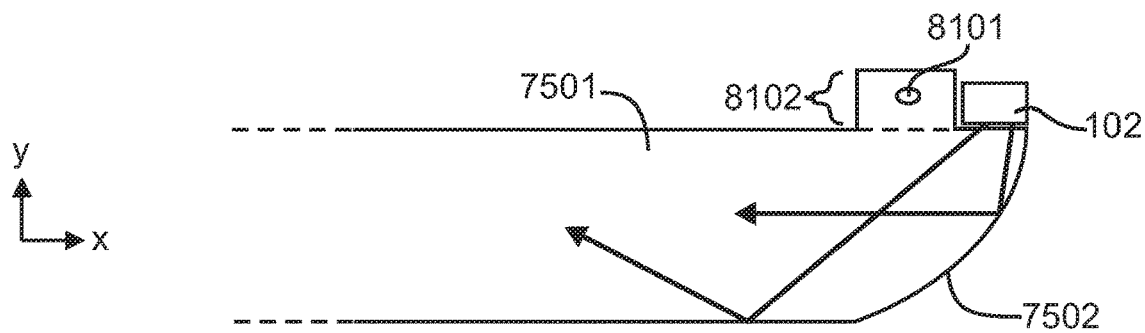
FIG. 81 is a top view of a region of one embodiment of a light emitting device comprising a light source disposed to couple light into a stack of coupling lightguides with light turning optical edges wherein the coupling lightguides have tabs with tab alignment holes.

FIG. 81 is a top view of a region of one embodiment of a light emitting device 8100 comprising the light source 102 disposed to couple light into the stack 7501 of coupling lightguides with light turning optical edges 7502. In this embodiment, the stack 7501 of coupling lightguides has tabs 8102 with tab alignment openings or apertures 8101.

The tab alignment openings or apertures 8101 may be used, for example, to register the stack 7501 of coupling lightguides (and their light input surface) with a pin extending from a circuit board comprising a light source to enable efficient light coupling into the stack 7501 of coupling lightguides.

Figure 82:
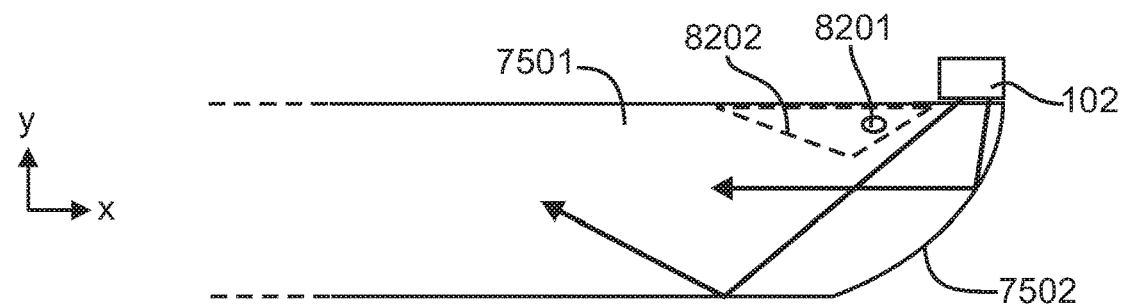
FIG. 82 is a top view of a region of one embodiment of a light emitting device comprising a light source disposed to couple light into a stack of coupling lightguides with light turning optical edges and registration holes in a low light flux density region.

FIG. 82 is a top view of a region of one embodiment of a light emitting device 8200 comprising the light source 102 disposed to couple light into the stack 7501 of coupling lightguides with light turning optical edges 7502. In this embodiment, the stack 7501 of coupling lightguide has alignment openings or apertures 8201 in low light flux density regions 8202. The alignment openings or apertures 8201 may be used, for example, to register the stack 7501 of coupling lightguides to the light source 102 and they are located in a low light flux density region 8202 such that a tab is not needed and any light loss due to the location of the alignment openings or apertures 8201 within the stack 7501 of coupling lightguides is minimized.

Figure 83:
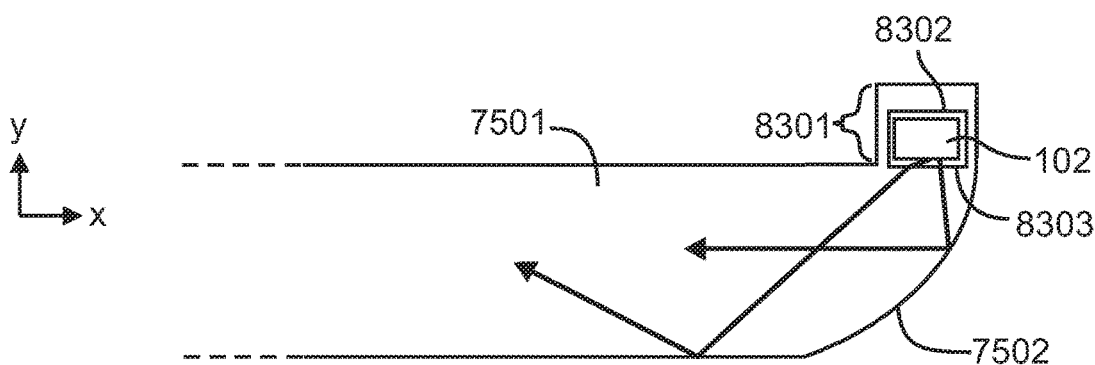
FIG. 83 is a top view of a region of one embodiment of a light emitting device comprising a light source disposed to couple light into a stack of coupling lightguides with a light source overlay tab region for light source registration.

FIG. 83 is a top view of a region of one embodiment of a light emitting device 8300 comprising the light source 102 disposed to couple light into the stack 7501 of coupling lightguides with a light source overlay tab region 8301 comprising an alignment cavity 8302 for registration of the light input surface 8303 of the stack 7501 of coupling lightguides with the light source 102. In this embodiment, for example, the alignment cavity 8302 within the stack 7501 of coupling lightguides may be placed over the light source 102 such that a light input surface 8303 of the stack 7501 of coupling lightguides is substantially registered and aligned in the x and y directions with the light source 102.

FIG. 84 is a top view of one embodiment of a lightguide 8400 comprising the film-based lightguide 107 having coupling lightguides 8401 with light turning optical edges 7502. The coupling lightguides 8401 can be folded in the +z direction and translated laterally in the +x direction 8402 (shown folded in FIG. 85) such that the coupling lightguides 8401 stack and align above one another.

FIG. 85 is a top view of one embodiment of a light emitting device 8500 comprising the lightguide 8400 shown in FIG. 84 with the coupling lightguides 8401 folded and translated to form the stack 7501 of coupling lightguides 8401 such that the stack 7501 extends past a lateral edge 8501 of the lightguide region 106 of the film-based lightguide 107. Light 8502 from the light source 102 has an optical axis in the −y direction that is rotated by the light turning optical edges 7502 of the stack 7501 of coupling lightguides to the −x direction and the fold in the stack 7501 of coupling lightguides 8401 redirects the coupling lightguide orientation to the −y direction such that the light has an optical axis exiting the coupling lightguides in the −y direction. The light 8502 then propagates into the lightguide region 106 of the film-based lightguide 107 and exits the film-based lightguide 107 in the light emitting region 108.

FIG. 86 is a top view of one embodiment of a lightguide 8600 comprising the film-based lightguide 107 having coupling lightguides 8401 with light turning optical edges 7502 and a non-folded coupling lightguide 8603. The non-folded coupling lightguide 8603 has a width 8601 along the edge of the lightguide region 106 from which the coupling lightguides 8401 extend and a length 8602 in the direction perpendicular to the edge where the coupling lightguides 8401 connect with the lightguide region 106.

FIG. 87 is a top view of one embodiment of a light emitting device 8700 comprising the lightguide 8600 shown in FIG. 86 with the coupling lightguides 8401 folded and translated to form the stack 7501 of coupling lightguides 8401 that do not extend past the lateral edge 8501 (or a plane comprising the lateral edge 8501) of the lightguide region 106 of the film-based lightguide 107. Light 8502 from the light source 102 has an optical axis in the −y direction that is rotated by the light turning optical edges 7502 of the stack 7501 of coupling lightguides 8401 to the −x direction, and the fold in the stack 7501 of coupling lightguides 8401 redirects the coupling lightguide orientation to the −y direction such that the light has an optical axis exiting the coupling lightguides 8401 in the −y direction. The light 8502 then propagates into the lightguide region 106 and exits the film-based lightguide 107 in the light emitting region 108. Light 8702 from the light source 102 has an optical axis in the −y direction and passes through the non-folded coupling lightguide 8603 and into the lightguide region 106 directly. In this embodiment, the non-folded coupling lightguide 8603 permits the stack 7501 of coupling lightguides 8401 to not extend past the lateral edge 8501 of the lightguide region 106 of the film-based lightguide 107 because the non-folded coupling lightguide 8603 does not need to be folded and translated in the +x direction to receive light from the light source 102.

Figure 88:
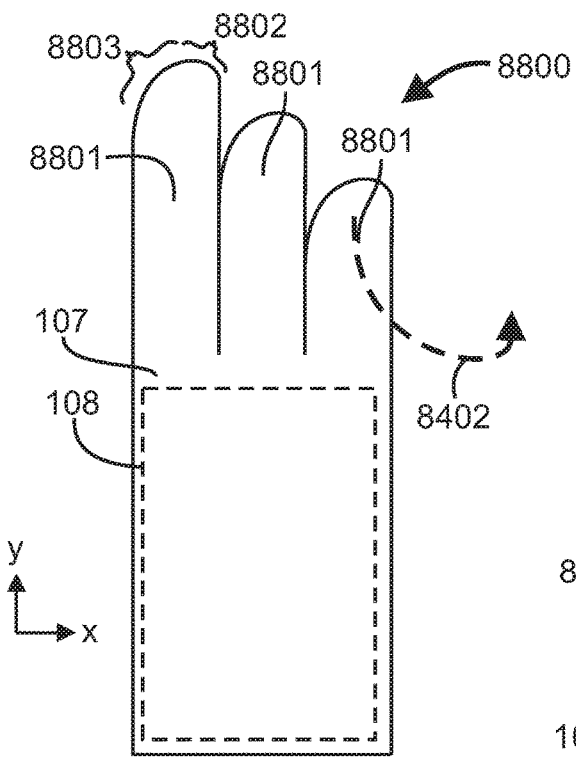
FIG. 88 is a top view of one embodiment of a lightguide comprising coupling lightguides with light collimating optical edge regions and light turning optical edge regions.

FIG. 88 is a top view of one embodiment of a lightguide 8800 comprising the film-based lightguide 107 having coupling lightguides 8801 with light turning optical edges 8803 and light collimating optical edges 8802. The coupling lightguides 8801 can be folded in the +z direction and translated laterally in the +x direction 8402 (shown folded in FIG. 89) such that the coupling lightguides 8801 stack and align above one another.

Figure 89:
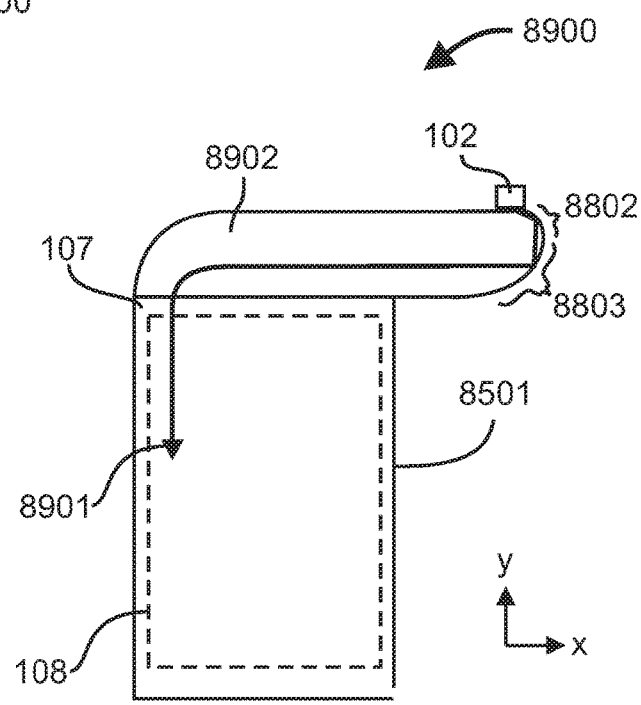
FIG. 89 is a top view of one embodiment of a light emitting device comprising the film-based lightguide of FIG. 88 wherein coupling lightguides are folded.

FIG. 89 is a top view of one embodiment of a light emitting device 8900 comprising the lightguide 8800 shown in FIG. 88 with the coupling lightguides 8801 folded and translated to form a stack 8902 of coupling lightguides 8801 such that the stack 8902 of coupling lightguides 8801 extends past a lateral edge 8501 of the lightguide region 106 of the film-based lightguide 107. Light 8901 from the light source 102 is collimated by the light collimating optical edges 8802 and has an optical axis in the −y direction that is rotated by the light turning optical edges 8803 of the stack 8902 of coupling lightguides 8801 to the −x direction and the fold in the stack 8902 of coupling lightguides 8801 redirects the coupling lightguide orientation to the −y direction such that the light has an optical axis exiting the coupling lightguides 8801 in the −y direction. The light 8901 then propagates into the lightguide region 106 of the film-based lightguide 107 and exits the film-based lightguide 107 in the light emitting region 108.

Figure 90:
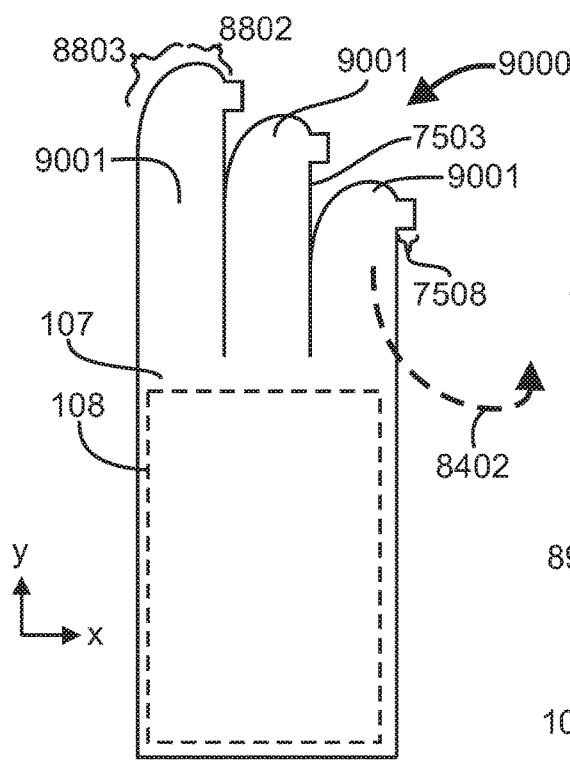
FIG. 90 is a top view of one embodiment of a lightguide comprising coupling lightguides with extended regions.

FIG. 90 is a top view of one embodiment of a lightguide 9000 comprising the film-based lightguide 107 with coupling lightguides 9001 with light turning optical edges 8803, light collimating optical edges 8802, and extended regions 7508. The coupling lightguides 9001 can be folded in the +z direction and translated laterally in the +x direction 8402 (shown folded in FIG. 91) such that the coupling lightguides 9001 stack and align above one another.

Figure 91:
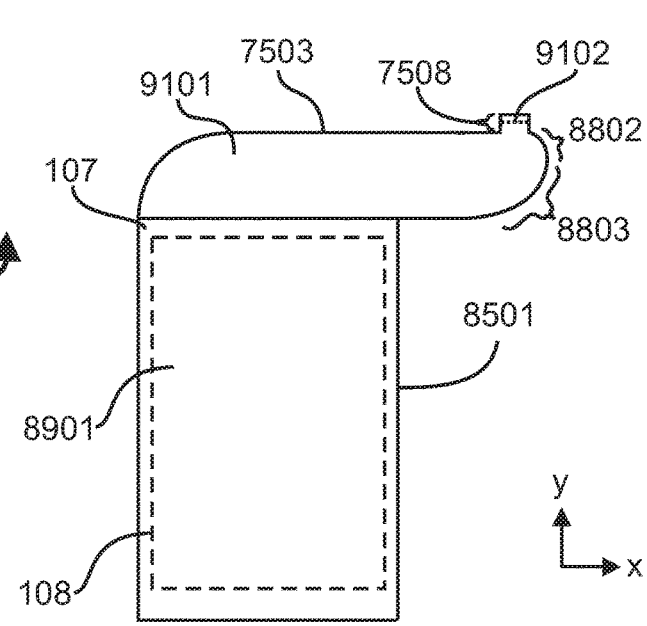
FIG. 91 is a top view of one embodiment of the lightguide of FIG. 90 with the coupling lightguides folded.

FIG. 91 is a top view of one embodiment of the lightguide 9000 shown in FIG. 90 with the coupling lightguides 9001 folded and translated to form a stack 9101 of coupling lightguides 9001 such that the stack 9101 of coupling lightguides 9001 extends past a lateral edge 8501 of the lightguide region 106 of the film-based lightguide 107. The extended regions 7508 of the stack 9101 of the coupling lightguides 9001 extend past the lateral edges 7503 of the coupling lightguides 9001 and the stack 9101 can be cut and/or polished along a cut line 9102 (or adhered to an optical element or light source) without damaging the lateral edge 7503.

Figure 92:
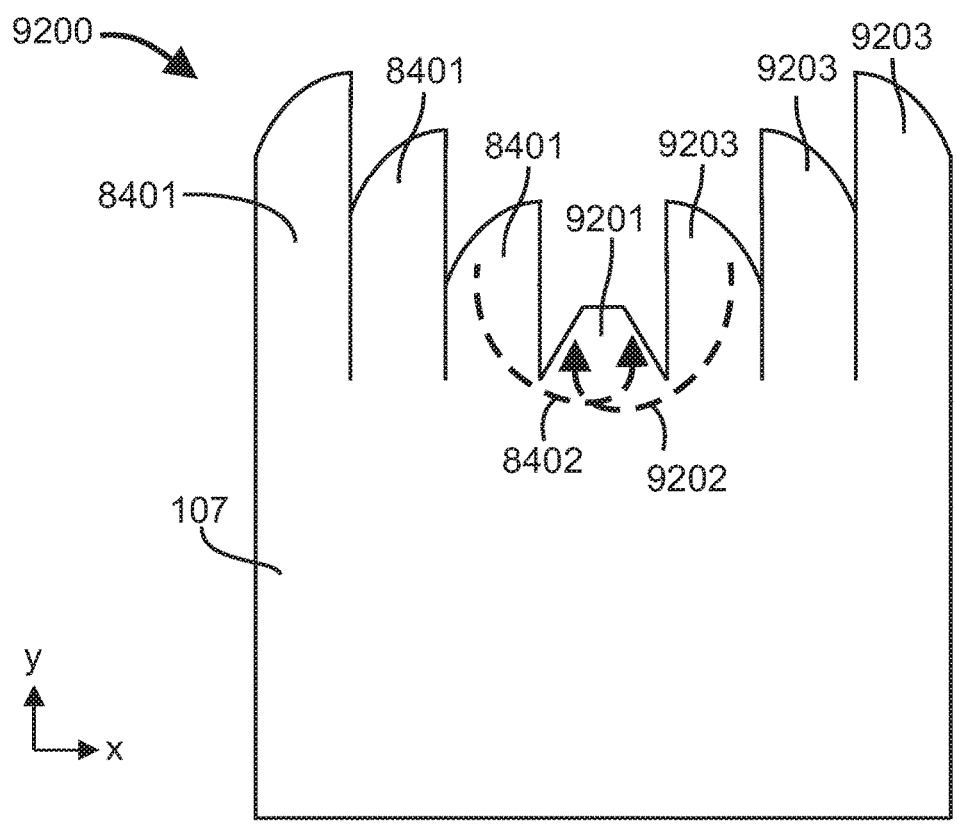
FIG. 92 is a top view of one embodiment of a lightguide comprising coupling lightguides with light turning optical edges turning light in two directions and a non-folded coupling lightguide.

FIG. 92 is a top view of one embodiment of a lightguide 9200 comprising the film-based lightguide 107 with a first set of coupling lightguides 8401 and a second set of coupling lightguides 9203 with light turning optical edges 9230 oriented to turn light in a plurality of directions, and a non-folded coupling lightguide 9201. The coupling lightguides 8401 can be folded in the +z direction and translated laterally in the +x direction 8402 (shown folded in FIG. 93) such that they stack and align above one another. The coupling lightguides 9203 can be folded in the +z direction and translated laterally in the −x direction 9202 (shown folded in FIG. 93) such that they stack and align above one another.

Figure 93:
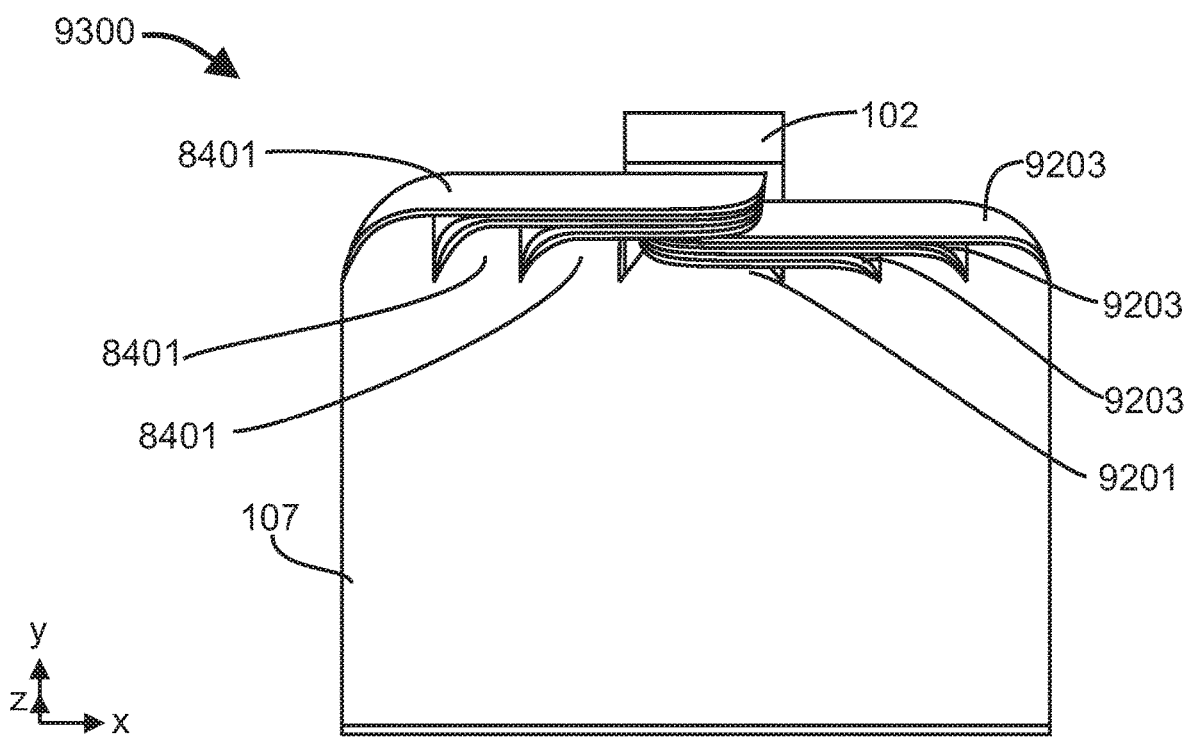
FIG. 93 is a perspective top view of one embodiment of a light emitting device comprising the film-based lightguide of FIG. 92 with the coupling lightguides from each side grouped together.

FIG. 93 is a perspective top view of one embodiment of a light emitting device 9300 comprising the light source 102 disposed to couple light into the lightguide 9200 shown in FIG. 92 with the first set of coupling lightguides 8401 folded and translated in the +x direction and the second set of coupling lightguides 9203 folded and translated in the −x direction. In this embodiment, the first set of coupling lightguides 8401 are folded and translated above the second set of coupling lightguides 9203 which are folded and translated above the non-folded coupling lightguide 9201 disposed to receive light from the light source 102 and transmit light to the lightguide region 106.

Figure 94A:
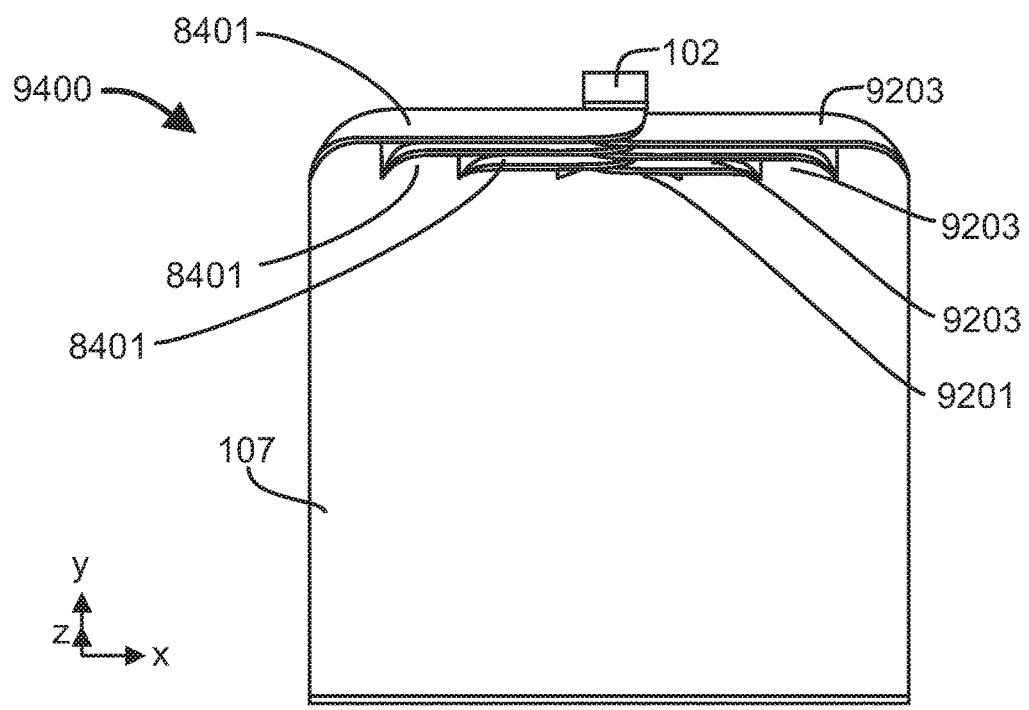
FIG. 94A is a perspective top view of one embodiment of a light emitting device comprising the film-based lightguide of FIG. 92 with the coupling lightguides from the sides interleaved in a stack.

FIG. 94A is a top view of one embodiment of a light emitting device 9400 comprising the light source 102 disposed to couple light into the lightguide 9200 shown in FIG. 92 with the first set of coupling lightguides 8401 folded and translated in the +x direction and the second set of coupling lightguides 9203 folded and translated in the −x direction. In this embodiment, the first set of coupling lightguides 8401 are folded and translated such that the first set of coupling lightguides 8401 are interleaved with the folded and translated second set of coupling lightguides 9203 above the non-folded coupling lightguide 9201. In one embodiment, interleaving the coupling lightguides 8401 and 9203 near the light source 102 improves the uniformity of the light within the lightguide region 106 to facilitate preventing or limiting undesirable variations in light source alignment and/or light output profile.

Figure 94B:
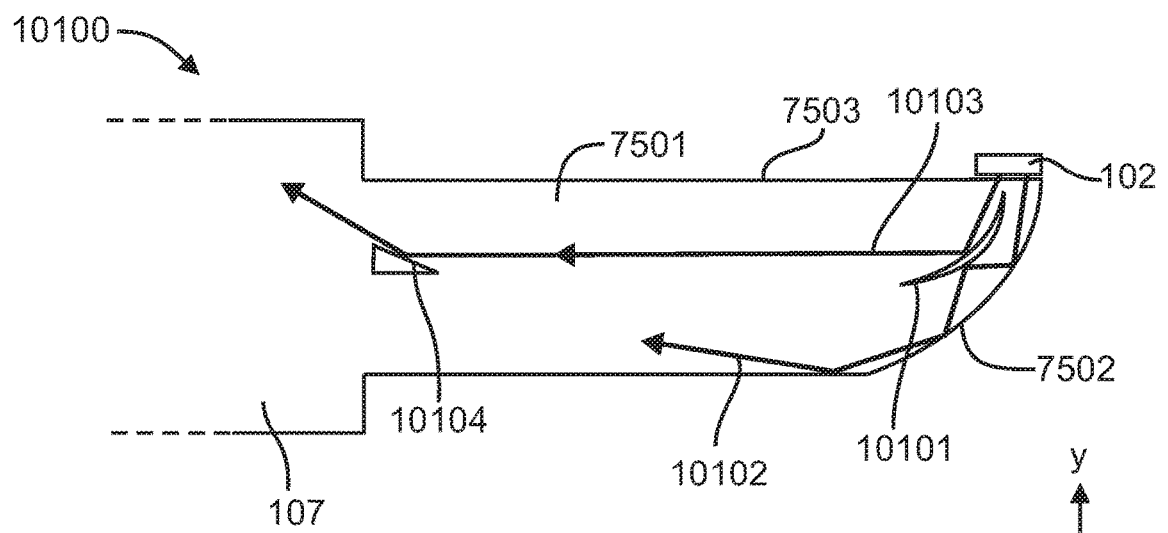
FIG. 94B is a cross-sectional side view of a region of one embodiment of a light emitting device comprising coupling lightguides with interior light directing edges.

FIG. 94B is a cross-sectional side view of a region of one embodiment of a light emitting device 10100 comprising a stack 7501 of coupling lightguides with interior light directing edges 10101 disposed near the input edge of the stack 7501 of coupling lightguides and interior light directing edges 10104 disposed near the lightguide region of the film-based lightguide 107. Light 10102 from the light source 102 enters the stack 7501 of coupling lightguides and is reflected and redirected by the interior light directing edges 10101 disposed near the input edge surface of the stack 7501 of coupling lightguides. Light 10103 from the light source 102 is reflected and redirected by the interior light directing edge 10101 disposed near the input edge of the stack 7501 of coupling lightguides and further reflected and redirected by the interior light directing edge 10104 disposed near the lightguide region of the film-based lightguide 107.

Figure 95:
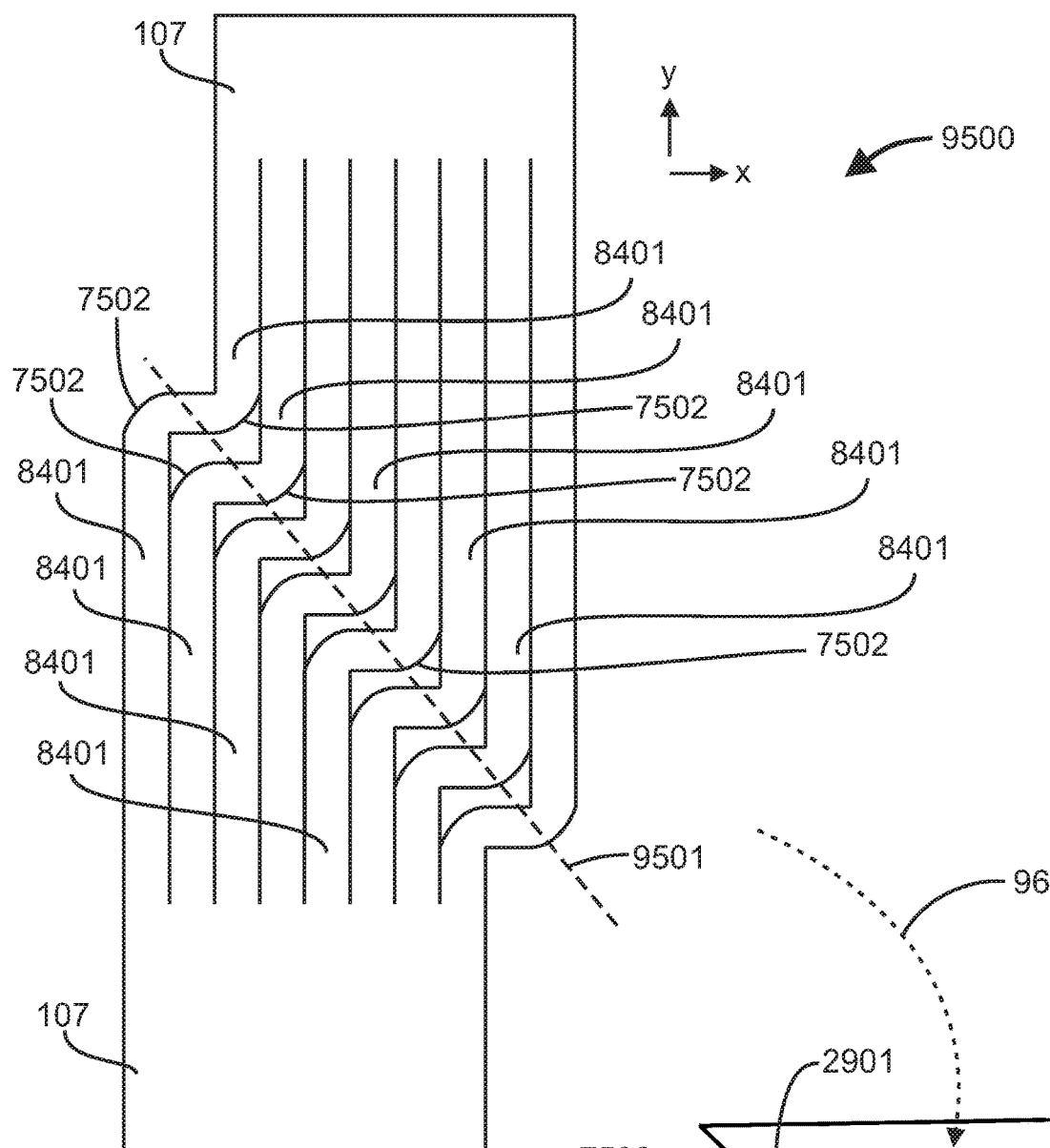
FIG. 95 is a top view of one embodiment of a film-based lightguide comprising coupling lightguides with light turning optical edges extended in shapes inverted along a first direction.

FIG. 95 is a top view of one embodiment of a lightguide 9500 comprising the film-based lightguide 107 comprising coupling lightguides 8401 having light turning optical edges 7502 with the coupling lightguides extended in shapes inverted along a first direction 9501.

Figure 96:
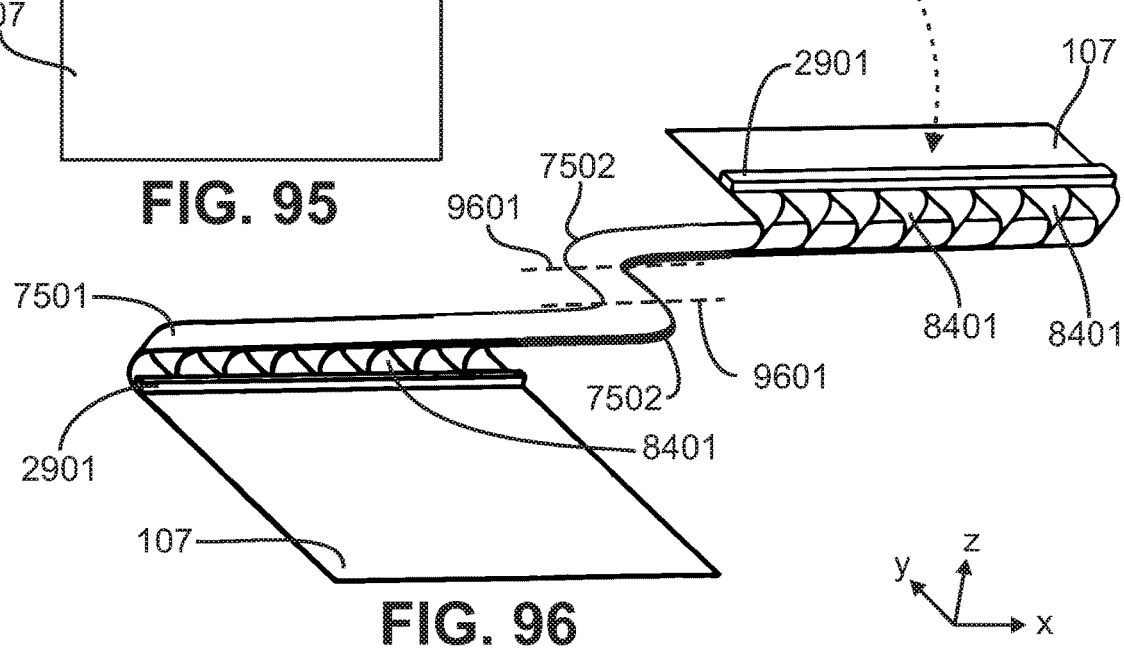
FIG. 96 is a perspective view of a lightguide comprising an embodiment of the lightguide of FIG. 95 folded to form two stacks of coupling lightguides.

FIG. 96 is a perspective view of one embodiment of folded lightguides 9600 comprising the lightguide 9500 shown in FIG. 95. The coupling lightguides 8401 are folded 9602 by translating one end (the top end shown in FIG. 95) in the +z direction, +x, and −y, then the −z direction using two relative position maintaining elements 2901 to form a stack 7501 of coupling lightguides 8401. In a further embodiment, the stack 7501 of coupling lightguides 8401 may be cut along cut lines 9601 to form two stacks 7501 of coupling lightguides 8401.

FIG. 97 is a top view of one embodiment of a lightguide 9700 comprising the film-based lightguide 107 having coupling lightguides 9702 with light turning optical edges 8803, light collimating optical edges 8802, and light source overlay tab regions 8301 comprising alignment cavities 8302 for registration of the light input surface of the stack of coupling lightguides with a light source. The lightguide 9700 also comprises a non-folding coupling lightguide 9703 with a light collimating optical edge 8802, and a light source overlay tab region 8301 comprising an alignment cavity 8302 for registration of the light input surface of the non-folded coupling lightguide 9703 with a light source. The coupling lightguides 9702 further comprise curved regions 9701 on the edge of the coupling lightguides 9702 to reduce the likelihood of stress (such as resulting from torsional or lateral bending, for example) focusing at a sharp corner, thus reducing the likelihood of film fracture. The coupling lightguides 9702 can be folded in the +z direction and translated laterally in the +x direction 8402 (shown folded in FIG. 98) such that they stack and align above one another.

FIG. 98 is a top view of one embodiment of a light emitting device 9800 comprising the light source 102 (shown in FIG. 99) and the lightguide 9700 shown in FIG. 97 with the coupling lightguides 9702 folded and translated to form a stack 9803 of coupling lightguides 9702 aligned along one edge of the lightguide region 106. Light 9802 from the light source 102 is collimated by the light collimating optical edges 8802 and has an optical axis in the −y direction that is rotated by the light turning optical edges 8803 of the stack 9803 of coupling lightguides 9702 to the −x direction and the fold in the stack 9803 of coupling lightguides 9702 redirects the coupling lightguide orientation to the −y direction such that the light has an optical axis exiting the coupling lightguides 9702 in the −y direction. The light 9802 then propagates into the lightguide region 106 of the film-based lightguide 107. Light 8702 from the light source 102 has an optical axis in the −y direction and passes through the non-folded coupling lightguide 9703 and into the film-based lightguide 107 directly.

FIG. 99 is an enlarged side view near the light source 102 in the y-z plane of the light emitting device 9800 illustrated in FIG. 98. An alignment guide 9903 comprises an alignment arm 9801 that is a cantilever spring with a curved front edge disposed above the light source 102. The alignment arm 9801 applies a force against the stack 9803 of coupling lightguides 9702 to maintain the position of the light input surfaces 103 of the coupling lightguides 9702 near the light output surface 9901 of the light source 102. In this embodiment, the alignment arm 9801 is inserted through the alignment cavities 8302 and the coupling lightguides 9702 can be pulled in the +y direction and downward (−z direction) such that the alignment cavities 8302 are positioned over the opposite end of the alignment guide 9903 and the light source 102 (the free end of the alignment arm 9801 can be lifted slightly during this movement if necessary). In this embodiment, the alignment cavities 8302 register and substantially maintain the position of the light input surfaces 103 of the coupling lightguides 9702 relative to the light output surface 9901 of the light source 102 in the x and y directions and the alignment arm 9801 on the alignment guide 9903 maintains the relative position in the z direction by applying force in the −z direction to position the stack 9803 of coupling lightguides 9702 against each other and the light source base 9902 (which could be a circuit board, for example). Light 9904 from the light source 102 exits the light output surface 9901 of the light source 102 and propagates into the coupling lightguides 9702 through the light input surface 103.

FIG. 100 is an enlarged side view of a region near the light source 102 in the y-z plane of one embodiment of a light emitting device 10000 comprising an alignment guide 9903 with an alignment arm 9801 that is a cantilever spring with a curved edge disposed above a light source 102 and light collimating optical element 7102. The alignment arm 9801 applies a force against a stack of coupling lightguides 9702 to maintain the position of the light input surfaces 103 of the coupling lightguides 9702 near the light output surface 10002 of the light collimating optical element 7102. In this embodiment, the alignment arm 9801 is inserted through the alignment cavities 8302 and the coupling lightguides 9702 can be pulled in the +y direction. In this embodiment, the alignment cavities are not sufficient in length to cover the alignment guide 9903, and the coupling lightguides 9702 remain held in place in the z direction by the alignment arm 9801. In this embodiment, the alignment cavities 8302 register and substantially maintain the position of the light input surfaces 103 of the coupling lightguides 9702 relative to the light output surface 10002 of the light collimating optical element 7102 in the x and +y directions and the alignment arm 9801 on the alignment guide 9903 maintains the relative position in the z direction by applying force in the −z direction to position the stack 9803 of coupling lightguides 9702 against each other and the light source base 9902 (which could be a circuit board, for example). Friction with the stack of coupling lightguides 9702 and the light source base 9902 and the alignment arm 9801 due to the force from the alignment arm 9801 in the −z direction and the friction from the fit of the inner walls of the alignment cavities 8302 and the light collimating optical element 7102 and/or the light source 102 help prevent the coupling lightguides 9702 from translating in the −y direction. In another embodiment, the light input surface 103 of the coupling lightguides 9702 are optically bonded to the light output surface 10002 of the light collimating optical element 7102 (or they are optically bonded to the light output surface of the light source 102 or a light turning optical element). Light 10003 from the light source 102 exits the light output surface 9901 of the light source 102 and propagates into the light collimating optical element 7102 where the light is collimated in the x-y plane and exits the light output surface 10002 of the light collimating optical element 7102 and enters the light input surface 103 of the coupling lightguides 9702 where it propagates to the lightguide region 106 (not shown).

Figure 101:
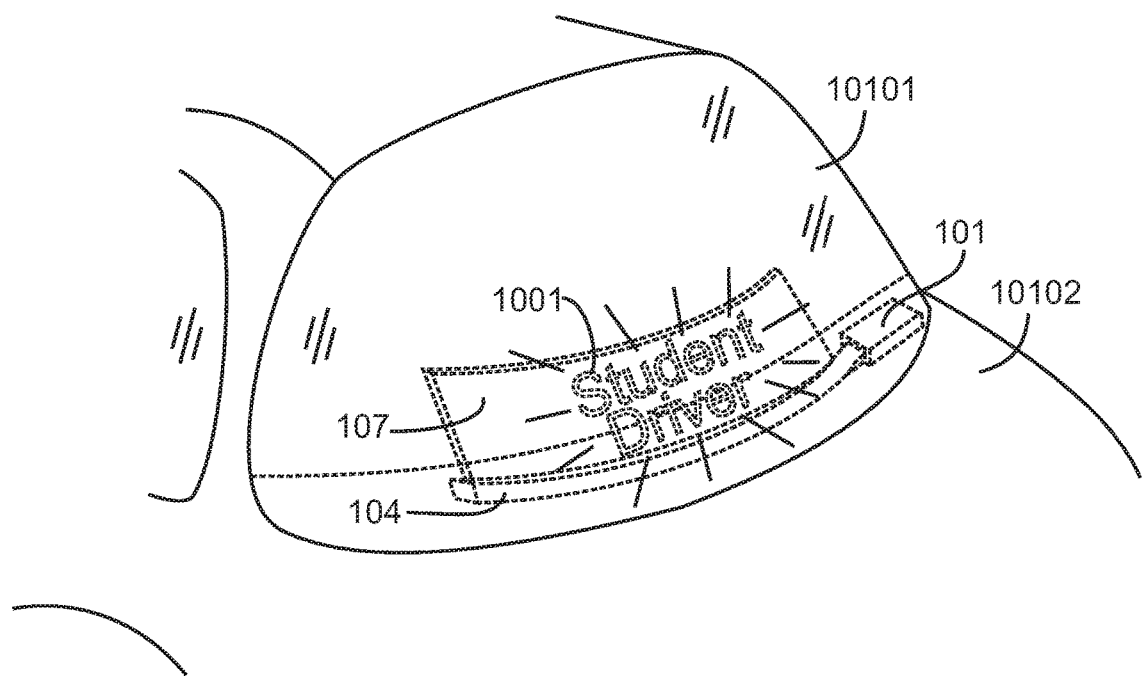

FIG. 101 is a perspective view of one embodiment of a light emitting transparent sign comprising a lightguide 107 disposed adjacent a window 2201 of an automobile 10102 wherein light from an input coupler 101 travels through an array of coupling lightguides 104 and into the lightguide 107 where it is extracted out of the lightguide in regions forming light emitting indicia 1001. In this embodiment, the lightguide is disposed adjacent the inner side of the window 10101 and is substantially transparent in the regions of the lightguide around the light emitting indicia 1001 and is partially translucent or mostly transparent in the regions corresponding to the light emitting indicia 1001 when the light input coupler 101 is not emitting light. In one embodiment, the flexibility of the film-based lightguide 107 facilitates the physical and optical coupling and conformity of the lightguide 107 to the window 10101 to alleviate optical defects such as additional reflections from additional air interfaces between the lightguide 107 and the window 10101 and visible air bubbles.

Figure 102:
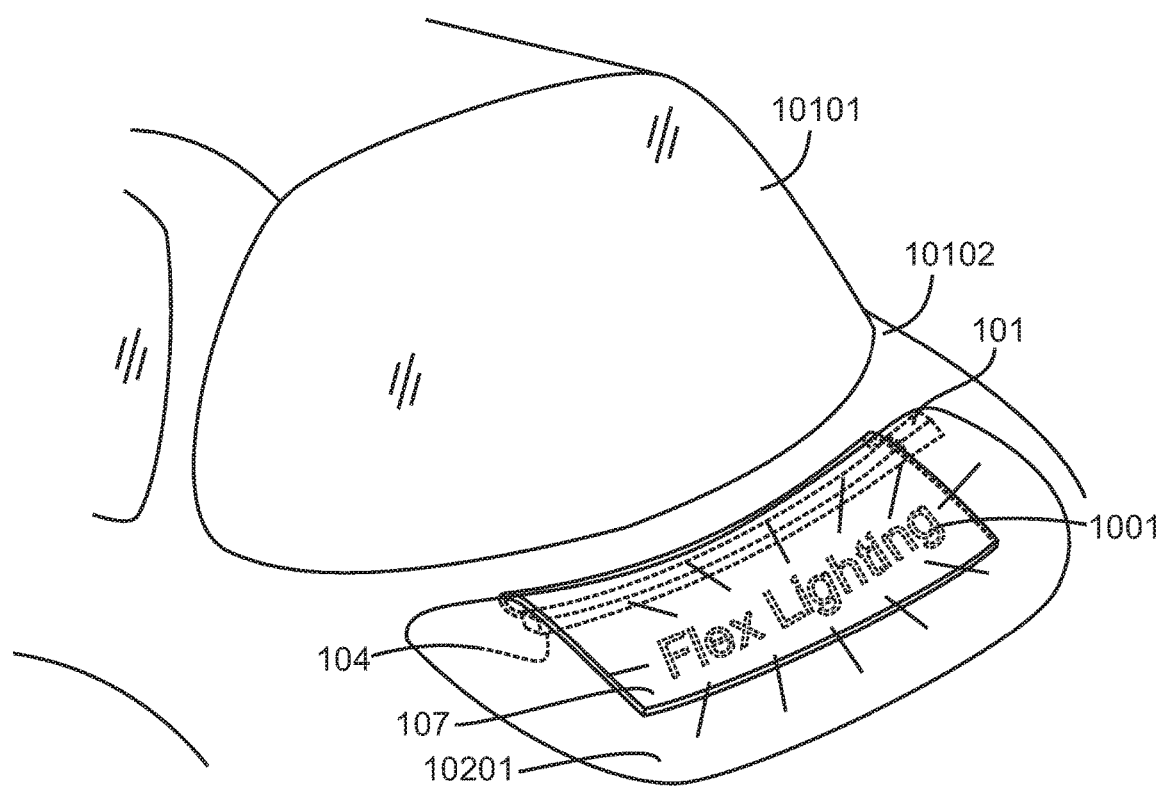

FIG. 102 is a perspective view of one embodiment of a light emitting transparent sign comprising a lightguide 107 disposed adjacent a trunk door 10201 of an automobile 10102 wherein light from an input coupler 101 inside the trunk travels through an array of coupling lightguides 104 and into the lightguide 107 where it travels from inside the trunk to the outside of the automobile 10102. The lightguide 107 is disposed adjacent to the trunk door 10201 and the light within the lightguide 107 is extracted out of the lightguide 107 in regions forming light emitting indicia 1001. In this embodiment, the light input coupler 101 is disposed within the trunk and the lightguide 107 passes through an opening between the trunk and the trunk door 10201. In this embodiment, the trunk door 10201 is visible through the lightguide 107 and the luminance contrast ratio between the light emitting indicia 1001 regions and the trunk looking through the lightguide 107 is low such that the indicia are substantially not visible when the light input coupler 101 is not emitting light. When the light input coupler 101 is emitting light the luminance contrast ration is high such that the light emitting indicia 1001 are readily legible. In another embodiment, the light emitting transparent sign is disposed on one selected from the group of a side door, side panel, front panel, hood, side of a trailer, top sign, and other region of an automobile, truck, airplane, or other craft or vehicle.

FIG. 103 is a perspective view of one embodiment of a light emitting sign 1000 comprising a light input coupler 101 and a lightguide region 106. Light 1005 from the light source in the light input coupler 101 propagates through the lightguide region 106 and exits the light emitting sign 1000 due to light extraction features in a region forming the light emitting indicia 1001.

FIG. 104 is an enlarged section of a light emitting region of the light emitting sign of FIG. 103 comprising the light emitting indicia 1001 comprising light extraction features 10401. The light traveling in the lightguide region 106 is extracted by the individual light extraction features 10401 such that a collective perceived indicia 1001 is perceived (in this example, the letter "O" appears to be luminous and visible). The light measurement region 10402 is the measurement region used to determine the diffuse reflectance, haze, transmission, surface area percentage, average dimensional size, etc. for a region of the light emitting region representing the indicia. For example, the diffuse reflectance for a region of the indicia is measured at the region 10402 or similar region within the boundary representing the indicia wherein the measurement spot size is smaller than the bounded region representing the indicia and includes multiple light extraction features and the space between them in the region.

Figure 105:
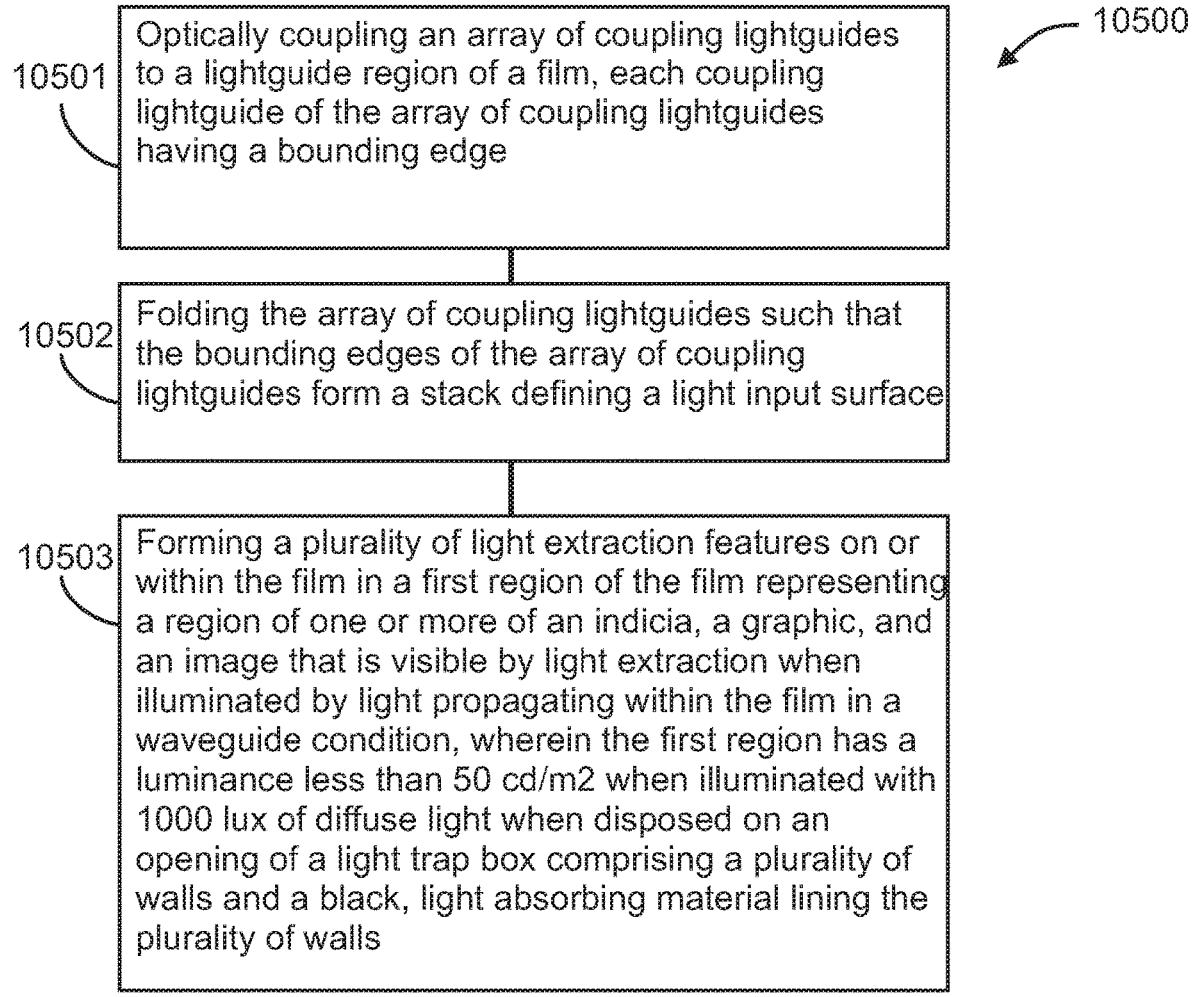

FIG. 105 is a block diagram of a method 10500 of producing a device comprising: optically coupling an array of coupling lightguides to a lightguide region of a film, each coupling lightguide of the array of coupling lightguides having a bounding edge 10501; folding the array of coupling lightguides such that the bounding edges of the array of coupling lightguides form a stack defining a light input surface 10502; and forming a plurality of light extraction features on or within the film in a first region of the film representing a region of one or more of an indicia, a graphic, and an image that is visible by light extraction when illuminated by light propagating within the film in a waveguide condition, wherein the first region has a luminance less than 50 cd/m2 when illuminated with 1000 lux of diffuse light when disposed on an opening of a light trap box comprising a plurality of walls and a black, light absorbing material lining the plurality of walls 10503.

Figure 106:
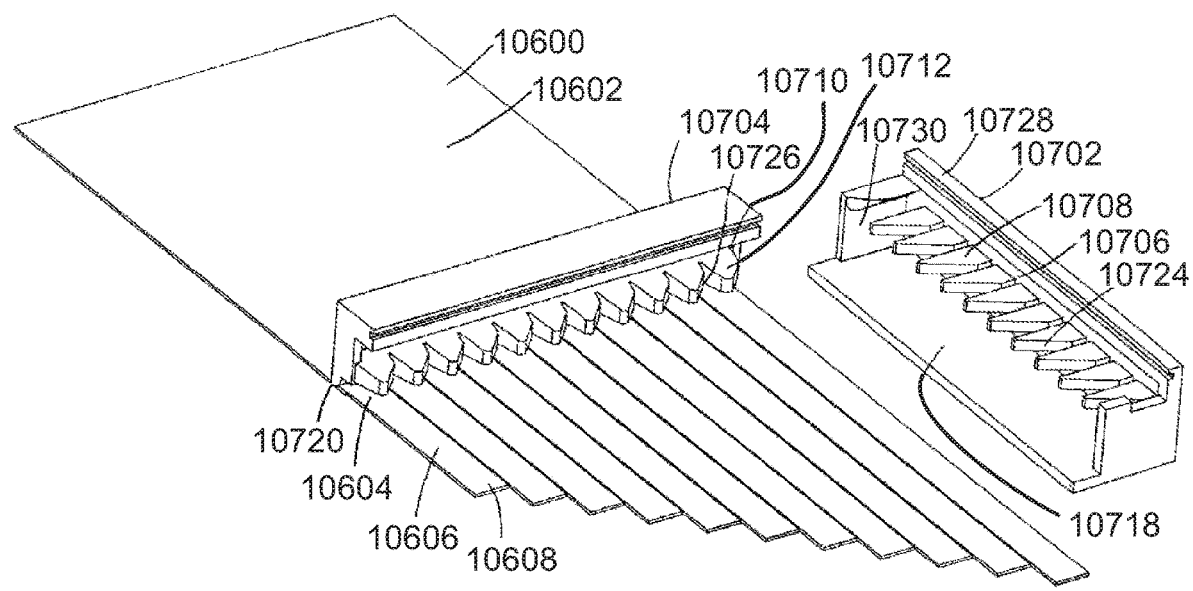
Figure 107:
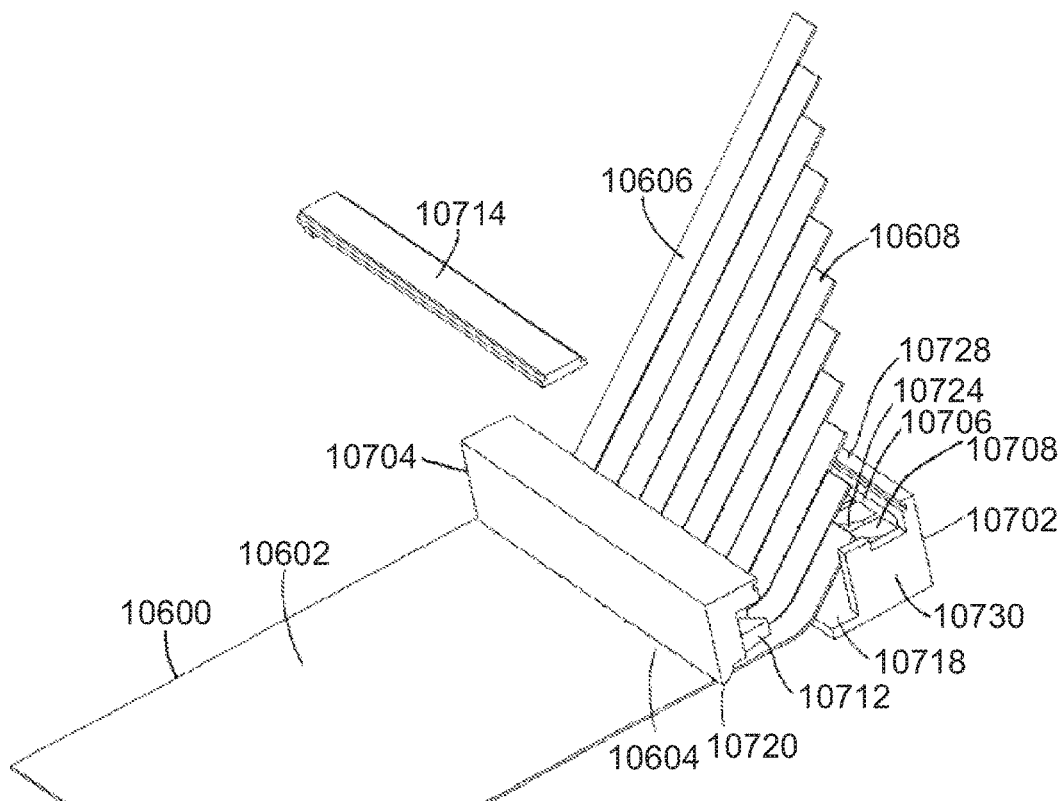
Figure 108:
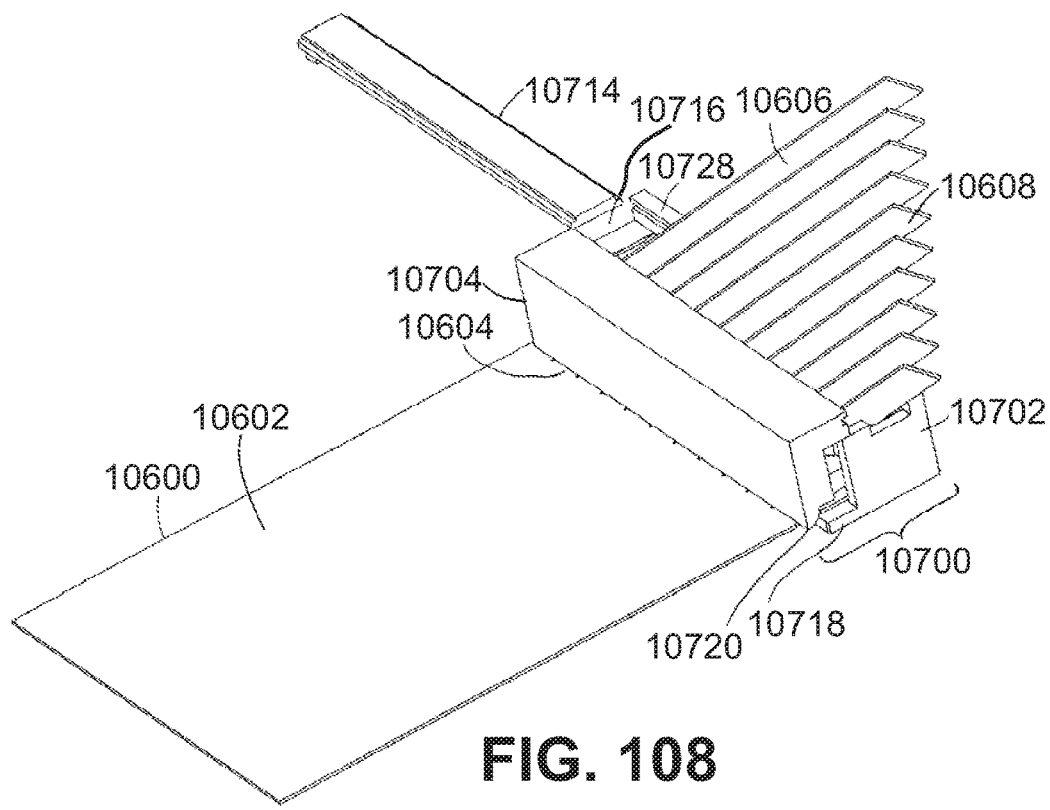

Looking initially to FIG. 106, exemplary first and second frame members 10702 and 10704 are shown along with an exemplary film sheet 10600 to be illuminated. The film sheet 10600 has a major sheet area 10602 (shown oriented along a plane), and an adjacent minor sheet area 10604 from which an array of elongated adjacent film strips 10606 extend (also shown oriented along a plane), with the film strips 10606 extending along a (first) direction at least substantially parallel to each other to terminate in strip ends 10608. The first frame member 10702 includes a first member inner face 10706 with a protruding array of first member teeth 10708, and the second frame member 10704 having a second member inner face 10710 which also preferably bears a protruding array of second member teeth 10712. The first member teeth 10708 are arrayed such that when the first and second frame members 10702 and 10704 are moved closely adjacent each other (a process shown in FIGS. 107-109) to form a frame 10700 (with the completed frame 10700 being shown in FIGS. 110 and 115), with the array of film strips 10606 situated between the first and second member inner faces 10706 and 10710 (and more particularly between the first member teeth 10708 and the second member teeth 10712, if any), each film strip 10606 is each urged by a first member tooth 10708 and by the second frame member 10704 (more particularly, by a second member tooth 10712, if any) into a second direction different from the first direction, with the urged film strips 10606 being adjacently situated in at least substantially parallel planes (as best seen in FIG. 115. Thus, by simply sandwiching the strips 1006 between the frame members 10702 and 10704, the strips 10606 are aligned (see FIGS. 108-109) such that they can thereafter be urged in a direction aligned generally parallel to the first member inner face 10706 to stack the strips 10606 (or at least the strip ends 10608) in abutting relationship. This step is shown in FIGS. 109 and 115 wherein the strips 10606 are urged by a cover member 10714 (to be discussed in greater detail below) into a direction oriented at least substantially perpendicular to the first direction. The strips 10606 then have their strip ends 10608 aligned to define an at least substantially continuous surface 10610, or the strip ends 10608 can be cut (and possibly polished) to generate an at least substantially continuous surface 10610, which can then be illuminated to transmit light into the major sheet area 10602 (or conversely light collected along the major sheet area 10602 can be transmitted along the strips 10606 to the collected strip ends 10610).

The first and second frame members 10702 and 10704 are preferably designed to complementarily interfit with each other when moved into abutment about the film strips 10606 with the first and second member inner faces 10706 and 10710 facing each other (as best seen in FIGS. 109 and 115). The first and second frame members 10702 and 10704 may then be joined together by use of adhesives or the like, or they might be mechanically joined by inserting a fastener through aligned fastener apertures defined in the first and second frame members 10702 and 10704, and/or by providing complementary mating structures on the first and second frame members 10702 and 10704 (e.g., a barbed prong on the first frame member 10702 which engages an aperture in the second frame member 10704). When the frame members 10702 and 10704 are moved into abutment about the film strips 10606, they are also preferably configured to have an open top slot 10716 defined therebetween (see FIG. 109), wherein the redirected strips 10606 extend through this top slot 10716). A cover member 10714 can then usefully be provided to slidably fit between the first and second frame members 10702 and 10704 along the top slot 10716, such that sliding the cover member 10714 between the first and second frame members 10702 and 10704 at least partially closes the top slot 10716, and at the same time urges the film strips 10606 into an abutting parallel stacked relationship below the cover member 10714 (as seen in FIGS. 109 and 115).

Similarly, the frame members 10702 and 10704 can bear structure which at least partially closes about the bottom of the interfit frame members 10702 and 10704, where the film strips 10606 enter the space therebetween. As best seen in FIG. 106, the first frame member 10702 includes a first member floor 10718 extending outwardly from the first member inner face 10706. The second frame member 10704 has a second member lower edge 10720 below the array of second member teeth 10712, with the second member lower edge 10720 being situated above the first member floor 10718 when the frame members 10702 and 10704 are interfit so as to define a gap 10722 (see FIG. 115) into which the film strips 10606 may extend. The second member lower edge 10720 is curved, having decreasing thickness as it extends downwardly, whereby film strips 10606 bearing against this lower edge 10720 more easily bend about it as they extend upwardly between the inner faces 10706 and 10710 of the frame members 10702 and 10704, and thus between the first member teeth 10708 and the second member teeth 10712 (if any).

Referring to FIG. 106, each of the first member teeth 10708 bear a first member tooth face 10724 which is aligned obliquely in relation to the first member inner face 10706. Similarly, each of the second member teeth 10712 bear a second member tooth face 10726 aligned obliquely in relation to the second member inner face 10710. As then shown in FIG. 114, which shows the teeth 10708 and 10712 of the frame members 10702 and 10704 when the frame members 10702 and 10704 are situated as in FIG. 115, when the first and second frame members 10702 and 10704 positioned closely adjacent each other with the first and second member inner faces 10706 and 10710 facing each other in parallel relation, the first member tooth faces 10724 and second member tooth faces 10726 are aligned at least substantially parallel to each other (with the tooth faces 10724 and 10726 here being angled at approximately 15 degrees to each other, though other angles can be acceptable). Additionally, the array of first member teeth 10708 is vertically spaced from the array of second member teeth 10712, with the array of first member teeth 10708 and the array of second member teeth 10712 being situated at different heights above the second member floor (preferably with the array of second member teeth 10712 being situated between the second member floor and the array of first member teeth 10708). These arrangements cause the second member teeth 10712 to promote the bending/redirection of the film strips 10606 caused by the first member teeth 10708.

Figure 110:
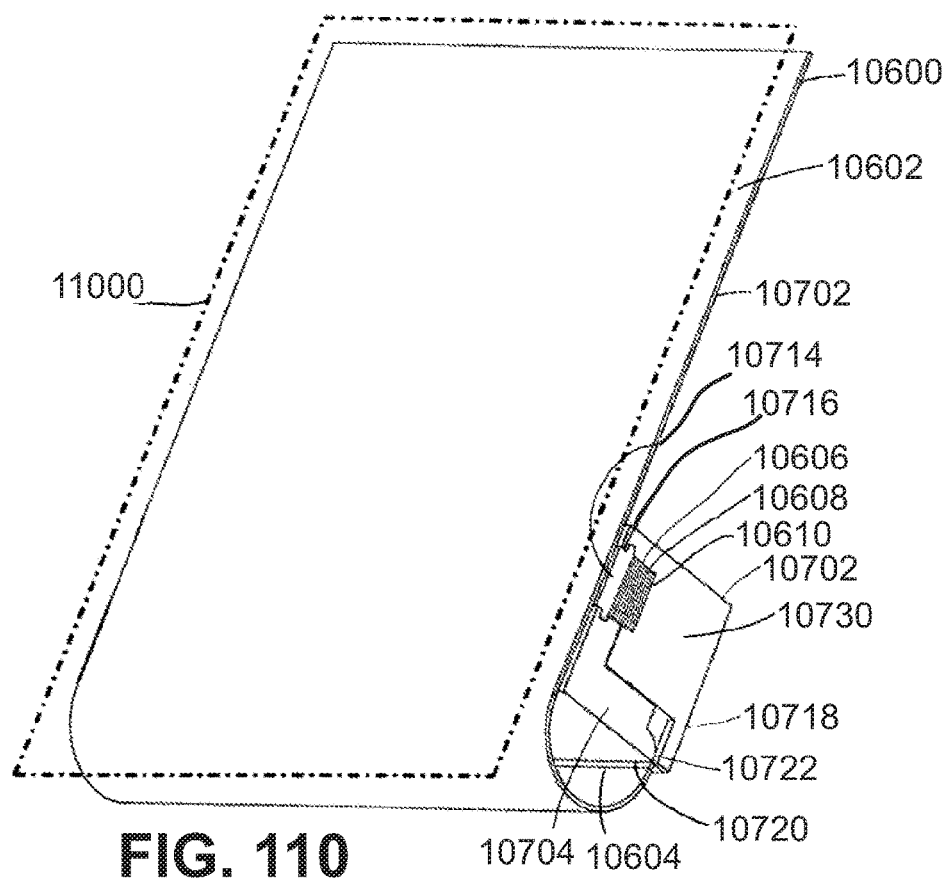

FIG. 110 schematically illustrates a display panel 11000—e.g., a liquid crystal display, organic light-emitting diode display, or simply a sign formed of paper, plastic, and/or other materials—situated in such a manner that it might be backlit by the major sheet area 10602 of the film sheet 10600. The frame members 10702 and 10704 and film sheet 10600 are shown in a particularly preferred arrangement wherein the film sheet 10600 is bent approximately 180 degrees, with the frame members 10702 and 10704 and film strips 10606 being situated alongside and spaced from the plane of the major sheet area 10602. An arrangement of this nature is particularly useful because it effectively allows generation of an "edgeless" display: the display 11000, and the illuminating major sheet area 10602, need not be bounded by a light source or other matter which defines a frame about the area of the display and sheet (save for perhaps at the bent side of the major sheet, which is also the side at which any leads to the display would likely extend). This in turn allows a variety of space-saving and aesthetically attractive arrangements for matter such as televisions, computer screens, displays of portable devices such as mobile telephones and personal digital assistants, signage, and the like.

It is also possible that once an illumination device such as that in FIG. 115 is formed, the strips 10606 could be edge-adhered or otherwise held in a bundle, and the frame members 10702 and 10704 may then be removed. The invention therefore extends to "frameless" illumination devices which include a film sheet 10600 exemplified by that of FIG. 115 and formed by processes similar to those depicted in FIGS. 106-109 and 114-115, but wherein the frame members 10702 and 10704 are absent. In these situations, the frame members 10702 and 10704 essentially provide a temporary fixture used during assembly of the illumination device, but which are removed from the final illumination device.

In similar respects, the invention also extends to illumination devices consisting of frame members 10702 and 10704 alone, prior to addition of the film sheet 10600 and completed assembly of the devices.

Further advantages, features, and objects of the invention will be apparent from the remainder of this document in conjunction with the associated drawings.

Expanding on the Summary above, film sheets used in the invention are preferably clear, low-light-absorption films which exhibit minimal light-scattering. Polycarbonate film of 0.05 mm to 1 mm thickness is an inexpensive and commonly available film which is suitable for use in the invention, but any film (e.g., polystyrene, polyester, acrylic or others) might be usable as well depending on the application to which the invention is to be applied. To deter light loss (promote internal reflection/transmission), the film can be coated/cladded with material having a lower refractive index than the film, preferably as low of a refractive index as economically possible while still yielding good adhesion between the coating and the film. Any applied coating is preferably as thin as possible to conserve size and costs, and to maximize light intake at the strip stack (shown at 10610 in FIGS. 110 and 115), if the strip ends 10608 are coated in addition to the remainder of the film sheet 10600. In this respect, a polycarbonate film with 0.5 mm thickness and a TC106 coating (Sun Process Corporation, Mt. Prospect, Ill., USA) of 0.01 mm thickness works well for most applications, with only 2% of the cross-section of the strip stack being occupied by the clad.

Strips 10606 (e.g., FIG. 106) can be cut in a film sheet 10600 in any suitable manner. An exemplary manufacturing process involves feeding film from a roll through tension rollers; using a knurl roll to imprint a light extraction pattern; applying an array of blades that raise and lower into the film to cut the strips; and a cutoff mechanism which cuts the film and its strips to a desired final length to generate a film sheet as exemplified at 10600 in FIG. 1. Heating stations can assist in softening the film to apply the light extraction pattern and to cut the film. Cutting is preferably performed using blades which are sufficiently sharp and smooth that they result in optically smooth cut edges (i.e., edges with minimal irregularities from which light loss might occur). Blade coatings, e.g., ceramic or fluoropolymer coatings, can enhance blade smoothness.

Once the strips are aligned in a stack (e.g., as at 10610 in FIGS. 110 and 115), the stack end 10610 is preferably cut and polished, or otherwise processed, to provide an optically smooth coupling surface to which light can be supplied from a light source (or from which a sensor or the like can receive light) with minimal loss. As examples of such processing, cutting and sanding/polishing can achieve such a surface, or flame or chemical polishing might be used with appropriate film materials.

Frame members such as 10702 and 10704 in FIGS. 106-110 and 114-115 can be made of any suitable materials, with plastic and metal materials being readily molded or machined to construct the frame members. If the film used in an illumination device is electrochromic, or otherwise has transmission, absorption, and/or reflection properties which are designed to vary with an applied voltage, current, frequency, or other input signal, it can be useful to form one or more of the frame members of a conductive material through which the input signal can be applied. The interior surfaces of the frame members can usefully be coated with a reflective material so that any light lost from the film strips to the interior of the frame might be reflected therein, and possibly redirected back into the strips.

The frame members and film sheets discussed above may have vastly different configurations than those shown in the drawings. The shapes, sizes, and proportions of the frame members, in particular the numbers, shapes, sizes, and proportions of their teeth, are design parameters which depend on the desired size of the illumination device, the numbers, sizes, and desired curvatures of the film strips, and similar factors. For example, a film sheet 20 cm wide with a thickness of 0.01 cm can be cut into fingers having 0.5 cm width to result in a strip stack (as at 10610 in FIGS. 110 and 115) having a light input (or receiving) surface of roughly 0.4 cm by 0.5 cm in size. Films suitable for use in the invention, and which are inexpensive and commonly available (at least at the time this document was prepared), tend to have superior light transmission where any strips are bent with radii of curvature which are at least approximately eight times the film thickness. (Lesser radii are possible—for example, strips can be bent with nearly negligible radii of curvature—but these tend to require surface coatings or similar measures at the bends to decrease light loss, which can increase costs.) Thus, in general, the frame members will have a height of at least eight times the film thickness, plus the overall strip stack thickness (assuming the stack is to extend within/between the frame members, as within the top slot 10716 in FIGS. 109 and 115). Similarly, the depth of the combined frame members will generally be approximately the width of the top slot (which is preferably the same as the maximum strip width), plus approximately 1.4 times the bending radius.

Figure 111:
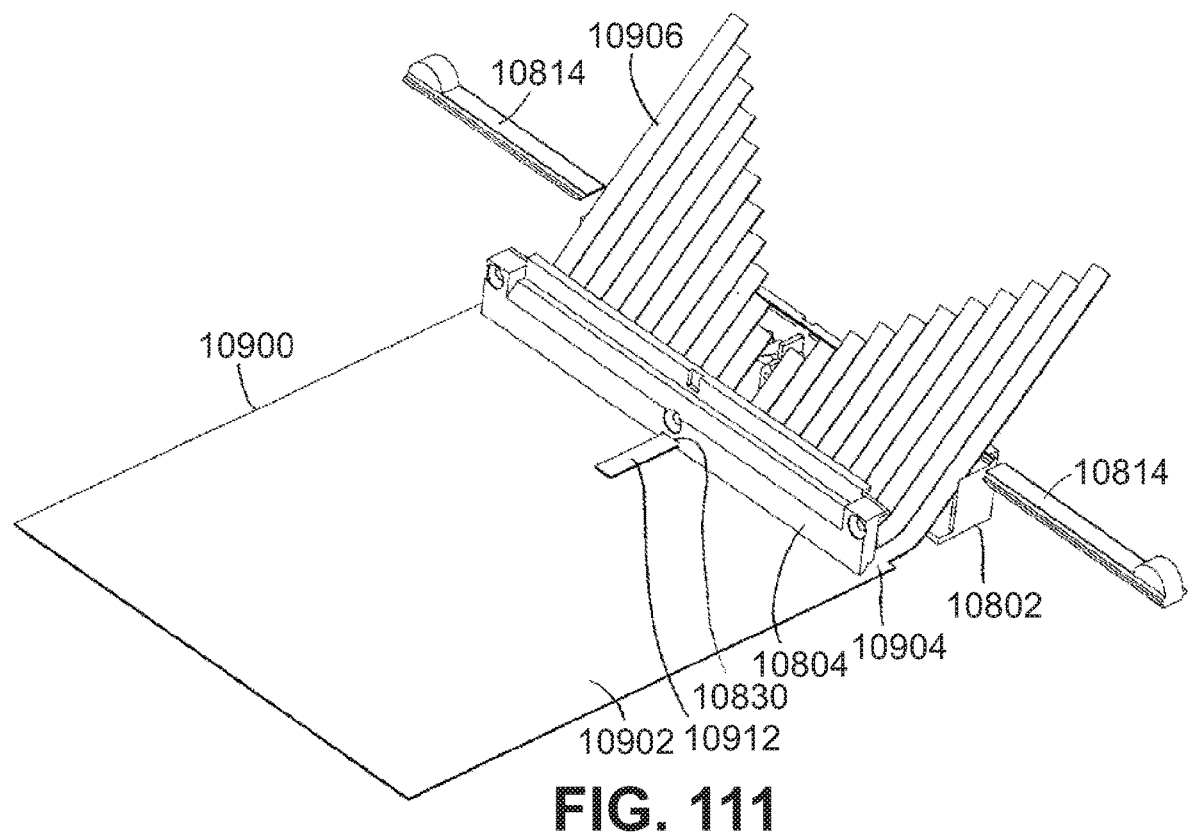

Frame members and illumination devices can also vary from those discussed above and shown in the figures in details other than their shapes, sizes, and proportions. To illustrate, FIGS. 111-113 illustrate first and second frame members 10802 and 10804 wherein the first frame member 10802 urges the film strips 10906 into two arrays of adjacently-situated strips situated in parallel planes, and a pair of cover members 10814 then urge these arrays into a stack extending from the center of the lengths of the stack members. When the film sheet 10900 is then bent similarly to that in FIG. 110, but at an angle of approximately 90 degrees rather than 180 degrees, the stacked strips 10910 extend behind the major area 10902 of the film sheet 10900, rather than outwardly from one of its sides (as in FIGS. 110 and 115). This may allow for a more compact and/or convenient arrangement, depending on how the illumination device is to be used. Additionally, a film sheet may bear strips extending from more than one of its edges—e.g., from opposing edges—and frames may be mounted about each of these edges so that the major area of the sheet can be illuminated from more than one edge. Such an arrangement is particularly preferred where the major sheet area is large, since illumination from multiple edges can provide greater illumination of the major sheet area. In similar respects, two or more frames can be mounted on a single edge of a film sheet to provide two or more strip stacks for input of light to, or output of light from, the major sheet area.

The teeth used on the frame members need not take the forms of those illustrated in the drawings (e.g., FIGS. 106 and 114), which have a roughly sawtooth profile, with a thickness that increases slightly as each tooth extends from its tip to its base in the vertical direction. Examples of other teeth configurations include tetrahedra, rod-like forms (similar to an array of comb teeth, but wherein the teeth might be are angled with respect to their frame members), and flanges having a C-shaped or J-shaped curve. Further, the teeth might be situated at different locations along the heights of the frame members, as by being located at the first member top edge 10728 in FIG. 106 (though in this case any stack of parallel abutting film strips would rest atop the first frame member 10702, rather than in a slot 10716 defined between the first and second slot members 10702 and 10704, as in FIGS. 109 and 115). In such situations, the first member teeth 10708 might be defined by forming notches/depressions in the first member top edge 10728 and/or the first member inner face 10706, such that the first member teeth 10708 are left to protrude both upwardly and outwardly from the first member inner face 10706. Similar adaptations could be made when providing the second member teeth on the second frame member. Depending on the configuration and location of the teeth, the width of the film strips, and on the degree of bending desired for the strips, the faces of the teeth need not be near parallel (as in FIG. 114, which shows the tooth faces 10724 and 10726 angled at approximately 15 degrees to each other), and in fact could be more perpendicular than parallel. However, for frame members and strips configured and proportioned as in the accompanying drawings, tooth faces which are parallel (or nearly so) are preferred.

As noted previously, the second member teeth help promote the bending/redirection of the film strips caused by the first teeth. This is not necessary, and the second member teeth may be omitted, or might simply be replaced by a single continuous ridge or other member rather than being provided as a series of independent teeth.

Further, while the frame members are depicted in the Figures as having linear arrays of teeth which redirect a planar array of film strips into a stacked array of strips, the arrayed teeth need not necessarily be linear, nor need the film strips input to the teeth be necessarily arrayed in a plane. In some applications (e.g., architectural lighting), curved film sheets and/or strip stacks, or sheets/stacks having other complex shapes, are sometimes desired. Thus, the frames can be constructed in such a manner that they might receive a curved/nonplanar array of strips. In this respect, the frame members illustrated in the accompanying drawings might be formed of a flexible material such as silicone whereby a final illumination device (as shown in FIGS. 110 and 113) might be bent to at least partially conform to a curved surface.

The construction of illumination devices such as those shown in FIGS. 110 and 113 also need not be done solely by hand and may be done in an automated or semi-automated manner. To illustrate, the frame members 10702 and 10704 of FIGS. 106-110 and 114-115 could be defined as portions of a machine wherein a sheet is fed below the second frame member 10704 (with an edge then being cut into film strips, if it is not already so cut), and the frame members 10702 and 10704 are then moved by a suitable mechanism in the manner shown in FIGS. 106-110 and 114-115 to construct the illumination device of FIG. 110. Stated differently, the invention also encompasses frame members which are provided as part of a further device which assists in the assembly of a final illumination device.

Frame members can also include other features. As one example, a frame member may include ports through which gels having a low refractive index, or other materials, may be injected to at least partially surround the film strips within the frame and better deter light loss from the strips. As another example, the frame members can be adapted such that the stacked strips do not extend therefrom, and rather terminate within the frame members at a location at which an LED or other light source (or light sensing/receiving device) is provided. In other words, the light source (or light receiver) can be provided within the frame, as well as any power supplies or other components needed for its operation. The frame members may include features allowing them to be quickly and easily attached and detached to each other, and/or to surrounding structure, and about a film sheet, whereby film sheets may be more easily removed from the frame members and replaced with other desired film sheets (e.g., where a film sheet defining a sign bearing one message is to be replaced by a sign bearing another message). Alternatively, the frame members may bear structure for quick and easy attachment to surrounding structure, whereby an illumination device such as that in FIG. 110 may be readily removed and replaced in its entirety by another illumination device.

One issue that can be encountered with the frame members discussed above is that if the film sheet is not held with respect to the first frame member (and/or the second frame member) as the aforementioned assembly steps are followed, the film sheet and its strips can displace, making it more difficult to complete the assembly of the illumination device. Features can be added to one or more of the frame members to help deter such displacement. One example is illustrated in FIG. 111, wherein the second frame member 10804 bears a central strip aperture 10830 along its length and situated below the second member teeth (not shown). As shown in FIGS. 111-113, a central film strip 10912 extending from the film sheet 10900 may be bent to extend through this central strip aperture 10830, thereby at least partially restraining the film strips 10906 and film sheet 10900 with respect to the second frame member 10804 as it is moved toward the first frame member 10804 to bend the strips 10906 into arrays of parallel spaced strips (as in FIG. 112). After the illumination device has been fully assembled (FIG. 113), the end of the central film strip 10912 protruding from the second frame member 10804 may be cut off or otherwise removed.

As another example, one or more of the frame members—most preferably the first frame member—might include pegs or other protruding structure (e.g., on the first member floor), and the film sheet may then bear apertures, or its edges may bear notches, which receive the protruding structure(s). As a result, the film sheet can be placed in the first frame member with the protruding structure(s) deterring slipping of the film sheet as the second frame member is urged toward the first frame member.

Protruding structure(s), and complementary receiving structures such as aperture(s)/slot(s), are not the only structures that can be used to accomplish such a restraining arrangement, and a variety of other arrangements could alternatively or additionally be used. Referring to FIG. 106 to illustrate, tacky/adhesive surfaces, or elastomeric or other high-friction surfaces, can be situated on the frame members 10702 and 10704 (e.g., along the first member floor 10718 and/or the second member lower edge 10720) to deter slippage of the film sheet as the frame members 10702 and 10704 are sandwiched about the strips. As another example, tongues/clips could extend outwardly from the first member sidewalls 10730 to extend closely adjacent the first member floor 10718, so that the outermost film strips can be slid between the tongues/clips and the first member floor 10718 to restrain the sheet with respect to the first frame member 10702.

Sheet restraining arrangements can also or alternatively be used wherein the arrangements do not require additional structure on the frame members, and/or modification of the film sheet. To illustrate, the frame member(s) might bear apertures along the first member floor and/or along the second member lower edge, with these apertures being temporarily connected to a vacuum supply while the film strips are being urged by the frame members into a stacked array. The vacuum supply may thereafter be removed after the illumination device is sufficiently complete.

It should be understood that various terms used throughout this document to refer to orientation and position—e.g., 'top' (as in "top slot"), "lower" (as in "second member lower edge"), "vertically," and the like—are relative terms rather than absolute ones. In other words, it should be understood (for example) that the top slot being referred to may in fact be located at the bottom of the device depending on the overall orientation of the device. Thus, such terms should be regarded as words of convenience, rather than limiting terms.

To provide a more specific illustration of the invention, following is a description of an exemplary illumination device resembling that of FIG. 110, used to illuminate an LCD television display having a 20-inch (50 cm) diagonal dimension. Clear polycarbonate film having 0.01 inch (0.025 cm) thickness, provided on a roll 48 inches (122 cm) wide, was cut to 16 by 40 inch (41 by 102 cm) subsections. An array of blades cut strips in the film 0.733 inches (1.86 cm) wide by 20 inches (50 cm) long. Frame members (and a cap member) having a configuration resembling that in FIGS. 106-109 and 114-115 were used to define a completed illumination device as depicted in FIG. 115, and glue was used to bond the frame members together (and to the stacked strip ends), and to seal the interior of the frame from dust. The stacked strip ends were cut so that their tips extended along a common plane, and were then sanded with 100 and 320 grit sandpaper, followed by using a micro-mesh sanding kit. This resulted in an optically smooth input surface measuring approximately 0.733 inches (1.86 cm) by 0.2 inches (0.51 cm). Light was coupled into the input surface using a PT-120 PhlatLight (Luminus Devices, Billerica, Mass., USA). The major area of the film sheet was placed behind the LCD display, and the film sheet was bent from the state shown in FIG. 115 to that shown in FIG. 110 to situate the light source, heatsinks, fans, optics and electronics behind major area of the film sheet. The radius of curvature in the bend was 0.25 inches (0.64 cm), which is approximately 25 times the thickness of the film, resulting in negligible light leakage at the bend. The overall thickness/depth of the LCD display and the illumination device was approximately 1.25 inches (3.2 cm), primarily owing to the size of the heatsinks. The illumination device provided illumination to the display which appeared to be at least equivalent in quality to that provided by common prior methods, e.g., backlighting or frontlighting by Cold Cathode Fluorescent Lamps (CCFL) and/or Light Emitting Diodes (LEDs).

The invention is not intended to be limited to the preferred versions of the invention described above, but rather is intended to be limited only by the claims set out below. Thus, the invention encompasses all different versions that fall literally or equivalently within the scope of these claims.

EXAMPLES

Certain embodiments are illustrated in the following example(s). The following examples are given for the purpose of illustration, but not for limiting the scope or spirit of the invention.

In one embodiment, coupling lightguides are formed by cutting strips at one or more ends of a film which forms coupling lightguides (strips) and a lightguide region (remainder of the film). On the free end of the strips, the strips are bundled together into an arrangement much thicker than the thickness of the film itself. On the other end, they remain physically and optically attached and aligned to the larger film lightguide. The film cutting is achieved by stamping, laser-cutting, mechanical cutting, water jet cutting, local melting or other film processing methods. Preferably the cut results in an optically smooth surface to promote total internal reflection of the light to improve light guiding through the length of the strips. A light source is coupled to the bundled strips. The strips are arranged so that light propagates through them via total internal reflection and is transferred into the film lightguide portion. The bundled strips form a light input edge having a thickness much greater than the film lightguide region. The light input edge of the bundled strips defines a light input surface to facilitate more efficient transfer of light from the light source into the lightguide, as compared to conventional methods that couple to the edge or top of the film. The strips can be melted or mechanically forced together at the input to improve coupling efficiency. If the bundle is square shaped, the length of one of its sides I, is given by $I \sim \sqrt{(w \times t)}$ where w is the total width of the lightguide input edge and t is the thickness of the film. For example, a 0.1 mm thick film with 1 m edge would give a square input bundle with dimensions of 1 cm×1 cm. Considering these dimensions, the bundle is much easier to couple light into compared to coupling along the length of the film when using typical light sources (e.g. incandescent, fluorescent; metal halide, xenon and LED sources). The improvement in coupling efficiency and cost is particularly pronounced at film thicknesses below 0.25 mm, because that thickness is approximately the size of many LED and laser diode chips. Therefore, it would be difficult and/or expensive to manufacture micro-optics to efficiently couple light into the film edge from an LED chip because of the étendue and manufacturing tolerance limitations. Also, it should be noted that the folds in the slots are not creases but rather have some radius of curvature to allow effective light transfer. Typically, the fold radius of curvature will be at least ten times the thickness of the film.

An example of one embodiment that can be brought to practice is given here. The assembly starts with 0.25 mm thick polycarbonate film that is 40 cm wide and 100 cm long. A cladding layer of a lower refractive index material of approximately 0.01 mm thickness is disposed on the top and bottom surface of the film. The cladding layer can be added by coating or co-extruding a material with lower refractive index onto the film core. One edge of the film is mechanically cut into 40 strips of 1 cm width using a sharp cutting tool such as a razor blade. The edges of the slots are then exposed to a flame to improve the smoothness for optical transfer. The slots are combined into a bundle of approximately 1 cm×1 cm cross-section. To the end of the bundle a number of different types of light sources can be coupled (e.g. xenon, metal halide, incandescent, LED or Laser). Light propagates through the bundle into the film and out of the image area. Light may be extracted from the film lightguide by laser etching into the film, which adds a surface roughness that results in frustrated total internal reflectance. Multiple layers of film can be combined to make multi-color or dynamic signs.

An example of one embodiment that has been brought to practice is described here. The apparatus began with a 381 micron thick polycarbonate film which was 457 mm wide and 762 mm long. The 457 mm edge of the film is cut into 6.35 mm wide strips using an array of razor blades. These strips are grouped into three 152.4 mm wide sets of strips, which are further split into two equal sets that were folded towards each other and stacked separately into 4.19 mm by 6.35 mm stacks. Each of the three pairs of stacks was then combined together in the center in the method to create a combined and singular input stack of 8.38 mm by 6.35 mm size. An LED module, MCE LED module from Cree Inc., is coupled into each of the three input stacks. Light emitted from the LED enters the film stack with an even input, and a portion of this light remains within each of the 15 mil strips via total internal reflections while propagating through the strip. The light continues to propagate down each strip as they break apart in their separate configurations, before entering the larger lightguide. Furthermore, a finned aluminum heat sink was placed down the length of each of the three coupling apparatuses to dissipate heat from the LED. This assembly shows a compact design that can be aligned in a linear array, to create uniform light. Light traveling within the film exits in a light emitting region representing indicia due to light extraction from individual light extraction features that collectively arrange to form a light emitting indicia, graphic, icon, or image.

A method to manufacture one embodiment of a backlight comprising three film-based lightguides is as follows.

Three layers of thin film lightguides (<250 microns) are laminated to each other with a layer of lower refractive index material between them (e.g. methyl-based silicone PSA). Then, an angled beam of light, ions or mechanical substance (i.e. particles and/or fluid) patterns lines or spots into the film. If necessary, a photosensitive material should be layered on each material beforehand. The angle of the beam is such that the extraction features on the layers have the proper offset. The angle of the beam is dictated by the lightguide thickness and the width of the pixels and is given by $\theta=\tan^{-1}(t/w)$, where $\theta$ is the relative angle of light to the plane of the lightguide, t is the lightguide and cladding thickness and w is the width of the pixels. Ideally the extraction features direct the light primarily in a direction toward the intended pixel to minimize crosstalk.

In one embodiment a device comprises a light transmitting film having a lightguide region with opposing faces with a thickness of less than about 0.5 millimeters therebetween; a first region within the lightguide region of the film representing a region of an indicia, graphic, or image that is visible by light extraction when illuminated by light propagating within the film in a waveguide condition; wherein: the first region comprises light extraction features with average dimensions less than 500 microns that redirect a portion of light traveling within the film in a waveguide condition out of a face of the film in the first region; and the first region has a luminance less than 50 cd/m$^2$ when illuminated with 1000 lux of diffuse light when disposed on the opening of a light trap box comprising a black, light absorbing material lining the walls. In another embodiment, the device is a film-based lightguide. In embodiment, the device is a component of a light emitting sign. In one embodiment, the percentage of the surface area of the film occupied by the light extraction features in the first region is less than 20% or less than 10%. In another embodiment, the device further comprises an array of coupling lightguides extending from the lightguide region of the film; wherein: the coupling lightguides comprise bounding edges at the ends of the coupling lightguides; and the coupling lightguides are folded such that the bounding edges are stacked. In one embodiment, the device further comprises a light source disposed to emit light that propagates into the stacked bounding edges and propagates within the coupling lightguides to the lightguide region of the film with light from each coupling lightguide combining and totally internally reflecting within the lightguide region of the film. In another embodiment, the first region has a luminance less than: 10 cd/m$^2$ when illuminated with 300 lux of diffuse light; 10 cd/m$^2$ when illuminated with 500 lux of diffuse light; or 50 cd/m$^2$ when illuminated with 1000 lux of diffuse light when disposed on the opening of a light trap box comprising a black, light absorbing material lining the walls. In another embodiment, the light extraction features have average dimensions less than 300 microns. In another embodiment, the light extraction features comprise a light scattering material. In a further embodiment, the average largest dimensional size or average minimum dimensional size of the light extraction features in the first region in the plane parallel to the surface of the film at the light extraction features or the light emitting region of the film is less than 0.5 millimeters. In another embodiment, the light extraction features have a full angular width at half maximum intensity of transmitted light greater than 40 degrees when measured with laser light incident normal to the face of the film. In another embodiment, the first region has luminous transmittance greater than 70% or a haze less than 20% measured according to ASTM D1003 version 07e1.

In one embodiment, a device comprises a film-based lightguide comprising a first region representing a region of an indicia, graphic, image or pattern that is visible by light extraction when illuminated by light propagating within the film in a waveguide condition; coupling lightguides extending from the lightguide region and continuous with the lightguide region of the film; the coupling lightguides folded and arranged with their ends stacked; and light extraction features disposed within the first region; wherein the average largest dimensional size of the light extraction features in the first region in the plane parallel to surface or light emitting region of the film is less than 0.5 millimeters.

In one embodiment, a method of producing a device comprises: optically coupling an array of coupling lightguides to a lightguide region of a film, each coupling lightguide of the array of coupling lightguides having a bounding edge; folding the array of coupling lightguides such that the bounding edges of the array of coupling lightguides form a stack defining a light input surface; and forming a plurality of light extraction features on or within the film in a first region of the film representing a region of one or more of an indicia, a graphic, and an image that is visible by light extraction when illuminated by light propagating within the film in a waveguide condition, wherein the first region has a luminance less than 50 cd/m2 when illuminated with 1000 lux of diffuse light when disposed on an opening of a light trap box comprising a plurality of walls and a black, light absorbing material lining the plurality of walls. In one embodiment, forming a plurality of light extraction features comprises disposing the plurality of light extraction features within the first region having an average lateral dimension less than 500 microns in a direction parallel to an optical axis of the light within the film at the plurality of light extraction features when illuminated by light traveling within the array of coupling lightguides. In another embodiment, forming a plurality of light extraction features comprises occupying less than 10% of a surface area of the lightguide in the first region by the plurality of light extraction features. In one embodiment, optically coupling an array of coupling lightguides to a lightguide region of a film comprises forming the array of coupling lightguides extending from the lightguide region such that the array of coupling lightguides remains continuous with the lightguide region.

Exemplary embodiments of light emitting devices and methods for making or producing the same are described above in detail. The devices, components, and methods are not limited to the specific embodiments described herein, but rather, the devices, components of the devices and/or steps of the methods may be utilized independently and separately from other devices, components and/or steps described herein. Further, the described devices, components and/or the described methods steps can also be defined in, or used in combination with, other devices and/or methods, and are not limited to practice with only the devices and methods as described herein.

While the disclosure includes various specific embodiments, those skilled in the art will recognize that the embodiments can be practiced with modification within the spirit and scope of the disclosure and the claims.

EQUIVALENTS

Those skilled in the art will recognize or be able to ascertain using no more than routine experimentation, numerous equivalents to the specific procedures described herein. Such equivalents are considered to be within the scope of the invention. Various substitutions, alterations, and modifications may be made to the invention without departing from the spirit and scope of the invention. Other aspects, advantages, and modifications are within the scope of the invention. This application is intended to cover any adaptations or variations of the specific embodiments discussed herein. Therefore, it is intended that this disclosure be limited only by the claims and the equivalents thereof.

Unless otherwise indicated, all numbers expressing feature sizes, amounts, and physical properties used in the specification and claims are to be understood as being modified by the term "about". Accordingly, unless indicated to the contrary, the numerical parameters set forth in the foregoing specification and attached claims are approximations that can vary depending upon the desired properties sought to be obtained by those skilled in the art utilizing the teachings disclosed herein. Unless indicated to the contrary, all tests and properties are measured at an ambient temperature of 25 degrees Celsius or the environmental temperature within or near the device when powered on (when indicated) under constant ambient room temperature of 25 degrees Celsius.

What is claimed is:

1. A device comprising:
   a film comprising a major sheet area of the film bounded by edges of the film, the major sheet area comprising a light extracting region positioned to receive and extract light propagating by total internal reflection within the film out of the major sheet area;
   a minor sheet area of the film between the major sheet area and an array of strips, the array of strips extended from the minor sheet area of the film, and each strip of the array of strips is bent and stacked such that stacked ends of the array of strips define a light input surface; and
   a bend in the minor sheet area that positions the array of strips behind the major sheet area in a thickness direction of the film in the major sheet area.

2. The device of claim 1 wherein the bend in the minor sheet area bends the film by an angle of 180 degrees.

3. The device of claim 1 wherein the bend in the minor sheet area positions the light input surface behind the major sheet area in the thickness direction of the film in the major sheet area.

4. The device of claim 3 further comprising at least one light source positioned to emit light into the light input surface and positioned behind the major sheet area in the thickness direction of the film in the major sheet area.

5. The device of claim 4 wherein the light input surface is positioned between the edges of the film bounding the major sheet area.

6. The device of claim 5 wherein the at least one light source is positioned between the edges of the film bounding the major sheet area.

7. The device of claim 4 further comprising a display panel with a front viewing side and a back side opposite the front viewing side wherein light from the at least one light source propagates by total internal reflection through the array of strips and the minor sheet area, propagates into the major sheet area, is emitted from the major sheet area in the light extracting region, and propagates toward the display panel.

8. The device of claim 7 further comprising a heatsink positioned behind the major sheet area in the thickness direction of the film in the major sheet area.

9. The device of claim 7 wherein the display panel comprises a frame around a light emitting area of the display panel that receives light from the major sheet area, and the at least one light source is housed outside of the frame around the light emitting area of the display panel.

10. The device of claim 9 wherein the at least one light source is positioned between the edges of the film bounding the major sheet area.

11. The device of claim 7 wherein the light from the at least one light source illuminates the display panel from the back side of the display panel.

12. The device of claim 7 wherein the light from the at least one light source illuminates the display panel from the front viewing side of the display panel.

13. The device of claim 7 wherein the display panel comprises electrical leads extending from a first side of the display panel, and the bend in the minor sheet area is positioned at the first side of the display panel.

14. The device of claim 1 further comprising a frame restraining the array of strips, the frame positioned behind the major sheet area in the thickness direction of the film in the major sheet area.

15. The device of claim 1 wherein the film comprises a thickness in the thickness direction and the bend in the minor sheet area comprises a radius of curvature between 8 times and 25 times the thickness of the film.

16. The device of claim 1 further comprising at least one frame member, the at least one frame member comprising a first inner face and a second inner face, wherein the array of strips are positioned between the first inner face and the second inner face, and the at least one frame member is positioned behind the major sheet area in the thickness direction of the film in the major sheet area.

17. A film illumination device comprising:
a film comprising an array of strips extended along an edge of the film, the film comprising a major sheet area of the film with light extraction features, wherein each strip of the array of strips is bent and stacked such that ends of the array of strips are stacked;
at least one light source positioned to emit light into the ends of the array of strips; and
an area of the film between the major sheet area and the strips bent such that the array of strips, the ends of the array of strips, and the at least one light source are positioned behind the major sheet area in thickness direction of the film in the major sheet area.

18. The film illumination device of claim 17 further comprising a display panel with a front viewing side and a back side opposite the front viewing side wherein light from the at least one light source propagates by total internal reflection through the array of strips and the minor sheet area, propagates into the major sheet area, is emitted from the major sheet area in the light extracting region, and propagates toward the display panel.

19. A method of manufacturing a lightguide comprising:
a. forming a light extraction region in a major sheet area of a film;
b. forming an array of strips extending from a minor sheet area of the film, the minor sheet area positioned between the major sheet area and the array of strips;
c. folding and stacking the array of strips; and
d. bending the film in the minor sheet area such that the array of strips is positioned behind the light extraction region in a thickness direction of the film in the major sheet area.

20. The method of claim 19 wherein bending the film in the minor sheet area bends the film at an angle of 180 degrees.

* * * * *